United States Patent
Zhu et al.

(10) Patent No.: US 6,971,580 B2
(45) Date of Patent: Dec. 6, 2005

(54) AUTOMATED METHOD OF AND SYSTEM FOR DIMENSIONING OBJECTS OVER A CONVEYOR BELT STRUCTURE BY APPLYING CONTOURING TRACING, VERTICE DETECTION, CORNER POINT DETECTION, AND CORNER POINT REDUCTION METHODS TO TWO-DIMENSIONAL RANGE DATA MAPS OF THE SPACE ABOVE THE CONVEYOR BELT CAPTURED BY AN AMPLITUDE MODULATED LASER SCANNING BEAM

(75) Inventors: Xiaoxun Zhu, Marlton, NJ (US); Ka Man Au, Philadelphia, PA (US); Gennady Germaine, Cherry Hill, NJ (US); Timothy A. Good, Blackwood, NJ (US); Michael Schnee, Aston, PA (US); Ian Scott, Haddonfield, NJ (US); John Groot, San Jose, CA (US); David M. Wilz, Sr., Sewell, NJ (US); George B. Rockstein, Audobon, NJ (US); Robert E. Blake, Woodbury Heights, NJ (US); LeRoy Dickson, Morgan Hill, CA (US); Carl Harry Knowles, Moorestown, NJ (US)

(73) Assignee: Metrologic Instruments, Inc., Blackwood, NJ (US)

( * ) Notice: Subject to any disclaimer, the term of this patent is extended or adjusted under 35 U.S.C. 154(b) by 117 days.

(21) Appl. No.: 10/038,727
(22) Filed: Jan. 2, 2002
(65) Prior Publication Data
US 2002/0179708 A1 Dec. 5, 2002

Related U.S. Application Data

(63) Continuation of application No. 09/327,756, filed on Jun. 7, 1999, now abandoned.

(51) Int. Cl.[7] .................................................. G06K 7/10
(52) U.S. Cl. ........................... 235/472.01; 235/462.25; 235/462.01
(58) Field of Search .................. 235/472.01–472.03, 235/462.01, 462.02, 462.03–462.25, 462.27–462.45, 454, 470, 455, 375

(56) References Cited

U.S. PATENT DOCUMENTS 3,901,597 A    8/1975   White (Continued)

FOREIGN PATENT DOCUMENTS

| EP | 1 003 050 A2 | 1/1981 |
|----|---|---|
| EP | 0 346 015 B1 | 11/1994 |
| EP | 1 003 050 A3 | 6/2000 |
| EP | O 705 445 B1 | 8/2000 |
| WO | WO 94/27166 | 11/1994 |

OTHER PUBLICATIONS

Active, Optical Range Imaging Sensors by Paul J. Besl, Laser Distance Measurements, published by SPIE Optical Engineering Press, vol. MS115, 1995, pp. 36–61.

(Continued)

Primary Examiner—Thien M. Le
(74) Attorney, Agent, or Firm—Thomas J. Perkowski, Esq., P.C.

(57) ABSTRACT

A fully automated package identification and measuring system, in which an omni-directional holographic scanning tunnel is used to read bar codes on packages entering the tunnel, while a package dimensioning subsystem is used to capture information about the package prior to entry into the tunnel. Mathematical models are created on a real-time basis for the geometry of the package and the position of the laser scanning beam used to read the bar code symbol thereon. The mathematical models are analyzed to determine if collected and queued package identification data is spatially and/or temporally correlated with package measurement data using vector-based ray-tracing methods, homogeneous transformations, and object-oriented decision logic so as to enable simultaneous tracking of multiple packages being transported through the scanning tunnel.

17 Claims, 189 Drawing Sheets

U.S. PATENT DOCUMENTS

| | | | | |
|---|---|---|---|---|
| 4,188,544 A | | 2/1980 | Chasson | |
| 4,192,613 A | | 3/1980 | Hammar | |
| 4,333,006 A | * | 6/1982 | Gorin et al. | 235/462.34 |
| 4,580,894 A | * | 4/1986 | Wojcik | 356/28 |
| 4,613,324 A | | 9/1986 | Cruickshank | |
| 4,645,348 A | | 2/1987 | Dewar et al. | |
| 4,645,349 A | | 2/1987 | Tabata | |
| 4,648,717 A | | 3/1987 | Ross et al. | |
| 4,687,325 A | | 8/1987 | Corby, Jr. | |
| 4,742,555 A | * | 5/1988 | Tonkin | 382/274 |
| 4,794,550 A | | 12/1988 | Greivenkamp, Jr. | |
| 4,846,577 A | | 7/1989 | Grindon | |
| 4,867,570 A | | 9/1989 | Sorimachi et al. | |
| 4,900,146 A | | 2/1990 | Penney et al. | |
| 4,926,050 A | | 5/1990 | Shemwell | |
| 4,937,445 A | | 6/1990 | Leong et al. | |
| 4,979,815 A | | 12/1990 | Tsikos | |
| 5,006,721 A | | 4/1991 | Cameron et al. | |
| 5,041,726 A | | 8/1991 | Chang et al. | |
| 5,054,918 A | | 10/1991 | Downing et al. | |
| 5,076,690 A | | 12/1991 | deVos et al. | |
| 5,231,401 A | | 7/1993 | Kaman et al. | |
| 5,293,162 A | | 3/1994 | Bachalo | |
| 5,307,151 A | | 4/1994 | Hof et al. | |
| 5,331,118 A | * | 7/1994 | Jensen | 177/25.14 |
| 5,336,899 A | | 8/1994 | Nettleton et al. | |
| 5,471,326 A | | 11/1995 | Hall et al. | |
| 5,493,388 A | | 2/1996 | Adachi | |
| 5,510,889 A | | 4/1996 | Herr | |
| 5,528,517 A | | 6/1996 | Loken | |
| 5,547,034 A | * | 8/1996 | Wurz et al. | 177/25.13 |
| 5,555,090 A | * | 9/1996 | Schmutz | 356/601 |
| 5,589,928 A | | 12/1996 | Babbitt et al. | |
| 5,615,003 A | | 3/1997 | Hermary et al. | |
| 5,633,487 A | * | 5/1997 | Schmutz et al. | 235/462.22 |
| 5,656,799 A | * | 8/1997 | Ramsden et al. | 177/2 |
| 5,661,561 A | * | 8/1997 | Wurz et al. | 356/635 |
| 5,689,092 A | * | 11/1997 | Wurz et al. | 177/145 |
| 5,699,161 A | * | 12/1997 | Woodworth | 356/628 |
| 5,737,438 A | * | 4/1998 | Zlotnick et al. | 382/101 |
| 5,742,068 A | | 4/1998 | Dybdahl et al. | |
| 5,790,243 A | | 8/1998 | Herr | |
| 5,814,802 A | * | 9/1998 | Hecht et al. | 235/455 |
| 5,831,220 A | | 11/1998 | Ramsden et al. | |
| 5,831,719 A | | 11/1998 | Berg et al. | |
| 5,841,541 A | | 11/1998 | Dlugos | |
| 5,869,827 A | * | 2/1999 | Rando | 235/462.4 |
| 5,870,220 A | * | 2/1999 | Migdal et al. | 359/216 |
| 5,870,490 A | | 2/1999 | Takahashi et al. | |
| 5,872,858 A | | 2/1999 | Kamada et al. | |
| 5,900,611 A | * | 5/1999 | Hecht | 235/454 |
| 5,917,640 A | | 6/1999 | Staver | |
| 5,923,428 A | * | 7/1999 | Woodworth | 356/623 |
| 5,940,170 A | | 8/1999 | Berg et al. | |
| 5,969,823 A | | 10/1999 | Wurz et al. | |
| 5,986,745 A | | 11/1999 | Hermary et al. | |
| 5,988,862 A | | 11/1999 | Kacyra et al. | |
| 6,023,323 A | | 2/2000 | Kato et al. | |
| 6,075,883 A | | 6/2000 | Stern et al. | |
| 6,115,114 A | | 9/2000 | Berg et al. | |
| 6,123,264 A | | 9/2000 | Li et al. | |
| 6,166,811 A | | 12/2000 | Long et al. | |
| 6,246,468 B1 | | 6/2001 | Dimsdale | |
| 6,250,551 B1 | | 6/2001 | He et al. | |
| 6,382,515 B1 | * | 5/2002 | Good et al. | 235/472.01 |
| 6,405,925 B2 | | 6/2002 | He et al. | |
| 6,457,642 B1 | * | 10/2002 | Good et al. | 235/462.01 |

OTHER PUBLICATIONS

Pilar Parallel Infrared Laser Range Finder by Cargoscan, http://www.cargoscan.com/Pilar.asp, 2002.

CS900 Measuring Fan by Cargoscan A/S, http://www.cargoscan.com/cs900_fan.asp, 2001, p.1.

Automatic 3D Face Authentication by Beumier et al., Signal & Image Centre, Royal Military Academy, Brussels, 1999, pp. 1–12.

Automatic Face Verification From 3D and Grey Level Clues by Beumier et al., Signal & Image Ctr., Royal Military Academy, Brussels, 1999.

ADA LDI System, LD–500S Brochure and System Description by Adaptive Optics Associates, et. al., Adaptive Optics Associates, Inc., 1999.

The Measurement and Use of Registered Reflectance and Range Data in Scene Analys by Nitzan et al., Selected Papers on Laser Distance Measurements, SPIE Optical Engineering Press, vol. MS115, 1995, pp. 300–314.

Integrated Sensor and Range–Finding Analog Signal Processor by Gruss et al., IEEE Journal of Solid–State Circuits vol. 26(3), 1991, pp. 522–529.

* cited by examiner $R_{ref}$ IS FOR SPECIFYING ONLY POSITION/ORIENTATION OF SCANNERS IN TUNNEL SYSTEM

TUNNEL SCANNER POSITION DATA:

| SCANNER: | ROTATION ANGLE (DEGREES) | | | POSITION COORDINATES (INCHES) | | |
|---|---|---|---|---|---|---|
| | YAW | RITCH | ROLL | X | Y | Z |
| TOP/FRONT | 0 | 80 | 0 | 1 | 73 | -10 |
| TOP/BACK | 0 | 100 | 0 | -1 | 66 | 10 |
| FRONT | 0 | 40 | 0 | 0 | 57 | -40 |
| BACK | 0 | 130 | 0 | 0 | 57 | 40 |
| RIGHT SIDE/FRONT | 60 | 0 | 90 | -45 | 18 | -12 |
| RIGHT SIDE/BACK | 120 | 0 | 90 | -45 | 18 | 12 |
| LEFT SIDE/FRONT | -60 | 0 | 90 | 45 | 18 | -12 |
| LEFT SIDE/BACK | -120 | 0 | 90 | 45 | 18 | 12 |
| L/F CORNER #1 | -138 | 0 | 0 | 44 | 8 | 32 |
| L/F CORNER #2 | -138 | 0 | 0 | 32 | 8 | 70 |
| L/B CORNER #1 | -42 | 0 | 0 | 44 | 8 | -32 |
| L/B CORNER #2 | -42 | 0 | 0 | 32 | 8 | -70 |
| R/F CORNER #1 | 138 | 0 | 0 | -44 | 8 | 32 |
| R/F CORNER #2 | 138 | 0 | 0 | -32 | 8 | 70 |
| R/B CORNER #1 | 42 | 0 | 0 | -44 | 8 | -32 |
| R/B CORNER #2 | 42 | 0 | 0 | -32 | 8 | -70 |

ROTATION OCCUR IN ORDER GIVEN: YAW, PITCH, ROLL
POSITIVE YAW IS FROM R-AXIS TO P-AXIS
POSITIVE PITCH IS FROM Y-AXIS TO R-AXIS
POSITIVE ROLL IS FROM P-AXIS TO Y-AXIS

POSITION COORDINATES ARE OF THE CENTER OF THE DISC WITHIN THE FIXED (X, Y, Z) SYSTEM

FIG. 2C

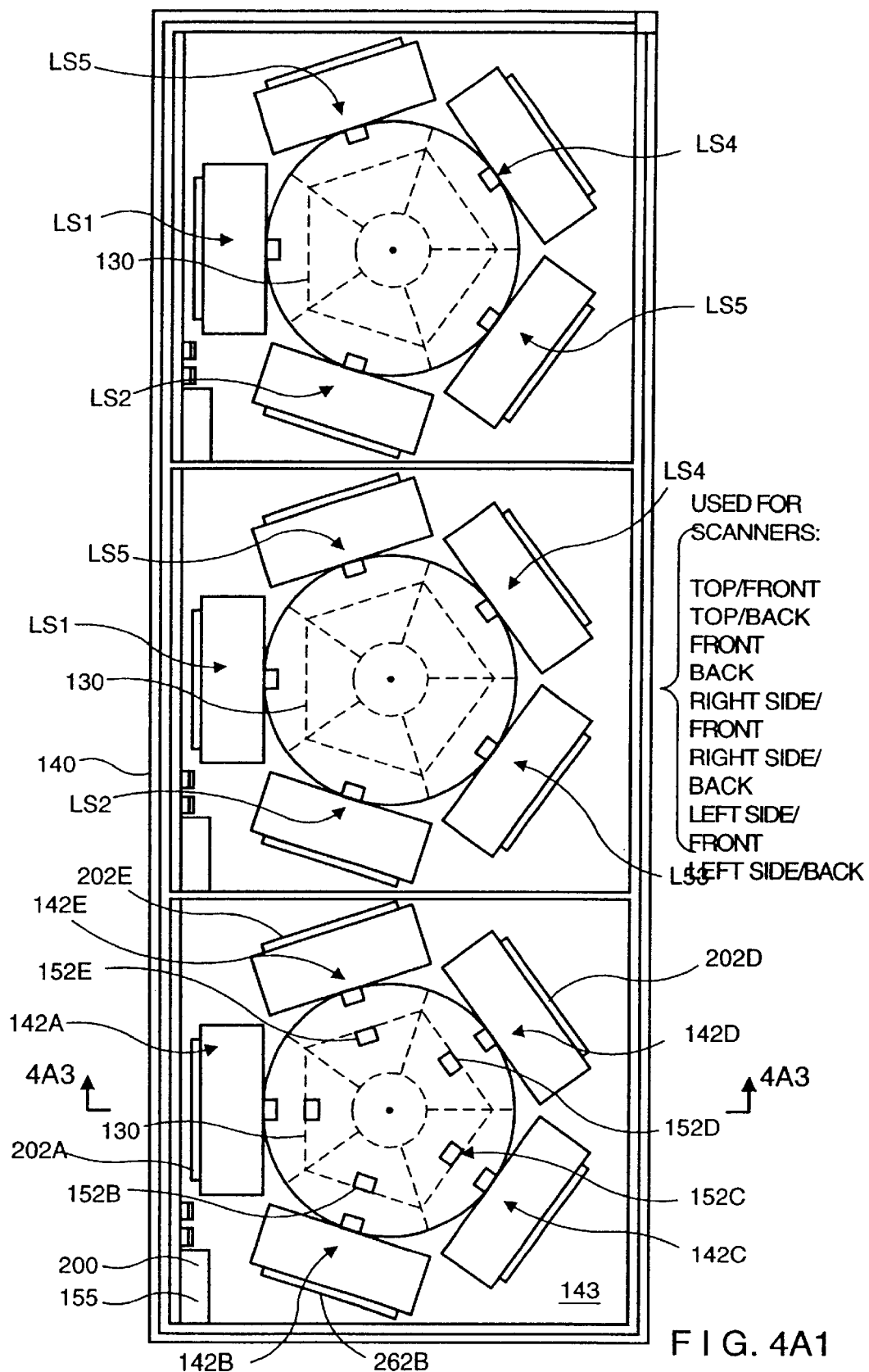
FIG. 4A1

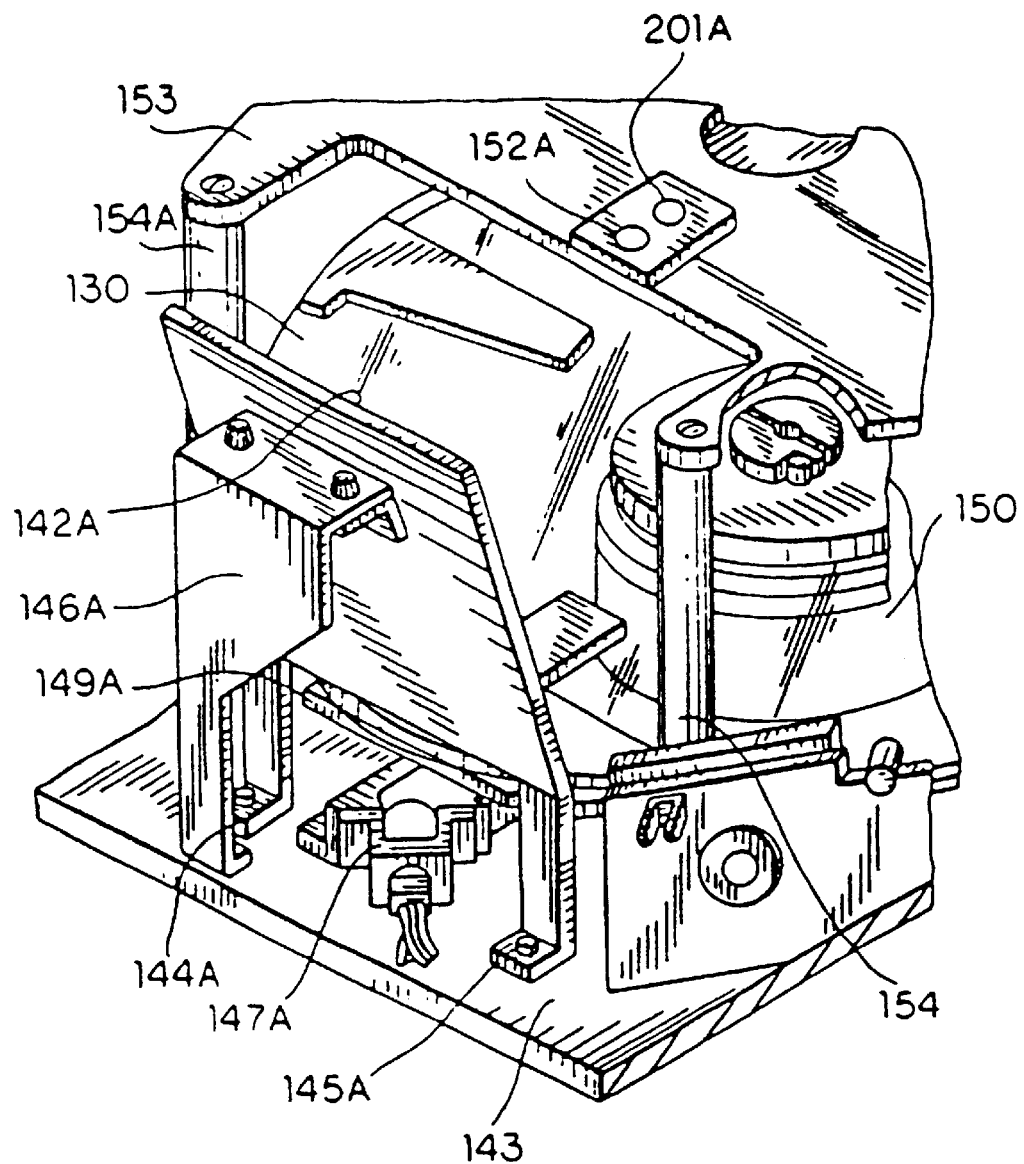
FIG. 4A2

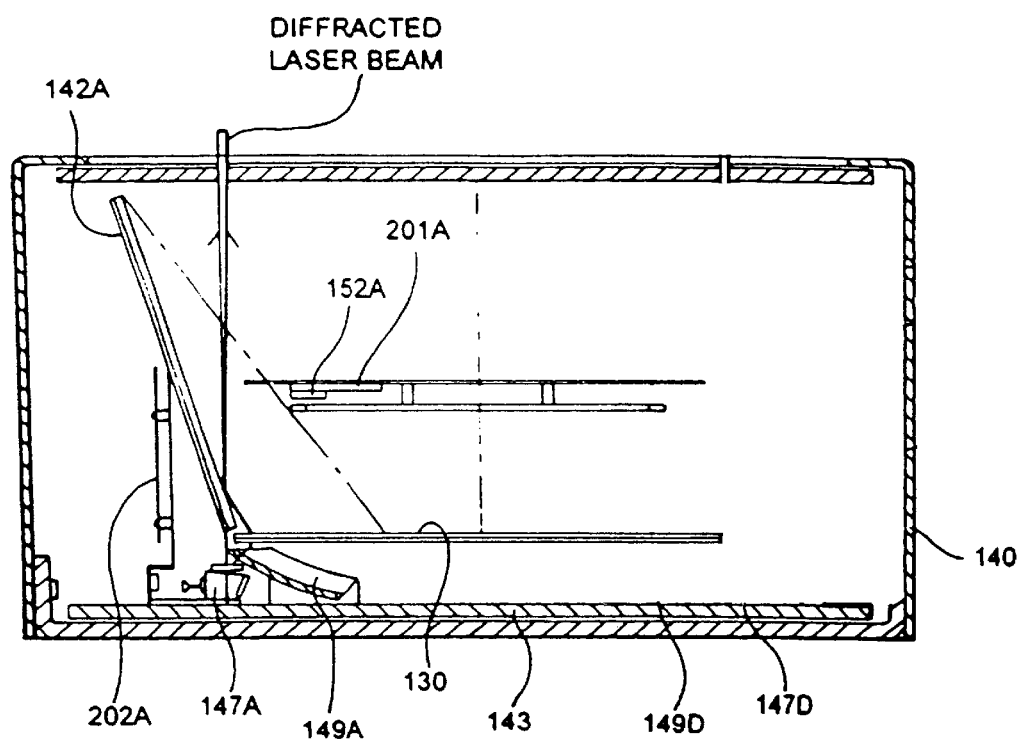
FIG. 4A3

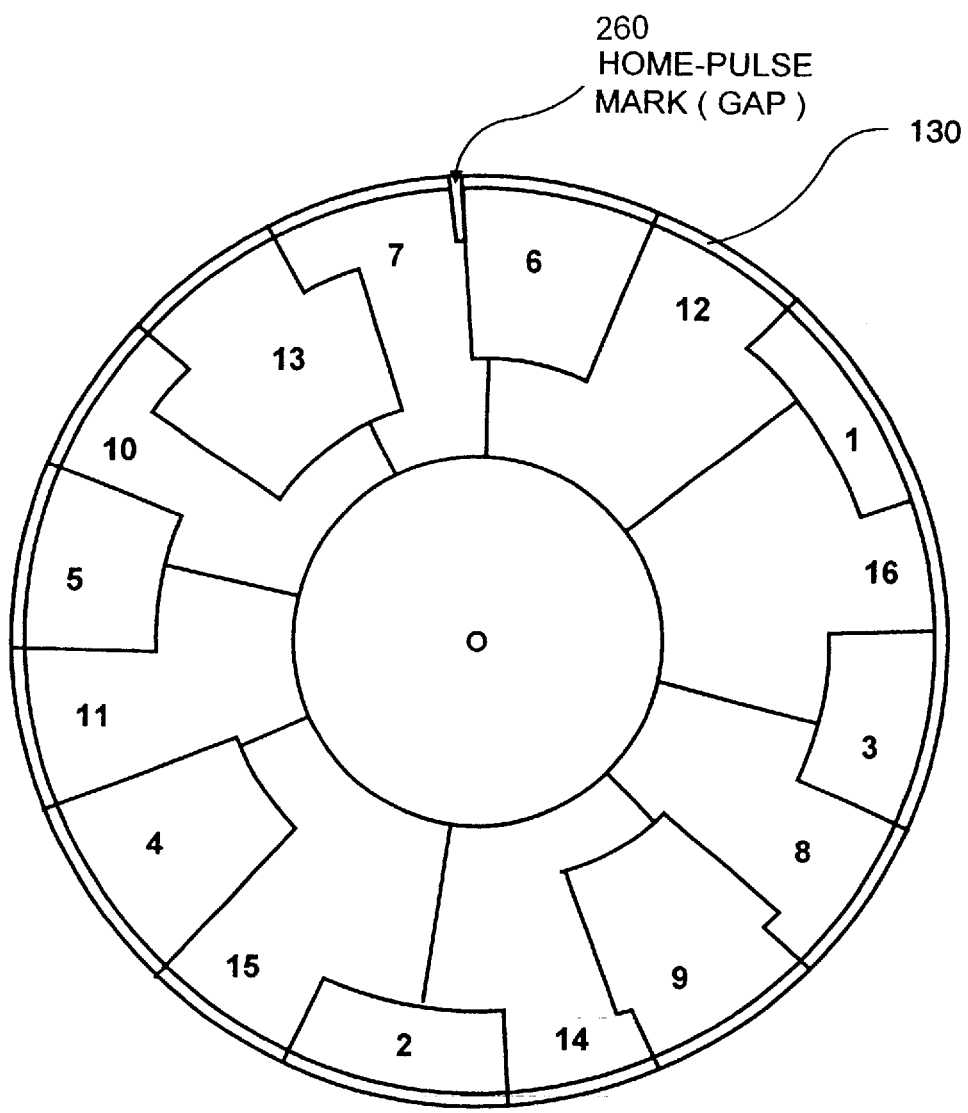
FIG. 4A4

| FACET | DIFFRACTION FOCAL LENGTH (INCHES) | GEOMETRICAL FOCAL LENGTH (INCHES) | ANGLE A (DEGREE) | ANGLE B (DEGREES) | ANGLE OF DIFFRACTION (DEGREES) | ANGLE OF BEAM FROM VERTICAL (DEREES) | SCAN ANGLE (DEGREES) | SCAN MULT. FACTOR (M) | ROTATION ANGLE (DEGREES) |
|---|---|---|---|---|---|---|---|---|---|
| 1 | 49.57 | 49.76 | 45.9 | 61.06 | 28.94 | -3.06 | 29.61 | 1.26 | 23.51 |
| 2 | 49.54 | 49.73 | 45.9 | 55.62 | 34.38 | 2.38 | 29.62 | 1.34 | 22.10 |
| 3 | 49.96 | 50.16 | 45.9 | 50.23 | 39.77 | 7.77 | 29.39 | 1.41 | 20.77 |
| 4 | 50.81 | 51.01 | 45.9 | 44.97 | 45.03 | 13.03 | 28.92 | 1.48 | 19.52 |
| 5 | 49.57 | 49.76 | 45.9 | 61.06 | 28.94 | -3.06 | 29.61 | 1.26 | 23.51 |
| 6 | 49.54 | 49.73 | 45.9 | 55.62 | 34.38 | 2.38 | 29.62 | 1.34 | 22.10 |
| 7 | 49.96 | 50.16 | 45.9 | 50.23 | 39.77 | 7.77 | 29.39 | 1.41 | 20.77 |
| 8 | 50.81 | 51.01 | 45.9 | 44.97 | 45.03 | 13.03 | 28.92 | 1.48 | 19.52 |
| 9 | 59.06 | 59.38 | 45.9 | 60.56 | 29.44 | -2.56 | 25.01 | 1.25 | 19.94 |
| 10 | 59.04 | 59.36 | 45.9 | 56.00 | 34.00 | 2.00 | 25.02 | 1.32 | 18.93 |
| 11 | 59.39 | 59.72 | 45.9 | 51.47 | 38.53 | 6.53 | 24.88 | 1.39 | 17.96 |
| 12 | 60.10 | 60.44 | 45.9 | 47.01 | 42.99 | 10.99 | 24.59 | 1.44 | 17.04 |
| 13 | 59.06 | 59.38 | 45.9 | 60.56 | 29.44 | -2.56 | 25.01 | 1.25 | 19.94 |
| 14 | 59.04 | 59.36 | 45.9 | 56.00 | 34.00 | 2.00 | 25.02 | 1.32 | 18.93 |
| 15 | 59.39 | 59.72 | 45.9 | 51.47 | 38.53 | 6.53 | 24.88 | 1.39 | 17.96 |
| 16 | 60.10 | 60.44 | 45.9 | 47.01 | 42.99 | 10.99 | 24.59 | 1.44 | 17.04 |

FIG. 4A5

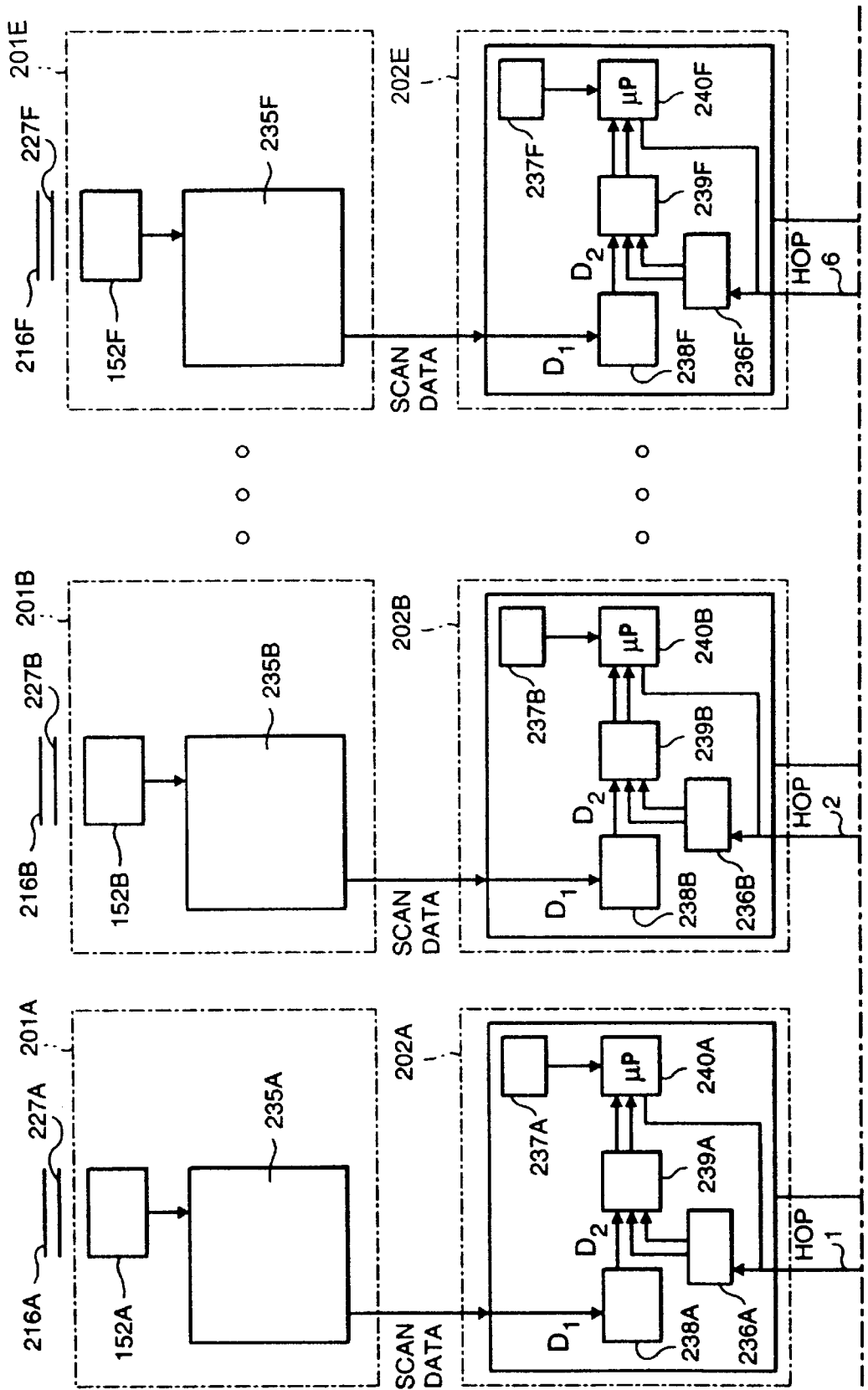
FIG. 4A6A

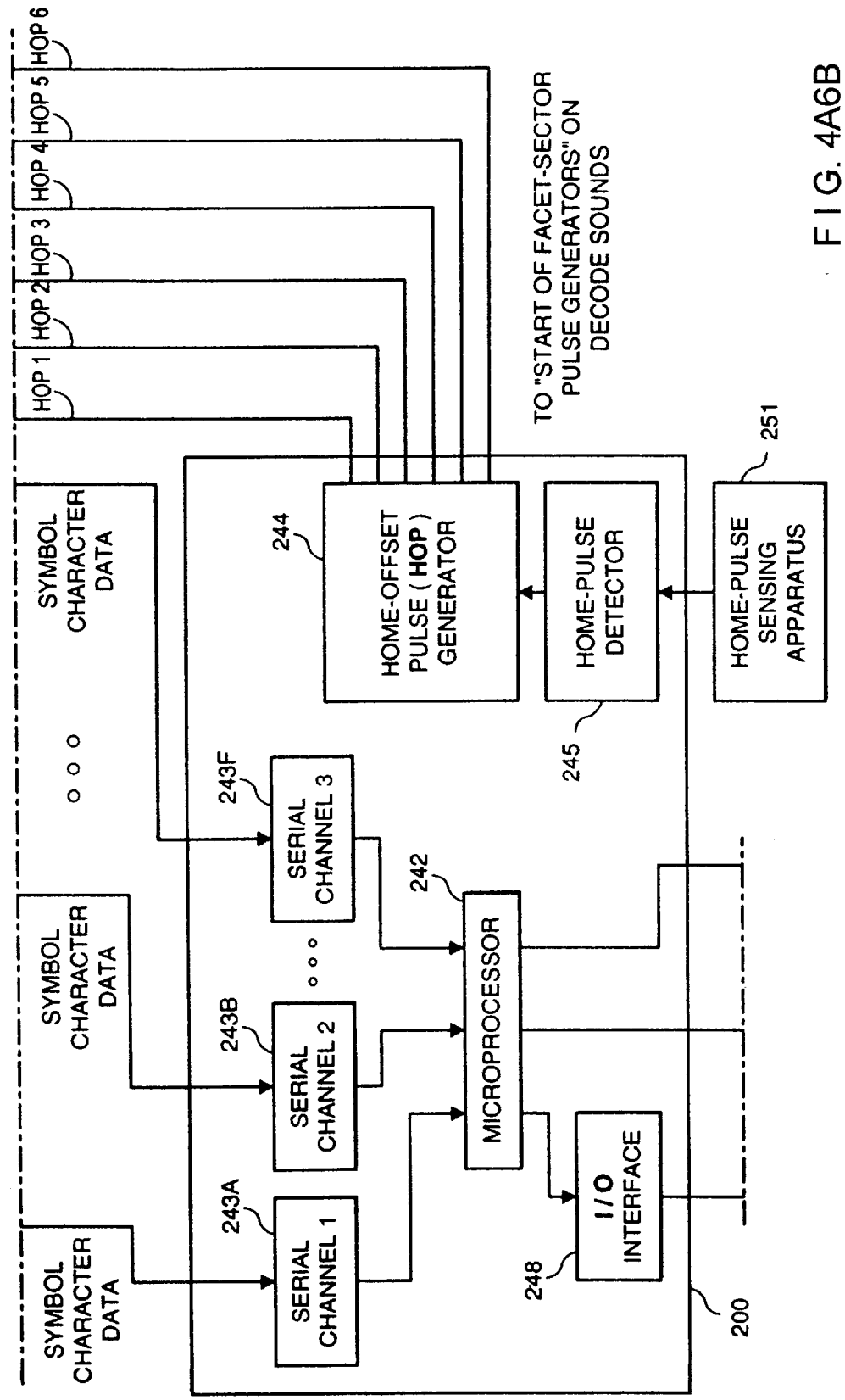
FIG. 4A6B

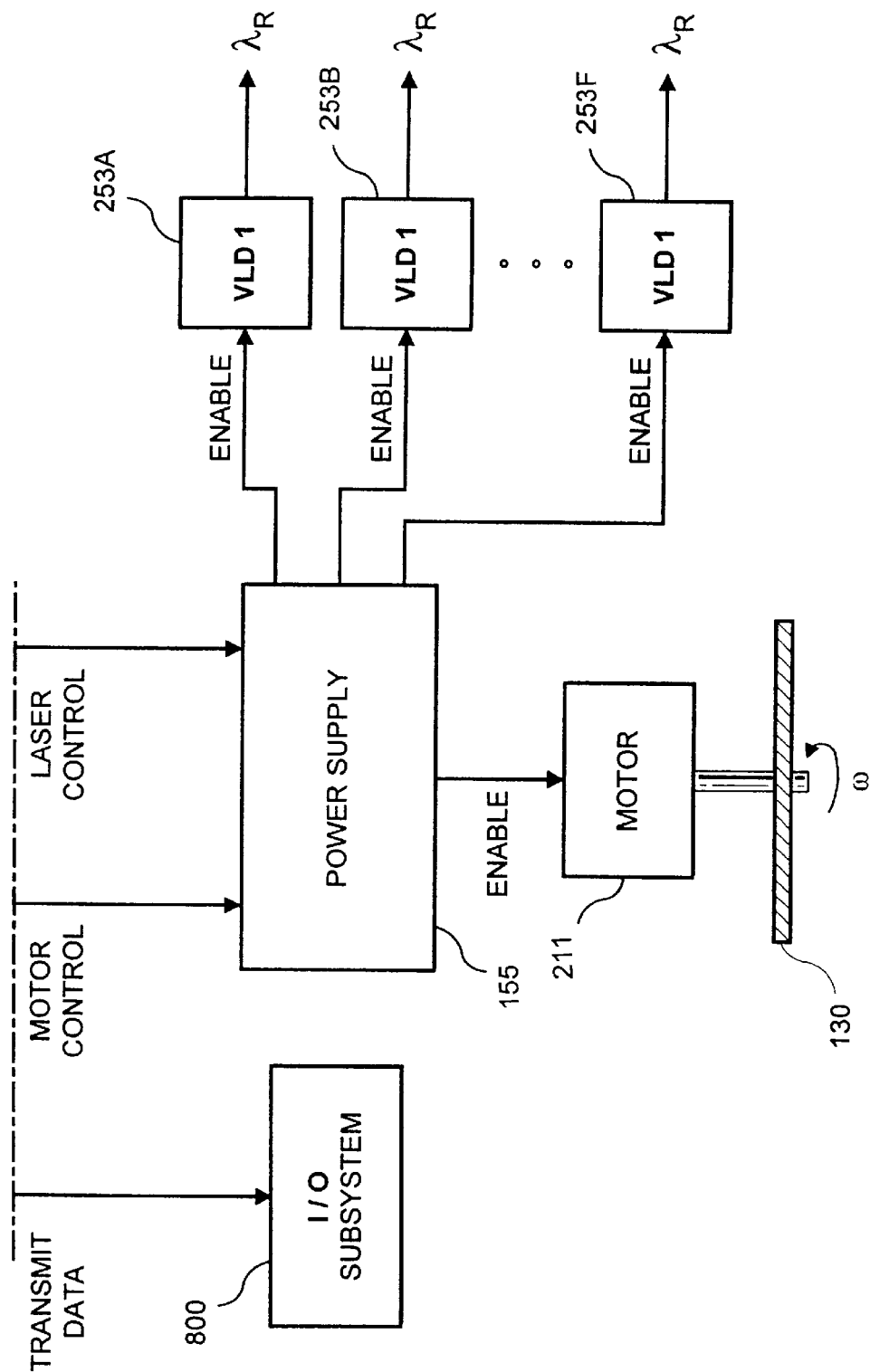
FIG. 4A6C

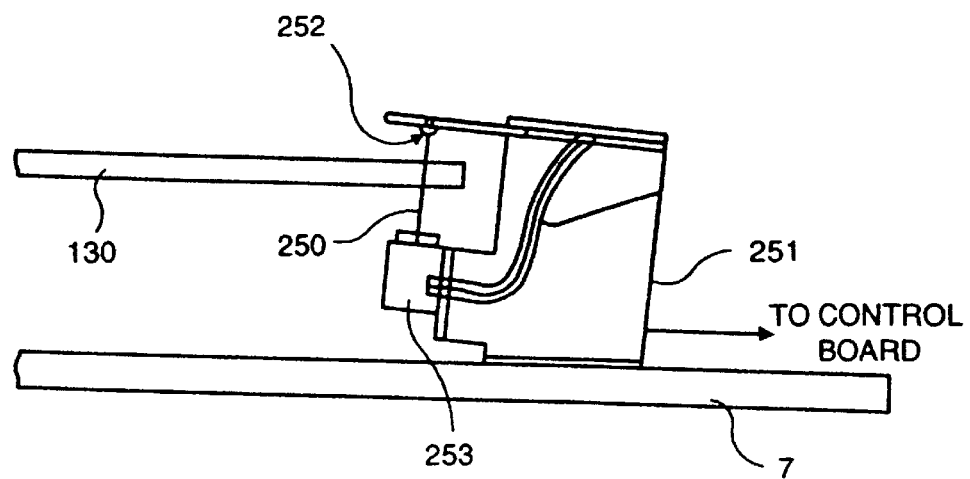
F I G. 4A7A
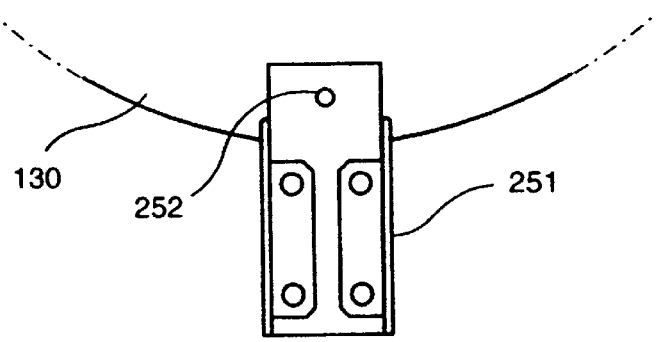
F I G. 4A7B

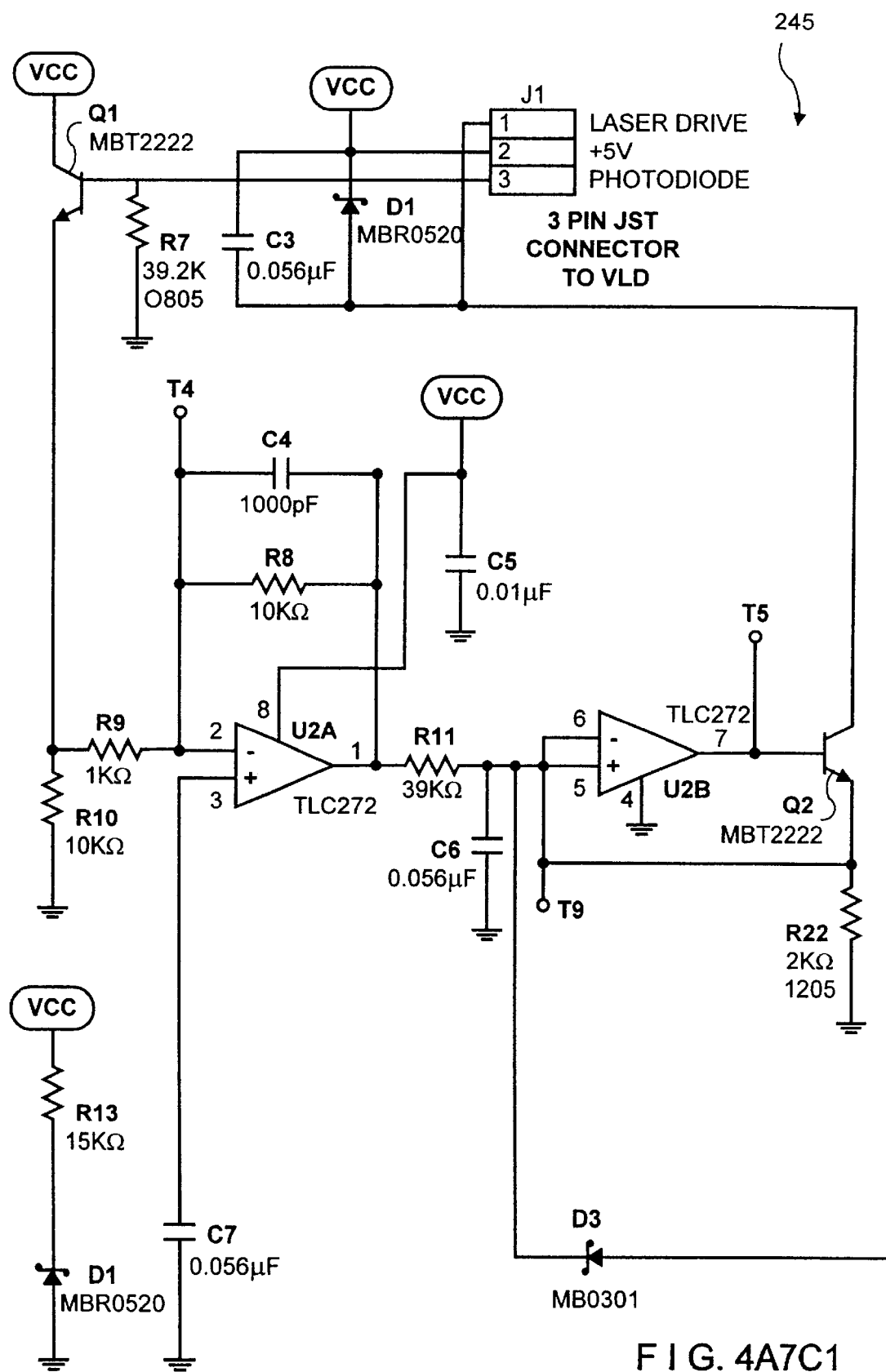
FIG. 4A7C1

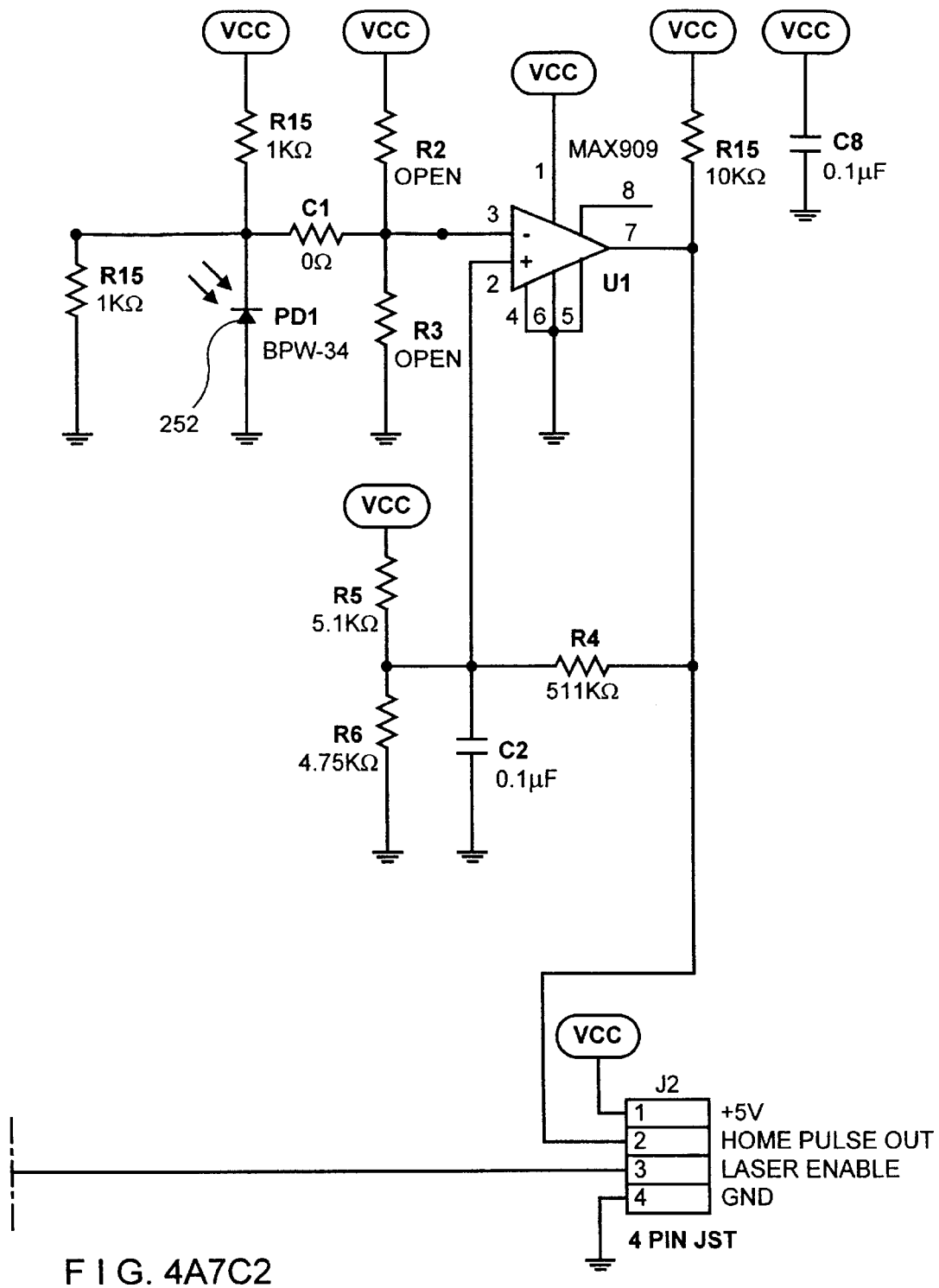
FIG. 4A7C2

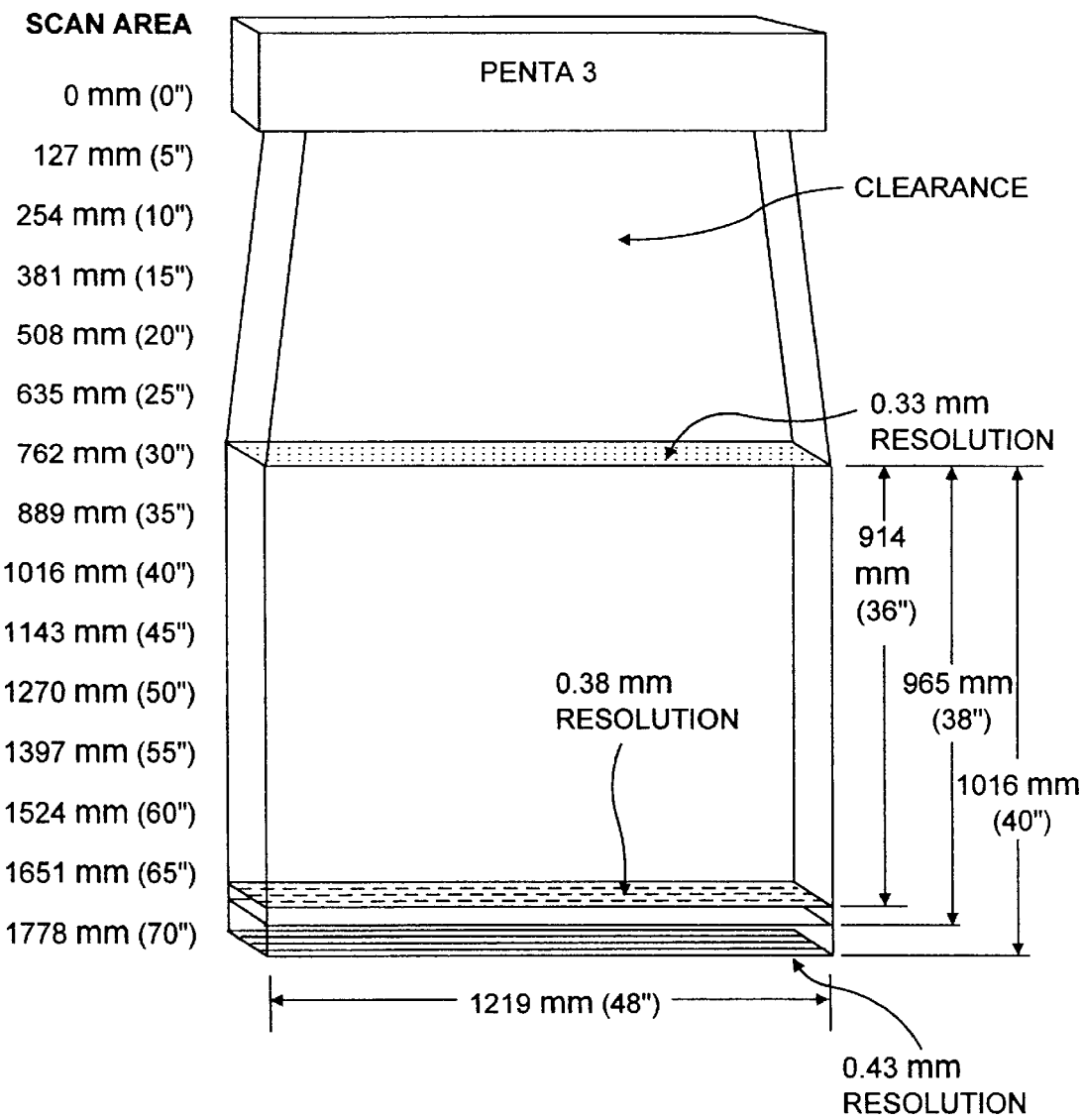
FIG. 4A8A

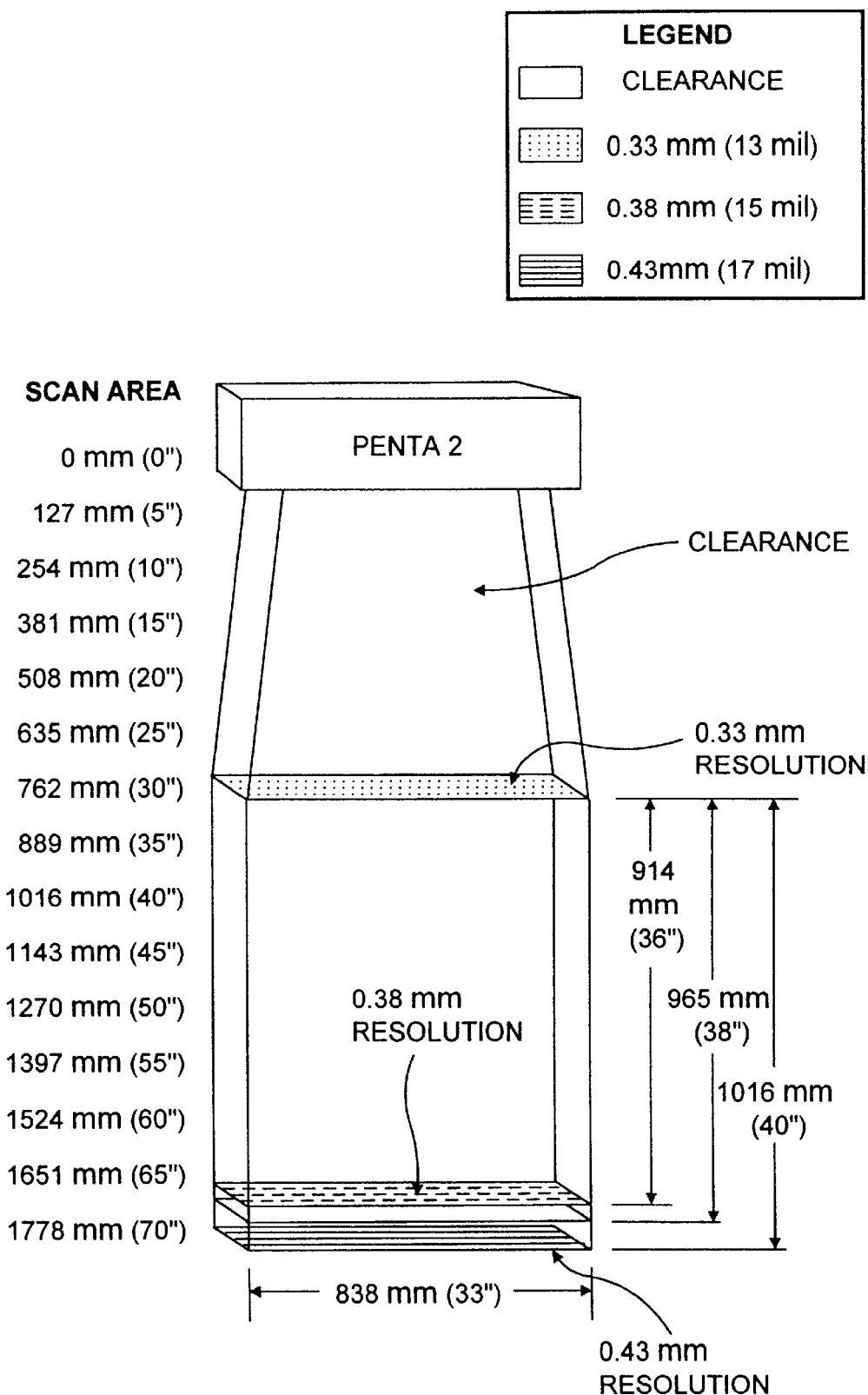
FIG. 4A8B

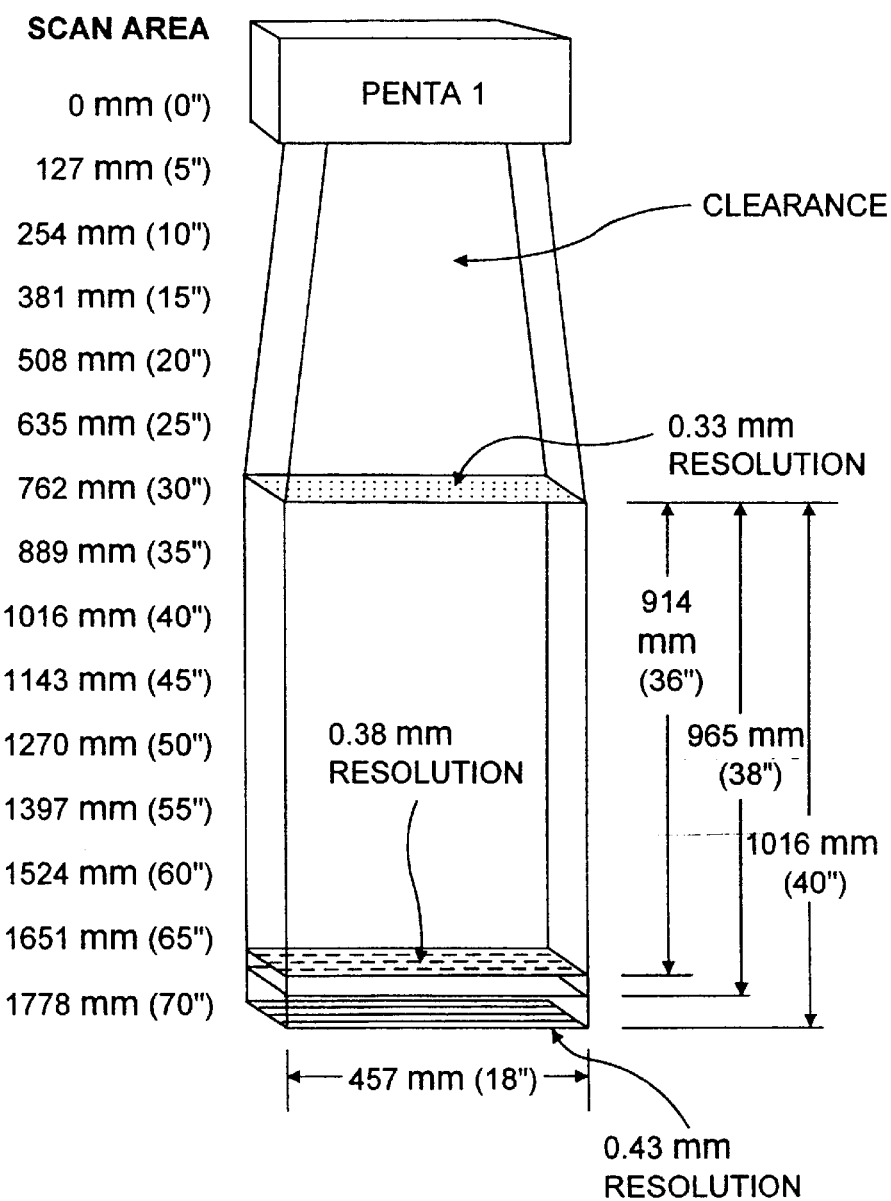
FIG. 4A8C

| SPECIFICATIONS FOR PENTA 1, PENTA 2, AND PENTA 3 SCANNERS ||
|---|---|
| OPERATIONAL ||
| LIGHT SOURCE | 5 VISIBLE LASER DIODES 858 ± 5 mm |
| LASER POWER | 8.4 mW (PEAK): LESS THEN 1 mW AVERAGE POWER |
| DEPTH OF SCAN FIELD | 914 mm (36") FOR 0.33 mm (13 mil) BAR CODES<br>965 mm (38") FOR 0.38 mm (15 mil) BAR CODES<br>1,016 mm (40") FOR 0.43 mm (17 mil) BAR CODES |
| WIDTH OF SCAN FIELD | PENTA 1: 457 mm (18")<br>PENTA 2: 838 mm (33")<br>PENTA 3: 1,219 mm (48") |
| SCAN SPEED | PENTA 1: 6,930 scan lines per second<br>PENTA 2: 13,860 scan lines per second<br>PENTA 3: 20,790 scan lines per second |
| SCAN PATTERN | OMNIDIRECTIONAL FIVE-SIDED PENTAGON SCAN PATTERN<br>PENTA 1: 20 SCAN LINES REPEATED AT FOUR DISTANCES (80 TOTAL)<br>PENTA 2: 40 SCAN LINES REPEATED AT FOUR DISTANCES (160 TOTAL)<br>PENTA 3: 60 SCAN LINES REPEATED AT FOUR DISTANCES (240 TOTAL) |
| MINIMUM BAR WIDTH | 0.33 mm (13 mil) |
| DECODE CAPABILITY | AUTODISCRIMINATES ALL STANDARD BAR CODES |
| SYSTEM INTERFACES | RS232. POINT TO POINT. RS422. LIGHT PEN EMULATION |
| PRINT CONTRAST | 35% MINIMUM REFLECTANCE DIFFERENCE |
| NUMBER CHARACTERS READ | UP TO 60 DATA CHARACTERS<br>(MAXIMUM NUMBER WILL VARY BASED ON SYMBOLOGY AND DENSITY) |
| ASPECT RATIO | UP TO 2.6 : 1 |

FIG. 4A8D

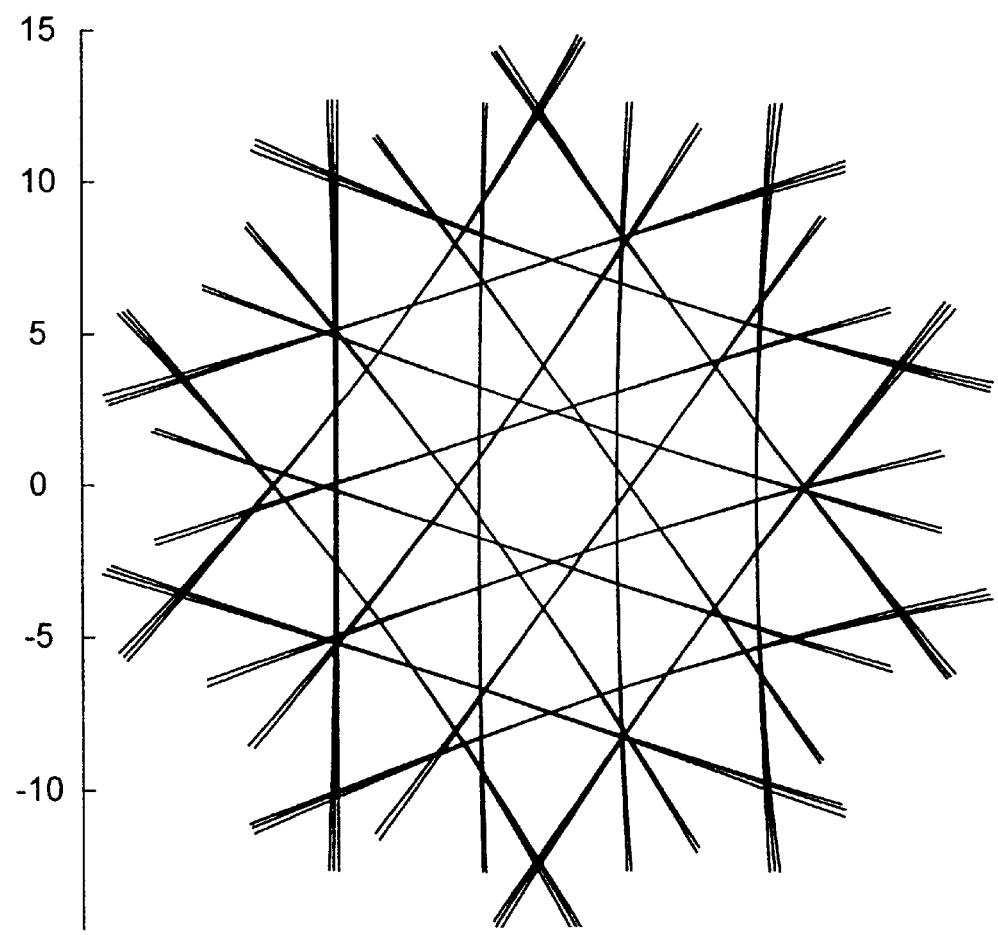
F I G. 4A9

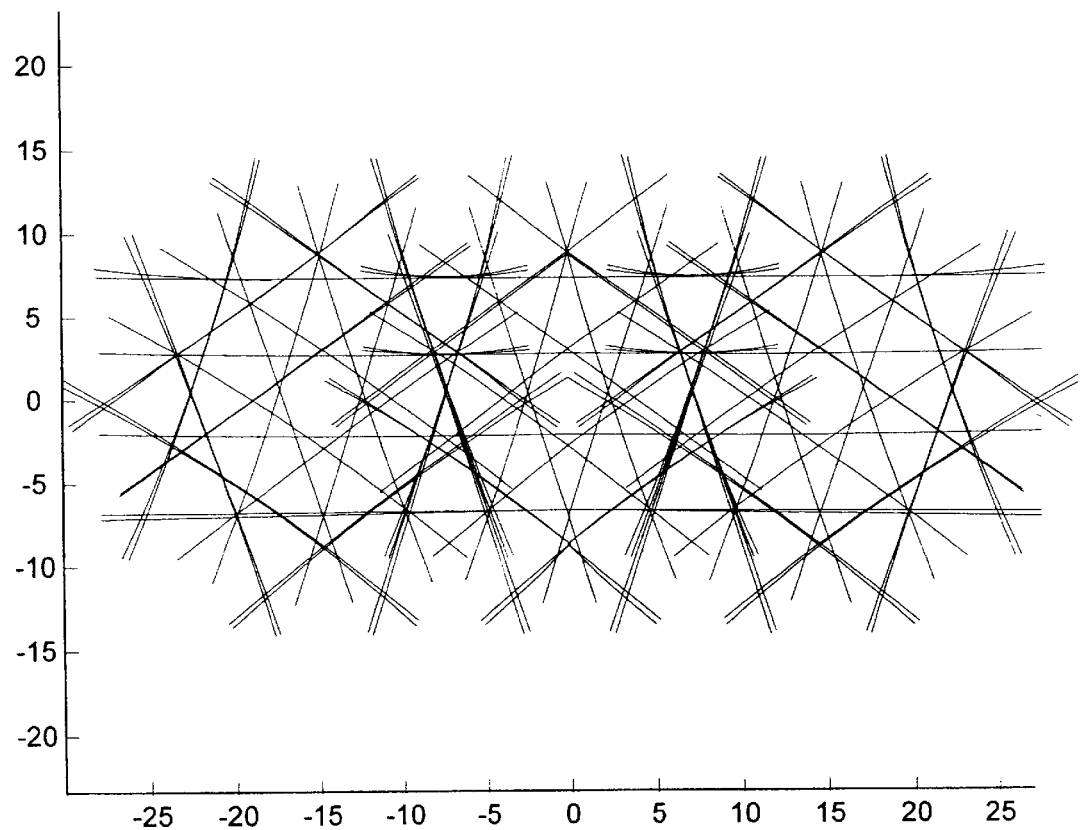
FIG. 4A10

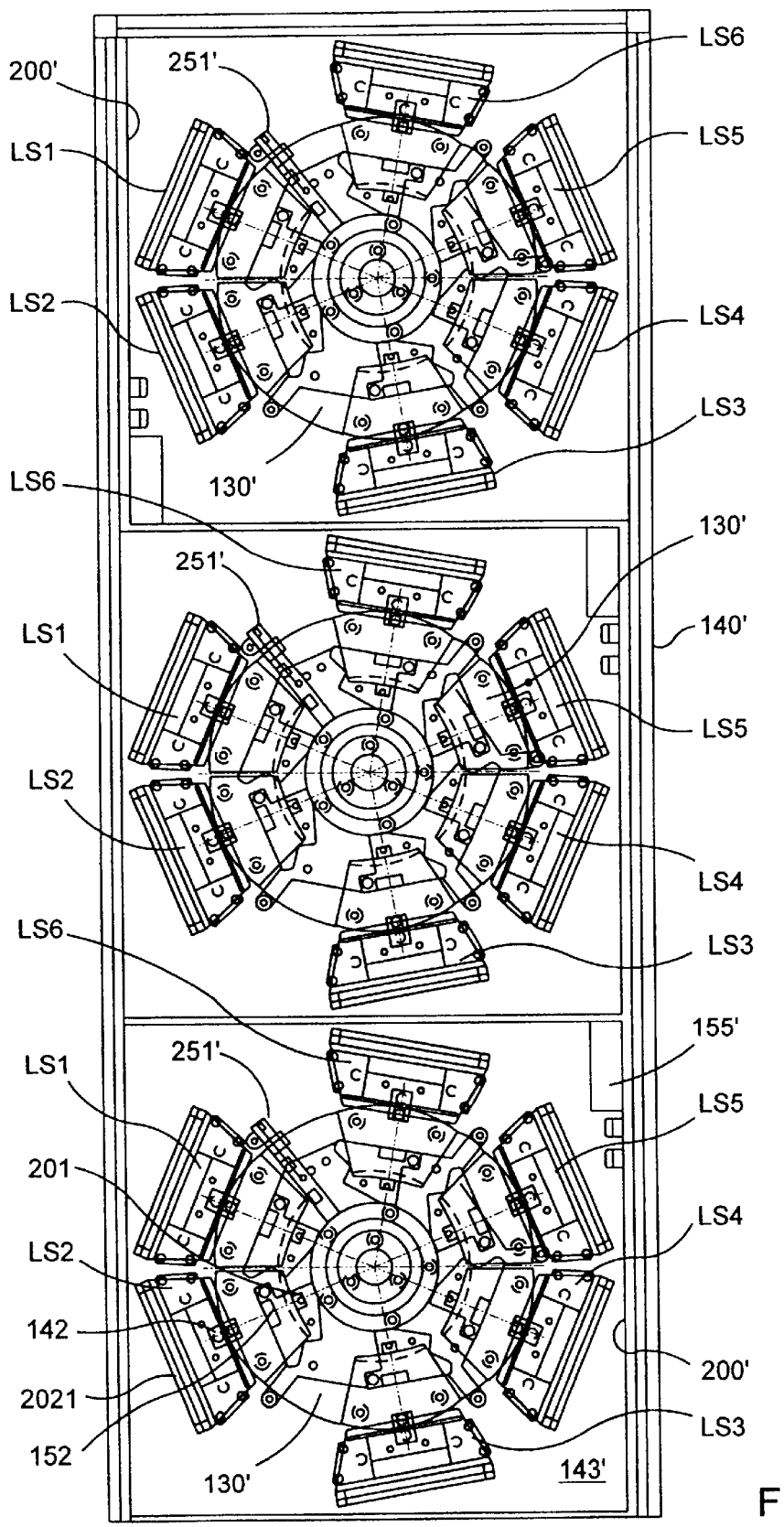
USED FOR SCANNERS:
L/F CORNER #1
L/F CORNER #2
L/B CORNER #1
L/B CORNER #2
R/F CORNER #1
R/F CORNER #2
R/B CORNER #1
R/B CORNER #2
FIG. 4B1

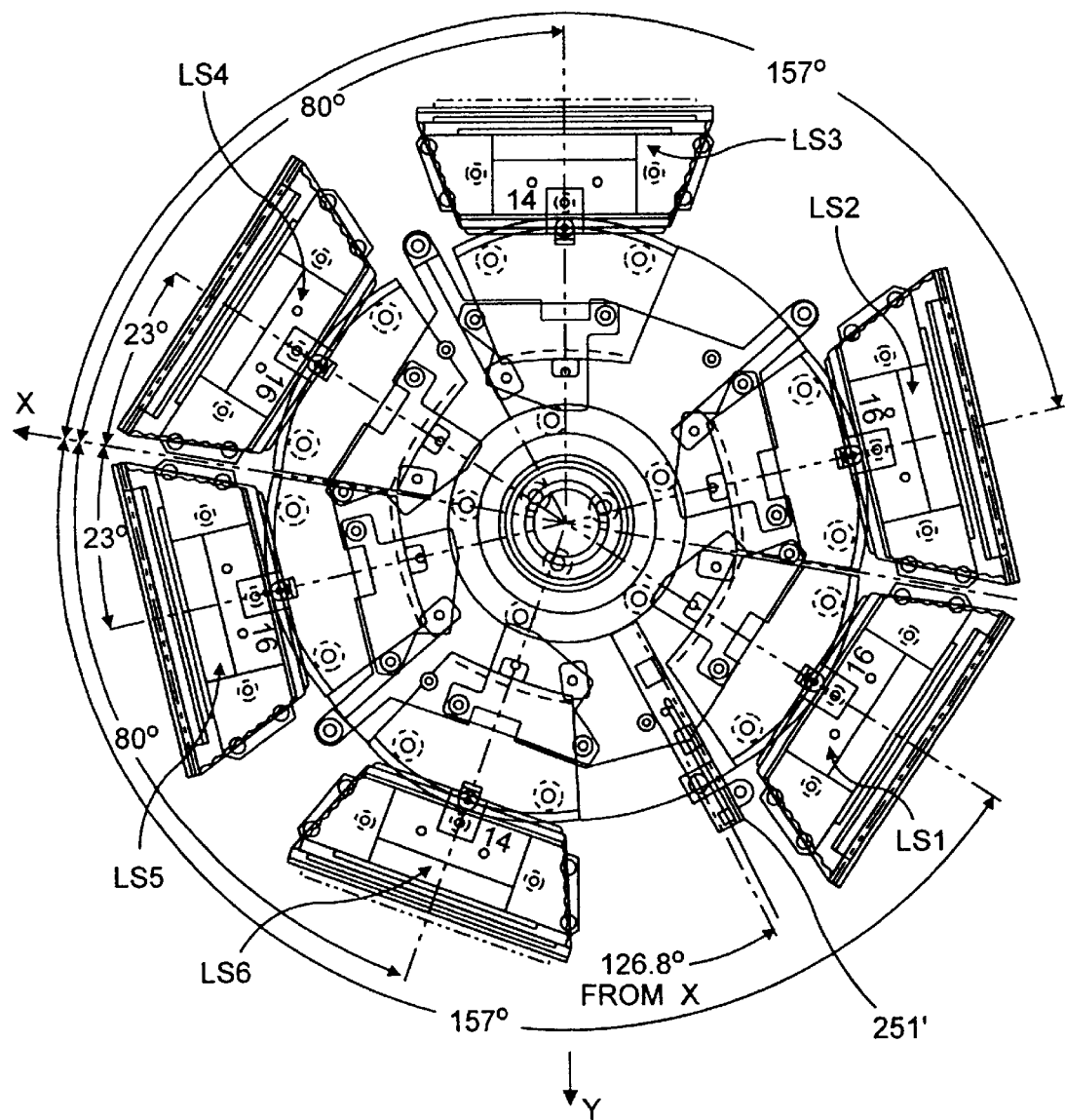
FIG. 4B1A

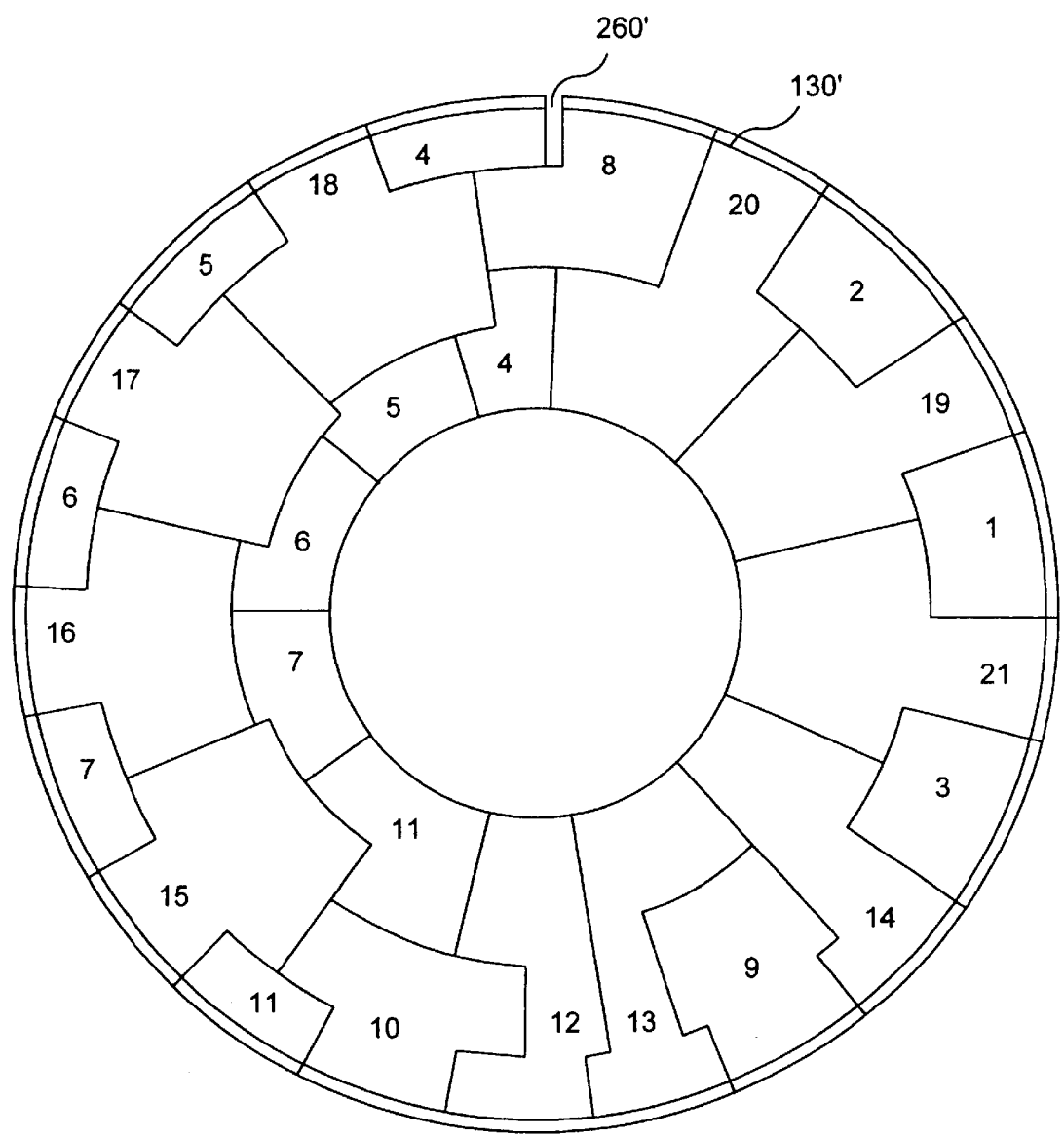
FIG. 4B2

FIG. 4B3A

DISK ORTHO42-7-1.3.XIS

ROTATIONAL SPEED OF DISK (RPM): 5200
658 nm

| FACET | DIFFRACTION FOCAL LENGTH (INCHES) | GEOMETRICAL FOCAL LENGTH (INCHES) | ANGLE A (DEGREE) | ANGLE B (DEGREES) | ANGLE OF DIFFRACTION (DEGREES) | ANGLE OF BEAM FROM VERTICAL (DEREES) | SCAN ANGLE (DEGREES) |
|---|---|---|---|---|---|---|---|
| 1 | 42.12 | 44.26 | 45.9 | 62.28 | 27.72 | -4.28 | 23.31 |
| 2 | 44.06 | 44.18 | 45.9 | 60.59 | 29.41 | -2.59 | 23.36 |
| 3 | 44.01 | 44.14 | 45.9 | 58.90 | 31.10 | -0.90 | 23.37 |
| 4 | 44.00 | 44.14 | 45.9 | 57.21 | 32.79 | 0.79 | 23.37 |
| 5 | 44.04 | 44.18 | 45.9 | 56.62 | 34.48 | 2.48 | 23.36 |
| 6 | 44.12 | 44.26 | 45.9 | 53.83 | 36.17 | 4.17 | 23.31 |
| 7 | 44.23 | 44.37 | 45.9 | 52.15 | 37.85 | 5.85 | 23.25 |
| 8 | 55.10 | 55.37 | 45.9 | 61.43 | 28.57 | -3.43 | 18.76 |
| 9 | 55.04 | 56.37 | 45.9 | 60.08 | 29.92 | -2.08 | 18.78 |
| 10 | 55.00 | 55.31 | 45.9 | 58.72 | 31.28 | -0.72 | 18.79 |
| 11 | 55.00 | 55.27 | 45.9 | 57.37 | 32.63 | 0.63 | 18.79 |
| 12 | 55.03 | 55.30 | 45.9 | 56.01 | 33.99 | 1.99 | 18.78 |
| 13 | 55.09 | 55.36 | 45.9 | 54.66 | 35.34 | 3.34 | 18.76 |
| 14 | 55.18 | 55.46 | 45.9 | 63.32 | 36.68 | 4.68 | 18.73 |
| 15 | 66.08 | 66.55 | 45.9 | 60.86 | 29.14 | -2.86 | 15.68 |
| 16 | 66.03 | 66.50 | 45.9 | 59.73 | 30.27 | -1.73 | 15.69 |
| 17 | 66.00 | 66.47 | 45.9 | 58.60 | 31.40 | -0.60 | 15.70 |
| 18 | 66.00 | 66.47 | 45.9 | 57.47 | 32.63 | 0.63 | 15.70 |
| 19 | 66.03 | 66.50 | 45.9 | 56.34 | 33.66 | 1.66 | 15.69 |
| 20 | 66.08 | 66.55 | 45.9 | 55.22 | 34.78 | 2.78 | 15.68 |
| 21 | 66.15 | 66.62 | 45.9 | 54.09 | 35.91 | 3.91 | 15.66 |

| FACET | SCAN MULT. FACTOR (M) | ROTATION ANGLE (DEGREES) | ACCOUNTING FOR DEAD TIME FOR LASER BEAM 2.34(DEGREES) | LIGHT COLLECTION FACTOR | MAXIMUM COLLECTION AREA IGNORING NOTCH) (SQ IN) | DESIGN COLLECTION AREA (INCLUDES NOTCH LOSS OF 0.15SQ INCHES) | 42 = TILT ANGLE OF CENTER RAY RELATIVE TO: (BEAM SPEEDS ARE ALL AT THE WORST CASE, END OF SCAN) | | |
|---|---|---|---|---|---|---|---|---|---|
| | | | | | | | BEAM SPEED AT THE FOCAL PLANE (INCHES/SEC) | BEAM SPEED AT MAX DEPTH OF FIELD (INCHES/SEC) | BEAM SPEED AT MIN DEPTH OF FIELD (INCHES/SEC) |
| 1 | 1.25 | 18.64 | 20.98 | 1.00 | 1.19 | 1.26 | 50694 | 53647 | 47822 |
| 2 | 1.28 | 18.29 | 20.83 | 1.04 | 1.24 | 1.31 | 51682 | 54615 | 48749 |
| 3 | 1.30 | 17.95 | 20.29 | 1.09 | 1.30 | 1.36 | 52683 | 55476 | 49690 |
| 4 | 1.33 | 17.61 | 19.95 | 1.16 | 1.37 | 1.43 | 53696 | 56747 | 50646 |
| 5 | 1.35 | 17.27 | 19.62 | 1.21 | 1.45 | 1.50 | 54721 | 57827 | 51615 |
| 6 | 1.38 | 16.95 | 19.29 | 1.29 | 1.54 | 1.59 | 55767 | 58917 | 52597 |
| 7 | 1.40 | 16.62 | 16.97 | 1.38 | 1.65 | 1.79 | 56803 | 60014 | 53593 |
| 8 | 1.25 | 15.06 | 17.40 | 1.59 | 1.90 | 1.92 | 59884 | 62601 | 57167 |
| 9 | 1.27 | 14.83 | 17.17 | 1.65 | 1.97 | 1.98 | 60822 | 63685 | 58059 |
| 10 | 1.29 | 14.60 | 16.84 | 1.71 | 2.04 | 2.05 | 61772 | 64580 | 58964 |
| 11 | 1.31 | 14.38 | 16.72 | 1.78 | 2.13 | 2.13 | 62734 | 65586 | 59882 |
| 12 | 1.33 | 14.16 | 16.50 | 1.87 | 2.23 | 2.22 | 63707 | 66601 | 60813 |
| 13 | 1.36 | 13.94 | 16.28 | 1.96 | 2.33 | 2.33 | 64691 | 67627 | 61756 |
| 14 | 1.37 | 13.72 | 16.07 | 2.06 | 2.46 | 2.44 | 65687 | 68662 | 62711 |
| 15 | 1.24 | 12.62 | 14.96 | 2.33 | 2.78 | 2.74 | 69335 | 71958 | 66711 |
| 16 | 1.26 | 12.46 | 14.80 | 2.40 | 2.76 | 2.81 | 70244 | 72903 | 67584 |
| 17 | 1.28 | 12.30 | 14.64 | 2.47 | 2.95 | 2.90 | 71164 | 73869 | 68468 |
| 18 | 1.29 | 12.14 | 14.48 | 2.56 | 3.05 | 3.00 | 72094 | 74825 | 69364 |
| 19 | 1.31 | 11.98 | 14.33 | 2.66 | 3.17 | 3.10 | 73036 | 75801 | 70270 |
| 20 | 1.33 | 11.83 | 14.17 | 2.76 | 3.29 | 3.22 | 73987 | 76786 | 71188 |
| 21 | 1.34 | 11.67 | 14.02 | 2.88 | 3.43 | 3.36 | 74949 | 77781 | 72116 |

FIG. 4B3B

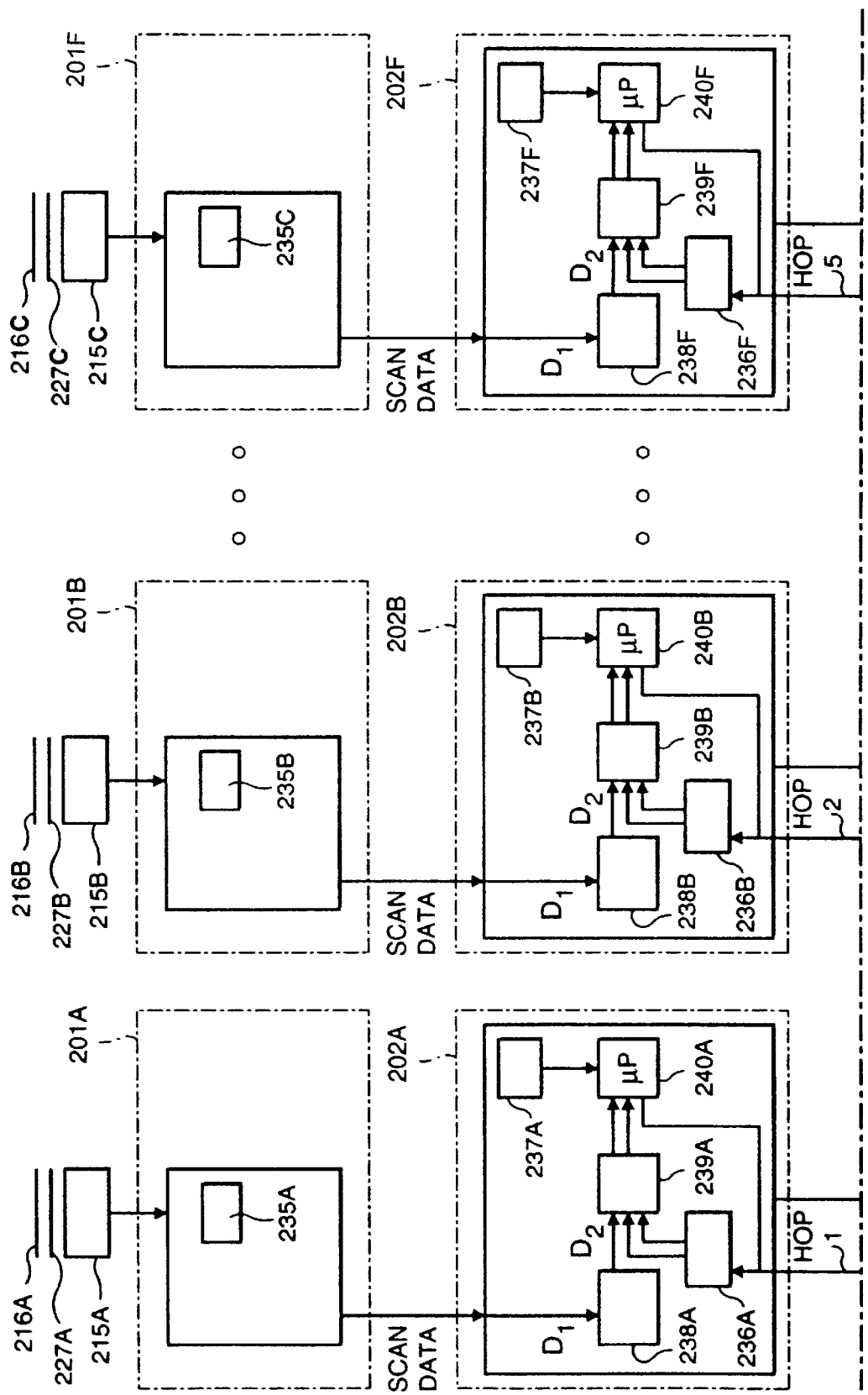

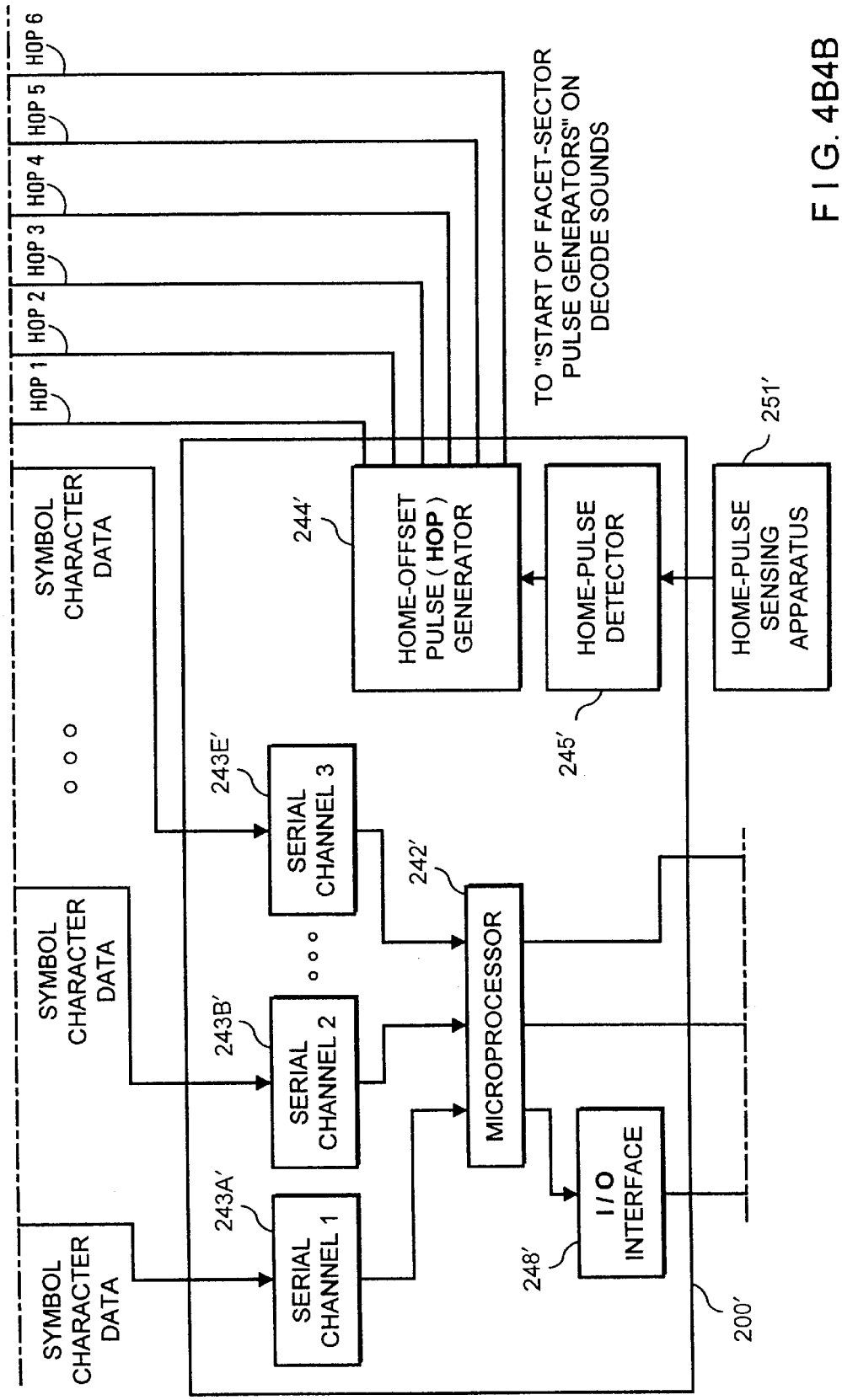
FIG. 4B4B

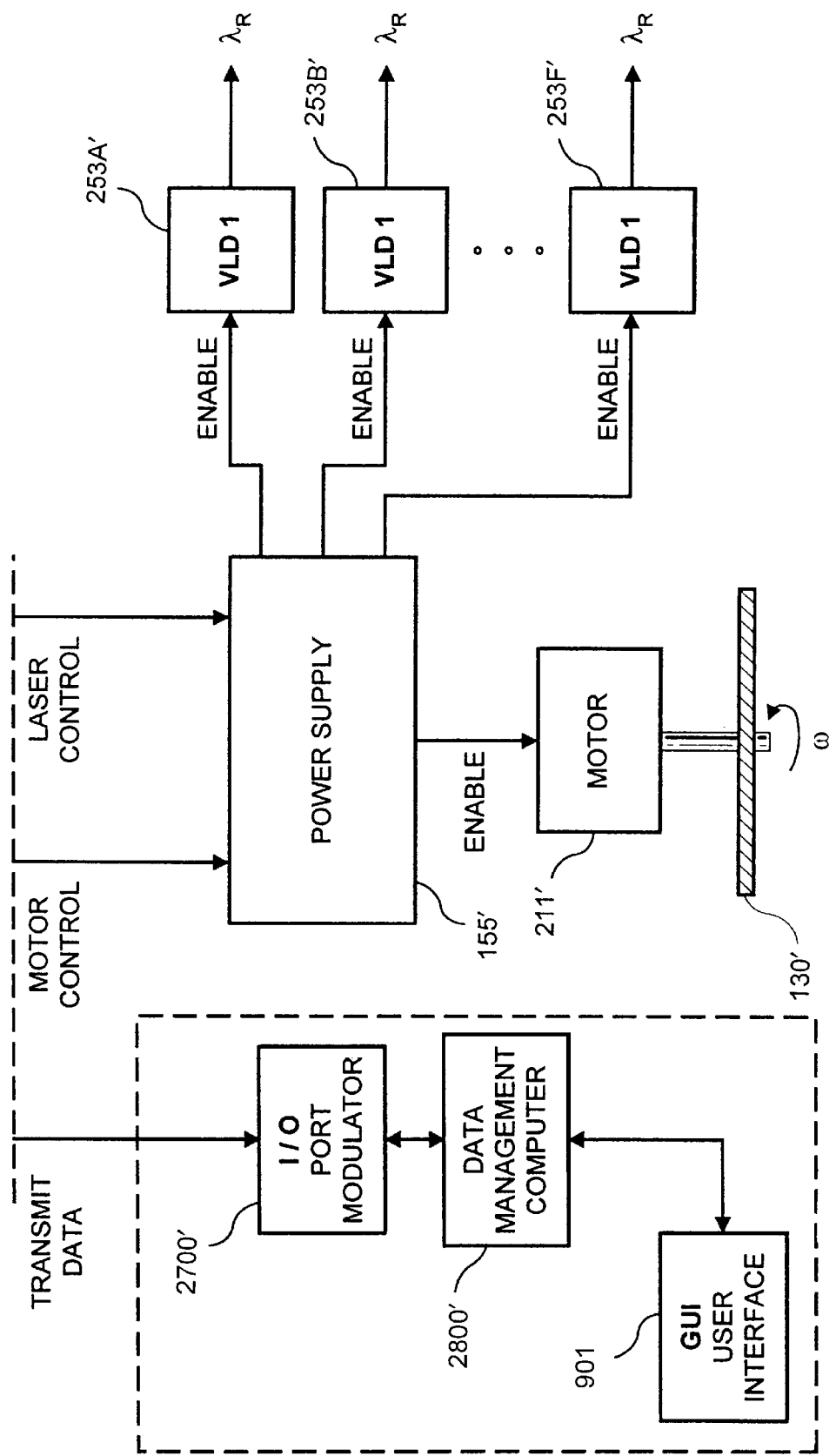
FIG. 4B4C

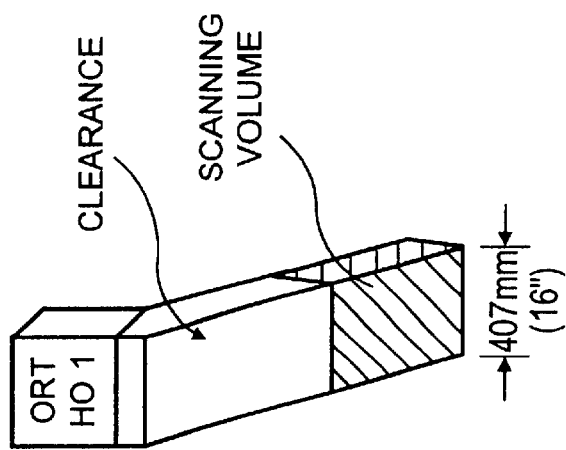
FIG. 4B5C
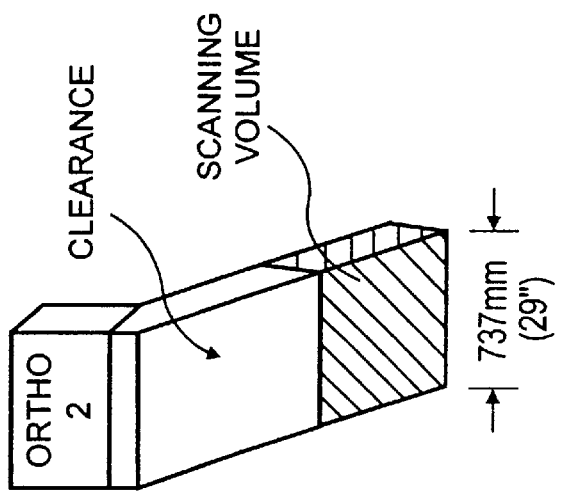
FIG. 4B5B
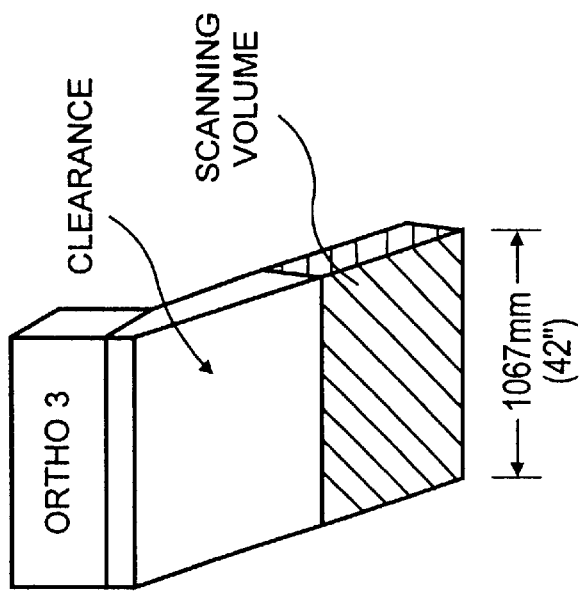
FIG. 4B5A

| SPECIFICATIONS FOR ORTHO 3, ORTHO 2, AND ORTHO 1 SCANNERS ||
|---|---|
| OPERATIONAL ||
| LIGHT SOURCE | 6 VISIBLE LASER DIODES 858 + 5 mm |
| LASER POWER | 8.4 mW (PEAK): LESS THEN 1 mW AVERAGE POWER |
| DEPTH OF SCAN FIELD | 584 mm (23") FOR 0.33 mm (13 mil) BAR CODES |
| WIDTH OF SCAN FIELD | ORTHO 1: 406 mm (16")<br>ORTHO 2: 737 mm (29")<br>ORTHO 3: 1,067 mm (42") |
| SCAN SPEED | ORTHO 1: 7,280 scan lines per second<br>ORTHO 2: 14,560 scan lines per second<br>ORTHO 3: 21,840 scan lines per second |
| SCAN PATTERN | OMNIDIRECTIONAL SIX-LINE ORTHOGONAL SCAN PATTERN<br>ORTHO 1: 21 SCAN LINES REPEATED AT THREE DISTANCES (63 TOTAL)<br>ORTHO 2: 42 SCAN LINES REPEATED AT THREE DISTANCES (126 TOTAL)<br>ORTHO 3: 63 SCAN LINES REPEATED AT THRE DISTANCES (189 TOTAL) |
| MINIMUM BAR WIDTH | 0.33 mm (13 mil) |
| DECODE CAPABILITY | AUTODISCRIMINATES ALL STANDARD BAR CODES |
| SYSTEM INTERFACES | RS232. POINT-TO-POINT RS422. LIGHT PEN EMULATION |
| PRINT CONTRAST | 35% MINIMUM REFLECTANCE DIFFERENCE |
| NUMBER CHARACTERS READ | UP TO 60 DATA CHARACTERS<br>(MAXIMUM NUMBER WILL VARY BASED ON SYMBOLOGY AND DENSITY) |
| ASPECT RATIO | UP TO 2.6 : 1 |

FIG. 4B5D

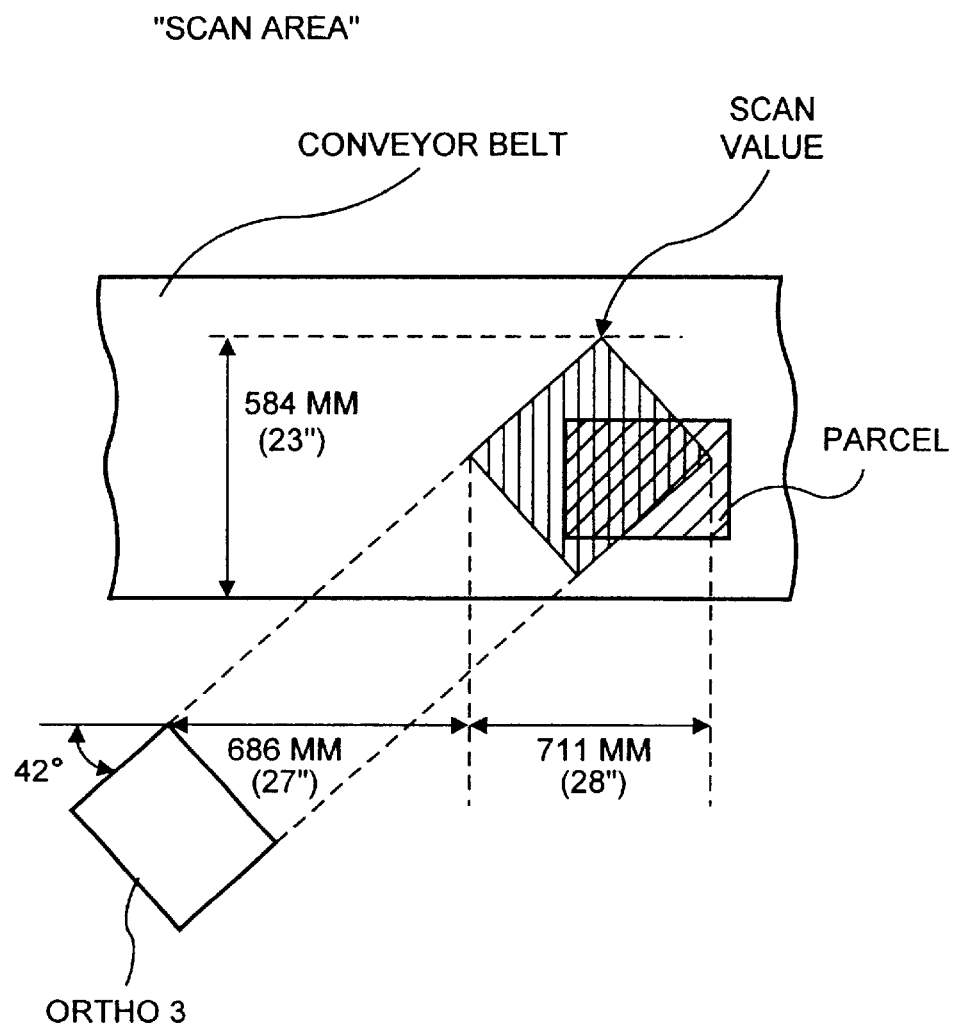
FIG. 4B6

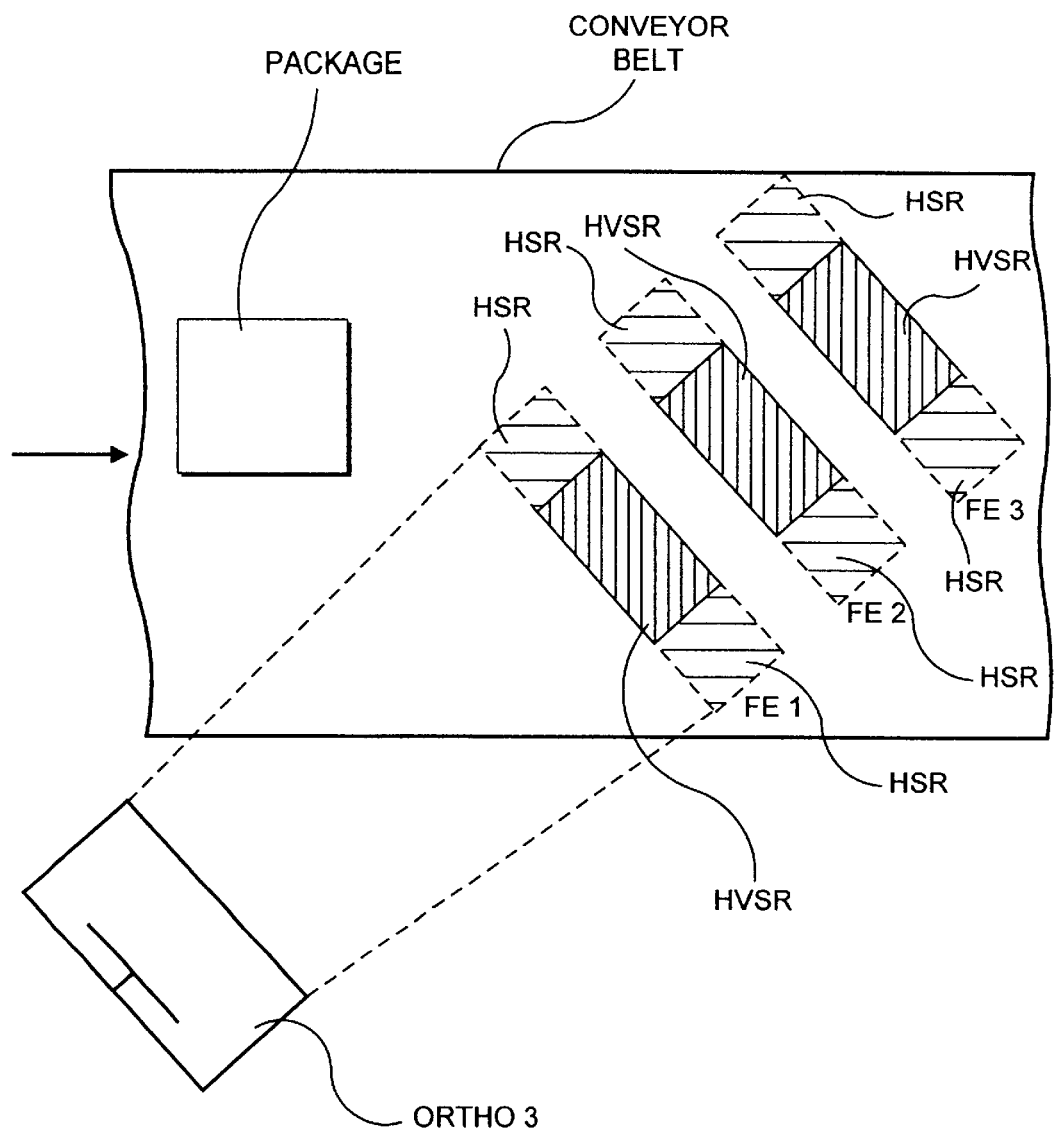
F I G. 4B7

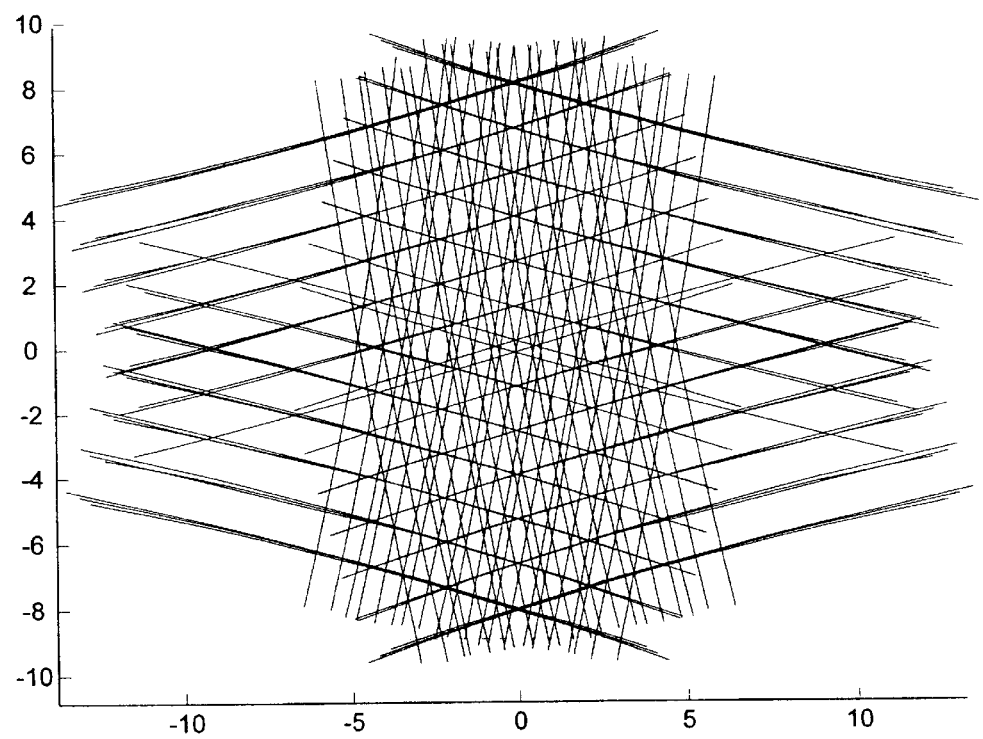
FIG. 4B8

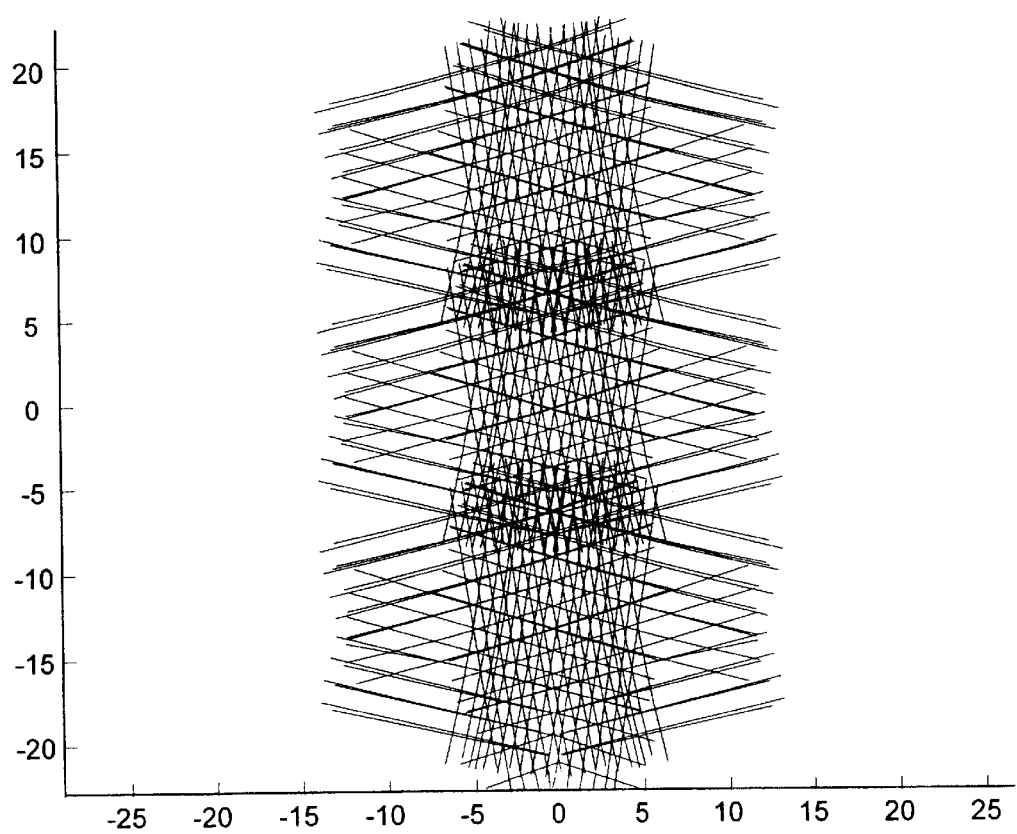
F I G. 4B9

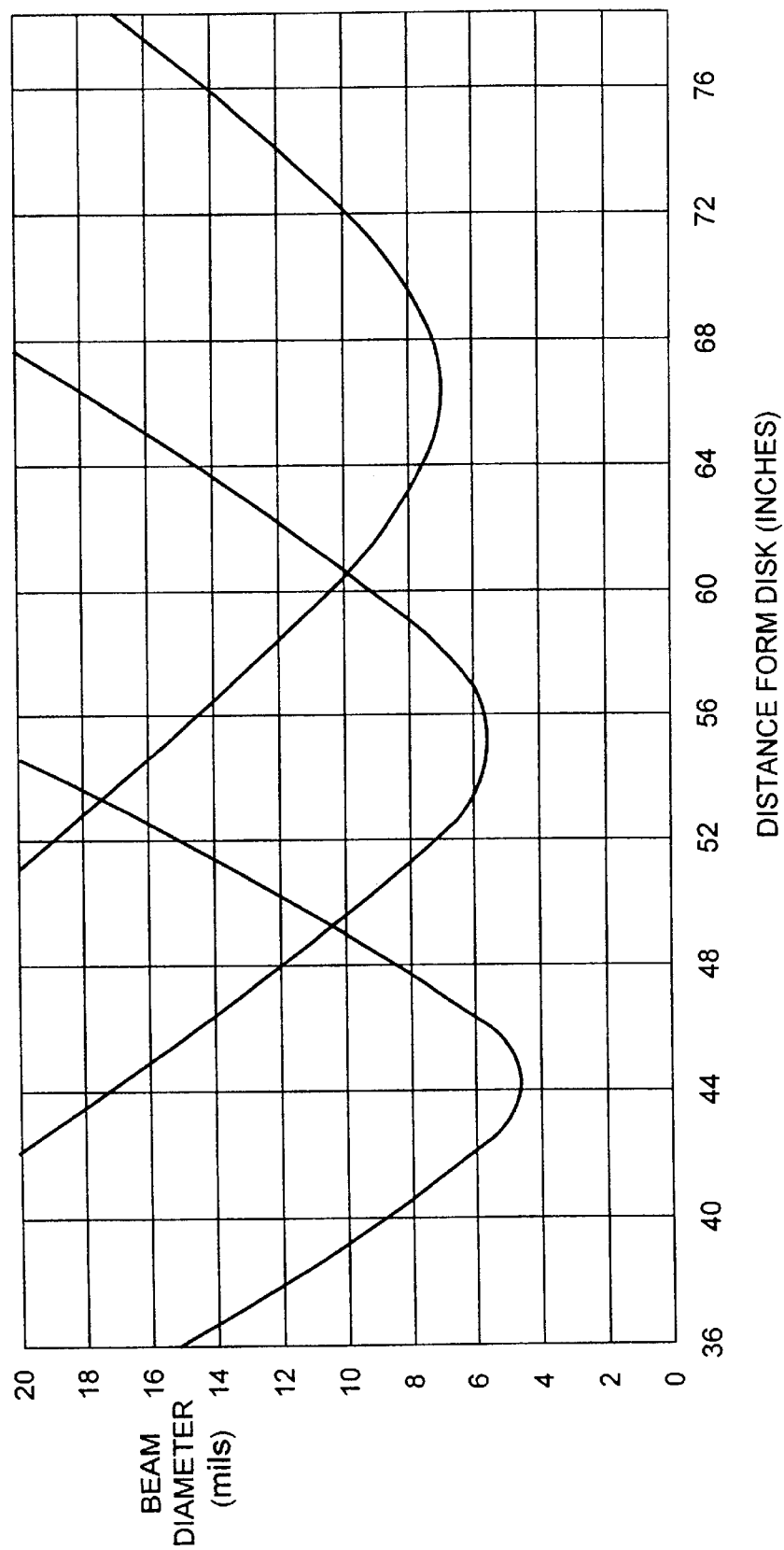
FIG. 4B10

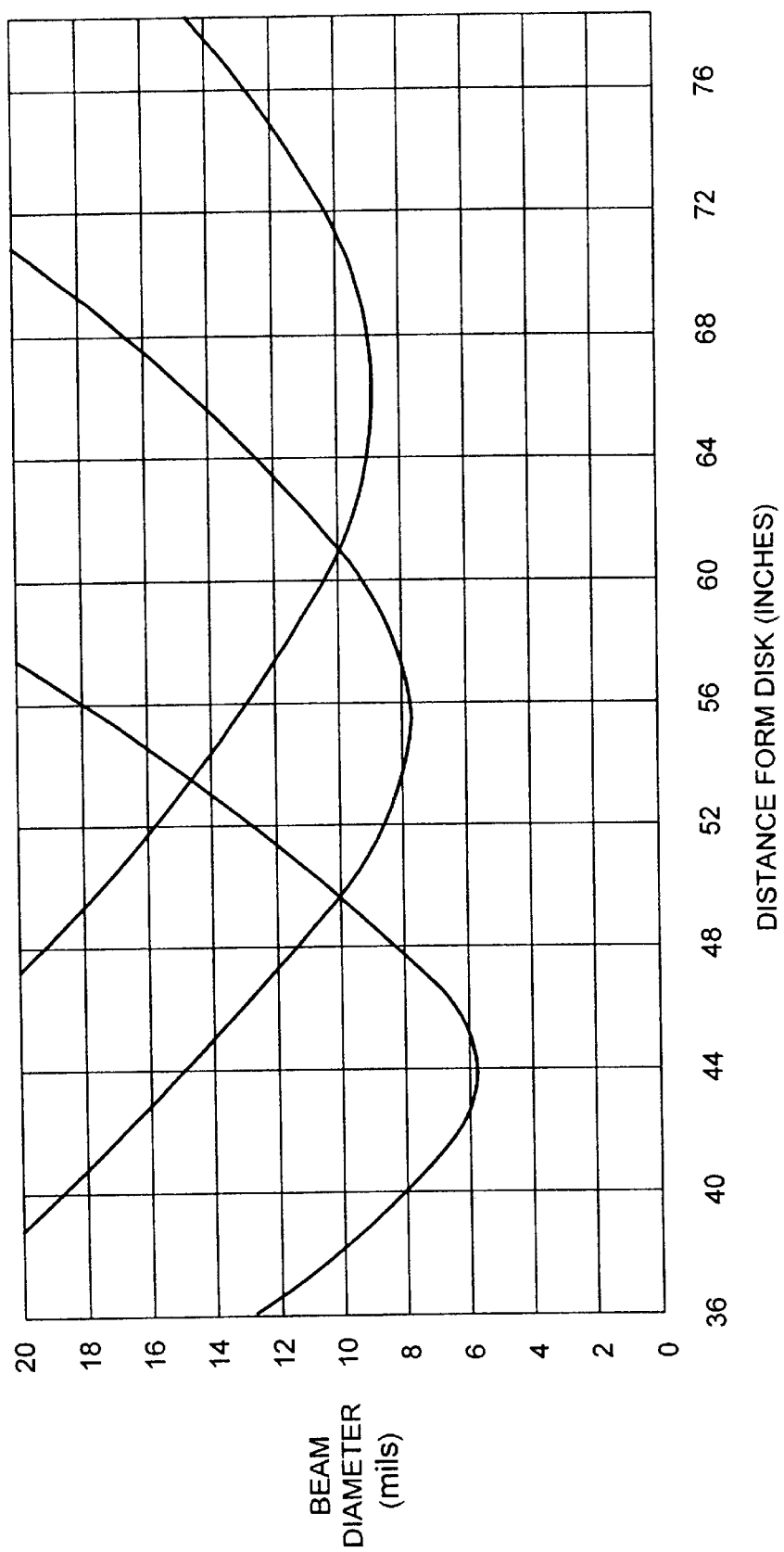
FIG. 4B11

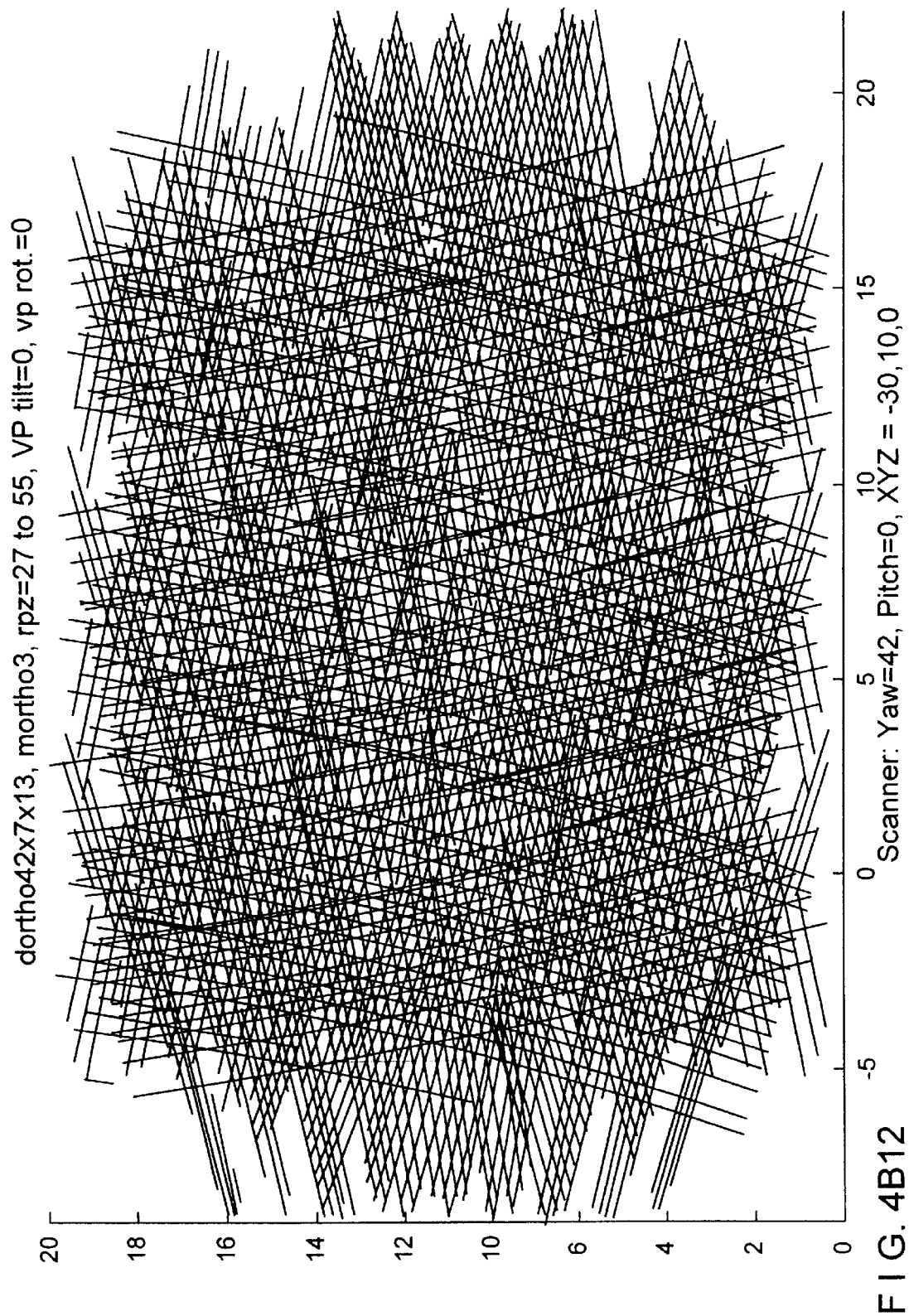
FIG. 4B12

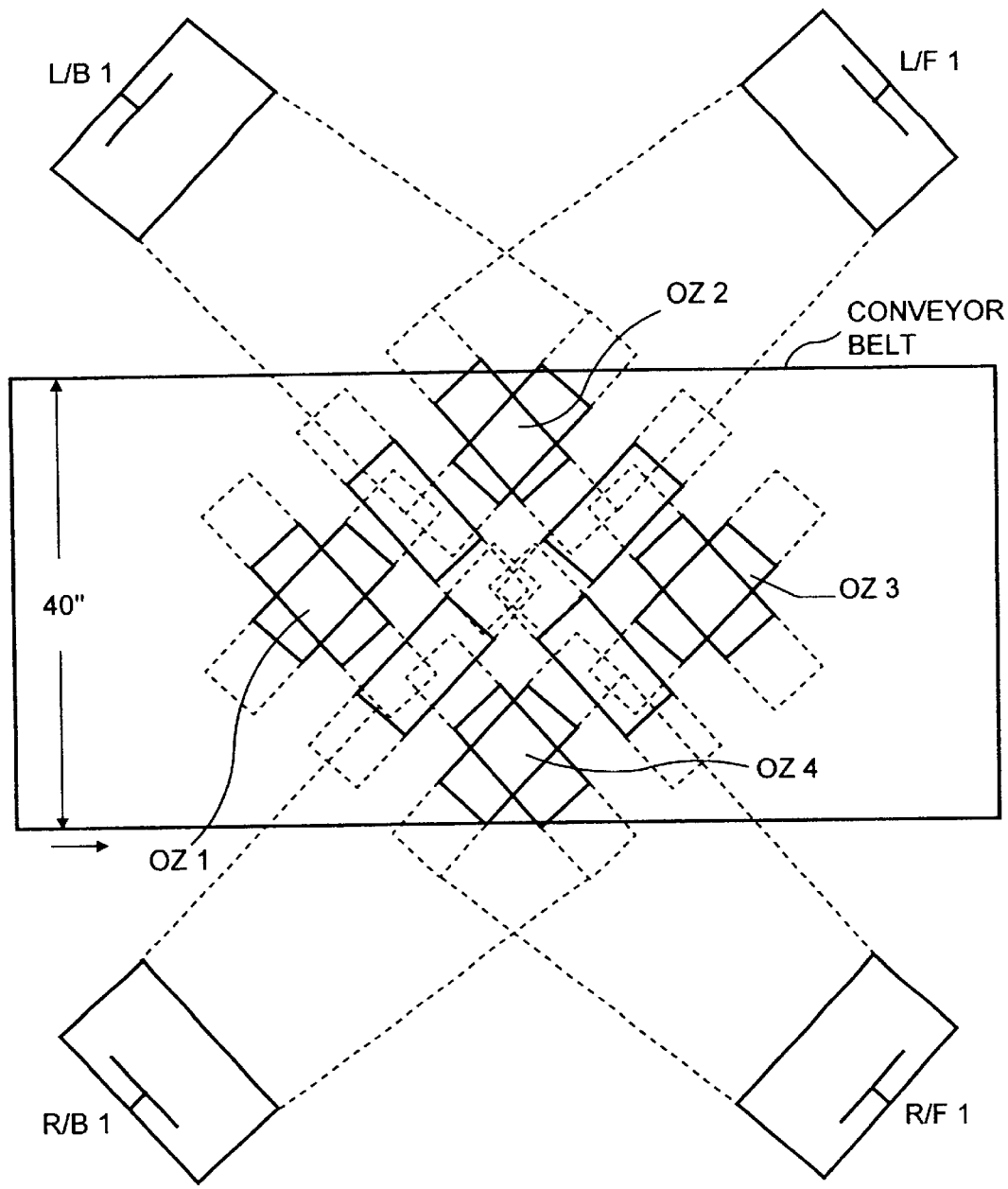
BASIC ORTHO SCANNING SOLUTION OVER 40" WIDE CONVEYOR BELT
FIG. 4B13

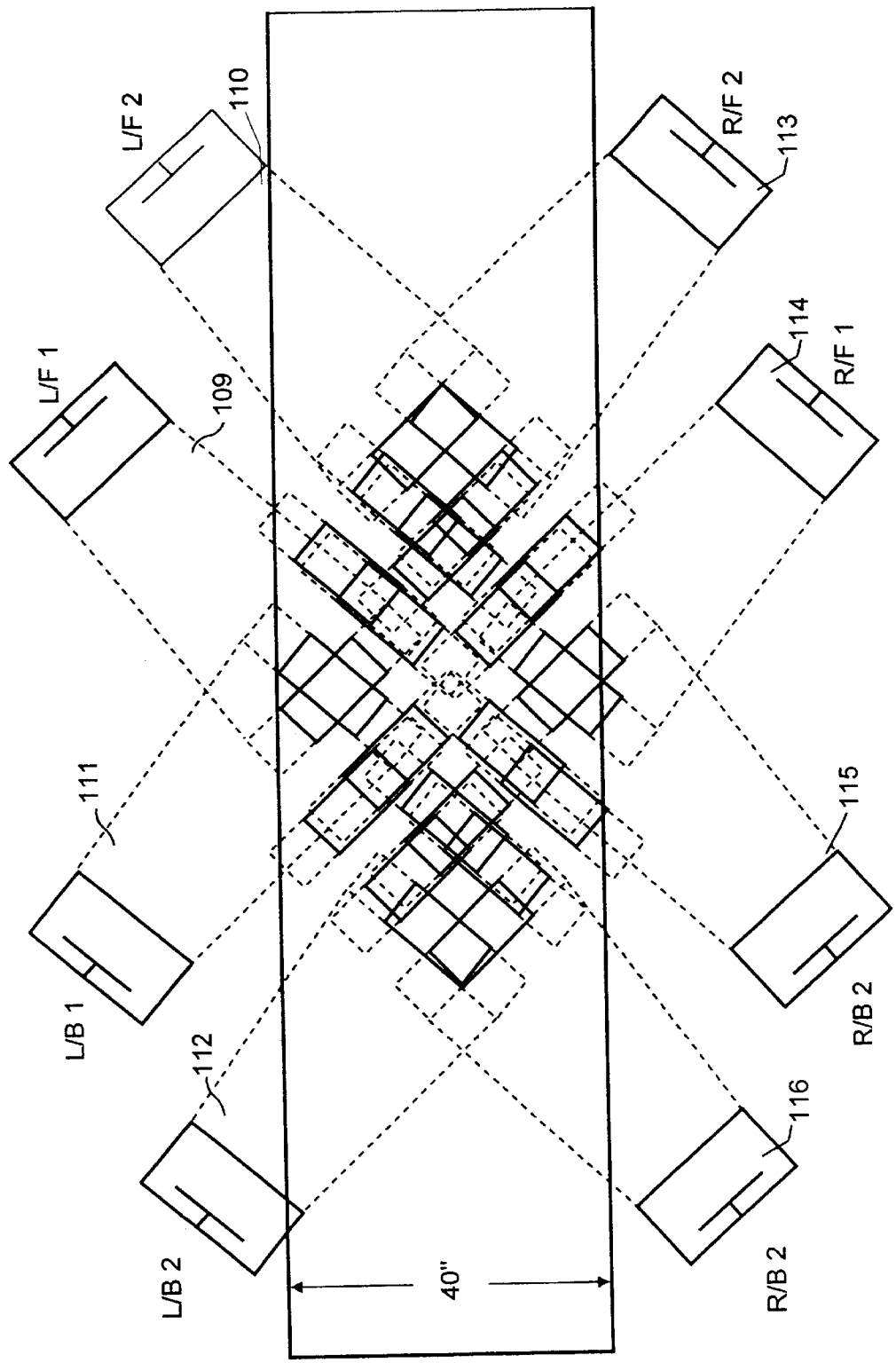
FIG. 4B14
AGGRESSIVE ORTHO SCANNING SOLUTION OVER 40" WIDE CONVEYOR BELT

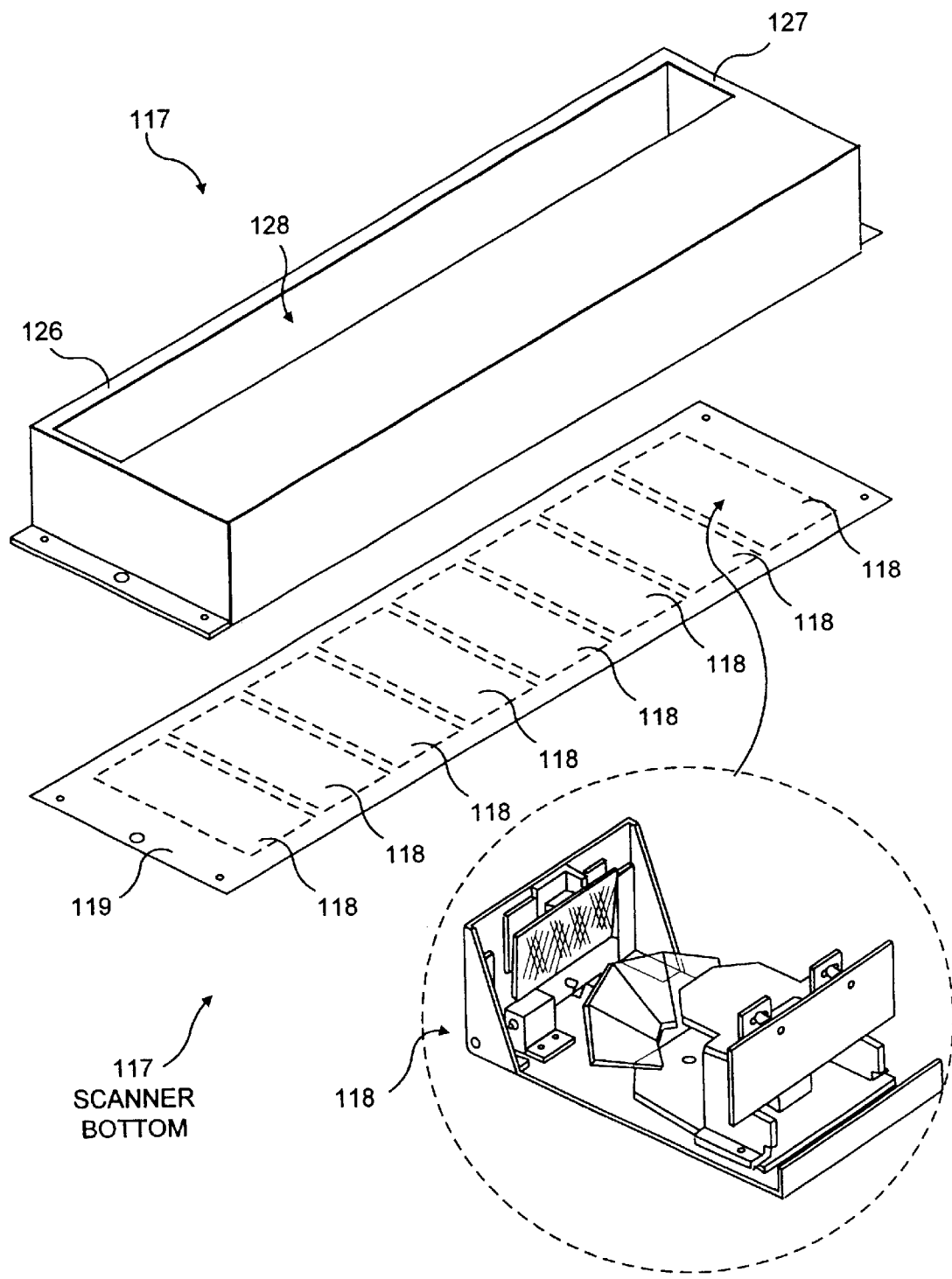
FIG. 4C1

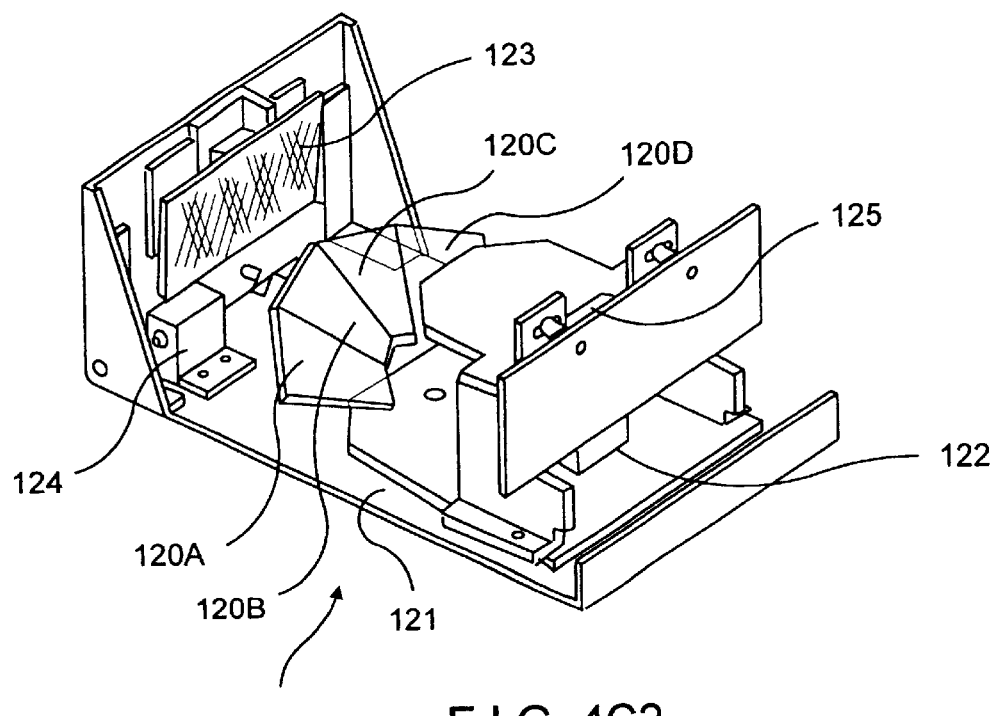
FIG. 4C2
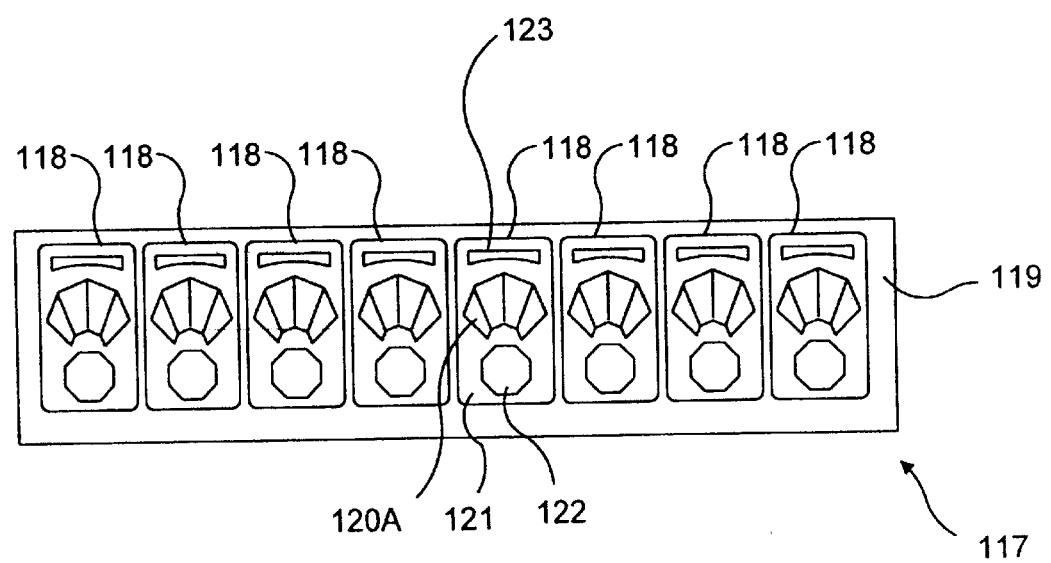
FIG. 4C3

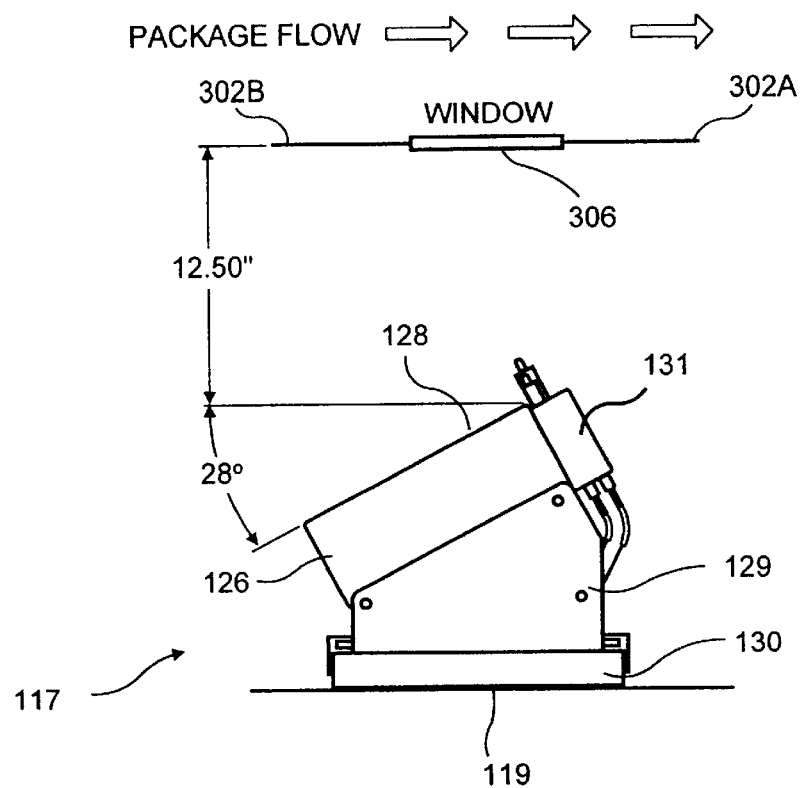
FIG. 4C3A

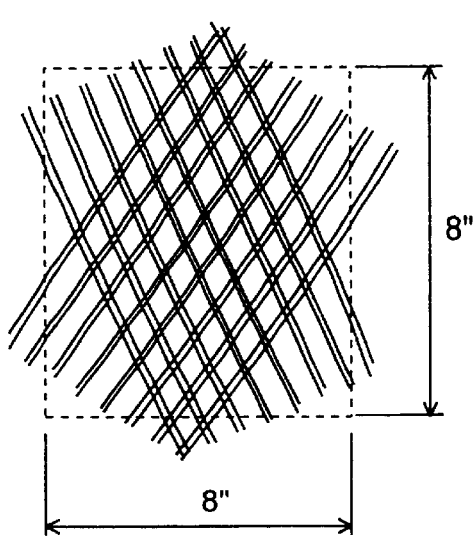
FIG. 4C4
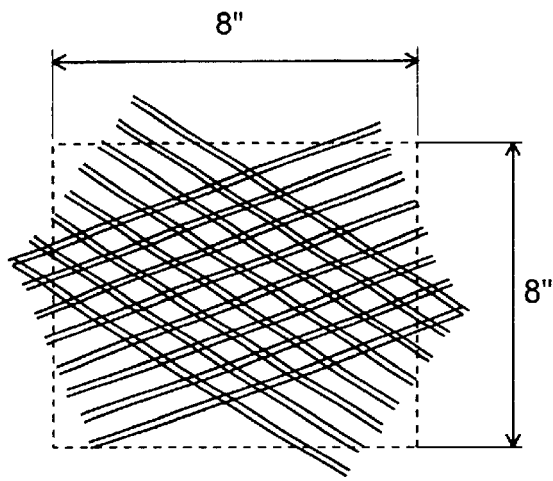
FIG. 4C5
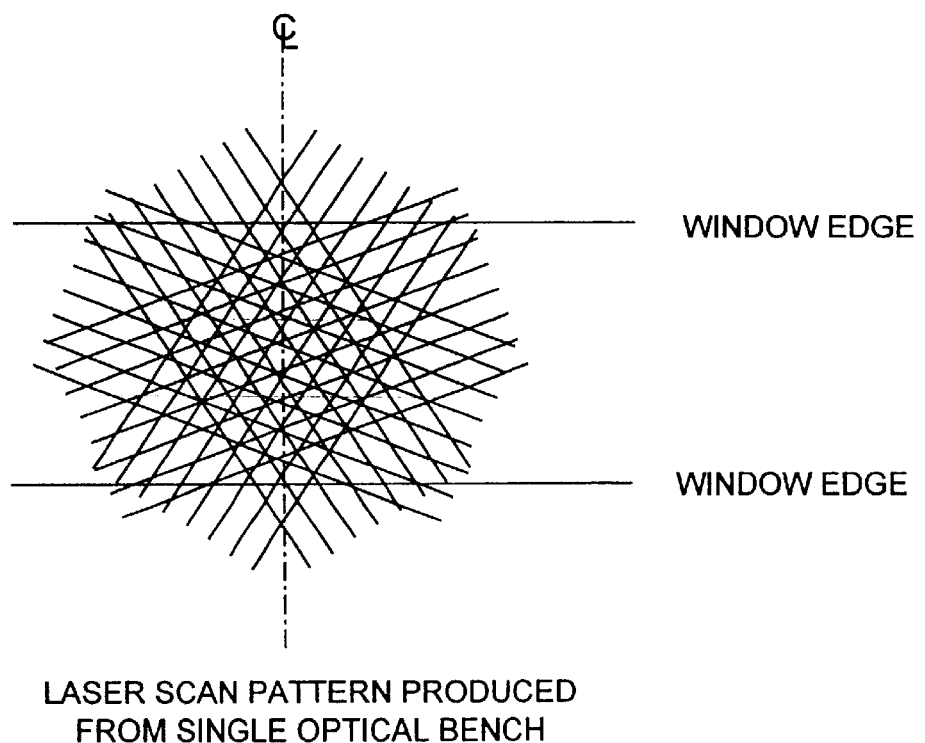
LASER SCAN PATTERN PRODUCED
FROM SINGLE OPTICAL BENCH
FIG. 4C6

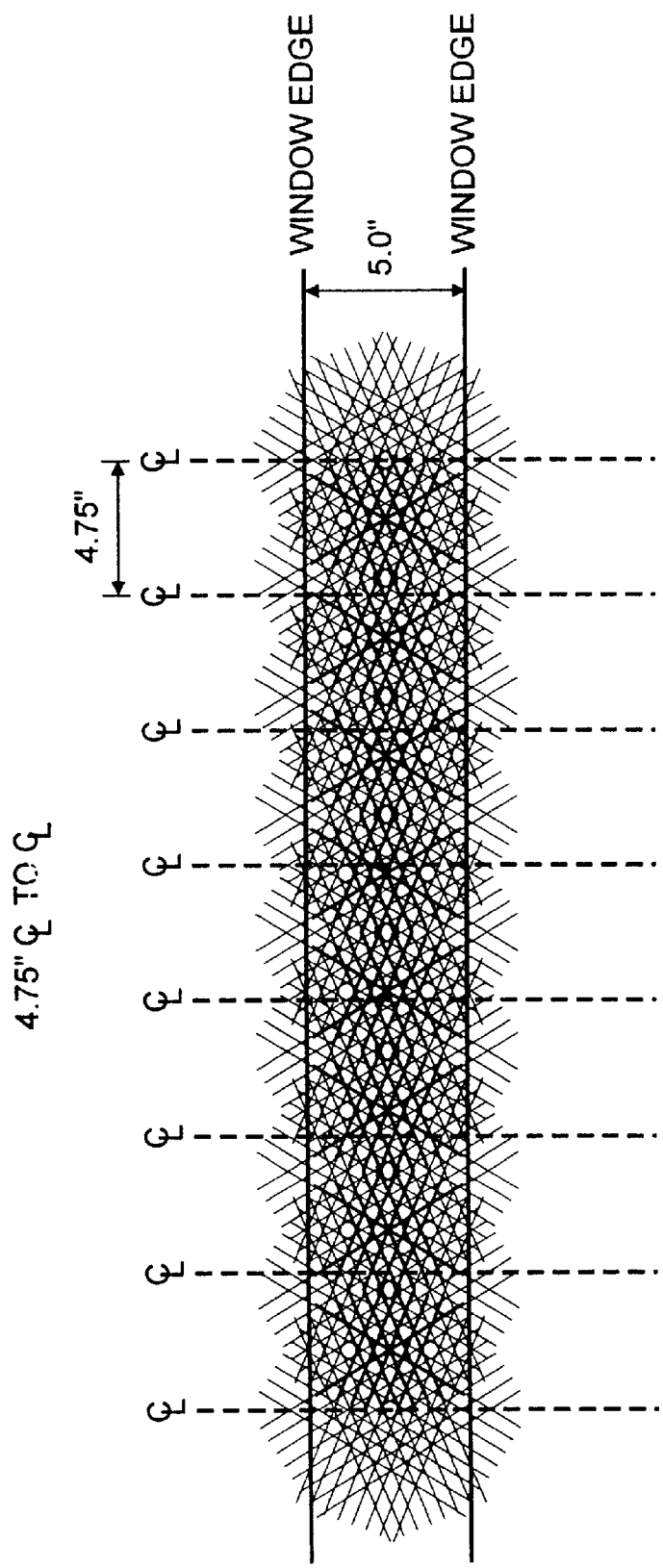
FIG. 4C7

$h = a + b$

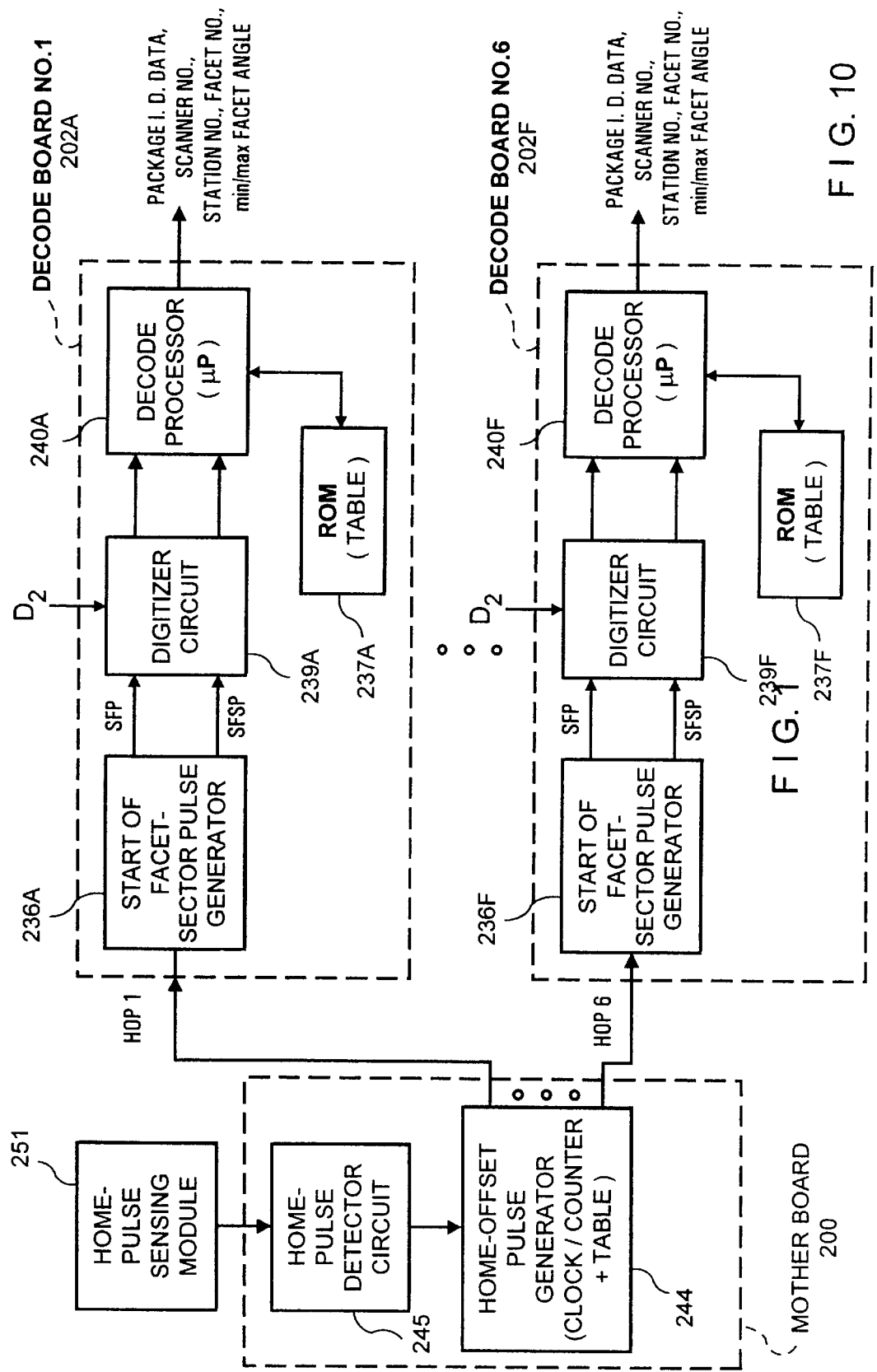

| SCANNING FACET NO. | TRIGGERING EVENT: WHEN THE CLOCK PULSE COUNT ATTAINS THE VALUE EQUAL TO THE COUNT VALUE SET FORTH BELOW | PULSE EVENT FROM SFP MODULE |
|---|---|---|
| 12 | 7 | SF12P |
| 16 | 146 | SF16P |
| 4 | 271 | SF4P |
| 20 | 446 | SF20P |
| 8 | 561 | SF8P |
| 11 | 716 | SF11P |
| 15 | 855 | SF15P |
| 3 | 980 | SF3P |
| 19 | 1155 | SF19P |
| 7 | 1270 | SF7P |
| 10 | 1425 | SF10P |
| 14 | 1564 | SF14P |
| 2 | 1689 | SF2P |
| 18 | 1864 | SF18P |
| 6 | 1979 | SF6P |
| 9 | 2134 | SF9P |
| 13 | 2273 | SF13P |
| 1 | 2398 | SF1P |
| 17 | 2573 | SF17P |
| 5 | 2688 | SF5P |

W = 5200 RPM

CLOCK PULSE WIDTH = 4 μSEC

FIG. 10B

| SCANNING FACET NO. | SFSP TRIGGERING EVENT | PULSE EVENT FROM SFSP MODULE |
|---|---|---|
| 12 | RULES 1 - 4 IN FIGS. | SFS 12/1P |
| | | SFS 12/2P |
| | | SFS 12/3P |
| | | SFS 12/4P |
| 16 | RULES 1-4 IN FIGS. | SFS 16/1P |
| | | SFS 16/2P |
| | | SFS 16/3P |
| | | SFS 16/4P |
| 4 | RULES 1-4 IN FIGS. | SFS 4/1P |
| | | SFS 4/2P |
| | | SFS 4/3P |
| | | SFS 4/4P |
| 20 | RULES 1-4 IN FIGS. | SFS 20/1P |
| | | SFS 20/2P |
| | | SFS 20/3P |
| | | SFS 20/4P |
| 8 | RULES 1-4 IN FIGS. | SFS 8/1P |
| | | SFS 8/2P |
| | | SFS 8/3P |
| | | SFS 8/4P |
| 11 | RULES 1-4 IN FIGS. | SFS 11/1P |
| | | SFS 11/2P |
| | | SFS 11/3P |
| | | SFS 11/4P |
| ⋮ | ⋮ | ⋮ |
| 17 | RULES 1-4 IN FIGS. | SFS 17/1P |
| | | SFS 17/2P |
| | | SFS 17/3P |
| | | SFS 17/4P |
| 5 | RULES 1-4 IN FIGS. | SFS 5/1P |
| | | SFS 5/2P |
| | | SFS 5/3P |
| | | SFS 5/4P |

FIG. 10D

RULE 1: FOR GENERATING SFSX/1P TYPE PULSES

FOR EACH FACET X BEFORE WHICH IS LOCATED FACET X-1 AND BEYOND WHICH IS LOCATED FACET X+1 (ABOUT THE SCANNING DISC), THE SFSP GENERATION MODULE GENERATES SFSX/1P TYPE PULSES WHEN THE COUNT IS EQUAL TO:

COUNT (SFXP)

RULE 2: FOR GENERATING SFSX/2P TYPE PULSES

FOR EACH FACET X, BEFORE WHICH IS LOCATED FACET X-1 AND BEYOND WHICH IS LOCATED FACET X+1 (ABOUT THE SCANNING DISC), THE SFSP GENERATION MODULE GENERATES SFSX/2P TYPE PULSES WHEN THE COUNT IS EQUAL TO:

$$\text{COUNT (SFXP)} + 1\left[\frac{\text{COUNT (SFX+1P)} - \text{COUNT (SFXP)}}{4}\right]$$

FIG. 10E1

RULE 3: FOR GENERATING SFSX/3P TYPE PULSES

FOR EACH FACET X BEFORE WHICH IS LOCATED FACET X-1 AND BEYOND WHICH IS LOCATED FACET X+1 (ABOUT THE SCANNING DISC), THE SFSP GENERATION MODULE GENERATES SFSX/3 TYPE PULSES WHEN THE COUNT IS EQUAL TO:

$$\text{COUNT (SFXP)} + 2\left[\frac{\text{COUNT (SFX+1P)} - \text{COUNT (SFXP)}}{4}\right]$$

RULE 4: FOR GENERATING SFSX/4P TYPE PULSES

FOR EACH FACET X, BEFORE WHICH IS LOCATED FACET X-1 AND BEYOND WHICH IS LOCATED FACET X+1 (ABOUT THE SCANNING DISC), THE SFSP GENERATION MODULE GENERATES SFSX/4 TYPE PULSES WHEN THE COUNT IS EQUAL TO:

$$\text{COUNT (SFXP)} + 3\left[\frac{\text{COUNT (SFX+1P)} - \text{COUNT (SFXP)}}{4}\right]$$

F I G. 10E2

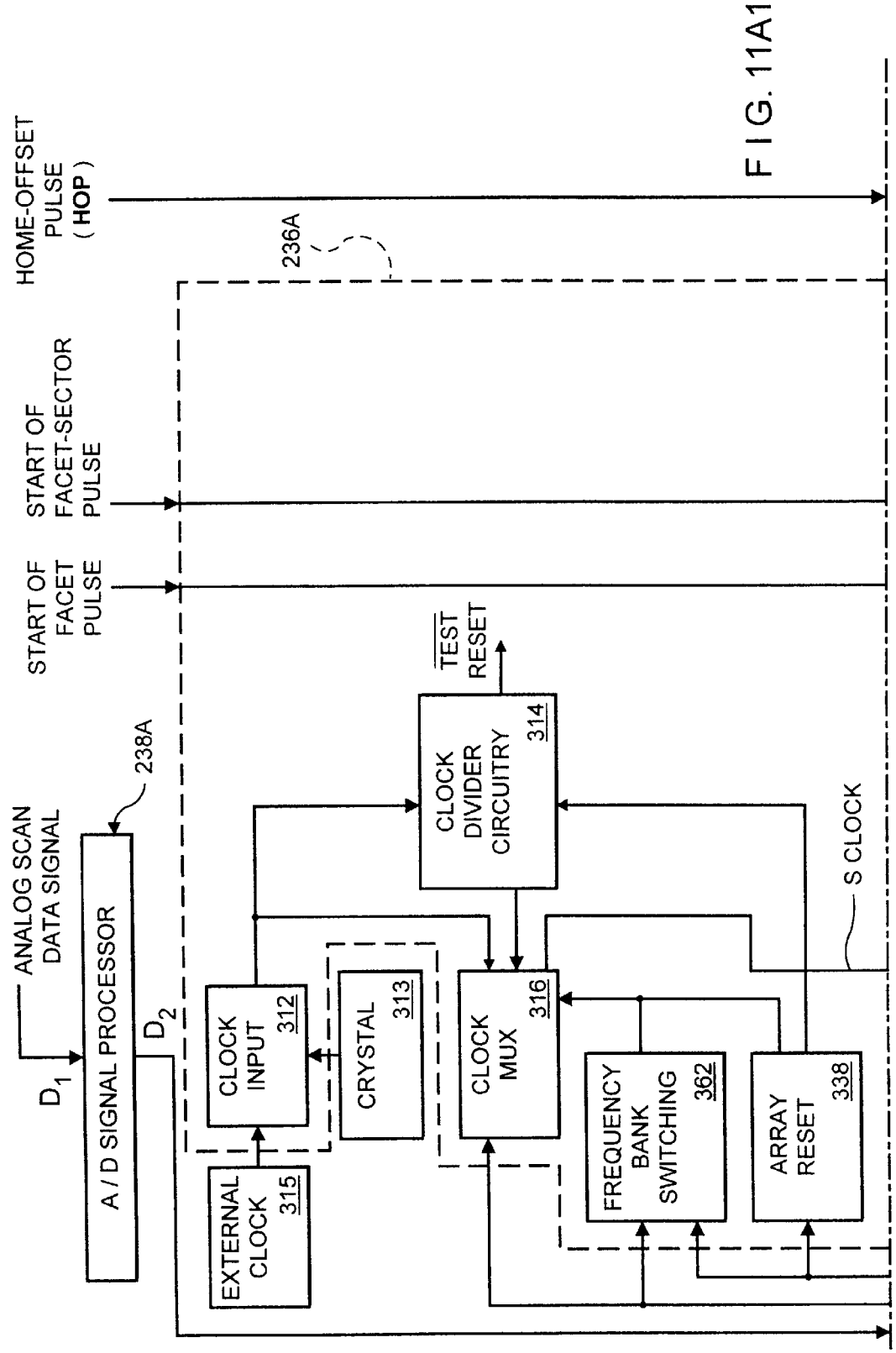
FIG. 11A1

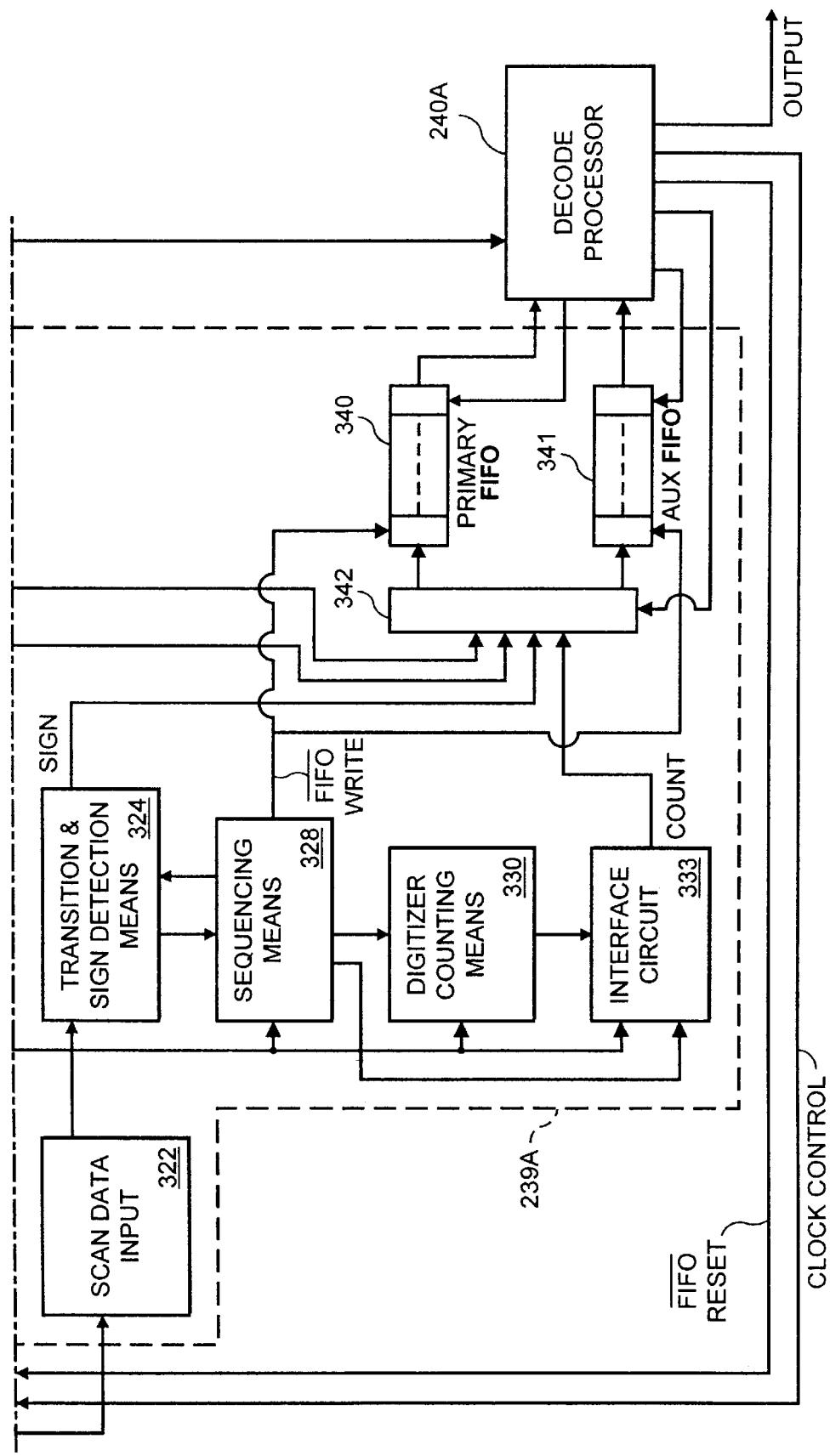
FIG. 11A2

| SCANNER NO. | TOTAL NO OF FACETS ON DISC |
|---|---|
| NO. OF SECTORS / FACET | SCANNING STATION NO. |

FIG. 11C1

| SCANNING FACET NO. | TRIGGERING EVENT: WHEN THE CLOCK PULSE COUNT ATTAINS THE VALUE EQUAL TO THE COUNT VALUE SET FORTH BELOW | PULSE EVENT FROM SFP MODULE |
|---|---|---|
| 12 | 7 | SF12P |
| 16 | 146 | SF16P |
| 4 | 271 | SF4P |
| 20 | 446 | SF20P |
| 8 | 561 | SF8P |
| 11 | 716 | SF11P |
| 15 | 855 | SF15P |
| 3 | 980 | SF3P |
| 19 | 1155 | SF19P |
| 7 | 1270 | SF7P |
| 10 | 1425 | SF10P |
| 14 | 1564 | SF14P |
| 2 | 1689 | SF2P |
| 18 | 1864 | SF18P |
| 6 | 1979 | SF6P |
| 9 | 2134 | SF9P |
| 13 | 2273 | SF13P |
| 1 | 2398 | SF1P |
| 17 | 2573 | SF17P |
| 5 | 2688 | SF5P |

TABLES EMBODIED IN DECODE PROCESSOR

W = 5200 RPM

CLOCK PULSE WIDTH = 4.0 $\mu$SEC

FIG. 11C2

| SCANNING FACET NO. | SFSP TRIGGERING EVENT | PULSE EVENT FROM SFSP MODULE | MINIMUM AND MAXIMUM FACET ANGLES CORRESPONDING TO FACET-SECTOR IDENTIFIED BY SFSP EVENT |
|---|---|---|---|
| 12 | RULES 1 - 4 IN FIGS. | SFS 12/1P | |
| | | SFS 12/2P | |
| | | SFS 12/3P | |
| | | SFS 12/4P | |
| 16 | RULES 1-4 IN FIGS. | SFS 16/1P | |
| | | SFS 16/2P | |
| | | SFS 16/3P | |
| | | SFS 16/4P | |
| 4 | RULES 1-4 IN FIGS. | SFS 4/1P | |
| | | SFS 4/2P | |
| | | SFS 4/3P | |
| | | SFS 4/4P | |
| 20 | RULES 1-4 IN FIGS. | SFS 20/1P | |
| | | SFS 20/2P | |
| | | SFS 20/3P | |
| | | SFS 20/4P | |
| 8 | RULES 1-4 IN FIGS. | SFS 8/1P | |
| | | SFS 8/2P | |
| | | SFS 8/3P | |
| | | SFS 8/4P | |
| 11 | RULES 1-4 IN FIGS. | SFS 11/1P | |
| | | SFS 11/2P | |
| | | SFS 11/3P | |
| | | SFS 11/4P | |
| ○○○ | | | |
| 17 | RULES 1-4 IN FIGS. | SFS 17/1P | |
| | | SFS 17/2P | |
| | | SFS 17/3P | |
| | | SFS 17/4P | |
| 5 | RULES 1-4 IN FIGS. | SFS 5/1P | |
| | | SFS 5/2P | |
| | | SFS 5/3P | |
| | | SFS 5/4P | |

F I G. 11D

| SCANNING FACET NO. | SFSP TRIGGERING EVENTS | PULSE EVENT FROM SFSP MODULE |
|---|---|---|
| 12 | DETECTION OF 1ST, 2ND, 3RD AND 4TH SFS PULSE AFTER DETECTION OF HOME PULSE (HOP) | SFS 12/1P |
| | | SFS 12/2P |
| | | SFS 12/3P |
| | | SFS 12/4P |
| 16 | DETECTION OF 5TH, 6TH, 7TH AND 8TH SFS PULSE AFTER DETECTION OF HOP | SFS 16/1P |
| | | SFS 16/2P |
| | | SFS 16/3P |
| | | SFS 16/4P |
| 4 | DETECTION OF 9TH, 10TH, 11TH AND 12TH SFSP AFTER DETECTION OF HOP | SFS 4/1P |
| | | SFS 4/2P |
| | | SFS 4/3P |
| | | SFS 4/4P |
| 20 | DETECTION OF 13TH, 14TH, 15TH AND 16TH SFSP AFTER DETECTION OF HOP | SFS 20/1P |
| | | SFS 20/2P |
| | | SFS 20/3P |
| | | SFS 20/4P |
| 8 | DETECTION OF 17TH, 18TH, 19TH AND 20TH SFSP AFTER DETECTION OF HOP | SFS 8/1P |
| | | SFS 8/2P |
| | | SFS 8/3P |
| | | SFS 8/4P |
| 11 | DETECTION OF 21ST, 22ND, 23RD AND 24TH SFSP AFTER DETECTION OF HOP | SFS 11/1P |
| | | SFS 11/2P |
| | | SFS 11/3P |
| | | SFS 11/4P |
| | ooo | |
| 17 | DETECTION OF 73RD, 74TH, 75TH AND 76TH SFSP AFTER DETECTION OF HOP | SFS 17/1P |
| | | SFS 17/2P |
| | | SFS 17/3P |
| | | SFS 17/4P |
| 5 | DETECTION OF 77TH, 78TH, 79TH AND 80TH SFSP AFTER DETECTION OF HOP | SFS 5/1P |
| | | SFS 5/2P |
| | | SFS 5/3P |
| | | SFS 5/4P |

FIG. 12D

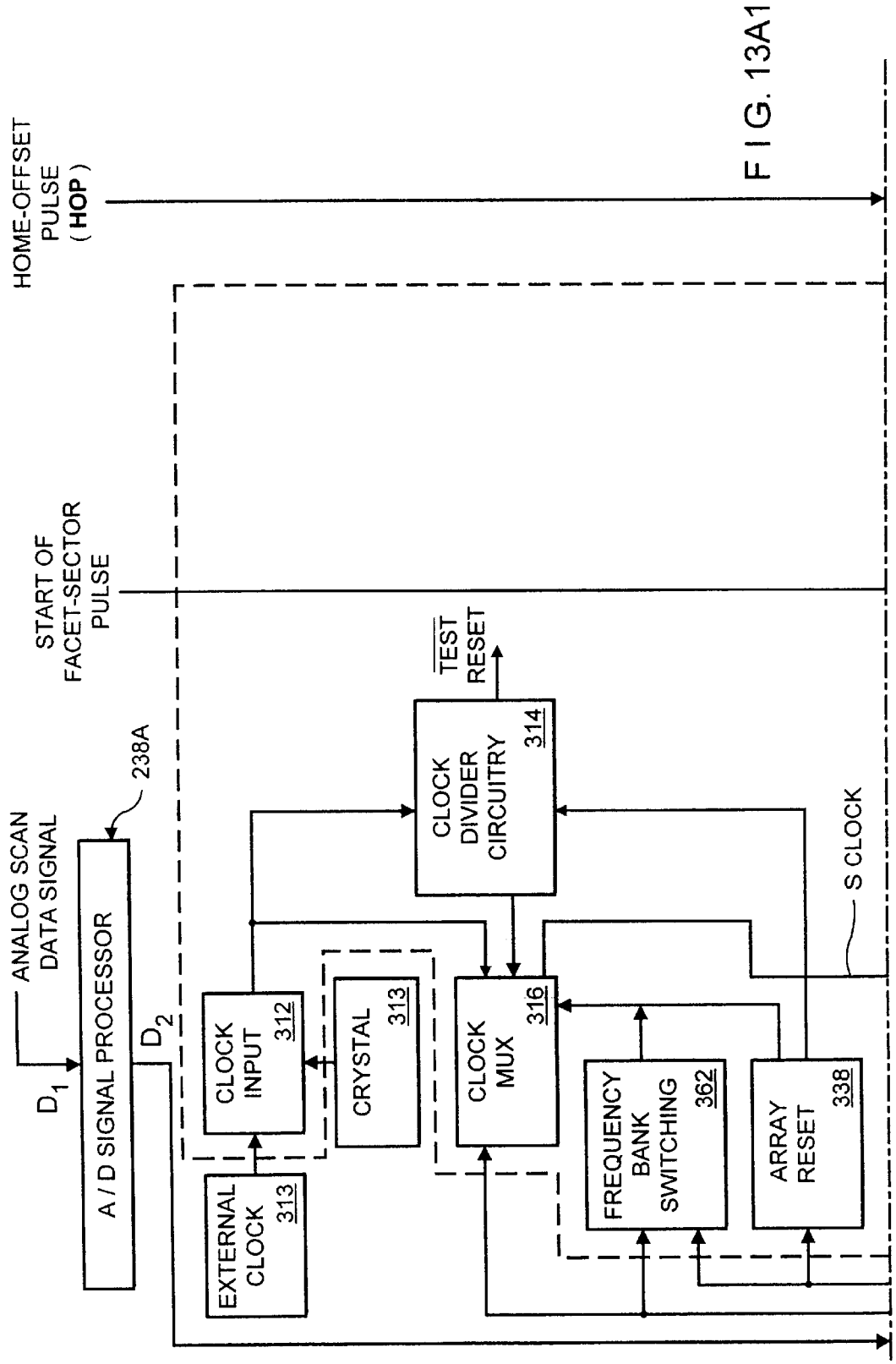
FIG. 13A1

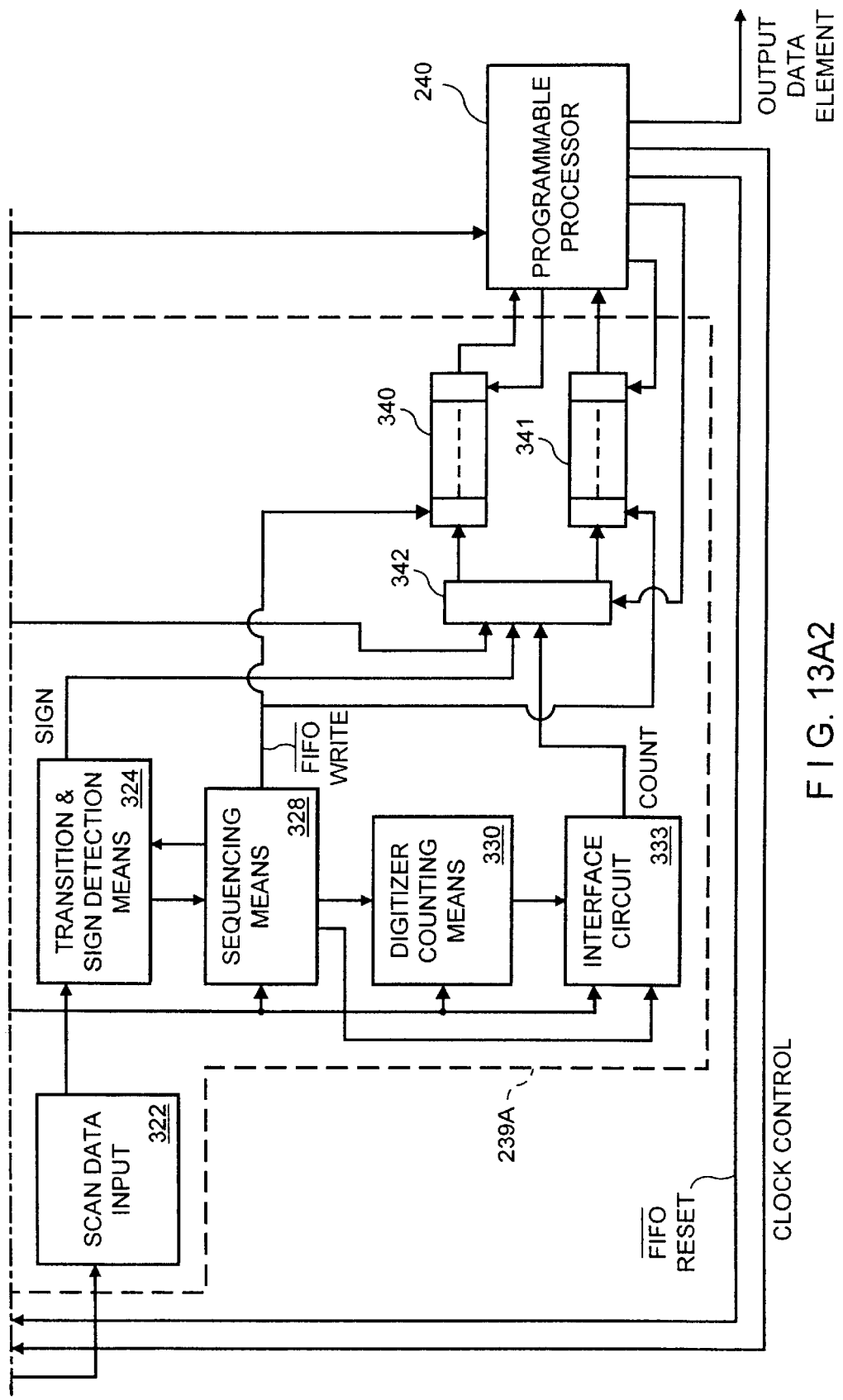
FIG. 13A2

| SCANNER NO. | SCANNING STATION NO. |
|---|---|
| TOTAL NO. OF FACETS ON DISC | NO. OF SECTORS PER FACET |

FIG. 13C1

TABLE EMBODIED IN DECODE PROCESSOR

| SCANNING FACET NO. | SFSP TRIGGERING EVENTS | PULSE EVENT FROM SFSP MODULE | MINIMUM AND MAXIMUM FACET ANGLES CORRESPONDING TO FACET-SECTOR IDENTIFIED BY SFSP EVENT |
|---|---|---|---|
| 12 | DETECTION OF $1^{ST}$, $2^{ND}$, $3^{RD}$ AND $4^{TH}$ SFS PULSE AFTER DETECTION OF HOME PULSE (HOP) | SFS 12/1P | $Q_{ROT\ MIN}$, $Q_{ROT\ MAX}$ |
| | | SFS 12/2P | |
| | | SFS 12/3P | |
| | | SFS 12/4P | |
| 16 | DETECTION OF $5^{TH}$, $6^{TH}$, $7^{TH}$ AND $8^{TH}$ SFS PULSE AFTER DETECTION OF HOP | SFS 16/1P | |
| | | SFS 16/2P | |
| | | SFS 16/3P | |
| | | SFS 16/4P | |
| 4 | DETECTION OF $9^{TH}$, $10^{TH}$, $11^{TH}$ AND $12^{TH}$ SFSP AFTER DETECTION OF HOP | SFS 4/1P | |
| | | SFS 4/2P | |
| | | SFS 4/3P | |
| | | SFS 4/4P | |
| 20 | DETECTION OF $13^{TH}$, $14^{TH}$, $15^{TH}$ AND $16^{TH}$ SFSP AFTER DETECTION OF HOP | SFS 20/1P | |
| | | SFS 20/2P | |
| | | SFS 20/3P | |
| | | SFS 20/4P | |
| 8 | DETECTION OF $17^{TH}$, $18^{TH}$, $19^{TH}$ AND $20^{TH}$ SFSP AFTER DETECTION OF HOP | SFS 8/1P | |
| | | SFS 8/2P | |
| | | SFS 8/3P | |
| | | SFS 8/4P | |
| 11 | DETECTION OF $21^{ST}$, $22^{ND}$, $23^{RD}$ AND $24^{TH}$ SFSP AFTER DETECTION OF HOP | SFS 11/1P | |
| | | SFS 11/2P | |
| | | SFS 11/3P | |
| | | SFS 11/4P | |
| | ∘∘∘ | | |
| 17 | DETECTION OF $73^{RD}$, $74^{TH}$, $75^{TH}$ AND $76^{TH}$ SFSP AFTER DETECTION OF HOP | SFS 17/1P | |
| | | SFS 17/2P | |
| | | SFS 17/3P | |
| | | SFS 17/4P | |
| 5 | DETECTION OF $77^{TH}$, $78^{TH}$, $79^{TH}$ AND $80^{TH}$ SFSP AFTER DETECTION OF HOP | SFS 5/1P | |
| | | SFS 5/2P | |
| | | SFS 5/3P | |
| | | SFS 5/4P | |

FIG. 13C2

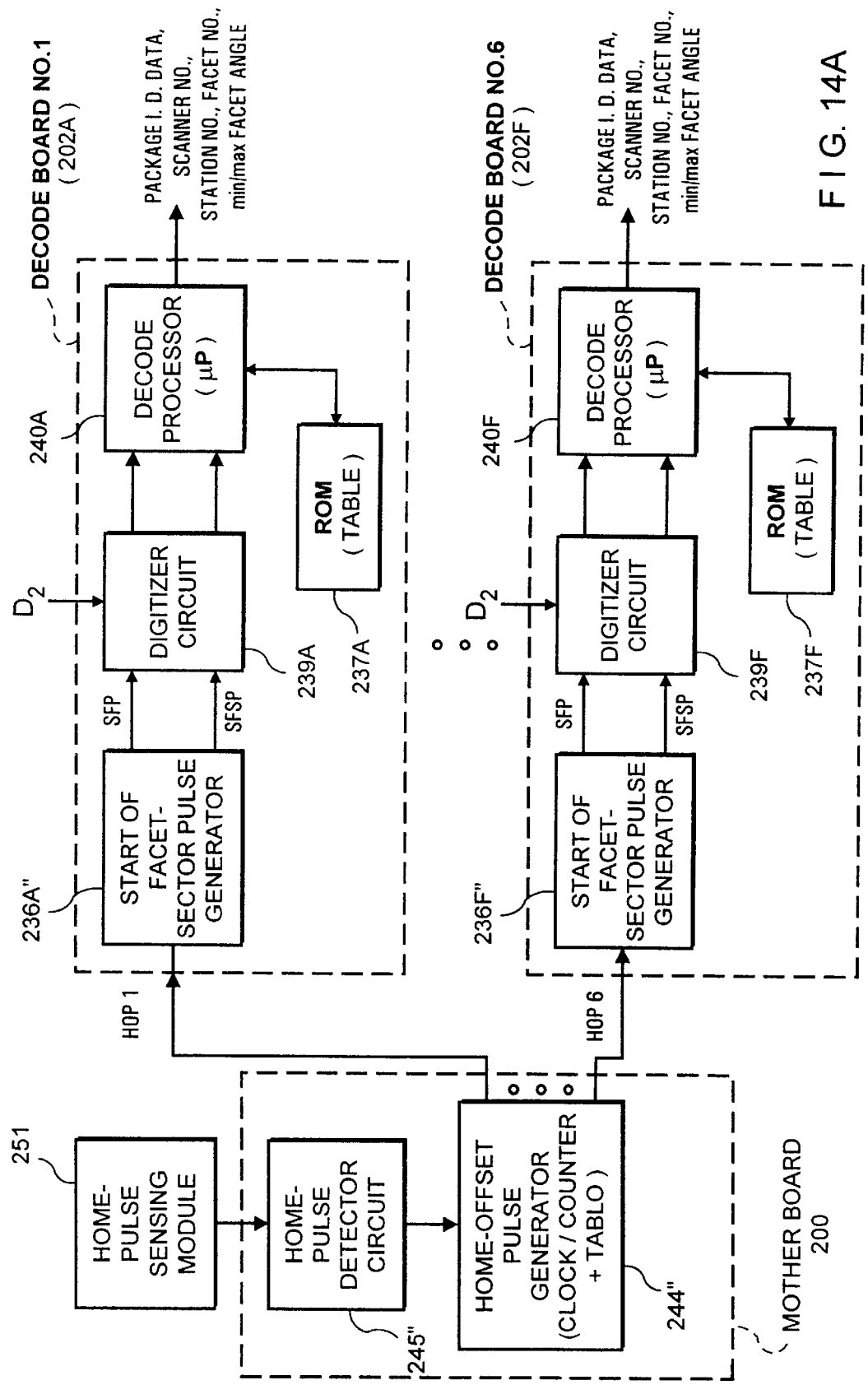

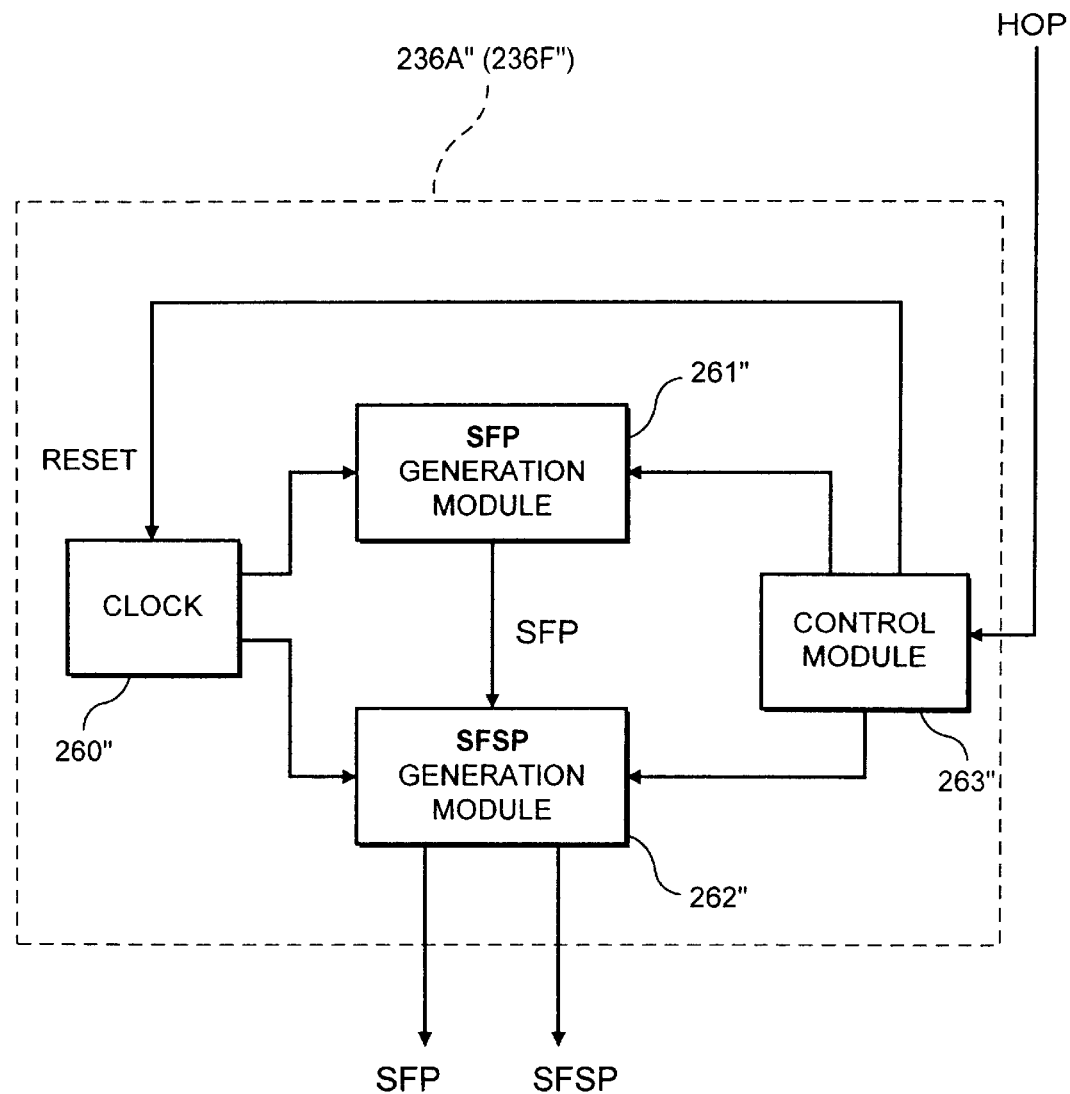
F I G. 14B

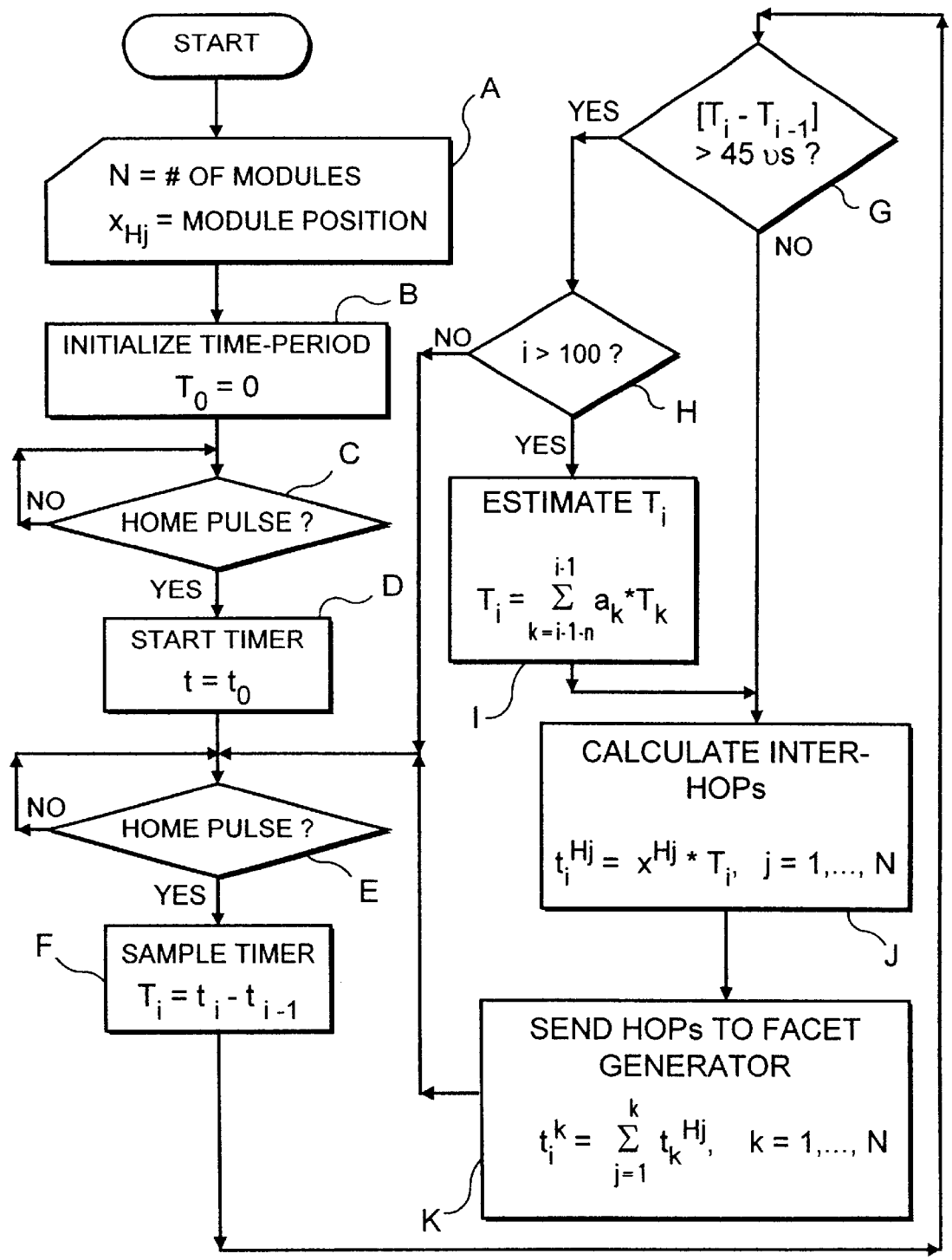
F I G. 14C

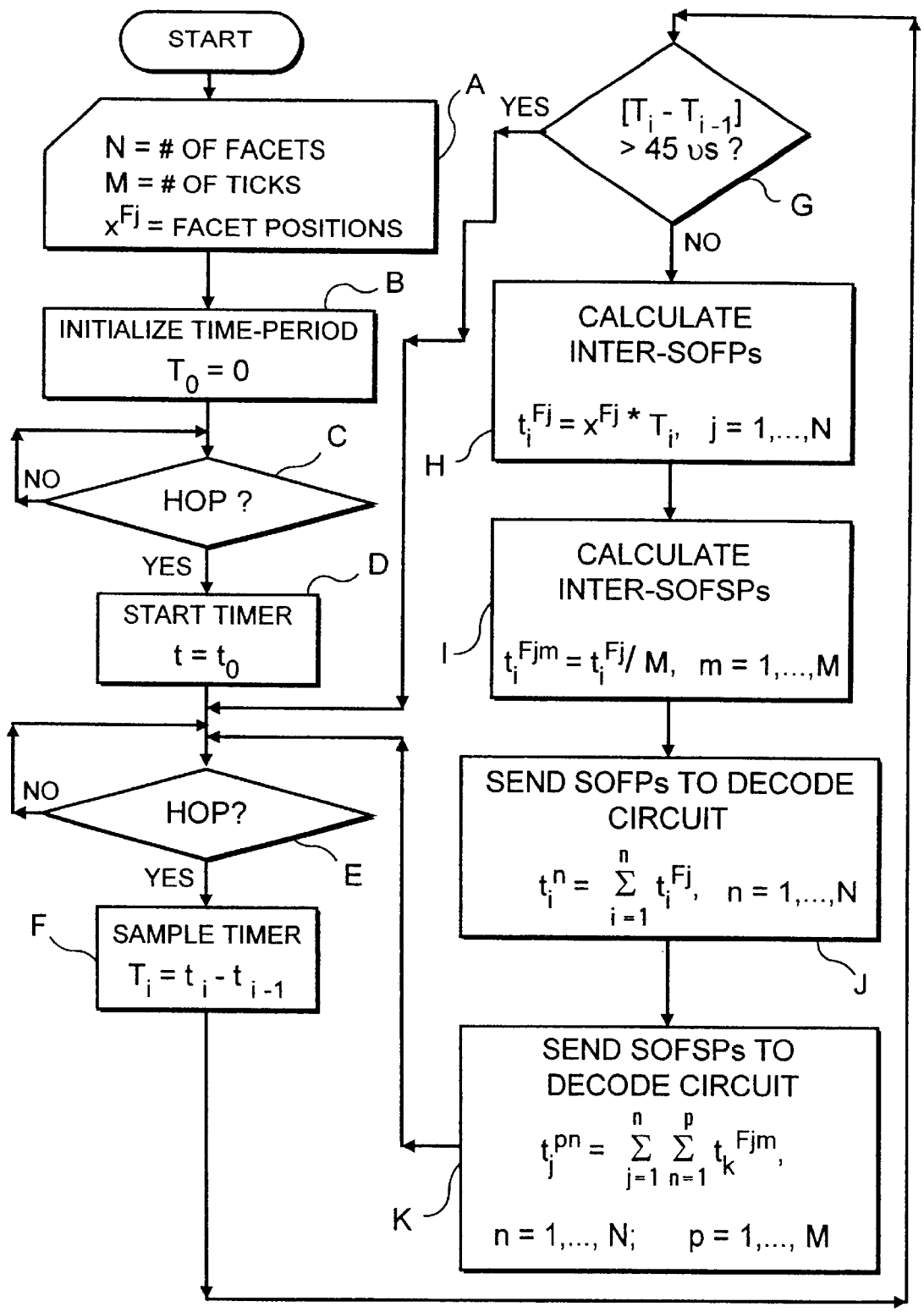
F I G. 14D

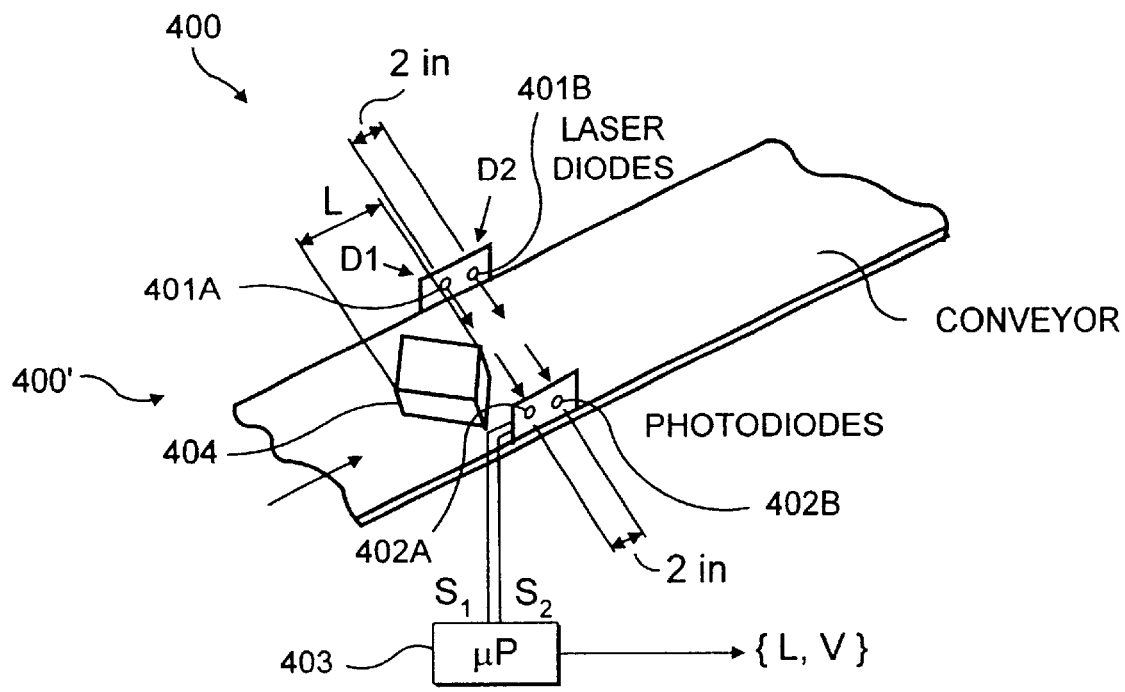
FIG. 15A
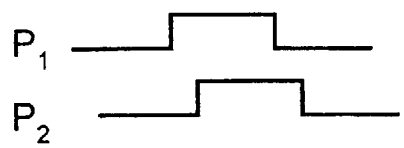
FIG. 15A1
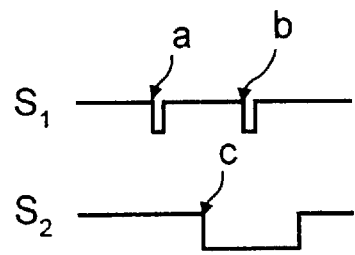
FIG. 15A2

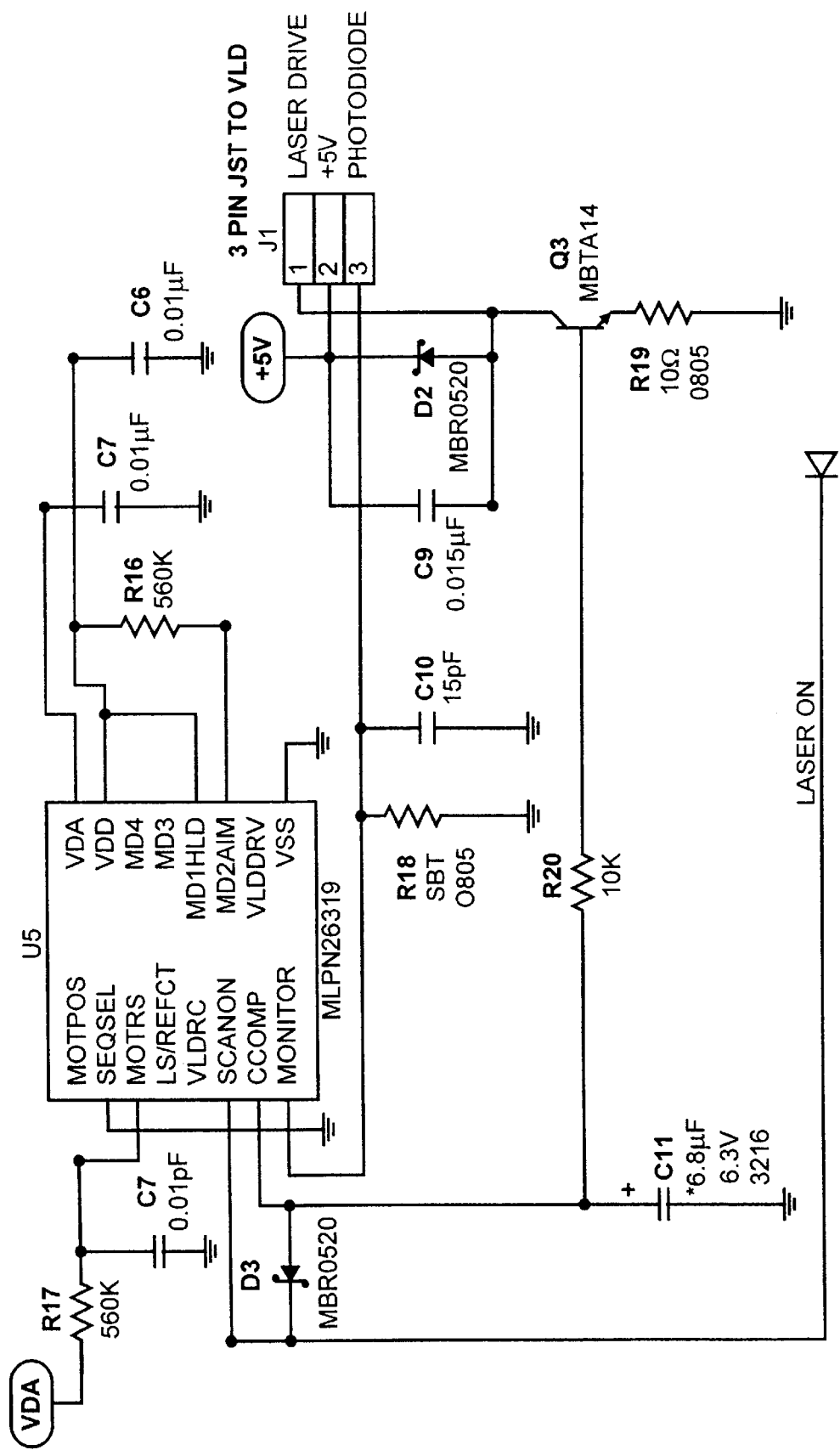
FIG. 15A3

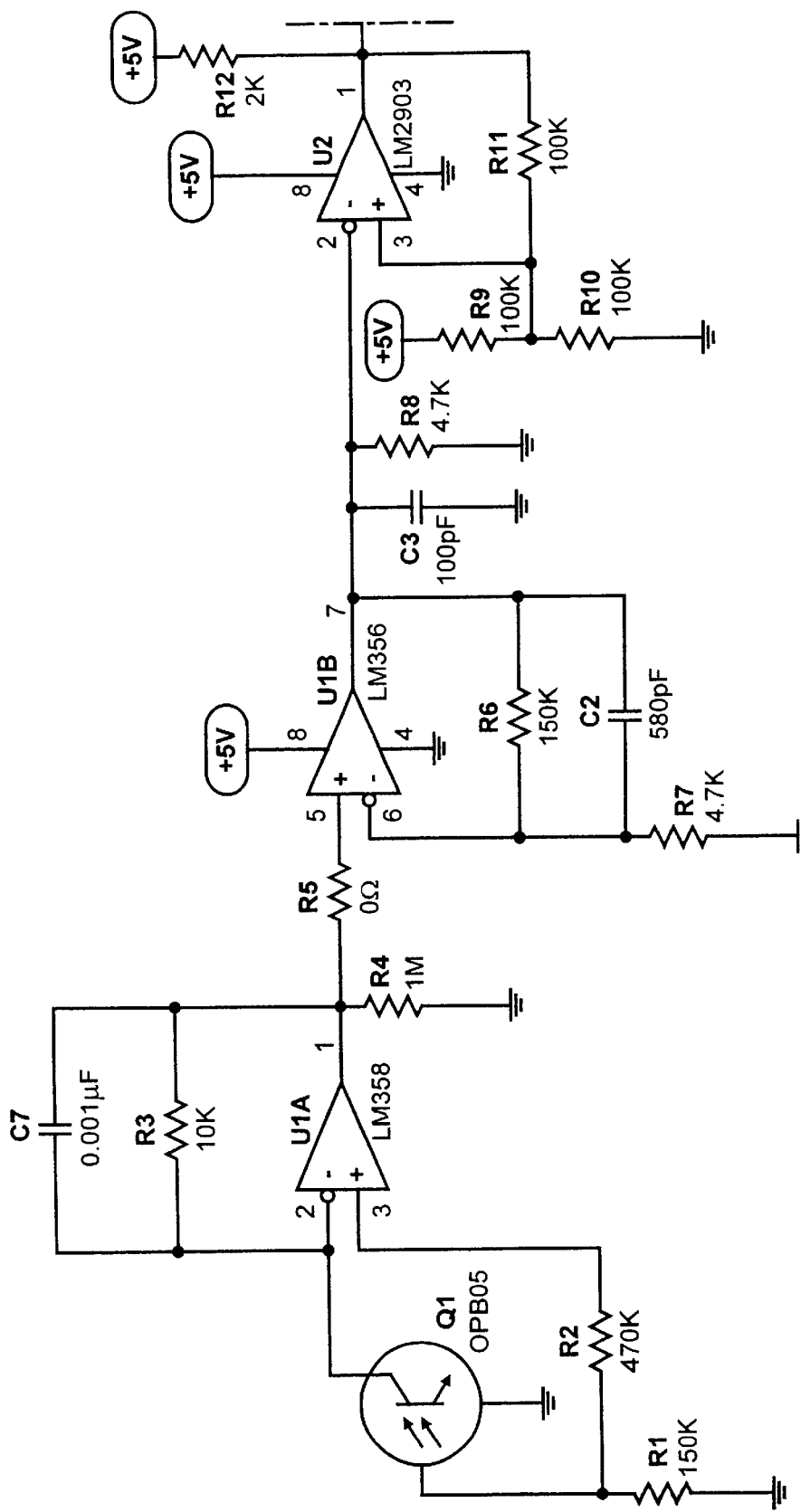
FIG. 15A4A

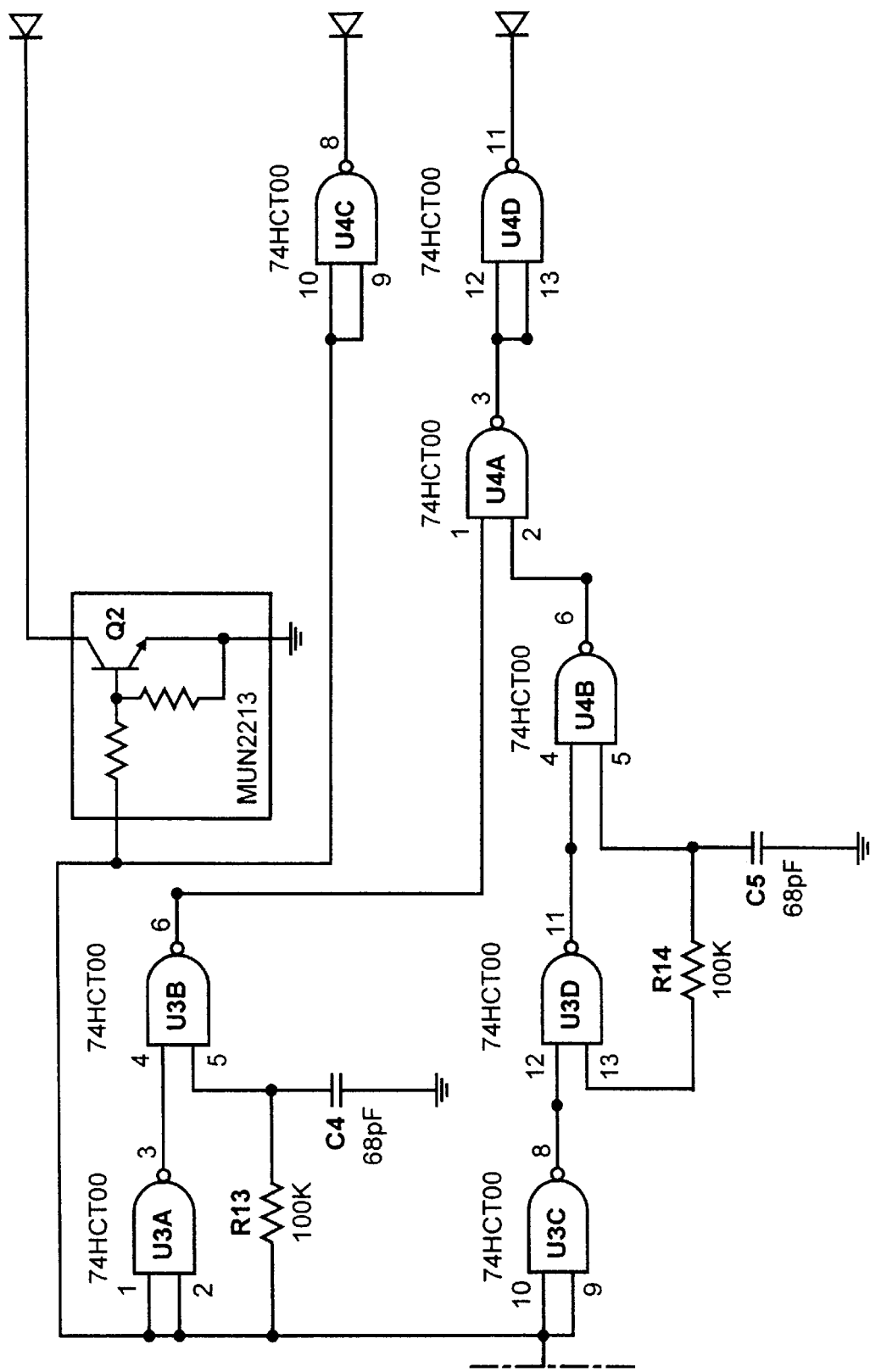
FIG. 15A4B

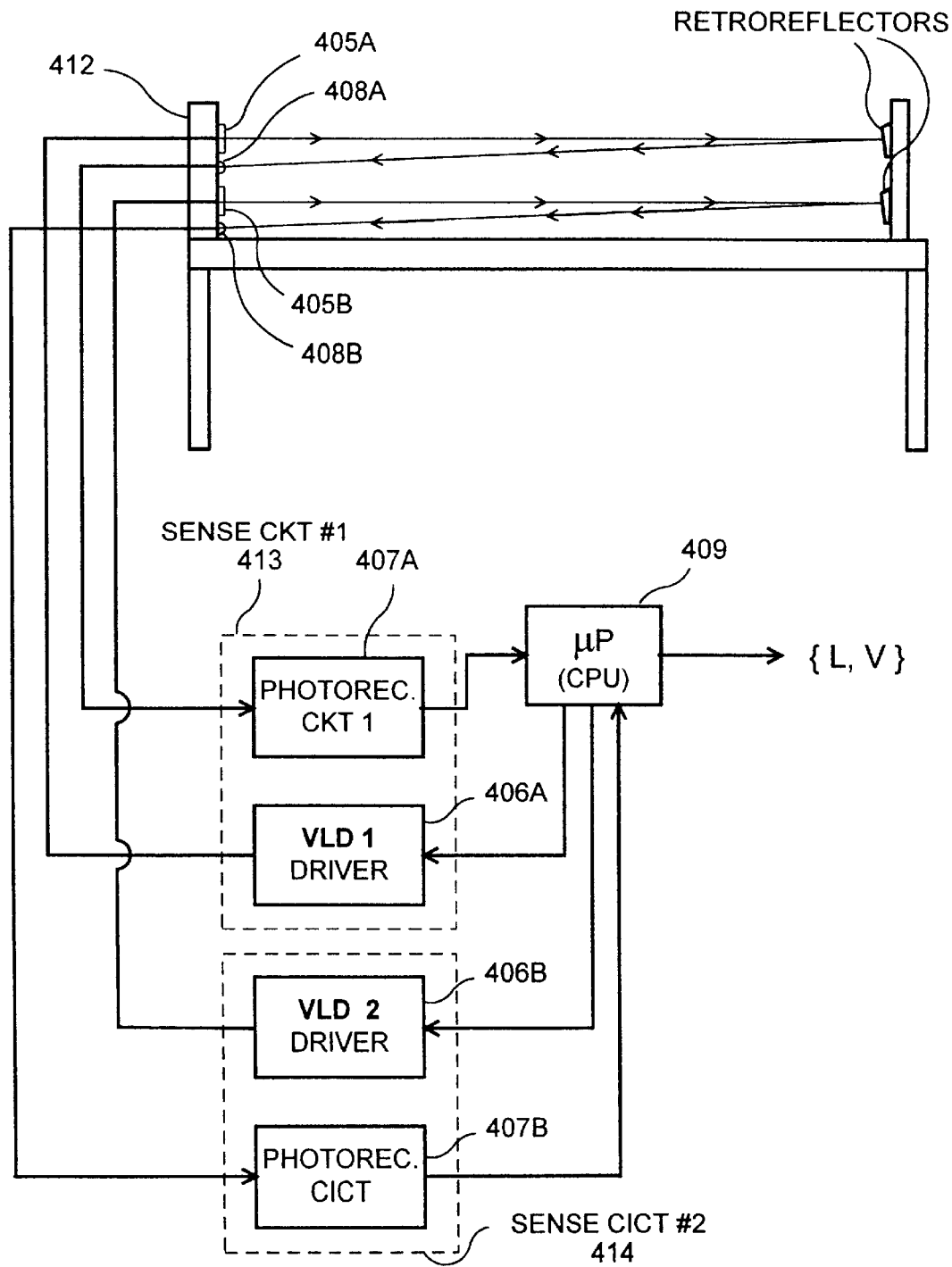
F I G. 15B

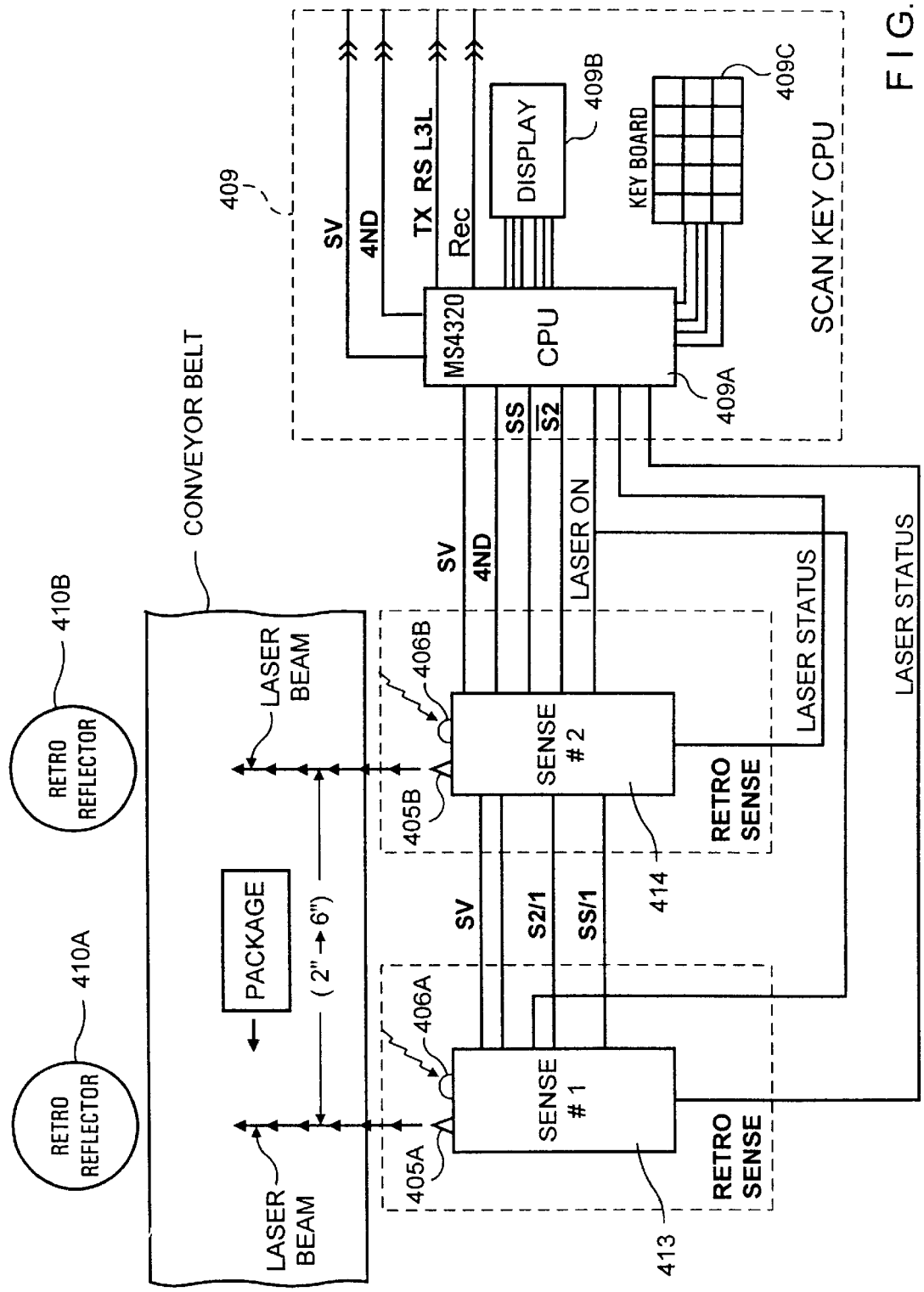
FIG. 15B1

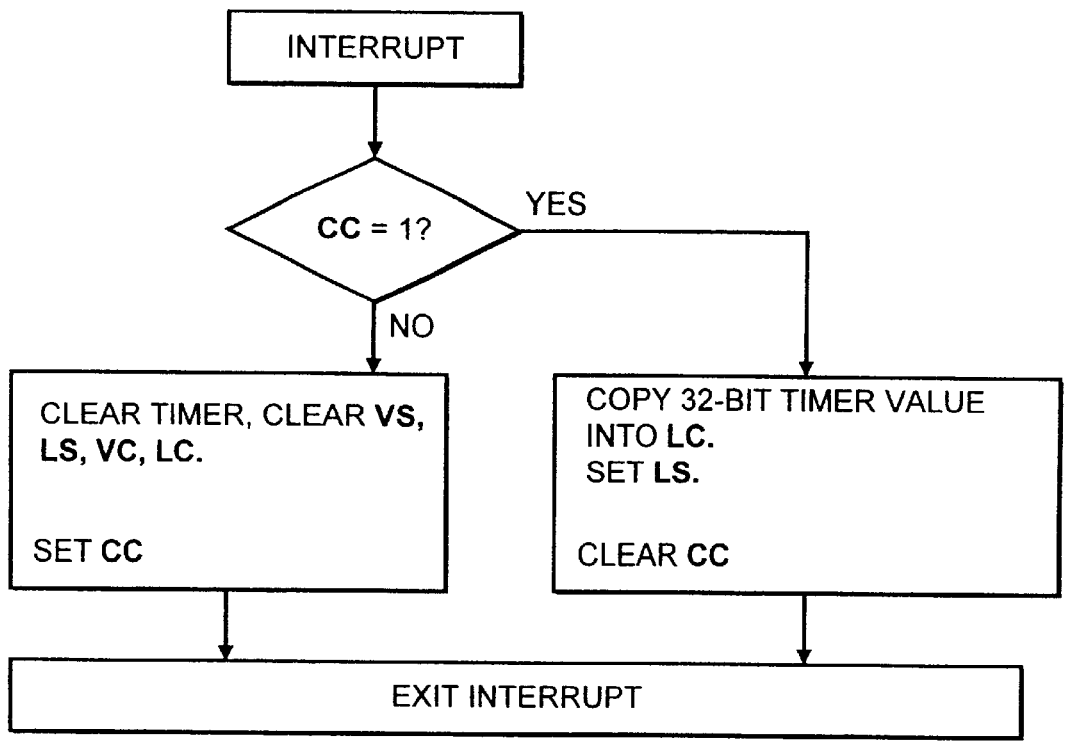
F I G. 15C1
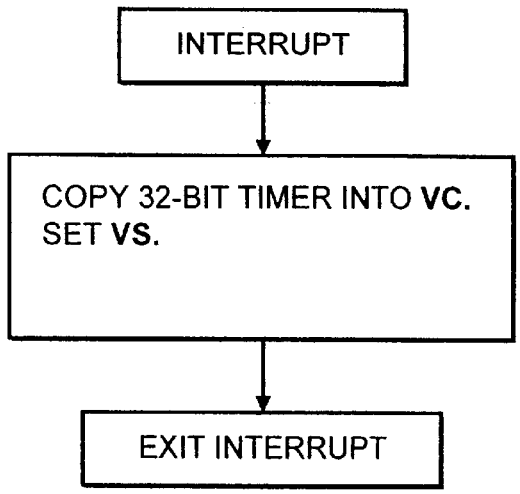
F I G. 15C2

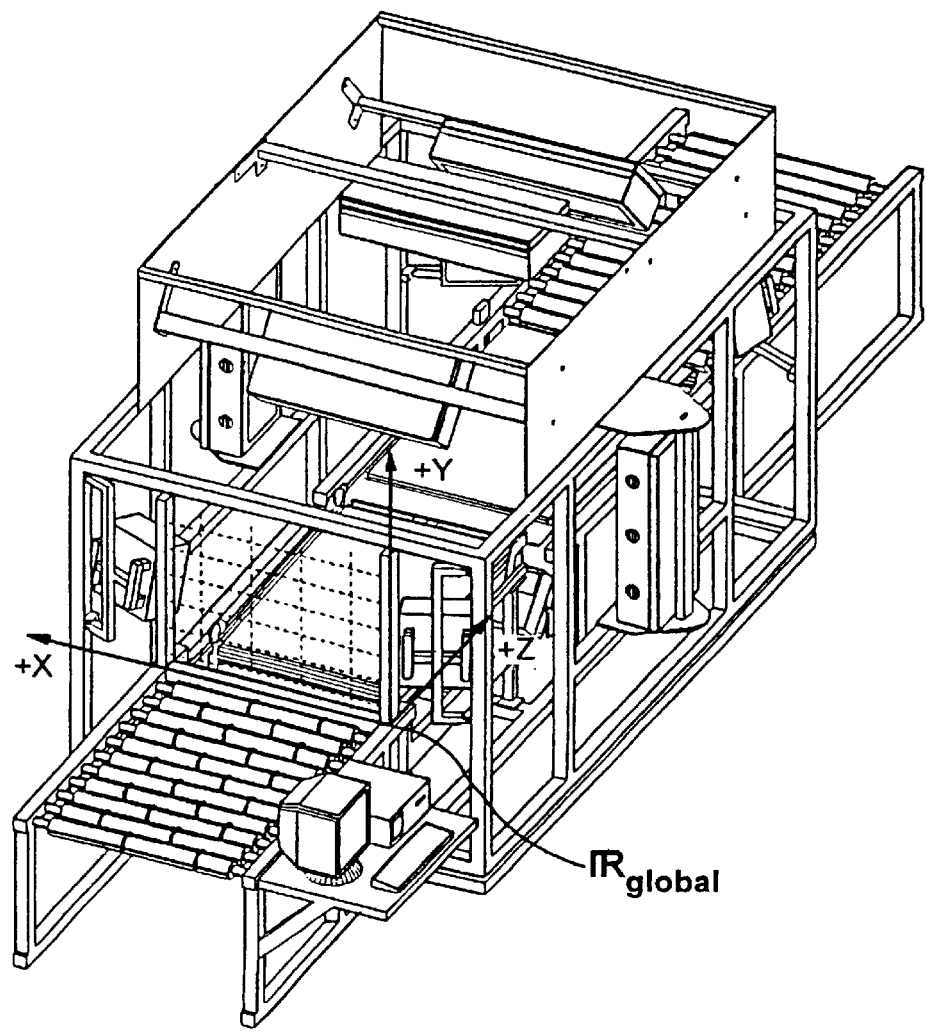
F I G. 16

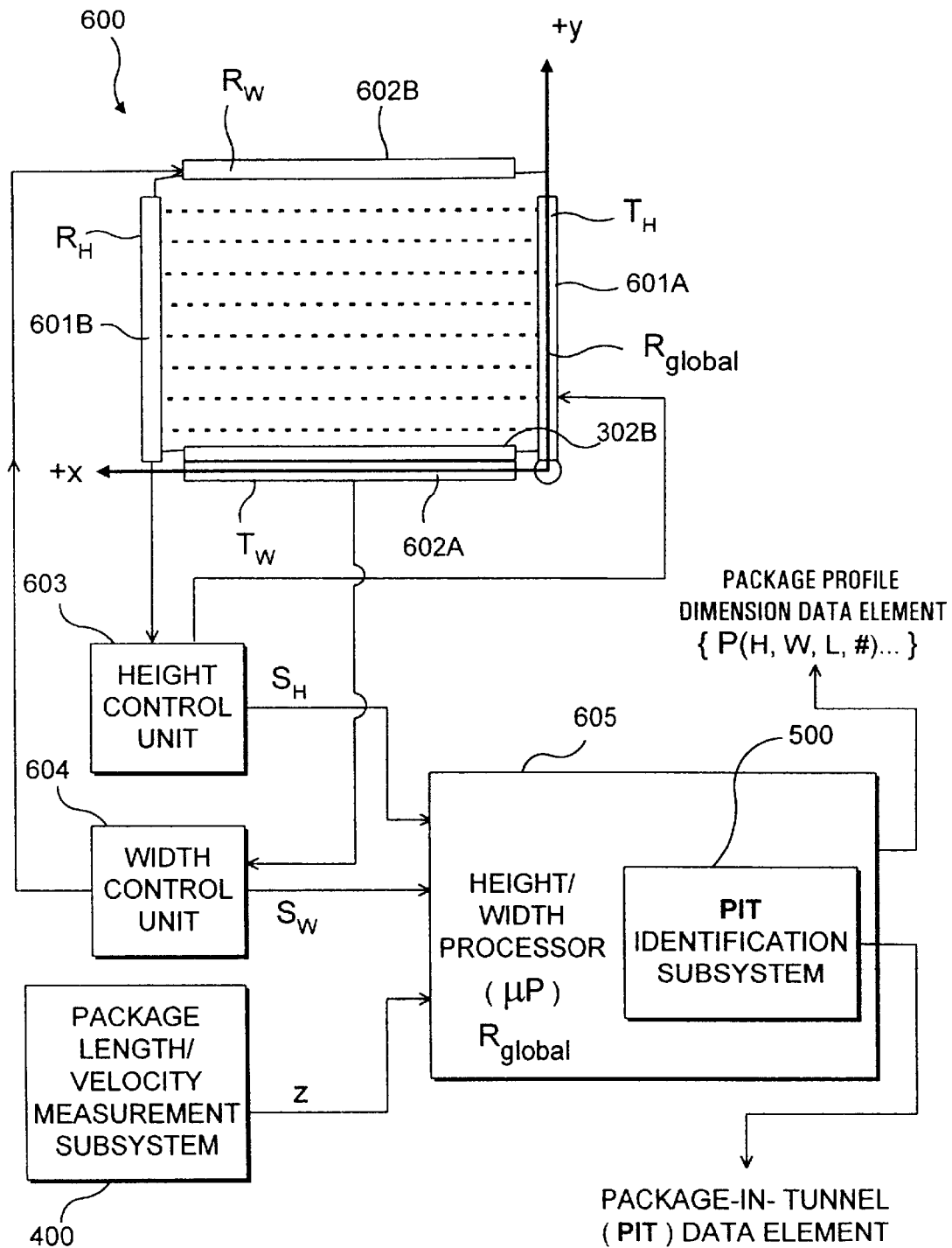
F I G. 16A

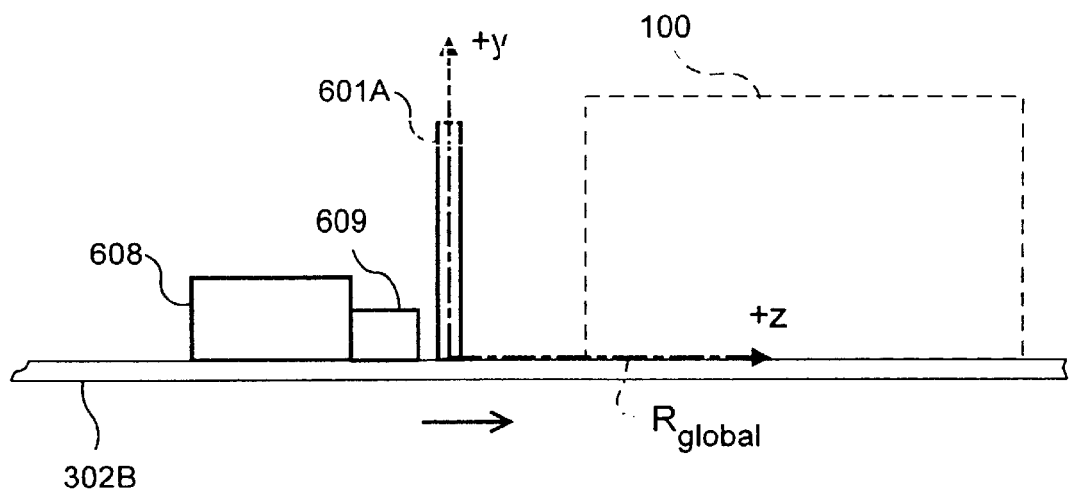
F I G. 17A
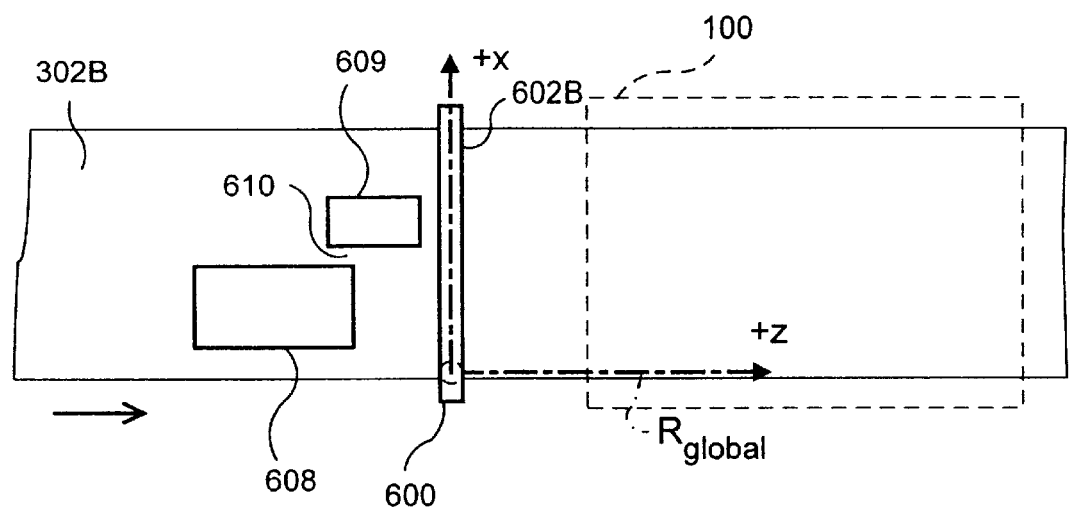
F I G. 17B
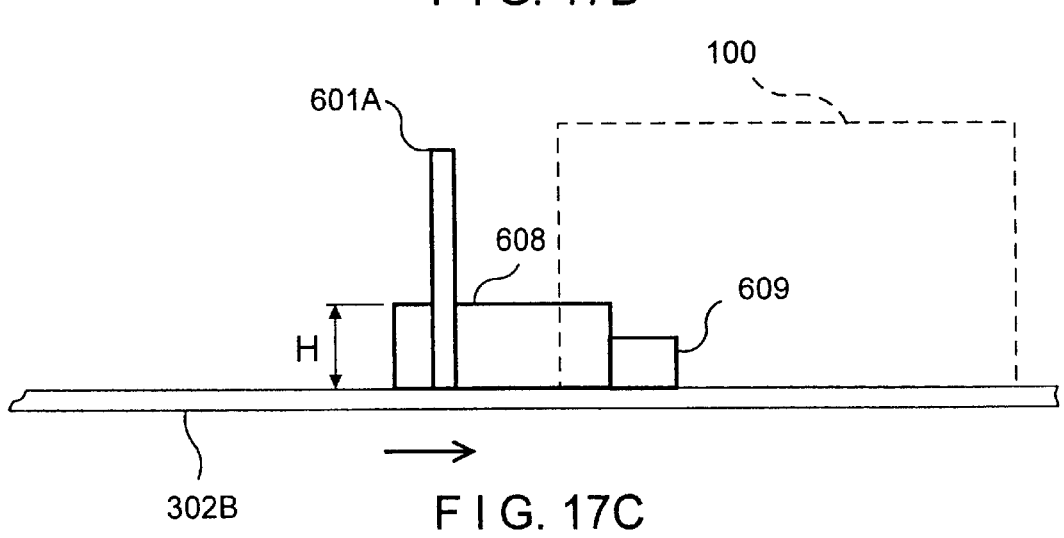
F I G. 17C

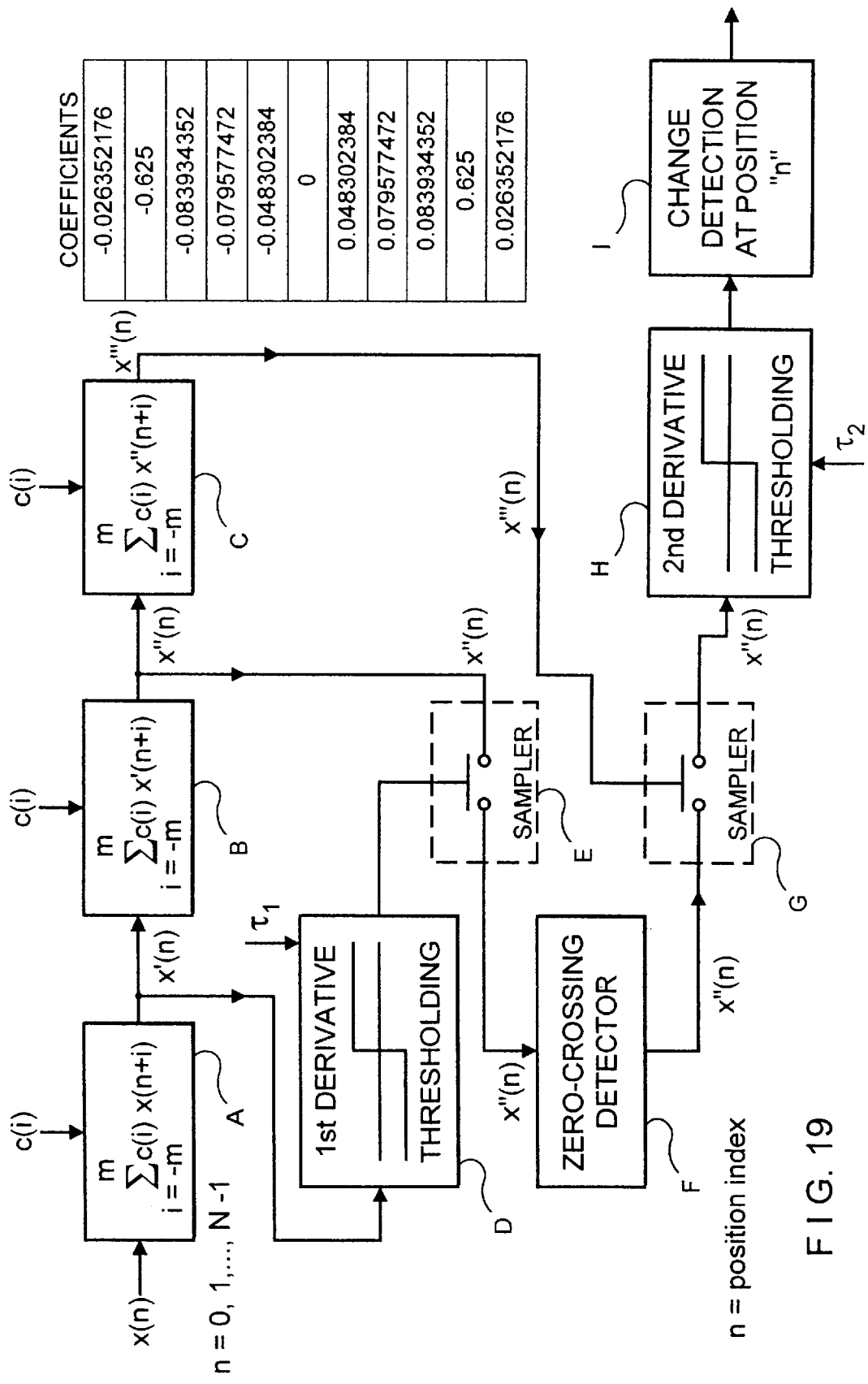
F I G. 19

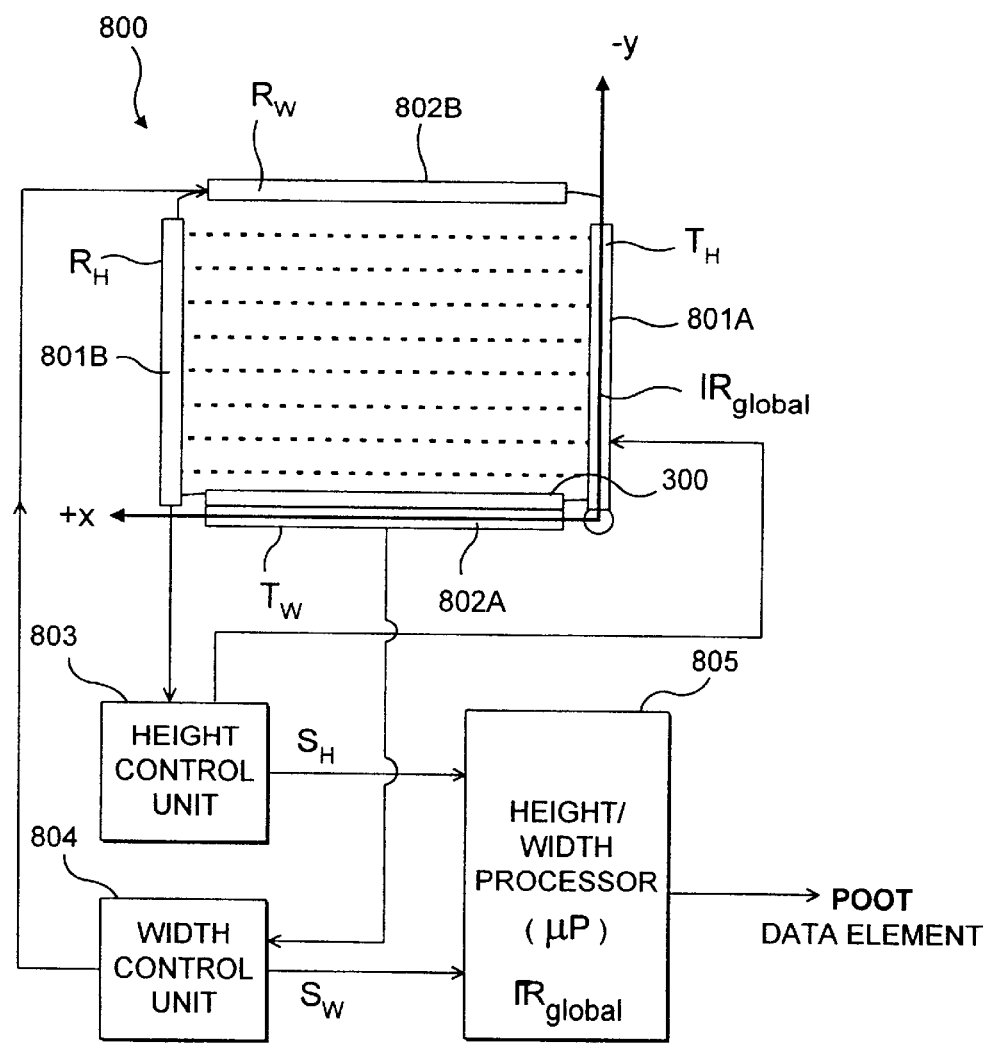
F I G. 21

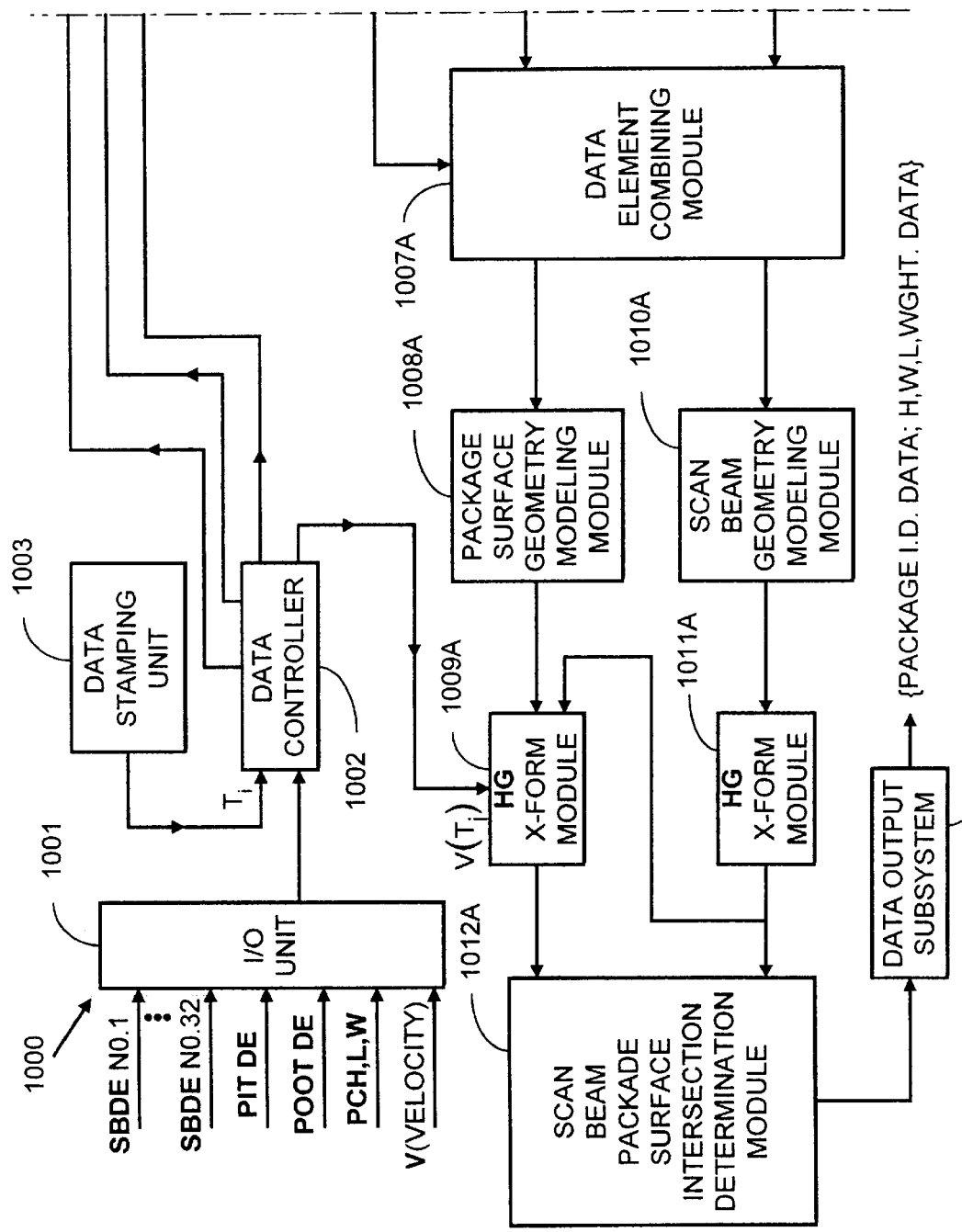
FIG. 22A1

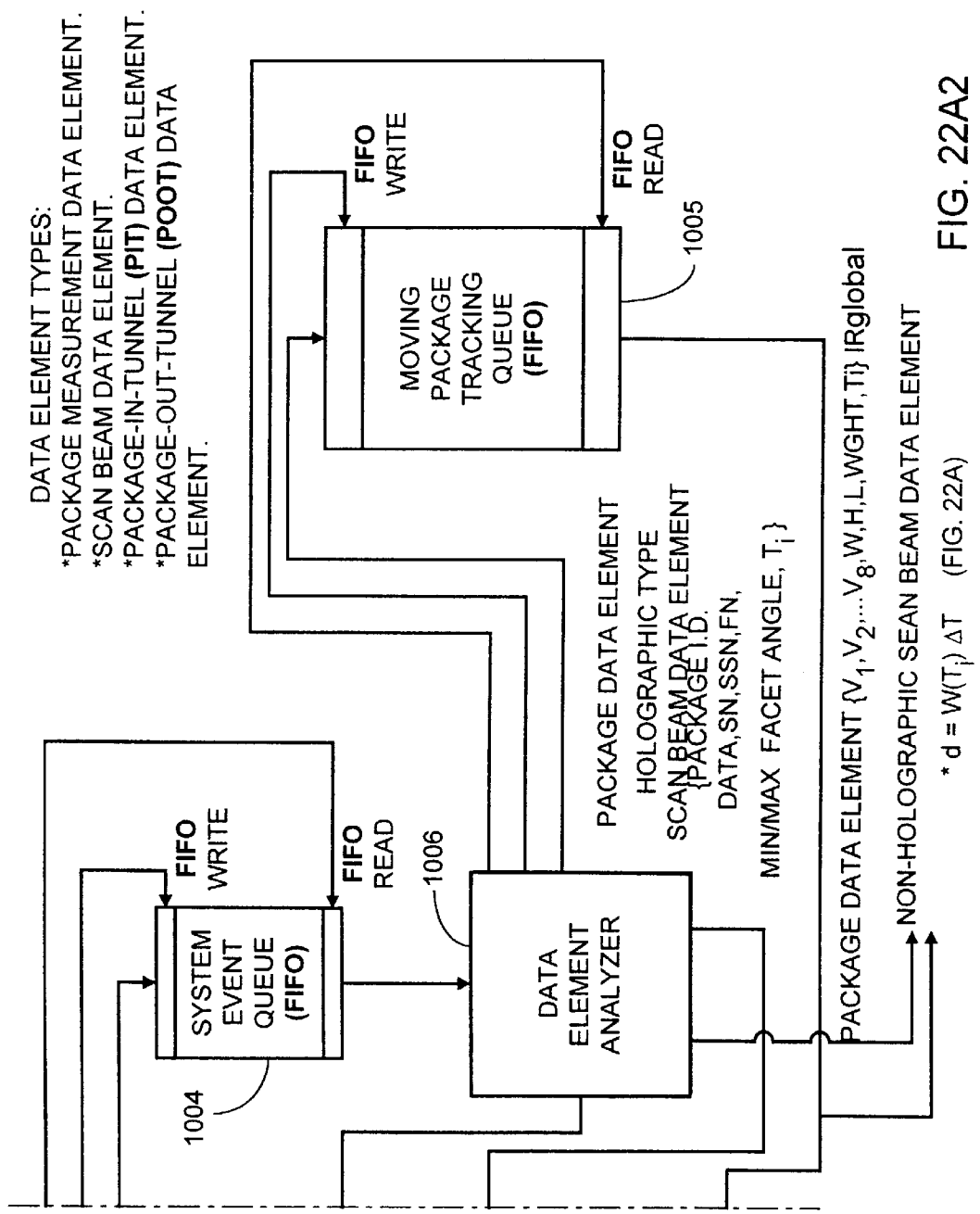
FIG. 22A2

DATA ELEMENT HANDLING RULES

1. WHEN A PACKAGE DATA ELEMENT (PDE) OF ANY TYPE IS REMOVED FROM THE SYSTEM EVENT QUEUE, THEN IT IS PLACED IN THE MOVING PACKAGE TRACKING QUEUE

2. WHEN A SCAN BEAM DATA ELEMENT (SBDE) IS REMOVED FROM THE SYSTEM EVENT QUEUE, THEN IT IS COMBINED WITH EACH PACKAGE DATA ELEMENT IN THE MOVING PACKAGE TRACKING QUEUE AND THEN EACH RESULTING DATA ELEMENT PAIR IS PROCESSED ALONG THE PACKAGE DATA ELEMENT CHANNEL AND SCAN DATA ELEMENT CHANNEL AS SHOWN IN FIG 22

3. WHEN A PACKAGE-IN-TUNNEL (PIT) DATA ELEMENT IS REMOVED FROM THE SYSTEM EVENT QUEUE, THEN THE OLDEST PACKAGE DATA ELEMENT IN THE MOVING PACKAGE TRACKING QUEUE IS REMOVED THERE FROM

4. WHEN A PACKAGE-OUT-OF-TUNNEL (POOT) DATA ELEMENT IS REMOVED FROM THE SYSTEM EVENT QUEUE, THEN THE FOLLOWING OPERATIONS ARE CARRIED OUT

FIG. 23A1

(a) IF THE TIME STAMP $T_i$ ON THE REMOVED POOT DATA ELEMENT INDICATES THAT CORRESPONDING PACKAGE HAS MOVED OUT OF THE SCANNING TUNNEL, THEN REMOVE THE OLDEST PACKAGE DATA ELEMENT IN MOVING PACKAGE TRACKING QUEUE (b) IF THE TIME STAMP $T_i$ ON THE REMOVED POOT DATA ELEMENT INDICATES THAT THE CORRESPONDING PACKAGE IS STILL MOVING THROUGH THE SCANNING TUNNEL, THEN DO NOT REMOVE ANY PACKAGE DATA ELEMENT FROM THE MOVING PACKAGE TRACKING QUEUE.

FIG. 23A2

VECTOR-BASED SURFACE MODELLING OF PACKAGES MOVING IN SCANNING TUNNEL

MATHEMATICAL FORM OF EACH SURFACE ON THE PACKAGE: VECTOR-BASED MODEL CONSISTING OF (1) AT LEAST THREE VERTICE POINTS WITHIN THE PLANE OF THE PACKAGE SURFACE, AND (2) NORMAL VECTOR FOR THE PLANE.

PROCEDURE:

(1) USE POSITION VECTOR ( REFERENCED TO X=0, Y=0, Z=0 IN $R_{global}$), FOR SPECIFYING THE POSITION OF EACH VERTEX IN THE PACKAGE SURFACE PLANE; AND (2) USE NORMAL VECTOR FOR SPECIFYING THE SURFACE DIRECTION OF THE PACKAGE SURFACE (AT WHICH LIGHT REFLECTS)

(3) THESE FOUR VECTORS SPECIFY THE SURFACE OF THE PACKAGE IN COORDINATE REFERENCE FROM $R_{global}$

FIG. 24A

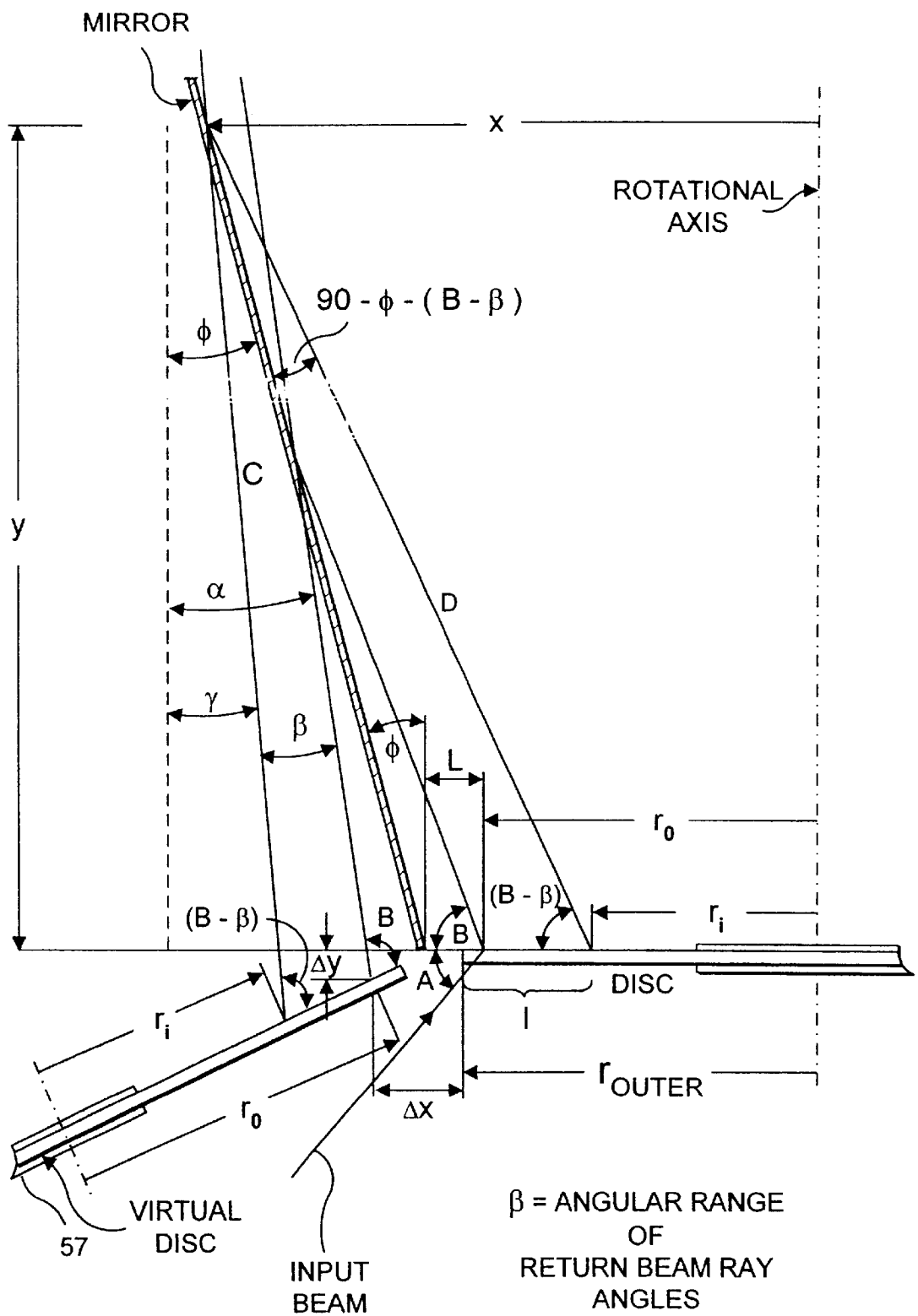
FIG. 25A1

( 1 ) THE RADIUS TO BEAM-INCIDENT-POINT ON THE HOLOGRAPHIC SCANNING DISC, ASSIGNED THE SYMBOLIC NOTATION "$r_0$"

( 2 ) SCANLINE SEPARATION BETWEEN ADJACENT SCANLINES AT THE FOCAL PLANE OF THE (i, J)-TH SCANLINE, ASSIGNED THE SYMBOLIC NOTATION "$S_{SL}$"

( 3 ) THE SCANLINE LENGTH (MEASURED INTO THE PAPER) FOR THE (i, J)-TH SCANLINE, ASSIGNED THE SYMBOLIC NOTATION "$L_{SL}$"

( 4 ) THE DISTANCE MEASURED FROM THE SCANNING DISC TO THE FOCAL PLANE OF THE (i, J)-TH SCANLINE, ASSIGNED THE SYMBOLIC NOTATION "$a_i$"

( 5 ) THE DISTANCE FROM RADIUS TO BEAM-INCIDENT-POINT $r_0$ TO BEAM FOLDING MIRROR, ASSIGNED THE SYMBOLIC NOTATION "$L$"

( 6 ) THE TILT ANGLE OF THE J-TH BEAM FOLDING MIRROR ASSOCIATED WITH GENERATION OF THE (i, J)-TH SCANLINE, ASSIGNED THE SYMBOLIC NOTATION "$\phi_j$"

( 7 ) THE TILT ANGLE OF THE VIRTUAL SCANNING DISC, ASSIGNED THE SYMBOLIC NOTATION "$2\phi$"

( 8 ) THE LATERAL SHIFT OF THE BEAM INCIDENT POINT ON THE VIRTUAL SCANNING DISC, ASSIGNED THE SYMBOLIC NOTATION "$\Delta X$"

( 9 ) THE VERTICAL SHIFT OF THE BEAM INCIDENT POINT ON THE VIRTUAL SCANNING DISC, ASSIGNED THE SYMBOLIC NOTATION "$\Delta Y$"

( 10 ) THE DISTANCE FROM THE ROTATION AXIS TO THE BEAM INCIDENT POINT ON THE VIRTUAL SCANNING DISC, ASSIGNED THE SYMBOLIC NOTATION "$r_0 + \Delta X$"

( 11 ) THE DISTANCE FROM THE BEAM INCIDENT POINT ON THE VIRTUAL SCANNING DISC TO THE FOCAL PLANE WITHIN WHICH THE (i, j)-TH SCANLINE RESIDES, ASSIGNED THE SYMBOLIC NOTATION "$f_i$"

( 12 ) THE DIAMETER OF THE CROSS-SECTION OF THE LASER BEAM SCANNING STATION, ASSIGNED THE SYMBOLIC NOTATION "$d_{BEAM}$"

( 13 ) THE ANGULAR GAP BETWEEN ADJACENT HOLOGRAPHIC SCANNING FACETS, ASSIGNED THE SYMBOLIC NOTATION "$d_{GAP}$"

( 14 ) THE OUTER RADIUS OF THE AVAILABLE LIGHT COLLECTION REGION ON THE HOLOGRAPHIC SCANNING DISC, ASSIGNED THE SYMBOLIC NOTATION "$r_{OUTER}$"

FIG. 25B1

(15) THE INNER RADIUS OF THE AVAILABLE LIGHT COLLECTION REGION ON THE HOLOGRAPHIC SCANNING FACET, ASSIGNED THE SYMBOLIC NOTATION "$r_{INNER}$"

(16) ONE-HALF OF THE DEPTH OF FIELD OF THE (i, J)-TH SCANLINE, ASSIGNED THE SYMBOLIC NOTATION "$\delta$"

(17) THE DISTANCE FROM THE MAXIMUM READ DISTANCE ($f_i$ + 5") TO THE INNER RADIUS $r_i$ OF THE SCANNING FACET, ASSIGNED THE SYMBOLIC NOTATION "C"

(18) THE OUTER RAY ANGLE MEASURED RELATIVE TO THE NORMAL TO THE i-TH HOLOGRAPHIC FACET, ASSIGNED THE SYMBOLIC NOTATION "$\alpha$"

(19) THE INNER RAY ANGLE MEASURED RELATIVE TO THE NORMAL TO THE i-TH HOLOGRAPHIC FACET, ASSIGNED THE SYMBOLIC NOTATION "$\gamma$"

(20) THE LIGHT COLLECTION ANGLE MEASURED FROM THE FOCAL POINT OF THE i-TH FACET TO THE LIGHT COLLECTION AREA OF THE SCANNING FACET, ASSIGNED THE SYMBOLIC NOTATION "$\beta$"

(21) THE INTERSECTION OF THE BEAM FOLDING MIRROR AND LINE C, ASSIGNED THE SYMBOLIC NOTATION "X"

(21A) THE INTERSECTION OF THE BEAM FOLDING MIRROR AND LINE C, ASSIGNED THE SYMBOLIC NOTATION "Y"

(22) THE DISTANCE MEASURED FROM THE INNER RADIUS TO THE POINT OF MIRROR INTERSECTION, ASSIGNED THE SYMBOLIC NOTATION "D"

(23) THE DISTANCE MEASURED FROM THE BASE OF THE SCANNER HOUSING TO THE TOP OF THE j-TH BEAM FOLDING MIRROR, ASSIGNED THE SYMBOLIC NOTATION "h"

(24) THE DISTANCE MEASURED FROM THE SCANNING DISC TO THE BASE OF THE HOLOGRAPHIC SCANNER, ASSIGNED THE SYMBOLIC NOTATION "d"

(25) THE FOCAL LENGTH OF THE i-TH HOLOGRAPHIC SCANNING FACET FROM THE SCANNING FACET TO THE CORRESPONDING FOCAL PLANE WITHIN THE SCANNING VOLUME, ASSIGNED THE SYMBOLIC NOTATION "$f_i$"

(26) INCIDENT BEAM ANGLE, ASSIGNED THE SYMBOLIC NOTATION "$A_i$"

FIG. 25B2

(27) DIFFRACTED BEAM ANGLE, ASSIGNED THE SYMBOLIC NOTATION "$B_i$"

(28) THE ANGLE OF THE J-TH LASER BEAM MEASURED FROM THE VERTICAL, ASSIGNED THE SYMBOLIC NOTATION "$\alpha$"

(29) THE SCAN ANGLE OF THE LASER BEAM, ASSIGNED THE SYMBOLIC NOTATION "$\theta_{Si}$"

(30) THE SCAN MULTIPLICATION FACTOR FOR THE i-TH HOLOGRAPHIC FACET, ASSIGNED THE SYMBOLIC NOTATION "$M_i$"

(31) THE FACET ROTATION ANGLE FOR THE i-TH HOLOGRAPHIC FACET, ASSIGNED THE SYMBOLIC NOTATION "$\theta_{ROTi}$"

(32) ADJUSTED FACET ROTATION ANGLE ACCOUNTING FOR DEADTIME, ASSIGNED THE SYMBOLIC NOTATION "$\theta'_{ROTi}$"

(33) THE LIGHT COLLECTION EFFICIENCY FACTOR FOR THE i-TH HOLOGRAPHIC FACET, NORMALIZED RELATIVE TO THE 16TH FACET, ASSIGNED THE SYMBOLIC NOTATION "$\xi_i$"

(34) THE MAXIMUM LIGHT COLLECTION AREA FOR THE i-TH HOLOGRAPHIC FACET, ASSIGNED THE SYMBOLIC NOTATION "$Area_i$"

(35) THE BEAM SPEED AT THE CENTER OF THE (i, j)-TH SCANLINE, ASSIGNED THE SYMBOLIC NOTATION "$V_{CENTER}$"

(36) THE ANGLE OF SKEW OF THE DIFFRACTED LASER BEAM AT THE CENTER OF THE i-TH HOLOGRAPHIC FACET, ASSIGNED THE SYMBOLIC NOTATION "$\phi_{SKEW}$"

(37) THE MAXIMUM BEAM SPEED OF ALL LASER BEAMS PRODUCED BY THE HOLOGRAPHIC SCANNING DISC, ASSIGNED THE SYMBOLIC NOTATION "$V_{MAX}$"

(38) THE MINIMUM BEAM SPEED OF ALL LASER BEAMS PRODUCED BY THE HOLOGRAPHIC SCANNING DISC, ASSIGNED THE SYMBOLIC NOTATION "$V_{MIN}$"

(39) THE RATIO OF THE MAXIMUM BEAM SPEED TO THE MINIMUM BEAM SPEED, ASSIGNED THE SYMBOLIC NOTATION "$V_{MAX}/V_{MIN}$"

(40) THE DEVIATION OF THE LIGHT RAYS REFLECTED OFF THE PARABOLIC LIGHT REFLECTING MIRROR BENEATH THE SCANNING DISC, FROM THE BRAGG ANGLE FOR THE FACET, ASSIGNED THE SYMBOLIC NOTATION "$\delta_e$"

FIG. 25B3

(1) $\Delta x := L(1 + \cos(2\phi))$ (2) $\Delta y := L \sin(2\phi)$ (3) $\Delta y := r_0 + \Delta x$ (4) $C := \sqrt{(f+\delta)^2 + l^2 + 2(f+\delta)l\cos(B)}$ LAW OF COSINES, WHERE: $l = r_{outer} - r_{inner}$ $\beta = \alpha - \gamma = B + 2\phi - 90 - \gamma$ (5) $\alpha := B - 90 + 2\phi$ (6) $r := \alpha - \cos\left[\dfrac{(f+\delta)^2 + C^2 - l^2}{2(f+\delta)C}\right]$ (7) $\beta := \alpha - \gamma$ (8) $X := D\cos(B - \beta) + r_i$ (9) $Y := D\sin(B - \beta)$

(10) $D := \dfrac{[r_0 + L - r_i]\sin(90 + \phi)}{\sin(90 - B + \beta - \phi)}$ (LAW OF SINES)

$$(12) \quad f_i := \sqrt{a_i^2 + \left[m\, S_{SL} - \left[r_0 + \Delta x\right]\right]^2}$$

m IS A FACTOR THAT VARIES FROM SCAN LINE TO SCAN LINE AND DETERMINED BY SCAN LINE SEPARATION AND DISTANCE FROM THE ROTATIONAL AXIS OF THE DISC.

$$(13) \quad B_i := \operatorname{atan}\left[\left[\frac{m\, S_{SL} - \left[r_0 + \Delta x\right]}{a_i}\right]\right] + 90 - 2\phi$$

$$(14) \quad \theta_{Si} := 2\operatorname{atan}\left[\left[\frac{\frac{1}{2}\text{ScanLineLength}}{f_i}\right]\right]$$

$$(15) \quad M_i := \frac{r_0}{f_i} + \cos(\lambda_i) + \cos(B_i)$$

$$(16) \quad \theta_{roti} := \frac{\theta_{Si}}{M_i}$$

$$(17) \quad \theta'_{roti} := \theta_{roti} + \underbrace{\frac{d_{beam}}{r_0} + \frac{d_{gap}}{r_0}}_{\Theta_{dead}}$$

$$(18) \quad \xi_i := \left[\frac{f_i}{f_{16}}\right]^2 \frac{\sin[B_{16}]}{\sin(B_i)} H_i$$

$$(19) \quad \text{Area}_i := \pi \left[r_{outer}^2 + r_{inner}^2\right] \frac{\xi_i}{\sum_{i=1}^{16}[\xi_i]} \qquad i = 1, 2, \ldots 16$$

FIG. 25C2

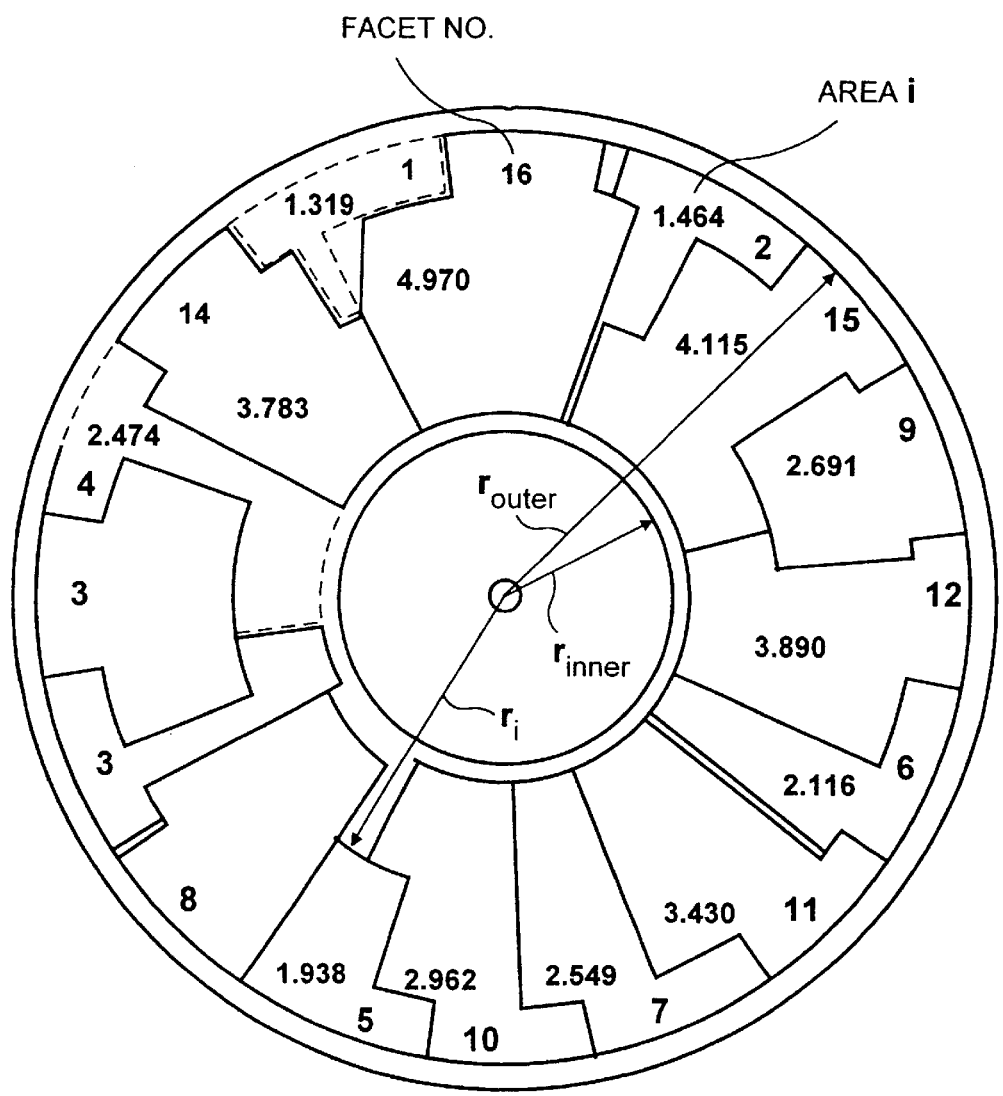
F I G. 26

**VECTOR MODELING OF LASER SCAN BEAMS
IN HOLOGRAPHIC SCANNING SUBSYSTEMS**

MATHEMATICAL FORM FOR EACH LASER SCAN BEAM:
VECTOR-BASED MODEL OF OPTICAL PATH OF BEAM
FROM DISC TO MIRROR TO FOCAL PLANE ( $\infty$ )

PROCEDURE:

(1) USE POSITION VECTOR REFERENCED FROM X=0, Y=0, Z=0 IN $\overline{R}_{local\ scanner}$, FOR SPECIFYING THE STARTING POINT OF LASER SCAN BEAM ON DISC, AND DIRECTION VECTOR FOR SPECIFYING THE DIRECTION OF LASER BEAM THE BEAM FOLDING MIRROR; AND (2) USE POSITION VECTOR FOR SPECIFYING POINT ON MIRROR WHERE BEAM IS REFLECTED FROM BEAM FOLDING MIRROR TOWARDS FOCAL PLANE OF FACET, EXTENDING TO INFINITY, AND DIRECTION VECTOR FOR SPECIFYING THE DIRECTION OF LASER BEAM TOWARDS DESIGNATED FOCAL PLANE (3) THESE FOUR VECTORS SPECIFY THE LASER BEAM RAY IN LOCAL COORDINATE REFERENCE $\overline{R}_{local\ scanner}$

FIG. 27

NOTE:

EACH SCANNING SURFACE IS SPECIFIED BY FOUR BOUNDARY POINTS IN y = 0, X - Z PLANE OF $R_{global}$, REFERENCED TO x = 0, y = 0, z = 0;

EACH POINT IS REPRESENTED BY A POSITION VECTOR AND A DIRECTION VECTOR ASSUMED NORMAL TO X-Y PLANE.

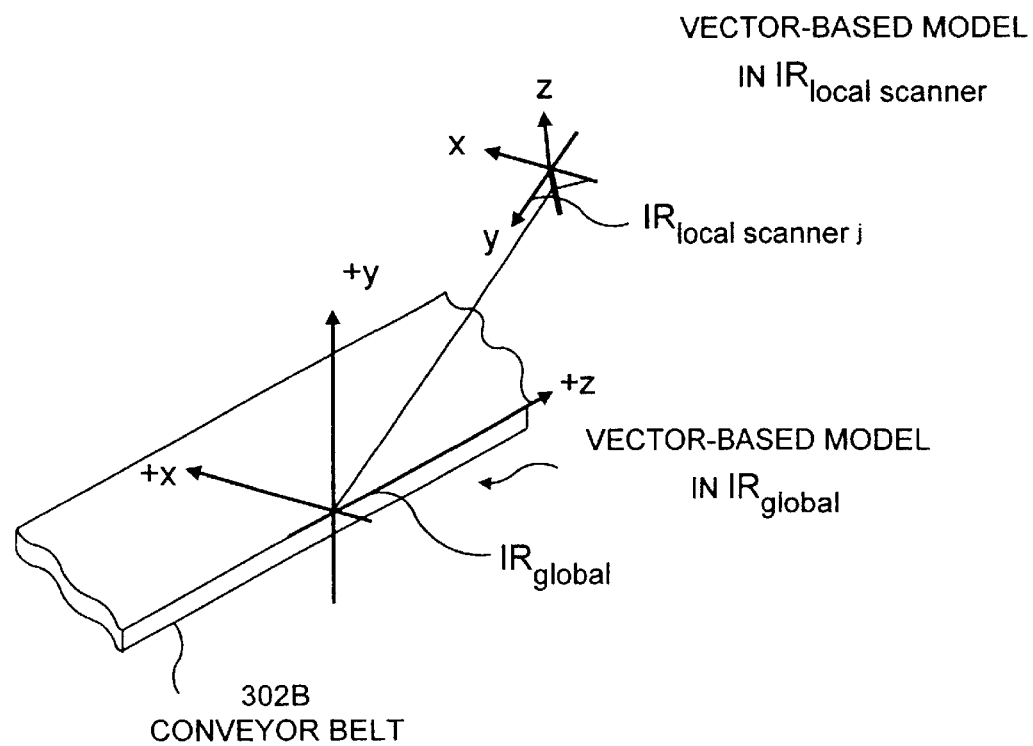
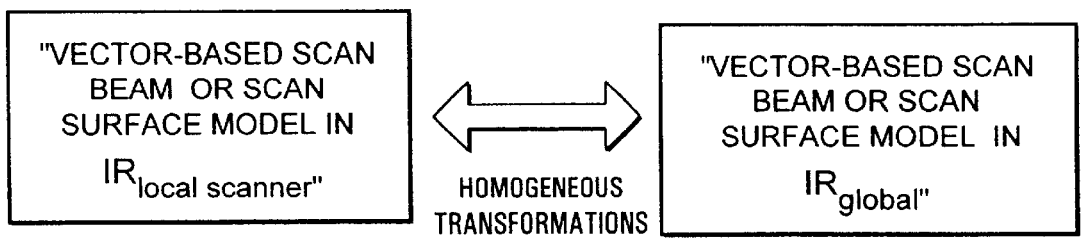
FIG. 29

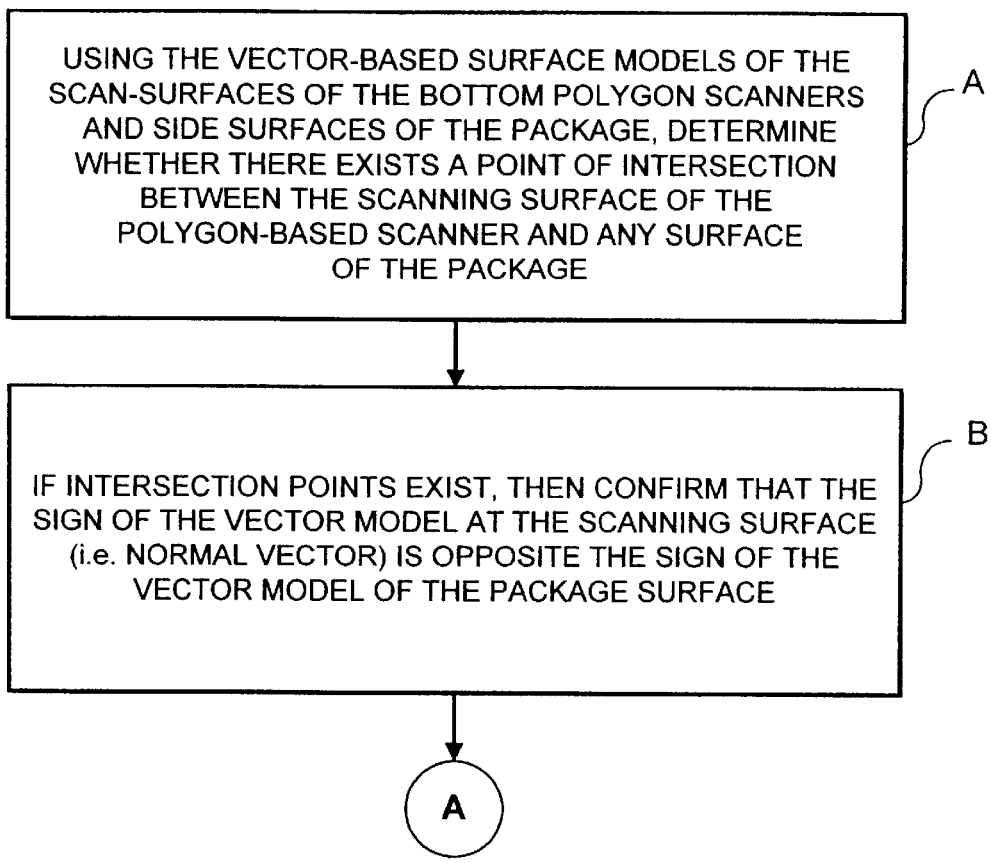
F I G. 32A

BASIC ORTHO SCANNING SOLUTION OVER 40" WIDE CONVEYOR BELT

DATA ELEMENT HANDLING RULES

1. WHEN A PACKAGE DATA ELEMENT (PDE) IS REMOVED FROM THE SYSTEM EVENT QUEUE, THEN IT IS PLACED IN THE MOVING PACKAGE TRACKING QUEUE

2. WHEN A SCAN BEAM DATA ELEMENT (SBDE) IS REMOVED FROM THE SYSTEM EVENT QUEUE, THEN IT IS COMBINED WITH EACH PACKAGE DATA ELEMENT IN THE MOVING PACKAGE TRACKING QUEUE AND THEN EACH RESULTING DATA ELEMENT PAIR IS PROCESSED ALONG THE PACKAGE DATA ELEMENT CHANNEL AND SCAN DATA ELEMENT CHANNEL AS SHOWN IN FIG. 36A AND 36B

3. WHEN A PACKAGE-IN-TUNNEL (PIT) DATA ELEMENT IS REMOVED FROM THE SYSTEM EVENT QUEUE, THEN THE OLDEST PACKAGE DATA ELEMENT IN THE MOVING PACKAGE TRACKING QUEUE IS REMOVED THEREFROM

4. WHEN A PACKAGE-OUT-OF-TUNNEL (POOT) DATA ELEMENT IS REMOVED FROM THE SYSTEM EVENT QUEUE, THEN THE FOLLOWING OPERATIONS ARE CARRIED OUT

FIG. 37A (A) IF THE TIME-STAMP $T_i$ ON THE REMOVED POOT DATA ELEMENT INDICATE THAT CORRESPONDING PACKAGE HAS MOVED OUT OF THE SCANNING TUNNEL, THEN REMOVE THE OLDEST PACKAGE DATA ELEMENT IN MOVING PACKAGE TRACKING QUEUE.

(B) IF THE TIME-STAMP $T_i$ ON THE REMOVED POOT DATA ELEMENT INDICATES THAT THE CORRESPONDING PACKAGE IS STILL MOVING THROUGH THE SCANNING TUNNEL, THEN DO NOT REMOVE ANY PACKAGE DATA ELEMENT FROM THE MOVING PACKAGE TRACKING QUEUE

FIG. 37B

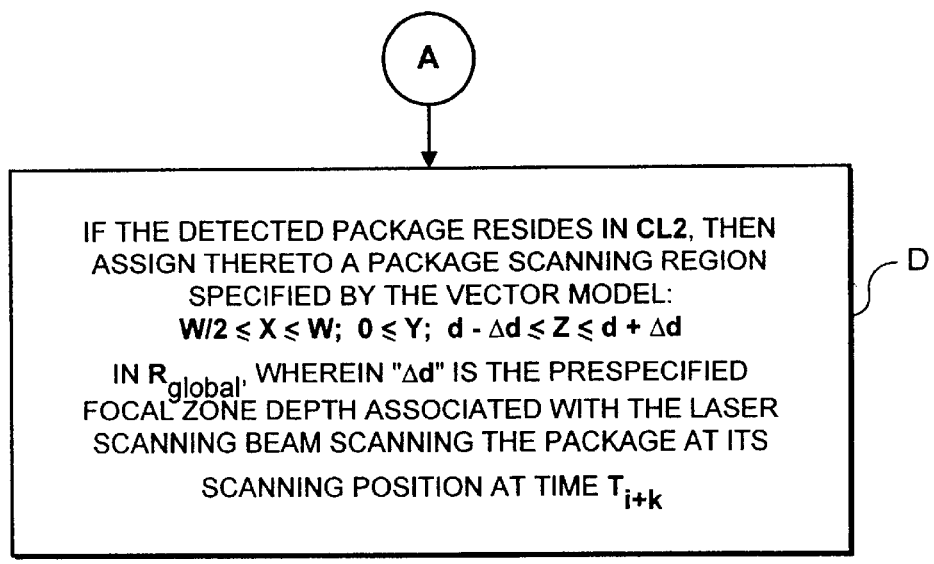
F I G. 39B

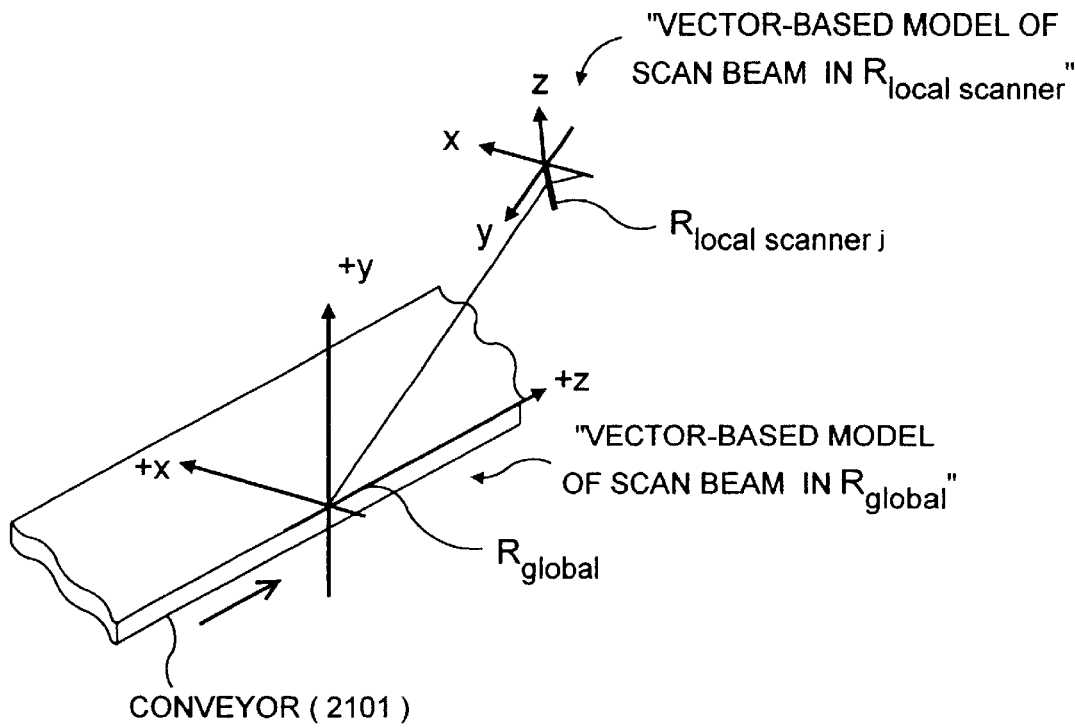
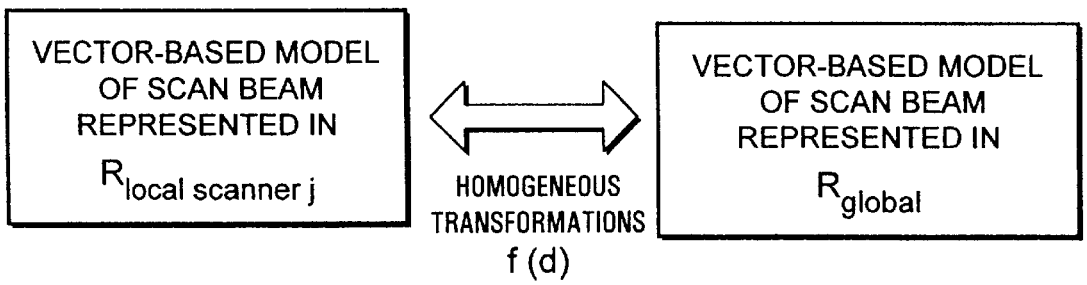
FIG. 40

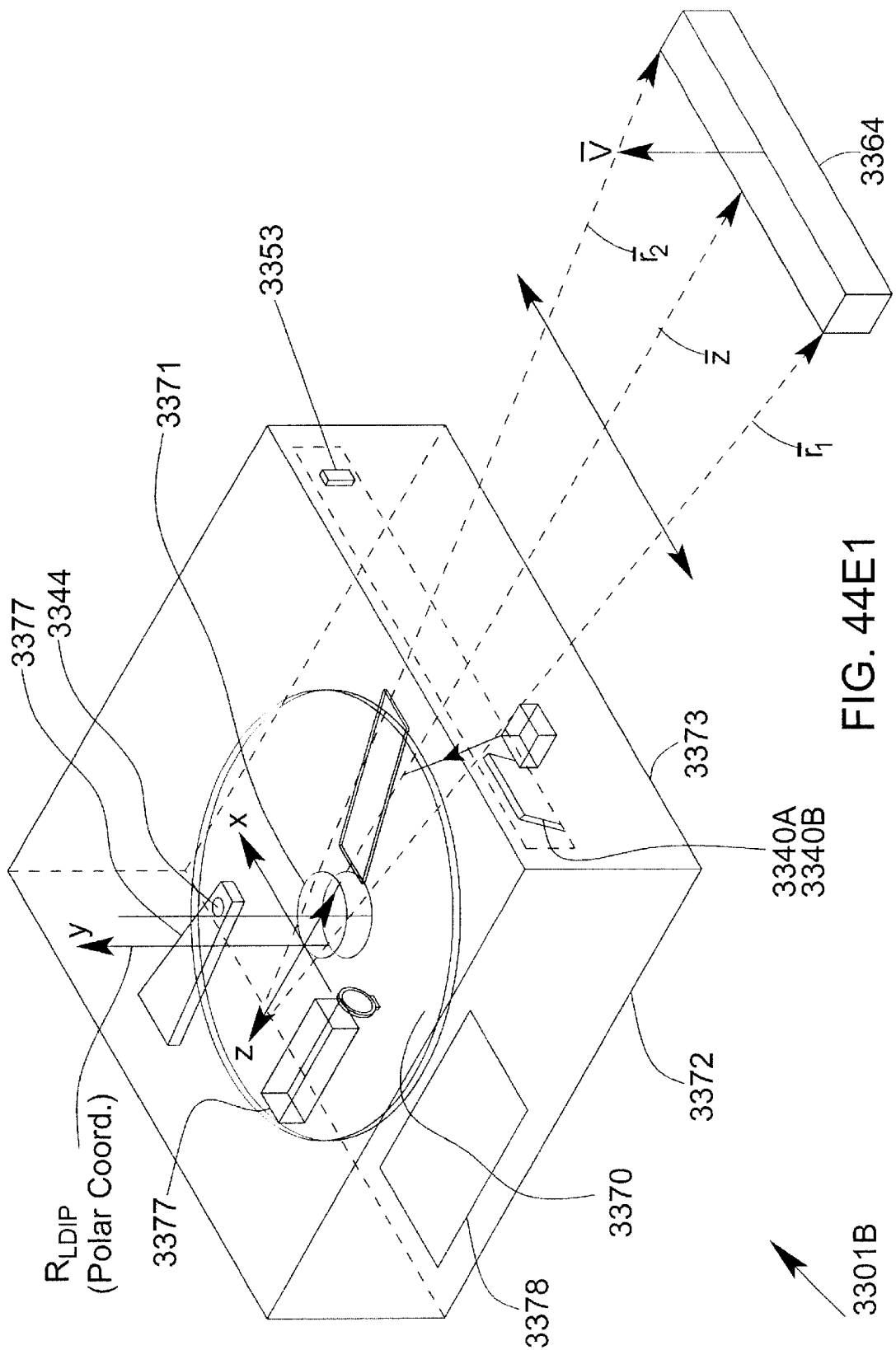
FIG. 44E1

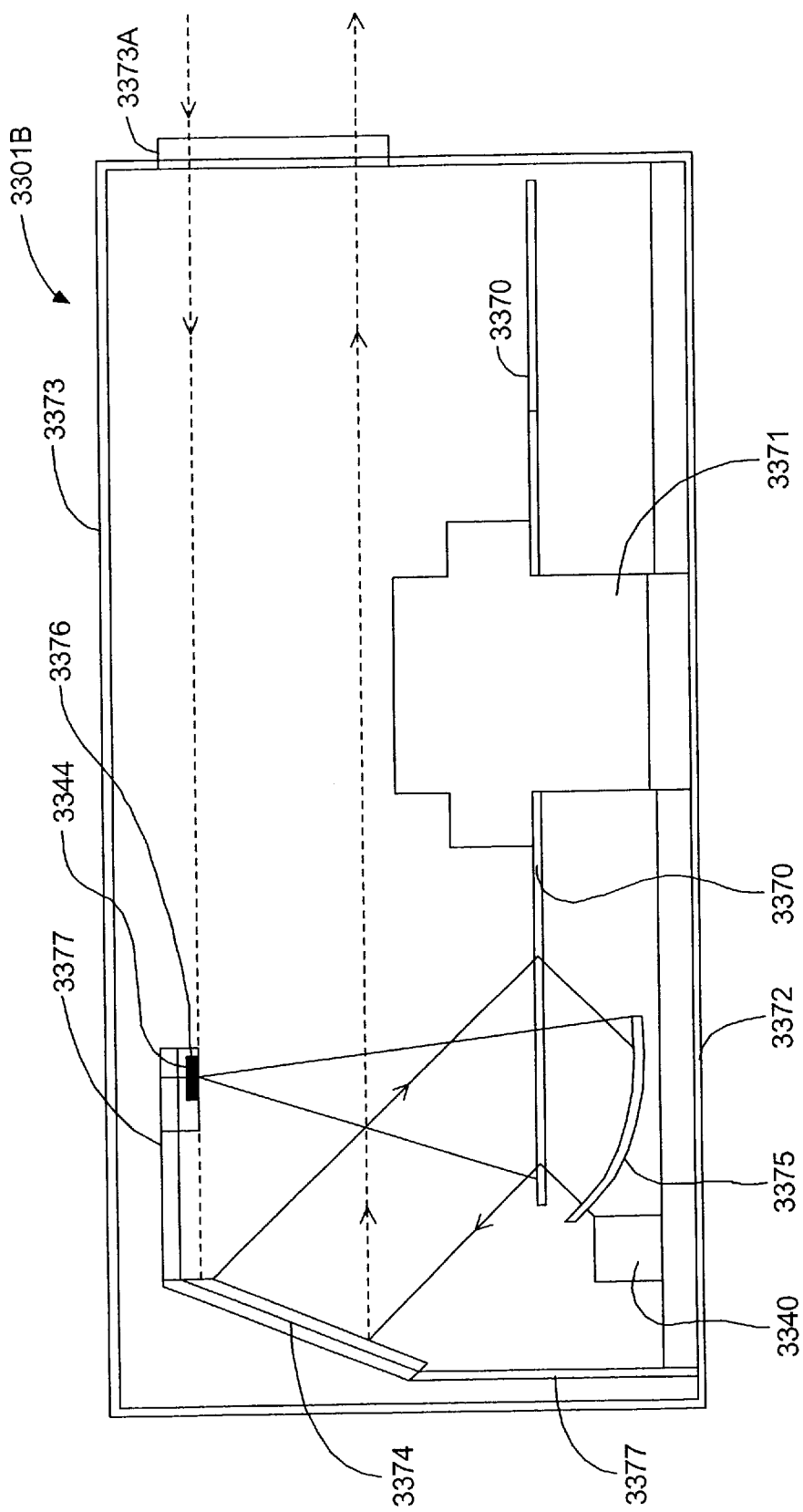
FIG. 44E2

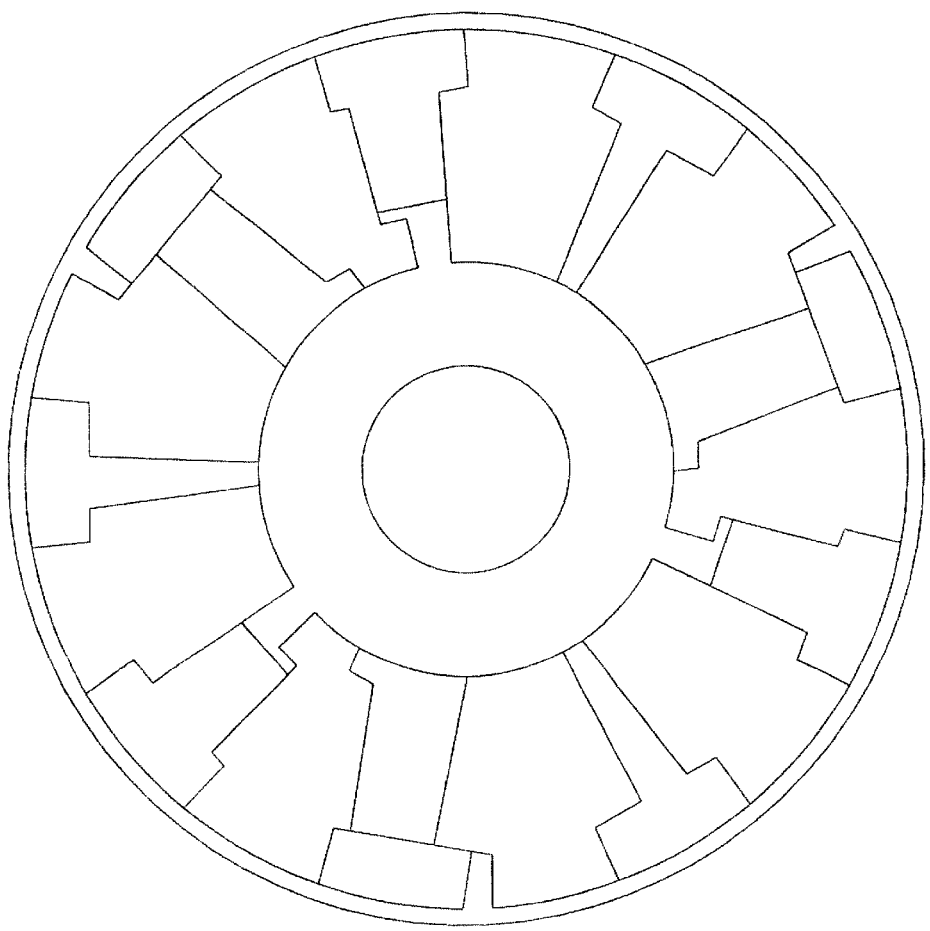
FIG. 44E3

| Facet | Diffraction Focal Length | Geometrical Focal Length (inches) | Angle A (degrees) | Angle B (degrees) | Angle Of Diffraction (degrees) | Angle Of Beam From Vertical (degrees) | Scan Angle (degrees) | Scan Mult. Factor (m) | Rotation Angle (degrees) |
|---|---|---|---|---|---|---|---|---|---|
| 1 | 36.00 | 36.09 | 45.9 | 44.70 | 45.30 | 0.00 | 34.49 | 1.52 | 22.75 |
| 2 | 36.00 | 36.09 | 45.9 | 44.70 | 45.30 | 0.00 | 34.49 | 1.52 | 22.75 |
| 3 | 36.00 | 36.09 | 45.9 | 44.70 | 45.30 | 0.00 | 34.49 | 1.52 | 22.75 |
| 4 | 41.00 | 41.14 | 45.9 | 44.70 | 45.30 | 0.00 | 30.49 | 1.50 | 20.29 |
| 5 | 41.00 | 41.14 | 45.9 | 44.70 | 45.30 | 0.00 | 30.49 | 1.50 | 20.29 |
| 6 | 41.00 | 41.14 | 45.9 | 44.70 | 45.30 | 0.00 | 30.49 | 1.50 | 20.29 |
| 7 | 46.00 | 46.19 | 45.9 | 44.70 | 45.30 | 0.00 | 27.31 | 1.49 | 18.30 |
| 8 | 46.00 | 46.19 | 45.9 | 44.70 | 45.30 | 0.00 | 27.31 | 1.49 | 18.30 |
| 9 | 46.00 | 46.19 | 45.9 | 44.70 | 45.30 | 0.00 | 27.31 | 1.49 | 18.30 |
| 10 | 52.00 | 52.28 | 45.9 | 44.70 | 45.30 | 0.00 | 24.26 | 1.48 | 16.36 |
| 11 | 52.00 | 52.28 | 45.9 | 44.70 | 45.30 | 0.00 | 24.26 | 1.48 | 16.36 |
| 12 | 52.00 | 52.28 | 45.9 | 44.70 | 45.30 | 0.00 | 24.26 | 1.48 | 16.36 |
| 13 | 58.00 | 58.39 | 45.9 | 44.70 | 45.30 | 0.00 | 21.81 | 1.47 | 14.79 |
| 14 | 58.00 | 58.39 | 45.9 | 44.70 | 45.30 | 0.00 | 21.81 | 1.47 | 14.79 |
| 15 | 58.00 | 58.39 | 45.9 | 44.70 | 45.30 | 0.00 | 21.81 | 1.47 | 14.79 |
| 16 | 64.00 | 64.52 | 45.9 | 44.70 | 45.30 | 0.00 | 19.81 | 1.47 | 13.49 |
| 17 | 64.00 | 64.52 | 45.9 | 44.70 | 45.30 | 0.00 | 19.81 | 1.47 | 13.49 |
| 18 | 64.00 | 64.52 | 45.9 | 44.70 | 45.30 | 0.00 | 19.81 | 1.47 | 13.49 |

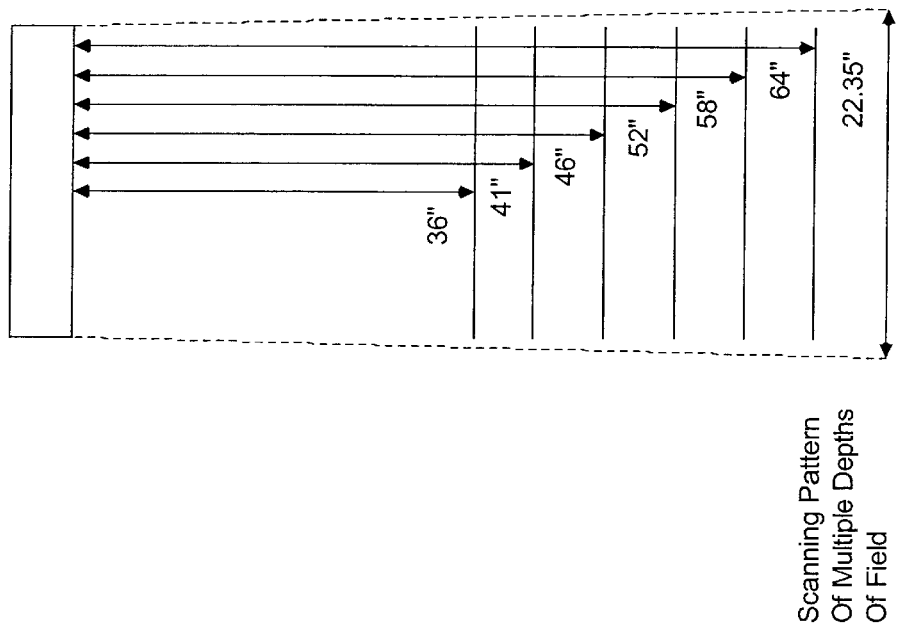
FIG. 44E5
Scanning Pattern
Of Multiple Depths
Of Field $F_1$ = Raw Image
$F_2$ = Smoothed Image
$F_3$ = Edge Image
$F_4$ = Object Image
$F_5$ = Area, Height, and Corner Coordinates

CONTROL STRUCTURES

INPUT OF OPERATOR PARAMETERS AND INITIALIZATIONS

FOR z := 1 TO n  DO
    READ ROW  z OF  $f$  INTO THE IMAGE  ROW STORE
    BUF(1...M, IND (z));
FOR y :=  k + 1  to N - k  DO BEGIN
        FOR x :=k + 1 TO M - k  DO BEGIN
            FOR z := 1 TO a DO
                      F (z) :=BUF(x + xind(z), ind(k + 1 + yind(z))):

PROCESSING OF THE PICTURE WINDOW F($f$,(x,y)) WITH A SPECIFIC
OPERATOR KERNEL ARGUMENTS:   F(z), WITH $1 \le z \le a$, OR F(i,j,),
WITH $-k \le i, j \le k$)
    RESULT:       GRAY VALUE v

⊕              IF (PARSEQ = 0) THEN
                  BUFOUT (x) := v
⊕              ELSE  BUF (x, IND (k+1)) := v
              END{for};
⊕       IF (PARSEQ = 0) THEN
            WRITE ROW BUFFER STORE BUFOUT(1...M) INTO
            ROW y OF THE RESULTANT IMAGE FILE OUT
⊕       ELSE
⊕            WRITE IMAGE ROW STORE BUF(1...M, IND(K+ 1)) INTO
⊕            ROW y OF THE RESULTANT IMAGE FILE OUT;
        IF (y  N - k)  THEN BEGIN
            READ ROW y + k + 1 OF THE INPUT IMAGE FILE INTO
            THE IMAGE ROW STORE BUF(1...M, IND(1));
            LINK := IND(1);
            FOR z := 1 TO n - 1 DO IND(z) := IND(z +1)
            IND(n) := LINK
            END {if}
        END {for}

CONTROL STRUCTURE FOR THE COMPUTATION OF LOCAL
OPERATORS, USING ROW-WISE BUFFERING, THE CENTERED
ij-COORDINATE SYSTEM, AND THE SPATIAL ARRANGEMENT FOR
THE WINDOW CONTENT IF THE ONE-DIMENSIONAL ARRAY F(z)
IS USED. PROGRAM LINES LABLED WITH ⊕ ARE SUPERFLUOUS
IF A PARALLEL OPERATOR HAS TO BE IMPLEMENTED

FIG. 44G1

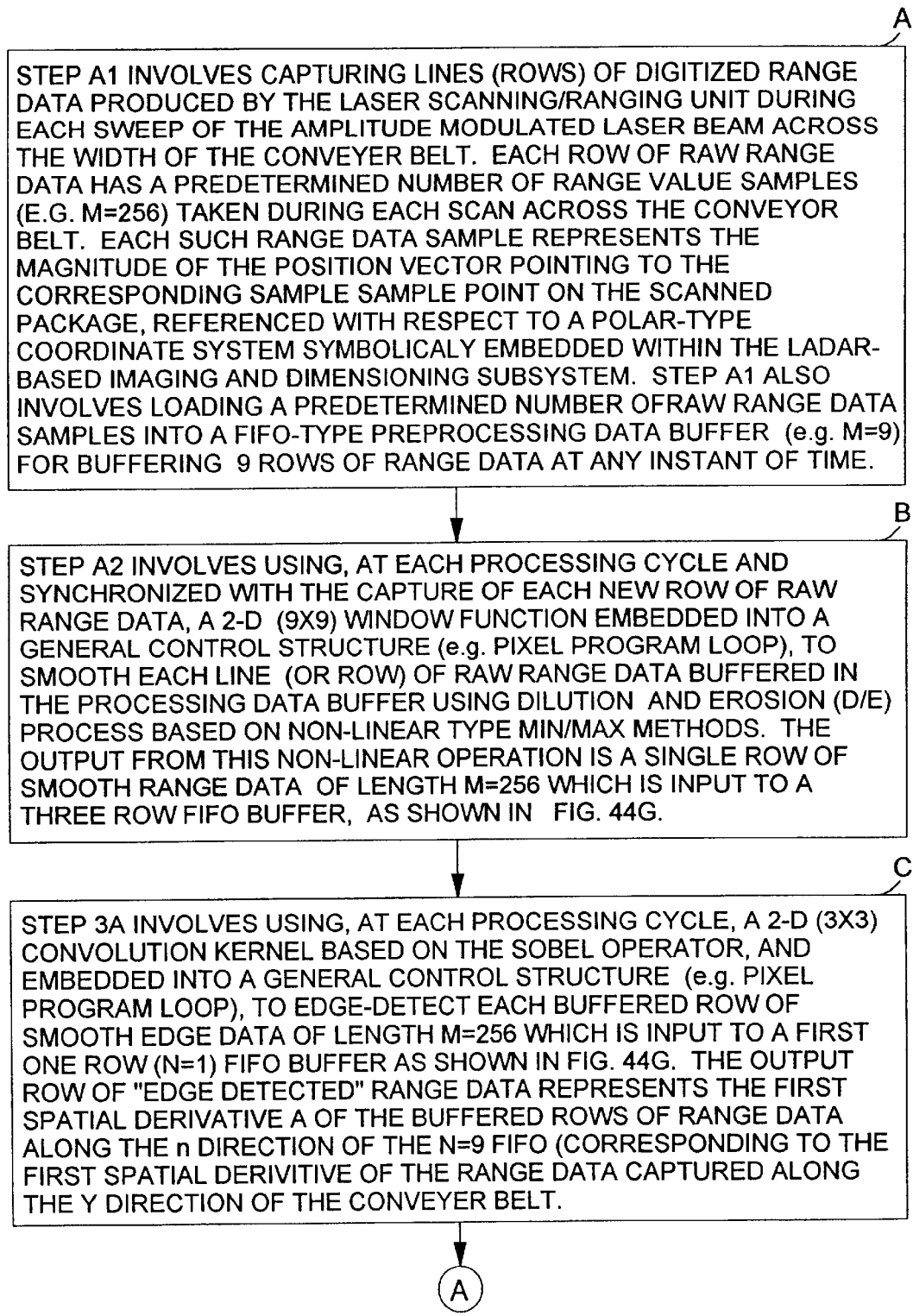
FIG. 44H1

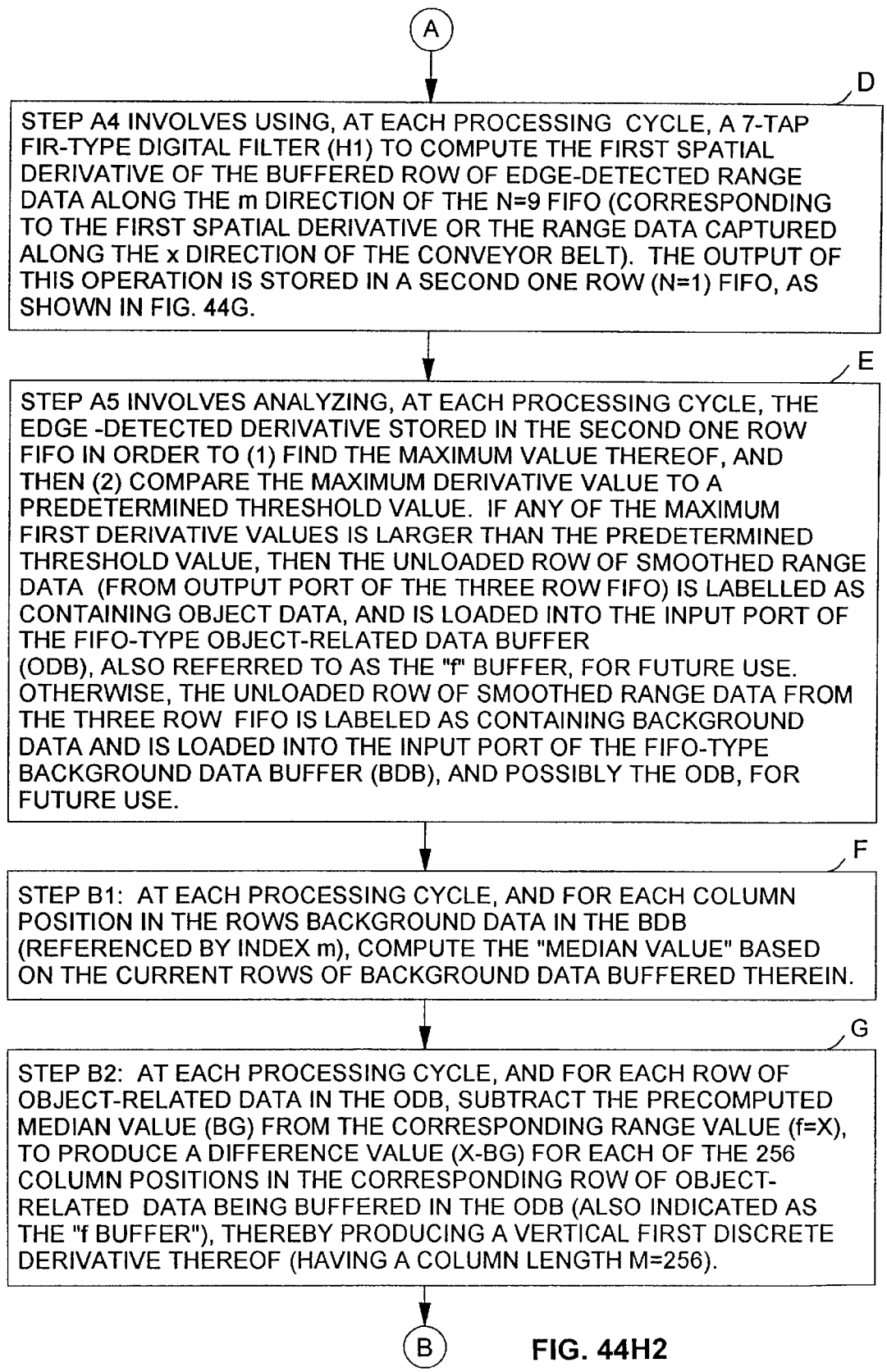
FIG. 44H2

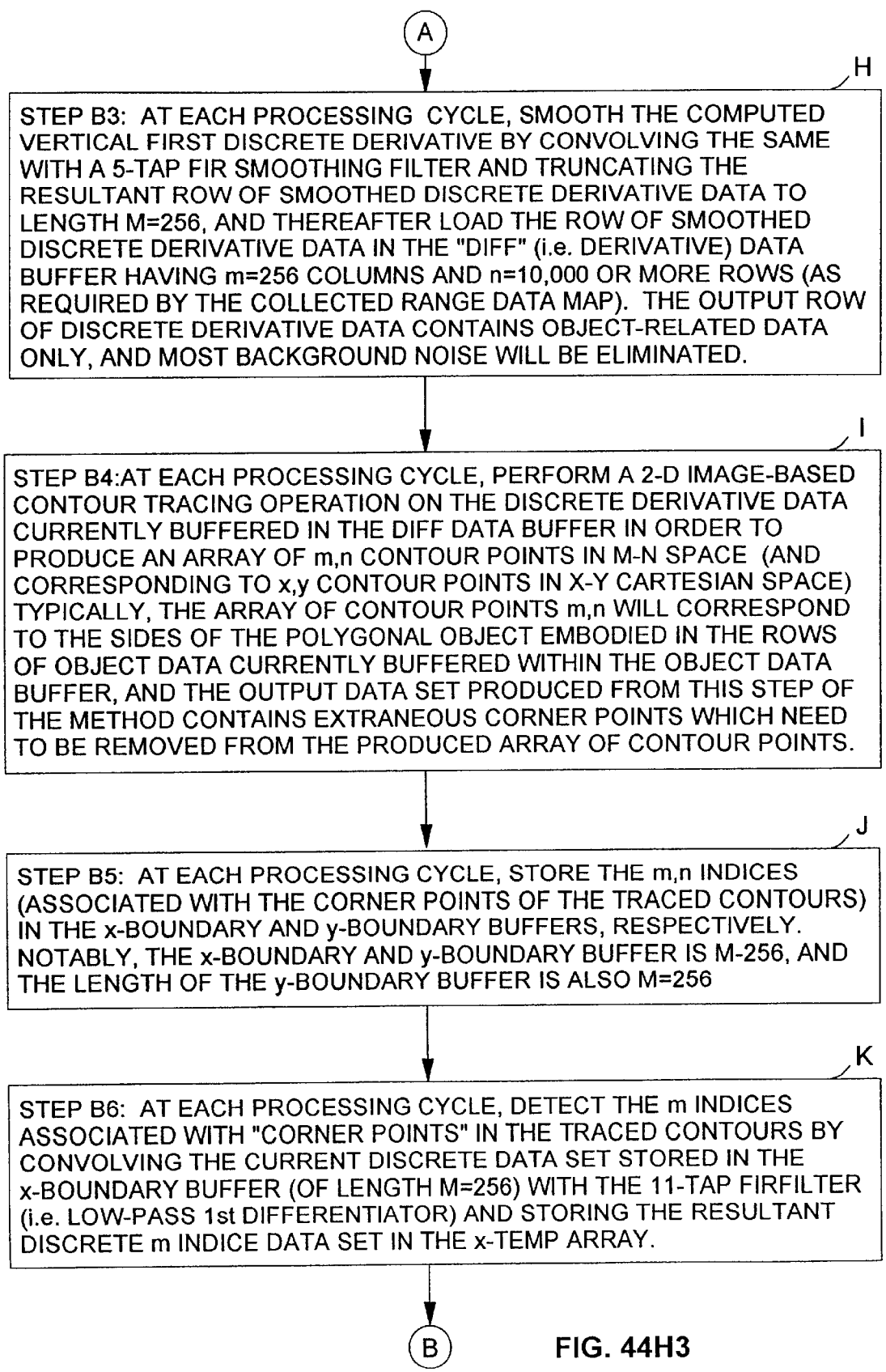
FIG. 44H3

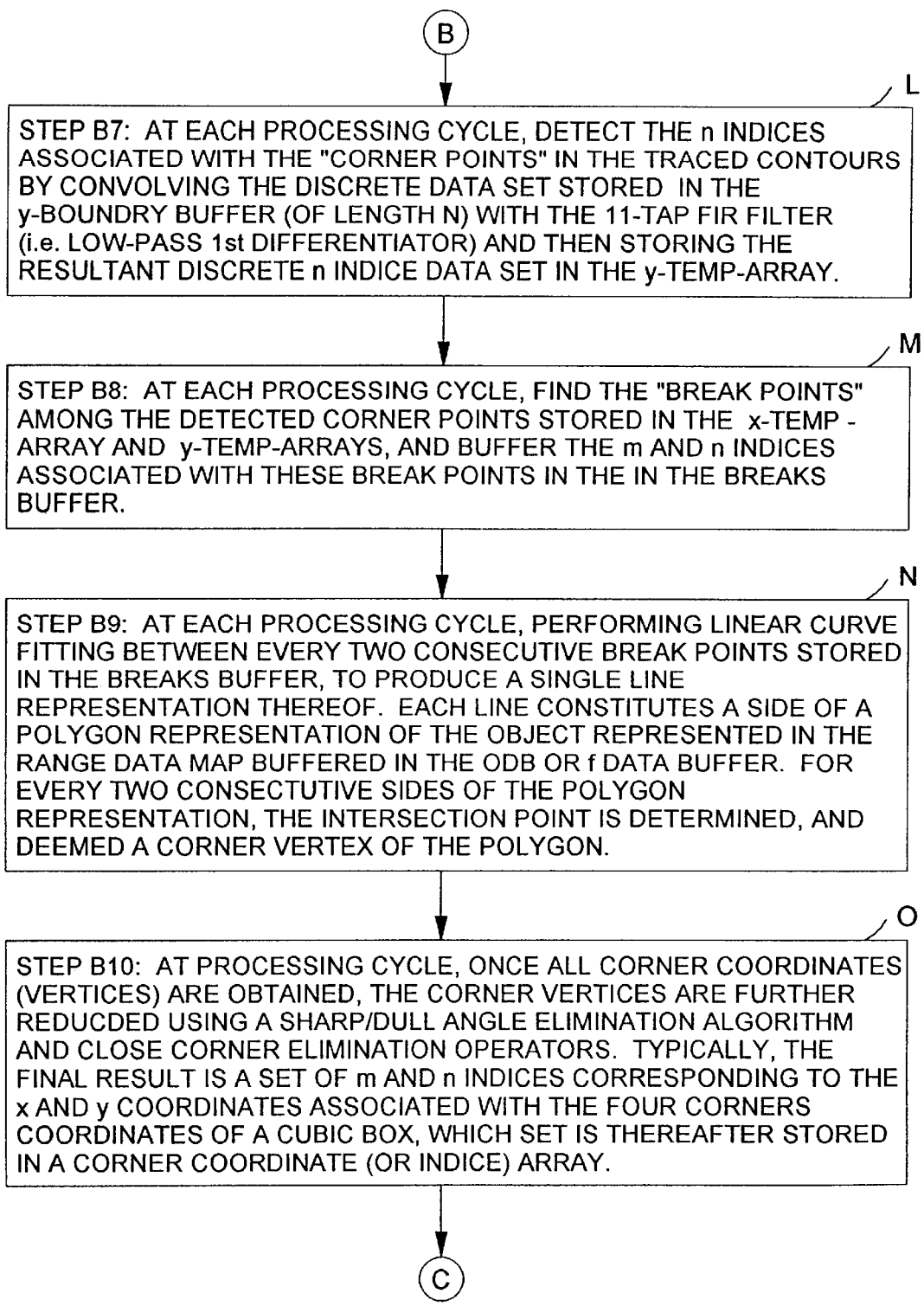
FIG. 44H4

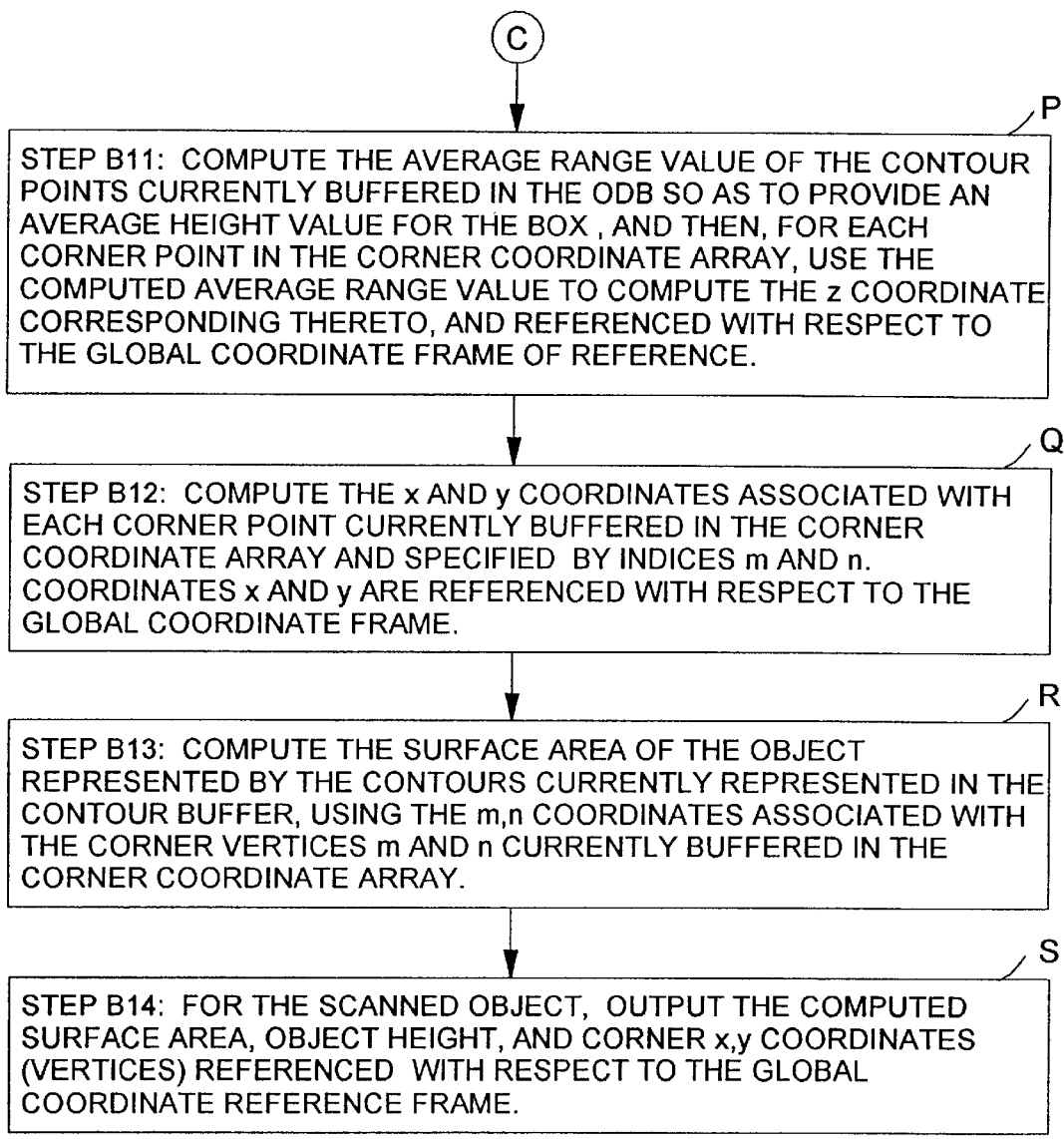
FIG. 44H5

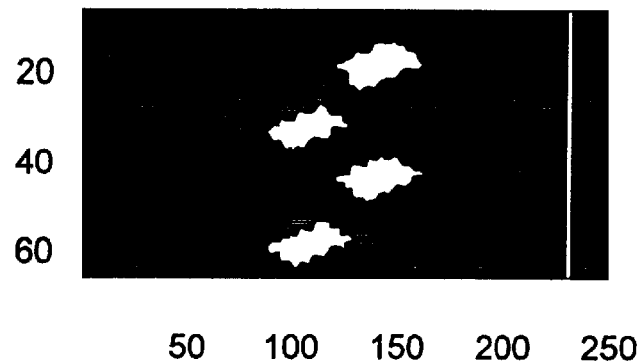
FIG. 44I1
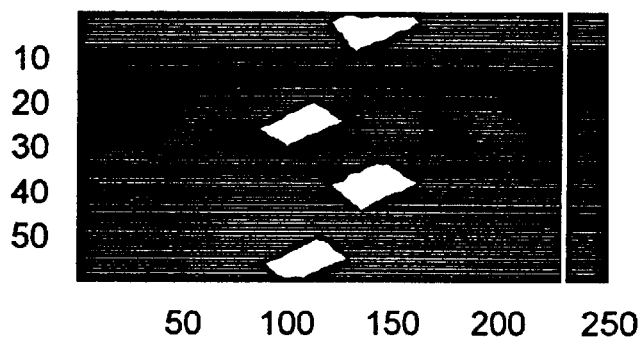
FIG. 44I2
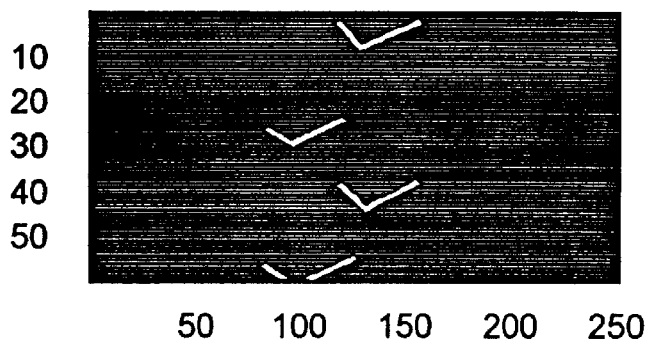
FIG. 44I3

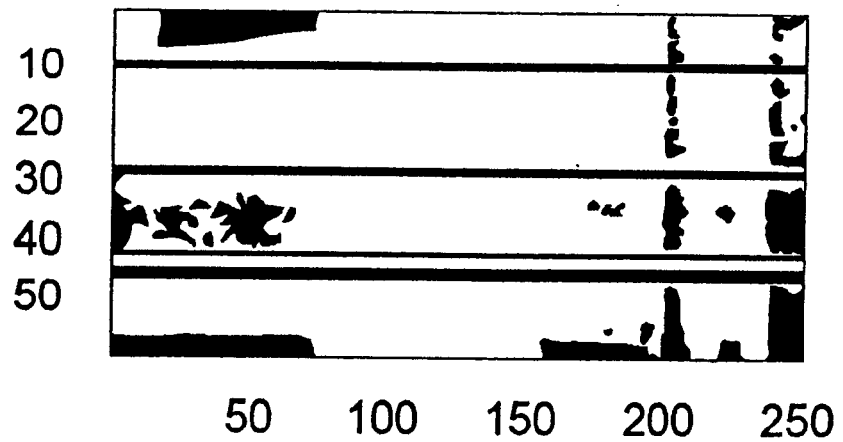
FIG. 4414
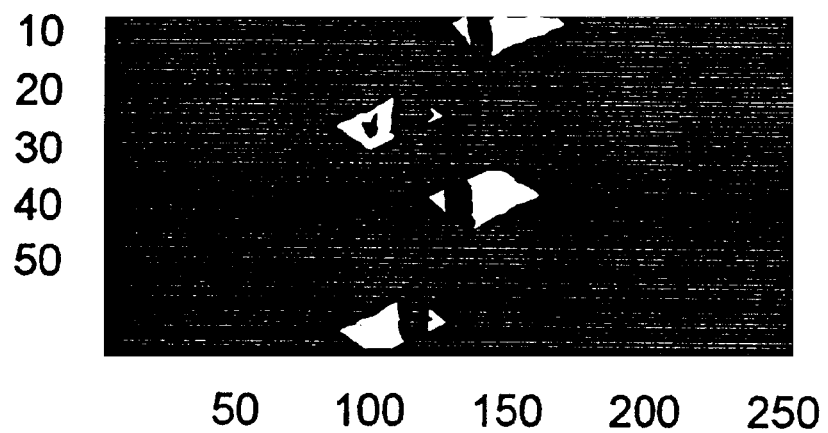
FIG. 4415

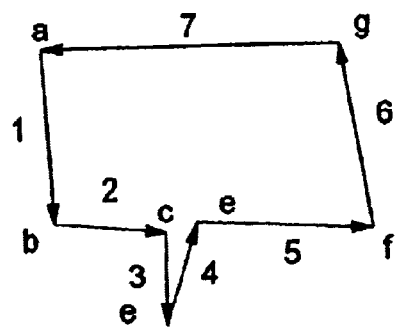
FIG. 4401
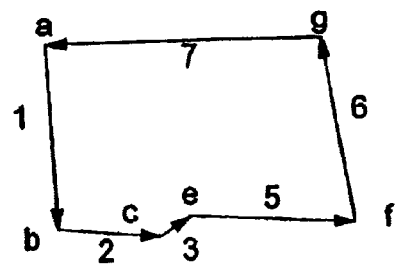
FIG. 4402
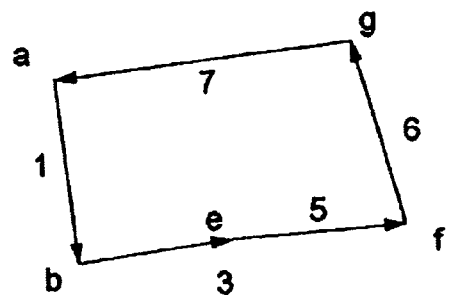
FIG. 4403
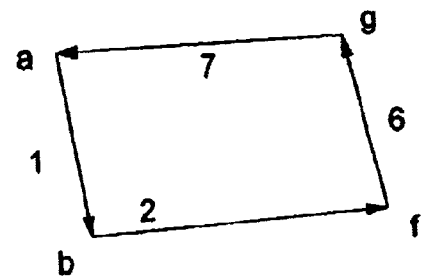
FIG. 4404

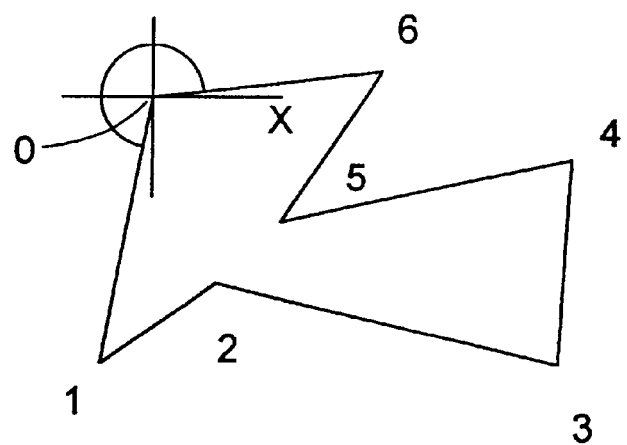
FIG. 44R1
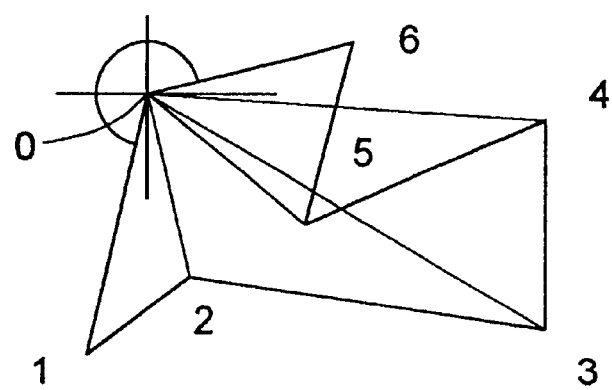
FIG. 44R2

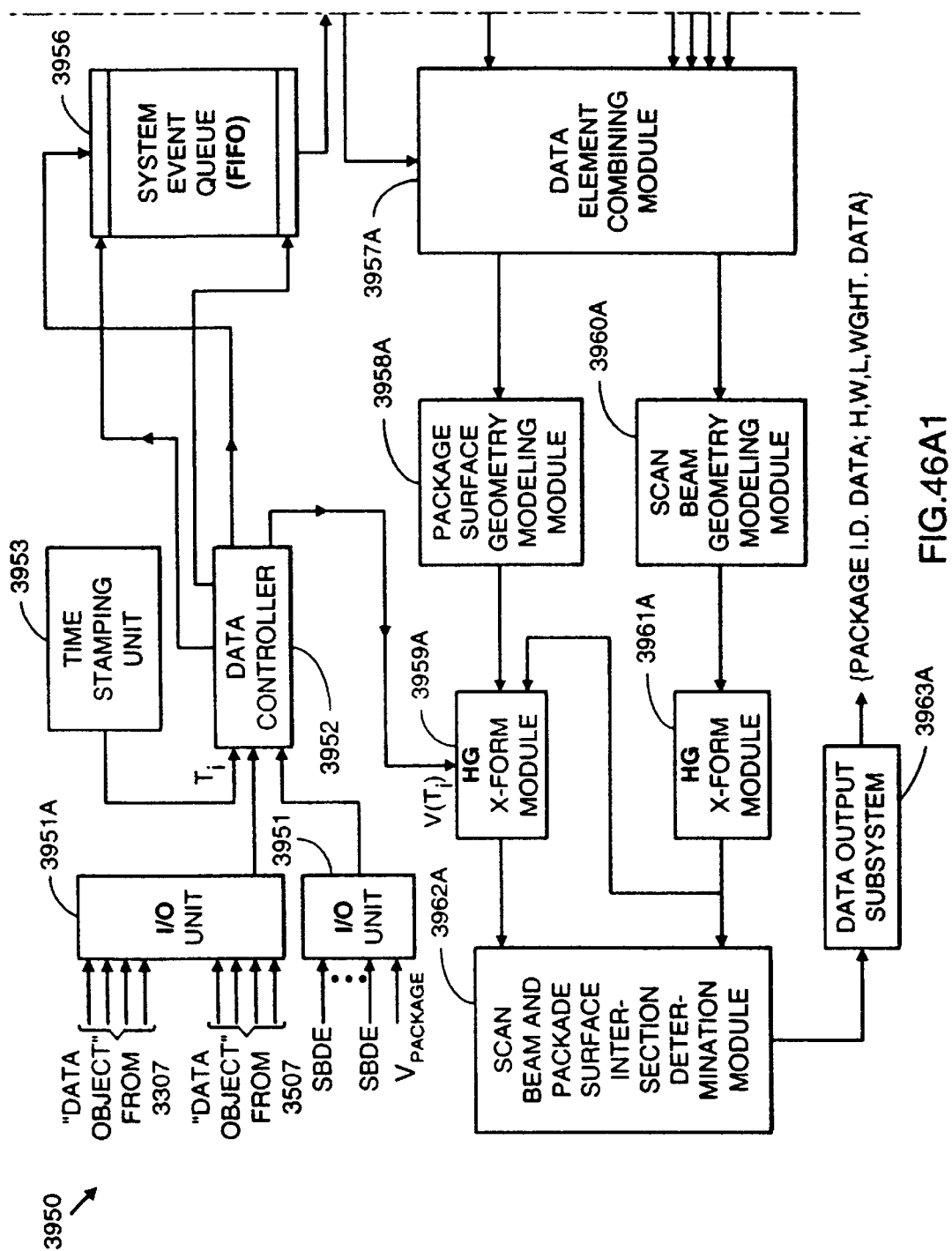
FIG.46A1

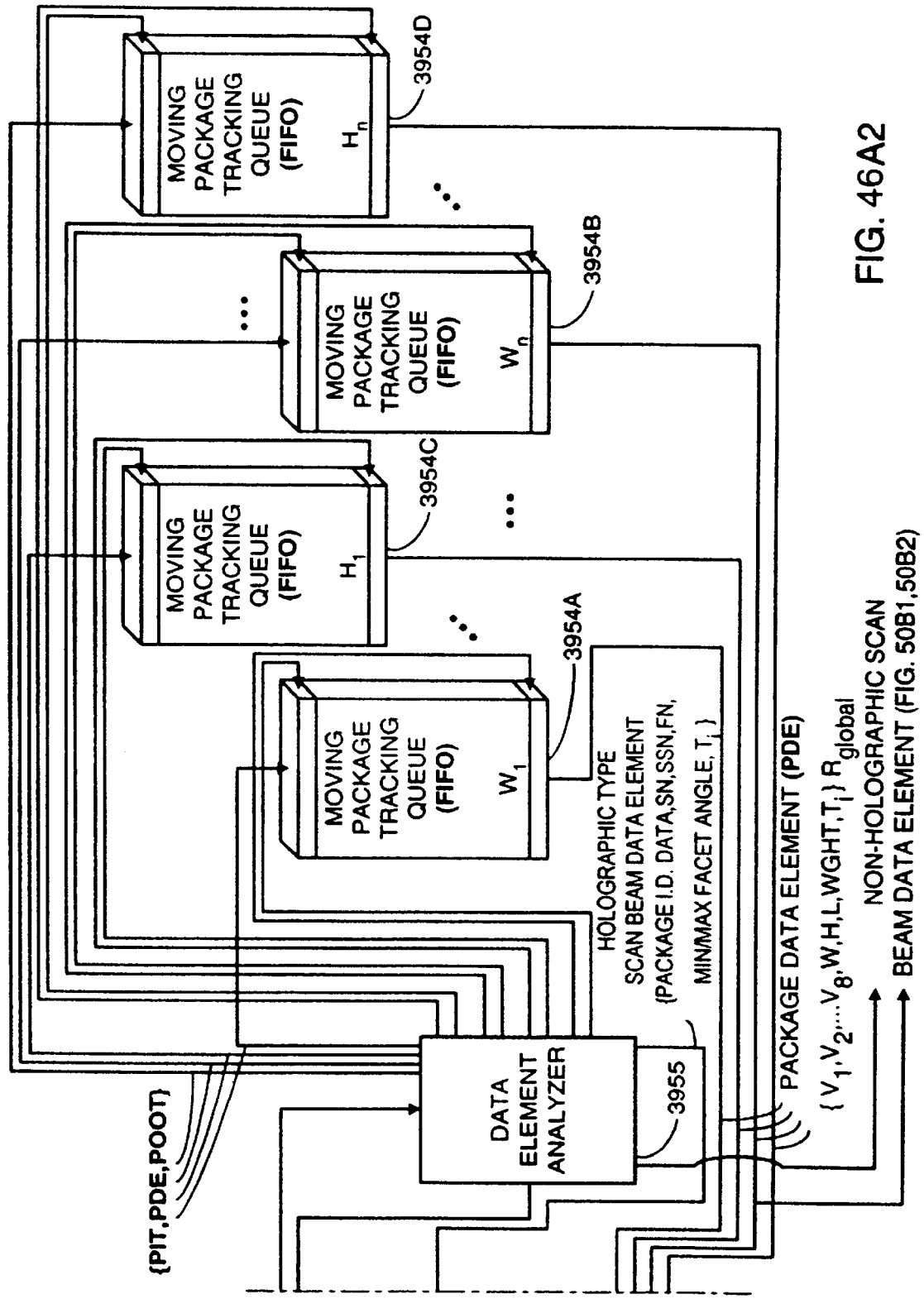
FIG. 46A2

DATA ELEMENT HANDLING RULES

1. WHEN A PACKAGE DIMENSION ELEMENT (PDE) OF ANY TYPE IS REMOVED FROM THE SYSTEM EVENT QUEUE, THEN IT IS PLACED IN THE MOVING PACKAGE TRACKING QUEUE INDICATED BY THE PACKAGE DIMENSION DATA ASSOCIATED WITH THE PACKAGE DIMENSION DATA ELEMENT

2. WHEN A SCAN BEAM DATA ELEMENT (SBDE) IS REMOVED FROM THE SYSTEM EVENT QUEUE, THEN IT IS COMBINED WITH EACH PACKAGE DATA ELEMENT IN EACH MOVING PACKAGE TRACKING QUEUE, AND THEN EACH RESULTING DATA ELEMENT PAIR IS PROCESSED ALONG THE PACKAGE DATA ELEMENT CHANNEL AND SCAN DATA ELEMENT CHANNEL AS SHOWN IN FIGS. 51A1 AND 51A2

3. WHEN A PACKAGE-IN-TUNNEL (PIT) DATA ELEMENT IS REMOVED FROM THE SYSTEM EVENT QUEUE, THEN THE OLDEST PACKAGE DATA ELEMENT IN THE MOVING PACKAGE TRACKING QUEUE (INDICATED BY THE PACKAGE DIMENSION DATA ASSOCIATED WITH THE PIT DATA ELEMENT) IS REMOVED THEREFROM.

4. WHEN A PACKAGE-OUT-OF-TUNNEL (POOT) DATA ELEMENT IS REMOVED FROM THE SYSTEM EVENT QUEUE, THEN THE FOLLOWING OPERATIONS ARE CARRIED OUT:

FIG. 47A (A) IF THE TIME STAMP $T_i$ ON THE REMOVED POOT DATA ELEMENT INDICATES THAT CORRESPONDING PACKAGE HAS MOVED OUT OF THE SCANNING TUNNEL, THEN REMOVE THE OLDEST PACKAGE DATA ELEMENT IN MOVING PACKAGE TRACKING QUEUE INDICATED BY THE PACKAGE DIMENSION DATA ELEMENT ASSOCIATED WITH THE POOT DATA ELEMENT (B) IF THE TIME-STAMP $T_i$ ON THE REMOVED POOT DATA ELEMENT INDICATES THAT THE CORRESPONDING PACKAGE IS STILL MOVING THROUGH THE SCANNING TUNNEL, THEN DO NOT REMOVE ANY PACKAGE DATA ELEMENT FROM ANY MOVING PACKAGE TRACKING QUEUE

FIG. 47B

VECTOR MODELING OF LASER SCAN BEAMS IN
HOLOGRAPHIC SCANNING SUBSYSTEMS

MATHEMATICAL FORM FOR EACH LASER SCAN BEAM:
VECTOR-BASED MODEL OF OPTICAL PATH OF BEAM FROM DISC TO
MIRROR TO FOCAL PLANE ($\infty$ )

PROCEDURE:

(1) USE POSITION VECTOR REFERENCED FROM X=0, Y=0, Z=O IN $R_{local\ scanner}$, FOR SPECIFYIED THE STARTING POINT OF LASER SCAN BEAM ON DISC, AND DIRECTION VECTOR FOR SPECIFYING THE DIRECTION OF LASER BEAM THE BEAM FOLDING MIRROR; AND (2) USE POSITION VECTOR FOR SPECIFYING POINT ON MIRROR WHERE BEAM IS REFLECTED FROM BEAM FOLDING MIRROR TOWARDS FOCAL PLANE OF FACET, EXTENDING TO INFINITY, AND DIRECTION VECTOR FOR SPECIFYING THE DIRECTION OF LASER BEAM TOWARDS DESIGNATED FOCAL PLANE (3) THESE FOUR VECTORS SPECIFY THE LASER BEAM RAY IN LOCAL COORDINATE REFERENCE $R_{local\ scanner}$

FIG. 48B

VECTOR MODELING OF LASER SCAN BEAMS IN HOLOGRAPHIC SCANNING SUBSYSTEMS

MATHEMATICAL FORM FOR EACH LASER SCAN BEAM:
VECTOR-BASED MODEL OF OPTICAL PATH OF BEAM FROM DISC TO MIRROR TO FOCAL PLANE ($\infty$)

PROCEDURE:
(1) USE POSITION VECTOR REFERENCED FROM $X=0$, $Y=0$, $Z=0$ IN $R_{local\ scanner}$, FOR SPECIFYING THE STARTING POINT OF LASER SCAN BEAM ON DISC, AND DIRECTION VECTOR FOR SPECIFYING THE DIRECTION OF LASER BEAM TO THE BEAM FOLDING MIRROR, AND (2) USE POSITION VECTOR FOR SPECIFYING POINT ON MIRROR WHERE LASER BEAM IS REFLECTED FROM BEAM FOLDING MIRROR TOWARD FOCAL PLANE OF FACET EXTENDING TO INFINITY AND DIRECTION VECTOR FOR SPECIFYING THE DIRECTION OF LASER BEAM TOWARD DESIGNATED FOCAL PLANE (3) THESE FOUR VECTORS SPECIFY THE LASER BEAM RAY IN LOCAL COORDINATE REFERENCE $R_{local\ scanner}$

FIG. 49

VECTOR-BASED MODEL OF SCANNING-SURFACE PRODUCED BY NON-HOLOGRAPHIC BOTTOM SCANNERS

NOTE:

EACH SCANNING SURFACE IS SPECIFIED BY FOUR BOUNDARY POINTS IN $y = 0$, X - Z PLANE OF $R_{global}$, REFERENCED TO $x = 0, y = 0, z = 0$;

EACH POINT IS REPRESENTED BY A POSITION VECTOR AND A DIRECTION VECTOR ASSUMED NORMAL TO X-Y PLANE.

COORDINATE CONVERSION OF VECTOR-BASED MODELS OF SCAN BEAMS PRODUCED BY HOLOGRAPHIC SCANNERs IN SYSTEM
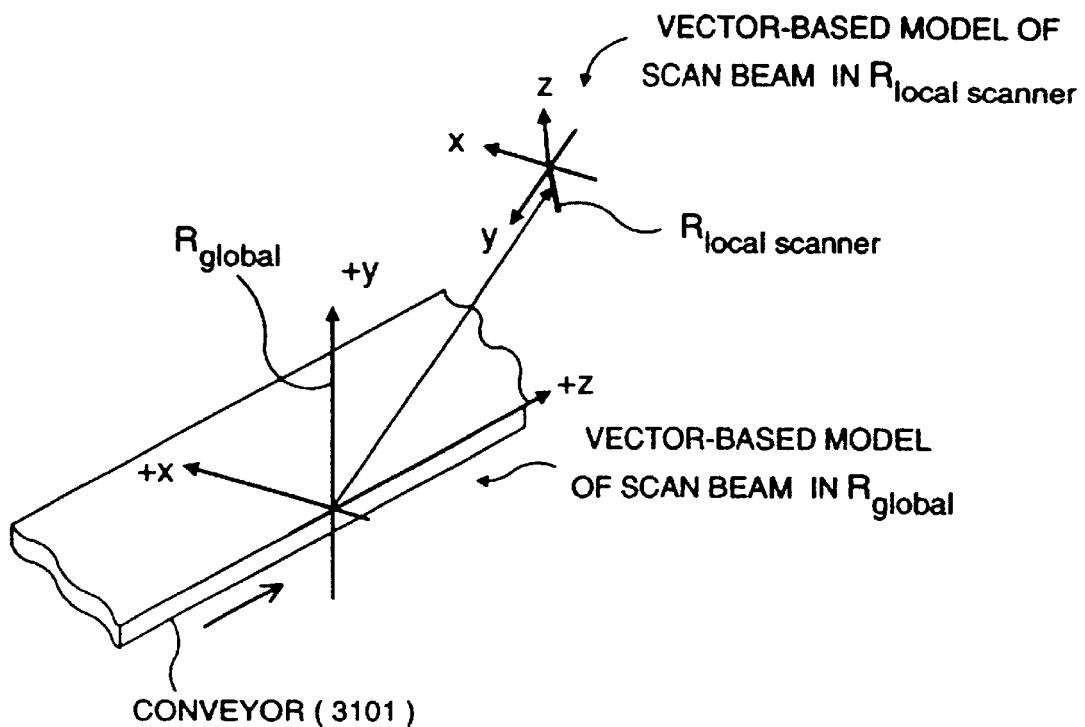
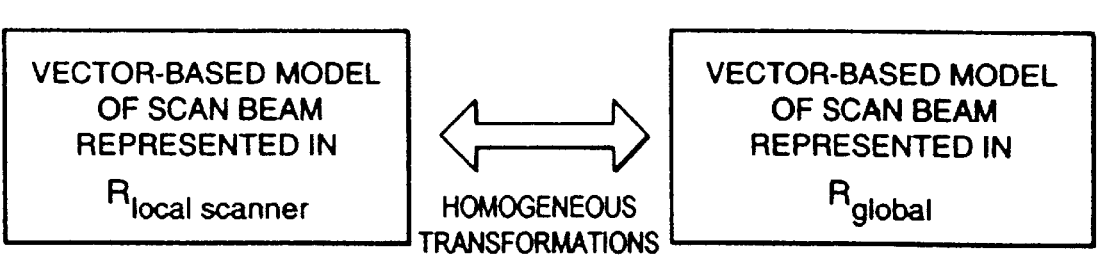
FIG. 51

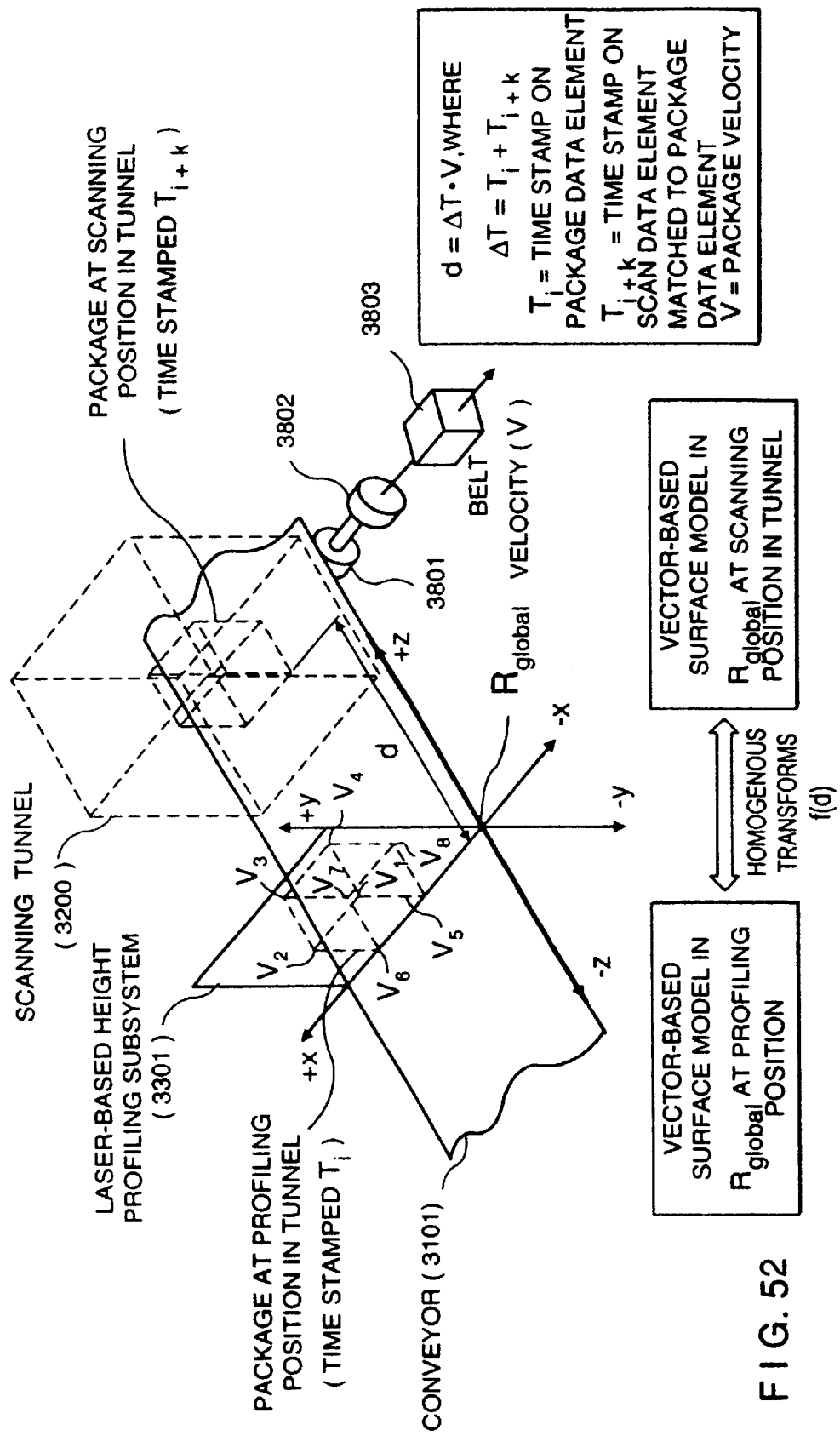

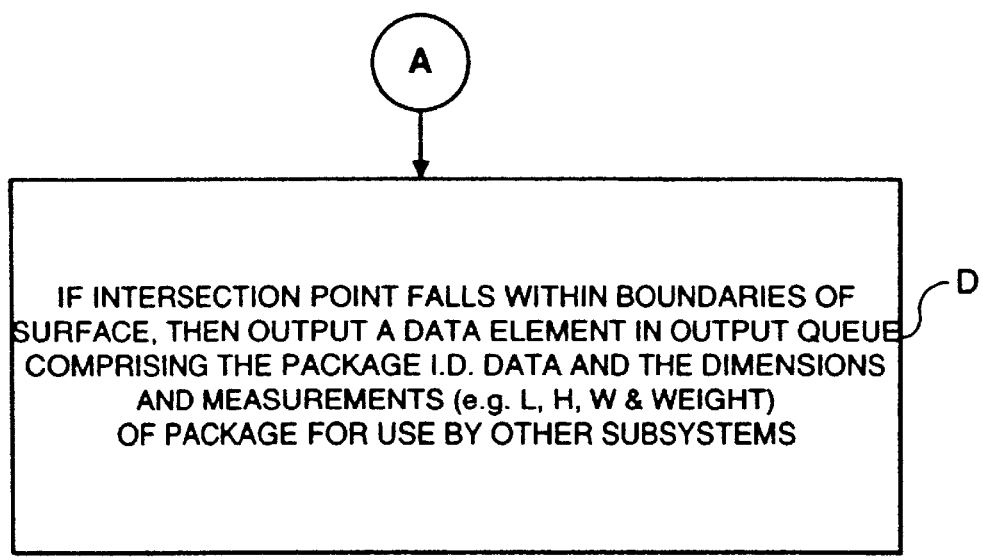
F I G. 53B

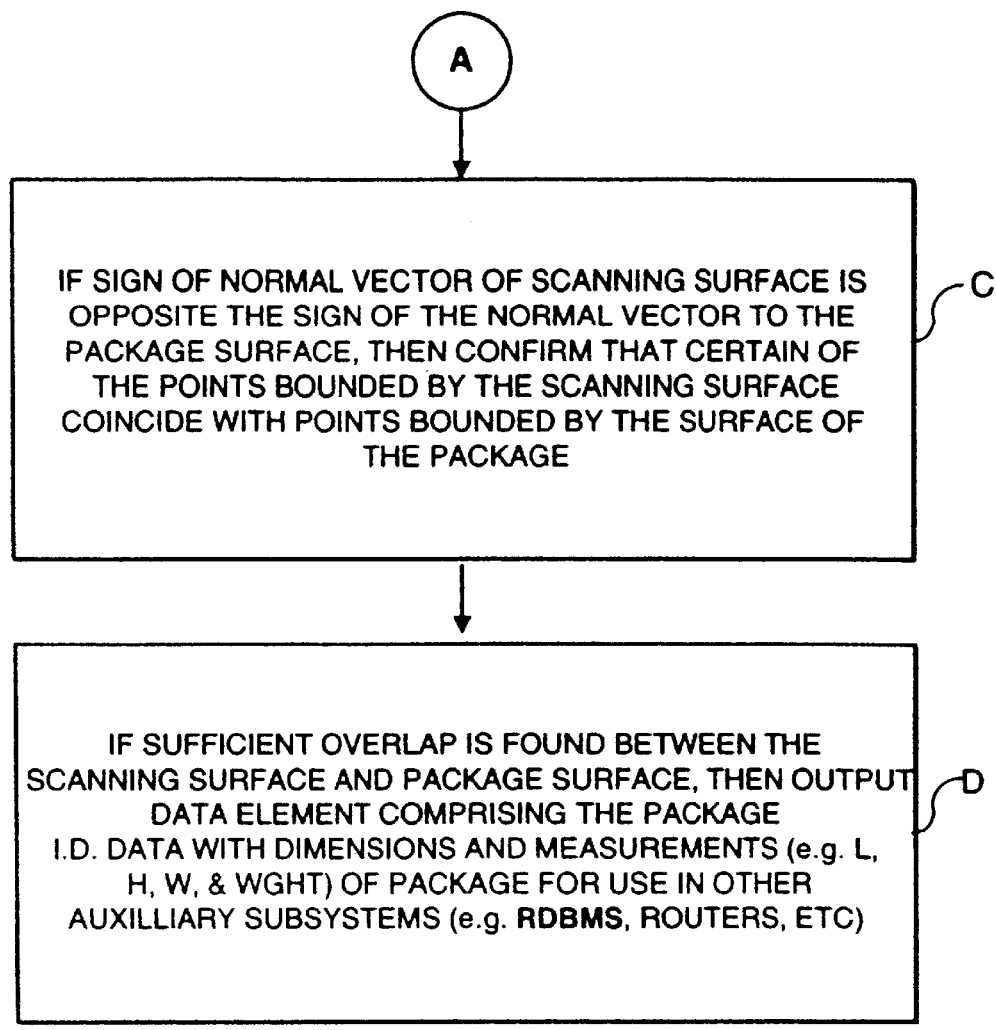
F I G. 54B

AUTOMATED METHOD OF AND SYSTEM FOR DIMENSIONING OBJECTS OVER A CONVEYOR BELT STRUCTURE BY APPLYING CONTOURING TRACING, VERTICE DETECTION, CORNER POINT DETECTION, AND CORNER POINT REDUCTION METHODS TO TWO-DIMENSIONAL RANGE DATA MAPS OF THE SPACE ABOVE THE CONVEYOR BELT CAPTURED BY AN AMPLITUDE MODULATED LASER SCANNING BEAM

This is a Continuation of application Ser. No. 09/327,756 filed Jun. 7, 1999 which Abandoned Application is related to the following U.S. patent applications: application Ser. No. 09/305,896 filed May 5, 1999, application Ser. No. 09/275,518 filed Mar. 24, 1999, application Ser. No. 09/274,265 filed Mar. 22, 1999; Ser. No. 09/243,078 filed Feb. 2, 1999; Ser. No. 09/241,930 filed Feb. 2, 1999; Ser. No. 09/157,778 filed Sep. 21, 1998; Ser. No. 09/047,146 filed Mar. 24, 1998, Ser. No. 08/949,915 filed Oct. 14, 1997; Ser. No. 08/854,832 filed May 12, 1997; Ser. No. 08/886,806 filed Apr. 22, 1997; Ser. No. 08/726,522 filed Oct. 7, 1996; and Ser. No. 08/573,949 filed Dec. 18, 1995, each said application being commonly owned by Assignee, Metrologic Instruments, Inc., of Blackwood, N.J., and incorporated herein by reference as if fully set forth herein.

BACKGROUND OF THE INVENTION

1. Field of Invention

The present invention relates generally to an automated tunnel-type laser scanning package identification and measuring system arranged about a high-speed conveyor structure used in diverse package routing and transport applications, and also a method of identifying and measuring packages labeled with bar code symbols.

2. Brief Description of the Prior Art

In many environments, there is a great need to automatically identify and measure objects (e.g. packages, parcels, products, luggage, etc.) as they are transported along a conveyor structure. While over-the-head laser scanning systems are effective in scanning upwardly-facing bar codes on conveyed objects, there are many applications where it is not practical or otherwise feasible to ensure that bar code labels are upwardly-facing during transportation under the scanning station.

Various types of "tunnel" scanning systems have been proposed so that bar codes can be scanned independently of their orientation within scanning volume of the system. One such prior art tunnel scanning system is disclosed in U.S. Pat. No. 5,019,714 to Knowles. In this prior art scanning system, a plurality of single scanline scanners are orientated about a conveyor structure in order to provide a limited degree of omni-directional scanning within the "tunnel-like" scanning environment. Notably, however, prior art tunnel scanning systems, including the system disclosed in U.S. Pat. No. 5,019,714, are incapable of scanning bar code systems in a true omni-directional sense, i.e. independent of the direction that the bar code faces as it is transported along the conveyor structure. At best, prior art scanning systems provide omni-directional scanning in the plane of the conveyor belt or in portions of planes orthogonal thereto. However, true omnidirectional scanning along the principal planes of a large 3-D scanning volume has not been hitherto possible.

Also, while numerous systems have been proposed for automatically identifying and measuring the dimensions and weight of packages along a high-speed conveyor, prior art systems have been very difficult to manufacture, maintain, and operate in a reliable manner without the use of human supervision.

Thus, there is a great need in the art for an improved tunnel-type automated laser scanning package identification/measuring system and a method of identifying and measuring packages transported along a high-speed conveyor system, while avoiding the shortcomings and drawbacks of prior art scanning systems and methodologies.

OBJECTS AND SUMMARY OF THE PRESENT INVENTION

Accordingly, a primary object of the present invention is to provide a novel tunnel-type automated package identification and measuring system that is free of the shortcomings and drawbacks of prior art tunnel-type laser scanning systems and methodologies.

Another object of the present invention is to provide a fully automated package identification and measuring system, wherein an omni-directional laser scanning tunnel is used to read bar codes on packages entering the tunnel, while a package dimensioning subsystem is used to capture information about the package prior to entry into the tunnel.

Another object of the present invention is to provide such an automated package identification and measuring system, wherein Laser Detecting And Ranging (LADAR-based) scanning methods are used to capture two-dimensional range data maps of the space above a conveyor belt structure, and two-dimensional image contour tracing methods are used to extract package dimension data therefrom.

Another object of the present invention is to provide a fully automated package identification and measuring system, wherein the package dimensioning subsystem is realized as a LADAR-based package imaging and dimensioning unit (i.e. subsystem) supported above the conveyor belt structure of the system. Another object of the present invention is to provide such an automated package identification and measuring system, wherein the LADAR-based imaging and dimensioning subsystem produces a synchronized amplitude-modulated laser beam that is automatically scanned across the width of the conveyor belt structure and, during each scan thereacross, detects and processes the reflected laser beam in order to capture a row of raw range (and optionally reflection-intensity) information that is referenced with respect to a polar-type coordinate system symbolically-embedded within the LASAR-based imaging and dimensioning subsystem.

Another object of the present invention is to provide such an automated package identification and measuring subsystem, wherein the rows of range data captured by the LADAR-based imaging and dimensioning subsystem are continuously loaded into a preprocessing data buffer, one row at a time, and processed in real-time using window-type convolution kernals that smooth and edge-detect the raw range data and thus improve its quality for subsequent dimension data extraction operations.

Another object of the present invention is to provide such an automated package identification and measuring subsystem, wherein the LADAR-based imaging and dimensioning subsystem automatically substracts detected background information (including noise) from the continuously updated range data map as to accommodate for changing environmental conditions and enable high system performance independent of background lighting conditions.

Another object of the present invention is to provide such an automated package identification and measuring subsystem, wherein the LADAR-based imaging and dimensioning subsystem automatically buffers consecutively captured rows of smoothed/edge-detected range data to provide a range data map of the space above the conveyor belt, and employs two-dimensional image contour tracing techniques to detect image contours within the buffered range data map, indicative of packages being transported through the laser scanning tunnel system.

Another object of the present invention is to provide such an automated package identification and measuring subsystem, wherein the LADAR-based imaging and dimensioning subsystem automatically processes the indices (m,n) of the computed contours in order to detect vertices associated with polygonal-shaped objects extracted from the range data map, which are representative of packages or like objects being transported through the laser scanning tunnel system.

Another object of the present invention is to provide such an automated package identification and measuring subsystem, wherein the LADAR-based imaging and dimensioning subsystem automatically processes the m and n indices of the detected vertices associated with the computed contours in order to detect candidates for corner points associated with the corners of a particular package being transported through the laser scanning tunnel system.

Another object of the present invention is to provide such an automated package identification and measuring subsystem, wherein the LADAR-based imaging and dimensioning subsystem automatically processes the m and n indices of detected corner point candidates in order to reduce those corner point candidates down to those most likely to be the corners of a regular-shaped polygonal object (e.g. six sided box).

Another object of the present invention is to provide such an automated package identification and measuring subsystem, wherein the LADAR-based imaging and dimensioning subsystem automatically processes the m and n indices of the corner points extracted from the range data map in order to compute the surface area of the package represented by the contours traced therein.

Another object of the present invention is to provide such an automated package identification and measuring subsystem, wherein the LADAR-based imaging and dimensioning subsystem automatically processes the m and n indices of the corner points extracted from the range data map in order to compute the x,y and z coordinates corresponding to the corners of the package represented by the contours traced therein, referenced relative to a Cartesian-type global coordinate reference system symbolically embedded within the automated package identification and measuring subsystem.

Another object of the present invention is to provide such an automated package identification and measuring subsystem, wherein the LADAR-based imaging and dimensioning subsystem automatically processes the m and n indices of the corner points extracted from the range data map in order to compute the average height of the package represented by the contours traced therein, referenced relative to the Cartesian-type global coordinate reference system.

Another object of the present invention is to provide such an automated package identification and measuring subsystem, wherein the LADAR-based imaging and dimensioning subsystem employs a polygonal-type laser scanning mechanism for scanning an amplitude-modulated laser beam across the width of the conveyor belt.

Another object of the present invention is to provide such an automated package identification and measuring subsystem, wherein the LADAR-based imaging and dimensioning subsystem employs a holographic-type laser scanning mechanism for scanning an amplitude-modulated laser beam across the width of the conveyor belt.

Another object of the present invention is to provide a fully automated package identification and measuring system, wherein corner-projected orthogonal laser scanning patterns employed therein provide for enhanced reading of ladder and picket fence oriented bar codes on packages moving through the tunnel.

Another object of the present invention is to provide a fully automated package identification and measuring system, wherein mathematical models are created on a real-time basis for both the geometry of the package and the position of the laser scanning beam used to read the bar code symbol thereon.

Another object of the present invention is to provide a fully automated package identification and measuring system, wherein the mathematical models are analyzed to determine if collected and queued package identification data is spatially and/or temporally correlated with package measurement data using vector-based ray-tracing methods, homogeneous transformations, and object-oriented decision logic so as to enable simultaneous tracking of multiple packages being transported through the scanning tunnel.

Another object of the present invention is to provide such a system, in which a plurality of holographic laser scanning subsystems are mounted from a scanner support framework, arranged about a high-speed conveyor belt, and arranged so that each scanning subsystem projects a highly-defined 3-D omni-directional scanning volume with a large depth-of-field, above the conveyor structure so as to collectively provide omni-directional scanning with each of the three principal scanning planes of the tunnel-type scanning system.

Another object of the present invention is to provide such a system, in which each holographic laser scanning subsystem projects a highly-defined 3-D omni-directional scanning volume that has a large depth-of-field and is substantially free of spatially and temporally coincident scanning planes, to ensure substantially zero crosstalk among the numerous laser scanning channels provided within each holographic laser scanning subsystem employed in the system.

Another object of the present invention is to provide such a system, in which a split-type conveyor is used with a gap disposed between its first and second conveyor platforms, for mounting of an omni-directional projection-type laser scanning subsystem that is below the conveyor platforms and ends substantially the entire width of the conveyor platform.

Another object of the present invention is to provide such a system, wherein a plurality of holographic laser scanners are arranged about the conveyor system as to produce a bi-directional scanning pattern along the principal axes of a three-dimensional laser scanning volume.

A further object of the present invention is to provide a system, in which each holographic laser scanner employed in the system projects a three-dimensional laser scanning volume having multiple focal planes and a highly confined geometry extending about a projection axis extending from the scanning window of the holographic scanner and above the conveyor belt of the system.

Another object of the present invention is to provide an automated package identification and measuring system, wherein singulated packages can be detected, dimensioned, weighed, and identified in a fully automated manner without human intervention, while being transported through a laser scanning tunnel subsystem using a package conveyor subsystem.

Another object of the present invention is to provide such a system, wherein a package detection and dimensioning subsystem is provided on the input side of its scanning tunnel subsystem, for detecting and dimensioning singulated packages passing through the package detection and dimensioning subsystem.

Another object of the present invention is to provide such a system, wherein a data element queuing, handling and processing subsystem is provided for queuing, handling and processing data elements representative of package identification, dimensions and/or weight, and wherein a moving package tracking queue is maintained so that data elements comprising objects, representative of detected packages entering the scanning tunnel, can be tracked along with dimensional and measurement data collected on such detected packages.

Another object of the present invention is to provide such a system, wherein a package detection subsystem is provided on the output side of its scanning tunnel subsystem.

Another object of the present invention is to provide such a system, wherein the tunnel scanning subsystem provided therein comprises a plurality of laser scanning subsystems, and each such laser scanning subsystem is capable of automatically generating, for each bar code symbol read by the subsystem, accurate information indicative of the precise point of origin of the laser scanning beam and its optical path to the read bar code symbol, as well as produced symbol character data representative of the read bar code symbol.

Another object of the present invention is to provide such a system, wherein the plurality of laser scanning subsystems generated an omnidirectional laser scanning pattern within a 3-D scanning volume, wherein a bar code symbol applied to any one side of a six-sided package (e.g. box) will be automatically scanned and decoded when passed through the 3-D scanning volume using the conveyor subsystem.

Another object of the present invention is to provide such a system, wherein the laser scanning subsystems comprise holographic laser scanning subsystems, and also polygonal-type laser scanning subsystems for reading bar code symbols facing the conveyor surface.

Another object of the present invention is to provide such a system, wherein each holographic laser scanning subsystem employed in the tunnel scanning subsystem comprises a device for generating information specifying which holographic scanning facet or holographic facet sector (or segment) produced the laser scan data used to read any bar code symbol by the subsystem.

Another object of the present invention is to provide such a system, wherein each non-holographic (e.g. polygonal-type) laser scanning subsystem employed in the tunnel scanning subsystem comprises a device for generating information specifying which mirror facet or mirror sector produced the laser scan data used to read any bar code symbol by the subsystem.

Another object of the present invention is to provide such a system, wherein the data element queuing, handling and processing subsystem provided therein further comprises a scan beam geometry modeling subsystem for producing, relative to a local coordinate reference system symbolically embedded within the laser scanning subsystem, coordinate information comprising a geometric model of each laser scanning beam used to read a particular bar code symbol for which symbol character data has been produced by the laser scanning subsystem.

Another object of the present invention is to provide such a system, wherein the data element queuing, handling and processing subsystem provided therein further comprises a first homogeneous transformation module for converting the coordinate information comprising the geometric model of each laser scanning beam used to read a particular bar code symbol on a detected package, from the local coordinate reference system symbolically embedded within the laser scanning subsystem, to a global coordinate reference system symbolically embedded within the tunnel-type scanning system.

Another object of the present invention is to provide such a system, wherein the data element queuing, handling and processing subsystem provided therein further comprises a package surface modeling subsystem for producing, relative to a local coordinate reference system symbolically embedded within the laser scanning subsystem, coordinate information comprising a geometric model of each surface on each package detected by the package detection and dimensioning subsystem.

Another object of the present invention is to provide such a system, wherein the data element queuing, handling and processing subsystem provided therein further comprises a second homogeneous transformation module for converting the coordinate information comprising the geometric model of each surface on a detected package, from the local coordinate reference system symbolically embedded within the laser scanning subsystem, to a global coordinate reference system symbolically embedded within the tunnel-type scanning system.

Another object of the present invention is to provide such a system, wherein a laser scan beam and package surface intersection determination subsystem is provided for determining which detected package was scanned by the laser scanning beam that read a particular bar code symbol, and for linking (i.e. correlating) package measurement data associated with the detected package with package identification data associated with the laser scanning beam that read a bar code symbol on a detected package.

Another object of the present invention is to provide such a system with a package velocity measurement subsystem for measuring the velocity of the package as it moves from the package detection and dimensioning subsystem through the laser scanning tunnel subsystem of the system.

Another object of the present invention is to provide such a system, wherein the package velocity measurement subsystem is realized using a pair of spaced-apart laser beams projected over the conveyor so that when a package interrupts these laser beams, electrical pulses are automatically generated and processed using a clock in order to compute the instantaneous velocity of each and every package transported along the conveyor belt subsystem.

Another object of the present invention is to provide such a system, wherein the package detection and dimensioning subsystem provided on the input side of the laser scanning tunnel subsystem comprises a first pair of light transmitting and receiving structures arranged to transmit a plurality of light beams along a direction parallel to the conveyor belt in order to collect data and measure the height of each singulated package passing through the package detection and dimensioning subsystem, and a second pair of light transmitting and receiving structures arranged to transmit a plurality of light beams along a direction perpendicular to the conveyor belt in order to collect data and measure the width of each singulated package passing through the package detection and dimensioning subsystem.

Another object of the present invention is to provide such a system, wherein the package detection and dimensioning subsystem provided on the input side of the laser scanning tunnel subsystem further comprises a height data processor for processing arrays of height profile data collected from the first pair of light transmitting and receiving structures in order to detect stacked arrangements of packages transported through the package detection and dimensioning subsystem, and width data processor for processing arrays of width profile data collected from the second pair of light transmitting and receiving structures in order to detect side-by-side arrangements of packages transported through the package detection and dimensioning subsystem, and upon detecting either a stacked configuration of packages or a side-by-side configuration of packages, automatically generating an unique data element indicative of such multiple package arrangements along the conveyor belt, and placing this unique data element in the moving package tracking queue in the data element queuing, handling and processing subsystem so that this subsystem can cause an auxiliary subsystem to reroute such multiple packages through a singulation unit and then return to pass once again through the system of the present invention.

Another object of the present invention is to provide such a system, wherein a package weighing-in-motion subsystem is provided for weighing singulated packages moving through the package detection and dimensioning subsystem, and producing weight measurement information for assignment to each detected package.

Another object of the present invention is to provide an automated package identification and measuring system, wherein singulated packages can be detected, dimensioned, weighed, and identified in a fully automated manner without human intervention, while being transported through a laser scanning tunnel subsystem using a package conveyor subsystem.

Another object of the present invention is to provide such a system, wherein a package detection and dimensioning subsystem is provided on the input side of its scanning tunnel subsystem, for detecting and dimensioning singulated packages passing through the package detection and dimensioning subsystem.

Another object of the present invention is to provide such a system, wherein a data element queuing, handling and processing subsystem is provided for queuing, handling and processing data elements representative of package identification, dimensions and/or weight, and wherein a moving package tracking queue is maintained so that data elements comprising objects, representative of detected packages entering the scanning tunnel, can be tracked along with dimensional and measurement data collected on such detected packages.

Another object of the present invention is to provide such a system, wherein a package detection subsystem is provided on the output side of its scanning tunnel subsystem.

Another object of the present invention is to provide such a system, wherein the tunnel scanning subsystem provided therein comprises a plurality of laser scanning subsystems, and each such laser scanning subsystem is capable of automatically generating, for each bar code symbol read by the subsystem, accurate information indicative of the precise point of origin of the laser scanning beam and its optical path to the read bar code symbol, as well as produced symbol character data representative of the read bar code symbol.

Another object of the present invention is to provide such a system, wherein the plurality of laser scanning subsystems generated an omnidirectional laser scanning pattern within a 3-D scanning volume, wherein a bar code symbol applied to any one side of a six-sided package (e.g. box) will be automatically scanned and decoded when passed through the 3-D scanning volume using the conveyor subsystem.

Another object of the present invention is to provide such a system, wherein the laser scanning subsystems comprise holographic laser scanning subsystems, and also polygonal-type laser scanning subsystems for reading bar code symbols facing the conveyor surface.

Another object of the present invention is to provide such a system, wherein each holographic laser scanning subsystem employed in the tunnel scanning subsystem comprises a device for generating information specifying which holographic scanning facet or holographic facet sector (or segment) produced the laser scan data used to read any bar code symbol by the subsystem.

Another object of the present invention is to provide such a system, wherein each non-holographic (e.g. polygonal-type) laser scanning subsystem employed in the tunnel scanning subsystem comprises a device for generating information specifying which mirror facet or mirror sector produced the laser scan data used to read any bar code symbol by the subsystem.

Another object of the present invention is to provide such a system, wherein the data element queuing, handling and processing subsystem provided therein further comprises a scan beam geometry modeling subsystem for producing, relative to a local coordinate reference system symbolically embedded within the laser scanning subsystem, coordinate information comprising a geometric model of each laser scanning beam used to read a particular bar code symbol for which symbol character data has been produced by the laser scanning subsystem.

Another object of the present invention is to provide such a system, wherein the data element queuing, handling and processing subsystem provided therein further comprises a first homogeneous transformation module for converting the coordinate information comprising the geometric model of each laser scanning beam used to read a particular bar code symbol on a detected package, from the local coordinate reference system symbolically embedded within the laser scanning subsystem, to a global coordinate reference system symbolically embedded within the tunnel-type scanning system.

Another object of the present invention is to provide such a system, wherein the data element queuing, handling and processing subsystem provided therein further comprises a package surface modeling subsystem for producing, relative to a local coordinate reference system symbolically embedded within the laser scanning subsystem, coordinate information comprising a geometric model of each surface on each package detected by the package detection and dimensioning subsystem.

Another object of the present invention is to provide such a system, wherein the data element queuing, handling and processing subsystem provided therein further comprises a second homogeneous transformation module for converting the coordinate information comprising the geometric model of each surface on a detected package, from the local coordinate reference system symbolically embedded within the laser scanning subsystem, to a global coordinate reference system symbolically embedded within the tunnel-type scanning system.

Another object of the present invention is to provide such a system, wherein a laser scan beam and package surface intersection determination subsystem is provided for determining which detected package was scanned by the laser scanning beam that read a particular bar code symbol, and for linking (i.e. correlating) package measurement data associated with the detected package with package identification data associated with the laser scanning beam that read a bar code symbol on a detected package.

Another object of the present invention is to provide such a system with a package velocity measurement subsystem for measuring the velocity of the package as it moves from the package detection and dimensioning subsystem through the laser scanning tunnel subsystem of the system.

Another object of the present invention is to provide such a system, wherein the package velocity measurement subsystem is realized using an roller wheel engaged in direct contact with the conveyor belt as it moves, generating electrical pulses as an optical encoder attached to the shaft of the roller wheel is caused to complete one revolution, during which the conveyor belt traveled one linear foot, and counting these generated electrical pulses with reference to a clock in order to compute the instantaneous velocity of the conveyor belt, and thus each and every package transported therealong without slippage.

Another object of the present invention is to provide such a system, wherein the package detection and dimensioning subsystem provided on the input side of the laser scanning tunnel subsystem comprises a laser scanning mechanism that generates an amplitude modulated laser scanning beam that is scanned across the width of the conveyor structure in the package conveyor subsystem while the scanning beam is disposed substantially perpendicular to the surface of the conveyor structure, and light reflected from scanned packages is collected, detected and processed to produce information representative of the package height profile across the width of the conveyor structure for each timing sampling instant carried out by the package detection and dimension subsystem.

Another object of the present invention is to provide such a system, wherein the package detection and dimensioning subsystem provided on the input side of the laser scanning tunnel subsystem further comprises a height data processor for processing arrays of height profile data collected from the first pair of light transmitting and receiving structures in order to detect stacked arrangements of packages transported through the package detection and dimensioning subsystem, and width data processor for processing arrays of width profile data collected from the second pair of light transmitting and receiving structures in order to detect side-by-side arrangements of packages transported through the package detection and dimensioning subsystem, and upon detecting either a stacked configuration of packages or a side-by-side configuration of packages, automatically generating a unique data element indicative of such multiple package arrangements along the conveyor belt, and placing this unique data element in the moving package tracking queue in the data element queuing, handling and processing subsystem so that this subsystem can cause an auxiliary subsystem to reroute such multiple packages through a singulation unit and then returned to pass once again through the system of the present invention.

Another object of the present invention is to provide such a system, wherein a package weighing-in-motion subsystem is provided for weighing singulated packages moving through the package detection and dimensioning subsystem, and producing weight measurement information for assignment to each detected package.

Another object of the present invention is to provide an automated package identification and measuring system, wherein multiple packages, arranged in a side-by-side, stacked and/or singulated configuration, can be simultaneously detected, dimensioned, weighed, and identified in a fully automated manner without human intervention, while being transported through a laser scanning tunnel subsystem using a package conveyor subsystem.

Another object of the present invention is to provide such a system, wherein a package detection and dimensioning subsystem is provided on the input side of its scanning tunnel subsystem, for simultaneously detecting and dimensioning multiple packages passing through the package detection and dimensioning subsystem, and wherein the package detection and dimensioning subsystem employs multiple moving package tracking queues simultaneously maintained therein for spatially different regions above the conveyor belt so order that data objects, representative of packages detected in such spatially different regions, can be produced and tracked along with dimensional and measurement data collected on such detected packages.

Another object of the present invention is to provide such a system, wherein a data element queuing, handling and processing subsystem is provided for queuing, handling and processing data elements representative of package identification, dimensions and/or weight, and wherein multiple moving package tracking queues are simultaneously maintained for spatially different regions above the conveyor belt so that data elements comprising objects, representative of detected packages entering the scanning tunnel, can be tracked along with dimensional and measurement data collected on such detected packages.

Another object of the present invention is to provide such a system, wherein a multiple package detection and dimensioning subsystem is provided on the output side of its scanning tunnel subsystem, and multiple moving package tracking queues are simultaneously maintained therein for spatially different regions above the conveyor belt in order that data elements comprising objects, representative of detected packages exiting the scanning tunnel, can be tracked along with dimensional and measurement data collected on such detected packages.

Another object of the present invention is to provide such a system, wherein the tunnel scanning subsystem provided therein comprises a plurality of laser scanning subsystems, and each such laser scanning subsystem is capable of automatically generating, for each bar code symbol read by the subsystem, accurate information indicative of the precise point of origin of the laser scanning beam and its optical path to the read the bar code symbol, as well as symbol character data representative of the read bar code symbol.

Another object of the present invention is to provide such a system, wherein the data element queuing, handling and processing subsystem provided therein further comprises a scan beam geometry modeling subsystem for producing, relative to a local coordinate reference system symbolically embedded within the laser scanning subsystem, coordinate information comprising a geometric model of each laser scanning beam used to read a particular bar code symbol for which symbol character data has been produced by the laser scanning subsystem.

Another object of the present invention is to provide such a system, wherein the data element queuing, handling and processing subsystem provided therein further comprises a first homogeneous transformation module for converting the coordinate information comprising the geometric model of each laser scanning beam used to read a particular bar code symbol on a detected package, from the local coordinate reference system symbolically embedded within the laser scanning subsystem, to a global coordinate reference system symbolically embedded within the tunnel-type scanning system.

Another object of the present invention is to provide such a system, wherein the data element queuing, handling and processing subsystem provided therein further comprises a package surface modeling subsystem for producing, relative to a local coordinate reference system symbolically embedded within the laser scanning subsystem, coordinate information comprising a geometric model of each surface on each package detected by the package detection and dimensioning subsystem.

Another object of the present invention is to provide such a system, wherein the data element queuing, handling and processing subsystem provided therein further comprises a second homogeneous transformation module for converting the coordinate information comprising the geometric model of each surface on a detected package, from the local coordinate reference system symbolically embedded within the laser scanning subsystem, to a global coordinate reference system symbolically embedded within the tunnel-type scanning system.

Another object of the present invention is to provide such a system, wherein a laser scan beam and package surface intersection determination subsystem is provided for determining which detected package was scanned by the laser scanning beam that read a particular bar code symbol, and for linking (i.e. correlating) package measurement data associated with the detected package with package identification data associated with the laser scanning beam that read a bar code symbol on a detected package.

Another object of the present invention is to provide such a system with a package velocity measurement subsystem for measuring the velocity of the package as it moves from the package detection and dimensioning subsystem through the laser scanning tunnel subsystem of the system.

Another object of the present invention is to provide such a system, wherein the package velocity measurement subsystem is realized using an roller wheel engaged in direct contact with the conveyor belt as it moves, generating electrical pulses as an optical encoder attached to the shaft of the roller wheel is caused to complete one revolution, during which the conveyor belt traveled one linear foot, and counting these generated electrical pulses with reference to a clock in order to compute the instantaneous velocity of the conveyor belt, and this each and every package transported therealong without slippage.

Another object of the present invention is to provide such a system, wherein the package detection and dimensioning subsystem provided on the input side of the laser scanning tunnel subsystem comprises a laser scanning mechanism that generates an amplitude modulated laser scanning beam that is scanned across the width of the conveyor structure in the package conveyor subsystem while the scanning beam is disposed substantially perpendicular to the surface of the conveyor structure, and light reflected from scanned packages is collected, detected and processed to produce information representative of the package height profile across the width of the conveyor structure for each timing sampling instant carried out by the package detection and dimension subsystem.

Another object of the present invention is to provide such a system, wherein the package detection and dimensioning subsystem provided on the input side of the laser scanning tunnel subsystem comprises a stereoscopic camera subsystem which captures stereoscopic image pairs of packages being transported through the package detection and dimensioning subsystem, and also a real-time stereoscopic image processor which is programmed to detect multiple images present in the field of view of stereoscopic imaging subsystem, and compute the vertices and dimensions of each such detected package.

Another object of the present invention is to provide such a system, wherein a package weighing-in-motion subsystem is provided for weighing simultaneously weighing each package, or arrangement of side-by-side and/or stacked packages moving through the package detection and dimensioning subsystem, and producing weight measurement information for assignment to each detected package, or apportioned to each arrangement of side-by-side and/or stacked packages, based on relative volumetric measurements.

Another object of the present invention is to provide an improved tunnel-type scanning system, wherein bar code symbols downwardly facing the conveyor belt can be automatically scanned as they are transported through the system in a high-speed manner.

Another object of the present invention is to provide a novel corner-mounted laser scanning system which uses at least two (2) pairs of opposed VLD/scanning stations in order to produce an orthogonal set of raster-type scan patterns projected over a conveyor belt structure.

Another object of the present invention is to provide such a corner-mounted laser scanning system, wherein its laser scanning pattern has at least three depth-of-field (DOF) regions, identifiable as DOF1, DOF2 and DOF3, which are neither overlapping nor contiguous.

Another object of the present invention is to provide such a corner-mounted laser scanning system, which can read bar codes on the front of items on a conveyor belt when the bar codes are generally in a picket fence orientation (i.e. bar elements are arranged vertically relative to the conveyor belt surface) or ladder orientation (i.e. the bar elements are arranged horizontally relative to the conveyor belt surface), or nearly so.

Another object of the present invention is to provide a bar code symbol scanning system which is designed to be installed on side of the conveyor belt, so that the focused spot size normal to the beam is considerably smaller than the minimum resolution element of the bar code to be scanned.

Another object of the present invention is to provide a complete omni-directional scanning system, wherein the scanning pattern comprises an orthogonal set of laser scanning, including vertical or horizontal oriented rastered sets of laser scanning planes for reading bar code symbols having either a picket fence orientation or a ladder orientation, respectively.

Another object of the present invention is to provide a novel laser scanning system, comprising a set of scanners that are placed at an angle close to 45 degrees relative to the direction of item travel so as to assure that that at least one scanner can read bar codes on item surfaces that are facing in the direction of item travel and also toward the side of the conveyor belt, while minimizing the shadow effect yet ensuring good reading on the front surfaces.

Another object of the present invention is to provide such a laser scanning system, which further comprises side scanners that can read bar codes placed on the sides of items, rather than of on the front sides thereof.

Another object of the present invention is to provide such a laser scanning system, wherein the laser scan lines are optimally separated and tilted to assure that at least one scanner can read bar codes that are not in perfect picket fence or ladder orientations, yet provide some small degree of omni-directional scanning.

Another object of the present invention is to provide such a laser scanning system, wherein the relatively small focused spot of the laser scanning beam, required by the tilt of the scanner, reduces the depth of field for each focal group of the multiple-focal-plane scanning system.

Another object of the present invention is to provide such a laser scanning system, wherein the depth of field regions of the individual focal groups (DOF1, DOF2, DOF3) do not need to be contiguous due to the fact that the scanner is mounted at an angle off to the side of the conveyor belt.

Another object of the present invention is to provide such a laser scanning system, wherein the laser scanning lines in each focal groups are carefully separated to guarantee reading across the desired scan width while using only three focal zones, whereas in contrast, when using contiguous, or overlapping, focal zones would require as many as seven focal zones.

Another object of the present invention is to provide such a laser scanning system, wherein the laser scanning pattern produced thereby has a reduced number of focal zones to produce a scan pattern that is denser and which results in more effective scanning of bar code symbols on the front and back surfaces of objects.

Another object of the present invention is to provide such a laser scanning system, wherein each corner-located scanner is a holographic scanning subsystem having a laser scanning disc having twenty-one scanning facets which produce seven scan lines in each focal group.

Another object of the present invention is to provide a novel method of analyzing the laser scanning pattern produced by a pair of corner-based laser scanners.

Another object of the present invention is to provide such a method of laser scan pattern analysis, wherein a complete picture of the effectiveness of a proposed scan pattern (called a time-lapsed composite "scan coverage plot") is composed by taking multiple exposures of the item surface as it progresses through the scan volume.

Another object of the present invention is to provide such a method, wherein the x-axis of the scan coverage plot is the dimension parallel to the belt width, and the y-axis thereof is the height dimension for a box being scanned through the scan volume.

Another object of the present invention is to provide a novel laser scanning system which uses different optics in the laser beam production modules associated with the four laser scanning stations that generate the two sets of horizontally oriented scanning planes, and the two laser scanning stations that generate the two sets of vertically oriented scanning planes.

Another object of the present invention is to provide such a laser scanning system, wherein the nominal (normal to the scanning beam) resolution of the horizontal scan lines is greater than that of the vertical lines to compensate for the elongation of the horizontal scan lines in the direction of scan at the label.

Another object of the present invention is to provide such a laser scanning system, wherein the vertical scan lines are also elongated, but not in the scan direction.

Another object of the present invention is to provide such a laser scanning system, wherein the beam diameter at the disk is greater for the horizontal VLD stations than for the vertical VLD stations.

Another object of the present invention is to provide such a laser scanning system, wherein different optics are used for the two sets of stations in order to optimize the performance of the two sets of scan lines.

Another object of the present invention is to provide a novel corner-mounted laser scanning system, for use in reading bar code symbols on tubs and trays moving along a conveyor belt, as well as a "train" in which cars have bar codes placed on the front or back surfaces thereof.

Another object of the present invention is to provide a novel "corner" scanner that produces a laser scanning pattern that is predisposed to reading codes in orthogonal orientations, in contrast with conventional Omni, Raster, or Linear scanning patterns.

Another object of the present invention is to provide such a laser scanning pattern, wherein the scanlines in the laser scanning pattern generated therefrom are not necessarily orthogonal to the scan codes.

Another object of the present invention is to provide such a laser scanning system, wherein a definite degree of angular tolerance is provided, so that bar codes scanned at plus or minus 20 degrees of code orientation pose no problem during decoding with or without stitching).

Another object of the present invention is to provide such a laser scanning system, wherein optimal scanning occurs for bar code symbols oriented at about +/−10 degrees off the ladder or picket fence orientation of the system.

Another object of the present invention is to provide a corner-mounted laser scanning system that is designed to read mainly ladder and picket fence orientation labels on the front (or back) of tubs and trays on a moving conveyor belt.

Another object of the present invention is to provide such a corner-mounted laser scanning system which projects over a conveyor belt, a laser scanning pattern that is optimized for reading bar code symbols on surfaces that are oriented at about 45 degrees to the nominal direction of propagation of the laser scanning beams, unlike prior art scanners that have been optimized for reading bar code symbols on surfaces that are oriented at about 90 degrees to the nominal direction of propagation of the laser scanning beams.

Another object of the present invention is to provide a LADAR-based package imaging and dimensioning subsystem for imaging and/or profiling packages transported thereby a substantially constant velocity.

Another object of the present invention is to provide such a LADAR-based imaging and dimensioning subsystem, wherein a synchronized amplitude-modulated laser beam is automatically produced and scanned across the width of a conveyor belt structure and, during each scan thereacross, detects and processes the reflected laser beam in order to capture a row of raw range (and optionally reflection-intensity) information that is referenced with respect to a polar-type coordinate system symbolically-embedded within the LASAR-based imaging and dimensioning subsystem.

Another object of the present invention is to provide such a LADAR-based imaging and dimensioning subsystem, wherein captured rows of range data are continuously loaded into a preprocessing data buffer, one row at a time, and processed in real-time using window-type convolution kernals that smooth and edge-detect the raw range data and thus improve its quality for subsequent dimension data extraction operations.

Another object of the present invention is to provide such a LADAR-based imaging and dimensioning subsystem, wherein detected background information (including noise) is automatically substracted from consecutively captured rows of smoothed/edge-detected range data to provide a range data map of the space above the conveyor belt, for use in carrying out package dimension data extraction operations involving the same.

Another object of the present invention is to provide such a LADAR-based imaging and dimensioning subsystem, wherein two-dimensional image contour tracing techniques are used to detect image contours within the buffered range data map, indicative of packages being transported thereby.

Another object of the present invention is to provide such a LADAR-based imaging and dimensioning subsystem automatically processes the indices (m,n) of the computed contours in order to detect possible vertices associated with polygonal-shaped objects extracted from the range data map, which are representative of packages or like objects being transported by the subsystem.

Another object of the present invention is to provide such a LADAR-based imaging and dimensioning subsystem, wherein the m and n indices of the vertices associated with the computed contours are automatically processed in order to detect candidates for corner points associated with the corners of packages transported by the subsystem.

Another object of the present invention is to provide such a LADAR-based imaging and dimensioning subsystem, wherein the m and n indices of detected corner point candidates are automatically processed in order to reduce those corner point candidates down to those most likely to be the corners of a regular-shaped polygonal object (e.g. six sided box).

Another object of the present invention is to provide such a LADAR-based imaging and dimensioning subsystem, wherein the m and n indices of the corner points extracted from the range data map are automatically processed in order to compute the surface area of the package represented by the contours traced therein.

Another object of the present invention is to provide such a LADAR-based imaging and dimensioning subsystem, wherein the m and n indices of the corner points extracted from the range data map are automatically processed in order to compute the x, y and z coordinates corresponding to the corners of the package represented by the contours traced therein, referenced relative to a Cartesian-type global coordinate reference system symbolically embedded within the automated package identification and measuring subsystem.

Another object of the present invention is to provide such a LADAR-based imaging and dimensioning subsystem, wherein the m and n indices of the corner points extracted from the range data map are automatically processed in order to compute the average height of the package represented by the contours traced therein, referenced relative to the Cartesian-type global coordinate reference system.

Another object of the present invention is to provide such a LADAR-based imaging and dimensioning subsystem, wherein a polygonal-type laser scanning mechanism is used to scan an amplitude-modulated laser beam across the width of the conveyor belt.

Another object of the present invention is to provide such a LADAR-based imaging and dimensioning subsystem, wherein a holographic-type laser scanning mechanism is used to scan an amplitude-modulated laser beam across the width of the conveyor belt.

These and other objects of the present invention will become apparent hereinafter and in the claims to Invention.

BRIEF DESCRIPTION OF THE DRAWINGS

For a more complete understanding of the present invention, the following Detailed Description of the Illustrative Embodiment should be read in conjunction with the accompanying Drawings, wherein:

FIG. 2C is a table setting forth data specifying the position and orientation of the sixteen omni-directional holographic laser scanners mounted within the tunnel scanning subsystem of the first illustrative embodiment of the present invention, wherein the position of each single-disc holographic scanner is specified with respect to the center of the holographic scanning disc contained within each such scanning unit, and the position of each triple-disc holographic scanner is specified with respect to the center of the middle holographic scanning disc contained within each such scanning unit;

FIG. 4A1 is a plan view of the triple-disc holographic scanning subsystem (e.g. indicated as Front, Back, Top/Front, Top/Back, Left Side/Front, Left Side/Back, Right Side/Front and Right Side/Back in FIG. 1B and the Scanner Positioning Table shown in FIG. 2C), mounted on the top and sides of the tunnel-type scanning system of the first illustrative embodiment, showing three holographic scanning discs mounted on an optical bench with about a 15.0 inches spacing between the axis of rotation of each neighboring holographic scanning disc, and each holographic scanning disc mounted therein being surrounded by five beam folding mirrors, five parabolic light collection mirrors, five laser beam production modules, five photodetectors, and five analog and digital signal processing boards mounted on the optical bench of the subsystem;

FIG. 4A2 is a perspective view of one of the laser scanning stations mounted about each holographic laser scanning disc in the holographic laser scanning subsystem shown in FIG. 4A1, FIG. 4A3 is a cross-sectional view of the triple-disc holographic laser scanning subsystem shown in FIG. 4A2, taken along line 4A3—4A3 thereof, showing its holographic scanning disc rotatably supported by its scanning motor mounted on the optical bench of the subsystem;

FIG. 4A4 is a schematic representation of the layout of the volume-transmission type holographic optical element (HOEs) mounted between the glass support plates of each holographic scanning disc employed within the triple-disc holographic scanning subsystem shown in FIG. 4A1;

FIG. 4A5 is a table setting forth the design parameters used to construct each holographic disc within the single-disc holographic scanning subsystem employed in the tunnel scanning system of the first illustrative embodiment;

FIGS. 4A6A through 4A6C, taken together, show the subcomponents configured together on the analog signal processing boards, decode signal processing boards and within the housing of the single-disc holographic laser scanning subsystems of the first illustrative embodiment of the present invention;

FIG. 4A7A is an elevated view of the home-pulse mark sensing module of the present invention deployed about each holographic scanning disc in the system of the first illustrative embodiment of the present invention;

FIG. 4A7B is a plan view of the home pulse mark sensing module shown in FIG. 3A8A;

FIGS. 4A7C1 and 4A7C2, taken together, set forth a schematic diagram of an analog signal processing circuit which can be used to implement the home-pulse detector employed in the holographic laser scanning subsystems of the first illustrative embodiment of the present invention;

FIG. 4A8A is a schematic representation of the 3-D laser scanning volume produced from the triple-disc holographic laser scanning subsystem of FIG. 4A1 (indicated as "Penta 3"), indicating the physical dimensions of the 3-D scanning volume, as well as the minimum bar code element width resolutions that the subsystem can achieve over three identified subregions within the scanning volume;

FIG. 4A8B is a schematic representation of the 3-D laser scanning volume produced from a double-disc embodiment of the holographic laser scanning subsystem of FIG. 4A1 (indicated as "Penta 2"), indicating the physical dimensions of the 3-D scanning volume, as well as the minimum bar code element width resolutions that the subsystem can achieve over three identified subregions within the scanning volume;

FIG. 4A8C is a schematic representation of the 3-D laser scanning volume produced from a single-disc embodiment of the holographic laser scanning subsystem of FIG. 4A1 (indicated as "Penta 1"), indicating the physical dimensions of the 3-D scanning volume, as well as the minimum bar code element width resolutions that the subsystem can achieve over three identified subregions within the scanning volume;

FIG. 4A8D is a scanner specification table setting forth operational specifications for the holographic laser scanning subsystems shown in FIGS. 4A8A, 4A8B and 4A8C, for the Penta 3, Penta 2 and Penta 1 scanners, respectively;

FIG. 4A9 is a schematic representation of all the laser scan lines produced by a single scanning platform within the laser scanning subsystem of FIG. 4A1, projected into the respective focal planes of such laser scan lines;

FIG. 4A10 is a schematic representation of all the laser scan lines produced by all three of the laser scanning platforms within the laser scanning subsystem of FIG. 4B1, projected into the respective focal planes of such laser scan lines;

FIG. 4B1A is an enlarged plan view of one of the laser scanning subsystems (i.e. platforms) in the subsystem shown in FIG. 4B1, showing the angular position of each laser scanning station (LS1 through LS6) relative to the home pulse gap detector;

FIG. 4B1 is a plan view of the triple-disc holographic laser scanning subsystem (e.g. indicated as L/F Corner #1, L/F Corner #2, L/B Corner #1, L/B Corner #2, R/F Corner #1, R/F Corner #2, R/B Corner #1 and R/B Corner #2 in FIG. 1B and the Scanner Positioning Table shown in FIG. 2C), mounted within the corners of the tunnel-type scanning system of the first illustrative embodiment, showing each holographic scanning disc mounted therein being spaced apart from adjacent discs by about 13.0 inches and surrounded by six beam folding mirrors, six parabolic light collection mirrors, six laser beam production modules, six photodetectors, and six analog and digital signal processing boards mounted on the optical bench of the subsystem;

FIG. 4B2 is a schematic representation of the layout of the volume-transmission type holographic optical element (HOEs) mounted between the glass support plates of each holographic scanning disc employed within the triple-disc holographic scanning subsystem of FIG. 4B1;

FIGS. 4B3A and 4B3B shown a table setting forth the design parameters used to construct each holographic disc within the triple-disc holographic scanning subsystem of FIG. 4B1;

FIGS. 4B4A through 4B4C, taken together, show the subcomponents configured together on the analog signal processing boards, decode signal processing boards and within the housing of the triple-disc holographic laser scanning subsystems of FIG. 4B1;

FIG. 4B5A is a schematic representation of the 3-D laser scanning volume produced from the triple-disc holographic laser scanning subsystem of FIG. 4B1 (indicated as "Ortho 3"), indicating the physical dimensions of its 3-D scanning volume and the clearance between the scanner housing and the 3-D scanning volume;

FIG. 4B5B is a schematic representation of the 3-D laser scanning volume produced from a double-disc embodiment of the holographic laser scanning subsystem of FIG. 4B1 (indicated as "Ortho 2"), indicating the physical dimensions of its 3-D scanning volume and the clearance between the scanner and the 3-D scanning volume;

FIG. 4B5C is a schematic representation of the 3-D laser scanning volume produced from a single-disc embodiment of the holographic laser scanning subsystem of FIG. 4A1 (indicated as "Ortho 1"), indicating the physical dimensions of the 3-D scanning volume and the clearance between the scanner housing and the 3-D scanning volume;

FIG. 4B5D is a scanner specification table setting forth operational specifications for the holographic laser scanning subsystems shown in FIGS. 4B5A, 4B5B and 4B5C, for the Ortho 3, Ortho 2 and Ortho 1 scanners, respectively;

FIG. 4B6 is a plan view schematic representation of the 3-D laser scanning volume generated from the triple-disc holographic laser scanning subsystem of FIG. 4B1, showing the scanning volume projected over a conveyor belt structure transporting a package moving through the scanning tunnel of the system of FIG. 1;

FIG. 4B7 is a plan view schematic representation of the 3-D laser scanning volume generated from the triple-disc holographic laser scanning subsystem of FIG. 4B1, showing the orthogonal (i.e. horizontal and vertical) and horizontal scanning regions within each spatially-separated focal zone FZ1, FZ2 and FZ3 of the subsystem;

FIG. 4B8 is a schematic representation of all the laser scan lines produced by a single scanning platform within the laser scanning subsystem of FIG. 4B1, projected into the respective focal planes of such laser scan lines;

FIG. 4B9 is a schematic representation of all the laser scan lines produced by all three of the laser scanning platforms within the laser scanning subsystem of FIG. 4B1, projected into the respective focal planes of such laser scan lines;

FIG. 4B10 is a graphical representation plotting (i) the spot-size of a laser beam produced from a laser scanning station within the subsystem of FIG. 4B1 which generates laser scanning lines oriented to read "picket-fence" oriented bar code symbols on packages transported along the conveyor belt, versus (ii) the distance of the scanned bar code symbol from the holographic scanning disc;

FIG. 4B11 is a graphical representation plotting (i) the spot-size of a laser beam produced from a laser scanning station within the subsystem of FIG. 4B1 which generates laser scanning lines oriented to read "ladder" oriented bar code symbols transported along the conveyor belt, versus (ii) the distance of the scanned bar code symbol from the holographic scanning disc;

FIG. 4B12 is a graphical representation of the composite time-lapsed "scan coverage pattern" provided by each corner-mounted laser scanning subsystem in the first illustrative embodiment shown in FIG. 1;

FIG. 4B13 is a plan view schematic representation showing the scanning areas covered by four corner-mounted triple-disc laser scanning subsystems of FIG. 4B1, as well as the orthogonal and omnidirectional scanning regions projected over a moving conveyor belt structure;

FIG. 4B14 is a plan view schematic representation showing the scanning areas covered by eight corner-mounted triple-disc laser scanning subsystems employed in the tunnel scanning system of FIGS. 1 through 1C, as well as the orthogonal and omnidirectional scanning regions projected over a moving conveyor belt structure thereof;

FIG. 4C1 is an exploded diagram of the fixed laser projection scanner mounted beneath the conveyor belt surface of the system and between the first and second conveyor belt platforms of the conveyor subsystem employed in the tunnel scanning system of the first illustrative embodiment of the present invention, showing the optical bench upon which eight fixed projection-type laser scanning subsystems are mounted and enclosed within a scanner housing having a rugged glass scanning window bridging the gap provided between the first and second conveyor belt platforms;

FIG. 4C2 is a perspective diagram of the projection-type laser scanning subsystem mounted within the bottom-mounted fixed projection scanner shown in FIG. 4C1, showing an eight-sided polygon scanning element rotatably mounted closely adjacent to a stationary mirror array comprised of four planar mirrors, and a light collecting mirror centrally mounted for focusing light onto a photodetector disposed slightly beyond the polygon scanning element;

FIG. 4C3 is a plan view of the eight fixed-projection laser scanning subsystems mounted on the optical bench of the bottom-mounted laser scanner shown in FIG. 4C1;

FIG. 4C3 is an elevated end view of the eight fixed-projection laser scanning subsystems mounted on the optical bench of the bottom-mounted laser scanner shown in FIG. 4C1, so that the scanning window(s) of the fixed projection laser scanning subsystems (i.e. platforms or benches) are disposed at about a 28° angle with respect to the optically transparent extending across the width extent of the plane of the conveyor belt structure of the system;

FIG. 4C3A is a side end view of the polygonal bottom scanning subsystem depicted in FIG. 4C3;

FIG. 4C4 is a schematic representation of the partial scanning pattern produced by the eight-sided polygon scanning element and two stationary mirrors mounted adjacent to the central plane of each fixed-projection laser scanning subsystem mounted on the optical bench of the bottom-mounted laser scanner shown in FIG. 4C1;

FIG. 4C5 is a schematic representation of the partial scanning pattern produced by the eight-sided polygon scanning element and two outer stationary mirrors mounted adjacent to the two inner-located stationary mirrors in each fixed-projection laser scanning subsystem mounted on the optical bench of the bottom-mounted laser scanner shown in FIG. 4C1;

FIG. 4C6 is a schematic representation of the complete scanning pattern produced by the eight-sided polygon scanning element and four stationary mirrors mounted about the central plane of each fixed-projection laser scanning subsystem mounted on the optical bench of the bottom-mounted laser scanner shown in FIG. 4C1;

FIG. 4C7 is a schematic representation of the resultant (collective) omni-directional scanning pattern produced through the conveyor-mounted scanning window, by the eight fixed-projection laser scanning subsystems mounted on the optical bench of the bottom-mounted laser scanner shown in FIG. 4C1;

FIG. 5A is a schematic diagram showing the directions of omni-directional scanning provided in the X-Y plane of the 3-D scanning volume of the tunnel scanning system of the first illustrative embodiment of the present invention, by the Front and Back holographic laser scanning subsystems, and bottom-mounted fixed projection scanning subsystem employed therein;

FIG. 5B is a schematic diagram showing the direction of omni-directional scanning provided in the Y-Z plane of the 3-D scanning volume of the tunnel scanning system of the first illustrative embodiment, by the bottom-mounted fixed-projection laser scanning subsystem employed therein;

FIG. 6 is a schematic diagram showing the direction of omni-directional scanning provided in the X-Y plane of the 3-D scanning volume of the tunnel scanning system of the first illustrative embodiment, by the Left Side Front, Left Side Back, Right Side Front and Right Side Back holographic laser scanning subsystems employed therein;

FIG. 7 is a schematic diagram showing the direction of omni-directional scanning provided in the Y-Z plane of the 3-D scanning volume of the tunnel scanning system of the first illustrative embodiment, by the Front and Back holographic laser scanning subsystems employed therein;

FIG. 8A is a schematic diagram showing the direction of omni-directional scanning provided in the Y-Z plane of the 3-D scanning volume of the tunnel scanning system of the first illustrative embodiment of the present invention, by the holographic laser scanning subsystems (indicated by R/B Corner #1, R/B Corner #2, L/F Corner #1 and R/B Corner #2) employed therein;

FIG. 8B is a schematic diagram showing the direction of omni-directional scanning provided in the X-Y plane of the 3-D scanning volume of the tunnel scanning system of the first illustrative embodiment of the present invention, by the holographic laser scanning subsystems (indicated by R/B Corner #1, R/B Corner #2, R/F Corner #1 and R/B Corner #2) employed therein;

FIG. 10 is a schematic representation of the components on the control board and decode processing boards associated with holographic scanning disc employed within the tunnel scanning subsystem of the first illustrative embodiment of the present invention, showing the home-pulse detector and home-offset pulse (HOP) generator on the control board, and the start-of-facet-sector pulse (SOFSP) generator, digitizer circuitry, decode signal processor and ROM containing relative timing information about each SOFSP in relation to the HOP sent to the decode processing board from the control board of the present invention;

FIG. 10B is a first table containing parameters and information that are used within the SOFP generation module of the SOFSP generator shown in FIG. 10A;

FIG. 10D is a second table containing parameters and information that are used within the SOFSP generation module of the SOFSP generator shown in FIG. 10A;

FIG. 10E1 and 10E2 set forth a table containing a set of production rules used within the SOFSP generation module of the SOFSP generator shown in FIG. 10A, to generate start-of-facet-sector pulses therewithin;

FIGS. 11A and 11A2, taken together, set forth a schematic diagram of the digitizing circuit shown in FIG. 10, using a pair of dual FIFO memory storage buffers to synchronously track digital scan data and information about the facet-sectors on the optically-encoded holographic scanning disc of FIG. 12 used to generate the laser scanning beam that was used to collect such digital scan data from a bar code symbol on a package transported through the tunnel scanning subsystem of the first illustrative embodiment of the present invention;

FIGS. 11C1, 11C2 and 11D set forth tables containing parameters and information that are used within the decode processor of the present invention shown in FIG. 11B in order to recover digital count data from time-based facet-sector related information, and generate decoded symbol character data and the minimum and maximum facet sector angles that specify the facet sector on a particular holographic scanning disc used to generate the laser scanning beam/plane that collects the scan data associated with the decoded bar code symbol;

FIG. 12D is a table containing parameters and information that are used within the SOFSP generation module of the SOFSP generator shown in FIG. 12C;

FIGS. 13A1 and 13A2, taken together, set forth a schematic diagram of the digitizing circuit shown in FIG. 12B using a pair of dual FIFO memory storage buffers to synchronously track digital scan data and information about the facet-sectors on a holographic scanning disc used to generate the laser scanning beam that was used to collect such digital scan data from a bar code symbol on a package transported through the tunnel scanning subsystem hereof;

FIGS. 13C1 and 13C2 are tables containing parameters and information that are used within the decode processor of the present invention shown in FIGS. 13A1 and 13A2 in order to recover digital count data from time-based facet-sector related information, and generate decoded symbol character data and the minimum and maximum facet sector angles that specify the facet sector on a particular holographic scanning disc used to generate the laser scanning beam/plane that collect the scan data associated with the decoded bar code symbol;

FIG. 14A is a schematic representation of the components on the control board and decode processing boards associated with a holographic scanning disc employed within an alternative embodiment of the holographic scanning subsystems in the tunnel scanning subsystem of the first illustrative embodiment of the present invention, showing the home-pulse detector and home-offset pulse (HOP) generator on the control board, and the start-of-facet-sector pulse (SOFSP) generator, digitizer circuitry, and decode signal processor.

FIG. 14B is a schematic representation of the start-of-facet-sector pulse (SOFSP) generator employed on each decode board associated with a holographic laser scanning subsystem depicted in FIG. 14A;

FIG. 14C is a flow chart describing the operation of the HOP generator on the control board associated with each holographic scanning disc, wherein home offset pulses (HOPs) are automatically generated from the HOP generator aboard the control board in each holographic laser scanning subsystem independent of the angular velocity of the holographic scanning disc employed therein;

FIG. 14D is a flow chart describing the operation of the SOFSP generator aboard each decode board, wherein start of facet pulses (SOFPs) are automatically generated within the SOFP generation module relative to the home-offset pulse (HOP) received by the control module in the SOFSP generator independent of the angular velocity of the holographic scanning disc of the subsystem, and wherein start of facet sector pulses (SOFSPs) are automatically generated within the SOFSP generation module relative to SOFPs generated by the SOFP generation module, independent of the angular velocity of the holographic scanning disc of the subsystem;

FIG. 15A is a schematic representation showing the dual-laser based package velocity and measurement subsystem installed in a "direct transmit/receive" configuration at the location of the vertical and horizontal light curtains employed in the package height/width profiling subsystem of the present invention;

FIG. 15A1 is a schematic representation of the signals received by the photoreceivers of the dual-laser based package velocity and measurement subsystem shown in FIG. 15;

FIG. 15A2 is a schematic representation of the signals generated by the photoreceiving circuitry and provided as input to the signal processor of the dual-laser based package velocity and measurement subsystem shown in FIG. 15;

FIG. 15A3 is a schematic diagram of circuitry for driving the dual laser diodes used in the dual-laser based package velocity and measurement subsystem of FIG. 15A;

FIGS. 15A4A and 15A4B, taken together, set forth a schematic diagram of circuitry for conditioning the signals received by the photoreceivers employed in the dual-laser based package velocity and measurement subsystem of FIG. 15A;

FIG. 15B is a schematic representation showing the dual-laser based package velocity and measurement subsystem installed in a "retro-reflection" configuration at the location of the vertical and horizontal light transmitting/receiving structures employed in the package height/width profiling subsystem of the present invention;

FIG. 15B1 is a schematic diagram of electronic circuitry adapted for automatically generating a pair of laser beams at a known space-part distance, towards a retroflective device positioned on the opposite side of the conveyor belt of the system of the first illustrative embodiment of the present invention, and automatically detecting the retroflected beams and processing the same so as to produce signals suitable for computing the length and velocity of a package passing through the transmitted laser beams within the dual-laser based package velocity and measurement subsystem of FIG. 15B;

FIGS. 15C through 15C2, taken together, set forth a flow chart describing the steps carried out by the signal processor used in the dual-laser based package velocity and measurement subsystems of FIG. 15 and FIG. 15B, so as to compute the velocity (v) and length (L) of the package transported through the laser beams of the dual-laser based package velocity and measurement subsystem hereof;

FIG. 16 is a perspective view of the automated package identification and measurement system of the present invention, showing the location of the package height/width profiling subsystem (and package-in-tunnel signaling subsystem) in relation thereto and the global coordinate reference system $R_{global}$ symbolically embedded within the structure thereof, as shown;

FIG. 16A is a schematic representation of the horizontally and vertically arranged light transmitting and receiving structures and subcomponents employed in the package height/width profiling subsystem in the system of the first illustrative embodiment of the present invention;

FIG. 17A is an elevated side view of a pair of packages, arranged in a side-by-side configuration, and about to be transported through the package height/width profiling subsystem of FIG. 16;

FIG. 17B is a plan view of a pair of packages, arranged in a side-by-side configuration, and about to be transported through the package height/width profiling subsystem of FIG. 16;

FIG. 17C is an elevated side view of a pair of package, arranged in a side-by-side configuration, and being transported through and thus profiled by the package height/width profiling subsystem of FIG. 16;

FIG. 19 is a schematic diagram of an improved third-order finite-impulse-response (FIR) digital filter system that can be used to filter data streams produced from the width and height profiling data channels of the package height/width profiling subsystem of FIG. 16, in order to detect sudden changes in width and height profiles along the conveyor belt, within the context of a method of simultaneous package detection and tracking being carried out on a real-time basis in accordance with the principles of the present invention;

FIG. 21 is a schematic diagram of the package-in-tunnel signaling subsystem employed in the automated package identification and measuring system of the first illustrative embodiment of the present invention;

FIGS. 22A1, 22A2 and 22B, taken together provide a schematic representation of the data element queuing, handling and processing subsystem of the present invention shown in FIG. 4;

FIGS. 23A1 and 23A2 set forth a table of rules used to handle the data elements stored in the system event queue in the data element queuing, handling and processing subsystem of FIGS. 22A1 and 22A2;

FIG. 24A is a table setting forth a preferred procedure for creating a vector-based surface model for each surface of each package transported through the package dimensioning/measuring subsystem and package velocity/length measurement subsystem of the system hereof;

FIGS. 25A through 25A1 is schematic representation of a diffraction-based geometric optics model, created by the scan beam geometry modeling subsystem (i.e. module) of FIGS. 22A1 and 22A2, for the propagation of the laser scanning beam (ray) emanating from a particular point on the facet, towards its point of reflection on the corresponding beam folding mirror, towards to the focal plane determined by the focal length of the facet, created within the scan beam geometry modeling module shown in FIGS. 22A1 and 22A2;

FIGS. 25B1 through 25B3 set forth a table of parameters used to construct the diffraction-based geometric optics model of the scanning facet and laser scanning beam shown in FIGS. 25A and 25A1;

FIGS. 25C1 and 25C2, taken together, set forth a table of parameters used in the spreadsheet design of the holographic laser scanning subsystems of the present invention, as well as in real-time generation of geometrical models for laser scanning beams using 3-D ray-tracing techniques;

FIG. 26 is a schematic representation of the laser scanning disc shown in FIGS. 25A and 25A1, labeled with particular parameters associated with the diffraction-based geometric optics !model of FIGS. 25A and 25A1;

FIG. 27 is a table setting forth a preferred procedure for creating a vector-based ray model for laser scanning beams which have been produced by a holographic laser scanning subsystem of the system hereof, that may have collected the scan data associated with a decoded bar code symbol read thereby within the tunnel scanning subsystem;

FIG. 29 is a schematic representation graphically illustrating how a vector-based model created within a local scanner coordinate reference frame $R_{localscannerj}$ can be converted into a corresponding vector-based model created within the global scanner coordinate reference frame $R_{global}$ using homogeneous transformations;

Figure 1:
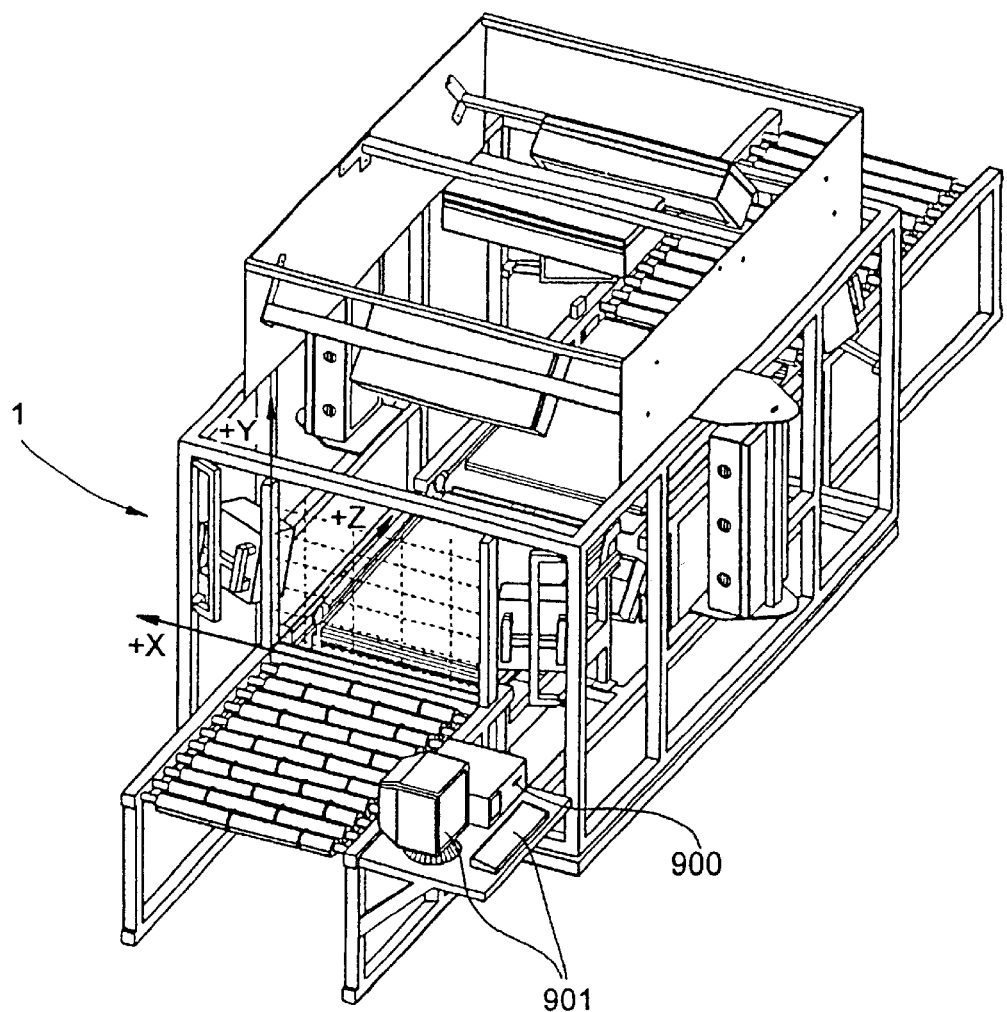
FIG. 1 is a perspective view of an automated tunnel-type laser scanning package identification and measurement (e.g. dimensioning and weighing) system constructed in accordance with the first illustrated embodiment of the present invention.
Figure 2A:
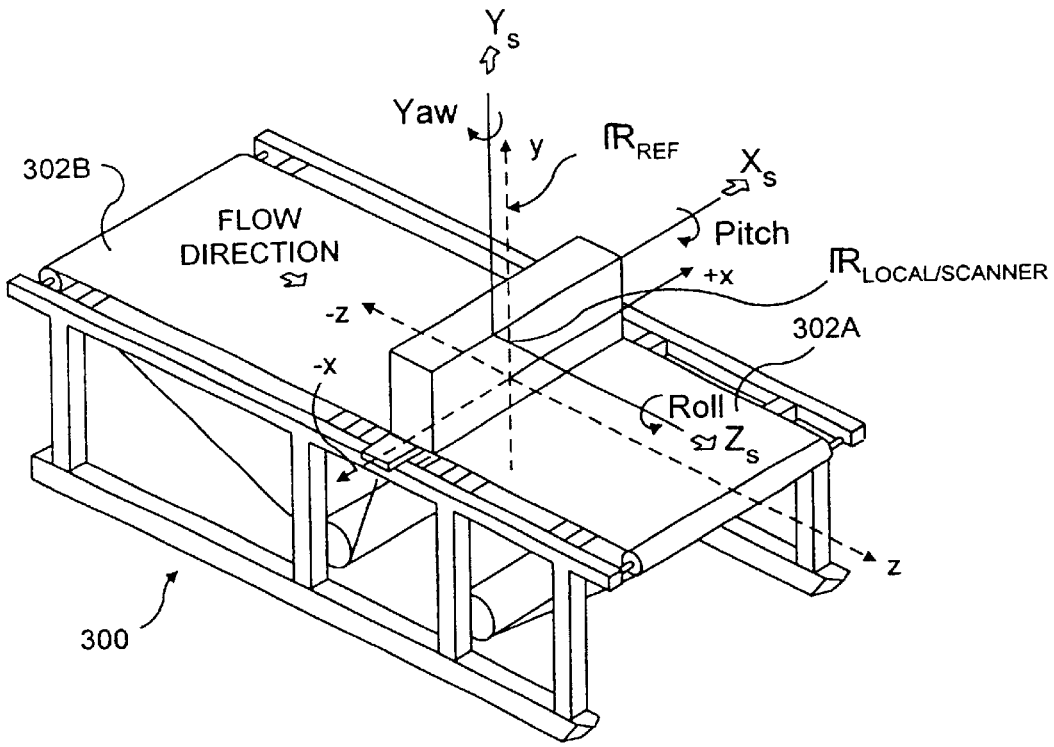
FIG. 2A is a perspective view of the split-conveyor subsystem removed from scanner support framework of the system of the first illustrative embodiment, showing a coordinate reference framework symbolically embedded within the conveyor subsystem and shown with graphical indications describing the directions of yaw, pitch and roll of each triple-scanning disc holographic scanner supported from the scanner support framework of the tunnel scanning system shown in FIGS. 1 and 1A.
Figure 2B:
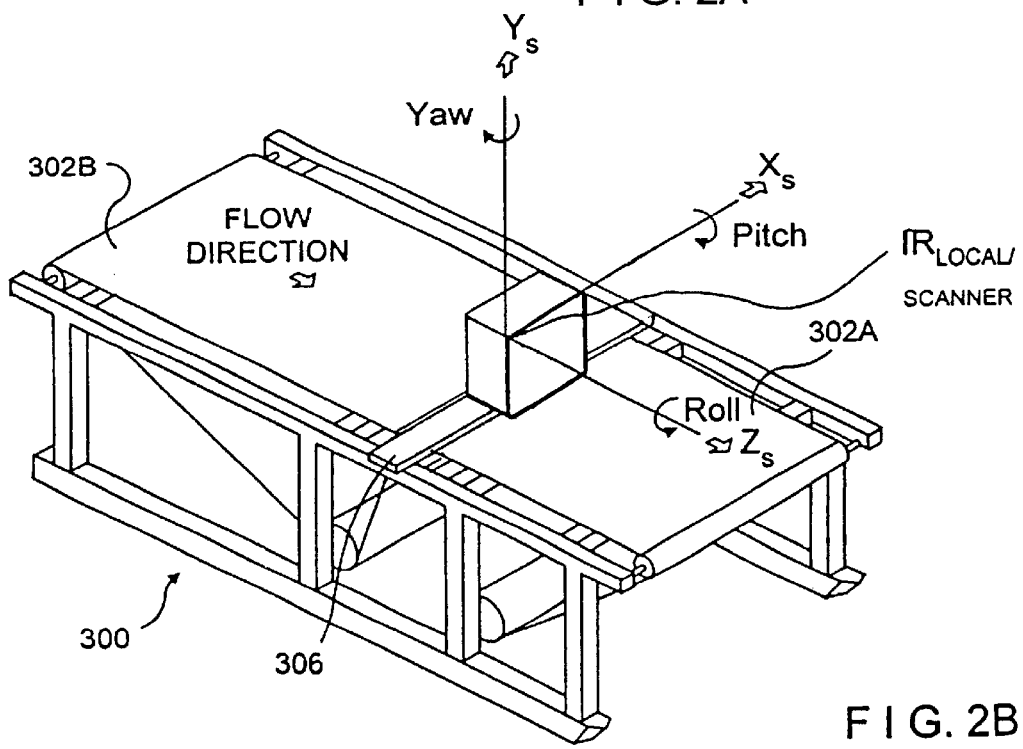
FIG. 2B is a perspective view of the split-conveyor subsystem removed from scanner support framework of the package identification and measurement system of the first illustrative embodiment, showing a coordinate reference framework symbolically embedded within the conveyor system and schematically depicted with graphical indications describing the directions of yaw, pitch and roll of each single-scanning disc holographic scanner supported from the scanner support framework of the tunnel scanning subsystem shown in FIGS. 1 and 1A.
Figure 3:
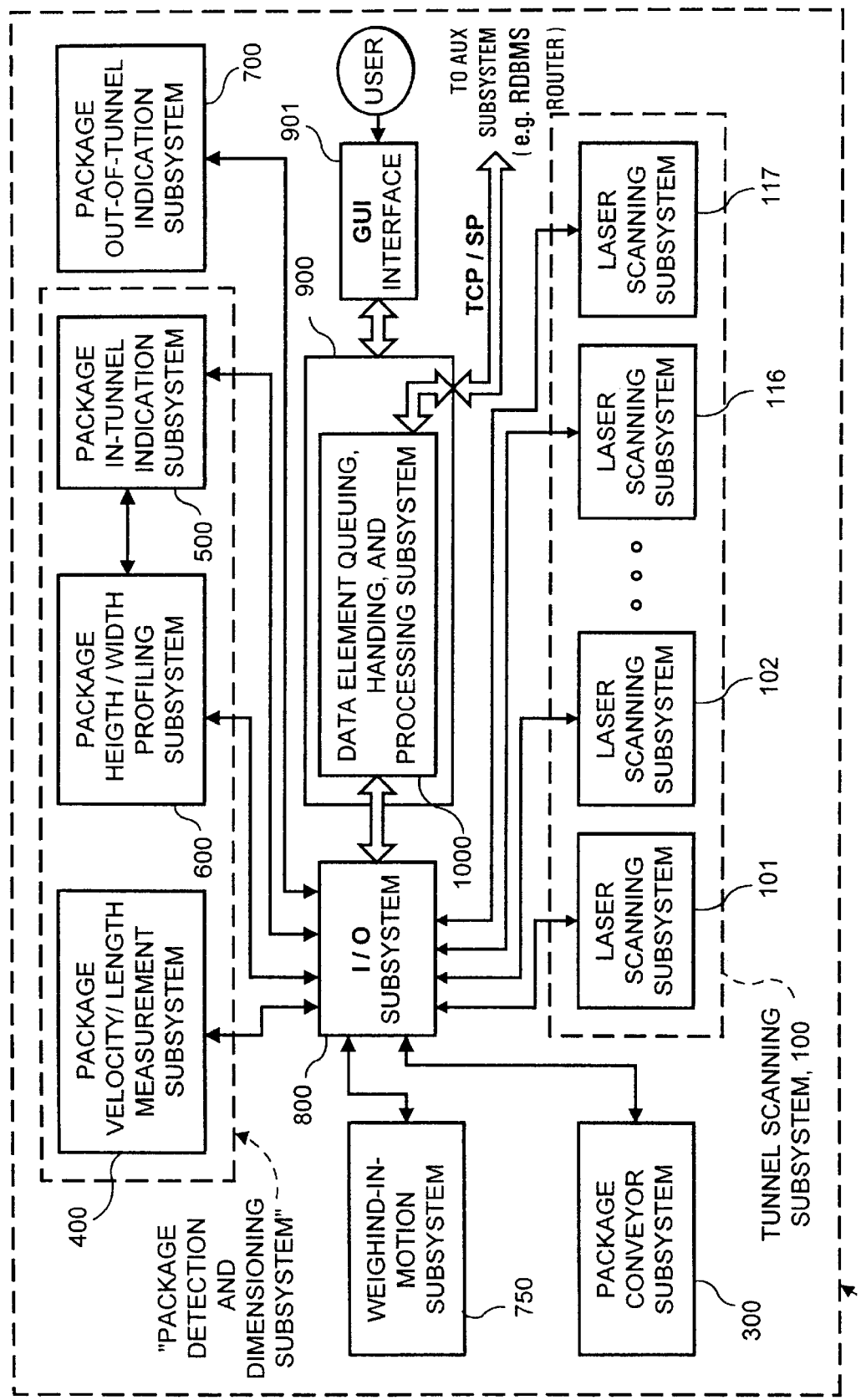
FIG. 3 is a schematic block diagram illustrating that the holographic and fixed-projection laser scanning subsystems, the package dimensioning/measurement subsystem, package velocity and length measurement subsystem, the package-in-tunnel indication subsystem, the package-out-of-tunnel subsystem, the package weighing-in-motion subsystem, the data-element queuing, handling and processing subsystem, the input/output port multiplexing subsystem, and the conveyor belt subsystem integrated together within the automated tunnel-type package identification and measurement system of the first illustrative embodiment of the present invention.
Figure 30:
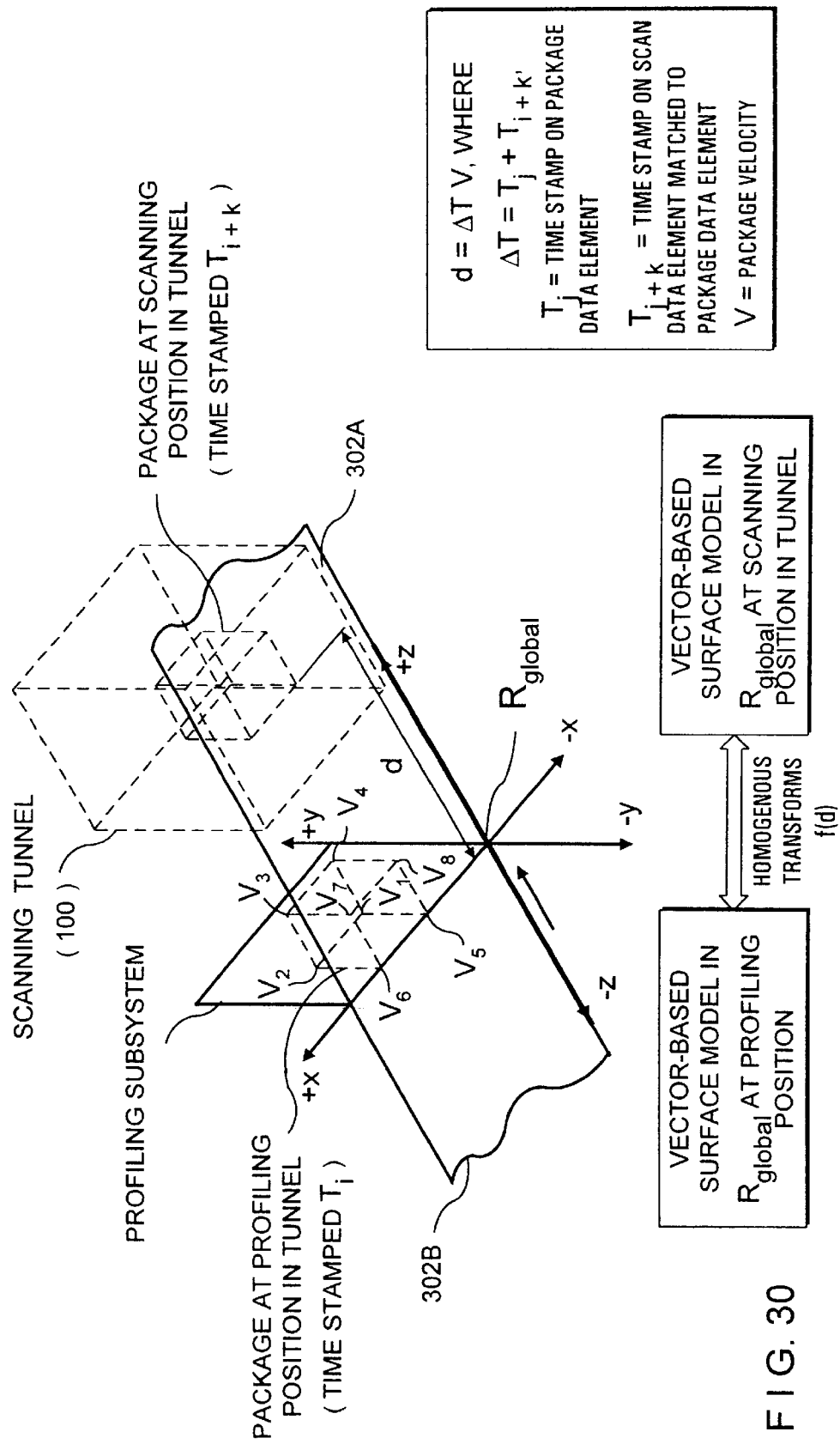
Figure 31A:
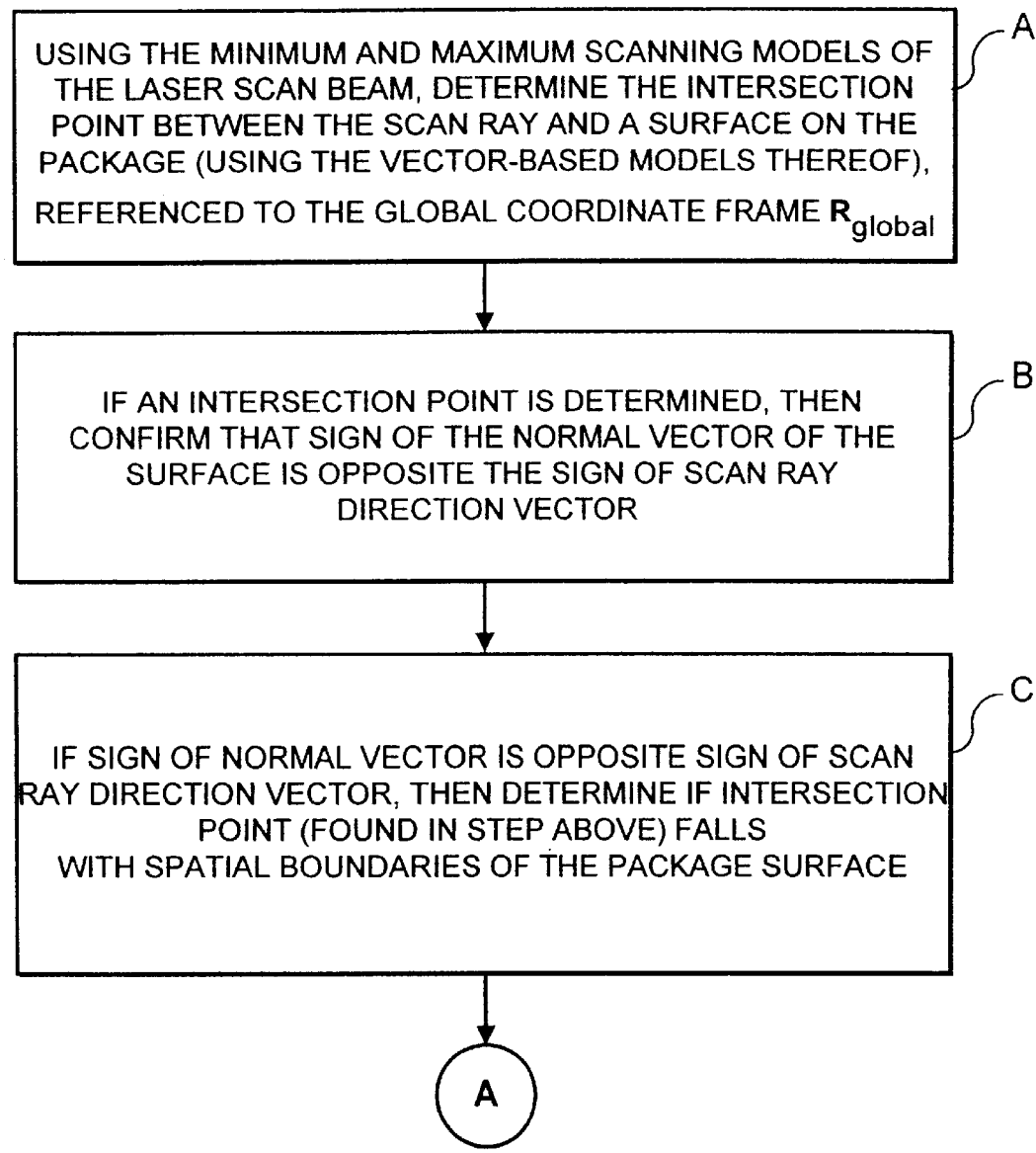
Figure 31B:
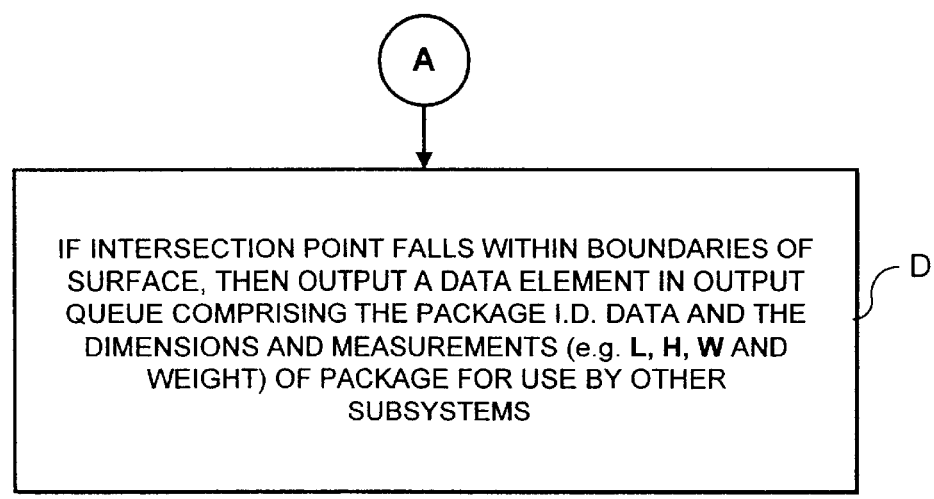
Figure 32B:
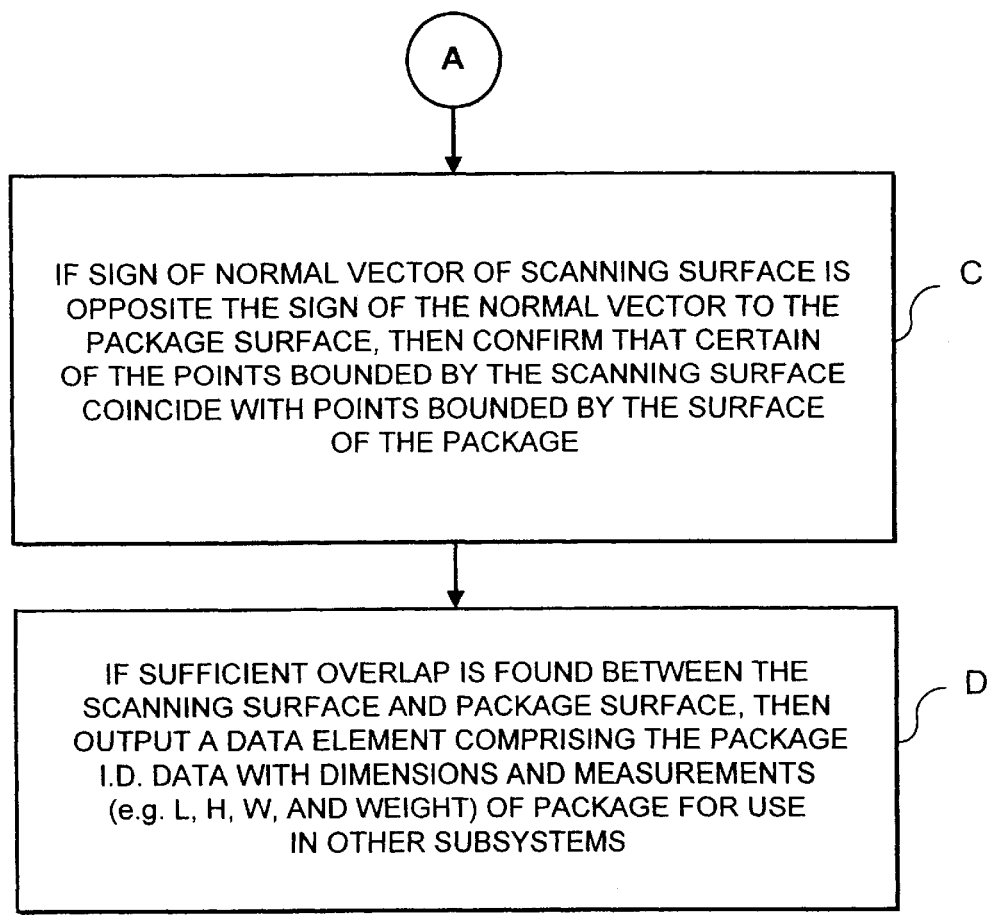
Figure 33:
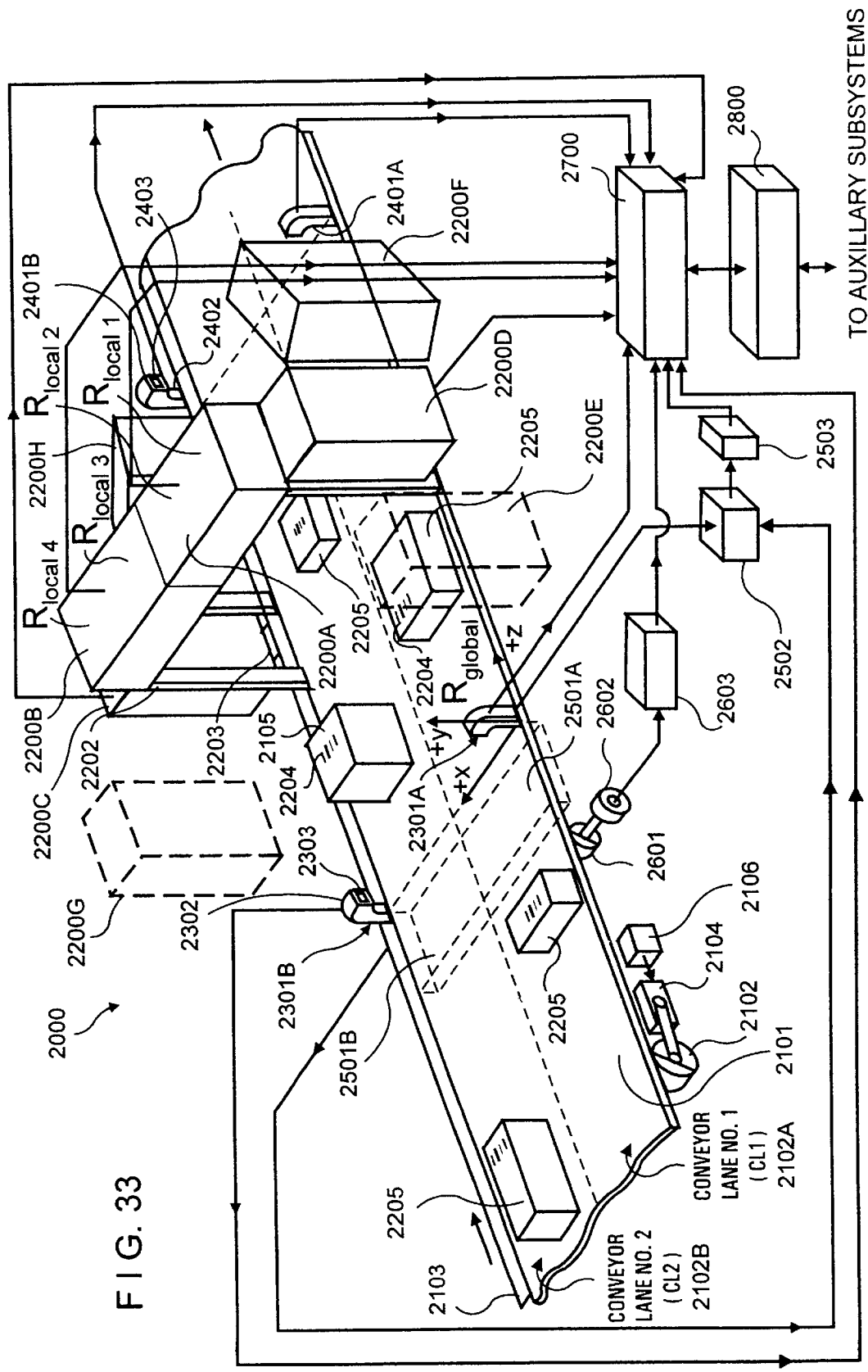
Figure 33A:
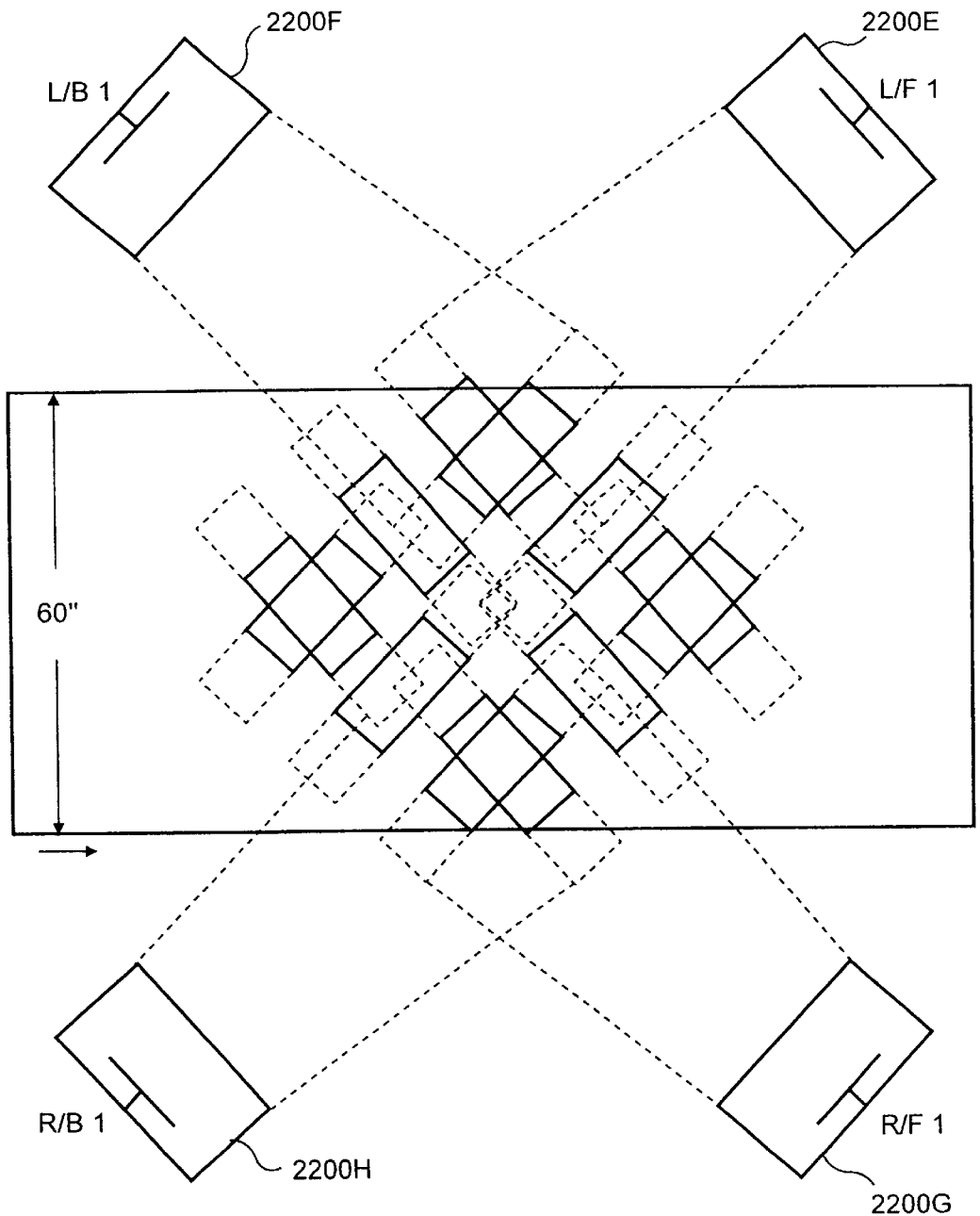
Figure 34:
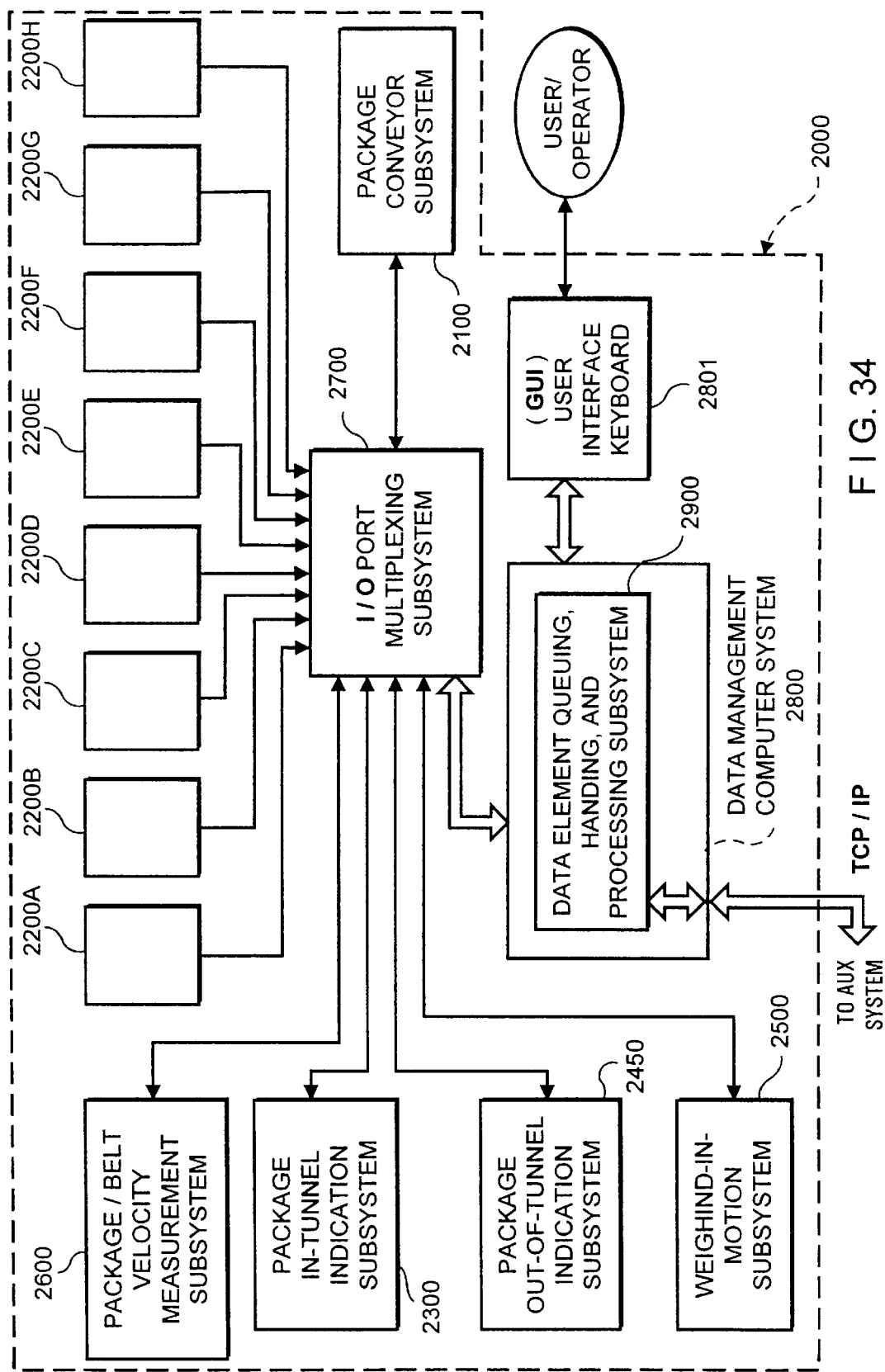
Figure 35A:
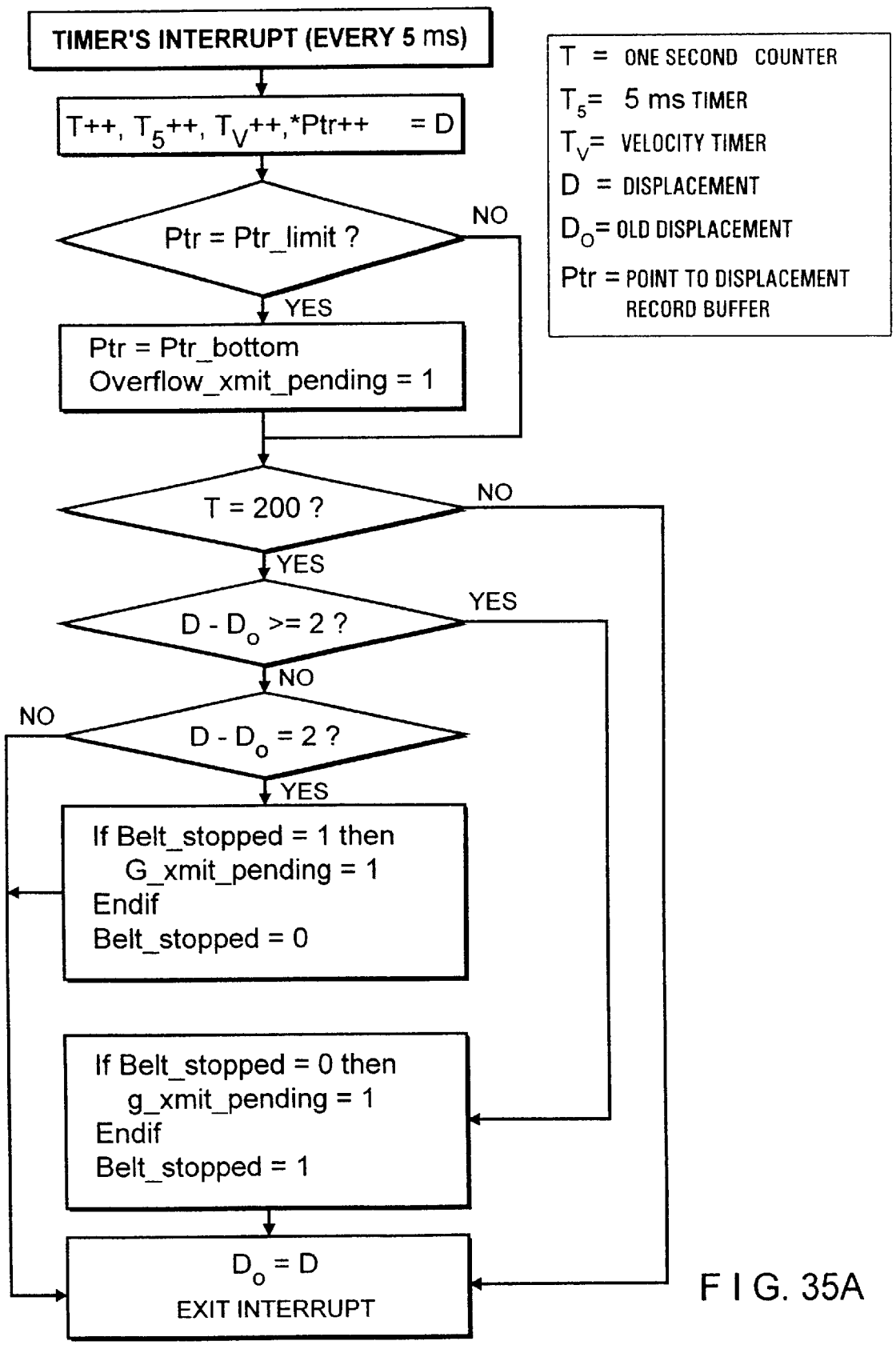
Figure 35B:
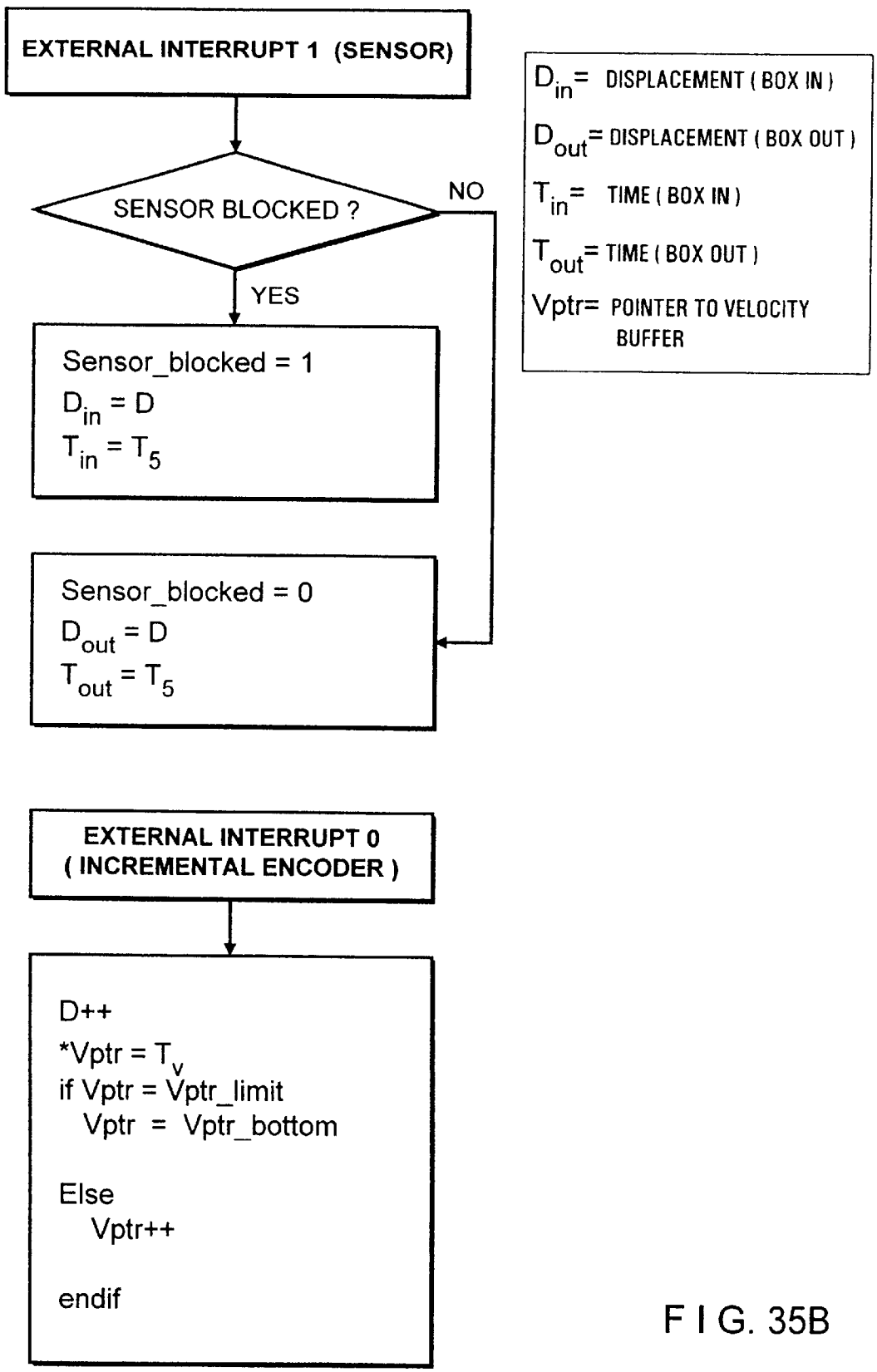
Figure 35C:
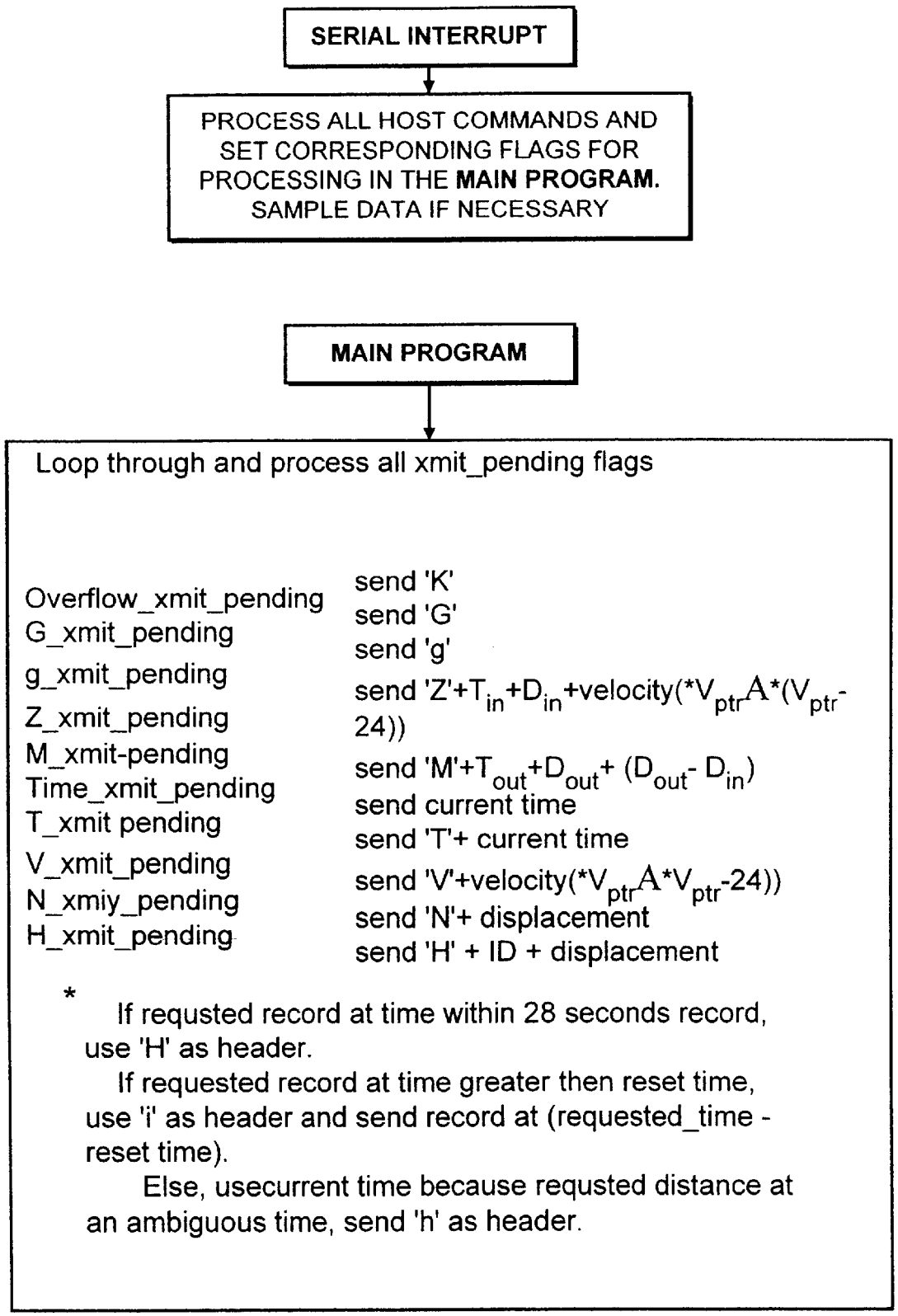
Figure 36A:
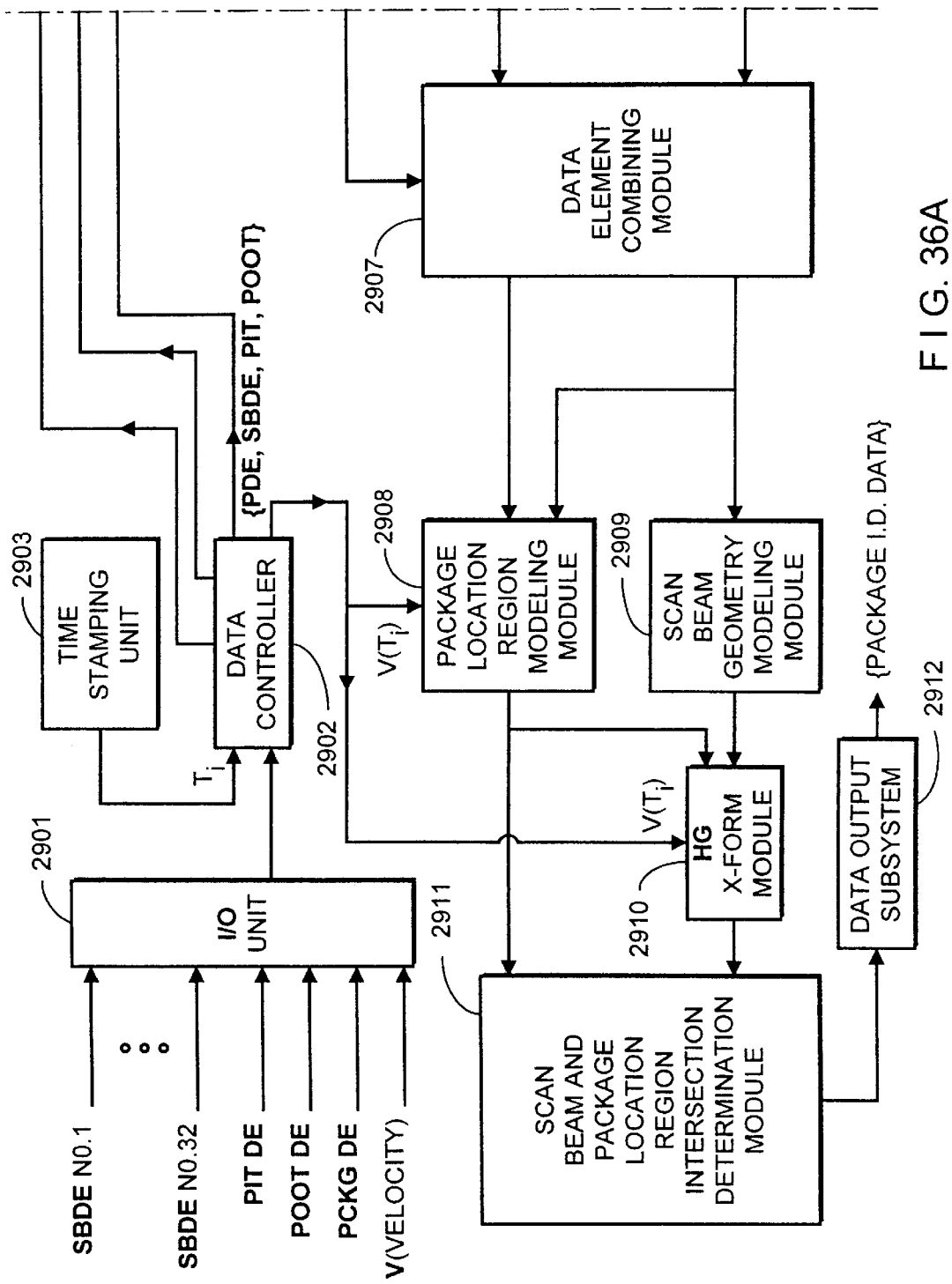
Figure 36B:
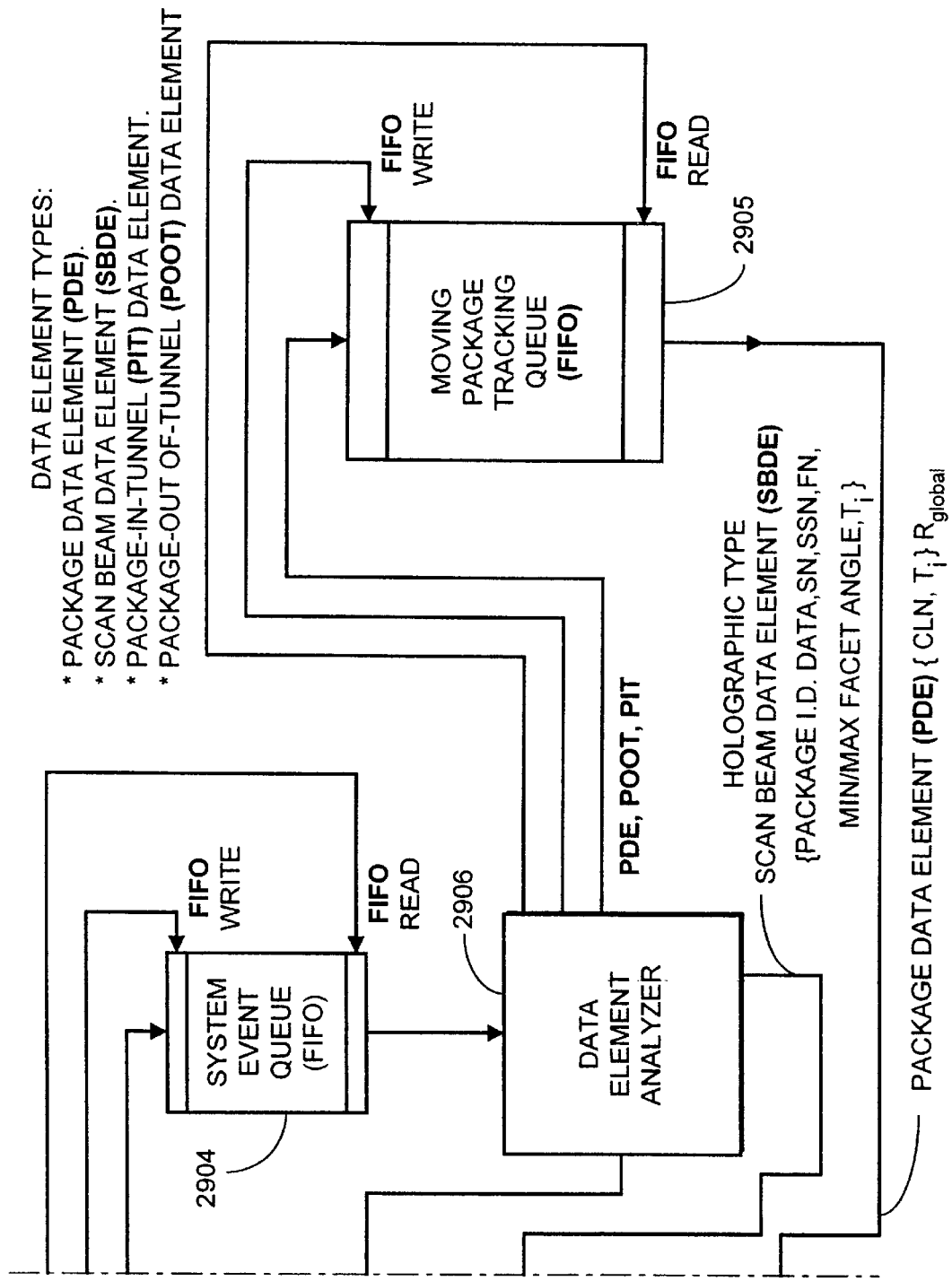
Figure 38:
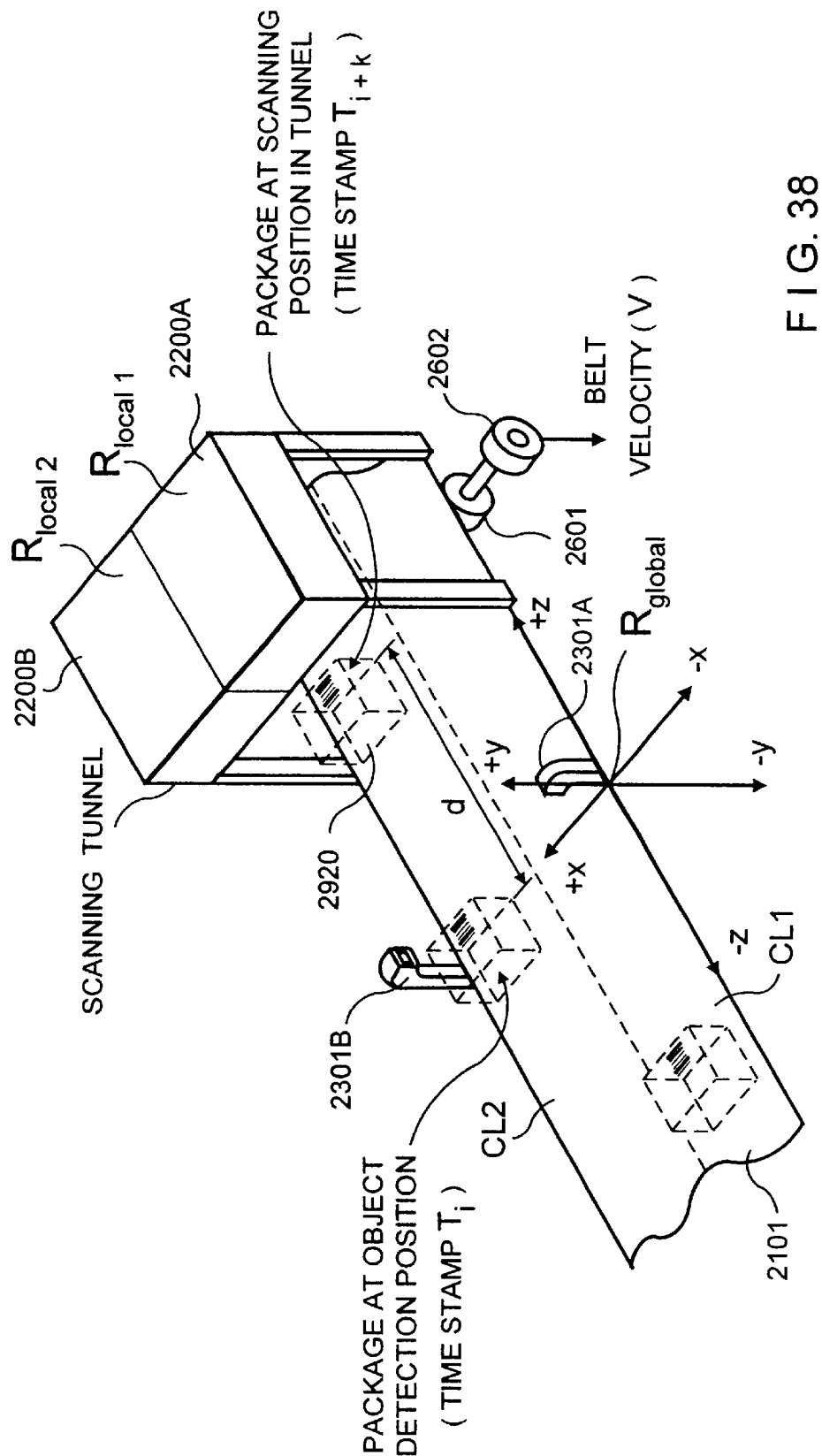
Figure 39A:
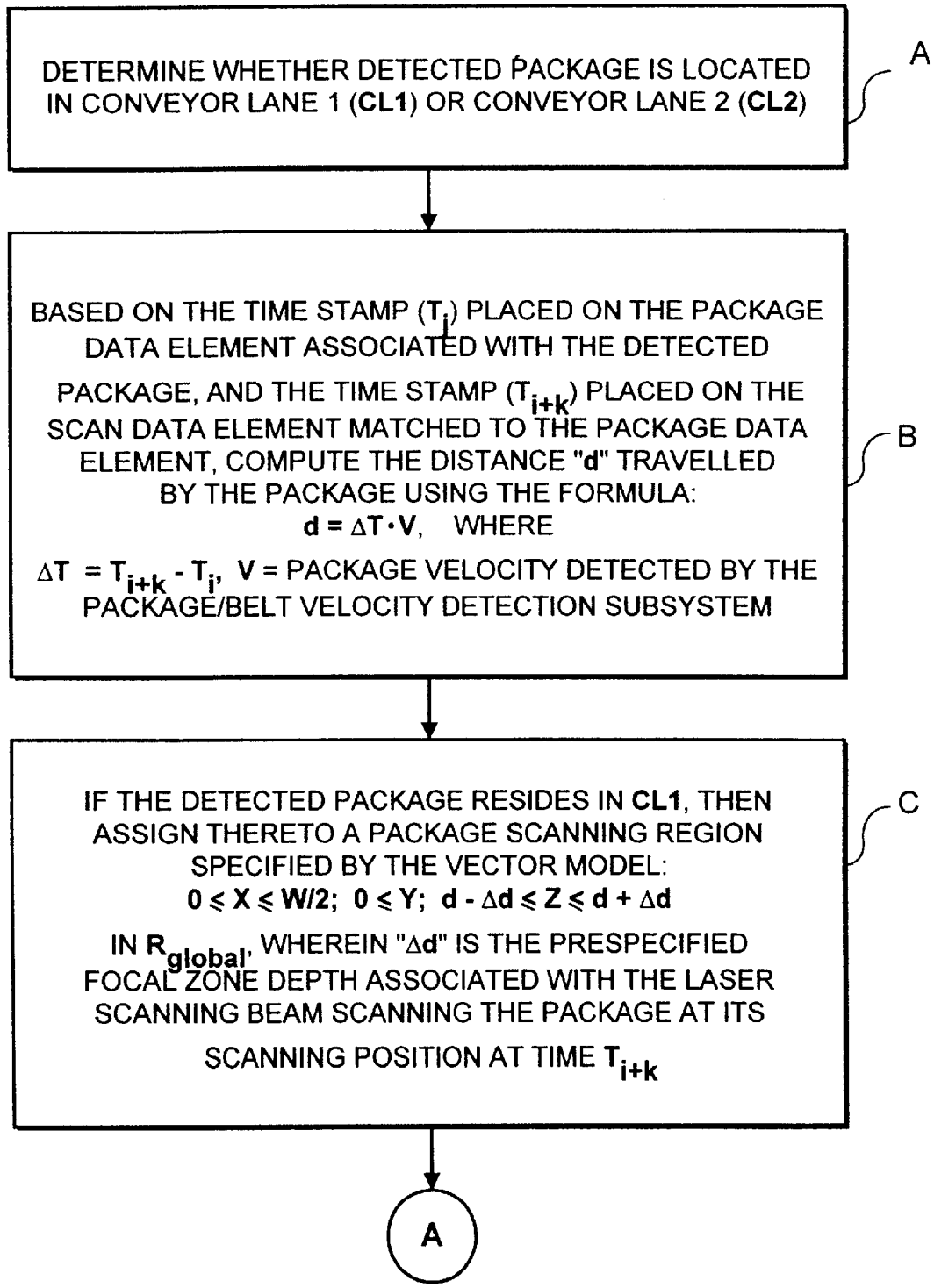
Figure 41:
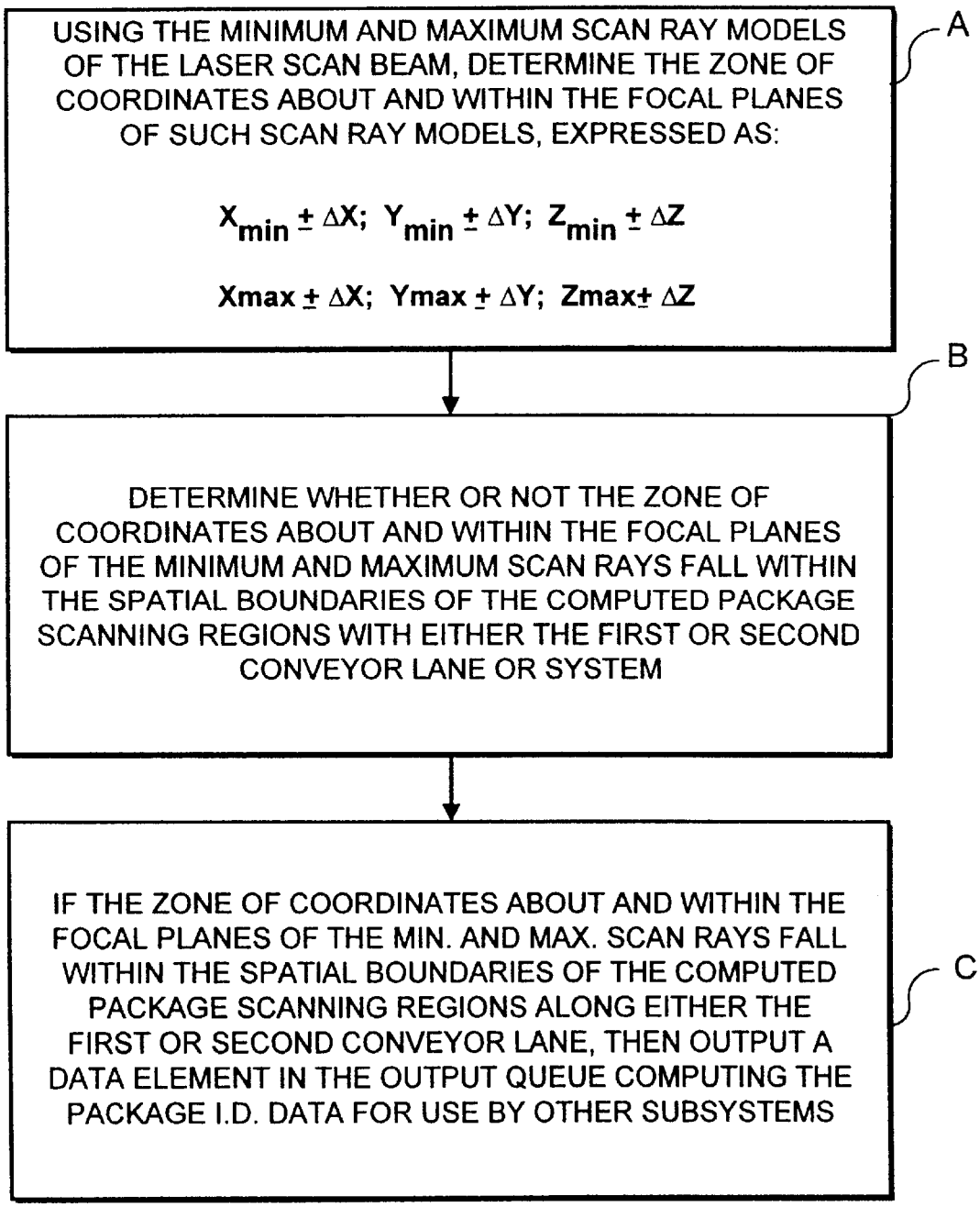
Figure 42:
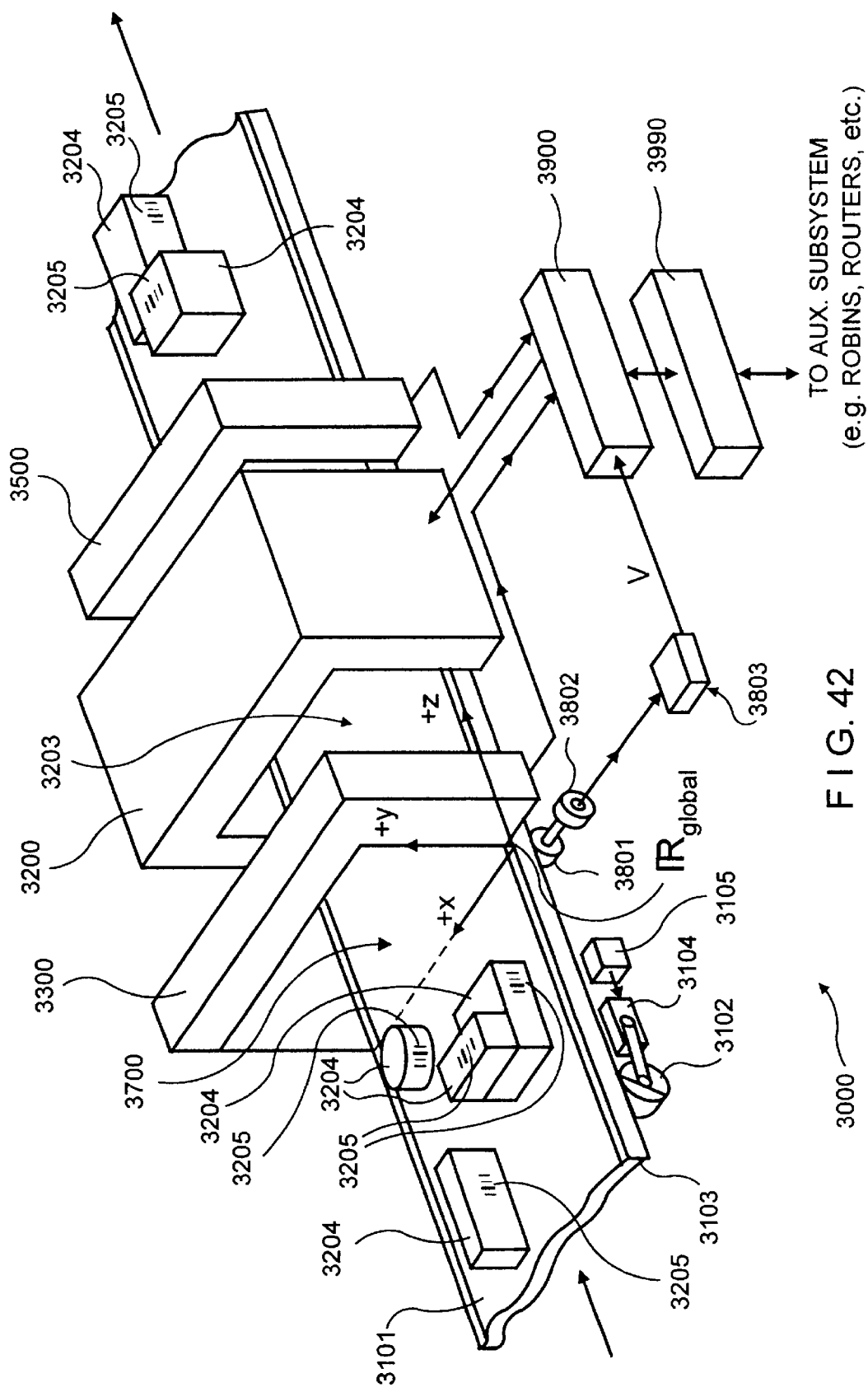
Figure 43:
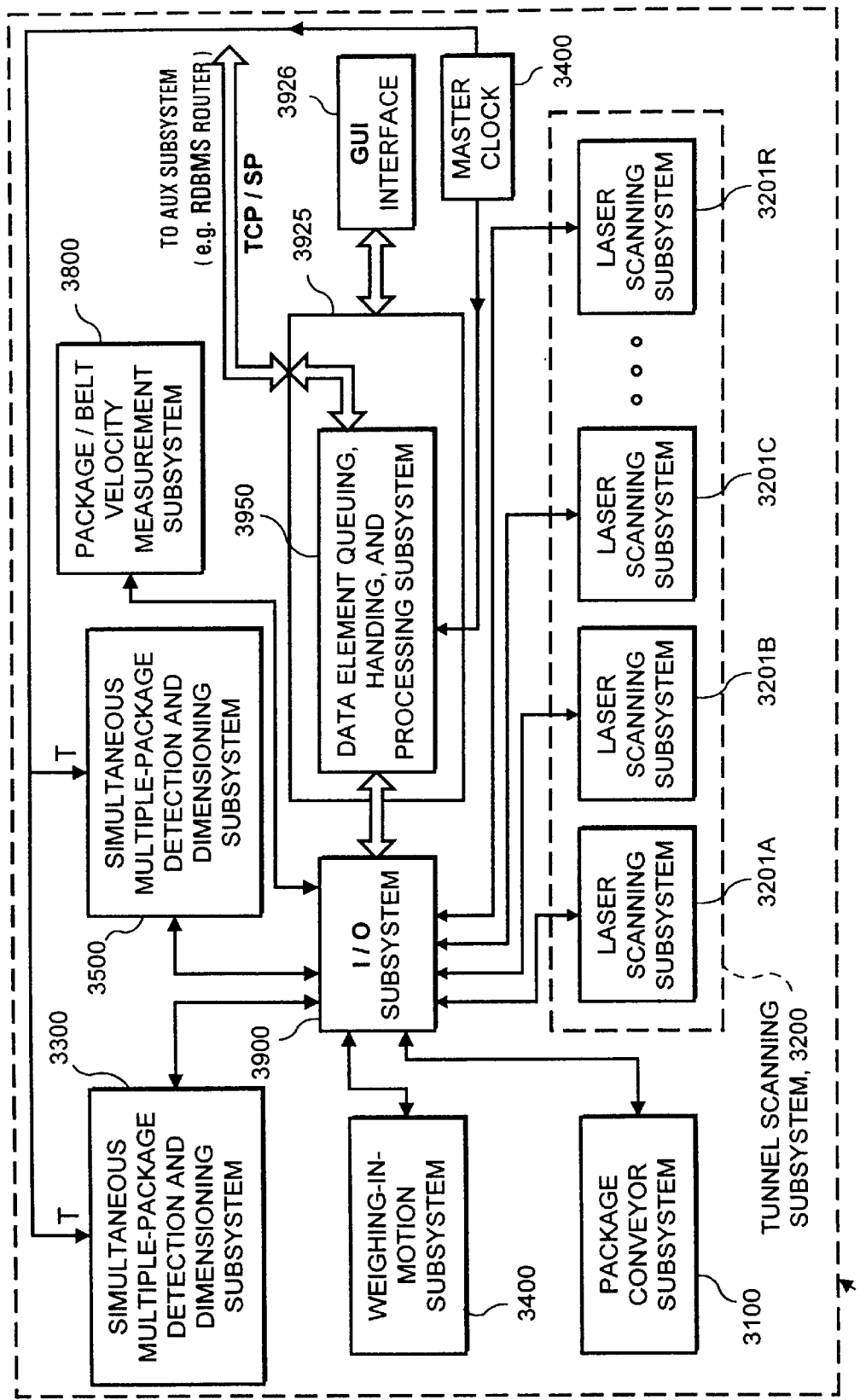
Figure 44:
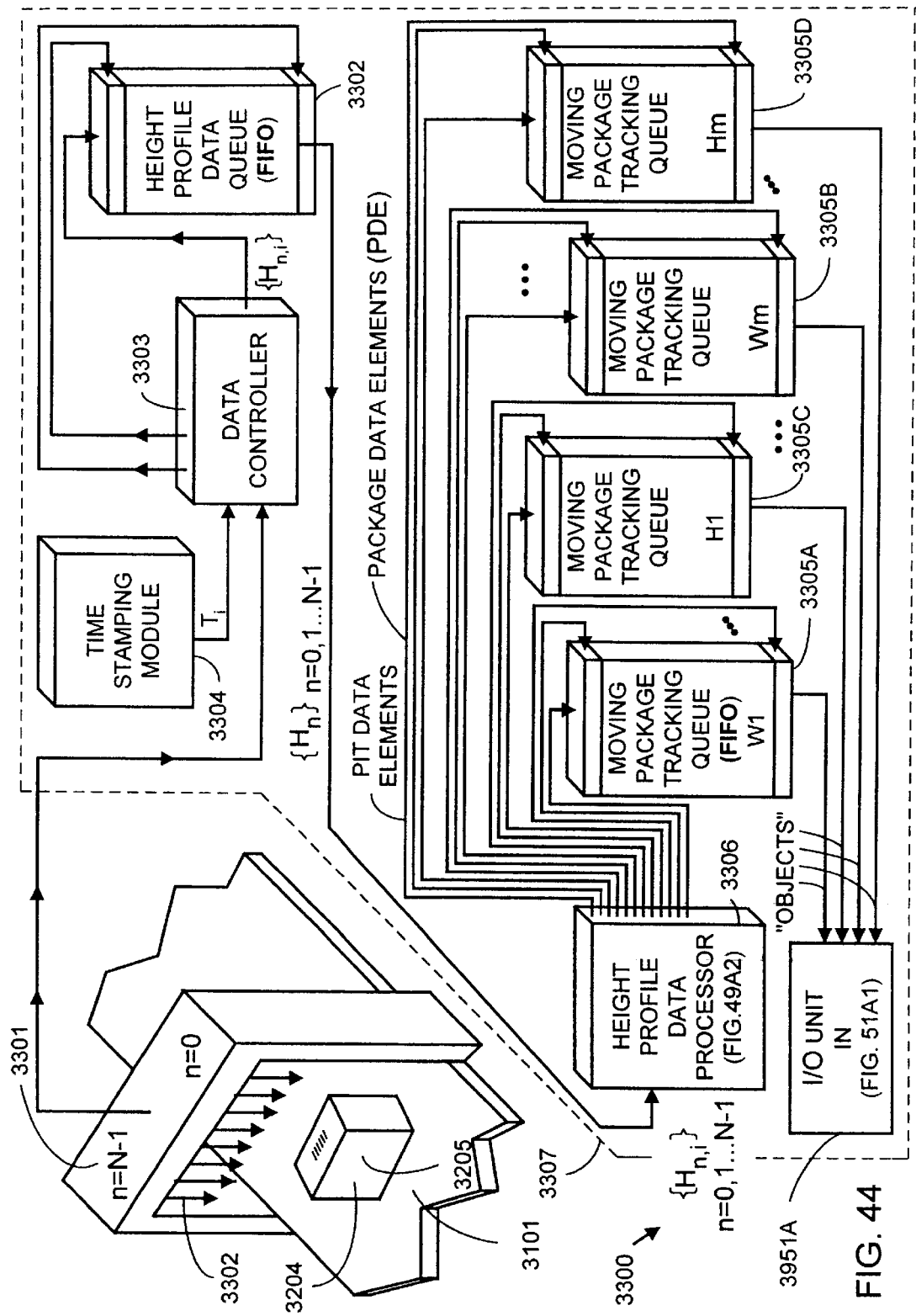
Figure 44A:
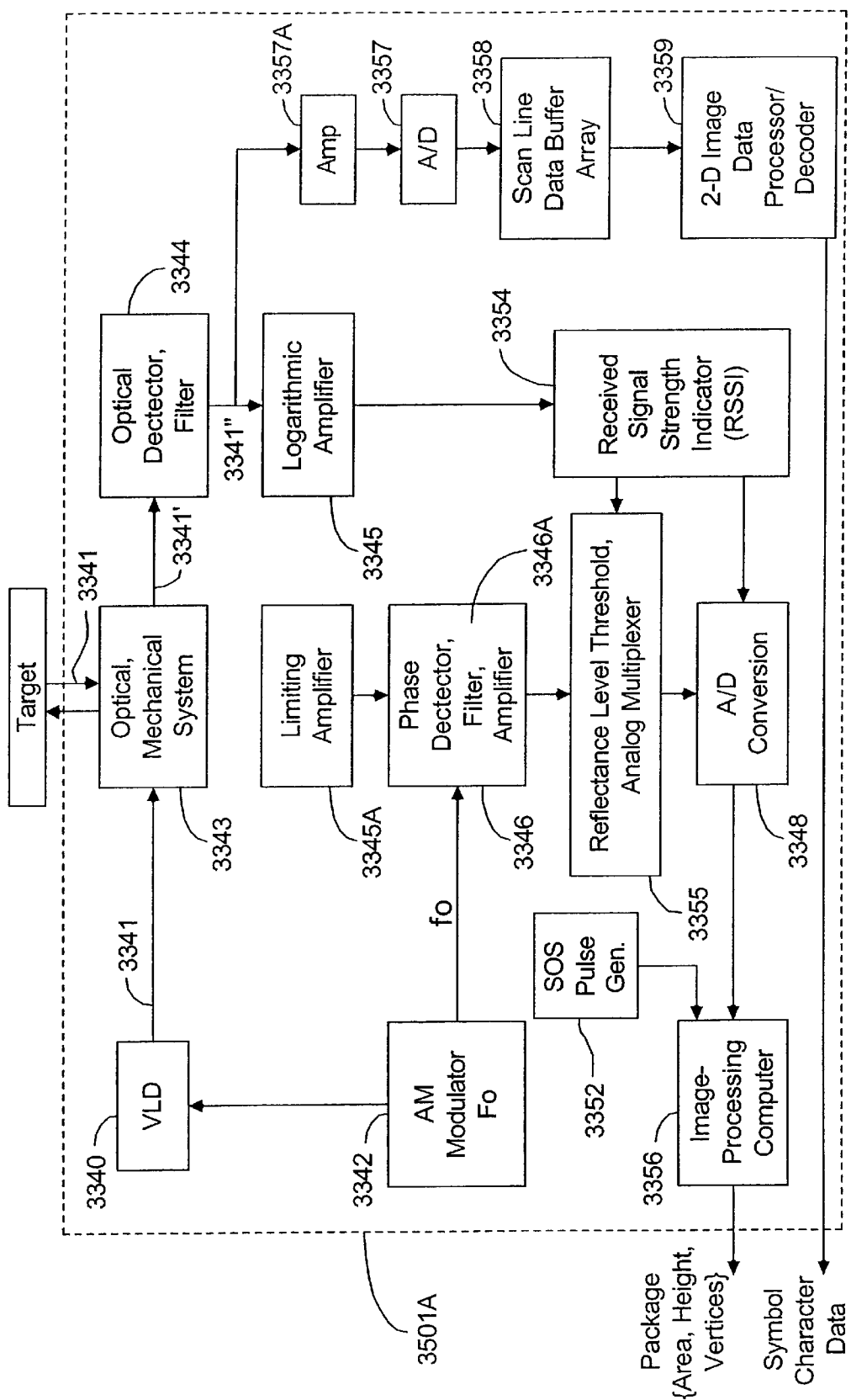
Figure 44B:
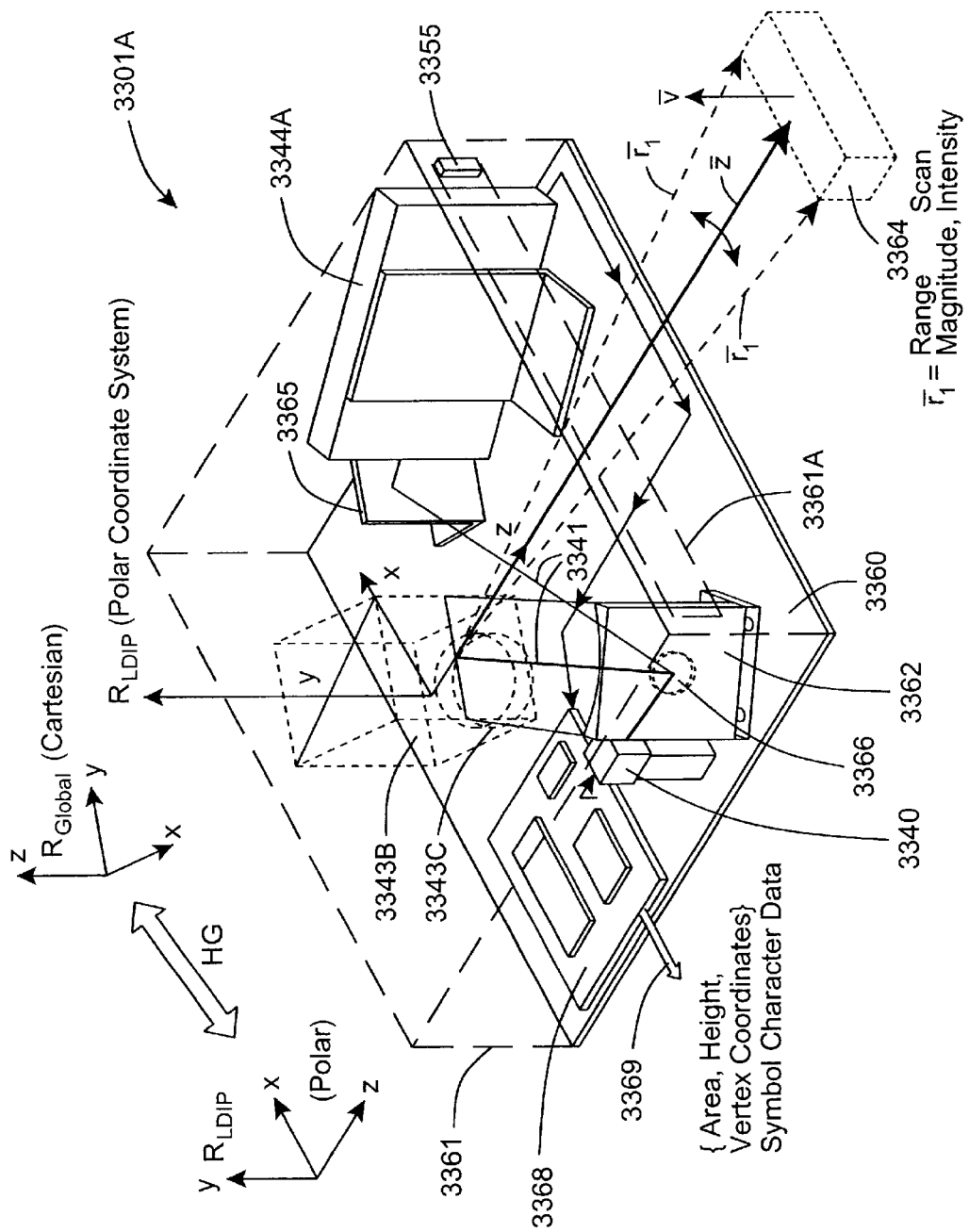
Figure 44C:
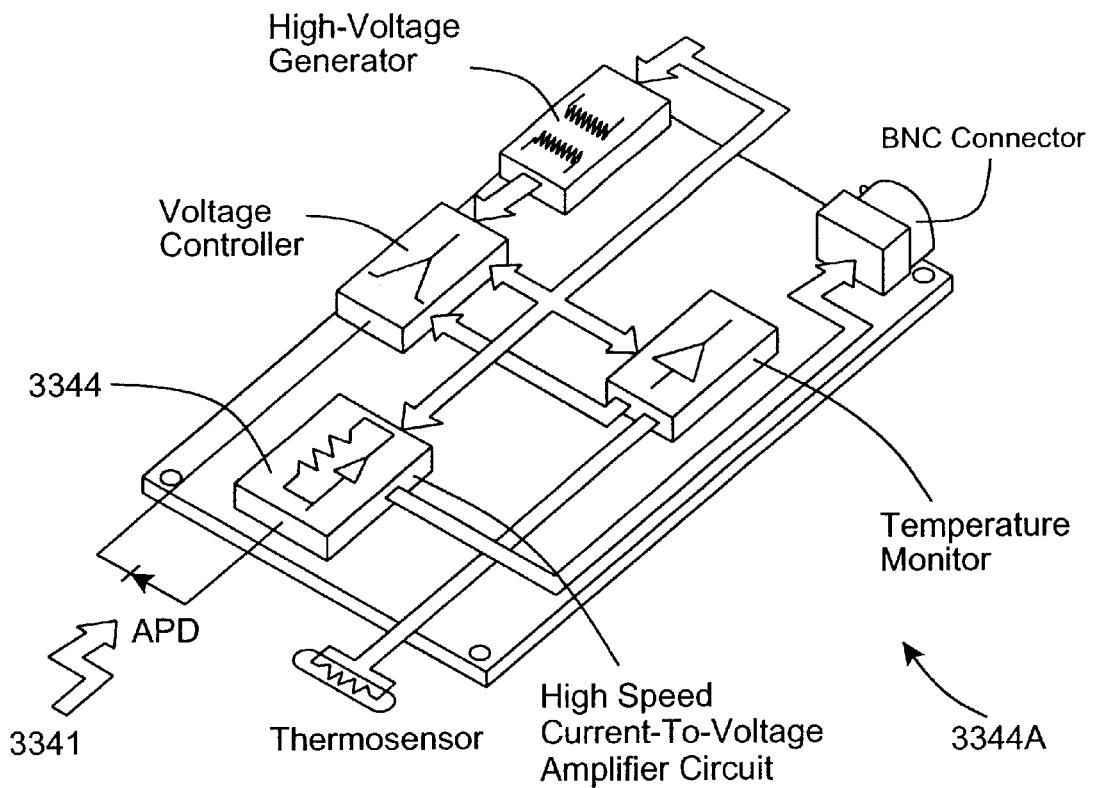
Figure 44D:
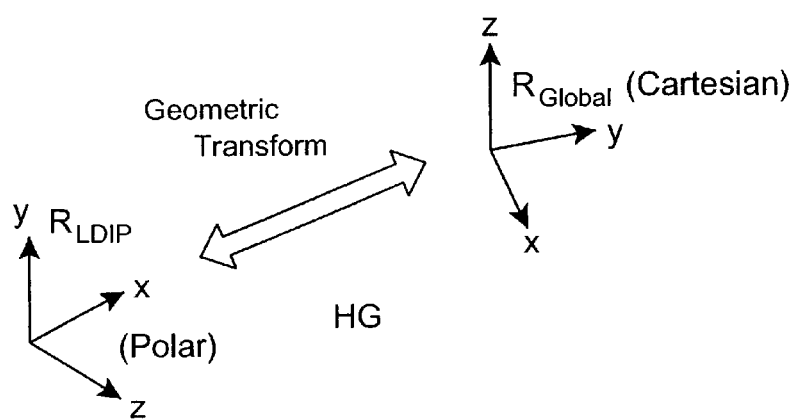
Figure 44F:
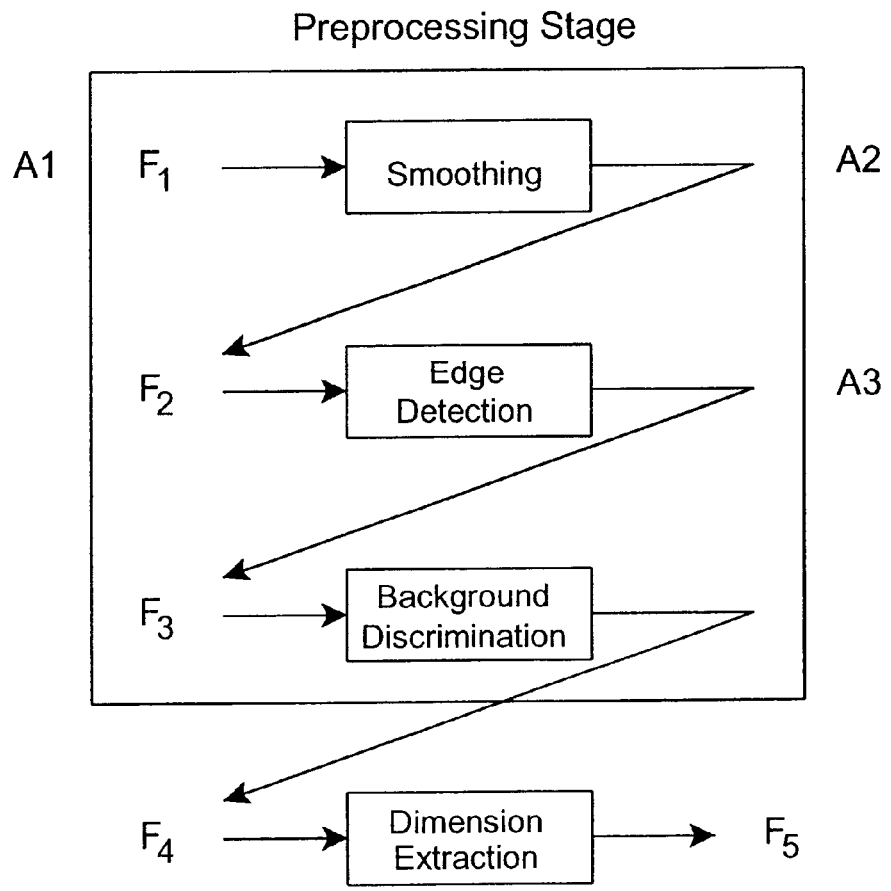
Figure 44G:
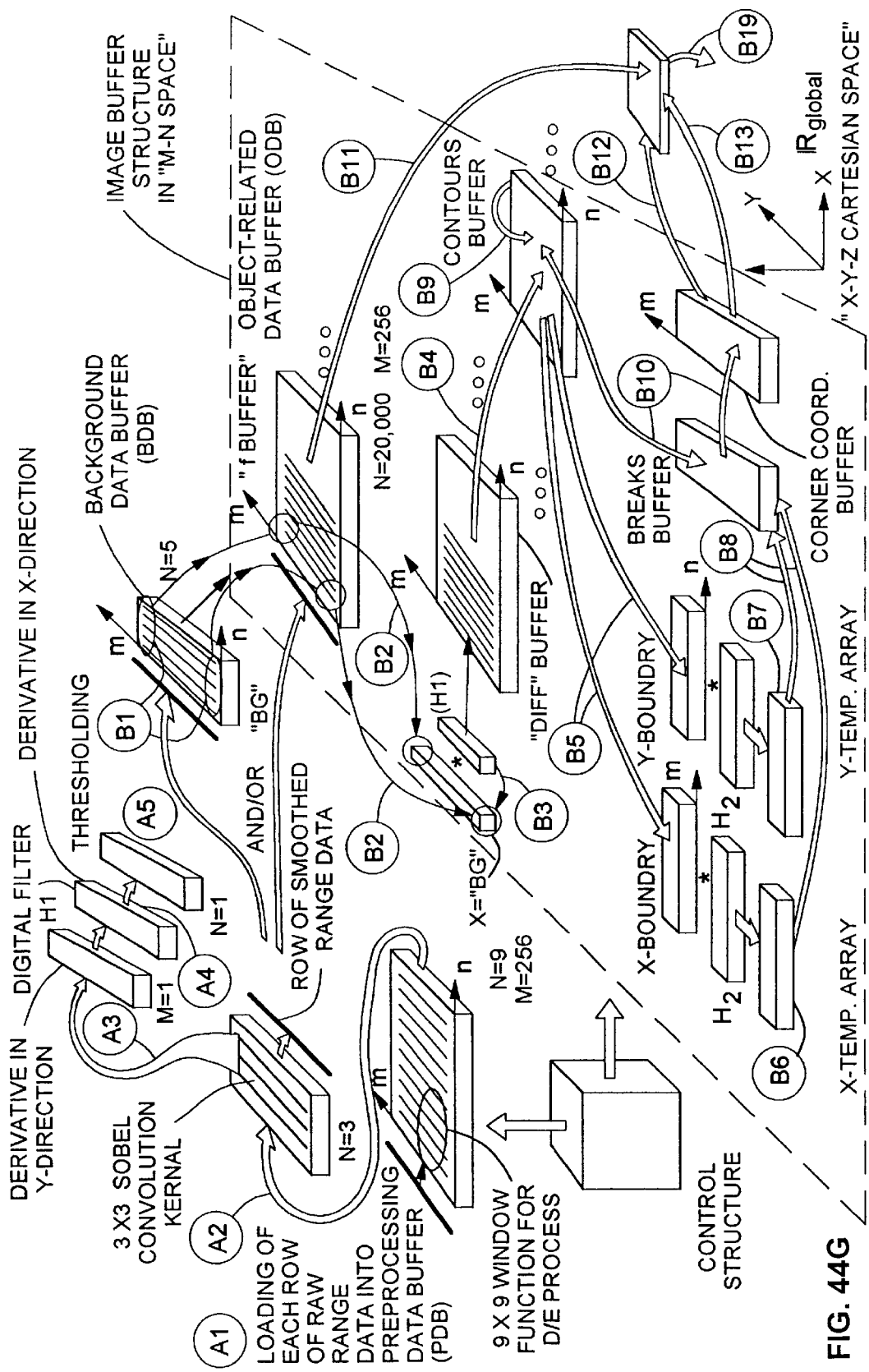
Figure 44J:
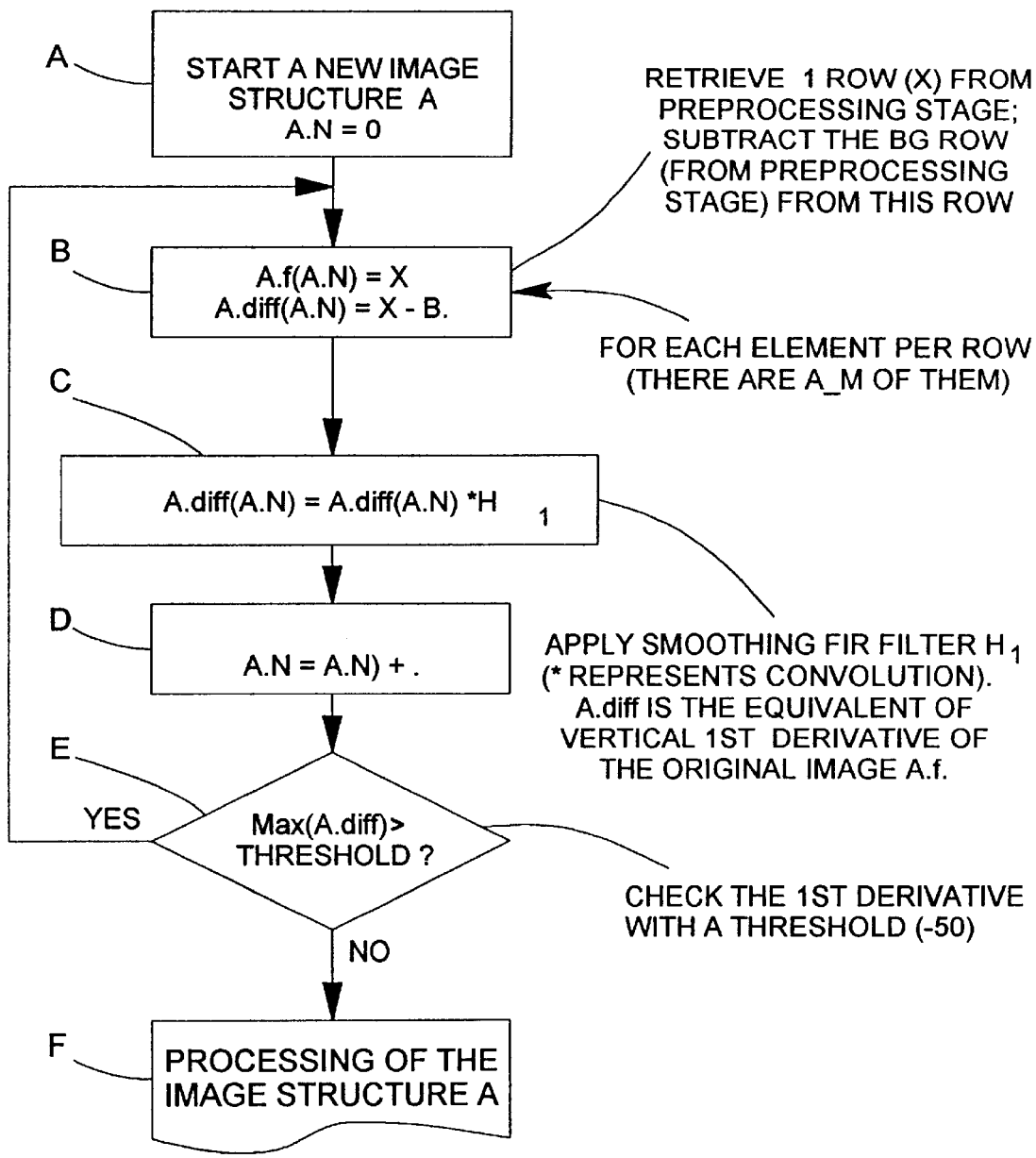
Figure 44K:
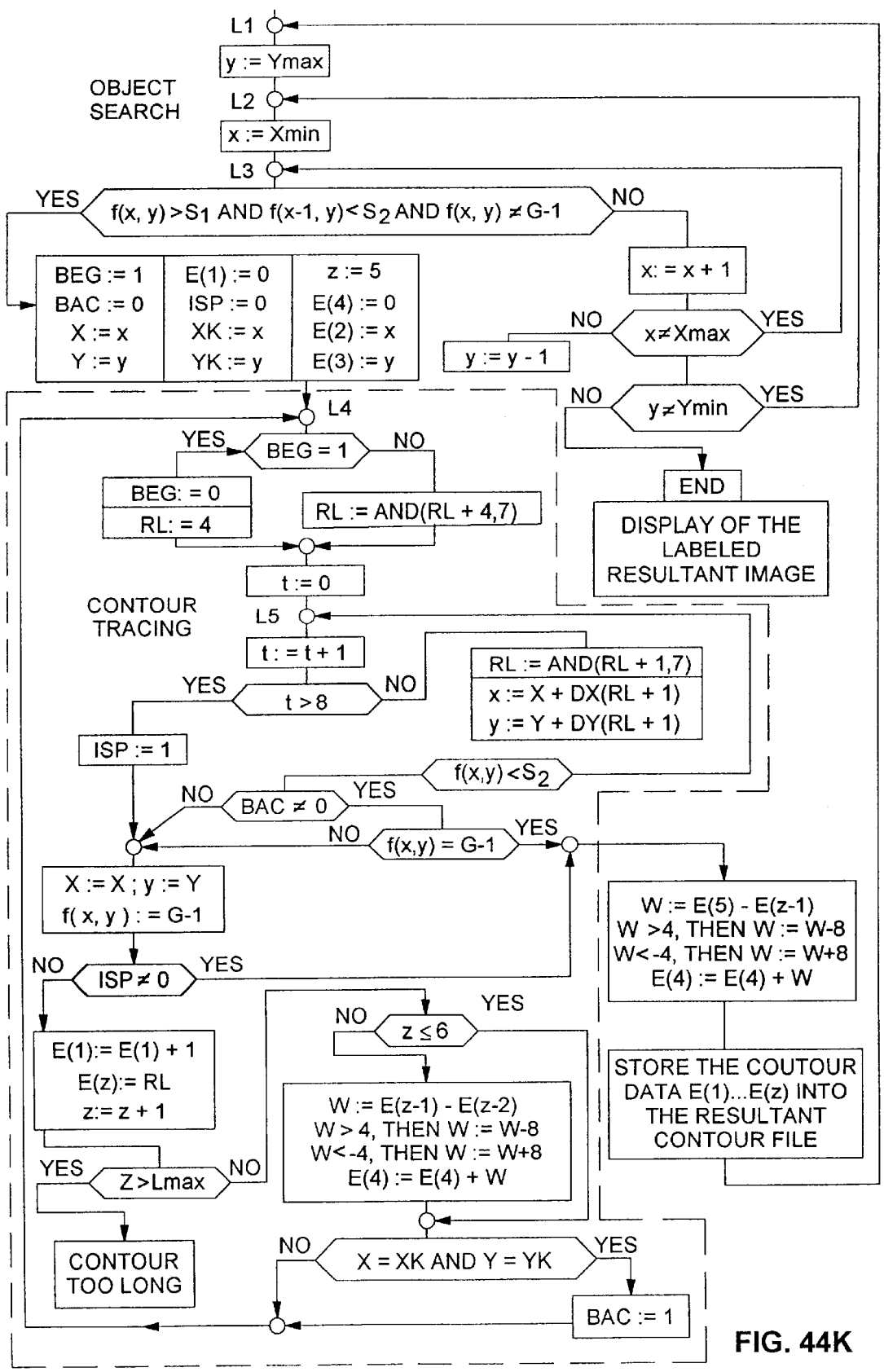
Figure 44L:
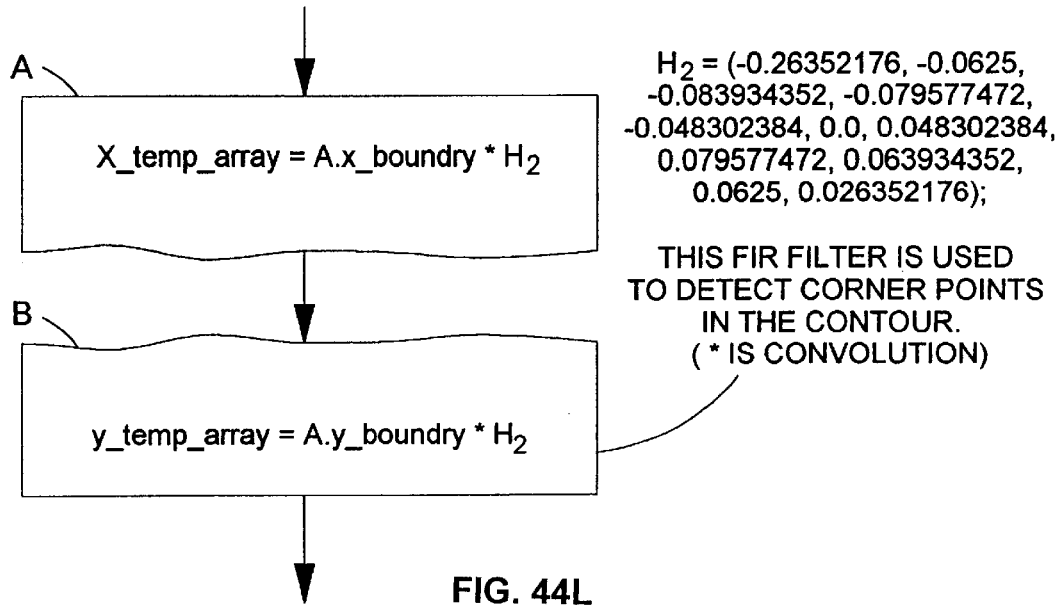
Figure 44M:
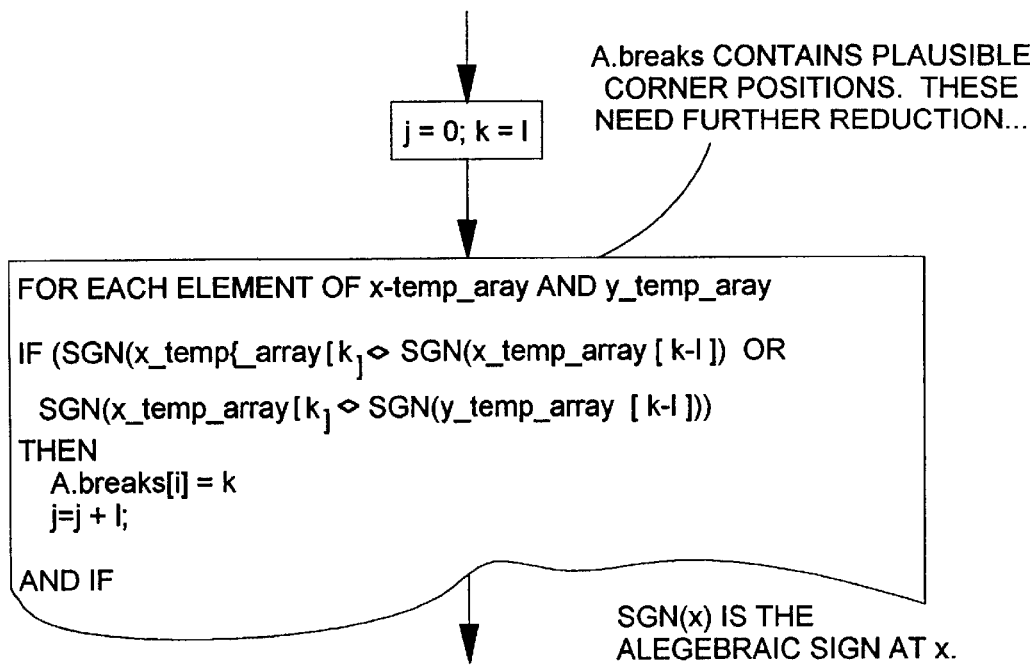
Figure 44N:
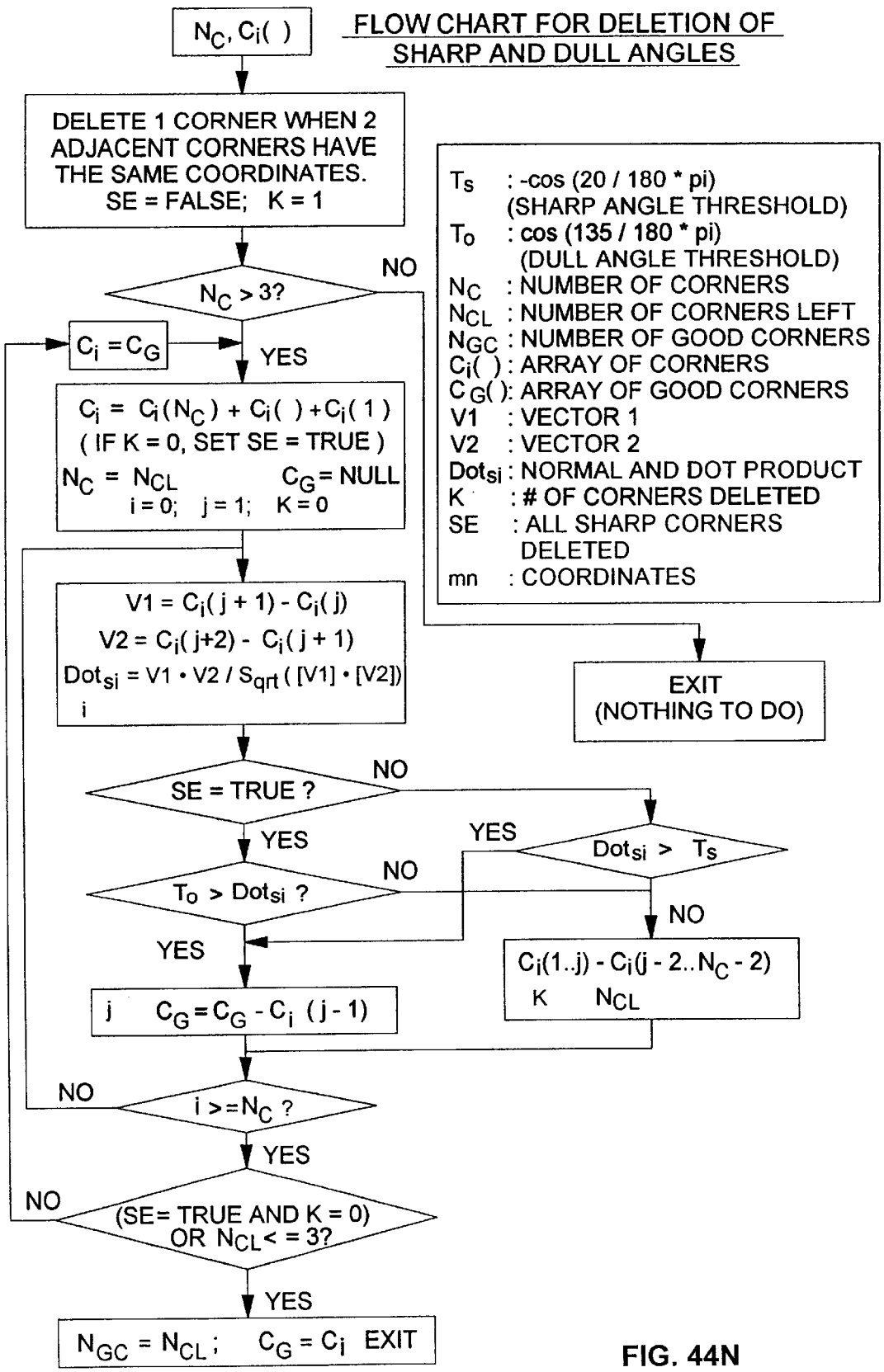
Figure 44P:
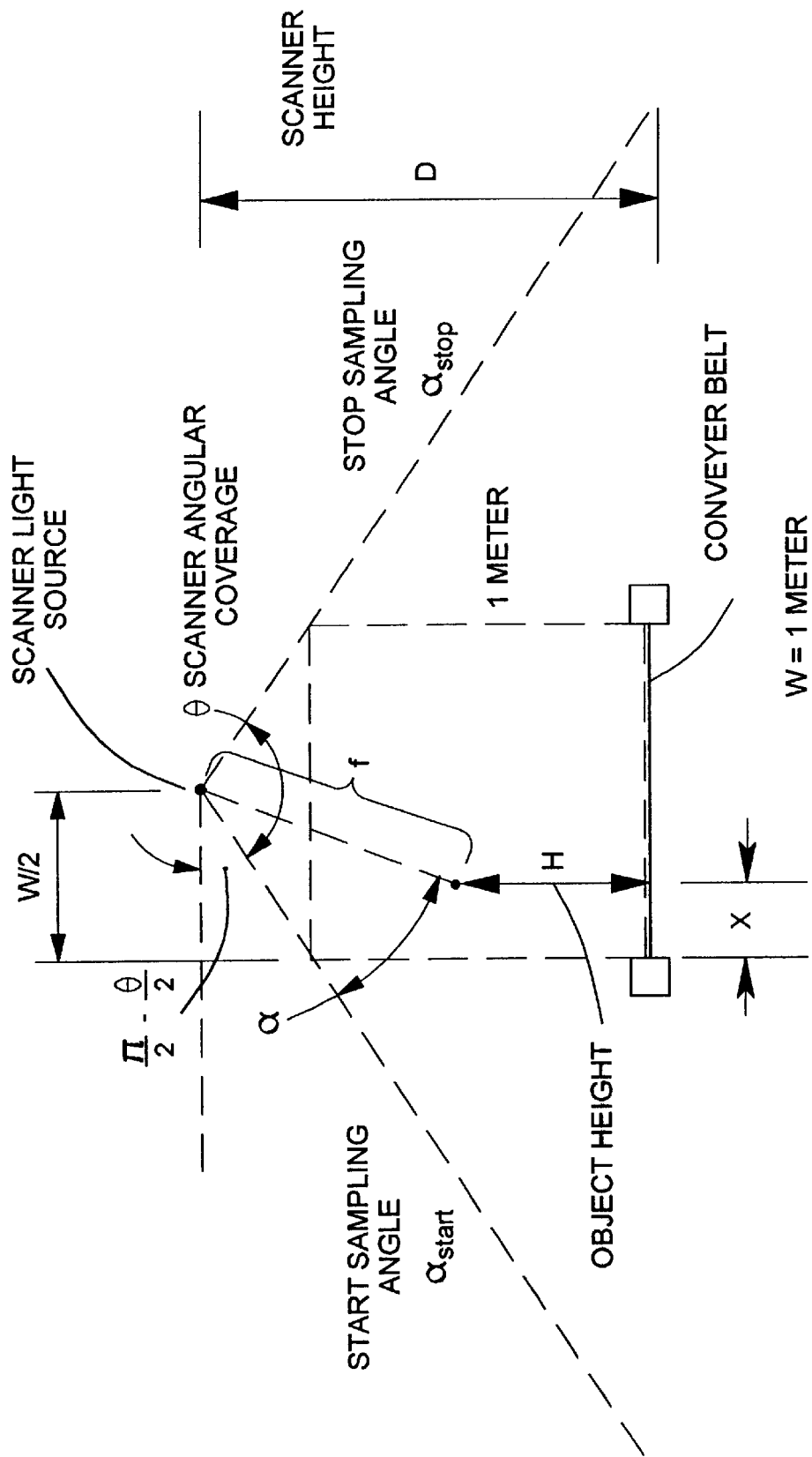
Figure 44Q:
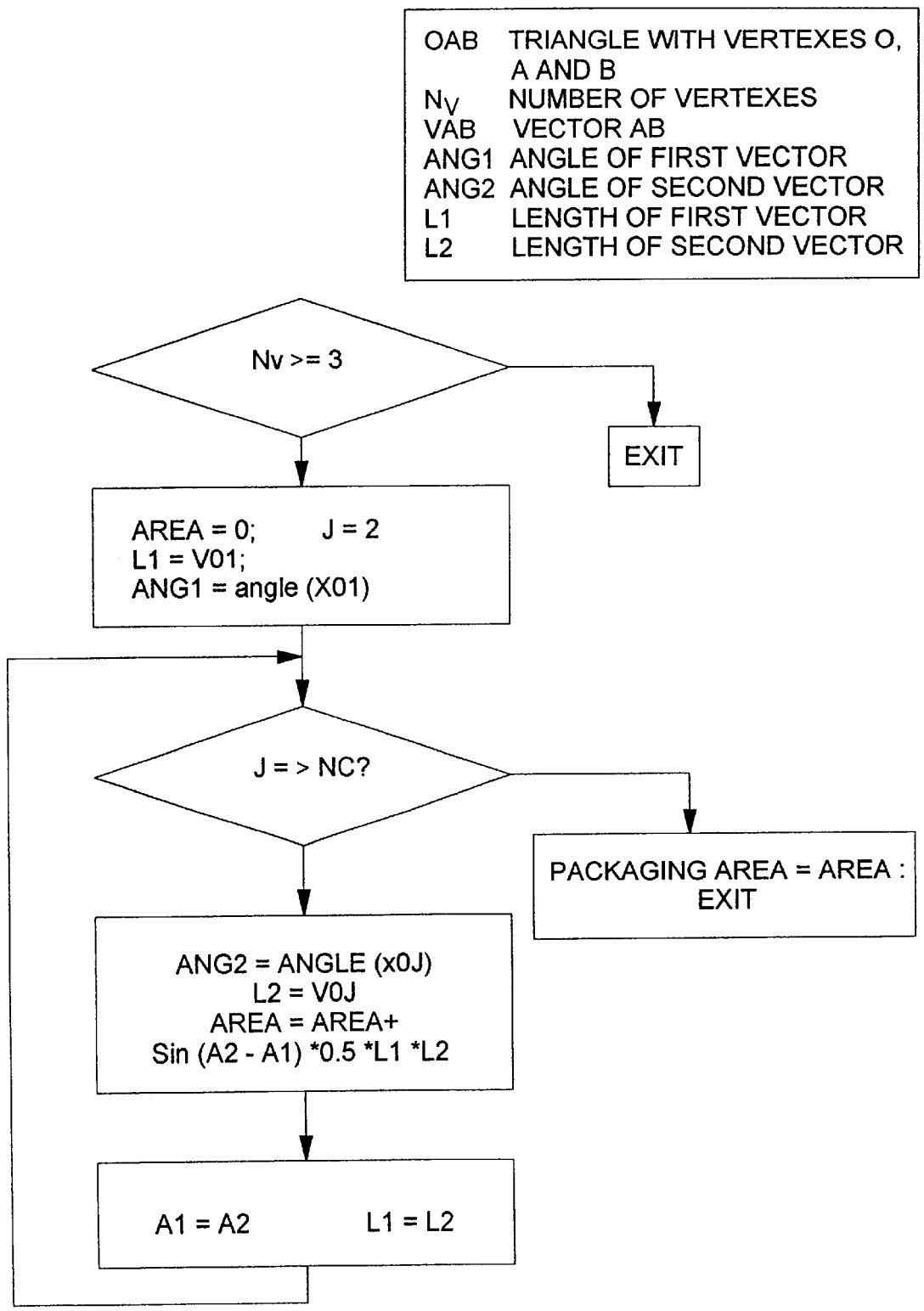
Figure 45A:
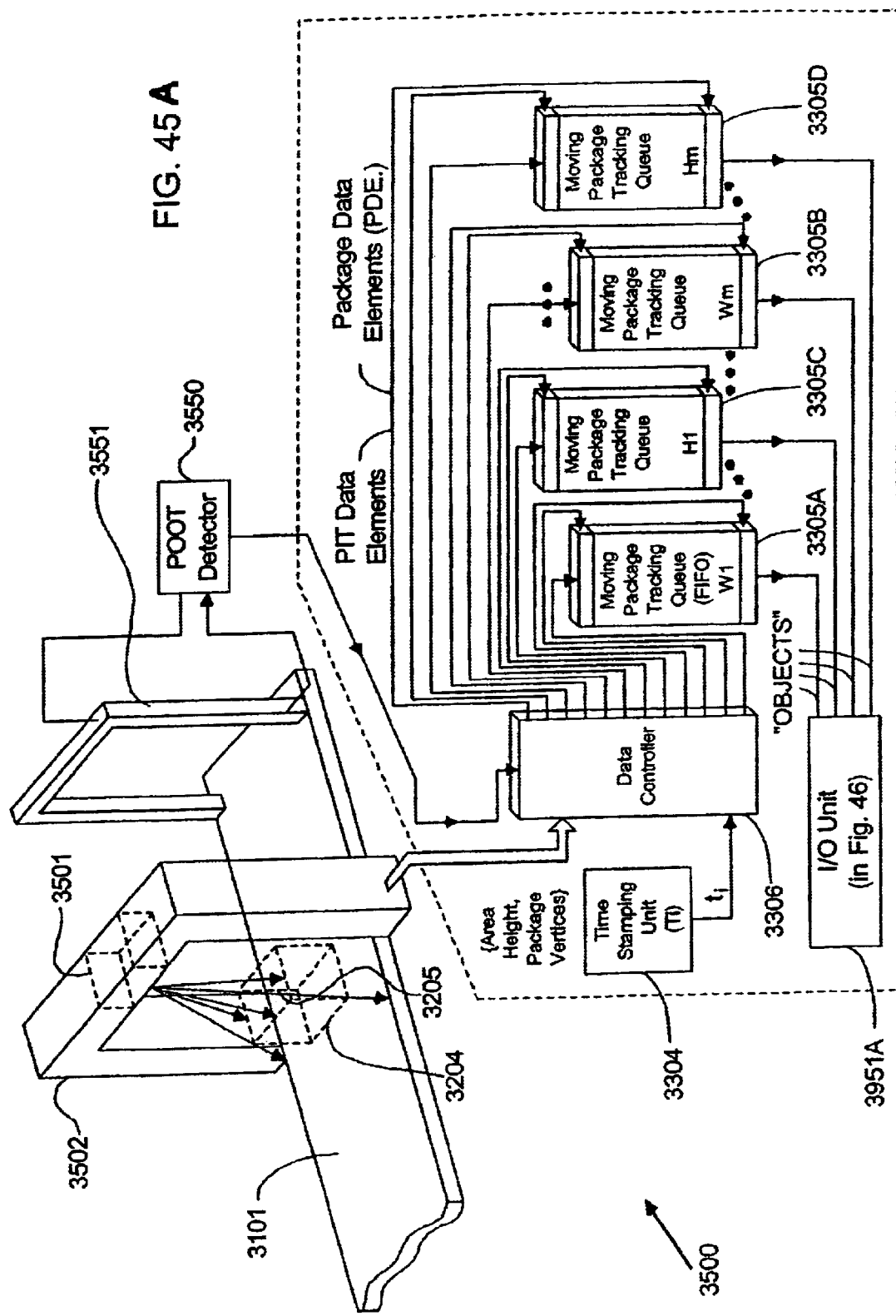
Figure 45B:
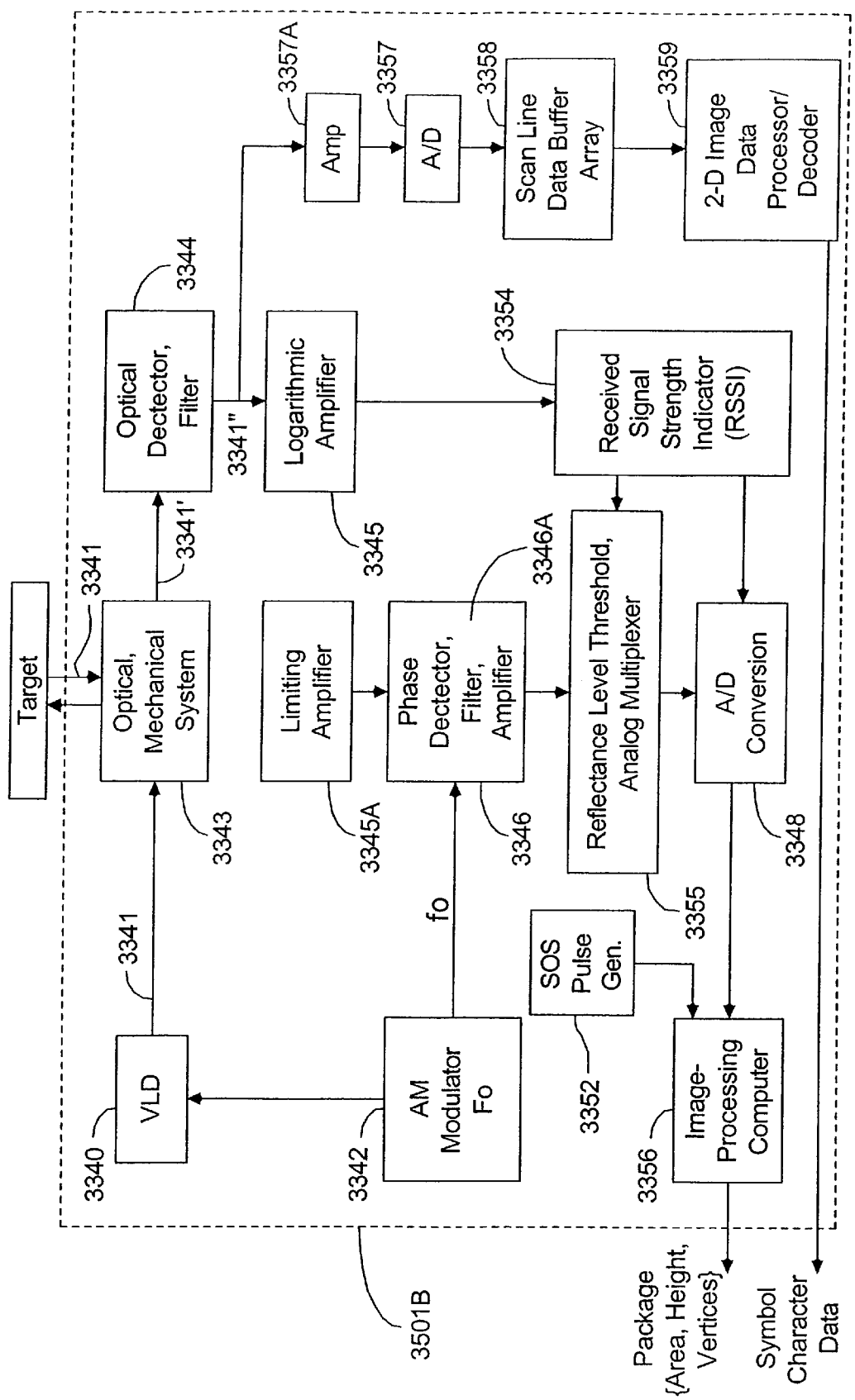
Figure 46B:
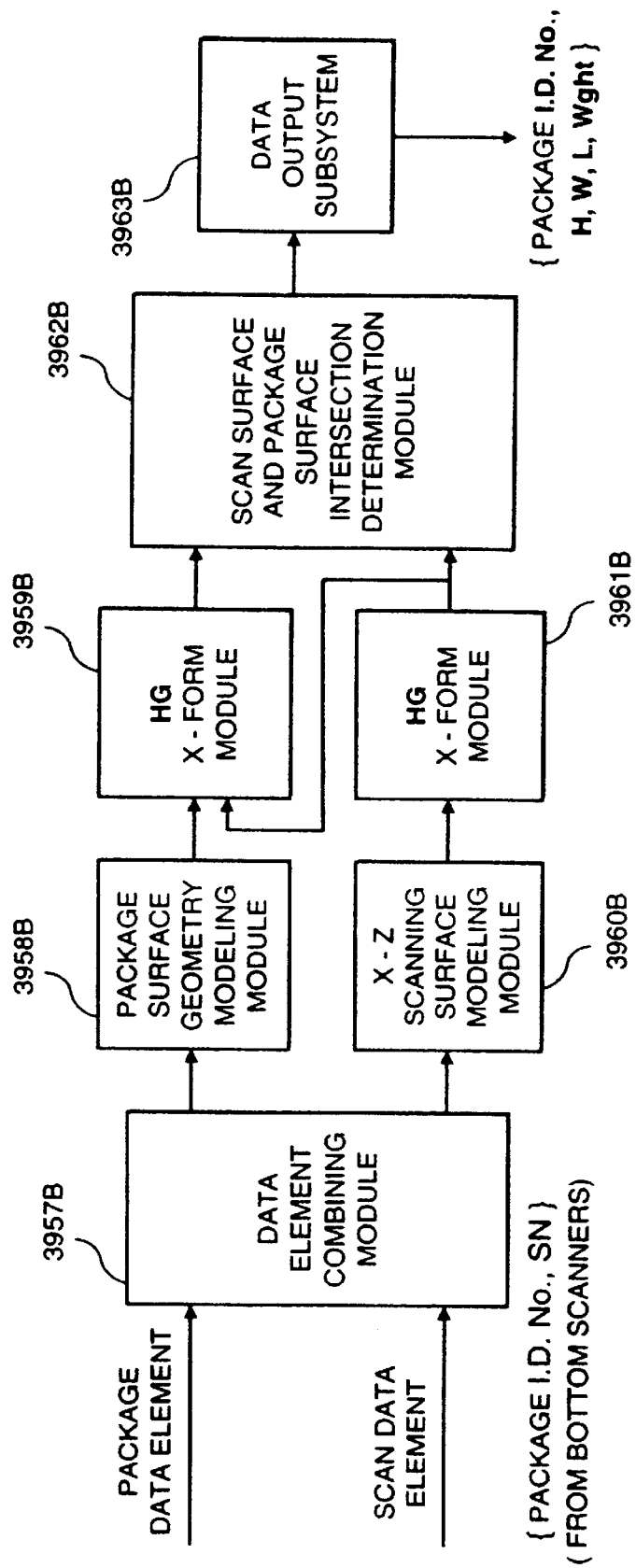
Figure 48A:
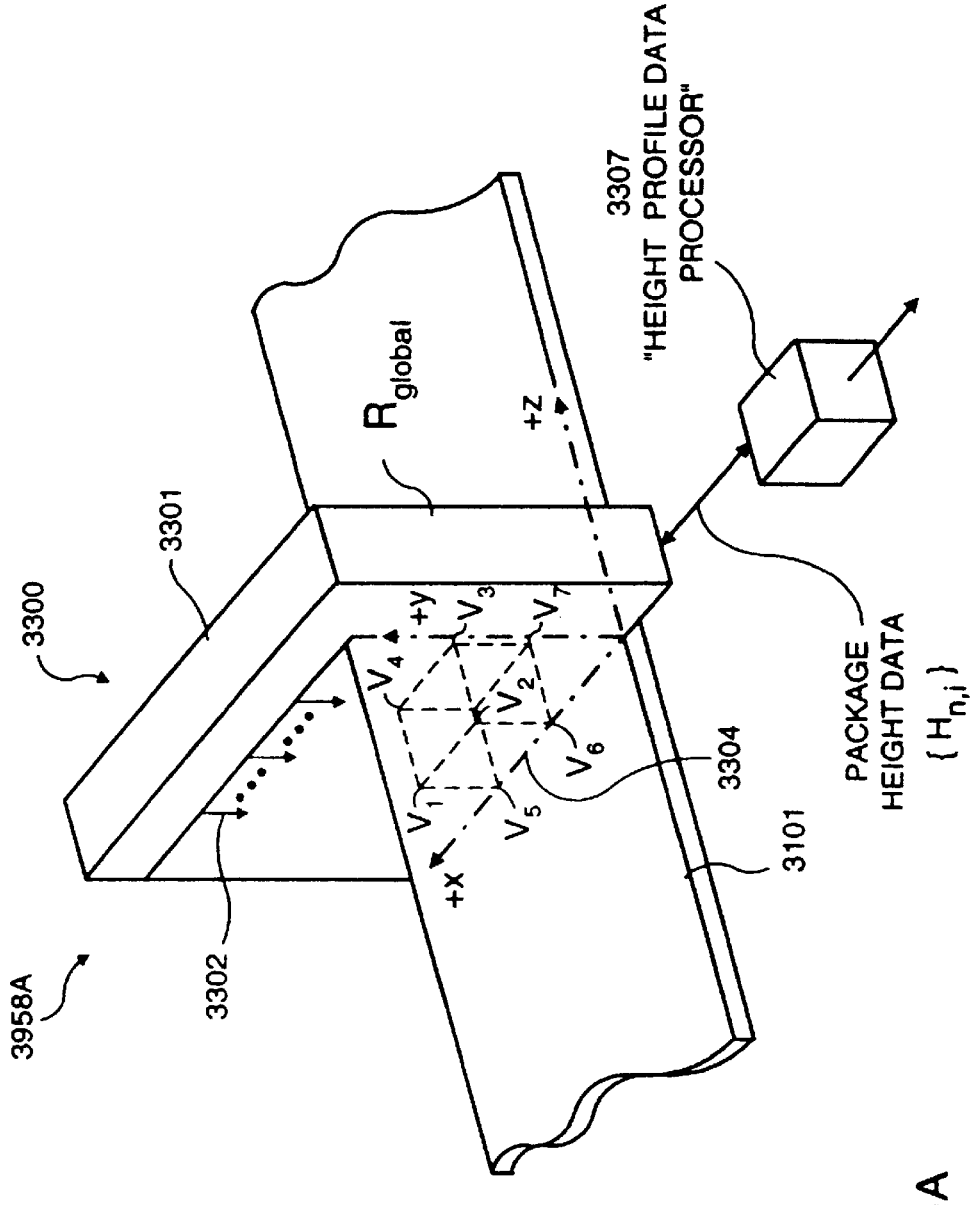
Figure 50:
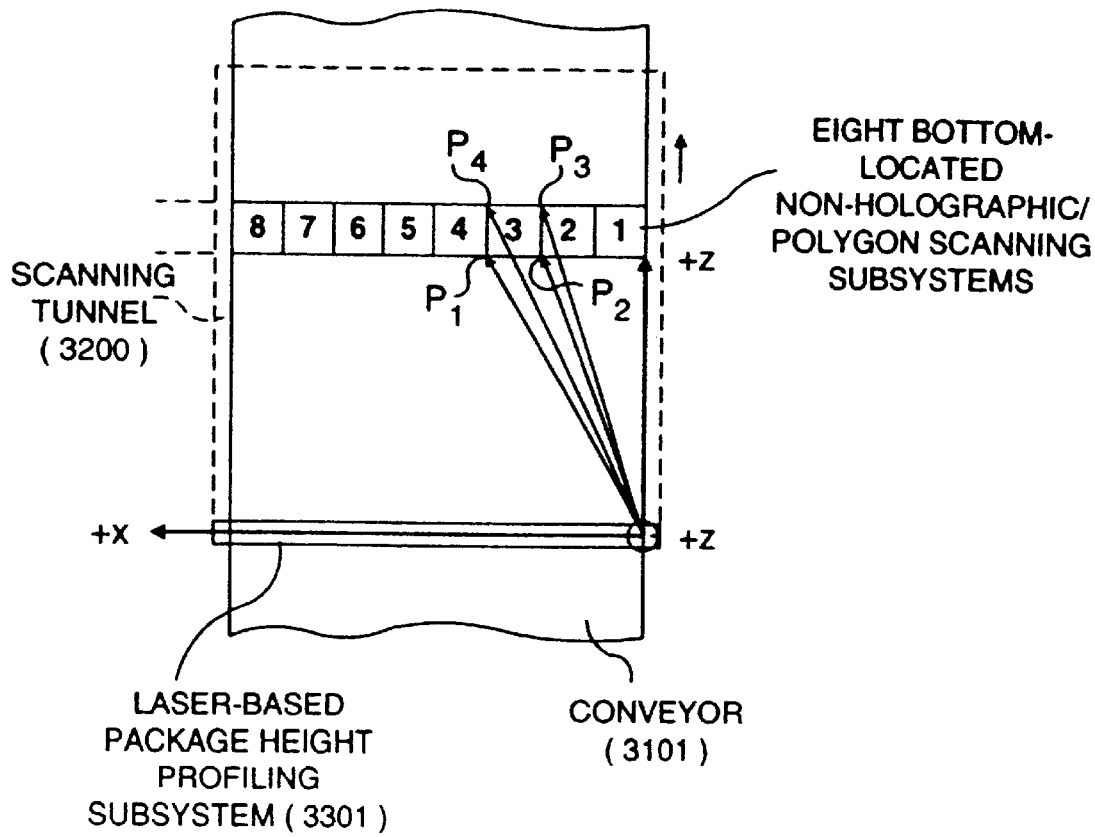
Figure 53A:
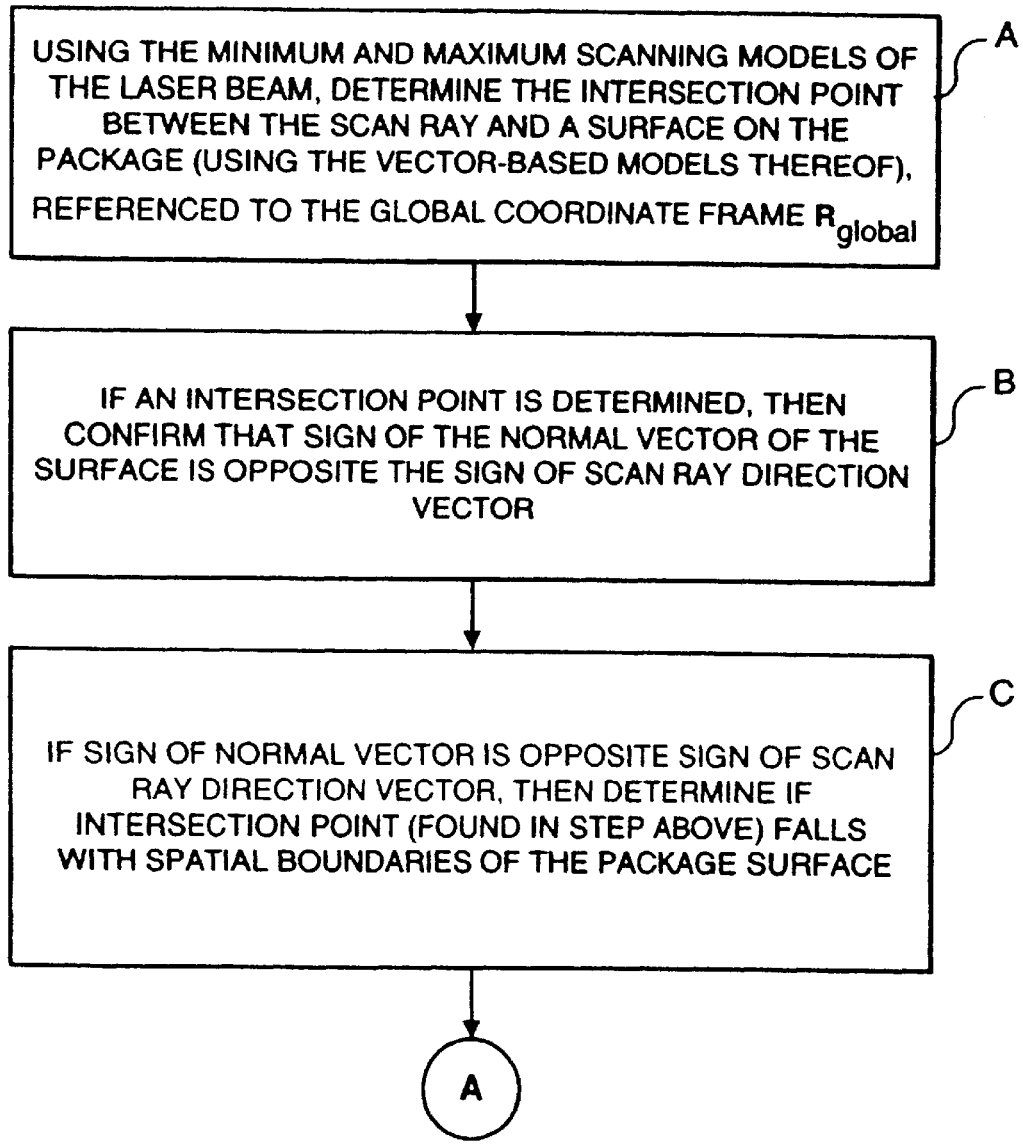
Figure 54A:
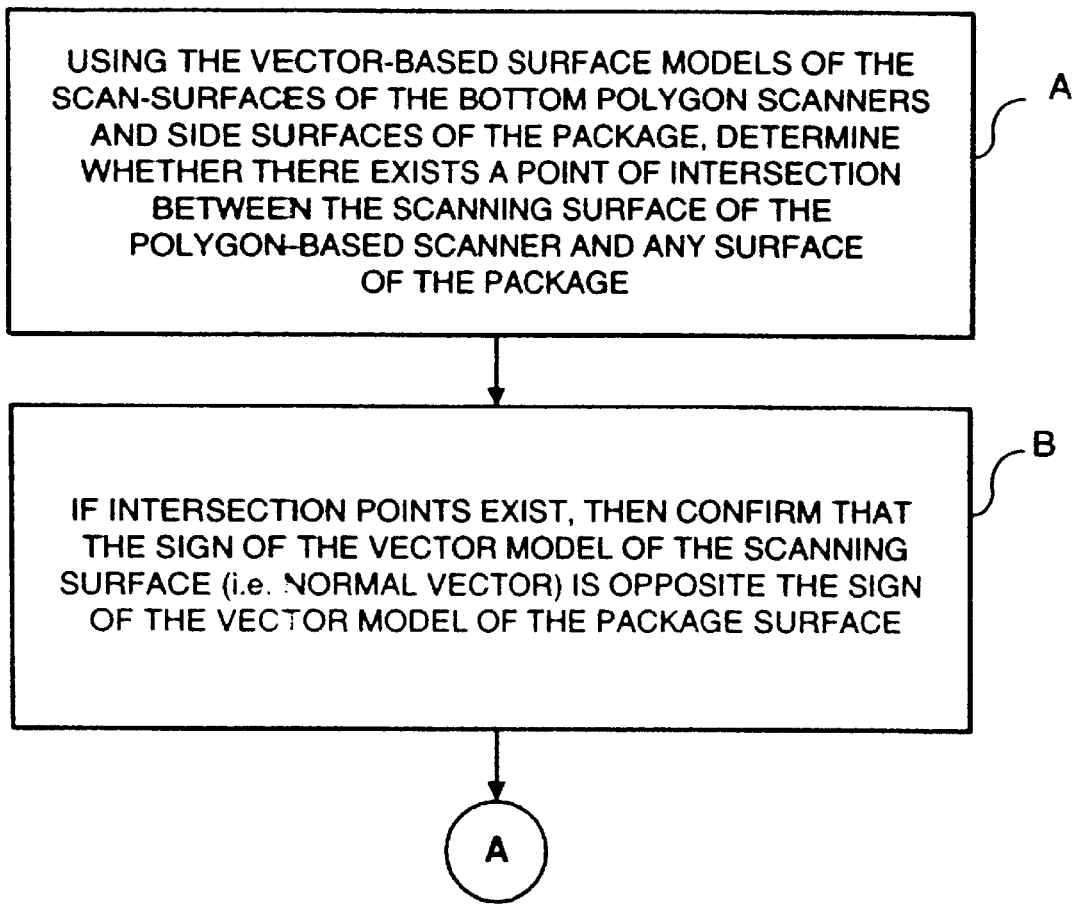
Figure 55:
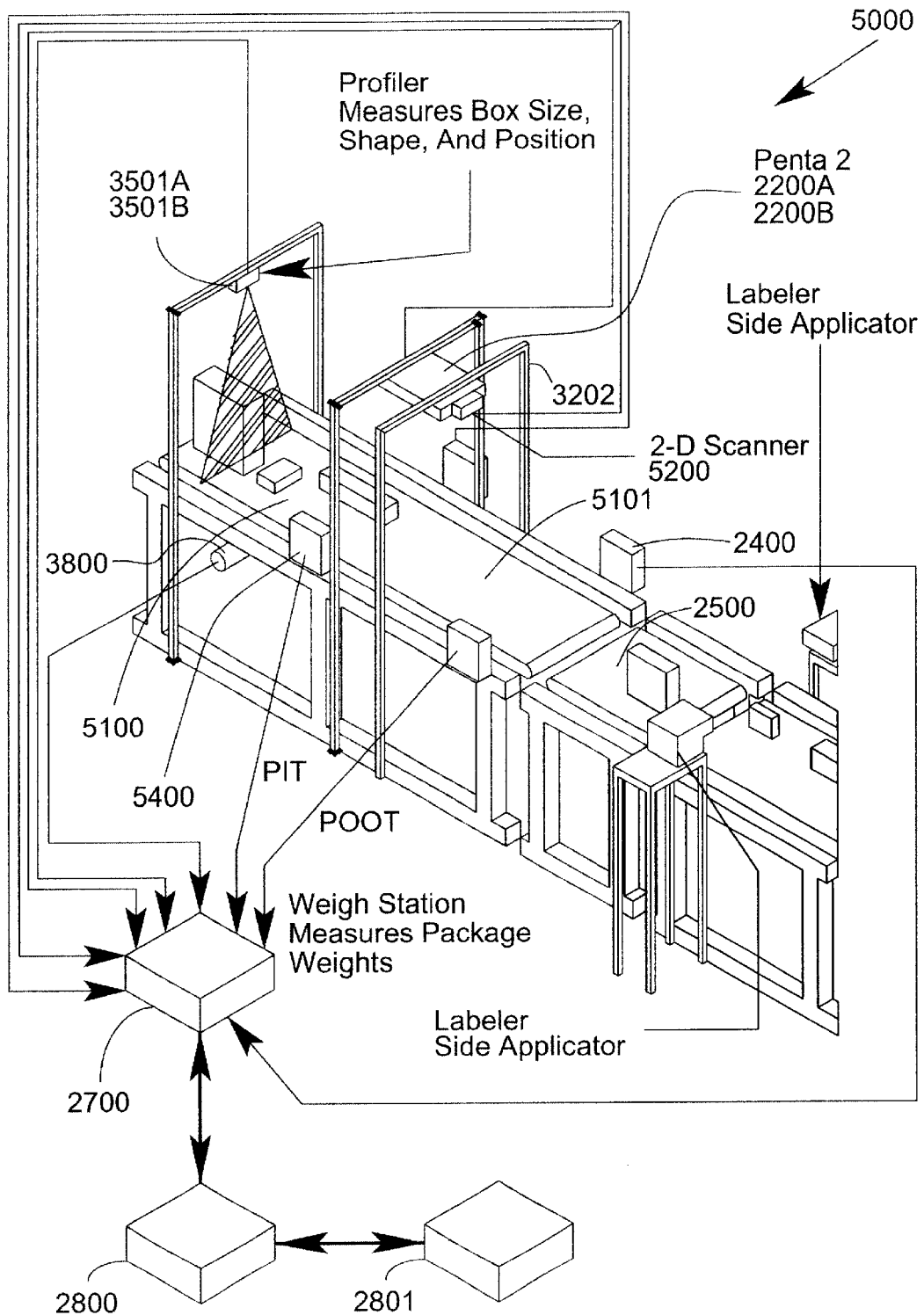
Figure 56:
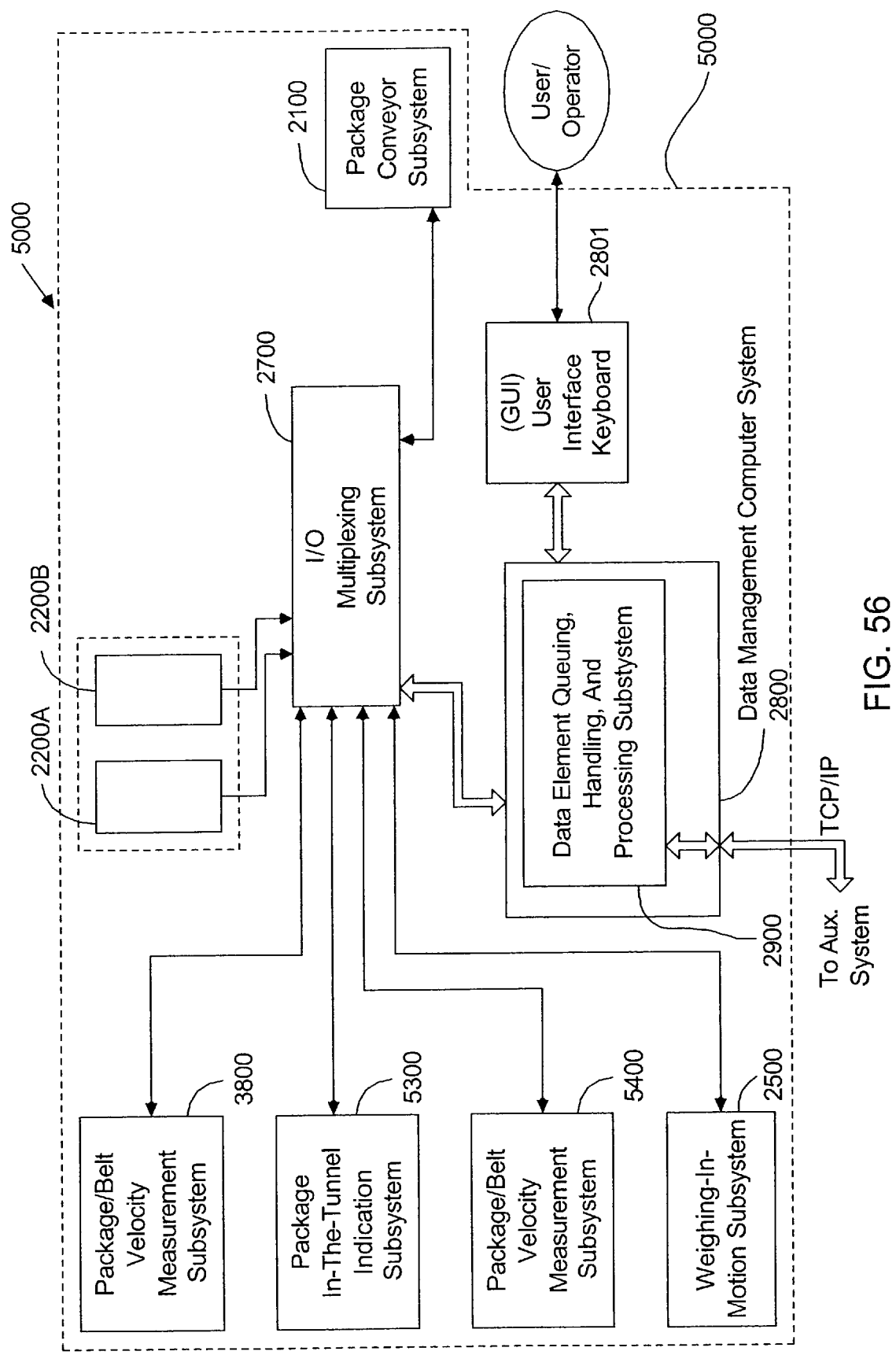
Figure 57:
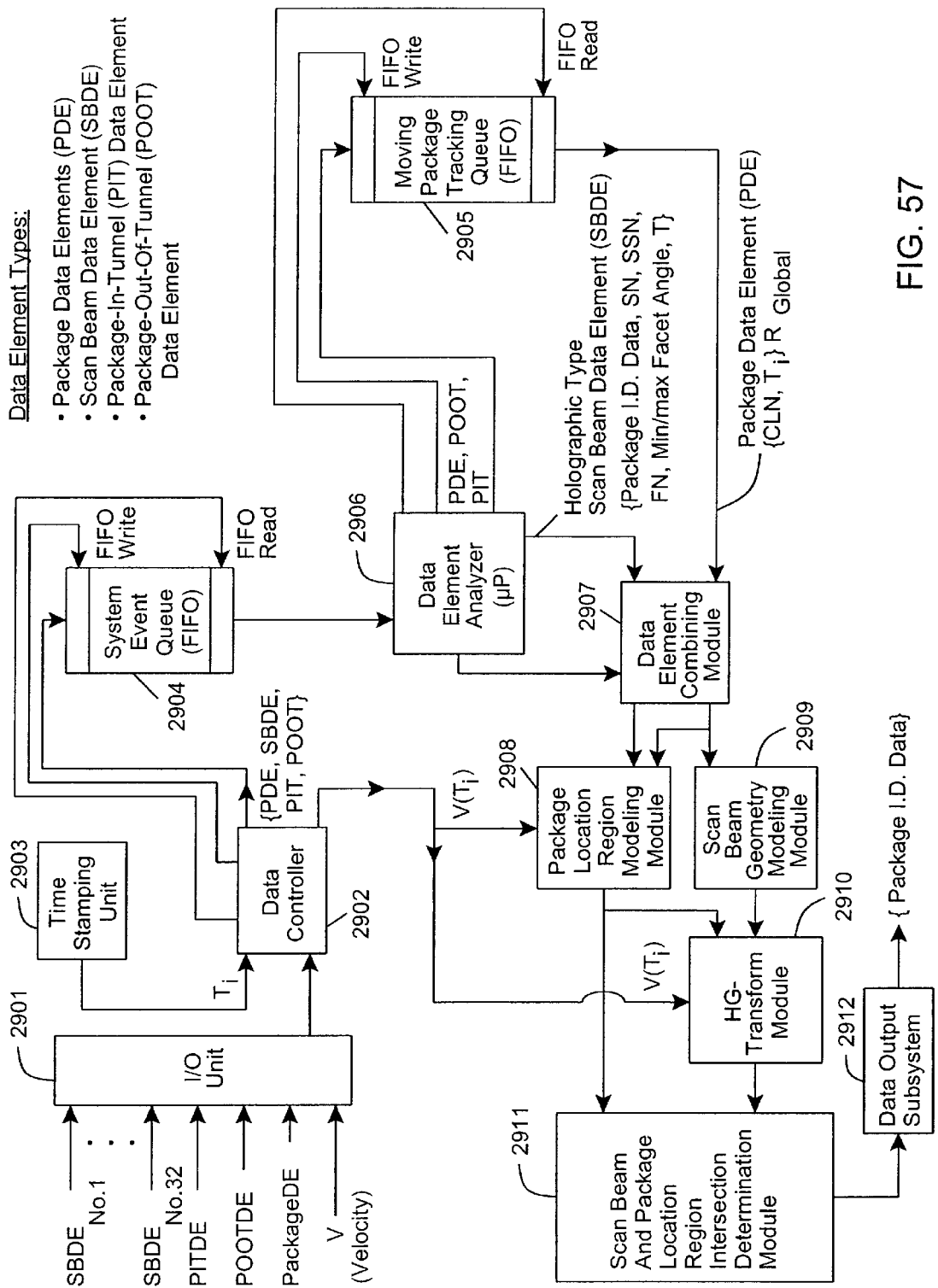
Figure 58:
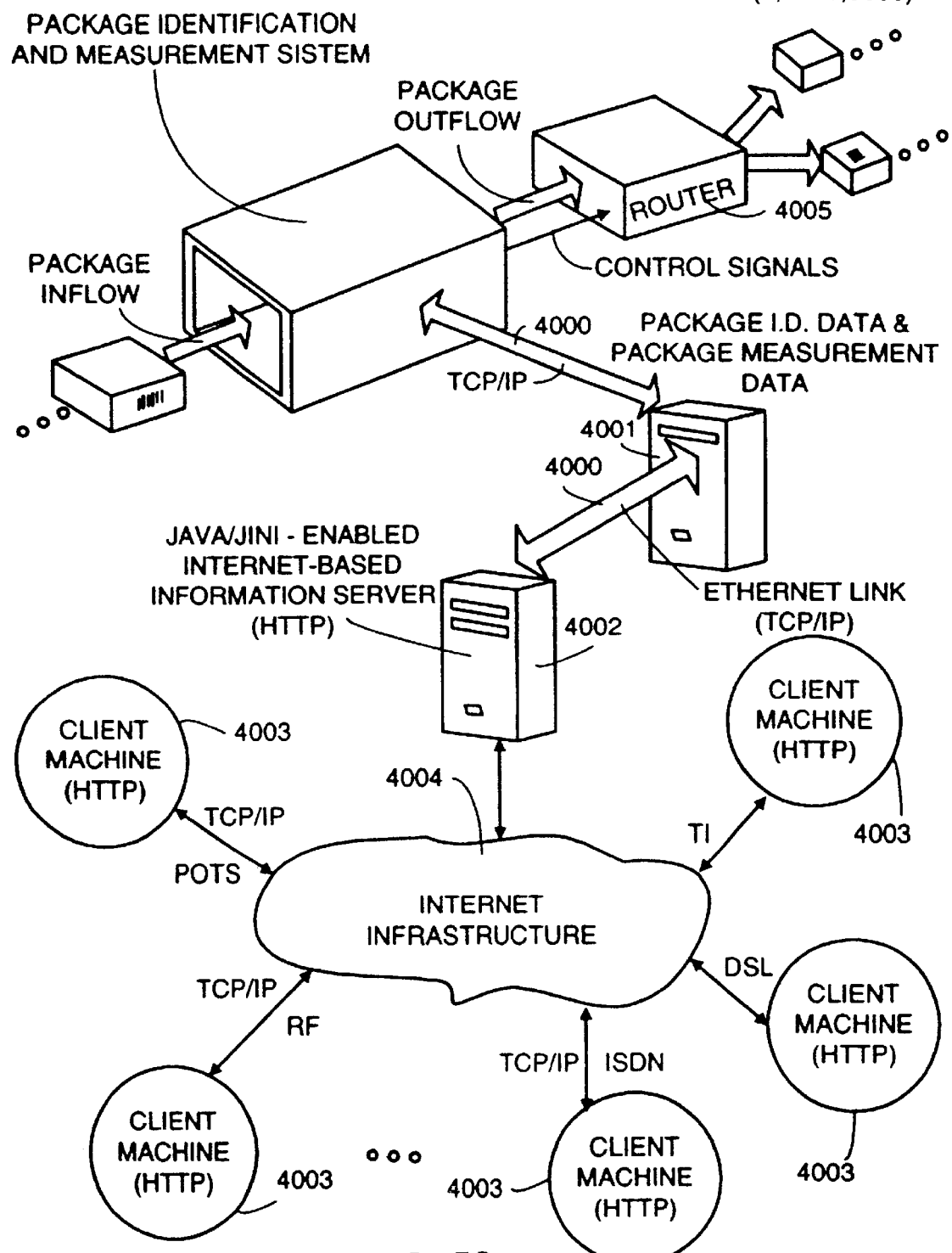

FIG. 30 is a schematic representation graphically illustrating how a vector-based package surface model created within the global coordinate reference frame $R_{global}$ at the "package height/width profiling position" can be converted into a corresponding vector-based package surface model created within the global scanner coordinate reference frame $R_{global}$ at the "scanning position" within the tunnel using homogeneous transformations, and how the package travel distance (d) between the package height/width profiling and scanning positions is computed using the package velocity (v) and the difference in time indicated by the time stamps placed on the package data element and scan beam data element matched thereto during each scan beam/package surface intersection determination carried out within the data element queuing, handling and processing subsystem of FIGS. 22A1, 22A2 and 22B;

FIGS. 31A and 31B, taken together, provide a procedure for determining whether the scan beam (rays) associated with a particular scan beam data element produced by a holographic scanning subsystem intersects with any surface on the package that has been scanned at a particular scanning position, and thus whether to correlate a particular package identification data element with particular package measurement data element acquired by the system;

FIGS. 32A and 32B, taken together, provide a procedure for determining whether the scanning surface associated with a particular scan beam data element produced by a non-holographic (e.g. polygon-based) bottom-located scanning subsystem intersects with any surface on the package that has been scanned at a particular scanning position, and thus whether to correlate a particular package identification data element with particular package measurement data element acquired by the system;

FIG. 33 is a perspective view of a "dual-lane" automated tunnel-type laser scanning package identification and weighing system constructed in accordance with the second illustrated embodiment of the present invention;

FIG. 33A is a plan view schematic representation showing the scanning areas covered by four corner-mounted triple-disc laser scanning subsystems of FIG. 33, as well as the orthogonal and omnidirectional scanning regions projected over the moving conveyor belt structure of the system;

FIG. 34 is a schematic block diagram illustrating the holographic laser scanning subsystems, the package-in-tunnel indication subsystem, the package velocity measurement subsystem, the package-out-of-tunnel subsystem, the package weighing-in-motion subsystem, the data-element queuing, handling and processing subsystem, the input/output port multiplexing subsystem, and the conveyor belt subsystem;

FIGS. 35A through 35C, taken together, set forth a flow chart describing the computational process used by the conveyor belt velocity measurement subsystem employed in FIG. 33, so as to compute the velocity of the conveyor belt of the system of the second illustrative embodiment of the present invention;

FIGS. 36A and 36B, taken together, set forth a schematic representation of the data element queuing, handling and processing subsystem employed in the system of the second illustrative embodiment of the present invention, illustrated in FIG. 33;

FIGS. 37A and 37B set forth a table of rules used to handle the data elements stored in the system event queue in the data element queuing, handling and processing subsystem of FIGS. 36A and 36B;

FIG. 38 is a schematic representation of the system and method used herein to create vector-based models of each package location region within the tunnel scanning system of the second illustrative embodiment;

FIGS. 39A and 39B provide a flow chart setting forth a preferred procedure for creating a vector-based model for each package location region within the tunnel scanning system of the second illustrative embodiment;

FIG. 40 is a schematic representation graphically illustrating how a vector-based scanning beam model created within a local scanner coordinate reference frame $R_{localscannerj}$ can be converted into a corresponding vector-based model created within the global scanner coordinate reference frame $R_{global}$ using homogeneous transformations;

FIG. 41 is a flow chart setting forth a preferred procedure for determining whether the scan beam (rays) associated with a particular scan beam data element produced by a holographic scanning subsystem within the system of FIG. 33 intersects with the package location region associated with package scanned at the scanning position associated with the scan beam data element, and thus whether to correlate a particular package identification data element with a particular package measurement data element or like token acquired by the system;

FIG. 42 is a perspective view of an automated tunnel-type laser scanning package identification and weighing system constructed in accordance with the third illustrated embodiment of the present invention, wherein multiple packages, arranged in stacked and/or side-by-side configurations, are transported along a high speed conveyor belt, dimensioned, weighed and identified in a fully automated manner without human intervention;

FIG. 43 is schematic block diagram of the system of FIG. 42, showing the subsystem structure thereof as comprising a scanning tunnel including holographic and non-holographic laser scanning subsystems, a first simultaneous multiple-package detection and dimensioning subsystem installed on the input side of the tunnel scanning subsystem, a second simultaneous multiple-package detection and dimensioning subsystem installed on the output side of the tunnel scanning subsystem, a package/belt velocity measurement subsystem, a package weighing-in-motion subsystem, a data-element queuing, handling and processing subsystem, an input/output (I/O) subsystem, a conveyor belt subsystem, and a master clock for establishing a global time reference when time-stamping data elements generated throughout the system;

FIG. 44 is a schematic representation of the first simultaneous multiple-package detection and dimensioning subsystem installed on the input side of the tunnel scanning subsystem, showing its various constituent subcomponents, namely a LADAR-based imaging and dimensioning subsystem for producing package dimension (PD) data elements, a package-in-the-tunnel (PIT) detection subsystem for automatically detecting the entry of multiple packages into the scanning tunnel and generating PIT data elements, a data element controller for receiving the PD and PIT data elements, date-stamping the same, and loading these data elements into and unloading the same from a plurality of moving package tracking queues assigned to different spatial regions above the conveyor belt, located on the input side of the tunnel scanning subsystem;

FIG. 44A is a schematic block diagram of the LADAR-based imaging and dimensioning subsystem employed in the simultaneous multiple-package detection and dimensioning subsystem shown in FIG. 44;

FIG. 44B is a schematic representation of a first illustrative embodiment of the LADAR-based imaging and dimensioning subsystem of the present invention, having an eight-sided polygonal scanning element, mounted on an optical bench within the subsystem housing, for scanning an amplitude modulated laser beam along a single scanning plane projected through a light transmission aperture formed in the subsystem housing, a light collecting mirror mounted on the optical bench for collecting reflected laser light off a scanned object (e.g. package) and focusing the same to a focal point located on the surface of a stationary planar mirror mounted on the optical bench, and an avalanche-type photodetector mounted on the optical bench for detecting laser light focused onto the stationary planar mirror and producing an electrical signal corresponding thereto, signal processing circuitry for processing the produced electrical signal and generating raw digital range data representative of the distance from the polygonal scanning element to sampled points along the scanned object (as well digital scan data representative of any bar code symbol the scanned surface of the object), a programmed digital image data processor for preprocessing the raw digital range data and removing background information components, and for processing the preprocessed range data so as to extract therefrom information regarding the dimensions (e.g. area, height and vertices) of the scanned object and produce data representative thereof, and a bar code symbol digitizing and decoding circuitry for processing the digital scan data signal and producing symbol character data representative of any bar code symbol located on the scanned surface of the object;

FIG. 44C is a schematic representation of the avalanche photodetector employed within the LADAR-based imaging and dimensioning subsystem shown in FIG. 44B;

FIG. 44D is a schematic representation illustrating that the information specified in the polar-type coordinate reference subsystem symbolically embedded within the LADAR-based subsystem of FIG. 44B can be converted (or translated) to the Cartesian-type coordinate reference system symbolically embedded within the automated tunnel-type laser scanning package identification and weighing system of FIG. 42;

FIG. 44E1 is a schematic representation of a second illustrative embodiment of the LADAR-based imaging and dimensioning subsystem of the present invention, having a holographic scanning disc, rotatably mounted on an optical bench within the subsystem housing, for scanning an amplitude modulated laser beam (produced from a laser beam production module) along a single scanning plane (along multiple depths of focus) projected through a light transmission aperture formed in the subsystem housing, a parabolic light collecting mirror mounted beneath the holographic scanning disc for collecting reflected laser light off a scanned object (e.g. package) and focusing the same to an avalanche-type photodetector mounted above the scanning disc, and producing an electrical signal corresponding thereto, signal processing circuitry for processing the produced electrical signal and generating raw digital range data representative of the distance from the polygonal scanning element to sampled points along the scanned object (as well digital scan data representative of any bar code symbol the scanned surface of the object), a programmed digital image data processor for preprocessing the raw digital range data and removing background information components, and for processing the preprocessed range data so as to extract therefrom information regarding the dimensions (e.g. area, height and vertices) of the scanned object and produce data representative thereof, and a bar code symbol digitizing and decoding circuitry for processing the digital scan data signal and producing symbol character data representative of any bar code symbol located on the scanned surface of the object;

FIG. 44E2 is a side cross-sectional view of the LADAR-based imaging and dimensioning subsystem shown in FIG. 44E1;

FIG. 44E3 is a table setting forth the design parameters used to construct the holographic scanning disc employed in the LADAR-based subsystem of the second illustrative embodiment;

FIG. 44E4 is a schematic representation of the linear scanning pattern produced from the LADAR-based subsystem of FIG. 44E1;

FIG. 45E5 is a schematic representation illustrating the various multiple depth of field supported by the laser scanning pattern produced from the LADAR-based subsystem shown in FIG. 44E1;

FIG. 44F is a high-level flow chart indicating the major stages of 2-D range data processing method carried out within the LADAR-based subsystem of FIG. 44E1;

FIG. 44G is a schematic representation of the 2-D range data processing method cyclically carried out on upon the computing platform of the LADAR-based imaging and dimensioning subsystem of the present invention;

FIG. 44G1 is a flow chart of an algorithmic control structure for the computation of local operators in the LADAR-based subsystem of the present invention;

FIGS. 44H1 through 44H5, taken together, set forth a flow chart describing the steps of the range data processing method carried out in the LADAR-based imaging and dimensioning subsystem of the illustrative embodiment of the present invention;

FIG. 44I is a graphical image of a 2-D range data map synthesized from a large number of rows of raw range data captured from the LADAR-based imaging and dimensioning subsystem of the present invention, in accordance with the data capturing operations specified in Step A1 of the flow chart set forth in FIGS. 44H1 through 44H5;

FIG. 44I2 is a graphical image of a 2-D range data map after being processed by the data processing operations specified in Step A2 of the flow chart set forth in FIGS. 44H1 through 44H5;

FIG. 44I3 is a graphical image of a 2-D range data map after being processed by the data processing operations specified in Step A3 of the flow chart set forth in FIGS. 44H1 through 44H5;

FIG. 44I4 is a graphical image of a 2-D range data map synthesized from a large number of rows of background data removed from rows of raw range data by the data processing operations specified in Step A4 of the flow chart set forth in FIGS. 44H1 through 44H5;

FIG. 44I5 is a graphical image of a differentiated 2-D range data map from which background data, indicated in FIG. 44I4, is substracted during being processed by the data processing operations specified in Steps B1, B2 and B3 of the flow chart set forth in FIGS. 44H1 through 44H5;

FIG. 44J is a flow chart describing the process of retrieving rows of range data, already preprocessed using smoothing and edge-detection techniques, and computes the first vertical derivative and stores the results in an image structure for further processing, such as contour tracing, etc.;

FIG. 44K is a flow chart describing the steps carried out by the contour tracing program employed in the LADAR-based imaging and dimensioning subsystem of the present invention;

FIG. 44L is a flow chart describing the operations carried out during Step B6 and B7 of the flow chart set forth in FIGS. 44H1 through 44H5;

FIG. 44M is a flow chart describing the operations carried out during Steps B6 and B7 of the flow chart set forth in FIGS. 44H1 through 44H5;

FIG. 44N is a flow chart describing the operations carried out during Step B10 of the flow chart set forth in FIGS. 44H1 through 44H5;

FIGS. 44O1 through 44O4 set forth polygonal contours of the type traced during Step B9, having corner points which are reduced using the algorithm set forth in FIG. 44N;

FIG. 44P is a schematic representation of the LADAR-based subsystem of the present invention, illustrating the geometrical transformation between the polar coordinate reference system embedded therewithin and the height of a package scanned thereby defined relative to the Cartesian coordinate reference system embedded within the package identification and dimensioning system of the present invention;

FIG. 44Q is a flow chart describing the surface computation operations carried out during Step B13 of the flow chart set forth in FIGS. 44H1 through 44H5;

FIGS. 44R1 and 44R2 are polygonal contours which illustrative the method of package surface area computation carried out during Step B13 of the flow chart set forth in FIGS. 44H1 through 44H5;

FIG. 45A is a schematic representation of the height profile data analyzer employed in the subsystem of FIG. 45, comprising a data controller, time-stamping module, a height profile data element queue, a height profile data analyzer, and a plurality of moving package tracking queues assigned to different spatial regions above the conveyor belt of the system located on the output side of the tunnel scanning subsystem;

FIG. 45B is a schematic block diagram of the laser scanning mechanism employed in the simultaneous multiple-package detection and dimensioning subsystem shown in FIG. 45;

FIGS. 46A1, 46A2 and 46B, taken together, provide a schematic representation of the data element queuing, handling and processing subsystem of the present invention shown in FIGS. 42 and 43;

FIGS. 47A and 47B set forth a table of rules used to handle the data elements stored in the can beam data element (SBDE) queue in the data element queuing, handling and processing subsystem of FIGS. 46A1, 46A2 and 46B;

FIG. 48A is a schematic representation of the surface geometry model created for each package surface by the package surface geometry modeling subsystem (i.e. module) deployed with the data element queuing, handling and processing subsystem of FIGS. 46A1, 46A2 and 46B, illustrating and showing how each surface of each package transported through package dimensioning/measuring subsystem is mathematically represented (i.e. modeled) using at least three position vectors (referenced to x=0, y=0, z=0) in the global reference frame $R_{global}$, and a normal vector drawn to the package surface indicating the direction of incident light reflection therefrom;

FIG. 48B is a table setting forth a preferred procedure for creating a vector-based surface model for each surface of each package transported through the package detection and dimensioning subsystem of the system hereof;

FIG. 49 is a table setting forth a preferred procedure for creating a vector-based ray model for laser scanning beams which have been produced by a holographic laser scanning subsystem of the system hereof, that may have collected the scan data associated with a decoded bar code symbol read thereby within the tunnel scanning subsystem;

FIG. 50 is a schematic representation of the vector-based 2-D surface geometry model created for each candidate scan beam by the scan surface modeling subsystem (i.e. module) shown in FIG. 46B, and showing how each omnidirectional scan pattern produced from a particular polygon-based bottom scanning unit is mathematically represented (i.e. modeled) using four position vectors (referenced to x=0, y=0, z=0) in the global reference frame $R_{global}$, and a normal vector drawn to the scanning surface indicating the direction of laser scanning rays projected therefrom during scanning operations;

FIG. 51 is a schematic representation graphically illustrating how a vector-based model created within a local scanner coordinate reference frame $R_{localscannerj}$ can be converted into a corresponding vector-based model created within the global scanner coordinate reference frame $R_{global}$ using homogeneous transformations;

FIG. 52 is a schematic representation graphically illustrating how a vector-based package surface model created within the global coordinate reference frame $R_{global}$ at the "package height/width profiling position" can be converted into a corresponding vector-based package surface model created within the global scanner coordinate reference frame $R_{global}$ at the "scanning position" within the tunnel using homogeneous transformations, and how the package travel distance (d) between the package height/width profiling and scanning positions is computed using the package velocity (v) and the difference in time indicated by the time stamps placed on the package data element and scan beam data element matched thereto during each scan beam/package surface intersection determination carried out within the data element FIGS. 53A and 53B, taken together, provide a procedure for determining whether the scan beam (rays) associated with a particular scan beam data element produced by a holographic scanning subsystem intersects with any surface on the package that has been scanned at a particular scanning position, and thus whether to correlate a particular package identification data element with particular package measurement data element acquired by the system;

FIGS. 54A and 54B, taken together, provide a procedure for determining whether the scanning surface associated with a particular scan beam data element produced by a non-holographic (e.g. polygon-based) bottom-located scanning subsystem intersects with any surface on the package that has been scanned at a particular scanning position, and thus whether to correlate a particular package identification data element with particular package measurement data element acquired by the system;

FIG. 55 is a perspective view of an automated tunnel-type laser scanning package identification and weighing system constructed in accordance with the fourth illustrated embodiment of the present invention, wherein packages, arranged in a singulated configuration, are transported along a high speed conveyor belt, dimensioned, weighed and identified in a fully automated manner without human intervention;

FIG. 56 is a block schematic of the system of FIG. 55;

FIG. 57 is a block schematic data element computer system management employed in FIG. 55; and FIG. 58 is a schematic representation of an automatic package identification and measurement system of the present invention shown interfaced to a relational database management system (RDBMS) and an Internet information server which are connected to a local information network that is interconnected to the Internet, for the purpose of enabling customers and other authorized personnel to use a WWW-enabled browser program to (1) remotely access (from an Internet server) information about any packages transported through the system, as well as diagnostics regarding the system, and (2) remotely control the various subcomponents of the system in order to reprogram its subsystems, perform service routines, performance checks and the like, as well as carry out other forms of maintenance required to keep the system running optimally, while minimizing downtime or disruption in system operations.

DETAILED DESCRIPTION OF THE ILLUSTRATIVE EMBODIMENTS OF THE PRESENT INVENTION

Referring to the figures in the accompanying Drawings, the preferred embodiments of the automated package identification and measurement system of the present invention will be described in great detail, wherein like elements will be indicated using like reference numerals.

Automated Tunnel-Type Laser Scanning Package Identification and Measurement System of the First Illustrative Embodiment of the Present Invention In FIG. 1, there is shown an automated tunnel-type laser scanning package identification and measuring (e.g. dimensioning and weighing) system designed to meet the needs of demanding customers, such as the United States Postal Service (USPS), which requires "hands-free" bar code (or code symbol) scanning of at least six-sided packages, wherein the label containing the code symbol to be read could be positioned in any orientation on any one of the six or more sides of the box or container structure. As used hereinafter, the term "hands-free" shall mean scanning of bar codes on boxes or parcels that are travelling past the scanners in only one direction on some sort of conveyor system. In this illustrative embodiment, the package should be singulated in a conventional manner.

As shown in FIG. 3, the automated tunnel scanning system of the first illustrative embodiment indicated by reference numeral 1 comprises an integration of subsystems, namely: a high-speed package conveyor system 300 having a conveyor belt 300 comprising at least two separated sections 302A and 302B, and each having a width of at least 30 inches to support one or more package transport lanes along the conveyor belt; a tunnel scanning subsystem 100 including an arrangement of holographic and non-holographic laser scanning bar code symbol reading subsystems 101 through 117 supported overhead and below the conveyor belt by a support frame 150 so as to produce a truly 3-D omnidirectional scanning volume above the conveyor belt, for scanning bar codes on packages transported therethrough independent of the package or bar code orientation; a package velocity and length measurement subsystem 400; a package-in-the-tunnel indication subsystem 500 realized as a 2-D light sensing structure mounted along the conveyor belt, on the input side of the tunnel, for automatically detecting the presence of each package moving into the scanning tunnel; a package (x-y) dimensioning subsystem 600, employing the 2-D light sensing structure of subsystem 500, for producing x-y profile data of detected packages; a package-out-of-the-tunnel indication subsystem 700 realized as an infrared (IR) light sensing object-detecting device mounted along the conveyor belt, on the output side of the tunnel, for automatically detecting the presence of packages moving out of the scanning tunnel; a weighing-in-motion subsystem 900 for weighing packages as they are transported along the conveyor belt; an input/output subsystem 800 for managing the inputs to and output from the system of FIG. 1; and a data management computer 900 with a graphical user interface (GUI) 901, for realizing a data element queuing, handling and processing subsystem 1000 as shown in FIG. 22, as well as other data and system management functions.

Figure 1A:
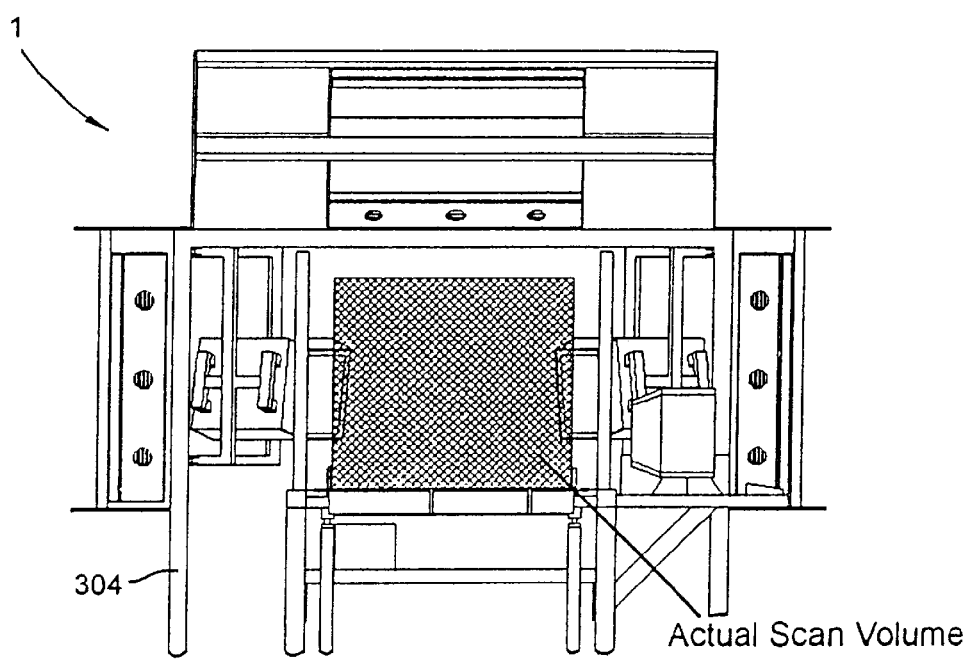
FIG. 1A is an end elevated view of the system shown in FIG. 1.
Figure 1B:
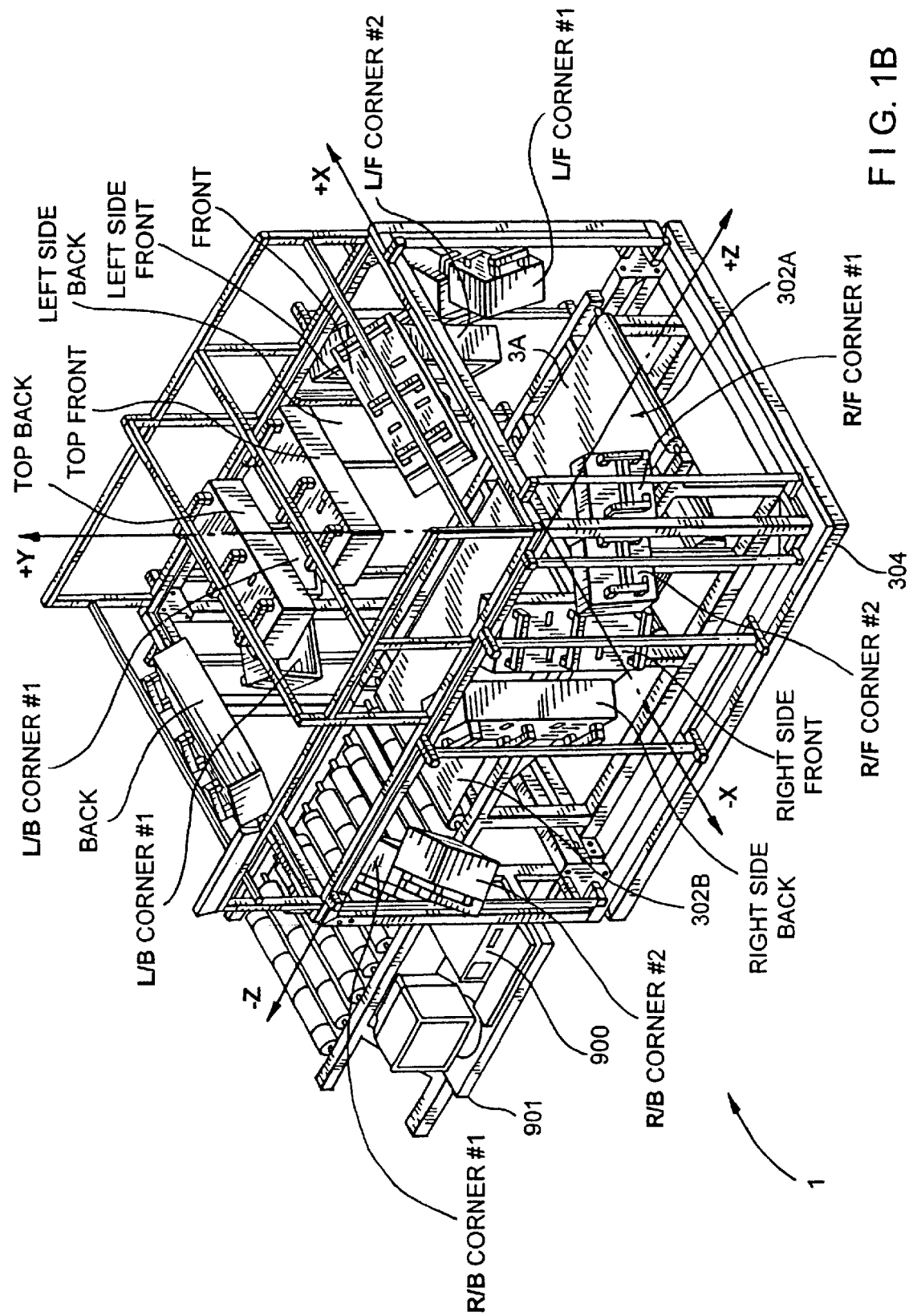
FIG. 1B is a first perspective view of the tunnel-type package identification and measurement system of the first illustrative embodiment of the present invention.
Figure 1C:
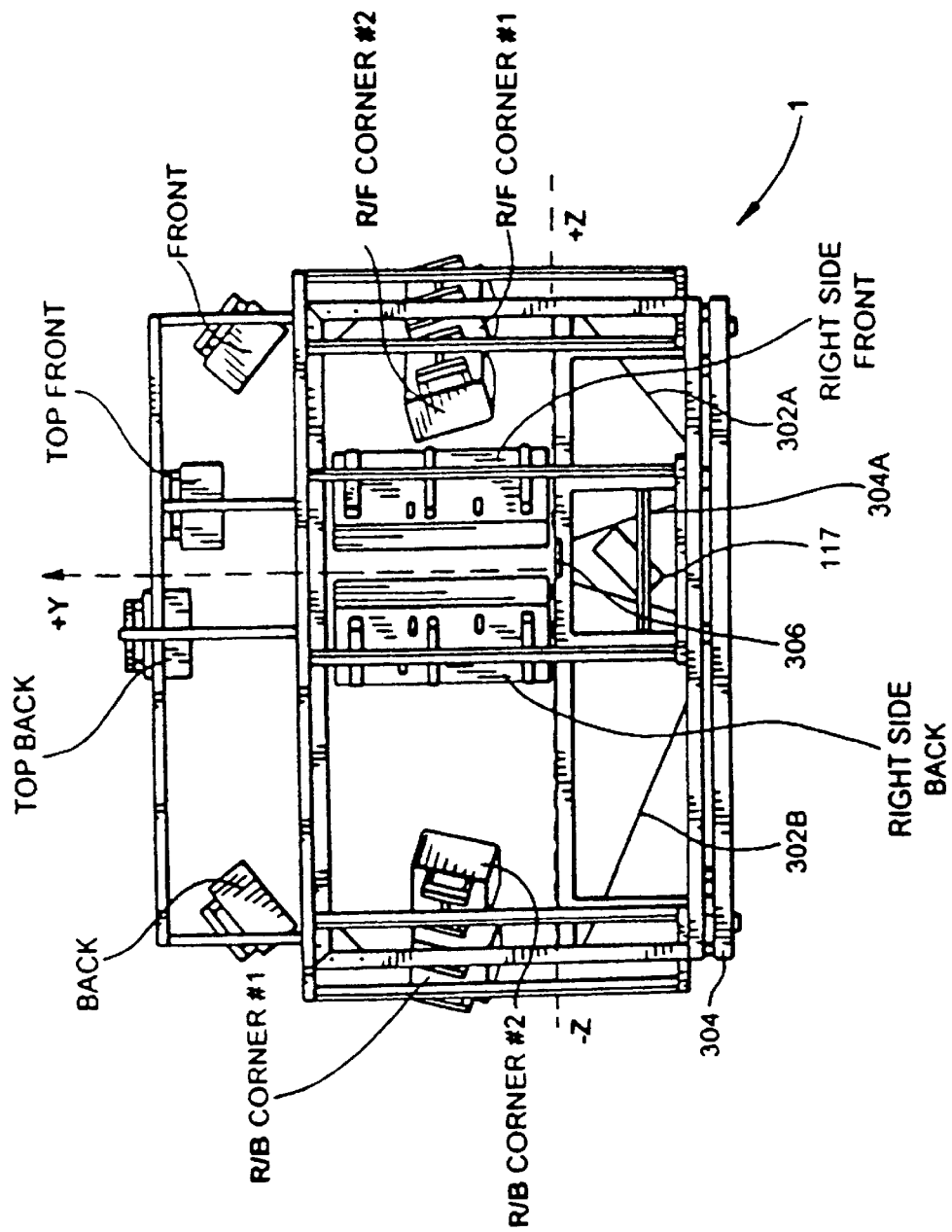
FIG. 1C is an elevated side view of the tunnel-type package identification and measurement system of the first illustrative embodiment, removed from the scanner support framework, in order to clearly show the O-ring conveyor platform for staggering packages prior to entering the 3-D scanning volume, the light curtain associated with the packaging dimensioning subsystem for determining the total volume of the package, and whether there are multiple packages entering the 3-D scanning volume, a scanner management computer system (i.e. Station) with a graphical user interface (GUI) for easily configuring the scanning subsystems within the system and monitoring the flow of packages into the scanning tunnel, and an exit sensor for detecting the exit of each scanned package within the scanning tunnel.
Figure 1D:
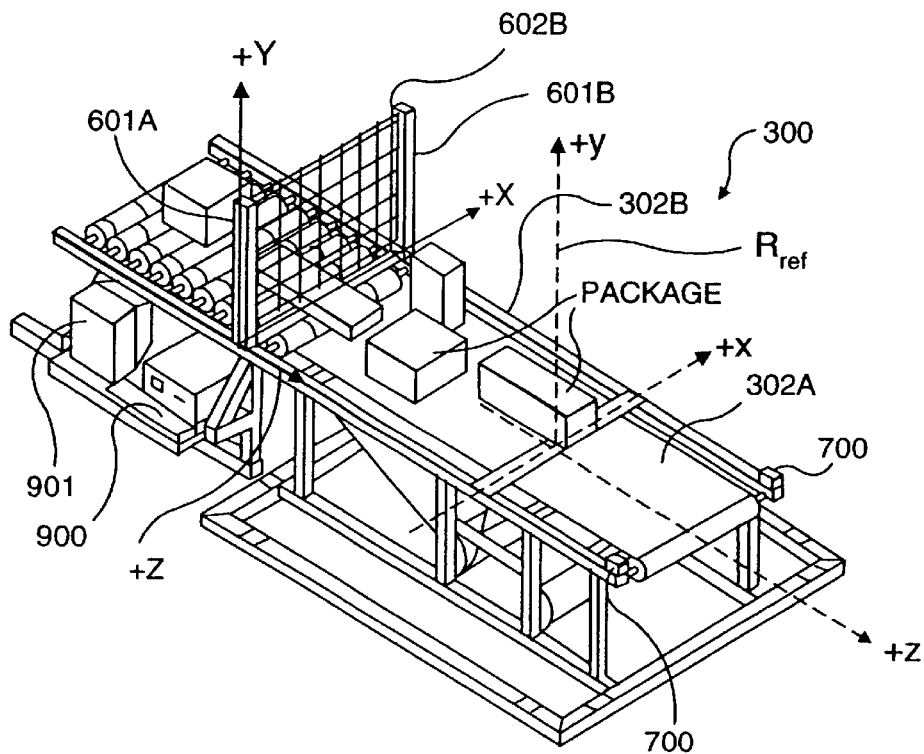
FIG. 1D is a perspective view of the tunnel-type laser scanning system of the first illustrative embodiment of the present invention, shown in greater detail, detached from a portion of its roller-based conveyor subsystem and scanner management subsystem.
Figure 1E:
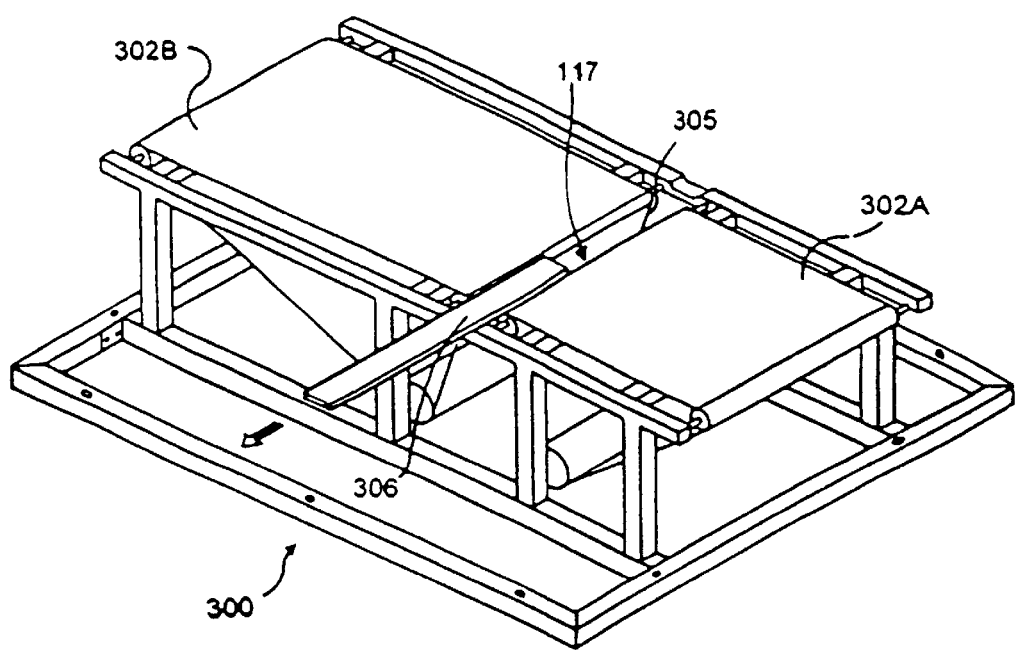
FIG. 1E is a perspective view of the split-section conveyor subsystem and its bottom-mounted laser scanning projection subsystem, and user-interface/workstation, shown detached from the scanner support framework shown in FIGS. 1, 1A and 1B.

Laser Scanning Tunnel Subsystem of First Illustrative Embodiment of the Present Invention As shown in FIGS. 1 through 1E, the tunnel scanning system of the first illustrative embodiment 1 comprises an arrangement of laser scanning subsystems (i.e. scanners) which, by virtue of their placement, relative to the conveyor belt subsystem 300, essentially form a "tunnel" scanning subsystem over and about the conveyor belt of the conveyor subsystem 300. In the field of package sortation of any sort, whether it be mail, luggage (as in an airport terminal) or other items or boxes, this type of code symbol scanning system is known as a "tunnel scanning system" by those skilled in the art.

The tunnel scanning system of the first illustrative embodiment, shown in great detail in FIGS. 1 through 32B, can be designed and constructed to meet any specific set of customer-defined scanning parameters. For example, in the first illustrative embodiment, the bar code label can be on any one side of a box having six or more sides. The bar code label could be in any orientation. Furthermore, the object bearing the bar code label to be read would be moving past the scanners of the conveyor belt travelling at speeds in excess of 600 feet per second. In the illustrative embodiment, the conveyor belts 302A and 302B are moving at 520 feet per second but many move faster in other embodiments. The types of codes to be read to include such codes as Code 39, Code 128 and others. The aspect ratio of the bar codes to be read is on the order of 10 mils and up.

The tunnel scanning system of the present invention can be used in various types of applications, such as for example, where the bar codes are read to determine (a) identification of incoming packages, (b) identification of outgoing packages, and (c) sortation of outgoing packages. For sortation types of applications, the information derived from the bar code will be used not only to identify the package, but also to direct the package along a particular path using deflectors, routers and other instruments well known in the package and parcel handling art.

In the first illustrative embodiment shown in FIG. 1, the volume to be scanned within the tunneling subsystem (e.g. its 3-D scanning volume) is approximately: 1 meter wide (i.e. the width of the conveyor belt); ten feet long; and 1 meter tall (i.e. the height of the tallest possible box going through). The laser scanning pattern produced by the concerted operation of the holographic laser scanning subsystems identified in the drawings, and described above, fills this entire 3-D scanning volume with over 400,000 scan lines per second. The 3-D scanning volume of the tunnel scanning system, measured with respect to the surface of the conveyor belt, begins at the surface of the conveyor belt in order to scan flat items (such as envelopes), and extends up approximately 1 meter ("h") above the surface of the conveyor belt subsystem.

As shown in FIGS. 1 through 1C, sixteen holographic laser scanning subsystems 101 through 116 are mounted on a lightweight scanner support framework 304, at positions specified in Tunnel Scanner Positioning Data Table shown in FIG. 2C. The terms (e.g. "Top/Front", Top/Back", etc.) used in this Table to identify the individual holographic scanning subsystems of the tunnel scanning system hereof are used throughout the drawings, rather than reference numerals. The one fixed-projection scanner subsystem, identified by the label "Bottom" or 117, is mounted between the gap 305 provided between the first and second conveyor platforms 302A and 302B comprising the conveyor subsystem 300 of the tunnel scanning subsystem 100.

The various omnidirectional and orthogonal scanning directions provided for within the 3-D scanning volume of the tunnel-scanning system of the present invention are schematically illustrated in FIGS. 5A through 9B. These illustrations indicate how each of the laser scanning subsystems within the tunnel scanning system contribute to produce the truly omnidirectional scanning performance attained by the tunnel scanner hereof.

Omni-Directional Holographic Laser Scanning Subsystem of the Present Invention

As shown in FIGS. 1B and 1C, the eight triple-disc holographic scanners (denoted as Top/Front, Top/Back, Front, Back, Right Side/Front, Right Side/Back, Left Side/Front and Left Side/Back) are mounted about the conveyor belt by way of the scanner support framework, in accordance with the positioning data set forth in the table of FIG. 2C. Notably, using the eight corner scanners in this system embodiment, the Front and Back Scanners should not be required and thus would be optional to achieve full omnidirectional scanning with the 3-D scanning volume of the tunnel scanning subsystem. Each of these eight triple-disc holographic scanning subsystems (denoted as Top/Front, Top/Back, Front, Back, Right Side/Front, Right Side/Back, Left Side/Front and Left Side/Back) is shown in greater detail in FIGS. 4A1 through 4A10.

Figure 8A:
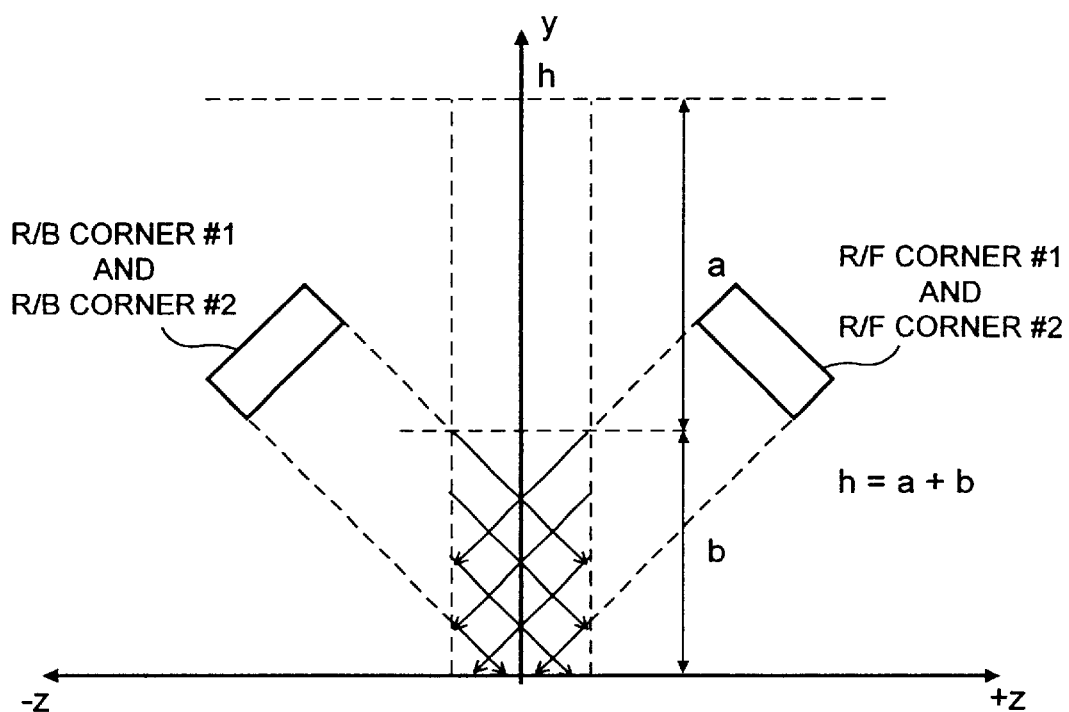
Figure 8B:
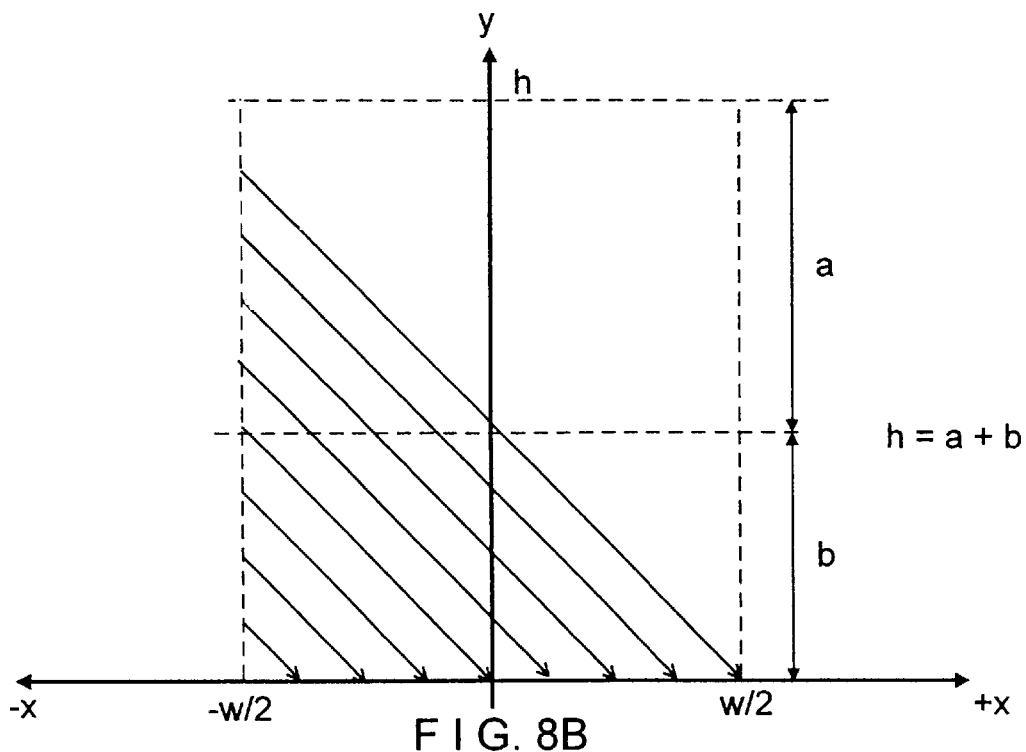

As shown in FIGS. 4A1 and 4A2, each triple-disc holographic scanning subsystem has three laser scanning platforms installed within a scanner housing 140. Each laser scanning platform, shown in greater detail in FIG. 4A2 produces a 3-D laser scanning volume as shown in FIG. 4A8C, to produce Penta 1 Scanner. Each 3-D scanning volume contains a omnidirectional laser scanning pattern having four over-lapping focal zones which are formed by five laser scanning stations indicated as LS1, LS2, LS3, LS4 and LS5 in FIG. 4A1, arranged about a sixteen-facet holographic scanning disc 130. When combining a pair of such scanning platforms, a Penta 2 Scanner is produced that is capable of producing a double-sized scanning volume as shown in FIG. 4A8B. When combining three such scanning platforms, a Penta 3 Scanner is produced that is capable of producing a triple-sized scanning volume as shown in FIG. 4A8A. The scan pattern and scan speeds for such alternative embodiments of this omni-directional scanning subsystem of the present invention is shown in the specification table set forth in FIG. 4A8D.

Figure 9A:
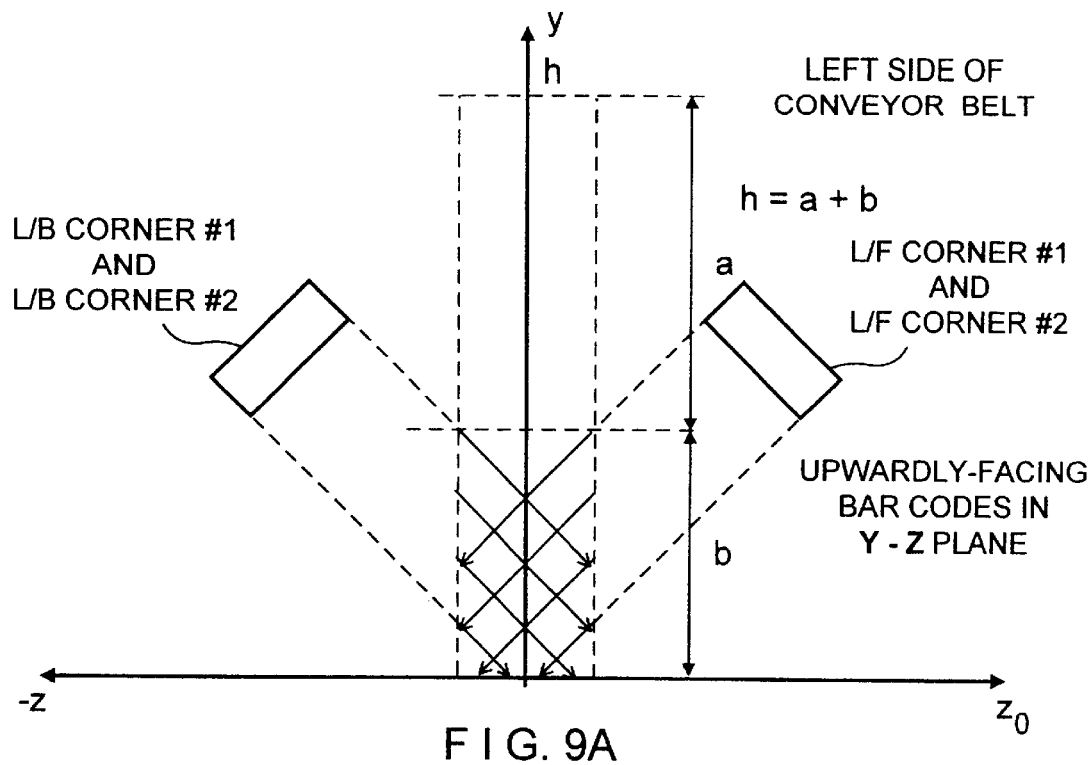
FIG. 9A is a schematic diagram showing the direction of omni-directional scanning provided in the Y-Z plane of the 3-D scanning volume of tunnel scanning system of the first illustrative embodiment of the present invention, by the holographic laser scanning subsystems (indicated by L/B Corner #1, L/B Corner #2, L/F Corner #1 and L/B Corner #2) employed therein.
Figure 9B:
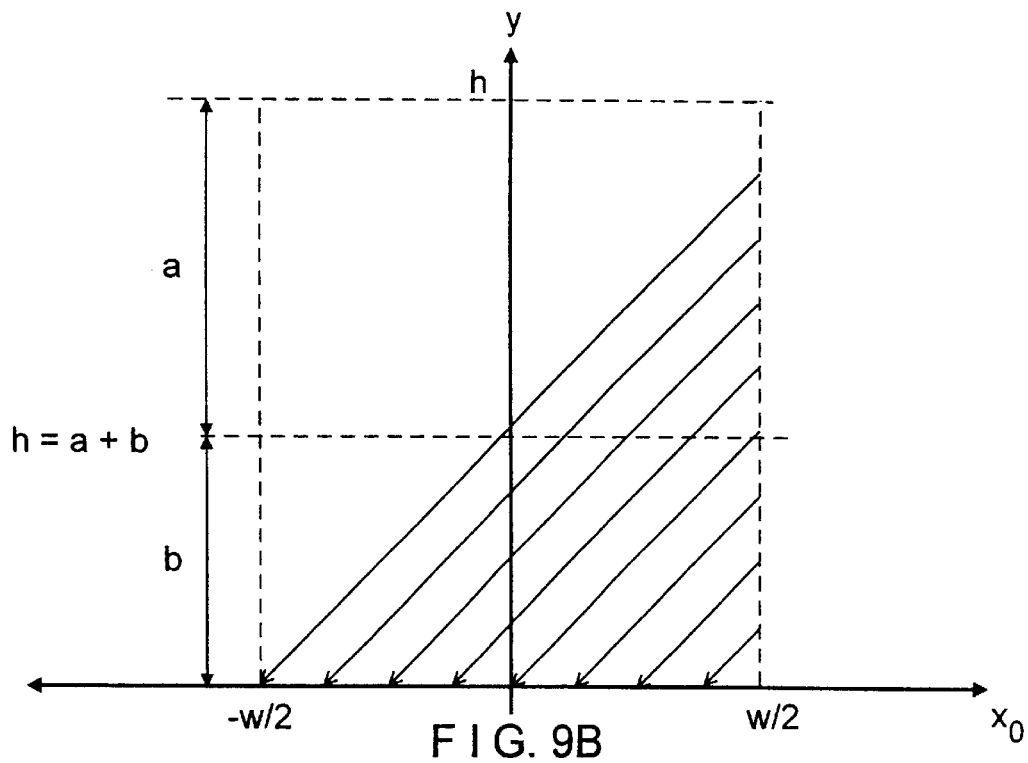
FIG. 9B is a schematic diagram showing the direction of omni-directional scanning provided in the X-Y plane of the 3-D scanning volume of tunnel scanning system of the first illustrative embodiment of the present invention, by the holographic laser scanning subsystems (indicated by L/B Corner #1, L/B Corner #2, L/F Corner #1 and L/B Corner #2) employed therein.

In general, each holographic laser scanning subsystem within these triple-disc scanners can be designed and constructed using the methods detailed in Applicant's copending application Ser. No. 08/949,915 filed Oct. 14, 1997; Ser. No. 08/854,832 filed May 12, 1997; Ser. No. 08/886,806 filed Apr. 22, 1997; Ser. No. 08/726,522 filed Oct. 7, 1996; and Ser. No. 08/573,949 filed Dec. 18, 1995, each incorporated herein by reference. The design parameters for each sixteen facet holographic scanning disc shown in FIG. 4A4, and the supporting subsystem used therewith, are set forth in the Table of FIG. 4A5. The design parameters set forth in the table of FIGS. 4A5 are defined in detail in the above-referenced U.S. patent applications. The scanning pattern projected within the middle (third) focal plane of the holographic scanning subsystem by one of its scanning platforms is shown in FIG. 4A9. The composite scanning pattern projected within the middle (third) focal/scanning plane of the triple-disc holographic scanning subsystem of FIG. 4A1 is shown in FIG. 4A10.

As shown in the system diagram of FIGS. 4A6A through 4A6C, each holographic laser scanning unit of the present invention 101 through 108 (denoted as Top/Front, Top/Back, Front, Back, Right Side/Front, Right Side/Back, Left Side/Front and Left Side/Back in FIGS. 1 through 1C) comprises a number of system components, many of which are realized on a control board 200, a plurality (e.g. six) analog signal processing boards 201A-201-F, and six digital signal processing boards 202A–202F.

As described in WIPO Patent Application Publication No. WO 98/22945, each holographic laser scanning unit 101 through 108 employed herein cyclically generates from its compact scanner housing 140 shown in FIG. 4A1, a complex three-dimensional laser scanning pattern within a well defined 3-D scanning volume which will be described in greater detail hereinbelow. In the system of the first illustrative embodiment, each such laser scanning pattern is generated by a rotating holographic scanning disc 130, about which are mounted five (5) independent laser scanning stations, sometime referred to as laser scanning modules by Applicants. In FIG. 4A1, these laser scanning stations are indicated by LS1, LS2, LS3, LS4 and LS5.

In FIG. 4A2, one of the laser scanning stations in the holographic scanner is shown in greater detail. For illustration purposes, all subcomponents associated therewith shall be referenced with the character "A", whereas the subcomponents associated with the other four laser scanning stations shall be referenced using the characters B through E. As illustrated in FIG. 4A2, the beam folding mirror 142A associated with each laser scanning station, has a substantially planar reflective surface and is tangentially mounted adjacent to the holographic scanning disc 130. In the illustrative embodiment, beam folding mirror 142A is supported in this position relative to the housing base (i.e. the optical bench) 143 using support legs 144A and 145A and rear support bracket 146.

As shown in FIG. 4A2, the laser beam production module 147 associated with each laser scanning station is mounted on the optical bench (i.e. housing base plate 143), immediately beneath its associated beam folding mirror 142A. Depending on which embodiment of the laser beam production module is employed in the construction of the holographic laser scanner, the position of the laser beam production module may be different.

As shown in FIGS. 3A2, six laser production modules 142A through 142E are mounted on base plate 143, substantially but not exactly symmetrically about the axis of rotation of the shaft of electric motor 150. During laser scanning operations, these laser beam production modules produce six independent laser beams which are directed through the edge of the holographic disc 130 at an angle of incidence $A_i$, which, owing to the symmetry of the laser scanning pattern of the illustrative embodiment, is the same for each laser scanning station (i.e. $A_i$=43.0 degrees for all values of i). The incident laser beams produced from the six laser beam production modules 142A through 142E extend along the five central reference planes, each extending normal to the plane of base plate 143 and arranged about 72 degrees apart from its adjacent neighboring central planes, as best illustrated in FIG. 4A2. While these central reference planes are not real (i.e. are merely virtual), they are useful in describing the geometrical structure of each laser scanning station in the holographic laser scanner of the present invention.

As shown in FIG. 4A2, the photodetector 152A (through 152E) of each laser scanning station is mounted along its central reference plane, above the holographic disc 130 and opposite its associated beam folding mirror 142A (through 142E) so that it does not block or otherwise interfere with the returning (i.e. incoming) laser light rays reflecting off light reflective surfaces (e.g. product surfaces, bar code symbols, etc) during laser scanning and light collecting operations. In the illustrative embodiment, the five photodetectors 152A through 152E are supported in their respective positions by a photodetector support frame 153 which is stationarily mounted to the optical bench by way of vertically extending support elements 154A through 154E. The electrical analog scan data signal produced from each photodetector is processed in a conventional manner by its analog scan data signal processing board 201A (through 201E) which is also supported upon the photodetector support frame, as shown. Notably, the height of the photodetector support board, referenced to the base plate (i.e. optical bench), is chosen to be less than the minimum height so that the beam folding mirrors must extend above the holographic disc in order to realize the prespecified laser scanning pattern of the illustrative embodiment. In practice, this height parameter is not selected (i.e. specified) until after the holographic disc has been completely designed according to the design process of the present invention, while satisfying the design constraints imposed on the disc design process. As explained in detail in WIPO Patent Application Publication No. WO 98/22945, the use of a spreadsheet-type computer program to analytically model the geometrical structure of both the laser scanning apparatus and the ray optics of the laser beam scanning process, allows the designer to determine the geometrical parameters associated with the holographic scanning facets on the disc which, given the specified maximum height of the beam folding mirrors $Y_j$, will produce the prespecified laser scanning pattern (including focal plane resolution) while maximizing the use of the available light collecting area on the holographic scanning disc.

As best shown in FIG. 4A3, the parabolic light collecting mirror 149A (through 149F) associated with each laser scanning station is disposed beneath the holographic scanning disc 130, along the central reference plane associated with the laser scanning station. While certainly not apparent from this figure, precise placement of the parabolic light collecting element (e.g. mirror) 149A relative to the holographic facets on the scanning disc 130 is a critical requirement for effective light detection by the photodetector (152A) associated with each laser scanning station. Placement of the photodetector at the focal point of the parabolic light focusing mirror alone is not sufficient for optimal light detection in the light detection subsystem of the present invention. As taught in WIPO Patent Application Publication No. WO 98/22945, careful analysis must be accorded to the light diffraction efficiency of the holographic facets on the scanning disc and to the polarization state(s) of collected and focused light rays being transmitted therethrough for detection. As will become more apparent hereinafter, the purpose of such light diffraction efficiency analysis ensures the realization of two important conditions, namely: (i) that substantially all of the incoming light rays reflected off an object (e.g. bar code symbol) and passing through the holographic facet (producing the corresponding instant scanning beam) are collected by the parabolic light collecting mirror; and (ii) that all of the light rays collected by the parabolic light collecting mirror are focused through the same holographic facet onto the photodetector associated with the station, with minimal loss associated with light diffraction and refractive scattering within the holographic facet. A detailed procedure is described in WIPO Patent Application Publication No. WO 98/22945 for designing and installing the parabolic light collecting mirror in order to satisfy the critical operating conditions above.

As shown in FIGS. 3A2 and 3A3, the five digital scan data signal processing boards 202A through 202E, are arranged in such a manner to receive and provide for processing the analog scan data signals produced from analog scan data signal processing boards 201A through 201E, respectively. As best shown in FIGS. 4A2 and 4A3, each digital scan data signal processing board is mounted vertically behind its respective beam folding mirror. A control board (i.e. motherboard) 200 is also mounted upon the base plate 143 for processing signals produced from the digital scan data signal processing boards. A conventional power supply board 155 is also mounted upon the base plate 143, within one of its extreme corners. The function of the digital scan data signal processing boards, the central processing board, and the power supply board will be described in greater detail in connection with the functional system diagram of FIGS. 4A6A through 4A6C. As shown, electrical cables are used to conduct electrical signals from each analog scan data signal processing board to its associated digital scan data signal processing board, and from each digital scan data signal processing board to the central processing board. Regulated power supply voltages are provided to the central signal processing board 200 by way of an electrical harness (not shown), for distribution to the various electrical and electro-optical devices requiring electrical power within the holographic laser scanner. In a conventional manner, electrical power from a standard 120 Volt, 60 HZ, power supply is provided to the power supply board by way of flexible electrical wiring (not shown). Symbol character data produced from the central processing board 200 is transmitted to the I/O subsystem 800, over a serial data transmission cable connected to a serial output (i.e. standard RS232) communications jack installed through a wall in the scanner housing 140.

Many of the system components comprising each of the holographic laser scanning units 101 through 116 are realized on control board 200, the plurality (e.g. five) analog signal processing boards 201A through 201E, and the six digital signal processing boards 202A through In the illustrative embodiment shown in FIG. 4A6A, each analog scan data signal processing board 201A through 201E has the following components mounted thereon: and photodetector 152A (through 152E) (e.g. a silicon photocell) for detection of analog scan data signals as described hereinabove; and analog signal processing circuit 235A (through 235E) for processing detected analog scan data signals.

In the illustrative embodiment, each photodetector 152A through 152E is realized as an opto-electronic device and each analog signal processing circuit 235A aboard the analog signal processing board (201A through 201E) is realized as an Application Specific Integrated Circuit (ASIC) chip. These chips are suitably mounted onto a small printed circuit (PC) board, along with electrical connectors which allow for interfacing with other boards within the scanner housing. With all of its components mounted thereon, each PC board is suitably fastened to the photodetector support frame 153, along its respective central reference frame, as shown in FIG. 4A2.

In a conventional manner, the optical scan data signal $D_0$ focused onto the photodetector 152A during laser scanning operations is produced by light rays of a particular polarization state (e.g. S polarization state) associated with a diffracted laser beam being scanned across a light reflective surface (e.g. the bars and spaces of a bar code symbol) and scattering thereoff. Typically, the polarization state distribution of the scattered light rays is altered when the scanned surface exhibits diffuse reflective characteristics. Thereafter, a portion of the scattered light rays are reflected along the same outgoing light ray paths toward the holographic facet which produced the scanned laser beam. These reflected light rays are collected by the scanning facet and ultimately focused onto the photodetector of the associated light detection subsystem by its parabolic light reflecting mirror 149A disposed beneath the scanning disc 130. The function of each photodetector 152A is to detect variations in the amplitude (i.e. intensity) of optical scan data signal $D_0$, and to produce in response thereto an electrical analog scan data signal $D_1$ which corresponds to such intensity variations. When a photodetector with suitable light sensitivity characteristics is used, the amplitude variations of electrical analog scan data signal $D_1$ will linearly correspond to the light reflection characteristics of the scanned surface (e.g. the scanned bar code symbol). The function of the analog signal processing circuitry is to band-pass filter and preamplify the electrical analog scan data signal $D_1$, in order to improve the SNR of the output signal.

In the illustrative embodiment of FIG. 4A1, each digital scan data signal processing board 202A through 202E is constructed in substantially the same manner. On each of these signal processing boards, the following devices are provided: an analog-to-digital (A/D) conversion circuit 238A through 238E, as taught in copending U.S. application Ser. No. 09/243,078 filed Feb. 2, 1999 and 09/241,930 filed Feb. 2, 1999, realizable as a first application specific integrated circuit (ASIC) chip; a programmable digitizing circuit 239A through 239E realized as a second ASIC chip; a start-of-facet-sector pulse (SOFSP) generator 236A through 236E realizable as a programmable IC chip, for generating SOFSPs relative to home-offset pulses (HOP) generated by a HOP generation circuit 244 on the control board 200, shown in FIG. 4A6B, and received by the SOFSP generator; an EPROM 237A through 237E for storing parameters and information represented in the tables of FIGS. 10B, 10D, 10E1 and 10E2; and a programmed decode computer 240A through 240E realizable as a microprocessor and associated program and data storage memory and system buses, for carrying out symbol decoding operations and recovery of SOFSPs from the digitizer circuit 239A in a synchronous, real-time manner as will be described in greater detail hereinafter. In the illustrative embodiment, the ASIC chips, the microprocessor, its associated memory and systems buses are all mounted on a single printed circuit (PC) board, using suitable electrical connectors, in a manner well known in the art.

The function of the A/D conversion circuit 238A is to perform a thresholding function on the second-derivative zero-crossing signal in order to convert the electrical analog scan data signal $D_1$ into a corresponding digital scan data signal $D_2$ having first and second (i.e. binary) signal levels which correspond to the bars and spaces of the bar code symbol being scanned. In practice, the digital scan data signal $D_2$ appears as a pulse-width modulated type signal as the first and second signal levels thereof vary in proportion to the width of bars and spaces in the scanned bar code symbol.

The function of the programmable digitizing circuit 239A of the present invention is two-fold: (1) to convert the digital scan data signal D2, associated with each scanned bar code symbol, into a corresponding sequence of digital words (i.e. a sequence of digital count values) $D_3$ representative of package identification (I.D.) data; and (2) to correlate time-based (or position-based) information about the facet sector on the scanning disc that generated the sequence digital count data (corresponding to a scanline or portion thereof) that was used to read the decoded bar code symbol on the package scanned in the scanning tunnel subsystem 100. Notably, in the digital word sequence D3, each digital word represents the time length duration of first or second signal level in the corresponding digital scan data signal $D_2$. Preferably, the digital count values are in a suitable digital format for use in carrying out various symbol decoding operations which, like the scanning pattern and volume of the present invention, will be determined primarily by the particular scanning application at hand. Reference is made to U.S. Pat. No. 5,343,027 to Knowles, incorporated herein by reference, as it provides technical details regarding the design and construction of microelectronic digitizing circuits suitable for use in each holographic laser scanning subsystem 101 through 116 in the system of the present invention.

In bar code symbol scanning applications, the each programmed decode computer 240A through 240E has two primary functions: (1) to receive each digital word sequence $D_3$ produced from its respective digitizing circuit 239A through 239E, and subject it to one or more bar code symbol decoding algorithms in order to determine which bar code symbol is indicated (i.e. represented) by the digital word sequence $D_3$, originally derived from corresponding scan data signal $D_1$ detected by the photodetector associated with the decode computer; and (2A) to generate a specification for the laser scanning beam (or plane-sector) that was used to collect the scan data underlying the decode bar code symbol, or alternatively, (2B) to generate a specification of the holographic scanning facet sector or segment that produced the collected scan data from which each laser-scanned bar code symbol is read.

In accordance with general convention, the first function of the programmed decode computer 240A hereof is to receive each digital word sequence $D_3$ produced from the digitizing circuit 239A, and subject it to one or more pattern recognition algorithms (e.g. character recognition algorithms) in order to determine which pattern is indicated by the digital word sequence $D_3$. In bar code symbol reading applications, in which scanned code symbols can be any one of a number of symbologies, a bar code symbol decoding algorithm with auto-discrimination capabilities can be used in a manner known in the art.

The second function of the programmed decode processor 240A through 240E is best described with reference to FIGS. 11D and 11E. In the illustrative embodiment hereof, each programmed decode computer 240A through 240E generates a specification for the laser scanning beam (or plane-sector) in terms of the minimum and maximum facet angles delimited by the facet sector involved in the scanning the decoded bar code symbol. Such minimum and maximum facet angles are indicated in the last column of the table shown in FIG. 11D. Alternatively, each programmed decode computer 240A through 240E could generate a specification of the holographic scanning facet sector or segment that produced the collected scan data from which each laser-scanned bar code symbol is read. In such a case, each programmed decode processor would generate for each decoded bar code symbol, the following items of information: the identification number of the laser scanning subsystem that produced the underlying scan data from which the bar code symbol was read; the identification number of the laser scanning station that produced the underlying scan data from which the bar code symbol was read; the facet number of the scanning facet on the scanning disc that produced the underlying scan data from which the bar code symbol was read; and the facet sector number of the scanning facet on the scanning disc that produced the underlying scan data from which the bar code symbol was read. Such information items could be generated using tables similar to those set forth in FIG. 11D, except that instead of reading out minimum and maximum facet angles (as provided in the rightmost column thereof), the facet sector (or segment) number could be read out, and assembled with the other items of information providing the specification of how the laser scanning beam in issue was generated from the holographic laser scanning subsystem. In either case, such information will enable the data management computer system 900 to compute a vector-based geometrical model of the laser scanning beam used to scan the read bar code symbol represented by the coordinated symbol character data.

As will be described in greater detail hereinafter, the geometrical model of the laser beam is produced in real-time aboard the data management computer system 900 using "3-D ray-tracing techniques" which trace the laser scanning beam from (1) its point of original on the holographic scanning disc, (2) to its point of reflection off the corresponding beam folding mirror, and (3) towards the focal point of the laser scanning beam determined by the focal length of the scanning facet involved in the production of the laser scanning beam. From the computed vector-based geometrical model of the laser scanning beam, the location of the decoded bar code symbol (i.e. when it was scanned by the laser scanning beam being geometrically modeled) can be specified (i.e. computed) in real-time relative to a local coordinate reference system symbolically embedded within the laser scanning subsystem.

As shown in FIG. 4A6B, the control board 200 comprises a number of components mounted on a small PC board, namely: a programmed microprocessor 242 with a system bus and associated program and data storage memory, for controlling the system operation of the holographic laser scanner and performing other auxiliary functions; first, second, third, forth and fifth serial data channels 243A through 243E, for receiving serial data input from the programmable decode computers 240A through 240E; an input/output (I/O) interface circuit 248 for interfacing with and transmitting symbol character data and other information to the subsystem 800, and ultimately to the data management computer system 900; home pulse detector 245 realizable as the electronic circuit shown in FIG. 4A6C, for detecting the home pulse generated when the laser beam 250 from VLD 253 (in home pulse marking sensing module 251 shown in FIG. 4A6C) is directed through home-pulse gap 260 (between Facets Nos. 6 and 7) and sensed by photodetector 253; and a home-offset-pulse (HOP) generator 244 realized as an ASIC chip, for generating a set of five home-offset pulses (HOPs) in response to the detection of each home pulse by circuit 245. In the illustrative embodiment, each serial data channel 243A through 243E is realized as an RS232 port, although it is understood that other structures may be used to realize the function performed thereby. The programmed control computer 242 also produces motor control signals, and laser control signals during system operation. These control signals are received as input by a power supply circuit 252 realized on the power supply PC board. Other input signals to the power supply circuit 252 include a 900 Volt, 60 Hz line voltage signal from a standard power distribution circuit. On the basis of the received input signals, the power supply circuit produces as output, (1) laser source enable signals to drive VLDs 253A through 253E, respectively, and (2) a motor enable signal in order to drive the scanning disc motor 150 coupled to holographic scanning disc 130.

Corner-Located Orthogonal Laser Scanning Subsystem of the Present Invention

Figure 7:
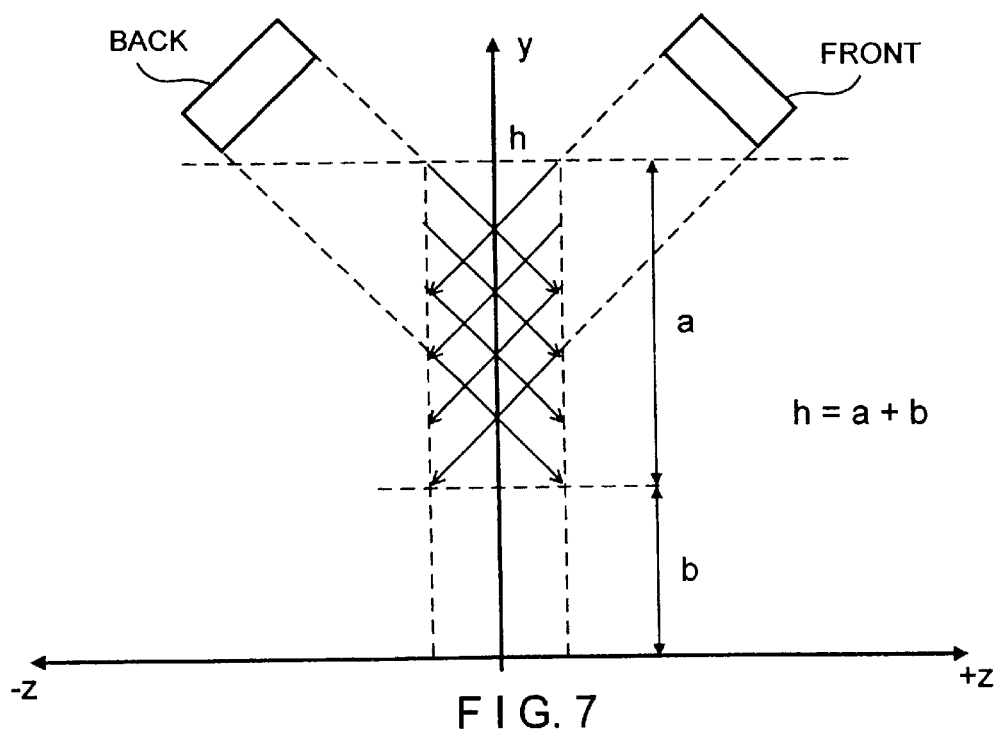

Each of the holographic scanners (denoted by R/F Corner #1, R/F Corner #2, R/B Corner #1, R/B Corner #2, L/F Corner #1, L/F Corner #2, L/B Corner #1 and L/B Corner #2 in FIG. 4A2 and 4A3) mounted within the corners of the scanner support framework are triple-disc holographic scanning subsystems designed to produce a 3-D scanning volume having three spatially-separated focal zones, best shown in FIG. 4B7. Within each of these focal zones, horizontal and vertically arranged (i.e. orthogonal) scanning planes are projected within the region defined by solid lines in FIG. 4B7, whereas only horizontal scanning planes are projected within the region defined by dotted lines in FIG. 4B7. Within the solid line defined region, ladder and picket-fence oriented bar code symbols are aggressively read, even if located on front-facing or back-facing surfaces, possibly downwardly directed, as in the case of postal tubs and trays used by the United States Postal Service (USPS. Each of these eight triple-disc holographic scanning subsystems (denoted as R/F Corner #1, R/F Corner #2, R/B Corner #1, R/B Corner #2, L/F Corner #1, L/F Corner #2, L/B Corner #1, L/B Corner #2) is shown in greater detail in FIGS. 4B1 through 4B12.

Figure 5A:
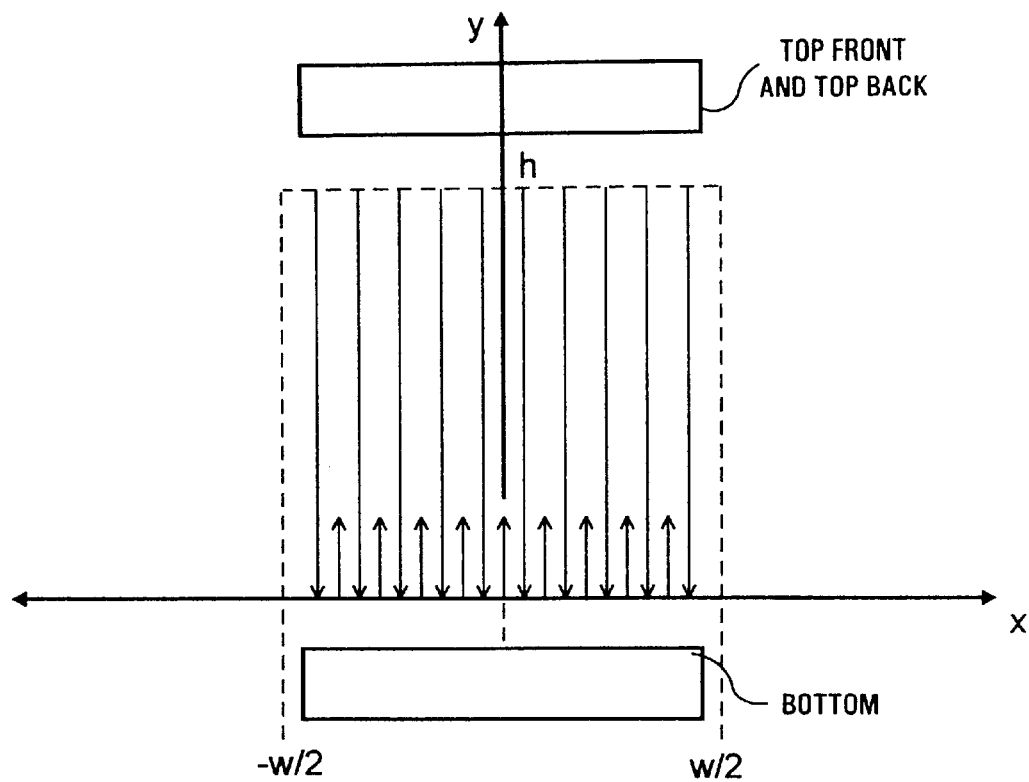
Figure 5B:
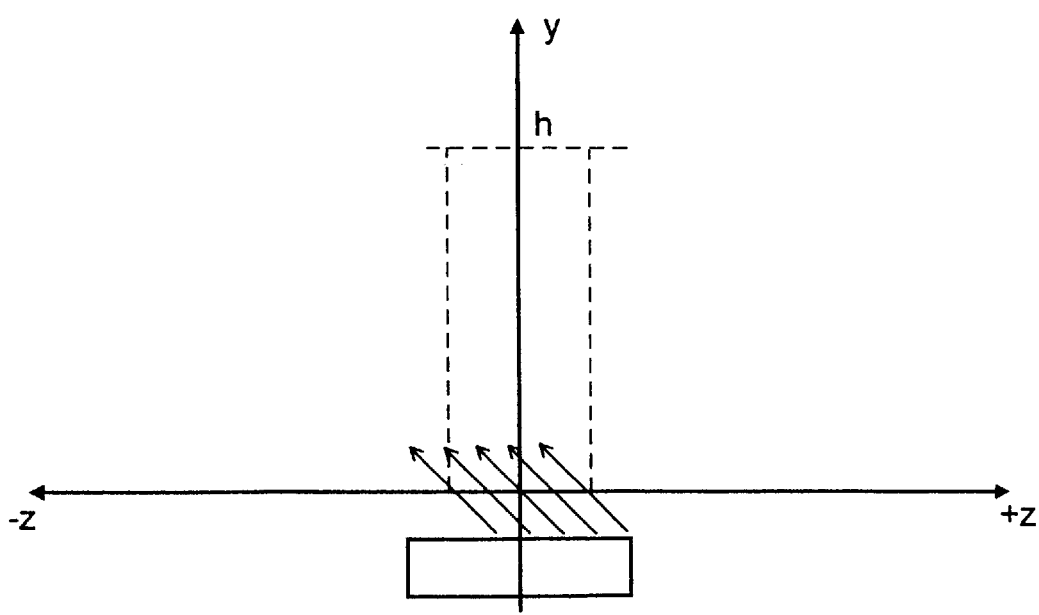

As shown in FIGS. 4B1 and 4B2, each triple-disc holographic scanning subsystem has three laser scanning platforms installed within a scanner housing 140'. Each laser scanning platform is similar in design to that shown in FIG. 4A2, and produces a 3-D laser scanning volume as shown in FIG. 4B5C. Each 3-D scanning volume contains an orthogonal-type laser scanning pattern having three non-contiguous (i.e. non-over-lapping focal zones) which are formed by six laser scanning stations that are indicated as LS1, LS2, LS3, LS4, LS5 and LS6 in FIG. 4B1, in a non-equally spaced apart manner specified in FIG. 4B1A, arranged about a twenty-one facet holographic scanning disc 130'. When combining a pair of such laser scanning platforms, an Ortho 2 Scanner is produced that is capable of producing a double-sized scanning volume as shown in FIG. 4B5B. When combining three such laser scanning platforms, an Ortho 3 Scanner is produced that is capable of producing a triple-sized scanning volume as shown in FIG. 4B5A.

Notably, laser scanning stations LS1, LS2, LS4 and LS5 indicated in FIG. 4B1 produce the horizontally (or near horizontally) oriented groups of laser scanning planes within the scanning volume of each orthogonal scanning subsystem 109 through 116. Laser scanning stations LS3 and LS6 indicated in FIG. 4B1 produce the vertically (or near vertically) oriented groups of laser scanning planes within the scanning volume of each orthogonal scanning subsystem 109 through 116. In order to increase the code element scanning resolution along the horizontal scanning direction of each orthogonal scanning subsystem, the laser beam production modules in laser scanning stations LS1, LS2, LS4 and LS5 employ different optics than laser scanning stations LS3 and LS5 to produce smaller spot sizes at each of the three focal zones, along the horizontal scanning direction, as evidenced by the spot size plots as a function of distance, shown in FIGS. 4B10 and 4B11. The scan pattern and scan speeds for such alternative embodiments of the orthogonal scanning subsystem of the present invention is shown in the specification table set forth in FIG. 4B5D.

In general, each holographic laser scanning platform within these triple-disc scanners 109 through 116 can be designed and constructed using the methods detailed in Applicant's copending application Ser. No. 08/949,915 filed Oct. 14, 1997; Ser. No. 08/854,832 filed May 12, 1997; Ser. No. 08/886,806 filed Apr. 22, 1997; Ser. No. 08/726,522 filed Oct. 7, 1996; and Ser. No. 08/573,949 filed Dec. 18, 1995, each incorporated herein by reference. The design parameters for each twenty-one facet holographic scanning disc shown in FIG. 4B2, and the supporting subsystem used therewith, are set forth in the Table of FIGS. 4B3A and 4B3B. The design parameters set forth in the table of FIGS. 4B3A and 4B3B are defined in detail in the above-referenced U.S. patent applications. The laser scanning pattern produced by one of the scanning platforms in the subsystem of FIG. 4B1 is graphically depicted in FIG. 4B8. The laser scanning pattern produced by all three of the scanning platforms in the subsystem of FIG. 4B1 is graphically depicted in FIG. 4B9. The time-lapsed composite scan coverage pattern produced by the holographic scanning subsystem of FIG. 4B1, over the length of its scanning volume, is graphically depicted in FIG. 4B12.

As shown in the system diagram of FIGS. 4B4A through 4B4C, each holographic laser scanning unit of the present invention 108 through 116 (denoted as R/F Corner #1, R/F Corner #2, R/B Corner #1, R/B Corner #2, L/F Corner #1, L/F Corner #2, L/B Corner #1, L/B Corner #2 in FIGS. 1 through 1C) comprises a number of system components, many of which are realized on a control board 200', a plurality (e.g. six) analog signal processing boards 201A' through 201E', and six digital signal processing boards 202A' through 202E'.

As described in WIPO Patent Application Publication No. WO 98/22945, each holographic laser scanning unit 109 through 116 employed herein cyclically generates from its compact scanner housing 140' shown in FIG. 4B1, a complex three-dimensional laser scanning pattern within a well defined 3-D scanning volume which will be described in greater detail hereinbelow. In the system of the first illustrative embodiment, each such laser scanning pattern is generated by a rotating holographic scanning disc 130', about which are mounted six (5) independent laser scanning stations. In FIG. 4B1, these laser scanning stations are indicated by LS1, LS2, LS3, LS4, LS5 and LS6.

In general, the design and construction of the laser scanning subsystem of FIG. 4B1 is similar to that shown in FIGS. 4A1 and 4A2, except that the number of scanning stations employed is six rather than five, the angular spacing thereof is not even between each scanning station, as shown in FIG. 4B1A, and the holographic scanning disc of FIG. 4B2 has twenty-one scanning facets with different optical characteristics, as revealed in the disc design table set forth in FIGS. 4B3A and 4B3B.

As shown in FIGS. 4B1 and 4B4A, the six digital scan data signal processing boards 202A' through 202F', are arranged in such a manner to receive and provide for processing the analog scan data signals produced from analog scan data signal processing boards 201A through 201F, respectively. As shown in FIGS. 4B1, each digital scan data signal processing board is mounted vertically behind its respective beam folding mirror. A control board (i.e. motherboard) 200' is also mounted upon the base plate 143' for processing signals produced from the digital scan data signal processing boards. A conventional power supply board 155' is also mounted upon the base plate 143', within one of its extreme corners. The function of the digital scan data signal processing boards, the central processing board, and the power supply board will be described in greater detail in connection with the functional system diagram of FIGS. 4B4A through 4B4C. As shown, electrical cables are used to conduct electrical signals from each analog scan data signal processing board to its associated digital scan data signal processing board, and from each digital scan data signal processing board to the central processing board. Regulated power supply voltages are provided to the central signal processing board 200' by way of an electrical harness (not shown), for distribution to the various electrical and electro-optical devices requiring electrical power within the holographic laser scanner. In a conventional manner, electrical power from a standard 120 Volt, 60 HZ, power supply is provided to the power supply board by way of flexible electrical wiring (not shown). Symbol character data produced from the central processing board 200' is transmitted to the I/O subsystem 800, over a serial data transmission cable connected to a serial output (i.e. standard RS232) communications jack installed through a wall in the scanner housing 140'.

Many of the system components comprising each of the holographic laser scanning units 109 through 116 are realized on control board 200', the plurality (e.g. six) analog signal processing boards 201A through 201E, and the six digital signal processing boards 202A' through 202F. In the illustrative embodiment shown in FIG. 4B4A, each analog scan data signal processing board 201A' through 201F' has the following components mounted thereon: and photodetector 152A' (through 152F') (e.g. a silicon photocell) for detection of analog scan data signals as described hereinabove; and analog signal processing circuit 235A' (through 235F) for processing detected analog scan data signals.

In the illustrative embodiment, each photodetector 152A' through 152F' is realized as an opto-electronic device and each analog signal processing circuit 235A' aboard the analog signal processing board (201A' through 201F') is realized as an Application Specific Integrated Circuit (ASIC) chip. These chips are suitably mounted onto a small printed circuit (PC) board, along with electrical connectors which allow for interfacing with other boards within the scanner housing. With all of its components mounted thereon, each PC board is suitably fastened to the photodetector support frame 153', along its respective central reference frame.

In a conventional manner, the optical scan data signal $D_0$ focused onto the photodetector 152A' during laser scanning operations is produced by light rays of a particular polarization state (e.g. S polarization state) associated with a diffracted laser beam being scanned across a light reflective surface (e.g. the bars and spaces of a bar code symbol) and scattering thereoff.

Typically, the polarization state distribution of the scattered light rays is altered when the scanned surface exhibits diffuse reflective characteristics. Thereafter, a portion of the scattered light rays are reflected along the same outgoing light ray paths toward the holographic facet which produced the scanned laser beam. These reflected light rays are collected by the scanning facet and ultimately focused onto the photodetector of the associated light detection subsystem by its parabolic light reflecting mirror 149A' disposed beneath the scanning disc 130'. The function of each photodetector 152A' is to detect variations in the amplitude (i.e. intensity) of optical scan data signal $D_0$, and to produce in response thereto an electrical analog scan data signal $D_1$ which corresponds to such intensity variations. When a photodetector with suitable light sensitivity characteristics is used, the amplitude variations of electrical analog scan data signal $D_1$ will linearly correspond to the light reflection characteristics of the scanned surface (e.g. the scanned bar code symbol). The function of the analog signal processing circuitry is to band-pass filter and preamplify the electrical analog scan data signal $D_1$, in order to improve the SNR of the output signal.

In the illustrative embodiment of FIG. 4B1, each digital scan data signal processing board 202A' through 202F' is constructed in substantially the same manner. On each of these signal processing boards, the following devices are provided: an analog-to-digital (A/D) conversion circuit 238A' through 238F' as taught in copending U.S. application Ser. No. 09/243,078 filed Feb. 2, 1999 and 09/241,930 filed Feb. 2, 1999, realizable as a first application specific integrated circuit (ASIC) chip; a programmable digitizing circuit 239A' through 239F' realized as a second ASIC chip; a start-of-facet-sector pulse (SOFSP) generator 236A' through 236F' realizable as a programmable IC chip, for generating SOFSPs relative to home-offset pulses (HOP) generated by a HOP generation circuit 244' on the control board 200', shown in FIG. 4B4B, and received by the SOFSP generator; an EPROM 237A' through 237F' for storing parameters and information represented in the tables of FIGS. 10B, 10D, 10E1 and 10E2; and a programmed decode computer 240A' through 240F' realizable as a microprocessor and associated program and data storage memory and system buses, for carrying out symbol decoding operations and recovery of SOFSPs from the digitizer circuit 239A' in a synchronous, real-time manner as will be described in greater detail hereinafter. In the illustrative embodiment, the ASIC chips, the microprocessor, its associated memory and systems buses are all mounted on a single printed circuit (PC) board, using suitable electrical connectors, in a manner well known in the art.

The function of the A/D conversion circuit 238A' is to perform a thresholding function on the second-derivative zero-crossing signal in order to convert the electrical analog scan data signal $D_1$ into a corresponding digital scan data signal $D_2$ having first and second (i.e. binary) signal levels which correspond to the bars and spaces of the bar code symbol being scanned. In practice, the digital scan data signal $D_2$ appears as a pulse-width modulated type signal as the first and second signal levels thereof vary in proportion to the width of bars and spaces in the scanned bar code symbol.

The function of the programmable digitizing circuit 239A' of the present invention is two-fold: (1) to convert the digital scan data signal D2, associated with each scanned bar code symbol, into a corresponding sequence of digital words (i.e. a sequence of digital count values) $D_3$ representative of package identification (I.D.) data; and (2) to correlate time-based (or position-based) information about the facet sector on the scanning disc that generated the sequence digital count data (corresponding to a scanline or portion thereof) that was used to read the decoded bar code symbol on the package scanned in the scanning tunnel subsystem 100. Notably, in the digital word sequence D3, each digital word represents the time length duration of first or second signal level in the corresponding digital scan data signal $D_2$. Preferably, the digital count values are in a suitable digital format for use in carrying out various symbol decoding operations which, like the scanning pattern and volume of the present invention, will be determined primarily by the particular scanning application at hand. Reference is made to U.S. Pat. No. 5,343,027 to Knowles, incorporated herein by reference, as it provides technical details regarding the design and construction of microelectronic digitizing circuits suitable for use in each orthogonal laser scanning subsystem 109 through 116 in the system of the present invention.

In bar code symbol scanning applications, the each programmed decode computer 240A' through 240F' has two primary functions: (1) to receive each digital word sequence $D_3$ produced from its respective digitizing circuit 239A' through 239F', and subject it to one or more bar code symbol decoding algorithms in order to determine which bar code symbol is indicated (i.e. represented) by the digital word sequence $D_3$, originally derived from corresponding scan data signal $D_1$ detected by the photodetector associated with the decode computer; and (2A) to generate a specification for the laser scanning beam (or plane-sector) that was used to collect the scan data underlying the decode bar code symbol, or alternatively, (2B) to generate a specification of the holographic scanning facet sector or segment that produced the collected scan data from which each laser-scanned bar code symbol is read.

In accordance with general convention, the first function of the programmed decode computer 240A' hereof is to receive each digital word sequence $D_3$ produced from the digitizing circuit 239A', and subject it to one or more pattern recognition algorithms (e.g. character recognition algorithms) in order to determine which pattern is indicated by the digital word sequence $D_3$. In bar code symbol reading applications, in which scanned code symbols can be any one of a number of symbologies, a bar code symbol decoding algorithm with auto-discrimination capabilities can be used in a manner known in the art.

The second function of the programmed decode processor 240A' through 240F' is best described with reference to FIGS. 11D and 11E. In the illustrative embodiment hereof, each programmed decode computer 240A through 240E generates a specification for the laser scanning beam (or plane-sector) in terms of the minimum and maximum facet angles delimited by the facet sector involved in the scanning the decoded bar code symbol. Such minimum and maximum facet angles are indicated in the last column of the table shown in FIG. 11D.

Alternatively, each programmed decode computer 240A' through 240F' could generate a specification of the holographic scanning facet sector or segment that produced the collected scan data from which each laser-scanned bar code symbol is read. In such a case, each programmed decode processor would generate for each decoded bar code symbol, the following items of information: the identification number of the laser scanning subsystem that produced the underlying scan data from which the bar code symbol was read; the identification number of the laser scanning station that produced the underlying scan data from which the bar code symbol was read; the facet number of the scanning facet on the scanning disc that produced the underlying scan data from which the bar code symbol was read; and the facet sector number of the scanning facet on the scanning disc that produced the underlying scan data from which the bar code symbol was read. Such information items could be generated using tables similar to those set forth in FIG. 11D, except that instead of reading out minimum and maximum facet angles (as provided in the rightmost column thereof), the facet sector (or segment) number could be read out, and assembled with the other items of information providing the specification of how the laser scanning beam in issue was generated from the holographic laser scanning subsystem. In either case, such information will enable the data management computer system 900 to compute a vector-based geometrical model of the laser scanning beam used to scan the read bar code symbol represented by the coordinated symbol character data.

As will be described in greater detail hereinafter, the geometrical model of the laser beam is produced in real-time aboard the data management computer system 900 using "3-D ray-tracing techniques" which trace the laser scanning beam from (1) its point of original on the holographic scanning disc, (2) to its point of reflection off the corresponding beam folding mirror, and (3) towards the focal point of the laser scanning beam determined by the focal length of the scanning facet involved in the production of the laser scanning beam. From the computed vector-based geometrical model of the laser scanning beam, the location of the decoded bar code symbol (i.e. when it was scanned by the laser scanning beam being geometrically modeled) can be specified (i.e. computed) in real-time relative to a local coordinate reference system symbolically embedded within the laser scanning subsystem.

As shown in FIG. 4B4B, the control board 200' comprises a number of components mounted on a small PC board, namely: a programmed microprocessor 242' with a system bus and associated program and data storage memory, for controlling the system operation of the holographic laser scanner and performing other auxiliary functions; first, second, third, forth and fifth serial data channels 243A' through 243F', for receiving serial data input from the programmable decode computers 240A' through 240F'; an input/output (I/O) interface circuit 248' for interfacing with and transmitting symbol character data and other information to the I/O subsystem 800, and ultimately to the data management computer system 900; home pulse detector 245' realizable as the electronic circuit shown in FIG. 4B4C, for detecting the home pulse generated when the laser beam 250' from VLD 253' (in home pulse marking sensing module 251 ' shown in FIG. 4B4C) is directed through home-pulse gap 260' (between Facets Nos. 4 and 8) and sensed by photodetector 253'; and a home-offset-pulse (HOP) generator 244' realized as an ASIC chip, for generating a set of five home-offset pulses (HOPs) in response to the detection of each home pulse by circuit 245'. In the illustrative embodiment, each serial data channel 243A' through 243F' is realized as an RS232 port, although it is understood that other structures may be used to realize the function performed thereby. The programmed control computer 242' also produces motor control signals, and laser control signals during system operation. These control signals are received as input by a power supply circuit 252' realized on the power supply PC board. Other input signals to the power supply circuit 252' include a 900 Volt, 60 Hz line voltage signal from a standard power distribution circuit. On the basis of the received input signals, the power supply circuit produces as output, (1) laser source enable signals to drive VLDs 253A' through 253F', respectively, and (2) a motor enable signal in order to drive the scanning disc motor 150 coupled to holographic scanning disc 130'.

Figure 13B:
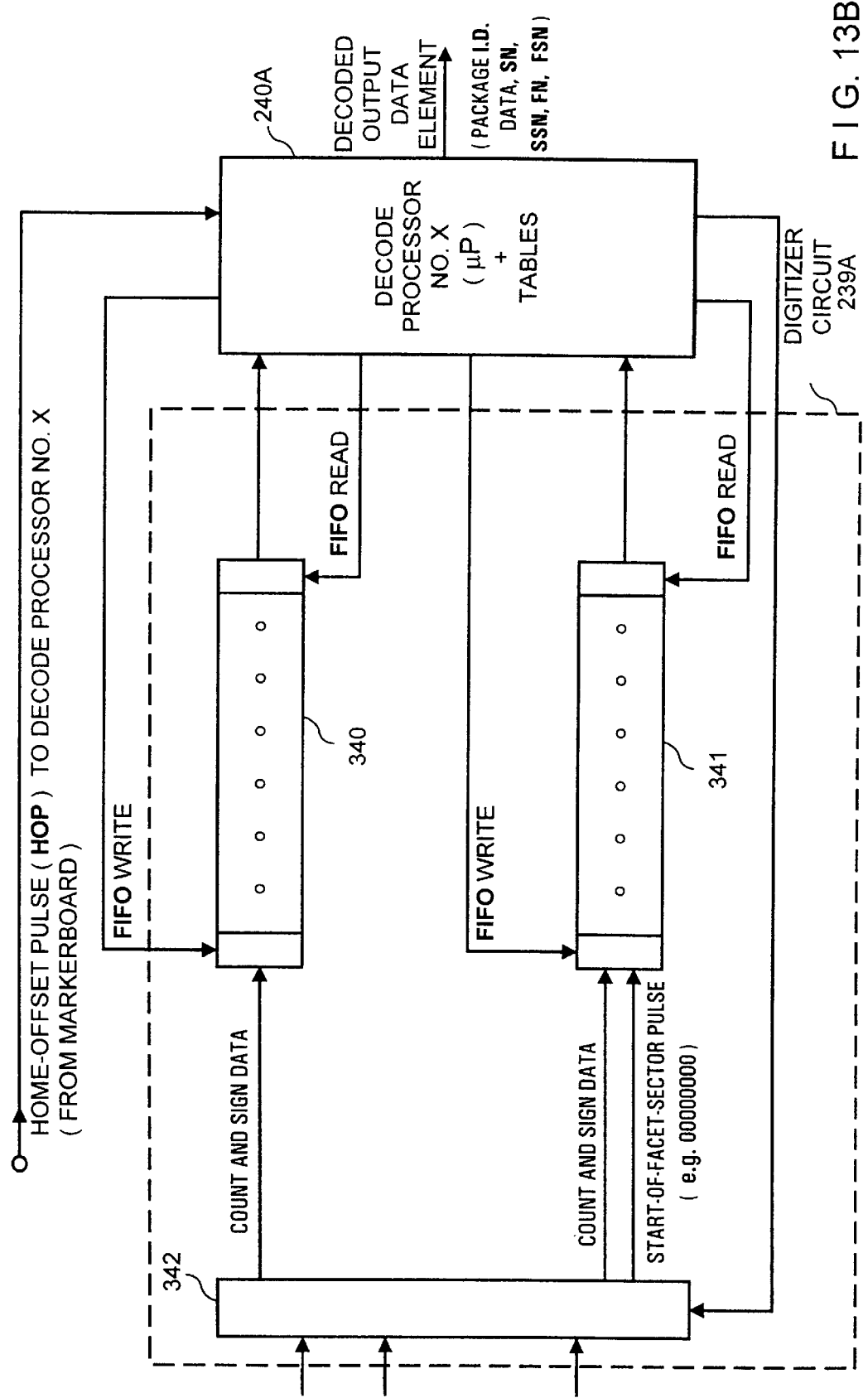
FIG. 13B is a schematic diagram showing the digitizing circuit of FIGS. 13A1 and 13A2 in greater detail.
Figure 13D:
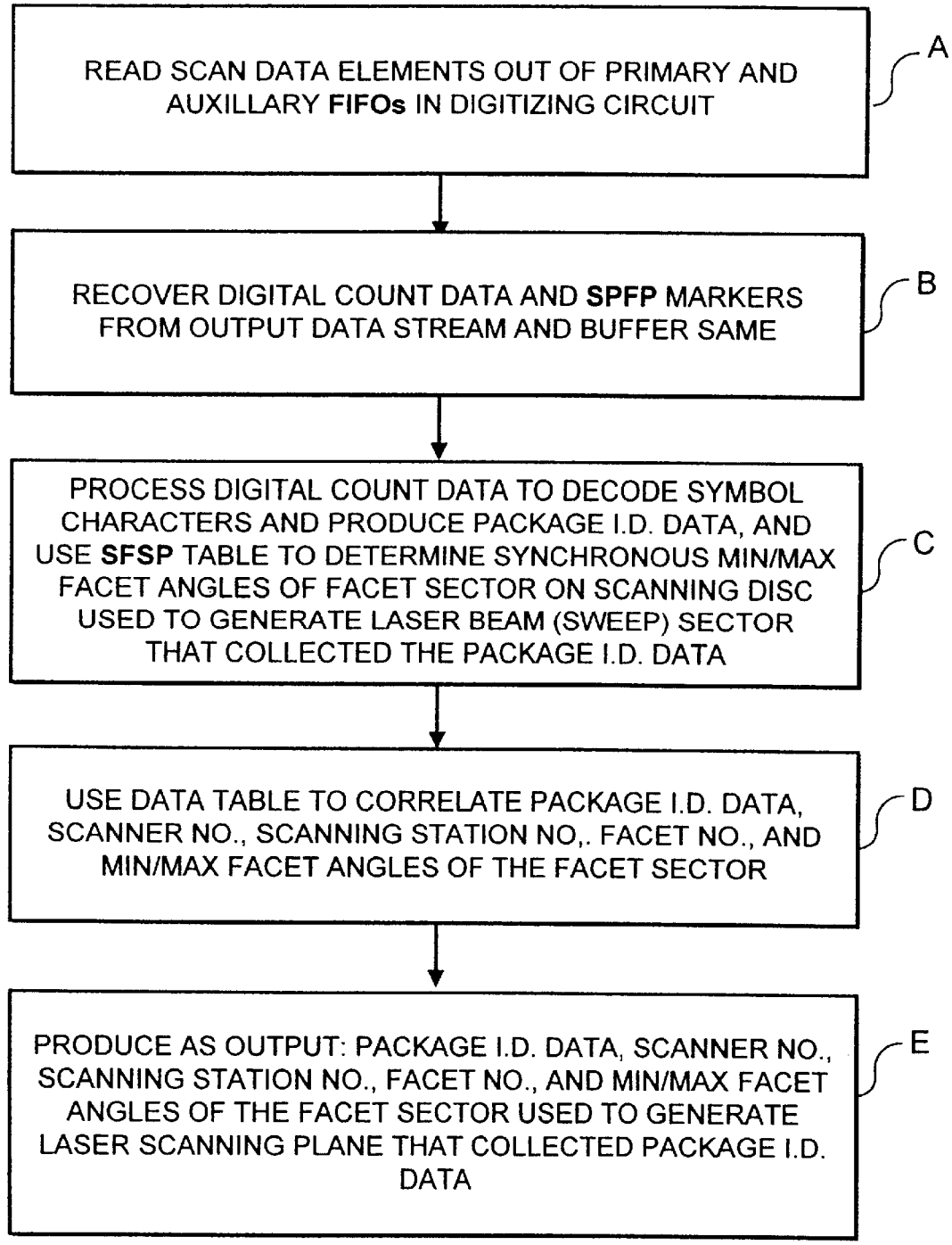
FIG. 13D is a high level flow chart describing the steps of the process carried out by the decode processor of the present invention shown in FIG. 12B.

As shown in FIG. 4B13, when using four orthogonal scanning subsystems of the type shown in FIG. 4B1, alone or in combination with other laser or CCD scanning subsystems (e.g. as shown in FIG. 4A1), the orthogonal scanning zones produced by each scanning subsystem spatially and orthogonally overlap above and across the width of the conveyor belt, at four regions indicated by OZ1, OZ2, OZ3 and OZ4 in FIG. 4B13. Thus, when bar code symbols arranged in either a ladder or picket-fence orientation on the front or rear surface of a package moving along the conveyor belt, and to some degree bar code symbols located on the side surfaces of such packages, will be aggressively scanned by both the horizontally and vertically (i.e. orthogonally) oriented laser scanning planes (or lines) produced at the orthogonal regions of the three focal zones of at least one corner-mounted orthogonal scanning subsystem. Even when bar code symbols are located on the front or back surfaces of package surfaces facing downwardly towards to the conveyor surface, the orthogonal scanning regions of the resulting orthogonal scanning volume will aggressively read the code symbol in a highly reliable manner.

As shown in FIG. 4B14, when using eight orthogonal scanning subsystems of the type shown in FIG. 4B1, alone or in combination with other laser or CCD scanning subsystems (e.g. as shown in FIG. 4A1), the orthogonal scanning zones produced by each scanning subsystem spatially and orthogonally overlap above and across the width of the conveyor belt, at many regions to complex to graphically identify by reference numbers in FIG. 4B13. Thus, when bar code symbols arranged in either a ladder or picket-fence orientation on the front or rear surface of a package moving along the conveyor belt, and to some degree bar code symbols located on the side surfaces of such packages, will be very aggressively scanned by both the horizontally and vertically (i.e. orthogonally) oriented laser scanning planes (or lines) produced at the orthogonal regions of the three focal zones of at least one corner-mounted orthogonal scanning subsystem. Even when bar code symbols are located on the front or back surfaces of package surfaces facing downwardly towards to the conveyor surface, the orthogonal scanning regions of the resulting orthogonal scanning volume will aggressively read the code symbol in a highly reliable manner.

The time-lapsed scan coverage pattern shown in FIG. 4B12 graphically indicates how many laser scanning lines are projected across the front or rear surface of a package as it moves through an orthogonal scanning system, as shown in either FIG. 4B13 or FIG. 4B14.

Polygonal-Based Bottom Scanning Subsystem of the Present Invention

The bottom-mounted fixed projection scanner (denoted as Bottom) employed in the tunnel scanning system hereof is shown in greater detail in FIGS. 4C1 through 4C7. As shown in FIG. 4C1, the bottom-mounted scanner comprises eight fixed-projection laser scanning subsystems 118, shown in FIG. 4C2, that are mounted along optical bench 119 shown in FIG. 4C1. Each fixed projection scanning subsystem 118 comprises: four stationary mirrors 120A through 120D arranged about a central reference plane passing along the longitudinal extent of the optical bench 121 of the subsystem; and eight-sided motor driven polygon scanning element 122 mounted closely to the nested array of mirrors 120A through 120D; a light collecting mirror 123 mounted above the nested array along the central reference plane; a laser diode 124 for producing a laser beam which is passed through collecting mirror 123 and strikes the polygon scanning element 122; and a photodetector 125, mounted above the polygon scanning element 122, for detecting reflected laser light and produce scan data signals indicative of the detected laser light intensity for subsequent signal processing in a manner known in the bar code reading 10 art.

As shown in FIG. 4C1, each subsystem 118 is mounted on optical bench 119, and a housing 126 with light transmission aperture 127, is mounted to the optical bench 119 in a conventional manner. As shown, a protective, scratch-resistant scanning window pane 128 is mounted over the light transmission aperture 127 to close off the interior of the housing from (dust, dirt and other forms of debris. When the bottom scanning unit 117 is assembled, it is then mounted to a pair of support brackets 129 which in turn are mounted to a base support bracket 130 connected to the scanning tunnel framework 304A, clearly shown in FIG. 1C. As shown in FIG. 4C2, the scanning unit 117 is mounted relative to the conveyor belt sections 302A and 302B so that the scanning window 128 on the bottom scanning unit 117 is disposed at about 28° to the protective conveyor window 306, disposed over the gap region 305 (e.g. about 5.0 inches wide) formed between the conveyor belt sections 302A and 302B. As shown in FIG. 4C2, the bottom scanning unit 117 is mounted about 12.5 inches below the conveyor scanning window 306. Also, the symbol character data outputs from subsystems 118 are supplied to a digital data multiplexer 130 which transmits the symbol character data to the I/O subsystem 800, shown in FIG. 3.

The partial scan patterns produced by individual stationary mirrors 120B, 102C and 120A, 120D, respectively, in each subsystem 118 are shown in FIGS. 4C4 and 4C5, respectively.

Figure 6:
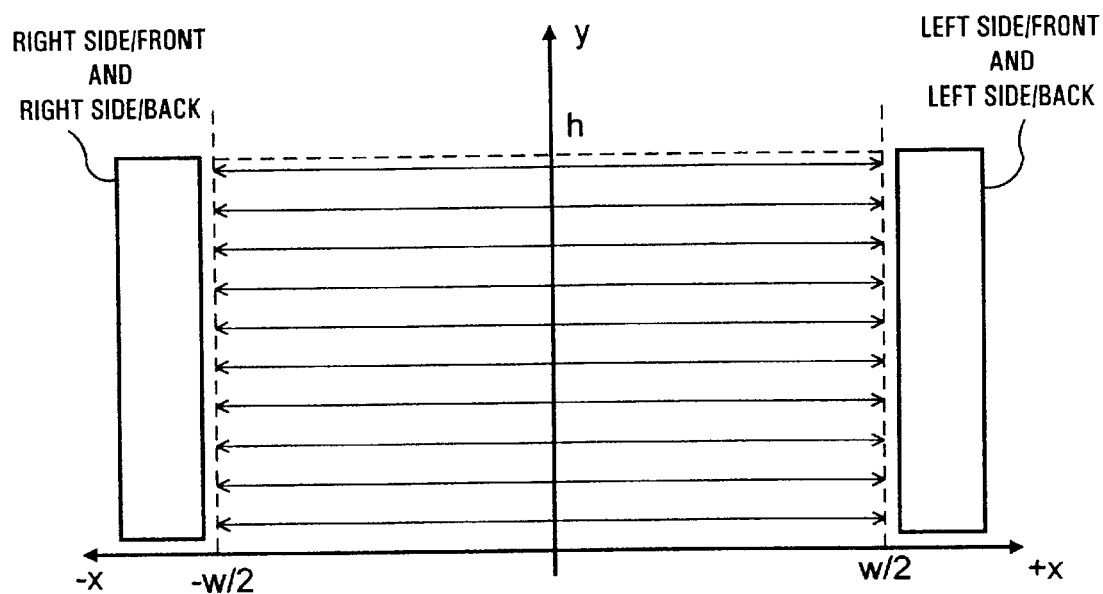

The complete pattern generated by each subsystem 118 is shown in FIG. 4C6. The composite omnidirectional scanning pattern generated by the eight subsystems 118 working together in the bottom scanner unit is shown in FIG. 4C7.

Figure 10A:
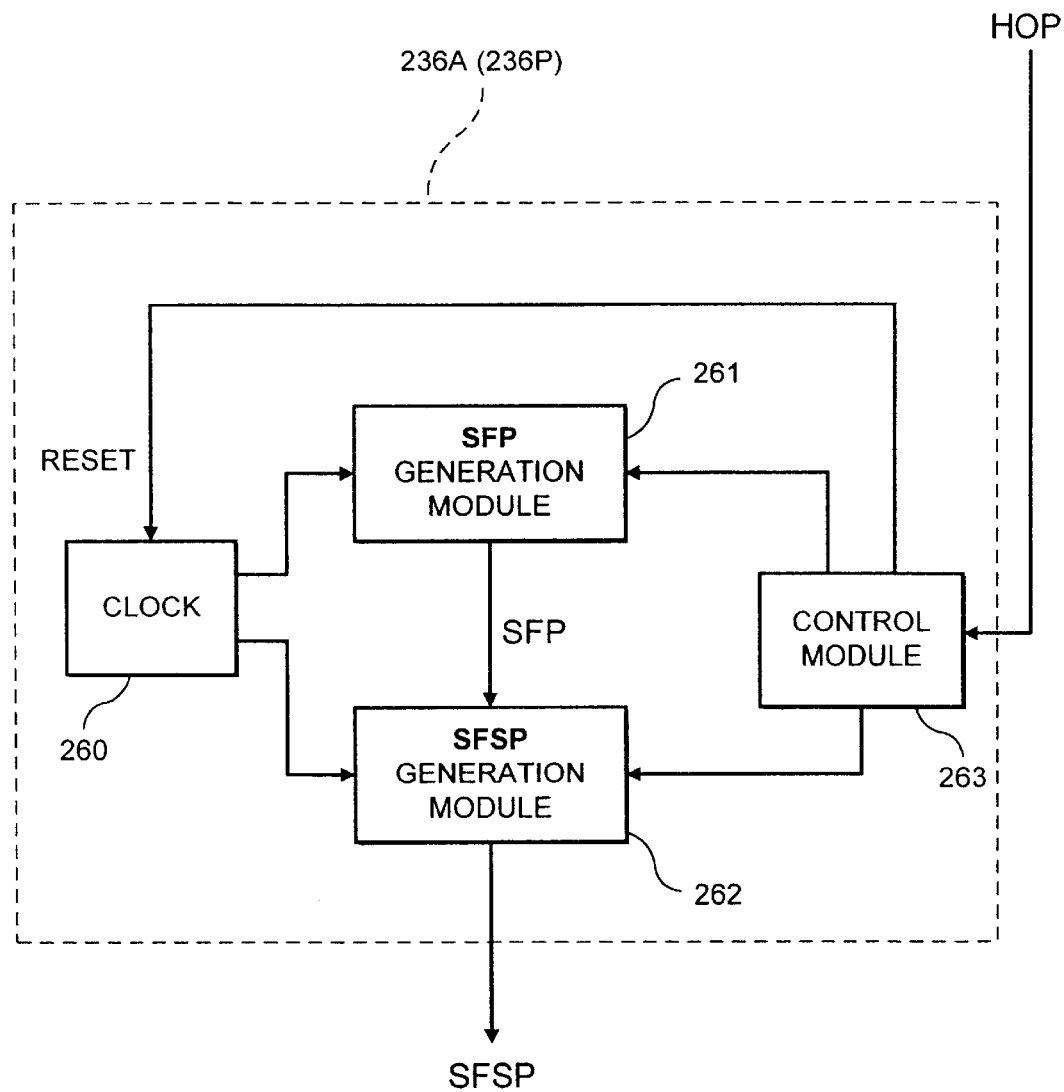
FIG. 10A is a schematic representation of the start-of-facet-sector pulse (SOFSP) generator employed on each decode board associated with a holographic laser scanning subsystem in the system of the first illustrative embodiment of the present invention.
Figure 10C:
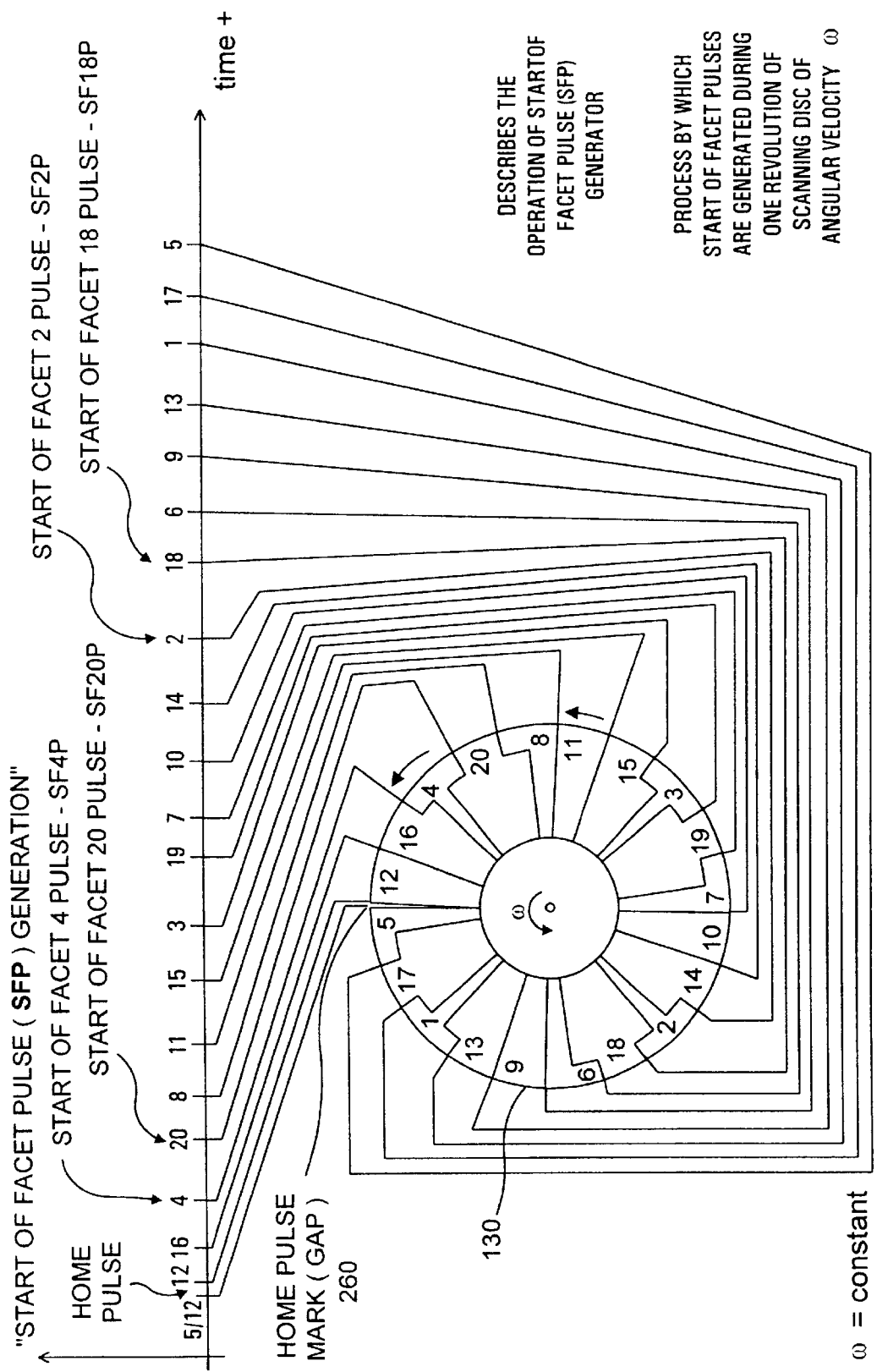
FIG. 10C is a schematic representation of the operation of the start-of-facet pulse (SOFP) generator employed within each SOFSP generator of the present invention, wherein start of facet pulses are generated within the SOFP generator relative to the home-offset pulse (HOP) received from the HOP generator on the control board associated with each holographic scanning disc.
Figure 10F:
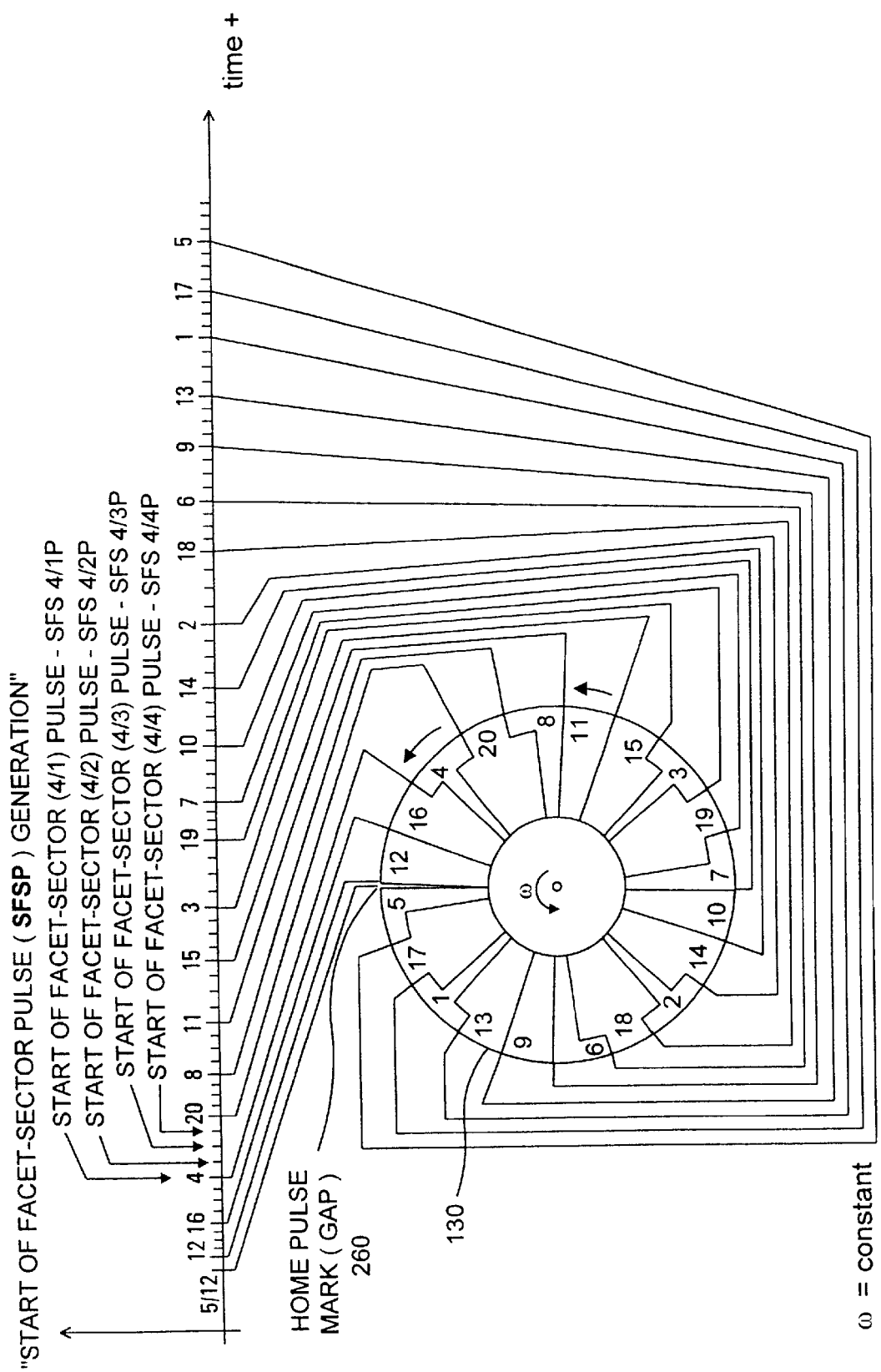
FIG. 10F is a schematic representation of the operation of the start-of-facet-sector pulse (SOFSP) generator of the present invention, wherein start of facet sector pulses (SOFSPs) are generated within the SOFSP generator relative to the home-offset pulse (HOP) received from the HOP generator on the control board associated with each holographic scanning disc.
Figure 11B:
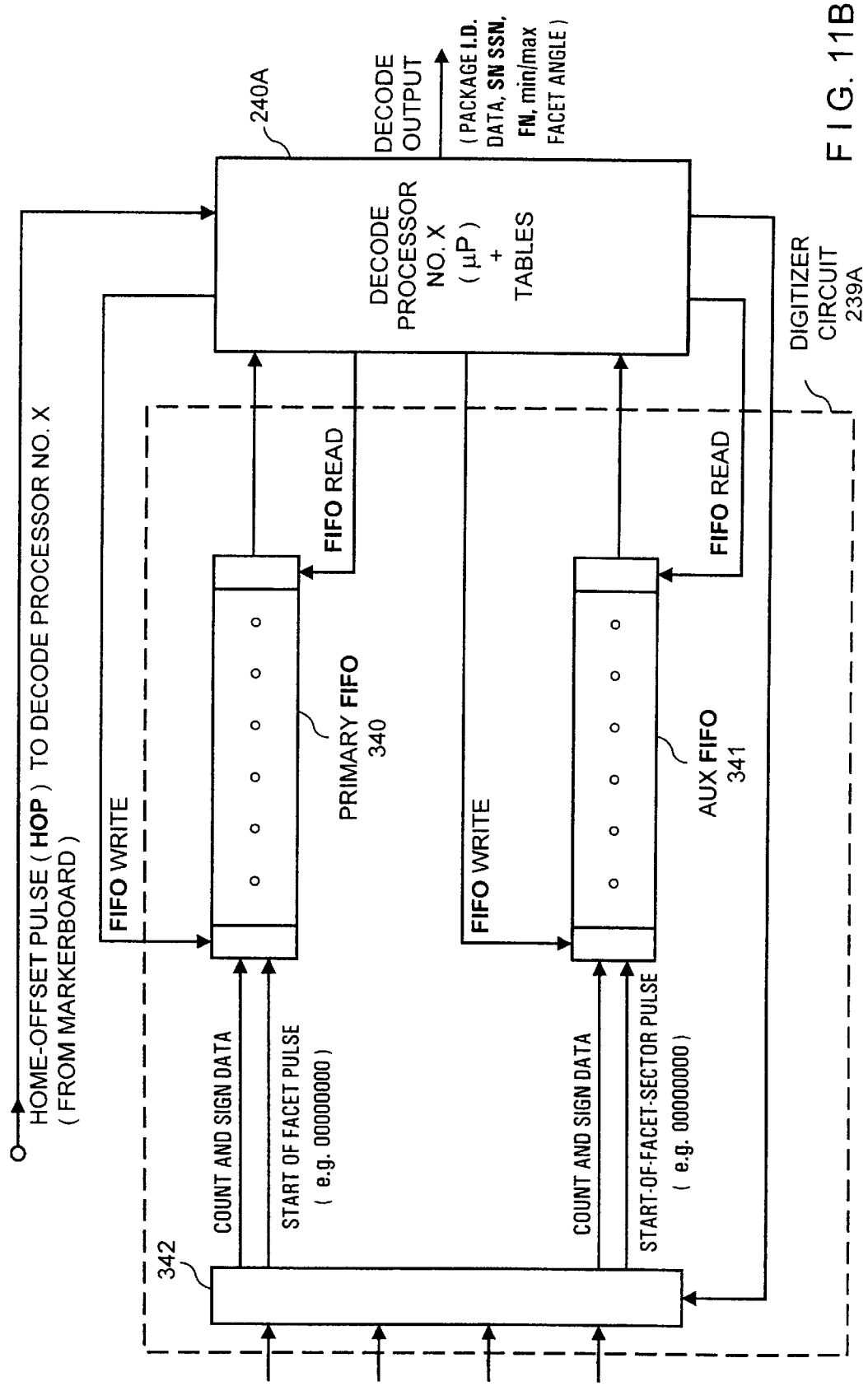
FIG. 11B is a schematic diagram showing in greater detail the digitizing circuit shown in FIG. 10.
Figure 11E:
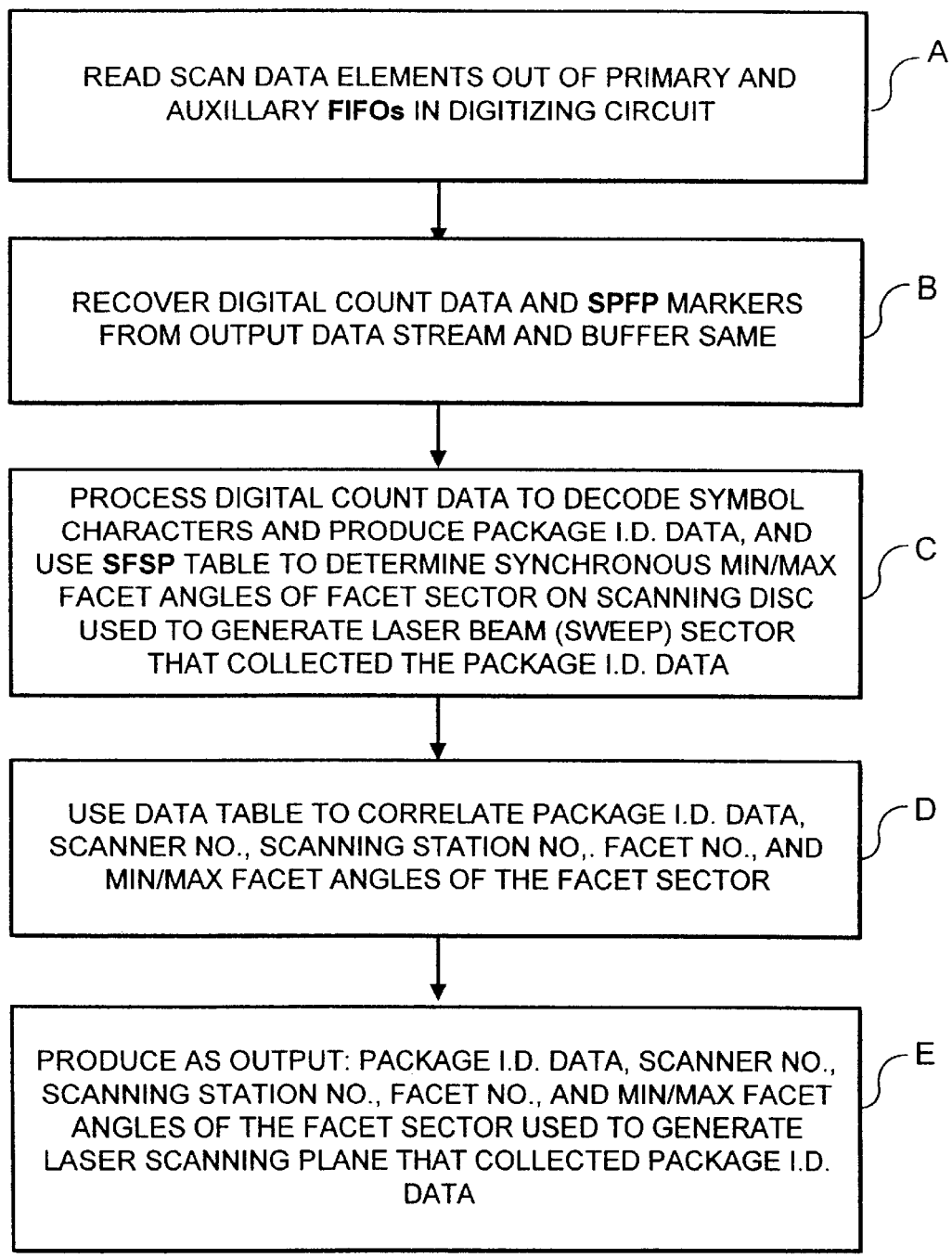
FIG. 11E is a high level flow chart describing the steps of the process carried out by the decode processor of the present invention shown in FIG. 11B.

First Method of Determining Laser Beam Position in Laser Scanning Subsystems Hereof Under Constant Scanning Motor Speed Conditions In FIGS. 10 through 11E, a first method is shown for (i) determining the position of the laser scanning beam produced by either the laser scanning subsystems shown in FIG. 4A1 and/or 4A2 when scanning motor speed is constant, and (ii) synchronously encoding facet section information with digital count data generated by the digitizer circuit on each decode board of such subsystems. In general, this method involves optically encoding the "home pulse mark/gap" along the edge of the holographic scanning disc, and upon detecting the same, generating home offset pulses (HOPs) which are used to automatically generate the start of each facet pulse (SOFPs), and the SOFPs in turn are used to automatically generate the start-of-facet-sector pulses (SOFSPs) aboard each decode board. The details of this process will be described hereinbelow.

Referring now to FIGS. 10 through 11E, it is noted that each home offset pulse produced from HOP generating circuit 244 is provided to the SOFSP generator 236A through 236F on the decode processing board. When the HOP pulse is received at the SOFSP generator 236A through 236F on a particular decode processing board, the home pulse gap on the scanning disc 130 is starting to pass through the laser beam directed therethrough at the scanning station associated with the decode signal processing board. As shown in FIGS. 10 through 11E, timing information stored in the tables shown in these figures is used by the SOFSP generator 236A to generate a set of SOFSPs in response to the received HOP pulse during each revolution of the scanning disc. This enables a digital number count (referenced from the HOP) to be generated and correlated along with the digital data counts produced within the digitizer circuit 239A in a synchronous manner. As shown in FIG. 10A, each SOFSP generator 236A through 236B comprises: a clock 260 for producing clock pulses (e.g. having a pulse duration of about 4 microseconds); a SOFP generation module 261 for generating SOFPs using the table of FIG. 10B in accordance with the process depicted in FIG. 10C; a SOFSP generation module 262 for generating SOFSPs using the table of FIG. 10D and production rules set forth in FIGS. 10E1 and 10E2, in accordance with the process depicted in FIG. 10F; and a control module 263 for controlling the SOFP generator 261 and the SOFSP generator 262, and resetting the clock 260 upon each detection of a new HOP from the HOP generator on the control board 200 associated with the holographic scanning unit.

As shown in FIGS. 11A1 and 11A2, the digitizer circuit 239A of the present invention comprises a number of subcomponents. In particular, a scan data input circuit 322 is provided for receiving digital scan data signal $D_2$. A clock input 132 is provided from an external fixed frequency source 313, e.g. a 40 MHz crystal, or another external clock 15 to produce a pulse train. The output of the clock input circuit 312 is provided to the clock divider circuitry 314. That circuit 314 includes dividers for successively dividing the frequency of the clock pulses by a factor of two to produce a plurality of clock frequencies, as will be described in detail later. This plurality of clock signals is provided to a clock multiplexer 136. As shown in FIGS. 11A1 and 11A2, the 40 MHz clock input signal is also provided directly to the clock multiplexer 316. The clock multiplexer 136 selects the desired output frequencies for the device based upon control signals received from clock control circuitry in the programmable processor 240A and in associated circuitry. The output of the clock multiplexer 316 comprises an S clock signal which provides the basic timing for the digitizer circuit 239A, as well as the input to digital counters. The processing of the input (bar code) scan data $D_2$ is provided from signal processor 238A. The scanner input circuit 322 provides output signals which represent the detected bar code signal to be processed and are provided to the transition and sign detecting circuit 324. That circuit detects the transition from a bar to a space or from a space to a bar from the input signals provided thereto, and also determines whether the symbol occurring before the transition is a bar or a space. Thus, the transition and sign detector 324 provides a signal bearing the "sign: information (referred to as the "SIGN" signal) which is provided to multiplexer 342, and thus a primary first-in, first-out (FIFO) memory which serves as the input of programmable processor 240A. The transition and sign circuit 324 also provides a signal to the sequencing means 328 to commence operation of the sequencing circuit 328. The sequencing circuit 328 sequences the digitizer circuit through a predetermined number of steps which begin at the occurrence of each symbol transition and which will be described in detail later. Sequencing circuit 328 provides a FIFO write signal to the FIFO input of primary FIFO 340 and the auxiliary FIFO 341, at the proper time to enable it to accept data thereinto. The sequencing circuit 328 provides input signals to digitizing counting circuit 330 so that the starting and stopping of the counters, occurring with the detection of each transition, is properly sequenced. The counting circuit 330 also receives an input signal from the clock multiplexer 316 (S Clock). This signal runs the counters at the selected rate when they are enabled by the sequencing means 328. The clock multiplexer 316, the sequencer circuit 328 and the counting circuit 330 each supply signals to the interface circuit 333 which enables it to properly pass the digitized count data to the primary and auxiliary FIFOs 340 and 341, via multiplexer 342, as shown in FIGS. 11A1, 11A2 and 11B. The clock multiplexer 316 is arranged to provide two banks of available frequencies for the device to use, namely, an upper and a lower bank. The selection of frequencies from the upper bank or the lower bank is determined by a frequency bank switching circuit 362. The frequency bank switching circuit 362 also provides an input to an array reset 38 which provides a signal to reset the clock divider 314 on command. The clock divider circuitry 314 also generates a TEST reset signal by inverting the array reset signal. The TEST reset signal resets the remainder of the circuit 239A. The command which initiates this reset condition is normally generated by a testing device (not shown) connected to device 239A and used to test it upon its fabrication.

As shown in FIGS. 11A1, 11A2 and 11B, digital count data or a string of zeros (representative of correlated SOFP data or count values from the HOP) are written into the primary FIFO using multiplexer 342 and write enable signals generated by the sequencing circuit 238. The SOFP marker (i.e. string of zeros) is written over the data in the primary FIFO 340 whenever the SOFP count data is presented to the digitizer circuit. Also, digital count data or a string of zeros (representative of correlated SOFSP data or SFS count values from the HOP) are written into the auxiliary FIFO 341 using multiplexer 342 and write enable signals generated by the sequencing circuit 238. The SOFSP marker (i.e. string of zeros) is written over the data in the auxiliary FIFO 341 whenever the SOFP count data is presented to the digitizer circuit. With such a data encoding scheme, the decoder 240A is allowed to decode process the scan count data in the FIFOs, as well as determine which facet sector produced the laser scanning beam. The later function is carried out using the tables set forth in FIGS. 11C1 through 11D and the method described in the flow chart of FIG. 1E. As shown in FIG. 11B, the output of the 240A is a scan beam data element comprising the package ID data, the scanner number (SN), the laser scanning station number (SSN), facet number (FN) and minimum and maximum facet angles subtending the facet sector involved in generating the laser beam used to read the decoded bar code symbol representative of the package ID data. Additional details concerning the design and construction of digitizer circuit (239A) can be found in Applicant's U.S. Pat. No. 5,343,027 incorporated herein by reference in its entirety.

Figure 12A:
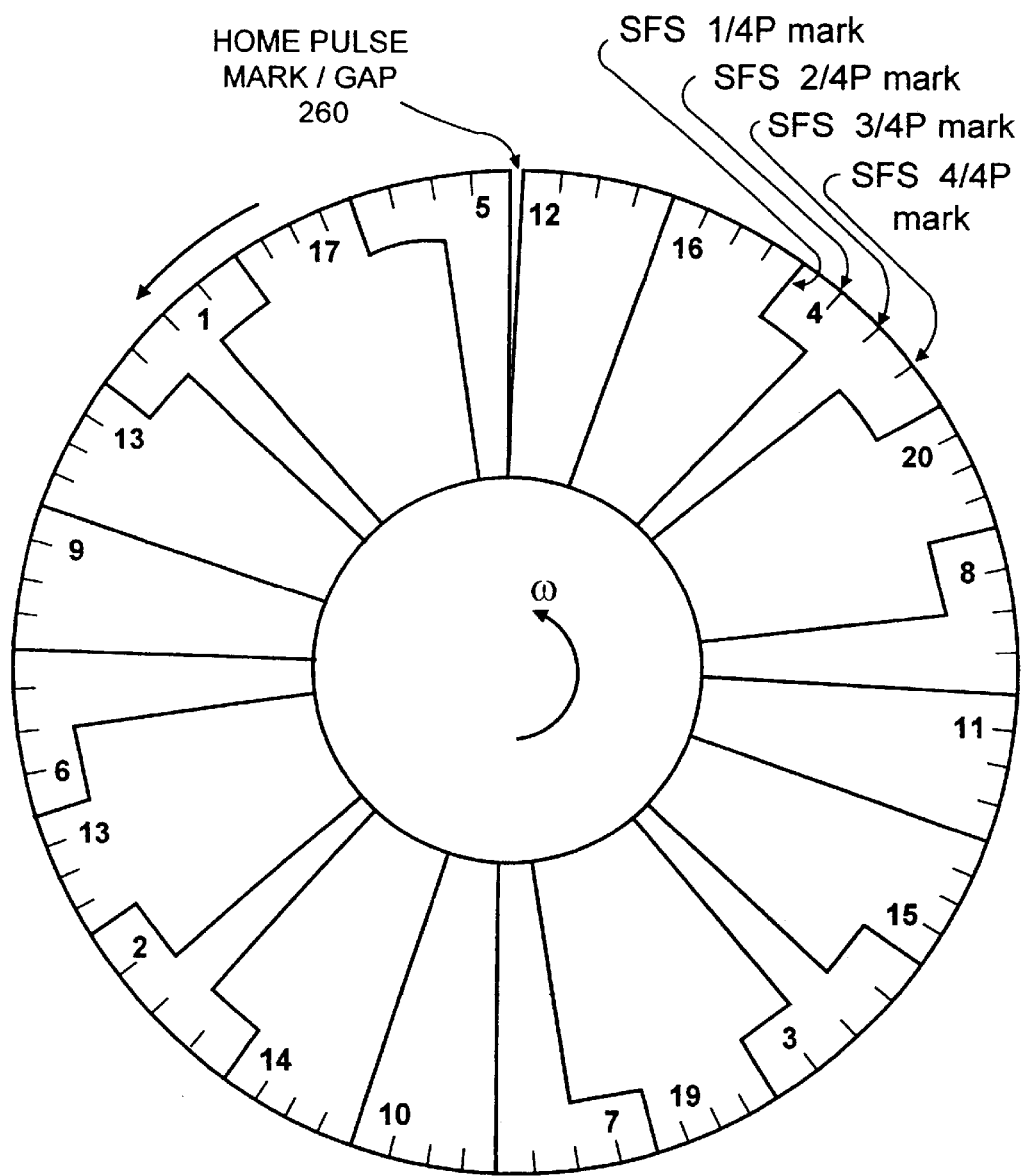
FIG. 12A is a schematic diagram of the holographic scanning disc that contains an optically-encoded home-pulse mark as well as a series of start-of-facet-sector marks about the outer edge thereof for indicating where each facet sector along the disc begins, relative to the home pulse mark.
Figure 12B:
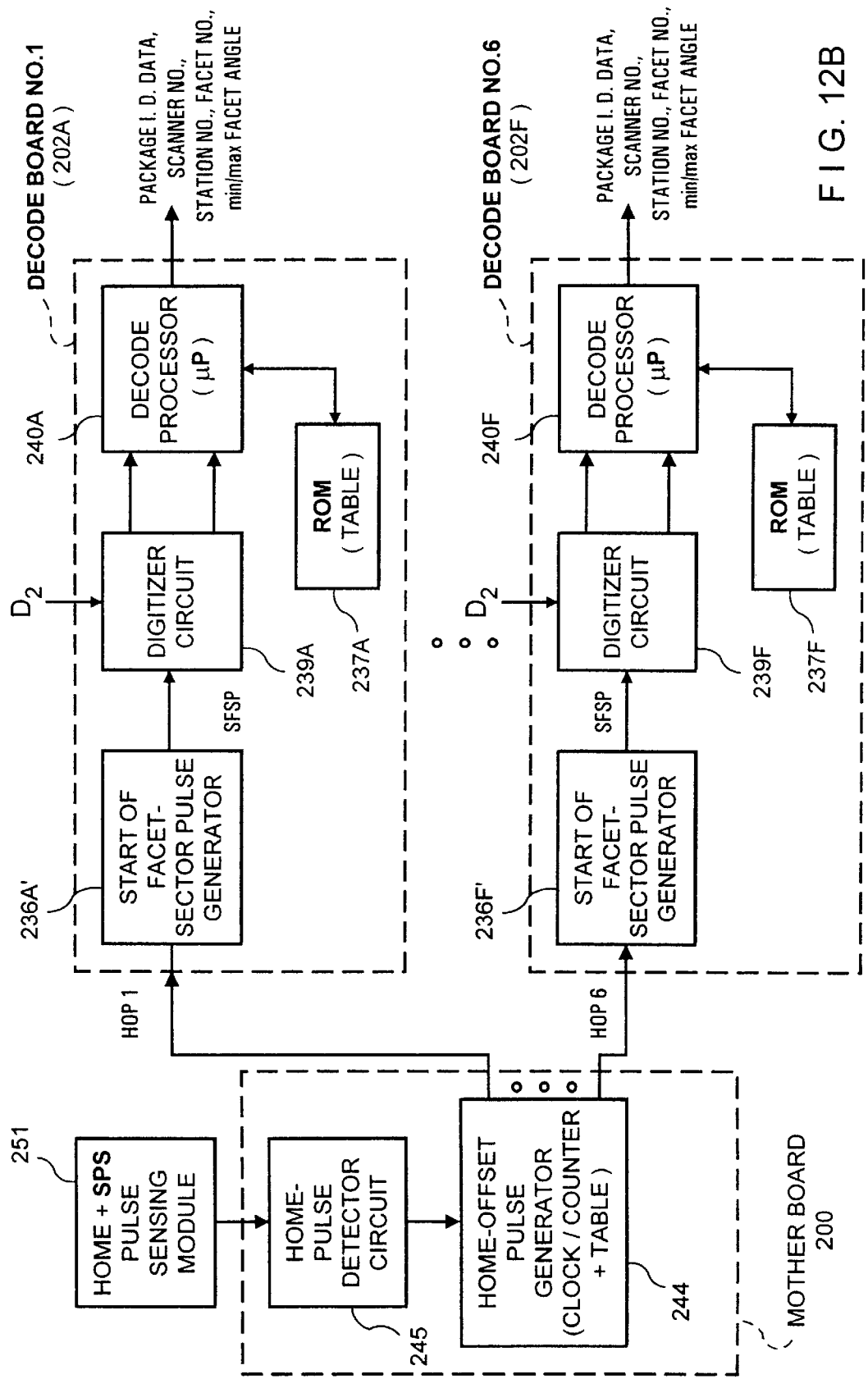
FIG. 12B is a schematic representation of the components on the control board and decode processing boards associated with an optically-encoded holographic scanning disc which can be employed within the tunnel scanning subsystem of the present invention, showing the home-pulse detector and home-offset pulse (HOP) generator on the control board, and the start-of-facet-sector pulse (SOFSP) generator, digitizer circuitry, decode signal processor and ROM containing relative timing information about each SOFSP in relation to the HOP sent to the decode processing board from the control board of the present invention.
Figure 12C:
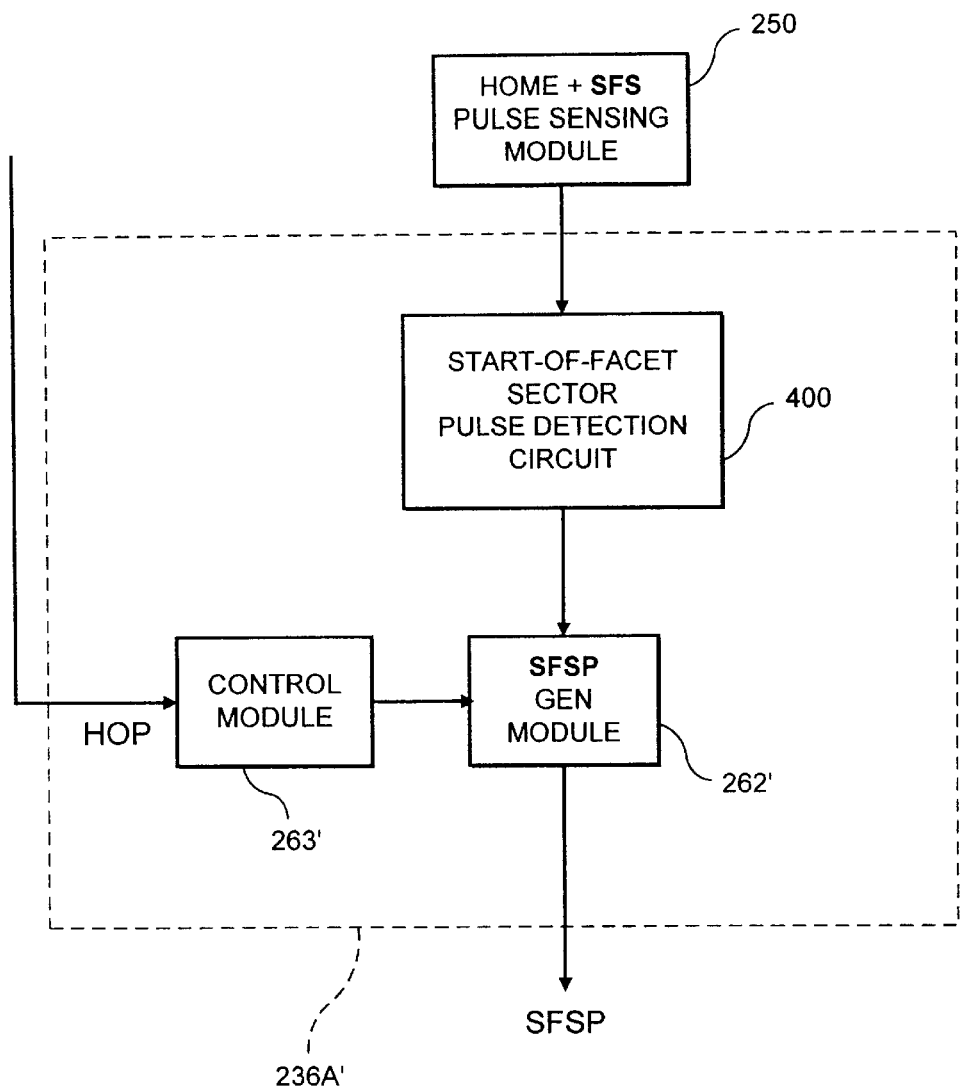
FIG. 12C is a schematic representation of the start-of-facet-sector pulse (SOFSP) generator employed on each decode board shown in FIG. 12B.
Figure 12E:
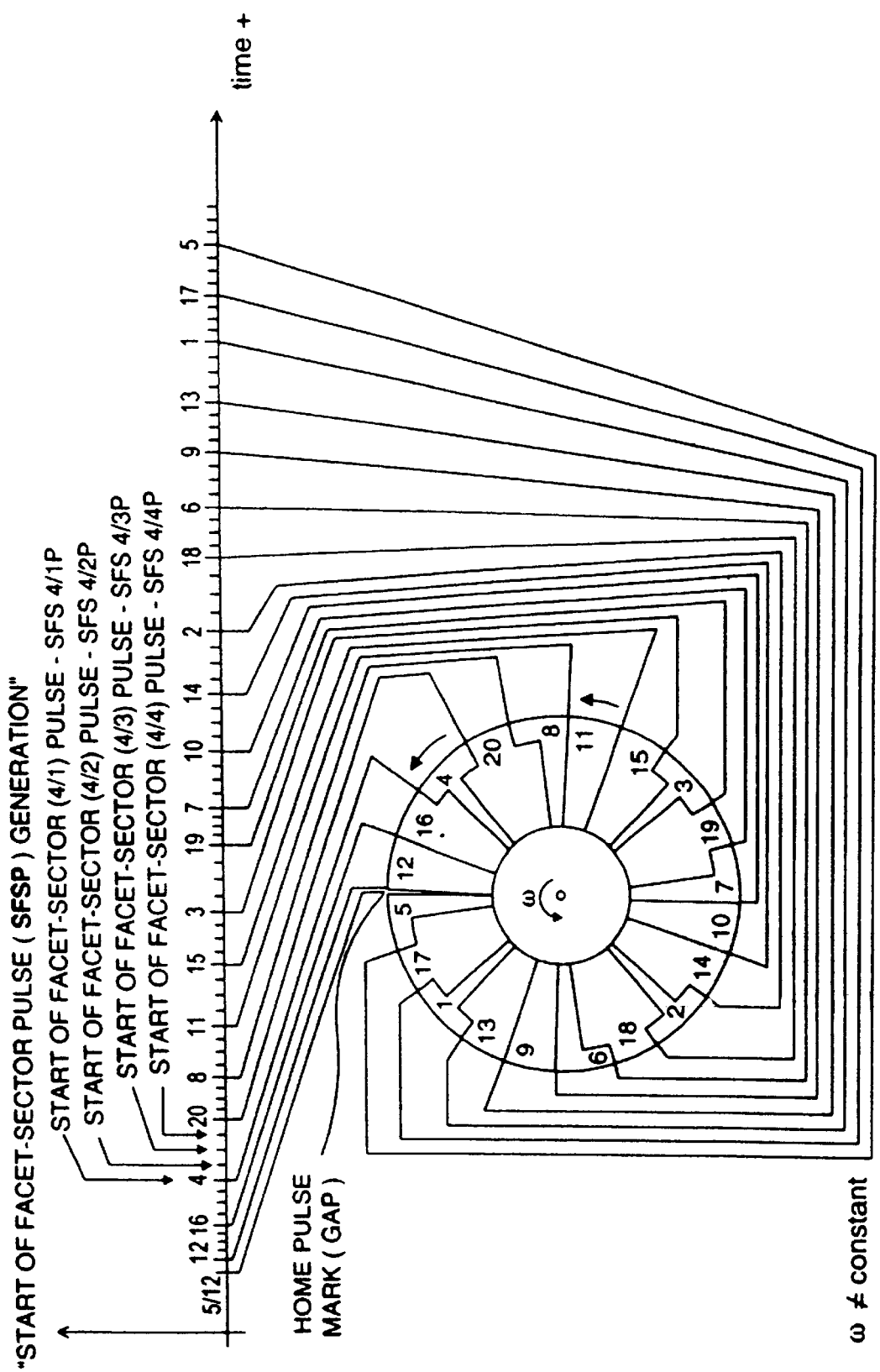
FIG. 12E is a schematic representation of the operation of the start-of-facet sector pulse (SOFSP) generator shown FIG. 12C, wherein start of facet sector pulses are generated therewithin relative to the home-offset pulse (HOP) received from the HOP generator on the control board associated with each holographic scanning disc.

Second Method of Determining Laser Beam Position in Holographic Laser Scanners Under Constant Scanning Motor Speed Conditions In FIGS. 12A through 13D, an alternative method is shown for (i) determining the position of the laser scanning beam produced by either the laser scanning subsystems shown in FIG. 4A1 and/or 4A2 when scanning motor speed is constant, and (ii) synchronously encoding facet section information with digital count data generated by the digitizer circuit on each decode board of such subsystems. This method involves optically encoding the start of each facet sector (SFS) mark along the outer edge of the holographic scanning disc 130, as shown in FIG. 12A. This optical encoding process can be carried out when mastering the scanning disc using a masking pattern during laser exposure. The home pulse gap sensing module described above can be used to detect the home pulse gap as well as the SFS marks along the edge of the scanning disc. As shown, the home gap or functionally equivalent mark of a predetermined opacity generates a home pulse, whereas the SFS marks generate a series of SOFSPs during each revolution of the scanning disc. The home pulse is detected on the home pulse detection circuit on the control board and is used to generate HOPs as in the case described above. The HOPs are transmitted to each decode board where they are used reference (i.e. count) how many SOFSPs have been counted since the received HOP, and thus determine which facet sector the laser beam is passing through as the scanning disc rotates. Digital counts representative of each SOFSP are synchronously generated by the SOFSP generator aboard each decode board and are loaded into the auxiliary FIFO 341, while correlated digital count scan data is loaded into both the primary and auxiliary FIFOs in a manner similar to that described above. The decode processor can use the information in tables 13C1 and 13C2 to determine which SOFSP counts correspond to which minimum and maximum facet angles in accordance with the decode processing method of the present invention described in FIG. 13D. The advantage of this method is that it is expected to be less sensitive to variations in angular velocity of the scanning disc.

Referring now to FIG. 3, the individual scanning subsystems within the system of the first illustrative embodiment are shown interfaced with the data management computer system 900 by away of I/O port subsystem 800 well known in the art. As shown, the data management computer system 900 has a graphical user interface (GUI) 901 supported by a display terminal, an icon-pointing device (i.e. a mouse device), keyboard, printer, and the like. The GUI enables programming of the system, as well as the carrying out of other management and maintenance functions associated with proper operation with the system. Preferably, the data management computer system 900 also includes a network interface card for interfacing with a high-speed Ethernet information network that supports a network protocol such as TCP/IP well known in the art.

The above-described methods for determining the position of laser scanning beams in holographic laser scanning systems involve recovering laser position information using a "home-pulse" mark on the holographic disc rotated a constant angular velocity. However, it has been discovered that such techniques work satisfactorily only when the angular velocity of the scanning disc is maintained very close to the designed nominal angular velocity during start-up and steady-state operation. In many applications, it is difficult or otherwise unfeasible to maintain the angular velocity of the scanning disc constant such modes of operation, even when using speed locking/control techniques known in the electrical motor arts. Thus in many applications there will be a need for a laser beam position determination system and method that works for any scanning disc motor speed as well as under small accelerations (and decelerations) of the scanning disc motor, hereinafter referred to as varying scanning motor speed conditions.

Laser Position Determination in Holographic Laser Scanners Under Varying Scanning Motor Speed Conditions In FIGS. 14A through 14D, a novel system and method is illustrated for (i) accurately determining the position of the laser scanning beam produced by either the laser scanning subsystems shown in FIG. 4A1 and/or 4A2 independent of whether or not the scanning motor speed can be maintained constant, and (ii) synchronously encoding facet section information with digital count data generated by the digitizer circuit on each decode board of such subsystems. In this embodiment of the present invention, a holographic scanning disc having a home pulse mark or gap 260 (260) as described hereinabove can be used to generate the required laser scanning pattern. Also, as shown in FIG. 4B1, each holographic scanning disc is provided with a home pulse sensing module 251 (251') and home pulse detection circuit 245 (245') as described in detail hereinabove. For purposes of illustration, this subsystem and method will be described below with reference to the laser scanning subsystem of FIG. 4A1, although the same remarks apply equally to the holographic scanning subsystem of FIG. 4B1, as well as the polygonal scanning subsystem of FIG. 4C1.

As illustrated in FIG. 14A, each time the home pulse mark or gap on the scanning disc 130 passes the home pulse sensing module 251, a home pulse (HP) is automatically generated from the home pulse detection circuit 245. Each time a home pulse is generated from the home pulse detection circuit 245, a set of home offset pulses (HOPs) is sequentially produced from HOP generation circuit 244' in accordance with the process depicted in FIG. 14C. The number of HOPs produced in response to each detected HP is equal to the number of laser scanning stations (i.e. scanning modules), N, arranged about the laser scanning disc. Each generated HOP is provided to the SOFSP generator (236A' through 236F') on the decode processing board (202A' through 202F') associated with the HOP. When the HOP pulse is received at the SOFSP generator on its respective decode signal processing board, the home pulse mark or gap on the scanning disc 130 is then starting to pass through the laser beam directed therethrough at the laser scanning station associated with the decode signal processing board. During each revolution of the scanning disc, the SOFSP generation module 261' within each SOFSP generation circuit 236A' through 236F' generates a set of start of facet pulses (SOFPs) relative to the HOP, and also a set of start of facet sector pulses (SOFSPs) relative to each SOFSP. This enables a SOFP and a SOFSP (referenced from the HOP) to be generated by each SOFSP generation circuit 236A' through 236F' and provided to the digitizer circuit 239A through 239F so that the SOFP and SOFSP data can be correlated with the digital data counts produced within the digitizer circuits in a synchronous manner. Within the decode processor, SOFP and SOFSP data can be translated into laser beam position data expressed in terms of the minimum and maximum angles that delimit the facet sector producing the scan data from which the bar code symbol was decoded.

In the illustrative embodiment, the HOP generation circuit 244' is implemented using an 87C51 microcontroller. The microcontroller uses two inputs: the home-pulse detected signal from the home pulse detection signal 245" connected to an interrupt pin of the 87C51; and a "motor-stable" signal from the scanning motor controller. The microcontroller has as many outputs as there are laser scanning stations (i.e. scanning modules) in each laser scanning subsystem. Each output pin is dedicated to sending HOPs to a particular laser scanning station within the subsystem.

In general, each SOFSP generation circuit is realized as a programmed microprocessor. However, for purposes of understanding the SOFSP generation circuit, it will be helpful to schematically represent it as comprising a number of subcomponents, as shown in FIG. 14B. As shown therein, each SOFSP generator 236A" through 236B" comprises: a clock 260" for producing clock pulses (e.g. having a pulse duration of about 4 microseconds); a SOFP generation module 261" for generating SOFPs in accordance with the process depicted in FIG. 14D; a SOFSP generation module 262" for generating SOFSPs in accordance with the process depicted in FIG. 14D; and a control module 263" for controlling the SOFP generator 261" and the SOFSP generator 262", and resetting the clock 260" upon each detection of a new HOP from the HOP generator 244" on the control board 200" associated with the holographic scanning unit.

In the illustrative embodiment, the SOFP/SOFSP generation circuit 236A" (through 236F") has been implemented using an programmed 87C52 microcontroller mounted on each decoding board associated with a particular scanning station. The HOP for the corresponding scanning station is received on an interrupt pin of the microcontroller. The microcontroller outputs three signals to the decode processor 240A (through 240F): (i) SOFPs; (ii) SOFSPs; and (iii) a signal processor adjustment signal which constitutes a level high (or low) when the facet that passes the scanning station's laser is a facet on a near (or far) focal plane.

The operation of the HOP generation circuit 244" and the SOFSP generation circuit 236A" (through 236F') will now be described within reference to the flow charts set forth in FIGS. 14C and 14D. In these flow charts described below, the following list of symbols are used:

$t_i$=timer value at start of home-pulse for the $i^{th}$ rotation of the disc;

$T_i$=time-period of the $(i-1)^{th}$ rotation of the disc;

$x^{Hj}$=angular value of the position of the laser of the $j^{th}$ scanning station (i.e. scanning module) of the system, relative to the previous scanning station (home-pulse laser for scanning station 1);

$x^{Fj}$=angular width of the $j^{th}$ facet of the disc;

$x^{Fjm}$=angular width of the $m^{th}$ sector (i.e. segment) of the $j^{th}$ facet of the disc;

$t_i^{Hj}$=time elapsed between the $j^{th}$ HOP and the $(j-1)^{th}$ HOP of the $i^{th}$ rotation of $i^{th}$ rotation of the disc;

$t_i^{Fj}$=time elapsed between the Start of Facet Pulse (SOFP) of facet j and facet j-1 of the $i^{th}$ rotation of the disc;

$t_i^{Fjm}$=time elapsed between the Start of Facet Segment Pulse (SOFSP) of sector m and sector m-1 of facet j of the $i^{th}$ rotation of the disc;

$t_i^n$=time at which the $n^{th}$ HOP/SOFP of the $i^{th}$ rotation of the disc is outputted; and $t_i^{pn}$=time at which the $p^{th}$ SOFSP of the $n^{th}$ facet of the $i^{th}$ rotation of the disc is outputted.

Each time the "start of home-pulse mark" is detected, the home-pulse pickup circuit 251 described hereinabove automatically produces a negative going output pulse which is provided to the HOP generation circuit 244", as shown in FIG. 14A. The HOP generation circuit 244' uses this negative going output pulse to calculate the times at which the home-pulse mark reaches the different modules (i.e. laser scanning stations) and, in response to such calculated times, to automatically generate and provided HOPs to the SOFSP generation circuit 236A' (through 236F'). The calculation is based on the important assumption that the motor speed for the $i^{th}$ rotation is very close to the motor speed for the $(i-1)^{th}$ rotation.

As indicated at Block A in FIG. 14C, the process within the SOFSP generation circuit 236A" defines N as the number of laser scanning stations (i.e. scanning modules) in the holographic scanner, and $x^{Hj}$ as the angular offset (i.e. position) of a laser scanning station from the home-pulse sensing module (i.e. pickup) 251. At Block B in FIG. 14C, the process involves initializing the time period or setting $T_0$=0. Then at Block C, the HOP generation circuit determines whether a home pulse (HP) has been detected at its input port. Until an HP is detected, the circuit remains at this control block. When an HP is detected, then at Block D the circuit starts the timer therewithin (i.e. $t=t_0$). Then at Block E, the circuit determines whether another HP has been detected. As shown, the circuit remains at this control block until the next HP is detected. When the HP is detected, then at Block F the circuit samples the timer. The time-period of rotation of the scanning disc is calculated from two consecutive home-pulse detections as follows:

$T_i = t_i - t_{i-1}$, where $T_i$ is the time-period for the $i^{th}$ rotation of the disc. Then at Block G, the circuit determines whether the time-period for the $i^{th}$ rotation is "close" to that for the $(i-1)^{th}$ rotation.

As indicated at Block G, a measure of "closeness" is defined as: $|T_i - T_{i-1}| < 45$ uS. If the time measure is not close, i.e. $|T_i - T_{i-1}| > 45$ uS, then if the time-period of rotation for the $i^{th}$ and $(i-1)^{th}$ rotation does not satisfy, $|T_i - T_{i-1}| < 45$ uS, the circuit checks at Block H to determine whether the scanning disc has rotated at least a 100 times (experimental value). If the scanning disc has not rotated at least a 100 times, then the circuit proceeds to Block E and waits for the next home-pulse and carries out the control process over again. Since it is critical to the performance of the scanner that every scan be associated with laser position information, the time-period has to be accurately predicted when for some reason the time-period between two consecutive rotations of the disc differs by more than 45 uS (experimental value). The assumption here is that the scanning motor speed cannot change suddenly between two rotations.

If the scanning disc has rotated at least a 100 times (i.e. i>100), then the circuit proceeds to Block I and estimates the time-period of the current rotation $T_i$; by using the time period data for the past n rotations of the disc, given by the following expression:

$$T_i = \sum_{k=i-1-n}^{i-1} a_k * T_k$$

Where the n coefficients $a_{i-1-n}$ through $a_{i-1}$ can be calculated beforehand (and offline) as follows: If $T_i$ is the actual time-period of rotation i of the disc, at least squares estimate of the time-period for rotation i+1 can be calculated by minimizing the function, $$E = \sum_{k=i-1-n}^{i-1} \left( T_k^* - \sum_{j=1}^{n} a_j T_{k-j}^* \right)^2 \text{ with respect to each } a_j (j=1,\ldots,n)$$

The final expressions for the minimized "optimal" values of the coefficients aj are given by:

$$a_j = (_k T_k^* T_{k-j}^*) / (_k {}_j T_{k-j}^*)$$

A good value for n with reasonable computational complexity was found to be 5.

As indicated at Block J, the circuit then calculates the "inter-HOPS" $t_i^{Hj}$ which is the time taken by the home-pulse mark to reach to scanning station j from scanning station j-1. This measure is given by the expression: $t_i^{Hj} = x^{Hj} * T_i$, j=1, . . . ,N Finally, at Block K, the circuit sends (i.e. transmits) HOPs to the SOFSP generation circuit of each laser scanning station (for the ith rotation) at each instant of time given by the expression:

$$t_i^k = \sum_{j=1}^{k} t_i^{Hj}, k=1,\ldots,N$$

Thereafter, the control process returns to Block E as indicated in FIG. 14C. If at Block G, the time measure is "close" (i.e. $|T_i - T_{i-1}| < 45$ uS), then the circuit proceeds directly to control Block J. As described above, the HOP generation circuit 244" on the control board 200 accurately predicts when the home-pulse mark on the scanning disc arrives at each scanning station and sends out a negative going pulse to each laser scanning station. In contrast, the SOFP generation circuit 236A" uses the HOPs to calculate when each facet/facet sector passes the laser module in each laser scanning station. Notably, an important assumption here is that the scanning motor speed does not vary too much between two consecutive rotations of the scanning disc.

As indicated at Block A in FIG. 14C, the process within the SOFSP generation circuit 236A" defines the following parameters: N as the number of laser scanning stations (i.e. scanning modules) in the holographic scanner; M as the number of sectors (or "Ticks") on each facet of the scanning disc: $x^{Fj}$ as the angular width of facet j of the scanning disc; and $x^{Fjm}$ as the angular width of sector m of facet j of the scanning disc.

At Block B in FIG. 14C, the process involves initializing the time period or setting $T_0 = 0$. Then at Block C, the SOFSP generation circuit determines whether a home pulse (HP) has been detected at its input port. Until an HP is detected, the SOFSP generation circuit remains at this control block. When an HP is detected, then at Block D the SOFSP generation circuit starts the timer therewithin (i.e. $t = t_0$). Then at Block E, the SOFSP generation circuit determines whether another HP has been detected. As shown, the SOFSP generation circuit remains at this control block until the next HP is detected. When the HP is detected, then at Block F the SOFSP generation circuit samples the timer contained therewithin. The time-period of rotation of the scanning disc is calculated from two consecutive home-pulse detections as follows: $T_i = t_i - t_{i-1}$, where $T_i$ is the time-period for the ith rotation of the disc. Then at Block G, the SOFSP generation circuit determines whether the time-period for the $i^{th}$ rotation is "close" to that for the $(i-1)^{th}$ rotation.

As indicated at Block G, a measure of "closeness" is defined as: $T_i - T_{i-1} | < 45$ uS. If the time measure is not close, then the time-period of rotation for the $i^{th}$ and $(i-1)^{th}$ rotation does not satisfy, $|T_1 - T_{i-1}| < 45$ uS, and the SOFSP generation circuit returns to Block E, as indicated in FIG. 14D and looks for another HOP, without sending any SOFP/SOFSP.

If the time-period of rotation for the $i^{th}$ and $(i-1)^{th}$ rotation does satisfy, $|T_1 - T_{i-1}| < 45$ uS, then the SOFSP generation circuit proceeds to Block H where the time between start of facet pulses (SOFSs) for facets j-1 and j of the disc for the $i^{th}$ rotation is calculated using the expression:

$$t_i^{Fj} = x^{Fj} * T_i, j=1,\ldots,N$$

Then at Block I, the SOFSP generation circuit calculates the "inter-HOPs" which are defined as the time between start of sector pulses m-1 and m for facet j, corresponding to rotation i of the disc. Such inter-HOPs are calculated by the expression:

$$t_i^{Fjm} = t_i^{Fj}/M, m=1,\ldots,M$$

At Block J, the SOFP generation circuit sends out (to the decode processor) SOFPs at the times given by the expression:

$$t_i^n = \sum_{j=1}^{n} t_i^{Fj}, n = 1, \ldots, N$$

Likewise, the SOFSP generation circuit sends out (to the decode processor) SOFSPs at the times given by the expression:

$$t_i^{pn} = \sum_{j=1}^{n} \sum_{m=1}^{p} t_i^{Fjm}, n = 1, \ldots, N; p = 1, \ldots, M$$

Using the transmitted SOFPs/SOFSPs, correlated with bar code scan data at the digitizer circuit 239A (through 239F), the decode circuit 240A (240F) can then specify the laser beam position in terms of the minimum and maximum angle of the scanning facet sector that generated the bar code scan data that has been correlated therewith using the dual-FIFO digitizer circuit 240 of the present invention. Typically, calculations for each SOFP/SOFSP will be performed in a pipelined fashion since the total computation time far exceeds the time between any two SOFSPs. The laser beam position determination subsystem illustrated in FIGS. 14A through 14D and described hereinabove, has been built and tested in holographic tunnel scanning system employing holographic laser scanners having 5 laser scanning stations, scanning discs with 16 facets and 20 facet sectors/segments, and scanning motor speed variations within the range of between 4800 rpm and 5800 rpm. The system can handle small scanning-motor accelerations (and decelerations).

Notably, the above-described subsystem has limitations on the number of sectors (or segments) that each facet can be resolved into along the scanning disc. While a large number of sectors per facet will guarantee more accurate laser beam position information, the subsystem is limited by the computational time required to output each SOFSP. Average computational times for outputting SOFPs is found to be about 20 uS, and about 12 uS for SOFSPs.

Figure 15:
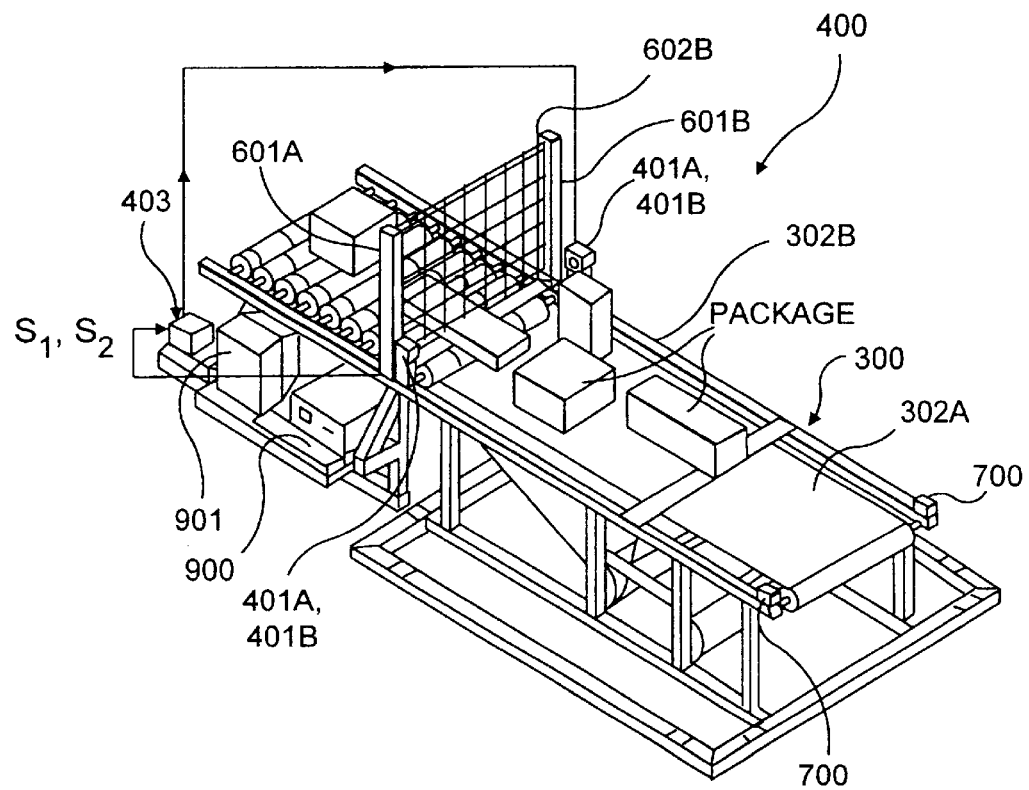
FIG. 15 is a schematic representation of the package velocity and length measurement subsystem of the present invention configured in relation to the tunnel conveyor and package height/width profiling subsystems of the system of the first illustrative embodiment of the present invention.

The Laser-Based Package Velocity and Length Measurement Subsystem of the First Illustrative Embodiment of the Present Invention In FIG. 15, the package velocity and length measurement subsystem 400 is configured in relation to the tunnel conveyor subsystem 500 and package height/width profiling subsystem 600 of the illustrative embodiment. In FIG. 15A, a direct transmit/receive configuration of the dual-laser based package velocity and measurement subsystem 400' is installed at the location of the vertical and horizontal light curtains 601 and 602 employed in the package height/width profiling subsystem 600. As shown in FIG. 15A, subsystem 400' comprises a pair of laser diodes (D1 and D2) 401A and 401B, respectively, spaced apart by about 2 inches and mounted on one side of the conveyor belt; a pair of photodiodes 402A and 402B spaced apart by about 2 inches and mounted on the other side of the conveyor belt, opposite the pair of laser diodes 401A and 401B; and electronic circuits, including a programmed microprocessor 403, for providing drive signals to the laser diodes 401A and 401B, and for receiving and processing the electrical data signals P1 and P2 produced by the photodiodes 402A and 402B so that information representative of the length (L) and velocity (V) of the package 404 moving on the conveyor belt is automatically computed in accordance with the flow chart shown in FIGS. 15C1 through 15C3.

In FIG. 15B, a retro-reflection configuration of the dual-laser based package velocity and measurement subsystem 400 is shown installed at the location of the vertical and horizontal light curtains 601 and 602 employed in the package height/width profiling subsystem 600. The dual laser diodes 405A and 405B used in the dual-laser based package velocity and length measurement subsystem 400 can be driven using the VLD driver circuitry 406A and 406B circuitry shown in FIG. 15B1. In FIG. 15B2, electronic circuitry 407A and 407B is shown for conditioning the signals received by the photoreceivers 407A and 407B in this subsystem are shown in FIG. 15B2. The velocity (v) and length (L) of the package transported through the package velocity and measurement subsystem 400 can be computed using 409 carrying out the algorithm disclosed in FIGS. 15C1 through 15C3. As shown in FIG. 15B, the laser beam transmitted from laser diode 405A is retro-reflected by retro-reflector 410A mounted on support structure 411 disposed opposite the support structure 412 supporting laser diodes 405A and 405B and photodiodes 408A and 408B. As shown in FIG. 15B, the laser beam from laser diode 405A is reflected off retro-reflector 410A and is detected by photodiode 408A, whereas the laser beam from laser diode 405B is reflected off retro-reflector 410B and is detected by photodiode 408B.

Figure 15C:
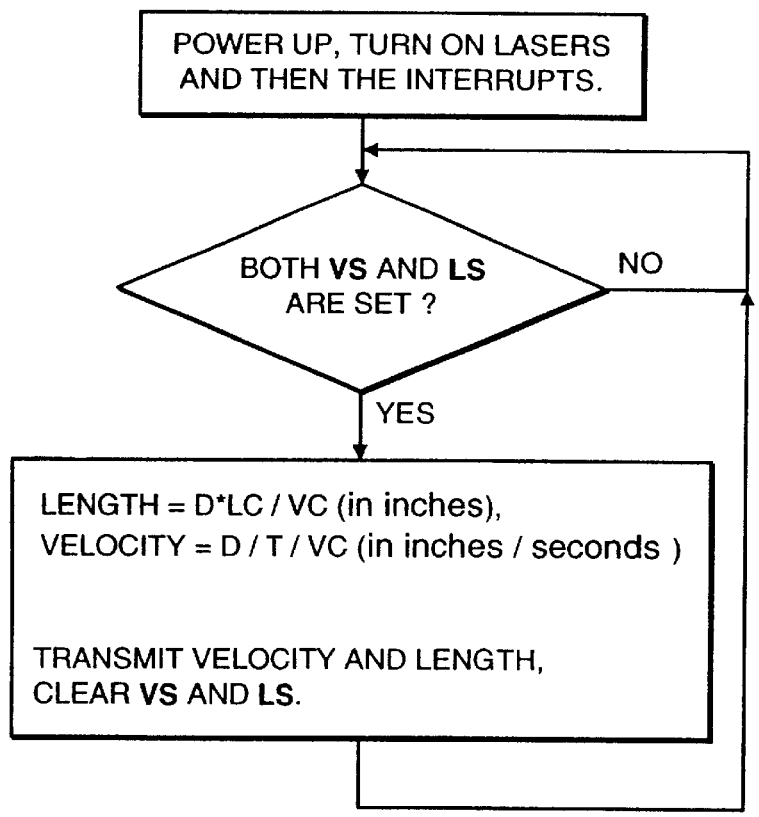

As when in FIG. 15B, the output signals from photodetectors 408A and 408B are provided to photoreceiving circuits 407A and 408B respectively, for processing and are then provided to micro-computing system 409 so that the Length (L) and Velocity (V) of the moving packages are computed in accordance with the algorithm described in FIGS. 15C1 through 15C3. In the illustrative embodiment shown in FIGS. 15B and 15B1, laser diode 405A and photodiode 408A are packages as a first laser transceiver module indicated at Block 413, whereas laser diode 408B and photodiode 408B are packaged as a second laser transceiver module 414. As shown in FIG. 15B micro-computing system 409 comprises a microprocessor (CPU) 409A display device 409B and keyboard 409C.

The Package Height/Width Profiling Subsystem of the First Illustrative Embodiment of the Present Invention As shown in FIGS. 16 and 16A, the global coordinate reference system $R_{global}$ is symbolically embedded within the structure of the package height/width profiling subsystem 600 (and also the package-in-tunnel signaling subsystem 500). As shown in FIG. 16A, the vertically arranged light transmitting and receiving structures 601A and 601B associated with the package height/width profiling subsystem, as well as horizontally arranged light transmitting and receiving structures 602A and 602B associated therewith, are arranged in a manner generally known in the package handling art. As shown in FIG. 16A, the vertically arranged light transmitting and receiving structures 601A and 601B are controlled by a height control unit 603, which produces, as output, a signal $S_H$ consisting of time-sampled package height data collected along the vertical extent of the scanning tunnel aperture, similarly, horizontally arranged light transmitting and receiving structures 603 are controlled by a width control unit 604, which produces, as output, a signal $S_w$ consisting of time-sampled package height data collected along the horizontal extent of the scanning tunnel aperture. The output data streams from height and width control units 603 and 604, and the package length/velocity measurement subsystem 400, are provided as input to an H/W data processor 605, programmed to produce (i) package profile dimension data element (e.g. H, weight, etc. as well as (ii) a package-in-tunnel (PIT) Indication (token) Data Element for each package detected by subsystem 600.

In the illustrative embodiment, package height/width profiling subsystem 600 is realized by integrating (i) the profiler system (Model No. P101-144-200) from KORE, Inc. of Grand Rapids, Mich., and (ii) the package velocity and measurement subsystem 400 described above, and providing programmed H/W data processor 605 in accordance with the principles of the present invention. The primary function of the package height/width profiling subsystem 600 is to obtain x and y coordinates associated with the profile of each package as it passes through the light curtain arranged in the x-y plane of the global coordinate reference system $R_{global}$. The function of the package velocity and length measurement subsystem 400 is to obtain the z coordinate(s) (i.e. the run-length L) of the package relative to the global reference system, at the time of package height/width profiling (i.e. when the package has past the dual laser beam transceiver of this subsystem). Notably, the package height/width profiling subsystem 600 carries out the function of the package-in-tunnel signaling subsystem 500. That is, each time a package is detected at the entry side of the scanning tunnel, the subsystem 600/500 automatically generates a package-in-tunnel (PIT) data element for transmission to the data element queuing, handling and processing subsystem 1000 to be described in greater detail below.

In the tunnel scanning system of the first illustrative embodiment, packages must be transported along the conveyor belt in a singulated manner (i.e. physically arranged so that one package is positioned behind the other package with a space disposed therebetween). In the event that this condition is not satisfied, the package height/width profiling subsystem 600 is designed to automatically detect that packages within the system have not been properly singulated (i.e. are arranged in a side-by-side and/or stacked configuration) and generate a control signal which causes a downstream package deflector to reroute the multiple packages through a package singulator unit and then rerouted through the scanning tunnel system without human intervention.

For example, subsystem 600 can simultaneously detect when two boxes 608 and 609 moving along conveyor 300, pass through non-singulated with a small gap or space 610 between the boxes, as shown in FIGS. 17A through 17C. In this case, the horizontal light curtain $T_w$, $R_w$ of the package dimensioning subsystem 600 will automatically detect the gap 610.

Figure 18A:
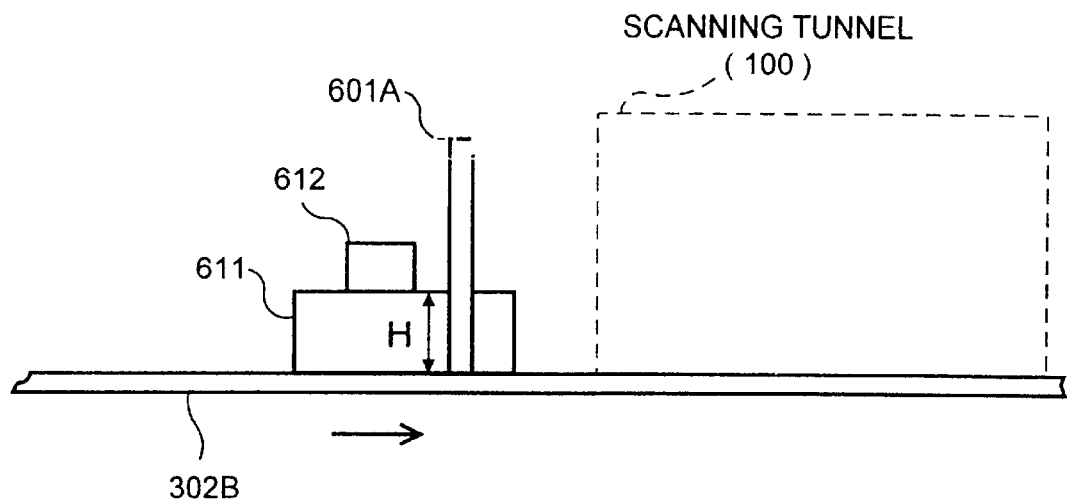
FIG. 18A is an elevated side view of a pair of stacked packages conveyed along the conveyor belt subsystem, wherein one package is being transported through and thus profiled by the package height/width profiling subsystem of FIG. 16, while the other package has not yet been profiled by the subsystem.
Figure 18B:
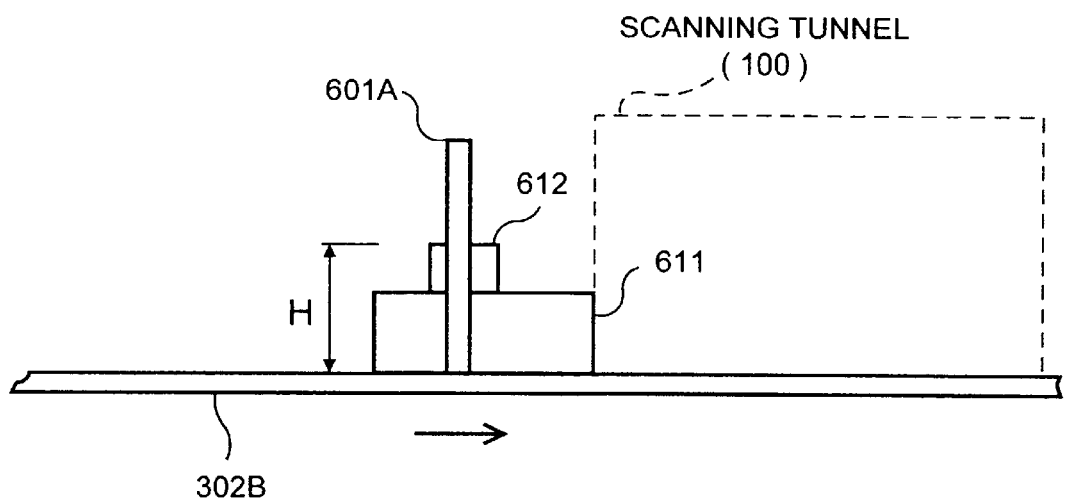
FIG. 18B is an elevated side view of a pair of stacked packages conveyed along the conveyor belt subsystem, wherein both packages are being transported through and thus profiled by the package height/width profiling subsystem of FIG. 16.
Figure 18C:
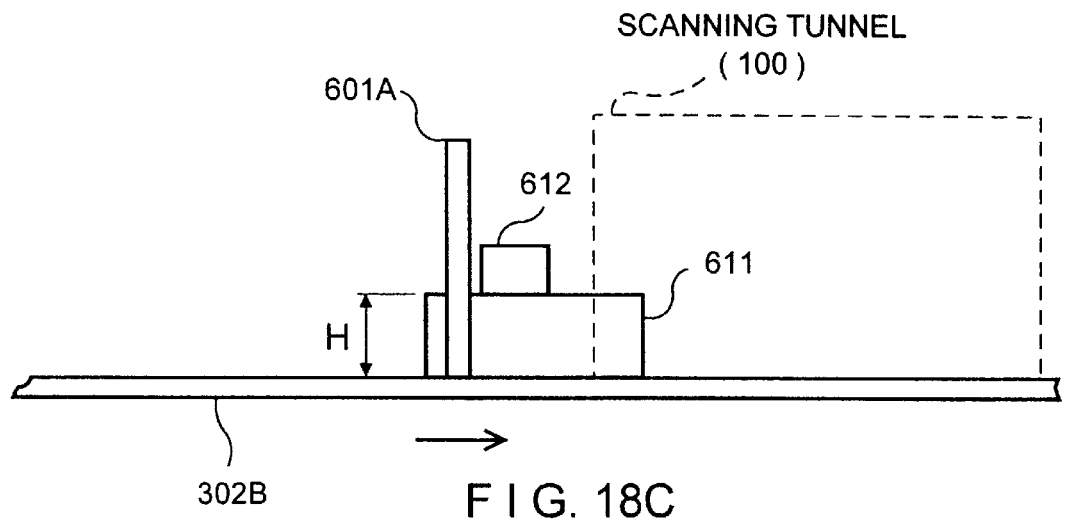
FIG. 18C is an elevated side view of a pair of stacked packages conveyed along the conveyor belt subsystem, wherein one package is being transported through and thus profiled by the package height/width profiling subsystem of FIG. 16, while the other package has already been profiled by the subsystem.
Figure 19A:
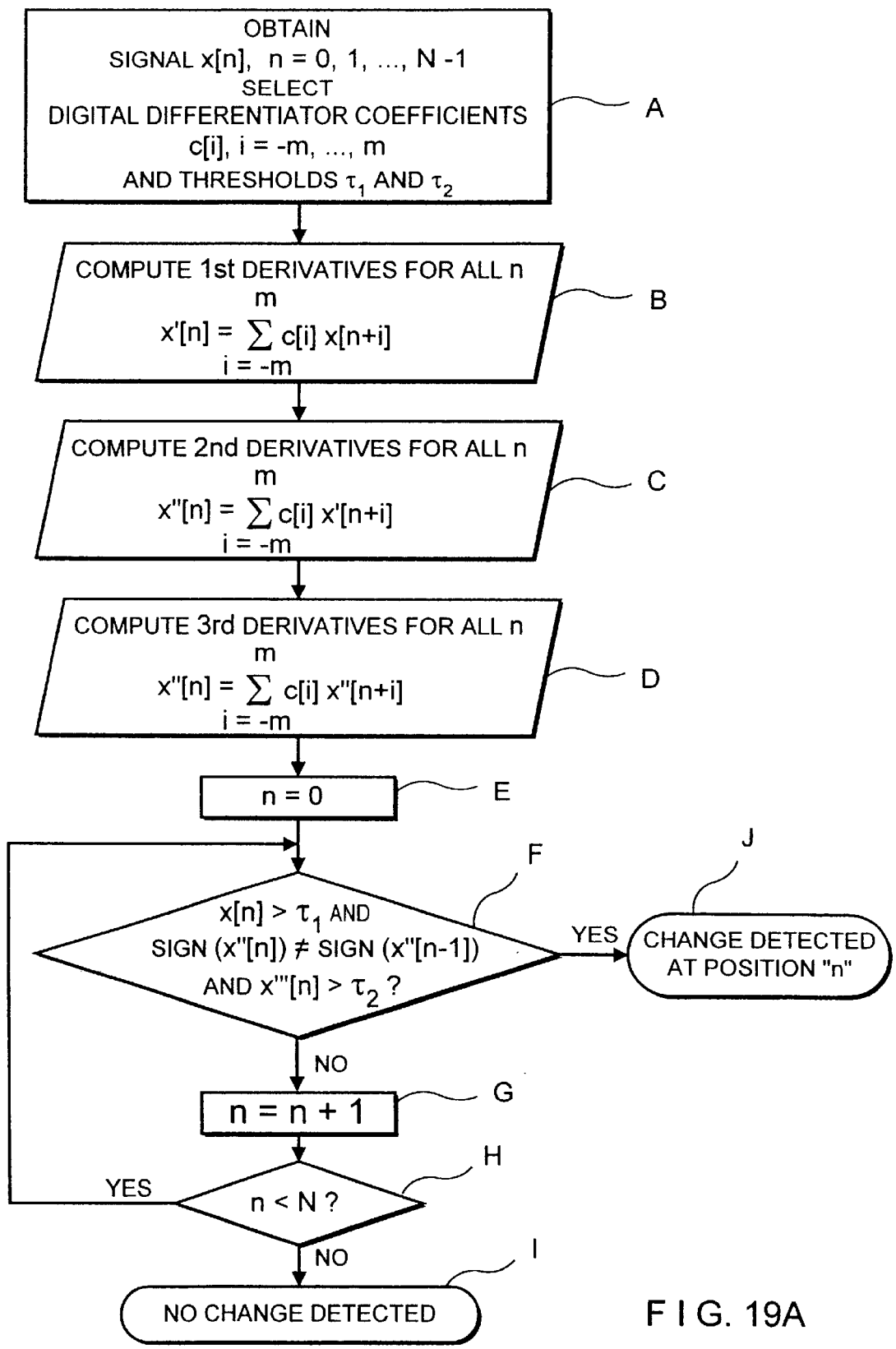
FIG. 19A is a flow chart describing the operation of the FIR digital filter system of FIG. 19 and how it detects sudden changes in the width and height data streams produced by the package height/width profiling subsystem of FIG. 16.
Figure 19B:
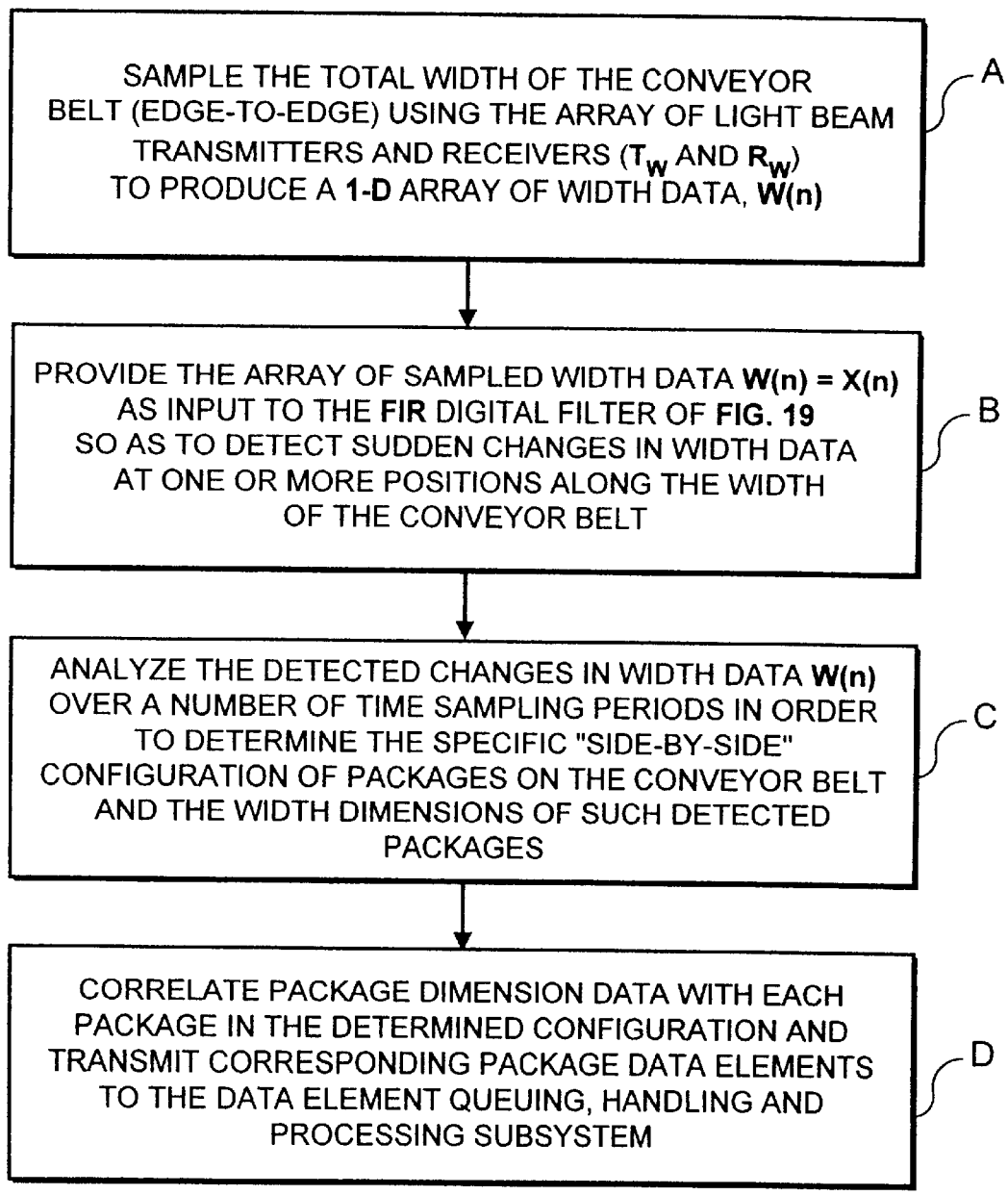
FIG. 19B is a flow chart describing the method of simultaneously detecting "side-by-side" configurations of packages along a conveyor belt using the FIR digital filter system of FIG. 19 to detect sudden changes in the width data streams produced by the package height/width profiling subsystem of FIG. 16.

When the two boxes 611 and 612 are close to each other or when one is on top of the other, as shown in FIGS. 18A through 18C, subsystem 600 employs a simultaneous package detection method based on package width (or height) measurements. This method of simultaneous package detection is best described by considering the width measurement taken by the subsystem over time as being expressible as $[x_1, x_2 \ldots x_n]$. According to the simultaneous package detection/tracking method hereof, the subsystem 600 employs a novel FIR digital filter system, as illustrated in FIGS. 19, 19A and 19B.

In general, the FIR digital filter formulation has a transfer function which fits the linear operation of differentiation where $d/dt\ e_{iwt}=iwe^{iwt}$. In the frequency domain, this implies that the transfer function is of the form:

$$H(w)=iw.$$

Letting the digital filter be of the form $Y_a=(N/Z_{K=-N})C_k x_{n-k}$ with coefficients $C_k=-C_k$, the transfer function can be expressed as:

$$H(w)=[2c_1 sinw+2c_2 sin2w+ \ldots +2c_N sinNw]i.$$

A Fourier Series approximation of the function can be expressed as:=

$$H(w) = \{iw \quad |w| < w_c$$
$$\{c \quad |w| > w_c$$

The resulting filter will have a passband of $[o,w_c]$. This is a low pass (smoothing) differentiator for $w_c < \pi$. The filter coefficients can be computed using the formula $C_k=(a_k+ib_k)/2$ where k=0.
Where $a_k=v$ and $b_k=(1/\pi)I_{-\pi}u(w)sinkwdw$ $b_k=(2/\pi)I_0^{wc}iwsinkwdw$ $C_k=(-1/\pi)((sinkw_c k)-(w_c coskw_c/k))$ Notably, $w_c$ is a value in the range of $[o,\pi\}$ when $w_c=\pi$, and also $C_k=(1/k)(-1)^k$ Using the above formulation, a digital filter can be designed for the simultaneous package detection method of subsystem 600. For the 1 st derivative, a low pass stop frequency of $f_c+o$ (1 is used where $w_c=2\pi$). This will help filter out the noise during measurement operations in subsystem 600. For the 2nd derivative, an all pass band ($w_c=\pi$) is used. To improve the detection performance, in particular to reduce flash-alarm rate, the present invention teaches using a 3rd derivative to sample the $2^{nd}$ derivative zero crossings and thus ensure that false-alarms do not happen due to the lowering of the 1st derivative threshold in the digital filter design. As illustrated in FIG. 19, the digital filter method of the present invention comprises: (A) computing the $1^{st}$ spatial derivative (or gradient function) of x(n) for all spatial samples n; (B) computing the $2^{nd}$ spatial derivative of x(n) for all samples n; (C) computing the $3^{rd}$ spatial derivative of x(n) for all spatial samples n; (D) determine whether the 1st spatial derivative signal x'(n) is greater than the threshold $\tau_1$; (E) using the thresholded 1st spatial derivative signal x'(n) to sample the $2^{nd}$ spatial derivative signal x"(x); (F) detecting the zero-crossings of x"(n) to produce a zero-crossing signal; (G) sampling the detected zero-crossing signal using the $3^{rd}$ spatial derivative signal x'"(n) to produce a sampled zero-crossing signal; (H) thresholding the sampled zero-crossing signal against the threshold $\tau_2$ to detect sudden changes in the value of x(n); and (I) analyzing the changes in the value of x(n) over a number of time sampling periods in order to determine whether packages are configured side-by-side, stacked or singulated manner.

In FIG. 19A, the digital filter method the present invention is represented in a flow chart, indicating the particular operations carried out in a real-time sequential manner.

As indicated at Block A in FIG. 19A, a sampled position signal x(n) is obtained where n=0,1,2, . . . , N−1; the digital filter coefficients c[i] are selected; and thresholds $\tau_1$ and $\tau_2$ are obtained using empirical methods. At Block B in FIG. 19A, the $1^{st}$ spatial derivative of x(n), denoted x'(n), is computed for all samples n. At Block C in FIG. 19A, the $2^{nd}$ spatial derivative of x(n), denoted x"(x), is computed for all samples n. A Block D in FIG. 19A, the $3^{rd}$ spatial derivative of x(n), denoted x'"(x), is computed for all samples n. At Block E in FIG. 19A, the position index n is set to zero. At Block F in FIG. 19A, the filter determines whether the 1st spatial derivative signal x'(n) is greater than the threshold $\tau_1$ whether sign (x"[x]) ≠sign (x"[n−1]) and whether x" [n]>$\tau_2$. If any one of these conditions are not satisfied, then at Block G the position index n is incremented by 1 (i.e. n=n+1) and then, at Block H, a check is made to determine whether the position index n is less than N. If not, then at Block I, no change is detected. If n<N, then the process flow returns to Block F, as indicated at Block F. If at Block F, all three of the conditions listed therein are satisfied, then at Block J a change is detected at position n across the width of the conveyor belt.

Figure 19C:
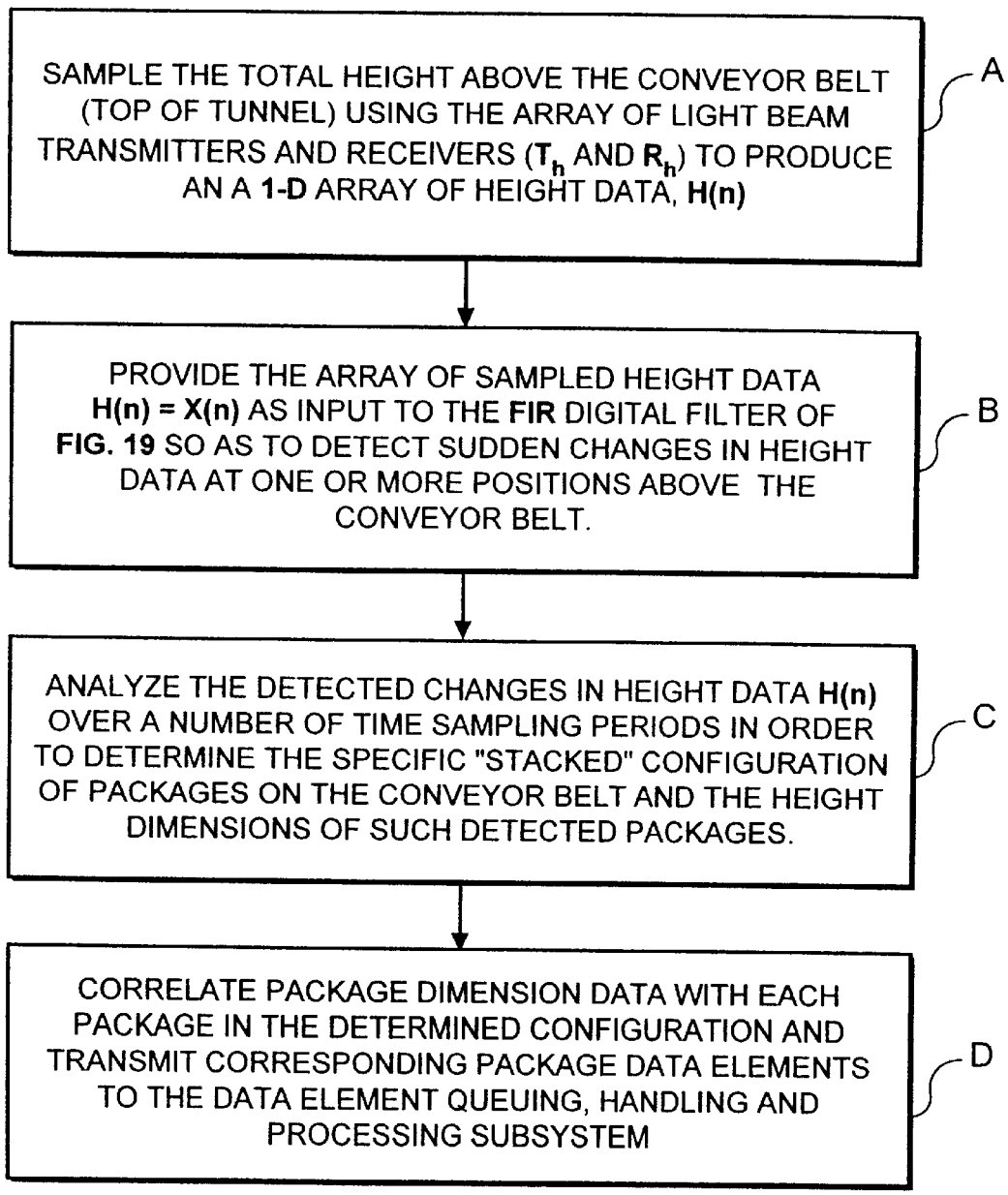
FIG. 19C is a flow chart describing the method of simultaneously detecting "stacked" configurations of packages along a conveyor belt using the FIR digital filter of FIG. 19 to detect sudden changes in the height data streams produced by the package height/width profiling subsystem of FIG. 16.

Notably, the digital FIR filter system illustrated in FIGS. 19 and 19A is used as a basic filtering module within H/W Data Processor 605 of FIG. 16A. During the operation of the system of the present invention, the H/W Data Processor 605 carries out the simultaneous package detection process of the present invention to be described hereinbelow with reference to FIGS. 19B and 19C.

In general, there are two basic scenarios to consider when carrying out the simultaneous package detection method of the present invention: (1) when one box is disposed beside another, as shown in FIGS. 17A through 17C; and (2) when one box is disposed on top of another as shown in FIGS. 18A through 18C. The cases of more than 2 boxes can be easily extended from these two box scenarios.

Considering the side-by-side boxes case, shown in FIGS. 17A through 17C, it is noted that the light transmitting and receiving structures ($T_W$, $R_W$) 602A and 602B, respectively, are used to measure the width of the packages when they move through the light curtain structure of FIG. 16A, as it is often referred to by those skilled in the art. In the case of side-by-side boxes, the measurement of package width will change while packages are passing through the light curtain structure. The method of simultaneously detecting packages arranged in a "side-by-side" configuration is illustrated in the flow chart of FIG. 19B.

As indicated at Block A in FIG. 19B, the first step in the method involves obtaining an array of N sampled width measurements W(n) along the total width of the conveyor belt (i.e. edge to edge) as the conveyor belt with packages thereon is transported through the light curtain shown in FIG. 16A. Collection of the array of width data elements, denoted by W(n) for n=0, 1, 2, . . . , N−1, is achieved using the array of light beam transmitters and receivers 602A and 602B, shown in FIG. 16A. Naturally, the spatial sampling rate (and thus the number and position of the N samples along the conveyor belt) is selected so that enough width measurements are taken and gaps between packages can be detected.

As indicated at Block B in FIG. 19B, second step in the method involves providing the array of sampled width data W(n) as input to the digital filter system of FIG. 19 so as to detect sudden changes in width data at one or more positions along the width of the conveyor belt. The first spatial derivative of the discrete set of width samples W(n) is defined as W'(n)=W(n)−W(n−1) where n=1,2, . . . N. The second spatial derivative of the discrete set of height samples W(n) is defined as W"(n)=W'(n)−W'(n−1) where n=1,2, . . . N. The third spatial derivative of the discrete set of width samples W(n) is defined as W'''(n)=W(n)"−W"(n−1) where n=1,2, . . . N. The digital filter system of FIG. 19 differentiates the sudden changes in values of W(n) from noise (e.g. measurement errors and slight irregularities in the box shape). As illustrated at Block F in FIG. 19A, the decision rules for the simultaneous detection method are:

(1) determine that the boxes are "side-by-side" if W'(n) >$\tau_1$, sign(W"[n])≠sign(W"[n−1]) and W"(n)>$\tau_2$, for any n; and (2) otherwise, determine that the boxes are singulated.

Notably, sign ( ) denotes the algebraic sign function which is used to find zero crossings in the 2nd spatial derivative signal W"(n). Simulations show that the above decision rules are work well with regard to noise, and always correctly locate abrupt changes in width data, which is necessary to determine that boxes are arranged in a side-by-side configuration.

As indicated at Block C in FIG. 19B, the third step of the method involves analyzing the detected changes in the width data array W(n) for n=0, 1, 2, . . . , N−1 for a number of time sampling periods, so as to determine the specific "side-by-side" configuration of packages on the conveyor belt.

As indicated at Block D in FIG. 19B, the fourth and last step of the method involves correlating the package dimension data (if collected) with each package in the detected "side-by-side" configuration, and transmitting a special "multiple-in-tunnel" package indicating data element (e.g. MPIT data element) to the data element queuing, handling and processing subsystem 1000 indicates that within subsystem 1000 there is either an irregular-shaped package in the tunnel or multiple side-by-side packages in the tunnel. Subsystem 1000 can then generate a control signal to cause a downstream package router to route such multiple packages through a package singulation unit, and then once again through the scanning tunnel system without human intervention. Considering the "stacked" boxes case, shown in FIGS. 18A through 18C, it is noted that the light transmitting and receiving structures ($T_W$, $R_W$) 601A and 601B, respectively, are used to measure the height of the packages when they move through the light curtain structure shown in FIG. 16A. In the case of stacked boxes, the measurement of the package height will change while packages are passing through the light curtain. The method of simultaneously detecting packages arranged in a "stacked" configuration is illustrated in the flow chart of FIG. 19C.

As indicated at Block A in FIG. 19C, the first step in the method involves obtaining an array of N sampled height measurements W(n) along the total height of the tunnel aperture (i.e. top to bottom) as the conveyor belt with packages thereon is transported through the light curtain structure shown in FIG. 16A. Collection of the array of height data elements, denoted by H(n) for n=0, 1, 2, . . . , N−1, is achieved using the array of light beam transmitters and receivers 601A and 601B, shown in FIG. 16A. Naturally, the sampling rate (and thus the position of the N samples above the conveyor belt) is selected so that enough height measurements are taken.

As indicated at Block B in FIG. 19C, the second step in the method involves providing the array of sampled height data H(n) as input to the digital filter system of FIG. 19 so as to process the data array(s) and detect sudden changes in height data at one or more positions above the height of the conveyor belt. The first spatial derivative of the discrete set of height samples H(n) is defined as H'(n)=H(n)−H(n−1) where n=1,2, . . . , N. The second spatial derivative of the discrete set of height samples H(n) is defined as H"(n)=H'(n)−H'(n−1) where n=1,2, . . . N. The third spatial derivative of the discrete set of height samples H(n) is defined as H'''(n)=H(n)"−H"(n−1) where n=1,2, . . . N. The digital filter system of FIG. 19 differentiates the sudden changes in values of H(n) from noise (e.g. measurement errors and slight irregularities in the box shape). As illustrated at Block F in FIG. 19A, the decision rules for the simultaneous detection method operating on sampled height data, are:

(1) determine that the boxes are "stacked" if H(n)>$\tau_1$, sign(H"[n]) ≠sign(H"[n−1]) and H"(n)>$\tau_2$, for any n; and (2) otherwise, determine that the boxes are singulated.

Notably, sign ( ) denotes the algebraic sign function which is used to find zero crossings in the 2nd spatial derivative signal H"(n). Simulations show that the above decision rules work well with regard to noise, and always correctly locate abrupt changes in height data, which is necessary to determine that boxes are arranged in a stacked configuration.

As indicated at Block C in FIG. 19C, the third step of the method involves analyzing the detected changes in the height data array H(n) for n=0, 1, 2, . . . , N−1 for a number of time sampling periods, so as to determine the specific "stacked" configuration of packages on the conveyor belt.

As indicated at Block D in FIG. 19C, the fourth and last step of the method involves correlating the package dimension data (if collected) with each package in the detected "side-by-side" configuration, and transmitting corresponding package indicating data elements (e.g. PIT data elements) to the data element queuing, handling and processing subsystem 1000. As will become apparent hereinafter, these PIT data elements enable detected packages to be tracked within the overall system and eventually linked up with corresponding package identification data acquired by the bar code symbol reading subsystems employed within the Tunnel Scanning System.

Using the package detection method described above, any arrangement of non-singulated boxes on the conveyor belt can be automatically detected and successfully tracked.

The sampling rate for the above described digital filtering method, denoted by T, can be determined as follows: Let the speed of the box/conveyor be denoted by v, and the minimum tolerance for package separation be denoted as D. Then considering the necessary data points to perform the second derivative, the following expression must hold true:

$$T \neq 3D/v$$

Using this rule for a 600 ft/min. conveyor belt, if the minimum tolerance is 50 mm (2 in.), then the sampling period is about 5 ms, which corresponds to a sampling frequency of about 200 Hz.

Figure 20A:
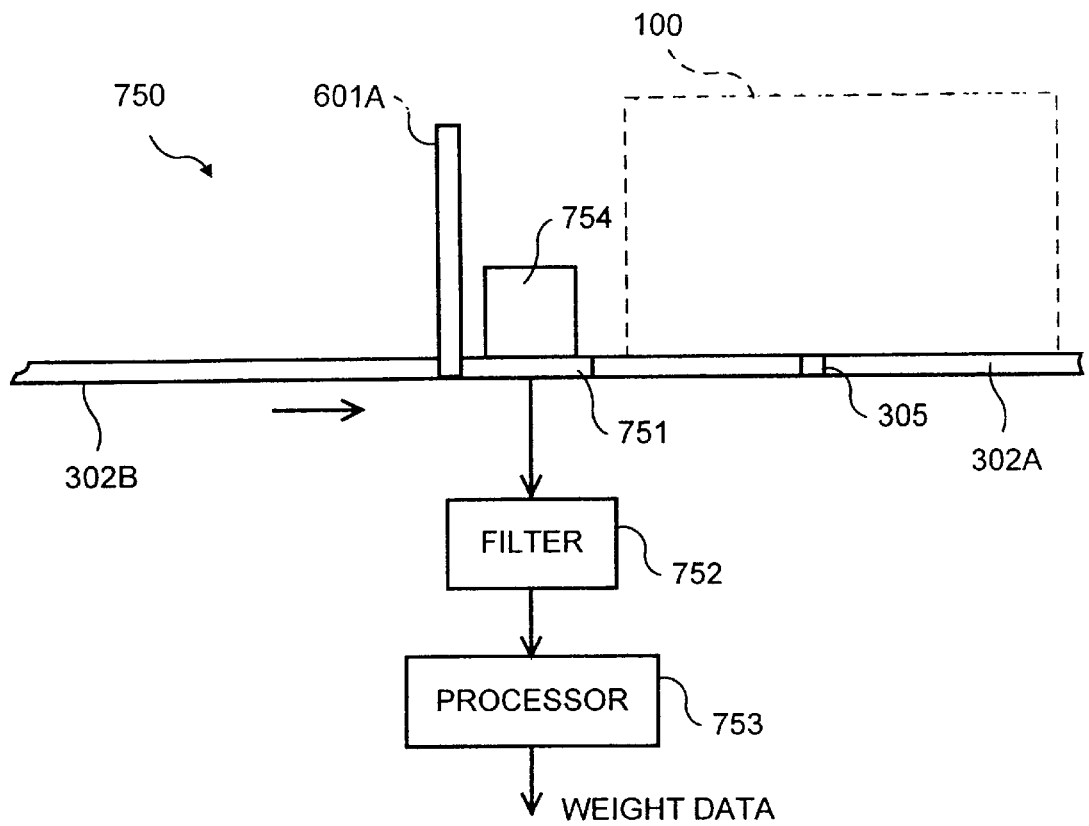
FIG. 20A is an elevated side schematic view of the in-motion weighing subsystem employed in the system of the first illustrative embodiment of the present invention, wherein the scale and data processing subcomponents thereof are shown arranged about the package height/width profiling subsystem of FIG. 16.
Figure 20B:
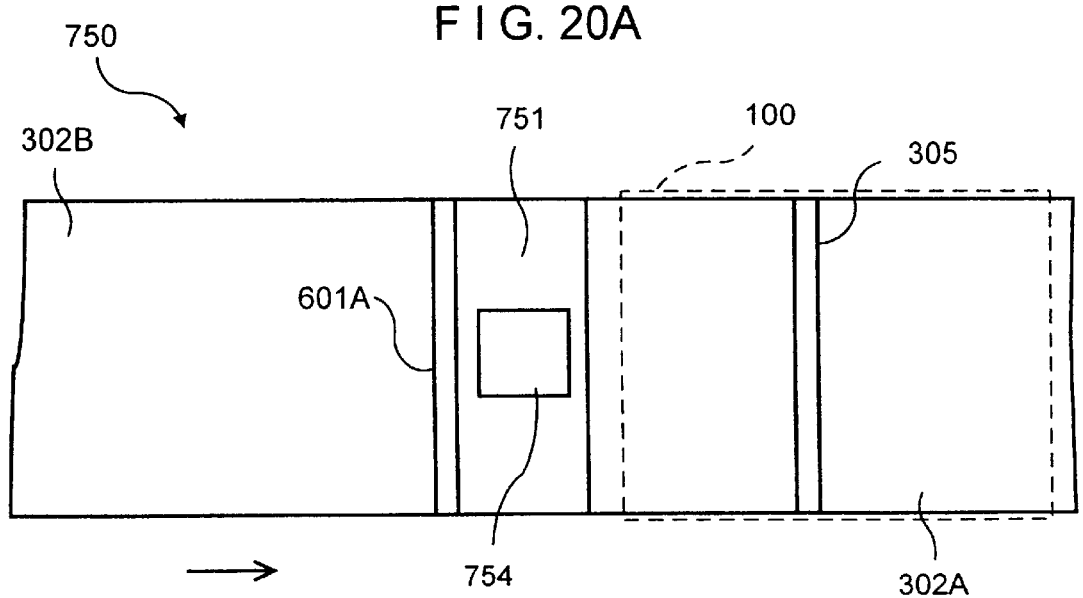
FIG. 20B is a plan view of the in-motion weighing subsystem shown in FIG. 20A, wherein a moving package is shown being weighed on the scale component as it is transported along the conveyor belt of the system of the first illustrative embodiment.

The In-Motion Package Weighing Subsystem of the First Illustrative Embodiment of the Present Invention As shown in the FIGS. 20A and 20B, the in-motion package weighing subsystem 750 is preferably arranged about the package height/width profiling subsystem 600. As shown, the in-motion weighing subsystem 750 comprises: a scale platform 751 integrated with the conveyor subsystem 300, for producing analog or digital weight signals indicative of the weight of a package(s) 754 moving across the scale platform 751; a filtering circuit 752 for filtering the analog or digital weight signals in order to remove noise components and artifacts therefrom; and a signal processor 753 for processing the filtered weight signals in order to produce a digital word representative of the measured weight of the package. Notably, the in-motion weighing subsystem of the illustrative embodiment can be used to realize using the 9480 EXPRESSWEIGHT™ In-Motion Variable Box and Package Weighing System from Mettler-Toledo, Inc. of Worthington, Ohio.

The Package-In-Tunnel Signaling Subsystem of the First Illustrative Embodiment of the Present Invention The package-in-tunnel indication subsystem 500 can be realized in a variety of ways. One way shown in FIG. 21, is to use a light transmitting/receiving structure as employed in package identification and measuring system 600, and generating a package-out-of-tunnel (POOT) data element upon detecting the exit of each package from the scanning tunnel. As shown in FIG. 21, the vertically arranged light transmitting and receiving structures 801A and 801B, as well as horizontally arranged light transmitting and receiving structures 802A and 802B, are arranged in a manner generally known in the package handling art. As shown in FIG. 21, the vertically arranged light transmitting and receiving structures 801A and 801B are controlled by a height control unit 803, which produces, as output, a signal $S_H$ consisting of time-sampled package height data collected along the vertical extent of the scanning tunnel aperture, similarly, horizontally arranged light transmitting and receiving structures 803 are controlled by a width control unit 804, which produces, as output, a signal $S_W$ consisting of time-sampled package height data collected along the horizontal extent of the scanning tunnel aperture. The output data streams from height and width control units 803 and 804, and the package length/velocity measurement subsystem 400, are provided as input to an H/W data processor 805, programmed to produce a package-out-of-tunnel (POOT) Indication (token) Data Element for each package detected by 800. In the illustrative embodiment, subsystem 800 is realized by integrating (i) the profiler system (Model No. P101-144-200) from KORE, Inc. of Grand Rapids, Mich., and providing programmed H/W data processor 805 which includes the digital filter system described in FIGS. 19 through 19C in order to simultaneously detect side-by-side configured packages, stacked packages, as well as singulated packages in the manner described in great detail hereinabove.

As shown in FIG. 21, the best location for this subsystem is at the exit plane of the scanning tunnel. The POOT data element is provided to the data element queuing, handling and processing subsystem 1000, in the manner similar to that of all other data elements generated from the package height/width profiling subsystem 600, scanning units associated with the tunnel scanning subsystem, and package-in-tunnel indication subsystem 500.

Figure 22B:
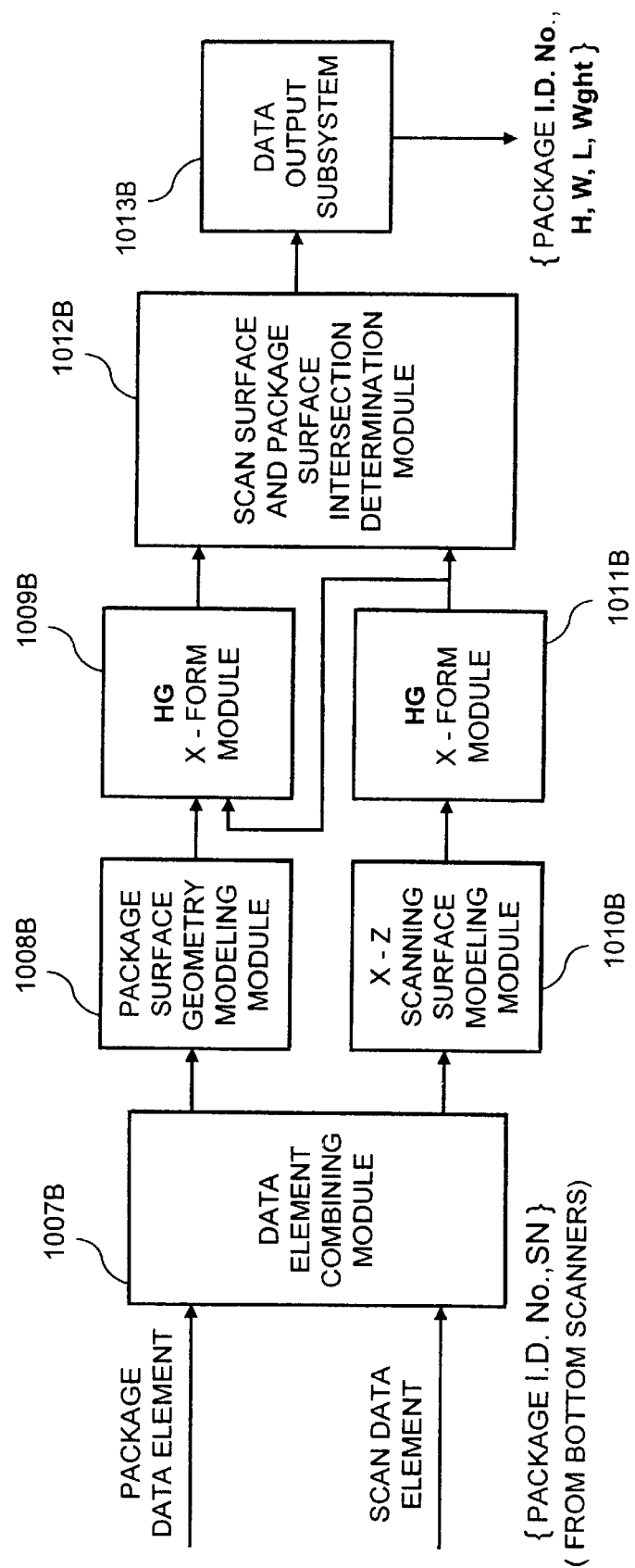

The Data Element Queuing, Handling and Processing Subsystem of the First Illustrative Embodiment of the Present Invention In FIGS. 22A1, 22A2 and 22B, the structure and function of data element queuing, handling and processing subsystem 1000 is shown in greater detail. As shown in FIGS. 22A1 and 22A2, all data elements entering subsystem 1000 are provided to an I/O subsystem 1001, the output port of which is connected to a data element time-stamping unit 1002 that is controlled by a timing/control unit 1003. In the illustrative embodiment, there are four possible types of data elements that might be loaded into the system event queue 1004, realized as a FIFO data structure known in the computing art. As shown in FIGS. 22A1 and 22A2, the four possible data element types are: package data elements; scan beam data elements; package-in-tunnel (PIT) data elements; and package out-of-tunnel (POOT) data elements.

As shown in FIGS. 22A1 and 22A2, the data element queuing, handling and processing subsystem 1000 further comprises a number of other modules, namely: a moving package tracking queue 1005, realized as a FIFO data structure known in the computing art, for queuing package data elements, package-in-tunnel (PIT) data elements and package out-of-tunnel (POOT) data elements; and a data element analyzer 1006 (e.g. programmed microprocessor and associated memory structures) for reading the different types of data elements from the output of the system event queue 1004 and analyzing and handling the same according to the Data Element Handling Rules set forth in FIGS. 23A1 and 23A2.

As shown in FIGS. 22A1 and 22A2, scan beam data elements generated from "holographic type" laser scanning subsystems must be processed using a system of data processing modules illustrated in FIGS. 22A1 and 22A2. As shown in FIGS. 22A1 and 22A2, this system of data processing modules comprises a data element combining module 1007A for combining (i) each scan beam data element generated from "holographic-type" laser scanning subsystems and accessed from the system event queue 1004 with (ii) each and every package data element in the moving package tracking queue 1005, so as to produce a plurality of combined data element pairs; a package surface geometry modeling module 1008A for generating a geometrical model for the package represented by the package data element in each combined data element pair produced by the data element combining module 1007A; a homogeneous transformation (HG) module 1009A for transforming (i.e. converting) the coordinates of each package surface geometry model produced at the "dimensioning position" in the global coordinate reference frame $R_{global}$, into package surface geometry model coordinates at the "scanning position" within the scanning tunnel (i.e. displaced a distance z from the package dimensioning position); a scan beam geometry modeling module 1010A for generating a geometrical model for the laser scanning beam represented by the scan beam data element in each combined data element pair produced by the data element combining module 1007A; a homogeneous transformation (HG) module 1011A for transforming (i.e. converting) the coordinates of each scanning beam geometry model referenced to the local frame of reference symbolically embedded within the holographic laser scanning system, into scanning beam geometry model coordinates referenced to the global coordinate reference $R_{global}$ at the "scanning position" within the scanning tunnel; a scan beam and package surface intersection determination module 1012A for determining, for each combined data element pair produced from the data element combining module, whether the globally-referenced scan beam model produced by the HG transformation module 1009A intersects with the globally-referenced package surface model produced by the HG transformation module 1011A, and if so, then the data output subsystem 1013A produces, as output, package identification data, package dimension data (e.g. height, width data etc.), and package weight data, for use by auxiliary systems associated with the tunnel scanning system of the present invention.

As shown in FIGS. 22A1, 22A2 and 22B, scan beam data elements generated from "non-holographic type" laser scanning subsystems must be processed using a different system of data processing modules than that shown in FIGS. 22A1 and 22A2. As shown in FIG. 22B, this system of data processing modules comprises: a data element combining module 1007B (similar to module 1007A) for combining (i) each scan beam data element generated from the "non-holographic-type" bottom-located laser scanning subsystems and accessed from the system event queue 1004 with (ii) each and every package data element in the moving package tracking queue 1005, so as to produce a plurality of combined data element pairs; a package surface geometry modeling module 1008B (similar to module 1008A) for generating a geometrical model for the package represented by the package data element in each combined data element pair produced by the data element combining module 1007B; a homogeneous transformation (HG) module 1009B (similar to module 1009A) for transforming (i.e. converting) the coordinates of each package surface geometry model produced at the "dimensioning position" in the global coordinate reference frame $R_{global}$, into package surface geometry model coordinates at the "scanning position" within the scanning tunnel (i.e. displaced a distance z from the package dimensioning position); a X-Z scanning surface (geometry) modeling module 1010B for generating a geometrical model for the laser scanning surface represented by the scan beam data element in each combined data element pair produced by the data element combining module 1007B; a homogeneous transformation (HG) module 1011B for transforming (i.e. converting) the coordinates of each x-z scanning surface geometry model referenced to the local frame of reference symbolically embedded within the non-holographic bottom laser scanning subsystem, into scanning beam geometry model coordinates referenced to the global coordinate reference $R_{global}$ at the "scanning position" within the scanning tunnel; a scan beam and package surface intersection determination module 1012B for determining, for each combined data element pair produced from the data element combining module, whether the globally-referenced scanning surface model produced by the HG transformation module 1009B intersects with the globally-referenced package surface model produced by the HG transformation module 1011B, and if so, then the data output subsystem 1013B produces, as output, package identification data, package dimension data (e.g. height, width data etc.), and package weight data, for use by auxiliary systems associated with the tunnel scanning system of the present invention.

Having described the overall structure and function of the data element queuing, handling and processing subsystem 1000, it is appropriate at this juncture to now briefly describe the operation thereof with reference to FIGS. 22A1, 22A2 and 22B.

Prior to loading into the system event queue 1004, each data element is time-stamped (i.e. $T_j$) by the timing stamping module 1002 driven by a master clock within timing/control unit 103 referenced to the global reference frame $R_{global}$. All data elements in the system event queue 1004 are handled by a data element analyzer/handler 1006 which is governed by the table of Data Element Handling Rules set forth in FIGS. 23A1 and 23A2. In general, subsystem 1000 is best realized by a computing platform having a multi-tasking operating system capable of handling multiple "threads" at the same time.

Each package moving through the scanning tunnel will be represented by a data element (i.e. an object in an object-oriented programming environment e.g. Java programming environment) stored in a moving package tracking queue 1005 operably connected to the data element handler 1006. Package data elements are placed in the moving package tracking queue 1005 and matched with each scan beam data element accessed from the system event queue 1004 using a data element combining module 1007A. Scan beam data elements generated from holographic-based scanning units are processed along the scan data processing channel illustrated by blocks 1008A, 1009A, 1010A, 1011A, 1012A, and 1013A set forth in the lower right hand corner of FIGS. 22A1 and 22A2, whereas scan beam data elements generated from non-holographic based scanning units (e.g. from the bottom-located polygon scanners in the tunnel) are processed along a different scan data processing channel illustrated by blocks 1008B, 1009B, 1010B, 1011B, 1012B, and 1013B set forth on FIG. 22B. This is because scan beam data elements generated from holographic-based scanning units have been generated from laser scanning beams (or finite scanning sectors) which can be tracked with scan package identification data by tracking facet sectors on the scanning disc in issue. While a similar technique can be used for polygon-based scanners (e.g. tracking "mirror sectors" instead of HOE-based facet sectors), a different approach has been adopted in the illustrative embodiment. That is, the scanning surface (e.g. 3×5 ") of each polygon scanning unit along the bottom scanner is accorded a vector-based surface model, rather than a ray-type model used for package identification data collected using holographic scanning mechanisms.

Figure 24:
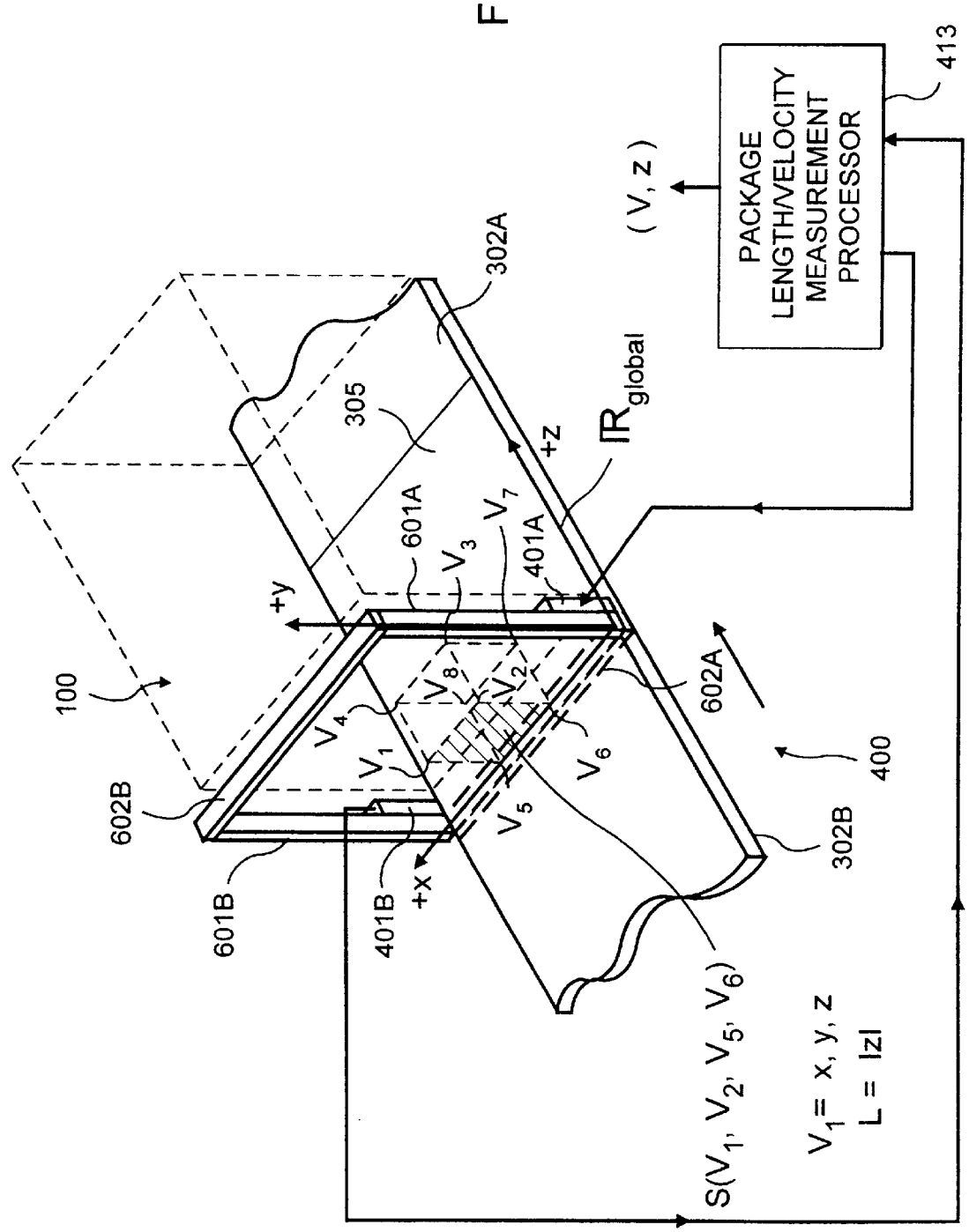
FIG. 24 is a schematic representation of the surface geometry model created for each package surface by the package surface geometry modeling subsystem (i.e. module) deployed with the data element queuing, handling and processing subsystem of FIGS. 22A1 and 22A2, illustrating and showing how each surface of each package (transported through package dimensioning/measuring subsystem and package velocity/length measurement subsystem) is mathematically represented (i.e. modeled) using at least three position vectors (referenced to x=0, y=0, z=0) in the global reference frame $R_{global}$, and a normal vector drawn to the package surface indicating the direction of incident light reflection therefrom.

The Package Surface Geometry Modeling Subsystem of the First Illustrative Embodiment of the Present Invention As shown in FIG. 24, a surface geometry model is created for each package surface by the package surface geometry modeling subsystem (i.e. module) 1008A deployed with the data element queuing, handling and processing subsystem 1000 of FIGS. 22A1 and 22A2. In the illustrative embodiment, each surface of each package transported through package dimensioning/measuring subsystem 600 and package velocity/length measurement subsystem 400 is mathematically represented (i.e. modeled) using at least three position vectors (referenced to x=0, y=0, z=0) in the global reference frame $R_{global}$, and a normal vector to the package surface indicating the direction of incident light reflection therefrom. The table of FIG. 24A describes a preferred procedure for creating a vector-based surface model for each surface of each package transported through the package dimensioning/measuring subsystem 600 and package velocity/length measurement subsystem of the system 400 hereof.

Figure 25A:
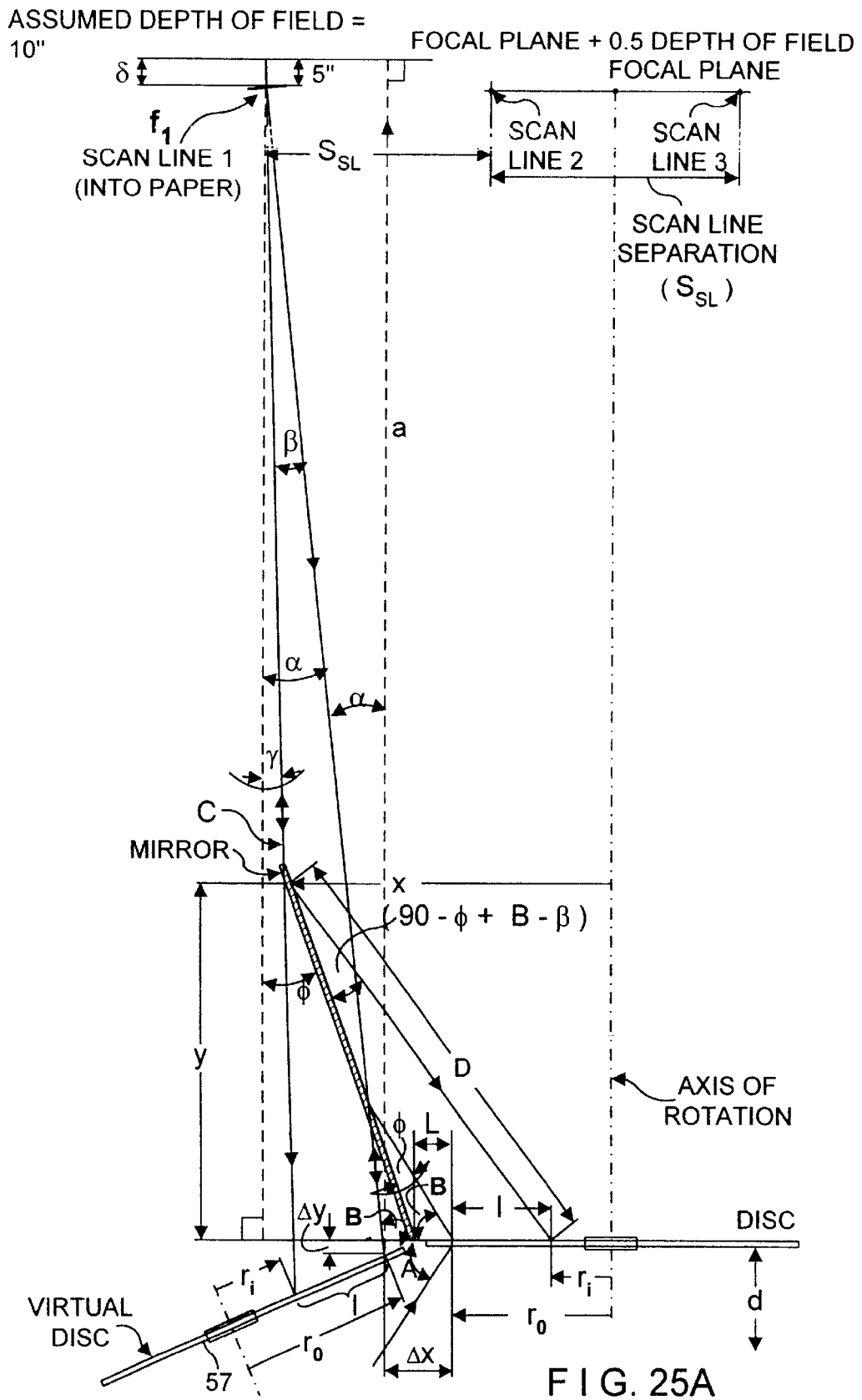

The Scan Beam Geometry Modeling Subsystem of the First Illustrative Embodiment of the Present Invention As shown in FIGS. 25A through 25A1, a vector-based model is created by the scan beam geometry modeling subsystem (i.e. module) 1010A of FIGS. 22A1 and 22A2, for the propagation of the laser scanning beam (ray) emanating from a particular point on the facet, to its point of reflection on the corresponding beam folding mirror, towards to the focal plane determined by the focal length of the facet.

The table set forth in FIGS. 25B1 through 25B3 define the parameters used to construct the diffraction-based geometric optics model of the scanning facet and laser scanning beam shown in FIGS. 25A and 25A1. Details of this modeling procedure can be found in Applicant's copending application Ser. No. 08/726,522 filed Oct. 7, 1996; and Ser. No. 08/573,949 filed Dec. 18, 1995.

FIG. 26 provides a schematic representation of the laser scanning disc shown in FIGS. 25A and 25A1, labeled with particular parameters associated with the diffraction-based geometric optics model of FIGS. 25A and 25A1.

In FIG. 27, a preferred procedure is described for creating a vector-based ray model for laser scanning beams which have been produced by a holographic laser scanning subsystem of the system hereof, that may have collected the scan data associated with a decoded bar code symbol read thereby within the tunnel scanning subsystem.

Figure 28:
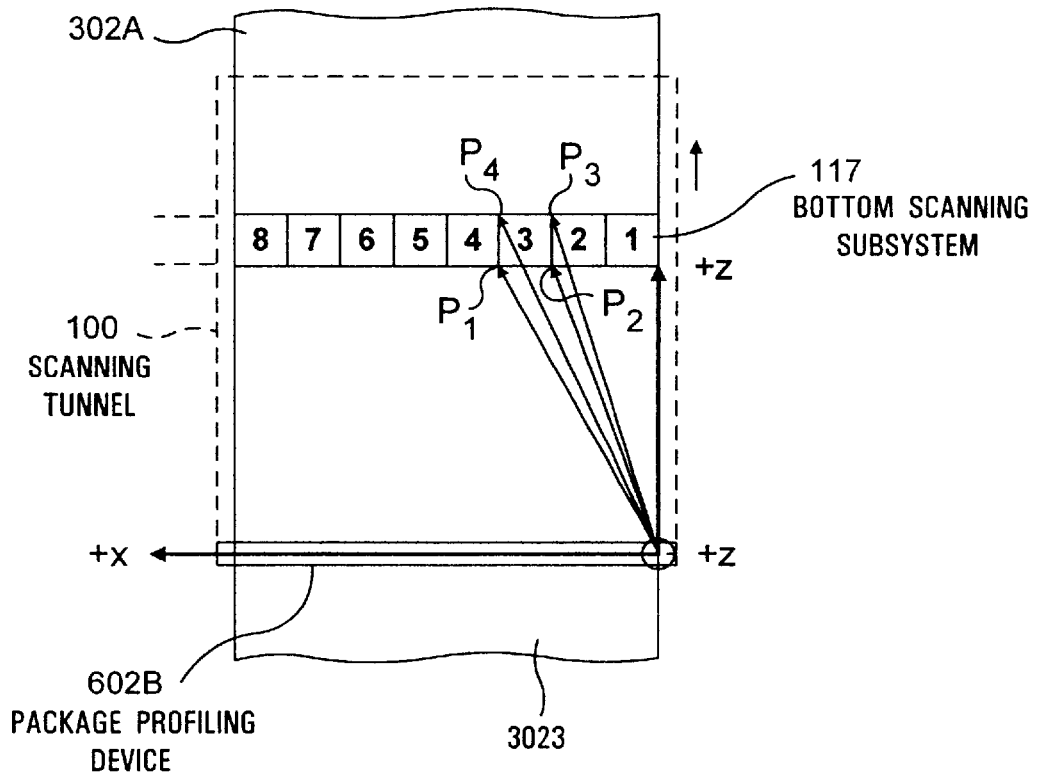
FIG. 28 is a schematic representation of the vector-based 2-D surface geometry model created for each candidate scan beam by the scan surface modeling subsystem (i.e. module) shown in FIG. 22B, and showing how each omnidirectional scan pattern produced from a particular polygon-based bottom scanning unit is mathematically represented (i.e. modeled) using four position vectors (referenced to x=0, y=0, z=0) in the global reference frame $R_{global}$, and a normal vector drawn to the scanning surface indicating the direction of laser scanning rays projected therefrom during scanning operations.

The Scan Surface Modeling Subsystem of the First Illustrative Embodiment of the Present Invention FIG. 28 schematically shows how the scan surface modeling subsystem (i.e. module) shown of FIG. 22B can be used to define a vector-based 2-D surface geometry model for each candidate scan beam generated by the polygonal-based bottom scanners in the tunnel scanning system. As shown in FIG. 28, each omnidirectional scan pattern produced from a particular polygon-based bottom scanning unit is mathematically represented (i.e. modeled) using four position vectors (referenced to x=0, y=0, z=0) in the global reference frame $R_{global}$, and a normal vector to the scanning surface indicating the direction of laser scanning rays projected therefrom during scanning operations.

The Homogeneous (HG) Transformation Module of the First Illustrative Embodiment of the Present Invention FIG. 29 schematically describes how the homogeneous (HG) transformation module 1009A of FIGS. 22A1 and 22A2 uses homogeneous transformations to convert a vector-based model within a local scanner coordinate reference frame $R_{localscannerj}$ into a corresponding vector-based model created within the global scanner coordinate reference frame $R_{global}$. This mathematical technique is essential in that it converts locally-referenced coordinates used to represent a laser beam (which scanned a bar code symbol) into globally-referenced coordinates used to represent the same laser scanning beam.

FIG. 30 describes how the homogeneous (HG) transformation module 1010A of FIGS. 22A1 and 22A2 uses homogeneous transformations to convert a vector-based package surface model specified within the global coordinate reference frame $R_{global}$ at the "package height/width profiling position", into a corresponding vector-based package surface model created within the global coordinate reference frame $R_{global}$ specified at the "scanning position" within the tunnel scanning system. This mathematical technique is essential in that it converts locally-referenced coordinates used to represent a package surface into globally-referenced coordinates used to represent the same package surface. Notably, this method of coordinate conversion involves computing the package travel distance (z=d) between the package height/width profiling and scanning positions using (1) the package or conveyor belt velocity (v) and the difference in time (i.e. ΔT=T1−T2) indicated by the time stamps (T1 and T2) placed on the package data element and scan beam data element, respectively, matched thereto during each scan beam/package surface intersection determination carried out within module 1012A in the data element queuing, handling and processing subsystem 1000 of FIGS. 22A1, 22A2 and 22B. Notably, this package displacement distance z=d between the profiling and scanning positions is given by the mathematical expression d=v ΔT.

The Scan Beam and Package Surface Intersection Determination Subsystem of the First Illustrative Embodiment of the Present Invention for Use with Scan Beam Data Elements Produced by Holographic Scanning Subsystems FIGS. 31A and 31B, taken together, describes a procedure which is carried out within the scan beam and package surface intersection determination module 1012A of the illustrative embodiment in order to determine whether (i) the scan beam (rays) associated with a particular scan beam data element produced by a holographic scanning subsystem intersects with (ii) any surface on the package that has been scanned at a particular scanning position, and thus whether to correlate a particular package identification data element with particular package measurement data element acquired by the system.

As indicated at Block A in FIG. 31A, the first step of the procedure involves using the minimum and maximum scan rays models of the laser scan beam to determine the intersection point between the scan ray and a surface on the package (using the vector-based models thereof) referenced to the global coordinate reference frame. As indicated at Block B in FIG. 31A, if an intersection point has been determined at Block A, then confirm that the sign of the normal vector of the surface is opposite the sign of the scan ray direction vector. As indicated at Block C in FIG. 31A, if the sign of the normal vector is opposite the sign of the scan ray direction vector, then determine if the intersection point (found at Block A) falls within the spatial boundaries of the package surface. As indicated at Block D in FIG. 31B, if the intersection point falls within the boundaries of the surface, then output a data element to the output queue in the data output subsystem 1013A, wherein the data element comprises package identification data and data representative of the dimensions and measurements of the package by the system for use by other subsystems. When a scan beam data element taken from the system event queue 1004 is correlated with a package data element using the above described method, then the subsystem 1000 outputs a data element (in an output data queue 1013A) containing the package ID data and the package dimensional and measurement data. Such data elements can be displayed graphically, printed out as a list, provided to sorting subsystems, shipping pricing subsystems, routing subsystems and the like.

The Scan Surface and Package Surface Intersection Determination Subsystem of the First Illustrative Embodiment of the Present Invention for Use with Scan Beam Data Elements Produced by Non-Holographic Scanning Subsystems FIGS. 32A and 32B, taken together, describes a procedure which can be carried out within the scan surface and package surface intersection determination module 1012B of FIG. 22B in order to determine whether the scanning surface associated with a particular scan beam data element produced by a non-holographic (e.g. polygon-based) "bottom-located" scanning subsystem spatially intersects with any surface on the package that has been scanned at a particular scanning position, and thus whether to correlate a particular package identification data element with particular package measurement data element acquired by the system.

As indicated at Block A in FIG. 32A, the first step of the procedure involves using the vector-based surface models of the laser scan surfaces of the bottom polygon scanners and side surfaces of the packages so as to determine whether or not there exists a point of intersection between the scanning surface of the polygon-based scanners and any surface of the package. As indicated at Block B in FIG. 32A, if an intersection point exists, then confirm that the sign of the vector model of the scanning surface (i.e. the normal vector) is opposite the sign of the vector model of the package surface. As indicated at Block C in FIG. 32B, if the sign of the normal vector of the scanning surface is opposite the sign of the normal vector to the package surface, then confirm that certain of the points bounded by the scanning surface coincide with points bounded by the surface of the package. As indicated at Block D in FIG. 32B, if sufficient overlap is found to exist between the scanning surface and the package surface, then output a data element to the output queue in the data output subsystem 1013B, wherein the data element comprises package identification data and data representative of the dimensions and measurements of the package by the system for use by other subsystems. When a scan beam data element taken from the system event queue 1004 is correlated with a package data element using the above described method, then the subsystem 1000 outputs a data element (in an output data queue 1013B) containing the package ID data and the package dimensional and measurement data. Such data elements can be displayed graphically, printed out as a list, provided to sorting subsystems, shipping pricing subsystems, routing subsystems and the like.

Notably, the smaller the facet sectors on the scanning disc, then the better resolution the system hereof will have with regarding to correlating package identification data with package measurement data. As the facet sector gets smaller, the corresponding minimum and maximum facet angles generated from the decoder device hereof will get closer and closer, approaching a single scanning ray in the ideal situation.

Automated Tunnel-Type Laser Scanning Package Identification and Weighing System Constructed According to a Second Illustrated Embodiment of the Present Invention Package Identification and Measurement Referring now to FIGS. 33 through 34, the "dual-lane" automated tunnel-type laser scanning system of the second illustrated embodiment 2000 will now be described in detail. As in the first illustrative embodiment depicted in FIGS. 1 through 32B, the system of the second illustrative embodiment is designed to identify and measure packages that are singulated along a conveyor subsystem in a conventional manner.

Overview of the Tunnel Scanning System of the Second Illustrative Embodiment of the Present Invention As shown in FIGS. 33 and 34, the automated tunnel scanning system of the second illustrative embodiment indicated by reference numeral 2000 comprises an integration of subsystems, namely: a high-speed package conveyor system 2100 having a conveyor belt 2101 having a width of at least 60 inches to support a pair of package transport lanes along the conveyor belt; a first pair of triple-disc holographic laser scanning bar code symbol reading subsystems 2200A and 2200B supported overhead above the conveyor belt 2101 by a support frame 2102 so as to produce a 3-D omnidirectional scanning volume 2103 thereabove, for scanning bar codes 2104 on packages 2105 transported therethrough; a second pair of triple-disc holographic laser scanning bar code symbol reading subsystems 2200C and 2200D supported on opposite sides of the conveyor belt structure as shown in FIG. 33, so as to produce a 3-D omnidirectional scanning volume 2103 thereabove, for scanning bar codes 2104 on packages 2105 transported therethrough; a four of triple-disc holographic laser scanning bar code symbol reading subsystems 2200E through 2200H mounted in the four corners of the tunnel system, as shown in FIG. 33A, for scanning bar codes 2104 on front and back surfaces of packages 2105 (e.g. USPS tubs and trays) transported therethrough; a package-in-the-tunnel indication subsystem 2300 realized as a pair of IR-based package detectors 2301A and 2301B directed over the first and second conveyor lanes (CL1 and CL2) 2102A and 2102B of the conveyor belt, respectively, for automatically detecting the presence of packages 2205 moving within lanes of the conveyor belt and into the scanning tunnel; a package-out-of-the-tunnel indication subsystem 2400 realized as a pair of IR-based package detectors 2401A and 2401B directed over the first and second conveyor lanes (CL1 and CL2) 2102A and 2102B of the conveyor belt, respectively, for automatically detecting the presence of packages moving within lanes of the conveyor belt and out of the scanning tunnel; a weighing-in-motion subsystem 2500 for weighing packages as they are transported along the conveyor belt 2101; a package/belt velocity measurement subsystem 2600 realized using a roller wheel 2601 engaged against the undersurface of the conveyor belt 2101, an optical shaft incremental encoder 2602 connected to the axle of the roller wheel 2601 and producing an electrical pulse output stream per revolution of the roller wheel, and a programmed microprocessor 2603 for processing the output pulse stream and producing digital data representative of the velocity of the conveyor belt (and thus package transported thereby) at any instant in time; an input/output subsystem 2700 for managing the data inputs to and data outputs from the system of FIG. 33; and a data management computer 2800, with a graphical user interface (GUI) 2701, for realizing a data element queuing, handling and processing subsystem 2900 as shown in FIG. 41, as well as other data and system management functions.

The High-Speed Conveyor Belt Subsystem of the Second Illustrative Embodiment

As shown in FIGS. 33, the high-speed conveyor belt subsystem 2100 of the illustrative embodiment comprises: a plurality of rollers 2102 spaced apart and supported by support frame structure (not shown in FIG. 33); a belt structure 2101, extending between and supported by a belt support structure 2103, and having a width of at least 60 inches to provide a pair of package transport lanes CL1 and CL2 along the conveyor belt subsystem; a drive motor 2104 for imparting torque to the rollers; and a belt velocity controller 2106 for controlling the velocity of the belt and thus packages during system operation.

Triple-disc Holographic Laser Scanning Bar Code Symbol Reading Subsystems of the Present Invention As shown in FIG. 33, triple-disc holographic laser scanning bar code symbol reading subsystem 2200A and 2200B are supported overhead above the conveyor belt 2101 by a support frame 2202. Triple-disc holographic laser scanning bar code symbol reading subsystem 2200C land 2200D are supported about the sides of the above the conveyor belt 2101 by support frame 2202, as well. Triple-disc holographic laser scanning bar code symbol reading subsystem 2200E through 2200G are supported in the four corners of the tunnel formed by subsystems 2200A through 2200D, as shown in FIG. 33A, also by way of support frame 2202, some of whose structure has not been shown for purposes of illustration in FIG. 33. Each triple-disc scanner 2200A through 2200D can be the same scanner shown in FIGS. 4A1 through 4A10. Each triple-disc scanner 2200E through 2200G can be the same scanner shown in FIGS. 4B4 through 4B12.

During system operation, each triple-disc holographic laser scanning subsystem 2200A through 2200D produces a 3-D omnidirectional scanning volume 2203 having four focal planes for omnidirectional scanning of bar codes on package transported therethrough. The omnidirectional laser scanning pattern projected from each scanning disc, within a particular focal plane of the scanning volume, is schematically depicted in FIG. 4A8A and 4A10. During system operation, each triple-disc holographic laser scanning subsystem 2200E through 2200G produces a 3-D scanning volume having three spatially-separated focal zones, as shown in FIGS. 4B7 through 4B9, for providing orthogonal (both horizontal and vertical) laser scanning patterns over regions indicated by solid lines (i.e. H&V) and only horizontal laser scanning patterns over the regions indicated by dotted lines (HSR).

Package-In-The-Tunnel Indication Subsystem of the Second Illustrative Embodiment of the Present Invention The package-in-the-tunnel indication subsystem 2300 depicted in FIGS. 33 and 34 are realized as a pair of IR-based package detectors 2301A and 2301B which are mounted on the edges of the first and second conveyor lanes (CL1 and CL2) 2102A and 2102B of the conveyor belt, respectively. Each IR-based package detector 2301A and 2301B comprises an infared (IR) transmitter 2302 in synchronous operation with an IR receiver 2303, as taught in U.S. Letters Pat. No. 5,789,730 to Rockstein, et al., incorporated herein by reference. The function of each synchronous IR transmitter and receiver 2302 and 2303 is to automatically detect the presence of a package (i.e. object) moving into the scanning tunnel along the conveyor belt lane assigned thereto. Notably, in the illustrative embodiment, where there are dual package conveyor lanes, the IR range of each IR-based package detector is adjusted so that it extends only half the width of the conveyor belt. In alternative single-lane systems, only a single IR-based package detector is required to construct the package-in-the-tunnel indication subsystem 2300, and in such embodiments, the range of the IR-based package detector will extend across the entire length of the conveyor belt.

Package-Out-The-Tunnel Indication Subsystem of the Second Illustrative Embodiment of the Present Invention The package-out-of-the-tunnel indication subsystem 2400 depicted in FIGS. 33 and 34 are also realized as a pair of IR-based package detectors 2401A and 2401B which are mounted on the edges of the first and second conveyor lanes (CL1 and CL2) 2102A and 2102B of the conveyor belt, respectively. Each IR-based package detector 2401A and 2401B comprises an infrared (IR) transmitter 2402 in synchronous operation with an IR receiver 2403, as taught in U.S. Pat. No. 5,789,730, supra, incorporated herein by reference. The function of each synchronous IR transmitter and receiver 2402 and 2403 is to automatically detect the presence of a package (i.e. object) moving out of the scanning tunnel along the conveyor belt lane assigned thereto. Notably, in the illustrative embodiment, where there are dual package conveyor lanes, the IR range of each IR-based package detector 2401A and 2401B is adjusted so that it extends only half the width of the conveyor belt. In alternative single-lane systems, only a single IR-based package detector is required to construct the package-out-of-the-tunnel indication subsystem 2400, and in such embodiments, the range of the IR-based package detector will extend across the entire length of the conveyor belt.

Package/Belt Velocity Measurement Subsystem of the Second Illustrative Embodiment of the Present Invention As illustrated in FIG. 33, the package/belt velocity measurement subsystem 2600 of the illustrative embodiment is realized engaging a roller wheel 2601 (with a one linear foot circumference) against the undersurface of the conveyor belt 2101 and connecting a Model RG/RJ Optical Shaft Incremental encoder 2602 from PhotoCraft, Inc. of Elburn, Ill., to the axle of the roller wheel 2601. The function of the shaft encoder 2602 is to automatically generate a predetermined number of electrical pulses for each revolution of the roller wheel 2601 in order to indicate that the belt 2101 has undergone one linear foot of travel. These electrical pulses are provided to the high-speed input port of a programmed microprocessor 2603 which count the electrical pulses and generate a digital data element representative of the physical displacement of the conveyor belt, z=A. By timing the displacement of each linear foot of conveyor belt travel, the programmed microprocessor 2603 can calculate the instantaneous velocity of the conveyor belt and produce a digital data element representative thereof for use by the data element queuing, handling and processing subsystem 2800. In the illustrative embodiment, the programmed microprocessor 2603 also carries out the computational process depicted in the flow chart set forth in FIGS. 40A through 40C in order to compute the instantaneous velocity of the conveyor belt of the system of the second illustrative embodiment of the present invention.

Weighing-In-Motion Subsystem of the Second Illustrative Embodiment of the Present Invention As shown in the FIG. 33, the in-motion package weighing subsystem 2500 is preferably arranged about the package in-the-tunnel detection subsystem 2400. As shown, the in-motion weighing subsystem 2500 comprises: a pair of scale platforms 2501A and 2501B mounted along conveyor lanes CL1 and CL2, respectively, and each producing analog or digital weight signals indicative of the weight of a package(s) 2205 moving across the scale platforms 2501A and 2501B; a filtering circuit 2502 for filtering the analog or digital weight signals in order to remove noise components and artifacts therefrom; and a signal processor 2503 for processing the filtered weight signals in order to produce a digital data element representative of the measured weight of the package, for provision to the data element queuing, handling and processing subsystem 2800, via the I/O subsystem 2700. Notably, the in-motion weighing subsystem 2700 of the illustrative embodiment can be realized using the EXPRESSWEIGHT™ Model 9480 In-Motion Variable Box and Package Weighing System from Mettler-Toledo, Inc. of Worthington, Ohio.

Input and Output Subsystem of the Second Illustrative Embodiment of the Present Invention In the second illustrative embodiment shown in FIG. 33, the function of the input/output (I/O) subsystem 2700 is to manage the data inputs to and the data outputs from the data management computer system 2800. In the illustrative embodiment, I/O subsystem 2700 can be realized using one or more rack-mounted I/O adapter boxes, such as the RocketPort Series RM 16-RJ45 multiport serial controller having sixteen I/O ports, sold by the Comtrol Corporation, of Saint Paul, Minn.

Data Element Queuing, Handling and Processing Subsystem of the Second Illustrative Embodiment of the Present Invention As illustrated in FIG. 34, data management computer 2800 is used to carry out the data element queuing, handling and processing subsystem 2900 in the second illustrative embodiment of the system of the invention. In FIG. 41, the structure and function of data element queuing, handling and processing subsystem 2900 is shown in greater detail.

As shown in FIG. 41, all data elements entering subsystem 2900 are provided to an I/O module 2901 having a plurality of input ports, and an output port which is connected to a data element time-stamping unit 2902 that is controlled by a timing/control unit 2903. In the illustrative embodiment, there are four (4) general types of data elements that might be loaded into the system event queue 2904, realized as a FIFO data structure known in the computing arts: (1) scan beam data elements; (2) package (weight) data elements; (3) package-in-tunnel (PIT) data elements; (4) package out-of-tunnel (POOT) data elements.

As shown in FIG. 36, the data element queuing, handling and processing subsystem 2900 further comprises a number of other modules, namely: a moving package tracking queue 2905 realized as a FIFO data structure known in the computing art, for queuing package (weight) data elements, package-in-tunnel (PIT) data elements, and package out-of-tunnel (POOT) data elements; and a data element analyzer 2906 (e.g. programmed microprocessor and associated memory structures) for reading the different types of data elements from the output of the system event queue 2904 and analyzing and handling the same according to the Data Element Handling Rules set forth in FIGS. 37A and 37B.

As shown in FIG. 36, scan beam data elements generated from the holographic laser scanning subsystems 2200A and 2200B are processed using a number of data processing modules, namely: a data element combining module 2907 for combining (i) each scan beam data element generated from holographic laser scanning subsystems 2200A and 2200B and accessed from the system event queue 2904 with (ii) each and every package data element in the moving package tracking queue 2905 so as to produce a plurality of combined data element pairs; a package location region (geometrical) modeling module 2908 for generating a vector-based (geometrical) model for the package location region indicated by the package data element in each combined data element pair produced by the data element combining module 2907; a scan beam geometry modeling module 2909 for generating a geometrical model for the laser scanning beam indicated by the scan beam data element in each combined data element pair produced by the data element combining module 2909; a homogeneous transformation (HG) module 2910 for transforming (i.e. converting) the coordinates of each scanning beam geometry model referenced to the local frame of reference (symbolically embedded within the holographic laser scanning system) into scanning beam geometry model coordinates referenced to the global coordinate reference $R_{global}$ at the "scanning position" within the scanning tunnel; a scan beam and package location region intersection determination module 2911 for determining, for each combined data element pair produced from the data element combining module, whether the globally-referenced scan beam model produced by the HG transformation module 2910 intersects with the globally-referenced package location region model produced by the package location region modeling module 2908, and if so, then the data output subsystem 2912 produces, as output, package identification data and package weight data for use by auxiliary systems associated with the tunnel scanning system of the second illustrative embodiment of the present invention.

Having described the overall structure and function of the data element queuing, handling and processing subsystem 2910 it is appropriate at this juncture to now briefly describe the operation thereof with reference to FIG. 36.

Prior to loading into the system event queue 2904 each data element is time-stamped (i.e. $T_j$) by the time-stamping module 2902 driven by a master clock within timing/control unit 2903 referenced to the global reference frame $R_{global}$. All data elements in the system event queue 2904 are handled by a data element analyzer/handler 2906 whose operation is governed by the Data Element Handling Rules set forth in the table of FIGS. 37A and 37B. In general, the data element queuing, handling and processing subsystem 2900 is best realized by an computing platform having a multi-tasking operating system (e.g. UNIX) capable of handling multiple "threads" at the same time.

Each package moving through the scanning tunnel shown in FIG. 33 will be represented by a data element (i.e. an object in an object-oriented programming environment e.g. Java programming environment) stored in the moving package tracking queue 2905. Package data elements are placed in the moving package tracking queue 2905 and matched with each scan beam data element accessed from the system event queue 2904 using the data element combining module 2906. Scan beam data elements generated from holographic-based scanning units 2200A and 2200B are processed along the scan data processing channel illustrated by blocks 2908, 2909, 2910 and 2911 set forth in FIG. 36.

The Package Location Region Modeling Subsystem of the Present Invention

As shown in FIG. 38, for each package scanned within the tunnel scanning subsystem, a vector-based model of the package location region is created by the package location region modeling subsystem (i.e. module) 2920 deployed with the data element queuing, handling and processing subsystem 2900 of FIG. 36. Notably, in the illustrative embodiment of FIG. 33, the "package location region" at the point of scanning within the tunnel is the subject matter of the modeling subsystem 2908, rather than the geometry of the package itself as was the case in the system of the first illustrative embodiment shown in FIGS. 1 through 32B. This is because the dimensions of the package are not determined in this illustrative embodiment, as they were in the first illustrative embodiment of the system of the present invention shown in FIG. 33. In the second illustrative embodiment, each package location region 2920 is mathematically represented (i.e. modeled) using a set of vectors (referenced to x=0, y=0, z=0) in the global reference frame $R_{global}$. The flow chart of FIGS. 39A and 39B describes a preferred modeling procedure for creating a vector-based model of the package location region at the point of package scanning within the tunnel scanning subsystem of FIG. 33.

As indicated at Block A in FIG. 39A, the first step in the modeling procedure involves determining whether the detected package is located in the first conveyor lane (CL1) or the second conveyor lane (CL2). As indicated at Block B in FIG. 39A, the second step uses (i) the time stamp $(T_j)$ placed on the package data element associated with the detected package, and (ii) the time stamp (Tj+k) placed on the scan beam data element matched to the package data element by the data element combining module 2907.

As indicated at Block B in FIG. 39A, the above-identified time stamps (Tj) and (Tj+k) are used to compute the distance "d" traveled by the package using the following formula: d=ΔT V, where ΔT=(Tj+k)−(Tj), and v=package velocity determined by the package/belt velocity measurement subsystem 2600. As indicated at Block C in FIG. 39A, if the detected package resides in the first conveyor lane (CL1), then the subsystem assigns thereto a "package location region" model specified by the vector model: 0≦x≦W/2; 0≦y; d−Δd≦z≦d+Δd in the global reference system, wherein Δd is the prespecified focal zone depth associated with the laser scanning beam scanning the package at its scanning position at time (Tj+k).

As indicated at Block D if the detected package resides in the second conveyor lane (CL2), then the subsystem assigns thereto a package location region model specified by the vector model: W/2≦x≦W; 0≦y; d−Δd≦z≦d+Δd in the global reference system, wherein Δd is the prespecified focal zone depth associated with the laser beam scanning the package at its scanning position at time (Tj+k).

The Scan Beam Geometry Modeling Subsystem of the Second Illustrative Embodiment of the Present Invention In the tunnel scanning system of FIG. 33, the scan beam geometry modeling subsystem (i.e. module) depicted in FIGS. 25A through 26 is employed in the subsystem 2909 shown in FIG. 36. Thus, the function of the scan beam geometry modeling subsystem (i.e. module) 2909 of FIG. 36 is to create a vector-based model for the propagation of the laser scanning beam (ray) (i) emanating from a particular point on the facet, (ii) to its point of reflection on the corresponding beam folding mirror, and (iii) towards to the focal plane determined by the focal length of the facet. This modeling method is similar to the method illustrated in FIGS. 25B1 through 26 and described hereinabove, and therefore will not be repeated to avoid obfuscation of the present invention.

The Homogeneous (HG) Transformation Module of the Present Invention

FIG. 40 schematically describes how the homogeneous (HG) transformation module 2910 of FIG. 36 uses homogeneous transformations to convert a vector-based "scanning beam" model referenced to a local scanner coordinate reference frame $R_{localscanner j}$ into a corresponding vector-based "scanning beam" model referenced to the global scanner coordinate reference frame $R_{global}$ symbolically embedded within the system of FIG. 33. This mathematical technique is essential in that it converts locally-referenced coordinates used to represent the laser beam (which scanned a bar code symbol) into globally-referenced coordinates used to represent the same laser scanning beam. Notably, this method of coordinate conversion involves computing the package travel distance (z=d) between (i) the package detection position at which time stamp (Tj) is applied to the PIT data element, and (ii) the package scanning position at which time stamp (Tj+k) is applied to the scan beam data element. In the illustrative embodiment, this computation involves using (i) the package or conveyor belt velocity (v), and (ii) the difference in time (i.e. ΔT=(Tj+k)−(Tj)) indicated by the time stamps (Tj+k) and (Tj) placed on the scan beam data element and package data element, respectively, matched thereto during each scan beam/package location region intersection determination carried out within module 2911. Notably, this package displacement distance z=d, defined between the package detection and scanning positions, is given by the mathematical expression d=v ΔT.

The Scan Beam and Package-Scanning Region Intersection Determination Subsystem of the Second Illustrative Embodiment of the Present Invention for Use with Scan Beam Data Elements Produced by Holographic Scanning Subsystems The procedure carried out within the scan beam and package location region intersection determination module 2911 of FIG. 36 is shown in FIG. 41. In general, the function of this computational module is to determine whether (i) the scan beam (rays) associated with a particular scan beam data element produced by a holographic scanning subsystem intersects with (ii) the package location region that has been modeled at a particular scanning position (i.e. specified by laser beam position information associated with the corresponding scan beam data element). If so, the module 2910 correlates the particular scan beam data element (i.e. package identification data element) with the package measurement data element corresponding to the modeled package location position.

As indicated at Block A in FIG. 41, the first step of the procedure involves using the minimum and maximum scan rays models of the laser scan beam (i.e. specified by the minimum and maximum facet scan angles) to determine the zone of coordinates about and within the focal planes of such scan rays models, expressed as: $x_{min}\pm\Delta x; y_{min}\pm\Delta y; z_{min}\pm\Delta z$; and $x_{max}\pm\Delta x; y_{max}\pm\Delta y; z_{max}\pm\Delta z$ As indicated at Block B in FIG. 41 the next step of the method involves determining whether or not the zone of coordinates about and within the focal planes of the minimum and maximum scan rays fall within the spatial boundaries of the computed package location region within either the first or second conveyor lane of the system. If the scan rays fall within the zone of coordinates specified at Block A, then, at Block C in FIG. 41, the method involves outputting a data element in the output queue comprising the package identification data (and weight measurement data if taken) for use by other auxiliary subsystems operably connected to the system. In general, such data elements can be displayed graphically, printed out as a list, provided to sorting subsystems, shipping pricing subsystems, routing subsystems and the like. If the scan rays do not fall within the zone of coordinates specified at Block A then, the method involves not outputting any data element in the output queue.

Automated Tunnel-Type Laser Scanning Package Identification and Weighing System Constructed According to a Third Illustrated Embodiment of the Present Invention;

Referring now to FIGS. 42 through 54B the automated laser scanning package identification and measurement system of the third illustrated embodiment 3000 will now be described in detail. In contrast with the capabilities of the systems of the first and second illustrative embodiments detailed above, the system of the third embodiment is capable of detecting, measuring, identifying and tracking multiple packages along the conveyor belt, regardless of their orientation or arrangement (e.g. stacked side-by-side and/or overlapping arrangements). As such, this novel system design, by incorporating many of the functionalities of the systems of the first and second illustrative embodiments, while providing several additional functionalities, enables simultaneous measurement and identification of non-singulated packages during transport along a high-speed conveyor subsystem so that auxiliary subsystems, operably connected to the tunnel-based system, can determine its safety and suitability for transport to its place of destination, and/or along its planned shipment route, with no human intervention.

Overview of the Tunnel Scanning System of the Third Illustrative Embodiment of the Present Invention As shown in FIGS. 42 and 43, the automated simultaneous package detecting, dimensioning and identifying system of the third illustrative embodiment is indicated by reference numeral 3000 and comprises an integration of subsystems, namely: a high-speed package conveyor system 3100 having a conveyor belt 3101 having a width of at least 30 inches to support one or more package transport lanes along the conveyor belt; a tunnel or similar arrangement of bar code symbol readers 3200 including, in the illustrative embodiment, holographic and non-holographic (e.g. polygonal) laser scanning bar code symbol reading subsystems 3201A through 3201R supported overhead, alongside, and below the conveyor belt 3101 by a support frame 3202, for generating a 3-D "six-axis" type omnidirectional scanning volume 3203 thereabove, as depicted in FIGS. 5A through 9B, for scanning bar codes 3205 on packages 3204 transported therethrough; a first simultaneous multiple-package detection and dimensioning subsystem 3300 arranged on the input side of the tunnel scanning subsystem 3200; a second simultaneous multiple-package detection and dimensioning subsystem 3500 arranged on the output side of the tunnel scanning subsystem 3200, and including, in the illustrative embodiment, (i) a LADAR-based imaging and dimensioning subsystem 3301B for scanning packages and generating information representative of package dimensions (e.g. surface area, height and vertices) and optionally bar code symbols on the scanned surfaces thereof, (ii) a laser-based package-in-the tunnel (PIT) detection subsystem 3350 for simultaneouly detecting multiple packages entering the scanning tunnel, generating a data element (i.e. data object) indicative of each such detected package and linking associated dimensional data (generated by subsystem 3500) thereto, and linking the PIT data element and associated dimensional data element thereto, with a time stamp Ti generated at the time the package was detected by the PIT detection subsystem 3350a weighing-in-motion subsystem 3700, installed beneath the first simultaneous multiple-package detection and dimensioning subsystem 3500, along the conveyor belt structure, for weighing packages as they are transported therealong; a package/belt velocity measurement subsystem 3800 realized using a roller wheel 3801 engaged against the undersurface of the conveyor belt 3101, an optical shaft incremental encoder 3802 connected to the axle of the roller wheel 3801 and producing an electrical pulse output stream per revolution of the roller wheel, and a programmed microprocessor 3803 for processing the output pulse stream and producing digital data representative of the velocity of the conveyor belt (and thus package transported thereby) at any instant in time; an input/output subsystem 3900 for managing the data inputs to and data outputs from the system of FIG. 33; and a data management computer 3925, with a graphical user interface (GUI) 3926, for realizing a data element queuing, handling and processing subsystem 3950 as shown in FIGS. 44 and 44A, as well as other data and system management functions.

The High-Speed Conveyor Belt Subsystem of the Third Illustrative Embodiment

As shown in FIG. 42, the high-speed conveyor belt subsystem 3100 of the third illustrative embodiment comprises: a plurality of rollers 3102 spaced apart and supported by support frame structure (not shown in FIG. 33); a belt structure 3101, extending between and supported by a belt support structure 3103, and having a width of at least 30 inches to provide one or more package transport lanes along the conveyor belt subsystem; a drive motor 3104 for imparting torque to the rollers; and a belt velocity controller 3105 for controlling the velocity of the belt and thus packages during system operation.

First Simultaneous Multiple-Package Detection and Dimensioning Subsystem of the Third Illustrative Embodiment of the Present Invention As shown in FIG. 44, the first simultaneous multiple-package detection and dimensioning subsystem 3300 of the illustrative embodiment is arranged on the input side of the tunnel scanning subsystem 3200, and comprises: a LADAR-based imaging and dimensioning unit 3301, mounted above the conveyor belt as shown in FIG. 44, and adapted for scanning the upwardly-facing surfaces of packages moving along the conveyor belt using an amplitude modulated (AM) laser beam, and generating package dimension (PD) data element representative of dimensions (e.g. surface area, height and vertices) of the scanned package, and optionally bar code symbols on the scanned surfaces thereof; a laser-based package-in-the tunnel (PIT) detection subsystem 3350 for simultaneously detecting multiple packages entering the scanning tunnel, and generating a data element (i.e. data object) indicative of each such detected package; a timing-stamping unit 3304, controlled by the master clock 3400 in FIG. 43, for generating time stamps $T_i$ to be attached to PD data elements and PIT data elements; a plurality of moving package tracking queues (FIFOs) 3305A through 3305D, each corresponding to different spatial regions above the conveyor belt and adapted for buffering "data objects" representative of detected packages and their various attributes, in an object-oriented programming environment (e.g. a Java programming environment); a data element controller (e.g. realized by a programmed microprocessor) 3306 for receiving PIT and PD data elements from subsystem 3301 or subsystem 3200 respectively, time-stamping PD data elements at the instant when the corresponding package is detected by the PIT detection subsystem 3350 writing the same to the input port of one of the moving package tracking queues 3305A through 3305D, and removing one or more data objects (representative of detected/tracked packages) from the output ports of one or more moving package tracking queues 3305A through 3305D and writing the same to the input port of the I/O unit 3951A shown in FIG. 46. Collectively, subcomponents 3302 through 3306 form the height profile data processor 3307 of the first simultaneous multiple-package detection and dimensioning subsystem 3300.

As shown in FIG. 44A, the LADAR-based imaging and dimensioning subsystem 3301 comprises: at least one visible laser diode VLD 3340 for producing a low power visible laser beam 3341; an amplitude modulation (AM) circuit 3342 for modulating the amplitude of the visible laser beam produced from the VLD at a frequency $f_0$ (e.g. 75 Mhz) with up to 7.5 milliwatts of optical power; an opto-mechanical (e.g. polygonal-reflective or holographic-diffractive) scanning mechanism, an electro-optical scanning mechanism or an acousto-optical scanning mechanism 3343 for sweeping the modulated laser beam across a conveyor belt or like transport structure; a start-of-scan (SOS) pulse generating circuit 3352 including photodetector 3353 disposed inside the system housing, at the corner of the window, automatically generates a "start-of-scan" pulse each time the laser beam passes past this photodetector 3352; an optical detector (e.g. an avalanche-type photodetector) 3344, a part of a larger photodetection module 3344A, for converting received optical signal 3341' into an electrical signal 3341"; an amplifier and filter circuit 3345 for isolating the $f_0$ signal component and amplifying it; a limiting amplifier 3345A for maintaining a stable signal level; a phase detector 3346 for mixing the reference signal component $f_0$ from the AM circuit 3342 and the received signal component $f_0$ reflected from the packages and producing a resulting signal which is equal to a DC voltage proportional to the Cosine of the phase difference between the reference and the reflected $f_0$ signals; an amplifier circuit 3346A for amplifying the phase difference signal; a received signal strength indicator (RSSI) 3354 for producing a voltage proportional to a LOG of the signal reflected from the package (i.e. target) which can be used to provide additional information; a reflectance level threshold analog multiplexer 3355 for rejecting information from the weak signals; a 12 bit A/D converter 3348 for converting the DC voltage signal from the RSSI circuit 3354 into a linear array of M raw range data elements $\{R_{n,i}\}$, taken along m=M (e.g. M=256) equally spaced sampling positions (i.e. locations) along the width of the conveyor belt, where each range data element $R_{n,i}$ provides a measure of the distance from the VLD 3340 to a point on the surface of the scanned package moving therealong; a high performance range/image data microcomputer 3356 with program memory, and data storage memory for buffering arrays of range data, and derivatives thereof, during the 2-D image data processing methods of the present invention; an A/D conversion circuit 3357 for converting analog scan data signals into lines of digital scan data samples; scan line data buffer array 3358 for buffering lines of digital scan data samples; and a programmed 2-D image data processor/decoder (e.g. microcomputer) 3359 for decode processing the bar code symbol represented in the structure of digital image in the scan line data buffer array, and producing symbol character data representative of the bar code symbol.

As shown in FIG. 44B, the LADAR-based imaging and dimensioning subsystem of the first illustrative embodiment 3301A comprises: an optical bench 3360 for supporting optical and electro-optical components of the subsystem; a system housing 3361 having a light transmission aperture 3361A for enclosing the optical bench and components mounted thereon in a shock-resistant manner; an eight-sided polygonal scanning element 3343B, rotatably supported on the shaft of an electrical motor 3343C mounted on the optical bench 3360, as shown, for scanning the amplitude modulated laser beam 3341 produced by the VLD 3340, along a single scanning plane projected through the light transmission aperture 3361 formed in the subsystem housing; a light collecting mirror 3362 mounted on the optical bench for collecting reflected laser light off a scanned object (e.g. package) 3364 and focusing the same to a focal point 3365A on the surface of a stationary planar mirror 3365 mounted on the optical bench; a small beam directing mirror 3366 mounted on the center of the light collecting mirror 3362 for directing the laser beam from the VLD 3340 to the rotating polygonal scanning element 3343B and out the light transmission aperture 3361A towards the package. The ambient light is filtered by a "front window" over the light transmission aperture 3361A. The avalanche-type photodetector (APD) 3344 detects reflected laser light returning onto the surface of the rotating polygon 3343B collected by the light collecting mirror 3362 and focused onto the stationary planar mirror 3365 The APD 3344, with APD module 3344A, converts light into electrical current signal having a frequency of 75 MHz signal and a phase delayed in relation to the reference signal. LOG amplifier 3345 amplifies the signal significantly and at the same time keep it within certain amplitude range. The limiting amplifiers 3345 and 3346A ensure that a signal of the same amplitude is produced at the output of each stage regardless of how weak or how strong the reflected light signal is upon striking the APD 3344. This automatic control feature allows the LADAR-based system to "scan" surfaces of different light reflectance at different distances. Also, the LOG amplifier 3345 enables the subsystem to measure an absolute value of the amplitude of the received laser signal. This gives information about any pattern of different reflectance on the "target" (the labels, large letters, pictures, etc.). In addition, the LOG amplifier 3345 enables setting a "threshold" for a signal level so that very weak or very strong reflections are attenuated.

All incoming laser return signals are processed in a synchronized manner using the SOS pulse produced by SOS pulse generating circuit 3353 and associated photodetector 3353A so as to produce lines of digital range data representative of the distance from the polygonal scanning element to sampled points along the scanned object 3364. As will be described in greater detail hereinafter, the programmed 2-D digital image data processing computer 3356, realizable as a serial or parallel computing machine, preprocesses each row of raw range data collected during each scan of the amplitude-modulated laser beam, removes background information components, stores the object related data in an image buffer within image processing computer 3356, and extracts therefrom information regarding the dimensions (e.g. area, height and vertices) of the object (e.g. package), after performing the necessary geometrical transformations. In connection therewith, it is noted at this juncture that while the collection and processing of raw "range" data is carried out with respect to the polar coordinate reference system $R_{LADAR}$, symbolically embedded within the LADAR-based imaging and profiling subsystem, geometric transformations, schematically depicted in FIG. 44D, are used to translate (i.e. convert) such information to the global coordinate reference system $R_{global}$ symbolically embedded within the package identification and measuring system, as illustrated in FIG. 42.

Simultaneously, the analog electrical signal input to the logarithmic amplifier 3345 is also processed along a separate data processing channel, as shown in FIG. 44A, in order to recover amplitude modulation information from received lines of scan image data, for subsequent buffering in the 2-D image array 3358 and decoded-processing by 2-D image data processor/decoder 3359. The output from the 2-D image data processor/decoder 3359 is symbol character data representative of the bar code symbol embodied within the structure of the received scan data image.

The signal and data processing circuitry employed in the subsystem 3301 can be realized on one or more PC boards 3368. Various types of I/O interfaces 3369 can be used to interface the subsystem 3301 to I/O subsystem 3900, as well as other devices with which it may be used in any particular application under consideration.

As shown in FIGS. 44E1 and E2, the LADAR-based imaging and dimensioning subsystem of the second illustrative embodiment 3301B is realized as a holographic-type laser scanning system, as taught generally in Applicants' copending application Ser. No. 08/949,915 filed Oct. 14, 1997; Ser. No. 08/854,832 filed May 12, 1997; Ser. No. 08/886,806 filed Apr. 22, 1997; Ser. No. 08/726,522 filed Oct. 7, 1996; and Ser. No. 08/573,949 filed Dec. 18, 1995, each incorporated herein by reference. As shown in FIGS. 44E1 and E2, the VLD 3340 can be realized as a laser beam production module having a multi-function-HOE (i.e. plate) embedded therewithin as taught in Applicants' copending application Ser. No. 08/949,915 filed Oct. 14, 1997; Ser. No. 08/854,832 filed May 12, 1997; Ser. No. 08/886,806 filed Apr. 22, 1997; Ser. No. 08/726,522 filed Oct. 7, 1996; and 08/573,949 filed Dec. 18, 1995, supra. The function of this laser beam production module is to produce a focused amplitude-modulated (AM) laser beam. As shown in FIGS. 44E1 and E2, the laser beam scanning mechanism 3341 of FIG. 3341 is realized as a holographic laser scanning disc 3370 rotatably mounted on the shaft of an electric motor 3371 mounted on the optical bench 3372 within the subsystem housing 3373. As shown in FIG. 44E3, the holographic scanning disc of the first illustrative embodiment has eighteen facets with six different focal distances, namely: 36", 41", 46", 52", 58" and 64". These facets generate laser beams that focus with six different focal planes, where each focal plane is repeated three times per revolution of the scanning disc. The design parameters for each facet on the holographic scanning disc of FIG. 44E3 are set forth in the Table of FIG. 44E4. The design parameters set forth in the table of FIG. 44E3 are defined in detail in the above-referenced U.S. patent applications. During operation, the resulting scanning pattern generated by this subsystem has the form of a single straight plane or line (hereinafter referred to as a "linear-type" laser scanning pattern) having six focal regions which, as shown in FIG. 44E5, may spatially overlap. In the first illustrative embodiment, the length of each scan line at each of the six focal planes is 22.35". Notably, all scan lines leave (i.e. diffract from) the scanning disc at the same elevation angle.

As shown in FIGS. 44E1 and 44E2, a post-disk beam folding mirror 3374 is mounted above the scanning disc 3370, at a tilt angle which causes the reflected laser beam to travel above scanning disk, parallel to the disk surface, and exit through the light transmission window 3373A at the opposite end of the subsystem scanner housing. This arrangement allows for a more compact scanner design and increases the optical path length inside the scanner box. In turn, this reduces the optical throw of the scanner (i.e. the minimum distance from the scanner window at which the scanner can read). By selecting the proper angle of diffraction off the scanning disc, it is possible, with this holographic laser scanner design, to minimize, and virtually eliminate, scan line bow so that the scan lines are all essentially straight lines. This has a number of important advantages in a variety of bar code scanning applications (e.g. when reading high density bar codes with high aspect ratios, when reading bar codes with relatively larger errors in orientation, and when reading bar code symbols at greater label velocities).

Alternatively, a second beam folding mirror (not shown) can be mounted within the scanner housing, just prior to the scanner window 3373A, in order to direct the AM laser beam out a new window formed on the top surface of the scanner, rather than on the side surface thereof, as shown in FIG. 44E2. This modification to the scanner design would allow the AM laser beam to exit the scanner housing perpendicular to the scanning disk, rather than parallel thereto. This modification would minimize the distance that the scanner extends out into the area next to a conveyor system, or it could reduce the required overhead space in an overhead scanning application. Other beam folding options are also envisioned.

As shown in FIG. 44E2, the LADAR-based subsystem 3301B also includes a parabolic light collecting mirror 3375 mounted beneath the scanning disc, upon the optical bench 3372. The function of the light collection mirror 3375 is to (1) collect laser light that reflects off the scanned package 3364 and transmitted back through the scanning facet that generated the respective laser beam, and (2) focus the same to a focal point 3376 on a photodetector 3344 mounted on bracket 3377, above the scanning disc and light collection mirror 3375 as shown in FIG. 44E2. Preferrably, bracket 3377 can be used to support post disc beam folding mirror 3374, as well. Also, photodetector 3344 can be realized as an avalanche-type photodetector as described above and shown in greater detail in FIG. 44C. The function of photodetector 3344 is to detect collected laser (return) light focused to focal point 3376, and produce an electrical signal corresponding thereto. The signal and data processing shown in FIG. 44A can be realized on one or more PC boards 3378 and can be provided with the necessary I/O interfaces required in any particular application.

The holographic LADAR-based subsystem 3301B operates in a manner similar to subsystem 3301A, described above, For each sweep of the AM laser beam, raw digital range data is generated and processed to produce package dimension type data described above. Also, the programmed digital image data processor 3359, or an analog equivalent of the general type described hereinabove in connection with the other system embodiments hereof, the analog signal from photodetector 3344 to produce symbol character data representative of bar code symbols on the scanned packages.

Notably, the holographic LADAR-based imaging and dimensioning systems 3301B described above, without modification, can also function as compact single-line, laser scanner having very large depth of field, reduced optical throw, and laser scan lines with minimum curvature (i.e. minimum bow). The single line scanner uses a holographic disk to create a sequence of scan lines that all leave the disk at the same diffraction angle but have different focal lengths. In the first embodiment of this scanner described above, the resulting linear scan pattern has six focal planes, providing a very large depth of field for high density bar codes. As mentioned above, six different holographic facets for the six focal planes are spatially repeated three times around the disk for a total of eighteen facets on the scanning disk. This replication of the basic scan pattern results in a high speed scanner.

In a second embodiment of this holographic laser scanner, the scanning disc could be provided with four different holographic facets, spatially repeated around the disc five times for a total of twenty facets on the scanning disc. This would result in a linear scanning pattern having four focal planes, providing greater scan speed for lower density bar code symbols. In some alternative embodiments, it may be desirable to provide some rastering of the linear scan pattern.

The LADAR-based imaging and dimensioning devices 3501A and 3501B described above have numerous applications outside of automatic package identifications and measurement, described hereinabove. In general, each of these ultra-compact devices of the present invention has the following capacities: measuring box size and shape to a tolerance of +/− 2 to 3 mm, at 800 scans per second; locate positions of labels on transported boxes; operating from the top of a conveyor belt avoiding the need to make a break therein; identify material present or not present in tilt trays, slots, etc.; confirming the shapes and sizes of objects in tunnel applications (e.g. also solves supermarket check out problem); counting people, animals, and other moving items moving through a portal; measuring shape and size of items; as well as measuring (or profiling) virtually anything in the three dimension space to a tolerance of about 2 mm or so, and generate an accurate coordinate map therefrom.

Two-Dimensional Range Data Processing Method of Present Invention

The function of the 2-D range data map processor 3356 depicted in FIG. 44A is to process rows of raw range data captured by the LADAR-based imaging and dimensioning subsystem so that package dimension (PD) data is extracted therefrom and data representative of the package dimension data is produced for use by other subsystems in the package identification and measuring system. In accordance with the principles of the present invention, this functionality is realized using a novel 2-D range data processing method. As shown in FIG. 44F, this method employs three stags of preprocessing operations on the captured rows of range data, indicated as (1) "Smoothing", (2) "Edge-detection", and (3) "Background Discrimination". Thereafter, the method employs one stage of "Data Extraction" operations for extracting package dimension data therefrom. As will be described in greater detail hereinafter, the data extraction stage employs (i) 2-D image contour tracing techniques to locate range data indices spatially corresponding to the corner points associated with the scanned object (e.g. package), and (ii) geometric transformations to compute the height, vertices and surface area of the scanned package.

As shown in FIG. 44G, the steps involved in carrying out the preprocessing stages of data processing are indicated as Steps A1 through A5, described in Blocks A through E in FIGS. 44H1 through 44H2, whereas the steps involved in carrying out the data extraction stage are indicated as Steps B1 through B14, described in Blocks F through S in FIGS. 44H2 through 44H5.

As indicated at Block A in FIG. 44H1, Step A1 involves capturing lines (rows) of digitized "range data" produced by the laser scanning/ranging unit, during each sweep of the amplitude modulated laser beam across the width of the conveyor belt. Each row of raw range data has a predetermined number of range value samples (e.g. M=256) taken during each scan across the conveyor belt. Each such range data sample represents the magnitiude of the position vector pointing to the corresponding sample point on the scanned package, referenced with respect to a polar-type coordinate system symbolically embedded within the LADAR-based imaging and dimensioning subsystem. As indicated at Block A, Step A1 also involves loading a predetermined number of rows of raw range data samples into a FIFO-type Preprocessing Data Buffer (e.g. M=9) for buffering 9 rows of range data at any instant of time.

FIG. 44I sets forth a graphical image of a 2-D range data map synthesized from a large number of rows of raw range data captured from the LADAR-based imaging and dimensioning subsystem of the present invention, in accordance with the data capturing operations specified in Step A1 of the flow chart set forth in FIGS. 44H1 through 44H5.

As schematically illustrated in block form in FIG. 44G, "CONTROL STRUCTURES" are required and used by the LADAR-based subsystem of the present invention. General control structures as "divide and conquer," backtracking, dynamic programming etc. support the implementation of the specific algorithms used in the LADAR-based subsystem hereof. These control structures consist of sequences or loops connecting abstract program modules. Window functions or operator kernels employed herein have to be embedded into a general control structure (pixel program loop), organizing the move of placed windows F(p) into all (non-border) point positions p of a given image according to a selected scan order, ensuring that the entire image domain is processed. Allowing small modifications, such a pixel program loop can be used for different local operators. For example, logically structured operators are characterized by data-dependent and/or location-dependent decisions. These decisions take place within the pixel program loop, and do not influence the general control structure of the program.

The use of predefined control structures allows often to describe the operators by giving only the operator kernel, which plays the role of a subroutine called at each pixel program loop. In general, the control structure of window operators allows the selection between different square windows of n×n pixel s (odd n), and between parallel or sequential processing. Special inputs made by the user at the beginning of the control structure, i.e. at program start, specify these selections.

With the input of a special parameter (PARSEQ=0 or =1) the user chooses parallel or sequential processing. If only parallel processing has to be implemented, then some program lines of the control structure can be eliminated. These rows have the label $\stackrel{\frown}{x}$ in the following control structures.

The structure requires the following data arrays:

Ind(1 . . . n): This array contains the indices of indirect row addressing. for example, the initial values are given by DATA ind (1, 2, 3, 4, 5), if n=5.

Xind(1 . . . a), and these values are used as arguments of the operator kernel (cp. FIG. 3.5). For example, if n=5 then the following arrays are used:

DATA xind(1, 1, 0, −1, −1 −1, 0, 1, 2, 2, 2, 1, 0, −1, −2, −2, −2, −2, −2, −1, 0, 1, 2, 2, 0);

DATA yind(0, 1, 1, 1, 0, −1, −1, −1, 0, 1, 2, 2, 2, 2, 2, 1, 0, −1, −2, −2, −2, −2, −2, −1, 0)

The control structure uses the following parameters and image files:

The window size n is assumed to be odd. The value k::=(n−1)/2 follows after initializing n. ⊕ The parameter PARSEQ is specified for selecting parallel (PARSEQ=0) or sequential (PARSEQ=1) processing. For label $\stackrel{\frown}{x}$, see above.

The original image f (or several input images in certain cases) and the resultant image h (in file OUT) have to be allocated as image files Processing follows the scheme as given in FIG. 44G1. Afterwards all open image files must be closed. Many of the operator kernels can be inserted at the location "processing of picture window . . . " of this control structure in FIG. 44G1. If so then this control structure is mentioned in the operator pseudo-program at the beginning of point (4). In this way repeated listings of identical control structures are avoided.

While the control structure includes row-wise buffering, operations which are necessary for opening or allocating an image file, acquiring an image (e.g. 2-D range map) via the LADAR-based scanning mechanism described above, are not contained in this control structure. Details on "general control structures" are provided in the textbook "HANDBOOK OF IMAGE PROCESSING OPERATORS" (1996) by R. Kletpe and P. Zamperoni, published by John Wiley and Sons, incorporated herein by reference.

As indicated at Block B in FIG. 44H1, Step A2 involves using, at each processing cycle and synchronized with the capture of each new row of raw range data, a 2-D (9×9) window function embedded into a general control structure (e.g. pixel program loop), to "smooth" each line (or row) of raw range data buffered in the M=9 FIFO Data Buffer using Dilution and Erosion (D/E) processes based on non-linear type min./max methods well known in the image processing art. The output from this non-linear operation is a single row of smooth range data of length M=256 which is input to a three row FIFO buffer, as shown in FIG. 44G. Details on the operation of the D/E algorithm are provided in the textbook "HANDBOOK OF IMAGE PROCESSING OPERATORS" (1996) by R. Kletpe and P. Zamperoni, published by John Wiley and Sons, supra.

FIG. 44I2 sets forth a graphical image of a 2-D range data map after being processed by the data processing operations specified in Step A2 of the flow chart set forth in FIGS. 44H1 through 44H5.

As indicated at Block C in FIG. 44H1, Step A3 involves using, at each processing cycle, a 2-D (3×3) convolution kernel based on the Sobel operato, and embedded into a general control structure (e.g. pixel program loop), to edge-detect each buffered row of smoothed range data of length M=256 which is input to a first one row (N=1) FIFO buffer as shown in FIG. 44G. The output row of "edge-detected" range data represents the first spatial derivative of the buffered rows of range data along the n direction of the N=9 FIFO (corresponding to the first spatial derivative of the range data captured along the y direction of the conveyor belt). Details on the operation of the D/E algorithm are provided in the textbook "HANDBOOK OF IMAGE PROCESSING OPERATORS" (1996) by R. Kletpe and P. Zamperoni, supra.

FIG. 44I3 sets forth a graphical image of a 2-D range data map after being processed by the data processing operations specified in Step A3 of the flow chart set forth in FIGS. 44H1 through 44H5;

As indicated at Block D in FIG. 44H2, Step A4 involves using, at each processing cycle, a 7-tap FIR-type digital filter (HI) to compute the first spatial derivative of the buffered row of edge-detected range data along the m direction of the N=9 FIFO (corresponding to the first spatial derivative of the range data captured along the x direction of the conveyor belt). The output of this operation is stored in a second one row (N=1) FIFO, as shown in FIG. 44G.

FIG. 44I4 sets forth a graphical image of a 2-D range data map synthesized from a large number of rows of background data removed from rows of raw range data by the data processing operations specified in Step A4 of the flow chart set forth in FIGS. 44H1 through 44H5;

As indicated at Block E in FIG. 44H2, Step A5 involves analyzing, at each processing cycle, the edge-detected derivative stored in the second one row FIFO in order to (1) find the maximum value thereof, and then (2) compare the maximum derivative value to a predetermined threshold value. If any of the maximum first derivative values is larger than the predetermined threshold value, then the unloaded row of smoothed range data (from output port of the three row FIFO) is labeled as containing object data, and is loaded into the input port of the FIFO-type Object-related Data Buffer (ODB), also referred to as the "f" Buffer, for future use. Otherwise, the unloaded row of smoothed range data from the three row FIFO is labeled as containing background data and is loaded into the input port of the FIFO-type Background Data Buffer (BDB), and possibly also the ODB, for future use. This concludes the preprocessing operations performed on the input stream of range data from the conveyor belt. The subsequent steps form part of the Dimension Extraction stage of the image data processing method of the present invention.

As indicated at Blocks F through H in FIGS. 44H2 and 44H3, Steps B1 through B3 involves processing rows of smoothed range data in order to derive a 2-D first spatial derivative of the range data map so that 2-D contour tracing can be reliably performed on this spatial derivative data, and the indices m and n associated with corner points of the scanned package found. These data processing operations are further described in the algorithm set forth in FIG. 44J.

As indicated at Block F in FIG. 44H2, Step B1 involves computing, at each processing cycle and for each column position in the rows of background data in the BDB (referenced by index m), the "median value" based on the current rows of background data buffered therein.

This computational operation is indicated in the first line of Block B in FIG. 44J.

As indicated at Block G in FIG. 44H2 Step B2 involves substracting, at each processing cycle and for each row of object-related data in the ODB, the precomputed median value (BG) from the corresponding range value (f=X), so as to produce a difference value (X-BG) for each of the 256 column positions in corresponding row of object-related data being buffered in the ODB (also indicated as the "f buffer"), thereby producing a vertical first discrete derivative thereof (having a column length M=256). This computational operation is indicated in the second line of Block B in FIG. 44J.

As indicated at Block H in FIG. 44H3, Step B3 involves smoothing, at each processing cycle, the computed vertical first discrete derivative. This can be achieved by convolving the same with a 5-tap FIR smoothing filter and truncating the resultant row of smoothed discrete derivative data to lengt M=256. Thereafter, the row of smoothed discrete derivative data is loaded into the "diff" (i.e. derivative) data buffer having m=256 columns and n=10,000 or more rows (as required by the collected range data map). The output row of discrete derivative data contains object-related data only, and most background noise will be eliminated. This computational operation is indicated at Block C in FIG. 44J. As shown therein, this operation is repeated for each row of smoothed range data until the condition set forth in Block D in FIG. 44J is satisfied. When this condition is satisfied, then the control structure underlying the data processing method hereof invokes the contour tracing algorithm set forth in FIG. 44K, and described in greater detail hereinbelow.

FIG. 44I5 is a graphical image of a differentiated 2-D range data map from which background data, indicated in FIG. 44I4, is substracted during being processed by the data processing operations specified in Steps B1, B2 and B3 of the flow chart set forth in FIGS. 44H1 through 44H5.

As indicated at Block I in FIG. 44H3, Step B4 involves performing, at each processing cycle, a 2-D image-based contour tracing operation on the discrete derivative data currently buffered in the diff data buffer in order to produce an array of m,n contour points in M-N Space (and corresponding to x,y contour points in X-Y Cartesian Space). The contour tracing algorithm set forth in FIG. 44K can be used to carry out this step of the data processing method hereof. The array of contour points m,n produced by the algorithm will correspond to the sides of the polygonal object embodied in the rows of object data currently buffered within the Object Data Buffer, and the output data set produced from this step of the method contains extraneous corner points which need to be removed from the produced array of contour points.

The program set forth in FIG. 44K traces contours of objects in a bilevel image. It stores the encoded contours (Freeman code) into a file. This program could also be extended to an image-to-image transformation, e.g. by computing geometrical features (convex hull, diameter etc.) for these contours and by visualizing these features. These possible extensions are not introduced here, because this would require the development of a composite program taking account of too many different geometrical features.

The program of FIG. 44K performs a complete object search in the input image (i.e. the diff. Of the 2-D range map). If there are several objects (i.e. 8-components), then the program finds all of them, and it computes the contour codes of all objects. The input image can also be a gray value image, as would the case in many package scanning environments. In this case, a global threshold discriminates between object points (gray value higher than the threshold) and background points (gray value lower or equal than the threshold.). The resultant file of encoded contours allows an error-free reconstruction of the bilevel input image.

The contour encoding algorithm is a fundamental procedure. It is often used in the context of shape analysis, of geometrical feature extraction of data-reducing image code generation, or of geometrical transformations of bilevel images. Contour codes have the advantage that geometrical features of the object can be computed by means of numerical manipulations of the contour code chain, sometimes just based on simple syntax rules. Algorithms on contour code chains are very time-efficient in general, and they do not need access to the image data. A contour code chain allows an exact reconstruction of the object.

The whole process of contour code determination consists of two phases: object finding, land contour tracing. The first phase searches the image line-by-line until a reliable initial point of the next object is found. The second phase traces the contour of this object, and stores the resultant code sequence into a file. Both phases alternate during the whole process until all objects are encoded.

Details on the operation of the contour tracing algorithm, set forth in FIG. 44K, provided in the textbook "HAND-BOOK OF IMAGE PROCESSING OPERATORS" (1996) by R. Kletpe and P. Zamperoni, published by John Wiley and Sons, incorporated herein by reference.

As indicated at Blocks J through M in FIGS. 44H3 through 44H4, Steps B5 through B8 involves processing the m and n indices associated with the traced contours generated in Step B4, so as to find the m and n indices of those corner points which qualify as "break points" and thus possibly corresponding to the corners of the scanned package.

As indicated at Block J in FIG. 44H3, Step B5 involves storing, at each processing cycle, the m,n indices (associated with the corner points of the traced contours) in the x-boundary and y-boundary buffers, respectively. Notably, the length of the X-boundary buffer is M=256, and the length of the y-boundary buffer is also M=256. This computational operation is indicated at Block A in FIG. 44L.

As indicated at Block K in FIG. 44H3, Step B6 involves detecting, at each processing cycle, the m indices associated with "corner points" in the traced contours. This step can be achieved by convolving the current discrete data set stored in the x-boundary buffer (of length M=256) with the 11-tap FIR filter (i.e. low-pass 1st differentiator) and storing the resultant discrete m indice data set in the x-temp-array. This computational operation is indicated at Block B in FIG. 44L.

FIG. 44L is a flow chart describing the operations carried out during Step B6 and B7 of the flow chart set forth in FIGS. 44H1 through 44H5.

As indicated at Block L in FIG. 44H4, Step B7 involves detecting, at each processing cycle, the n indices associated with the "corner points" in the traced contours. This step can be achieved by convolving the discrete data set stored in the y-boundary buffer (of length N) with the an 11-tap FIR digital filter (i.e. low-pass 1st differentiator) and then storing the resultant discrete n indice data set in the y-temp-array. This computational operation is indicated at Block B in FIG. 44M.

FIG. 44M is a flow chart describing the operations carried out during Steps B6 and B7 of the flow chart set forth in FIGS. 44H1 through 44H5.

As indicated at Block M in FIG. 44H4, Step B8 involves finding, at each processing cycle, the "break points" among the detected corner indices stored in the x-temp-array and y-temp-arrays, and buffering the m and n indices associated with these break points in the breaks buffer. In essence, the algorithm set forth in FIG. 44M first determines which m indices in the x_temp_array undergoes a "first derivative" zero-crossing, and then determines which n indices in the y_temp_array undergoes a "first derivative" zero-crossing. Any point along the traced contour having an m or n index (i.e. coordinate) with a zero value, indicating a range peak at the corresponding indices, is deemed to be a "break" point along the traced contour. A break point can be thought of as a location where the traced contour experiences a spatial discontinuity, corresponding to a possible corner point associated with the scanned package.

As indicated at Block N in FIG. 44H4, Step B9 involves performing, at each processing cycle, linear curve fitting between every two consecutive break points stored in the breaks buffer, in order to produce a single line representation thereof. Each line constitutes a side of a polygon representation of the object embodied within the structure of the range data map buffered in the ODB (i.e. "f data buffer"). For every two consecutive sides of the polygon representation, the intersection point is determined, and deemed a corner vertex of the polygon.

FIGS. 44O1 through 44O4 set forth polygonal contours of the type traced during Step B9, having corner points which are reduced using the algorithm set forth in FIG. 44N.

As indicated at Block O in FIG. 44H4, Step B10 involves at each processing cycle, reducing the corner vertices once all corner coordinates (vertices) have been obtained. This step can be carried out using the Sharp/Dull Angle Elimination algorithm and close corner elimination operators, set forth in FIG. 44N. Typically, the final result is a set of m and n indices corresponding to the x and y coordinates associated with the four corners coordinates of a cubic box, which set is thereafter stored in a corner coordinate (or indice) array.

FIG. 44N is a flow chart describing the operations carried out during Step B10 of the flow chart set forth in FIGS. 44H1 through 44H5. This algorithm eliminate wrong corners produced by the LADAR-based subsystem hereof. Vertex deletion is done is 2 stages where vertexes with too sharp an angle are deleted in the first. The following, second, stage deletes dull vertexes.

FIG. 44D1 is an example of an output representing a rectangle with three erroneous corners caused by noise. The goal of the algorithm is to combine lines '2', '3', '4', and '5' into a single line, therefore vertexes 'c', 'd', and 'e' have to be eliminated. The first stage searches vertexes 'a' to 'g' and eliminates any sharp ones. Vertex 'd' is deleted in the first round and the polygon would look like the one in FIG. 44O2. A second round turns out no sharp angles and stage 1 is completed.

The second stage of the algorithm again searches vertexes 'a' to 'g' and eliminates any dull ones. First, vertex 'c' is deleted, then 'e'. The polygon transformed from FIG. 44O2 to FIG. 44O3 then to FIG. 44O44. A second round in stage 2 also turns out nothing and the algorithm yields the polygon in FIG. 44O4.

As indicated at Block P in FIG. 44H5, Step B11 involves computing the average range value of the contour points currently buffered in the ODB so as to provide an average height value for the box, and then, for each corner point in the corner coordinate array, use the computed average range value to compute the z coordinate corresponding thereto, and referenced with respect to the global coordinate frame of reference.

Having determined the (m,n) indices corresponding to the corner points of the scanned package, and the average height of the scanned package, the data processing method hereof then proceeds to compute corresponding x and y coordinates for each such set of corner indices using geometric transformations. As shown in FIG. 44P, these geometric transformation can be schematically represented in the "polar-coordinate" based geometrical representation of the LADAR-based imaging and dimensioning subsystem of the present invention.

In particular, as indicated at Block Q in FIG. 44H5, Step B12 involves computing the x and y coordinates associated with each corner point currently buffered in the corner coordinate array and specified by indices m and n. Coordinates x and y are referenced with respect to the global coordinate frame. Mathematical expressions for computing these parameters, within geometric transformations implicitly embodied therewithin, can be derived using the geometrical model set forth in FIG. 44D.

According to the geometrical model shown in FIG. 44D, every point scanned by the AM laser beam of the LADAR-based subsystem hereof can be specified a position vector defined within a polar coordinate system embodied therewithin, as shown. Each position vector can be represented by $(R, \alpha)$, where R is the magnitude of the distance from the light source/scanner (e.g. polygonal or holographic scanning element) to the point on the scanned object, and $\alpha$ is the angle of the position vector emanating from the start of scan point, as reference in FIG. 44D, and where the SOS pulse photodetector 3352A in FIG. 44A is located. The value R is obtained through the phase detection output from A/D conversion circuit 3348. The value $\alpha$ is obtained from the sampling set up, using the SOS pulse generator 3352, shown in FIG. 44A. For example, 1 if a total of M points were sampled at a constant interval from the start of scanning line to the stop scanning line, as shown in FIG. 44D, and the point in question in the $m^{th}$ sampling, then $\alpha=m/M$.

In view of the fact that the polar-coordinate based LADAR unit hereof 3501 and 3502 produces accurately measured values for parameters $(R, \alpha, m)$, the data processing method hereof must employ a geometric transformation between $(R, \alpha, m)$ and $(H, x, y)$, Cartesian coordinate parameters referenced relative to the global coordinate reference employed by the greater system for package data tracking operations and the like. A suitable geometrical transformation for $(R, \alpha, m)$—$(H, x, y)$ is set forth below.

The first parameter in $(H, x, y)$, namely "H", the height of the scanned object (e.g. " 5 package), can be computed using the formula:

$$H=D-R\sin(\pi/2-\theta/2+\alpha)$$

The second parameter in $(H, x, y)$, namely, "x", the position of the sampling point with respect the edge of the conveyor belt can then be computed using the formula:

$$x=w/2-R\cos(\pi/2-\theta/2+\alpha)$$

assuming the LADAR-based unit is mounted at the center of the conveyor belt (i.e. at w/2).

Finally, the third parameter in $(H, x, y)$, namely "y", the coordinate along the belt's travelling direction, can be computed using the following formula:

$$y=m.v$$

where v is the velocity from the tachometer (3803).

As indicated at Block R in FIG. 44H5, Step B13 involves computing the surface area of the object represented by the contours currently represented in the contour buffer, using the m,n coordinates associated with the corner vertices m and n currently buffered in the corner coordinate array.

The algorithm set forth in FIG. 44Q sets forth surface computation operations which can be carried out during Step B13 of the flow chart set forth in FIGS. 44H1 through 44H5. FIGS. 44R1 and 44R2 set forth polygonal contours which illustrative the method of package surface area computation carried out during Step B13 of the flow chart set forth in FIGS. 44H1 through 44H5.

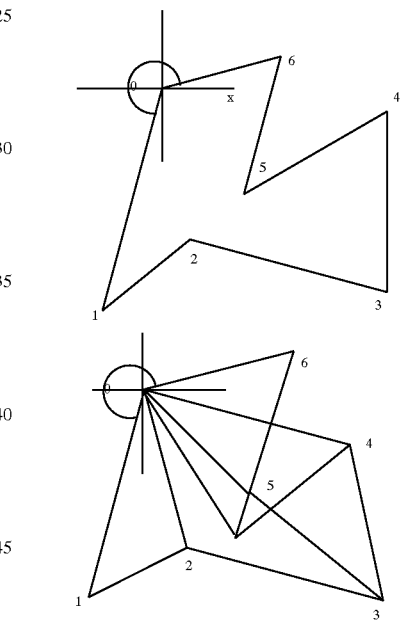

The algorithm shown in FIG. 44Q computes the area of the polygon-shaped package by summing the areas of the triangles that made up the polygon. For example, the polygon shown in FIG. 44R1 is made up of 5 triangles. The area 012, 023, 034, and 056 are positive and is negative for 045. In order to determine the polarity of the triangle (OAB)'s area, angles of the 2 vectors OA and OB need to be computed. If the angle of OB is bigger than OA, the area is positive, otherwise negative. The package's area will be the absolute value of the above sum.

As indicated at Block S in FIG. 44H5, Step B14 involves outputing, for the geometrically represented object (which has been scanned and data-sampled), the computed surface area, height, and corner x,y coordinates thereof, referenced with respect to the global coordinate reference frame.

In summary, the LADAR-based imaging and profiling subsystem of the present invention is capable of performing two distinct functions: by analyzing the phase difference between the transmitted AM laser beam, and the received (i.e. return) AM laser bean, the subsystem can geometrically profile virtually any object that is passed; also, by analyzing the magnitude of the return AM laser beam, the subsystem can generate a video image of the object (e.g. box or package or whatever) that is moved across the transmitted AM laser beam.

In alternative embodiments, it would be desirable to use blue VLDs with a characteristic wavelength of about 405 nm (now commercially available from Nichia, of Japan in order to generate the AM laser beam having a high resolution and long DOF. This would enable the LADAR-based imaging and profiling subsystem hereof to capture fairly high resolution images of scanned objects and thus read 1D and 2D bar code symbols embodied in the structure thereof, and thus be successfully decoded. Also, by providing mechanisms for causing the AM laser beam to be locally "dithered" about a reference direction, it should be possible to produce high density raster scanning patterns for read labels bearing text and the like using OCR techniques, well known in the art. Furthermore, the LADAR-based imaging and profiling subsystem of the present invention can be used in systems, wherein the AM laser beam produced therefrom is used to locate the label (e.g. text or bar code symbol label), while a high speed rastered laser beam is steered to the located label and aggressively scanned therewith in order to read the label.

Second Simultaneous Multiple-Package Detection and Dimensioning Subsystem of the Third Illustrative Embodiment of the Present Invention As shown in FIG. 45, the second simultaneous multiple-package detection and dimensioning subsystem 3500 of the illustrative embodiment is arranged on the output side of the tunnel scanning subsystem 3200, and comprises the same subcomponents contained in the first simultaneous multiple-package detection and dimensioning subsystem 3300. The only major difference is function: the function of subsystem 3500 is to simultaneously detect one or more packages exiting the scanning tunnel 3200, and generate for each such package, package dimension (PD) data and a package-out-of-tunnel (POOT) data element therefor when the POOT detection subsystem 3550, including laser light curtain or like device, detects the package downstream. The PD and POOT data elements produced from subsystem 3500 are processed in a manner similar to the PD and PIT data elements produced by subsystem 3300.

Weighing-In-Motion Subsystem of the Third Illustrative Embodiment of the Present Invention As shown in the FIGS. 42 and 43, the in-motion package weighing subsystem 3700 is preferably arranged about the first multiple package detection and dimensioning subsystem 3300. As in the first and second illustrative system embodiments, the in-motion weighing subsystem 3700 comprises: a scale platform integrated with the conveyor belt 3101, for producing analog or digital weight signals indicative of the weight of a package(s) 3204 moving across the scale platform; a filtering circuit for filtering the analog or digital weight signals in order to remove noise components and artifacts therefrom; and a signal processor for processing the filtered weight signals in order to produce a digital word representative of the measured weight of the package. Notably, the in-motion weighing subsystem of the illustrative embodiment can be used to realize using the 9480 EXPRESSWEIGHT™ In-Motion Variable Box and Package Weighing System from Mettler-Toledo, Inc. of Worthington, Ohio.

Package/Belt Velocity Measurement Subsystem of the Third Illustrative Embodiment of the Present Invention In the third illustrative system embodiment shown in FIGS. 42 and 43, the package/belt velocity measurement subsystem 3800 is realized as a number of subcomponents, namely: a roller wheel 3801 engaged against the undersurface of the conveyor belt 3101; an optical shaft incremental encoder 3802 connected to the axle of the roller wheel 3801 and producing an electrical pulse output stream per revolution of the roller wheel; and a programmed microprocessor 3803 for processing the output pulse stream and producing digital data representative of the velocity of the conveyor belt (and thus package transported thereby) at any instant in time. As shown in FIG. 42, the digital velocity information is provided to an assigned data input port provided by the I/O subsystem 3900.

Input/Output Subsystem of the Third Illustrative Embodiment of the Present Invention In the system shown in FIGS. 42 and 43, the function of the input/output subsystem 3900 is to manage the data inputs to and the data outputs from the data management computer system 3950. In the illustrative embodiment, I/O subsystem 3900 or can be realized using one or more rack-mounted I/O adapter boxes, such as the RocketPort Series RM16-RJ45 multiport serial controller having sixteen or thirty-two I/O ports, sold by the Comtrol Corporation, of Saint Paul, Minn.

Data Management Computer of the Third Illustrative Embodiment of the Present Invention In the system shown in FIGS. 42 and 43, the function of the data management computer 3925, with a graphical user interface (GUI) 3926, is to provide a powerful computing platform for realizing the data element queuing, handling and processing subsystem 3950 in a real-time manner, in addition to carrying out other data and system management functions. In general, subsystem 3950 is best realized by an computing platform having a multi-tasking operating system capable of handling multiple "threads" at the same time.

The Data Element Queuing Handling and Processing Subsystem of the Third Illustrative Embodiment of the Present Invention In FIGS. 44 and 44A, the structure and function of data element queuing, handling and processing subsystem 3950 is shown in greater detail. As shown in FIGS. 46A1 and 46A2, all time-stamped data objects, including PIT, POOT and package data elements associated therewith, are transferred from the moving package tracking queues 3305A through 3305D in subsystem 3300 and the moving package tracking queues 3505A through 3505D in subsystem 3500, to a first I/O unit 395A provided in subsystem 3950. Also, all scan beam data elements (SBDEs) and belt/package velocity measurements are provided to a second I/O unit 3951B, as shown in FIGS. 46A1 and 46A2.

As shown in FIGS. 46A1 and 46A2, each data object entering the subsystem 3950 though I/O unit 3951A is directly loaded into the system event queue 3956 under the control of data controller 3952 without performing any form of time-stamping operation, as these data elements already carry time-stamps placed thereon when generated in the package detection and dimensioning subsystems 3300 and 3500. In the illustrative embodiment, the data controller 3952 is realized as a programmed microprocessor and associated memory structures, whereas the system event queue 3956 is realized as a FIFO data structure known in the computing art.

Preferably, data objects obtained from the I/O unit 3951A having earlier time-stamps are loaded into the system event queue 3956 before data objects having more recent time-stamps. All incoming scan beam data elements and velocity measurements passing through I/O unit 3951C are time-stamped by the data controller 3952 using time-stamping unit 3953 (referenced to the master clock 3400 shown in FIG. 43), and then loaded into the system event queue 3956 under the control of the data controller 3952, as shown in FIGS. 46A1 and 46A2.

In the data element queuing, handling and processing subsystem 3950, the function of the data element analyzer/handler 3955 is to read the data elements (including data objects) from the output port of the system event queue 3956, and analyze and handle the same according to the Data Element Handling Rules set forth in FIGS. 47A and 47B.

As shown in FIGS. 46A1 and 46A2, scan beam data elements generated from "holographic type" laser scanning subsystems in the scanning tunnel must be processed using a system of data processing modules illustrated in FIGS. 46A1 and 46A2. As shown in FIGS. 46A1 and 46A2, this system of data processing modules comprises a data element combining module 3557A for combining (i) each scan beam data element generated from "holographic-type" laser scanning subsystems and accessed from the system event queue 3956 with (ii) each and every data object (i.e. package data element) in the moving package tracking queues 3954A through 3954D, so as to produce a plurality of combined data element pairs; a package surface geometry modeling module 3958A for generating a geometrical model for the package represented by the package data element in each combined data element pair produced by the data element combining module 3957A; a homogeneous transformation (HG) module 3959A for transforming (i.e. converting) the coordinates of each package surface geometry model produced at the "dimensioning position" in the global coordinate reference frame $R_{global}$, into package surface geometry model coordinates at the "scanning position" within the scanning tunnel (i.e. displaced a distance "z" from the package dimensioning position); a scan beam geometry modeling module 3960A for generating a geometrical model for the laser scanning beam represented by the scan beam data element in each combined data element pair produced by the data element combining module 3957A; a homogeneous transformation (HG) module 3961A for transforming (i.e. converting) the coordinates of each scanning beam geometry model referenced to the local frame of reference symbolically embedded within the holographic laser scanning system, into scanning beam geometry model coordinates referenced to the global coordinate reference $R_{global}$ at the "scanning position" within the scanning tunnel; a scan beam and package surface intersection determination module 3962A for determining, for each combined data element pair produced from the data element combining module, whether the globally-referenced scan beam model produced by the HG transformation module 3961A intersects with the globally-referenced package surface model produced by the HG transformation module 3959A and if so, then the data output subsystem 3963A produces, as output, package identification data, package dimension data (e.g. height, length, width data etc.), and package weight data, for use by auxiliary systems associated with the tunnel scanning system of the present invention.

As shown in FIGS. 45 and 45A, scan beam data elements generated from "non-holographic type" laser scanning subsystems must be processed using a different system of data processing modules than that shown in FIGS. 46A1 and 46A2. As shown in FIG. 46B, this system of data processing modules comprises: a data element combining module 3957B (similar to module 3957A) for combining (i) each scan beam data element generated from the "non-holographic-type" bottom-located laser scanning subsystems and accessed from the system event queue 3956 with (ii) each and every package data element in each of the moving package tracking queues 3954A through 3954D so as to produce a plurality of combined data element pairs; a package surface geometry modeling module 3958B (similar to module 3958A) for generating a geometrical model for the package represented by the package data object in each combined data element pair produced by the data element combining module 39657B; a homogeneous transformation (HG) module 3959B (similar to module 3959A) for transforming (i.e. converting) the coordinates of each package surface geometry model produced at the "dimensioning position" in the global coordinate reference frame $R_{global}$, into package surface geometry model coordinates at the "scanning position" within the scanning tunnel (i.e. displaced distance z from the package dimensioning position); a X-Z scanning surface (geometry) modeling module 3960B for generating a geometrical model for the laser scanning surface represented by the scan beam data element in each combined data element pair produced by the data element combining module 3957B; a homogeneous transformation (HG) module 3961B for transforming (i.e. converting) the coordinates of each X-Z scanning surface geometry model referenced to the local frame of reference symbolically embedded within the non-holographic bottom laser scanning subsystem, into scanning beam geometry model coordinates referenced to the global coordinate reference $R_{global}$ at the "scanning position" within the scanning tunnel; a scan beam and package surface intersection determination module 3962B for determining, for each combined data element pair produced from the data element combining module 3957B, whether the globally-referenced scanning surface model produced by the HG transformation module 3960B intersects with the globally-referenced package surface model produced by the HG transformation module 3959B, and if so, then the data output subsystem 3963B produces, as output, package identification data, package dimension data (e.g. height, width data etc.), and package weight data, for use by auxiliary systems associated with the tunnel scanning system of the present invention.

Having described the overall structure and function of the data element queuing, handling and processing subsystem 3950, it is appropriate at this juncture to now briefly describe the operation thereof with reference to FIGS. 45 and 45A.

Prior to loading into the system event queue 3956, each scan beam data element (SBDE) and each belt/package velocity measurement (v) is time-stamped (i.e. $T_j$) by timing stamping unit 3953 which is driven by a clock therewithin referenced to the master clock 3400 in FIG. 43. All data elements in the system event queue 3956 and moving package tracking queues 3954A through 3954D are handled by the data element analyzer/handler 3955 which is governed by the table of Data Element Handling Rules set forth in FIGS. 47A and 47B. In general, data element queuing, handling and processing subsystem 3950 is best realized by a computing platform having a multi-tasking operating system capable of handling multiple "threads" at the same time.

Package data objects removed from system event queue 3956 by data element analyzer/handler 3955 are placed into the appropriate moving package tracking queues 3954A through 3954D based on an analysis of the package dimension data elements associated with removed package data objects. As in the case of the multiple package detection and dimensioning subsystem 3300, each package moving through the scanning tunnel is represented by an "object" in an object-oriented programming environment (e.g. Java programming environment) stored in a moving package tracking queue 3954A through 3954D operably connected to the data element analyzer/handler 3955. Package data objects placed in the appropriate moving package tracking queues 3954A through 3954D, are removed therefrom by the data element analyzer/handler 3955 in accordance with the data element handling rules set forth in the table of FIGS. 47A and 47B.

Scan beam data elements generated from holographic-based scanning units are processed along the scan data processing channel illustrated by blocks 3960A, 3961A and 3962A set forth in the lower right hand corner of FIGS. 46A1 and 46A2, whereas scan beam data elements generated from non-holographic based scanning units (e.g. from the bottom-located polygon scanners in the tunnel) are processed along a different scan data processing channel illustrated by blocks 3960B, 3961B and 3962B set forth in FIG. 46B. This bifurcation of data element processing is required because scan beam data elements generated from holographic-based scanning units are generated from laser scanning beams (or finite scanning sectors) which can be tracked with scan package identification data using the facet sectors on the scanning disc in issue. While a similar technique can be used for polygon-based scanners (e.g. tracking "mirror sectors" instead of HOE-based facet sectors), a different approach has been adopted in the illustrative embodiment. That is, the scanning surface (e.g. 3×5 ") of each polygon scanning unit along the bottom scanner is accorded a vector-based surface model, rather than ray-type model used for package identification data collected using holographic scanning mechanisms.

The Package Surface Geometry Modeling Subsystem of the Third Illustrative Embodiment of the Present Invention As shown in FIG. 48A, a surface geometry model is created for each package surface by the package surface geometry modeling subsystem (i.e. module) 3958A deployed with the data element queuing, handling and processing subsystem 3950 of FIGS. 46A1 and 46A2. In the illustrative embodiment, each surface of each package transported through multiple package detecting and dimensioning subsystem 3300 is mathematically represented (i.e. modeled) using at least three position vectors (referenced to x=0, y=0, z=0) in the global reference frame $R_{global}$, and a normal vector to the package surface indicating the direction of incident light reflection therefrom. The table of FIG. 46B describes a preferred procedure for creating a vector-based surface model for each surface of each package transported through the multiple package detecting and dimensioning subsystem 3300 in the system 3000 hereof.

The Scan Beam Geometry Modeling Subsystem of the Third Illustrative Embodiment of the Present Invention As described in FIG. 49, a vector-based model is created by the scan beam geometry modeling subsystem (i.e. module) 3960A of FIGS. 46A1 and 46A2, which is similar to structure and function as scan beam geometry modeling subsystem 1010A shown in FIGS. 22A1 and 22A2. The function of this subsystem is to geometrically model the propagation of the laser scanning beam (ray) emanating from a particular point on the facet, to its point of reflection on the corresponding beam folding mirror, towards to the focal plane determined by the focal length of the facet. Details of this modeling procedure can be found in Applicant's copending application Ser. No. 08/726,522 filed Oct. 7, 1996; and Ser. No. 08/573,949 filed Dec. 18, 1995.

The Scan Surface Modeling Subsystem of the Third Illustrative Embodiment of the Present Invention FIG. 50 schematically shows how the scan surface modeling subsystem (i.e. module) shown of FIG. 5146A can be used to define a vector-based 2-D surface geometry model for each candidate scan beam generated by the polygonal-based bottom scanners in the tunnel scanning system. As shown in FIG. 49, each omnidirectional scan pattern produced from a particular polygon-based bottom scanning unit is mathematically represented (i.e. modeled) using four position vectors (referenced to x=0, y=0, z=0) in the global reference frame $R_{global}$, and a normal vector to the scanning surface indicating the direction of laser scanning rays projected therefrom during scanning operations. This modeling subsystem is substantially the same as subsystem 1010B shown in FIG. 22B.

The Homogeneous (HG) Transformation Modules of the Third Illustrative Embodiment of the Present Invention FIG. 51 schematically describes how the homogeneous (HG) transformation module 3961A of FIGS. 46A1 and 46A2 uses homogeneous transformations to convert a vector-based model within a local scanner coordinate reference frame $R_{localscannerj}$ into a corresponding vector-based model created within the global scanner coordinate reference frame $R_{global}$. This mathematical technique is essential in that it converts locally-referenced coordinates used to represent a laser beam (which scanned a bar code symbol) into globally-referenced coordinates used to represent the same laser scanning beam. Module 3961A is similar to module 1010A in FIGS. 22A1 and 22A2.

FIG. 52 illustrates how HG transformation module 3959A is used to convert a vector-based package surface model specified within the global coordinate reference frame $R_{global}$ at the "package height/width profiling position", into a corresponding vector-based package surface model created within the global coordinate reference frame $R_{global}$ specified at the "scanning position" within the tunnel scanning system. This mathematical technique is essential in that it converts locally-referenced coordinates used to represent a package surface into globally-referenced coordinates used to represent the same package surface. Notably, this method of coordinate conversion, similar to that disclosed in FIG. 30, involves computing the package travel distance (z=d) between the package height/width profiling and scanning positions using (1) the package or conveyor belt velocity (v) and the difference in time (i.e. $\Delta T=T1-T2$) indicated by the time stamps (T1 and T2) placed on the package data element and scan beam data element, respectively, matched thereto during each scan beam/package surface intersection determination carried out within module 3962A in the data element queuing, handling and processing subsystem 3000. Notably, this package displacement distance z=d between the profiling and scanning positions is given by the mathematical expression d=v $\Delta T$.

The Scan Beam and Package Surface Intersection Determination Subsystem of the Third Illustrative Embodiment of the Present Invention for Use with Scan Beam Data Elements Produced by Holographic Scanning Subsystems FIGS. 53A and 53B, taken together, describes a procedure which is carried out within the scan beam and package surface intersection determination module 3962A of the illustrative embodiment in order to determine whether (i) the scan beam (rays) associated with a particular scan beam data element produced by a holographic scanning subsystem intersects with (ii) any surface on the package that has been scanned at a particular scanning position, and thus whether to correlate a particular package identification data element with particular package measurement data element acquired by the system.

As indicated at Block A in FIG. 53A, the first step of the procedure involves using the minimum and maximum scan rays models of the laser scan beam to determine the intersection point between the scan ray and a surface on the package (using the vector-based models thereof) referenced to the global coordinate reference frame. As indicated at Block B in FIG. 53A, if an intersection point has been determined at Block A, then confirm that the sign of the normal vector of the surface is opposite the sign of the scan ray direction vector. As indicated at Block C in FIG. 53A, if the sign of the normal vector is opposite the sign of the scan ray direction vector, then determine if the intersection point (found at Block A) falls within the spatial boundaries of the package surface. As indicated at Block D in FIG. 53B, if the intersection point falls within the boundaries of the surface, then output a data element to the output queue in the data output subsystem 3963A, wherein the data element comprises package identification data and data representative of the dimensions and measurements of the package by the system for use by other subsystems. When a scan beam data element taken from the scan beam data element queue 3956 is correlated with a package data element (i.e. object) using the above described method, then the subsystem 3963A outputs a data element (in an output data queue) containing the package ID data and the package dimensional and measurement data. Such data elements can be displayed graphically, printed out as a list, provided to sorting subsystems, shipping pricing subsystems, routing subsystems and the like.

The Scan Surface and Package Surface Intersection Determination Subsystem of the Third Illustrative Embodiment of the Present Invention for Use with Scan Beam Data Elements Produced by Non-Holographic Scanning Subsystems FIGS. 54A and 54B, taken together, describes a procedure which can be carried out within the scan surface and package surface intersection determination module 3962B of FIGS. 46A1 and 46A2 in order to determine whether the scanning surface associated with a particular scan beam data element produced by a non-holographic (e.g. polygon-based) "bottom-located" scanning subsystem spatially intersects with any surface on the package that has been scanned at a particular scanning position, and thus whether to correlate a particular package identification data element with particular package measurement data element acquired by the system.

As indicated at Block A in FIG. 54A, the first step of the procedure involves using the vector-based surface models of the laser scan surfaces of the bottom polygon scanners and side surfaces of the packages so as to determine whether or not there exists a point of intersection between the scanning surface of the polygon-based scanners and any surface of the package. As indicated at Block B in FIG. 54A, if an intersection point exists, then confirm that the sign of the vector model of the scanning surface (i.e. the normal vector) is opposite the sign of the vector model of the package surface. As indicated at Block C in FIG. 54B, if the sign of the normal vector of the scanning surface is opposite the sign of the normal vector to the package surface, then confirm that certain of the points bounded by the scanning surface coincide with points bounded by the surface of the package. As indicated at Block D in FIG. 54B, if sufficient overlap is found to exist between the scanning surface and the package surface, then output a data element to the output queue in the data output subsystem 3963B, wherein the data element comprises package identification data and data representative of the dimensions and measurements of the package by the system for use by other subsystems. When a scan beam data element taken from the system event queue 3956 is correlated with a package data element using the above described method, then the subsystem 3963B outputs a data element (in an output data queue) containing the package ID data and the package dimensional and measurement data. Such data elements can be displayed graphically, printed out as a list, provided to sorting subsystems, shipping pricing subsystems, routing subsystems and the like.

Notably, the smaller the facet sectors on the scanning disc, then the better resolution the system hereof will have with regarding to correlating package identification data with package measurement data. As the facet sector gets small, the corresponding minimum and maximum facet angles generated from the decoder device hereof will get closer and closer, approaching a single scanning ray in the ideal situation.

Automated Tunnel-Type Laser Scanning Package Identification and Weighing System Constructed According to a Fourth Illustrated Embodiment of the Present Invention Referring now to FIG. 55, the automated laser scanning package identification and measurement system of the third illustrated embodiment 5000 will now be described in detail.

Like the systems of the first and second illustrative embodiments detailed above, system 5000 is capable of detecting, measuring, identifying and tracking singulated packages along the conveyor belt.

As shown in FIG. 55, automated tunnel-type laser scanning package identification and weighing system 5000 comprises: the automated simultaneous package detecting, dimensioning and identifying system of the third illustrative embodiment is indicated by reference numeral 5000 and comprises an integration of subsystems, namely: a high-speed package conveyor system 3100 having a conveyor belt 3101 having a width of at least 30 inches to support one or more package transport lanes along the conveyor belt; a tunnel or similar arrangement of 1-D and 2-D bar code symbol readers including, in the illustrative embodiment, 1-D holographic laser scanning bar code symbol reading subsystem 2200A,2200B, and 2-D laser scanning bar code symbol reading subsystem 5200 supported overhead the conveyor belt 3101 by a support frame 3202, for generating a 3-D omnidirectional scanning volume 3203 thereabove, as depicted in FIG. 55, for scanning 1-D and 2-D bar codes 3205 on packages 3204 transported therethrough; a LADAR-based imaging and dimensioning subsystem 3501A(3501B) for generating an amplitude modulated laser beam 3302 that is repeatedly scanned across the width-wise dimension of the scanning tunnel at a stationary point of rotation above the conveyor belt, and producing data representative of the height, area and corner coordinates (vertices) of packages entering the scanning tunnel; a package-in-the-tunnel detection subsystem 5400 for detecting each package entering the scanning tunnel and generating a PIT data element (i.e.data object) indicative thereof; a weighing-in-motion subsystem 2500, installed along the conveyor belt structure beyond the tunnel scanning subsystem for weighing packages as they are transported therealong; a package-out-of-the-tunnel (POOT) detection subsystem 5400 for detecting each package exiting the scanning tunnel and generating a POOT data element (i.e. data object) indicative thereof; a weighing-in-motion subsystem 2500, installed along the conveyor belt structure beyond the tunnel scanning subsystem for weighing packages as they are transported therealong; a package/belt velocity measurement subsystem 3800 realized using a roller wheel 3801 engaged against the undersurface of the conveyor belt 3101, an optical shaft incremental encoder 3802 connected to the axle of the roller wheel 3801 and producing an electrical pulse output stream per revolution of the roller wheel, and a programmed microprocessor 3803 for processing the output pulse stream and producing digital data representative of the velocity of the conveyor belt (and thus package transported thereby) at any instant in time; an input/output subsystem 2700 for managing the data inputs to and data outputs from the system; and a data management computer 2800, with a graphical user interface (GUI) 3926, for realizing a data element queuing, handling and processing subsystem 3950 as shown in FIGS. 44 and 44A, as well as other data and system management functions.

Applications of the System of the Present Invention

In general, the package identification and measuring systems of the present invention can be installed in package routing hubs, shipping terminals, airports, factories, and the like. There of course will be numerous other applications for such systems as new situations arise, and the capabilities of such systems become widely known to the general public.

As shown in FIG. 58, the system of the present invention (1, 2000, or 3000) described above can be connected to an information network 4000 supporting TCP/IP or other network protocol. As shown, the network includes at least one relational database management computer system (RDBMS) 4001 designed to receive information collected from each and every package identified, dimensioned and measured while passing through the scanning tunnel subsystem of the system. Notably, a package router 4005 is shown installed downstream from the system in order to route packages in an automated manner using control signals generated by the subsystem 900 in the system. It is understood that many systems 1, 2000 or 3000 could be assembled in various types of package routing networks in order to achieve a particular set of functions relating to automatic identification, routing, and sorting operations.

As shown in FIG. 58, the RDBMS 4001 is connected to a Java/Jinni-enabled Internet (i.e. http) server 4002 by way of an information network supporting TCP/IP in a manner well known in the art. The HTTP server 4002, realized using a SUN® workstation supporting Java and Jini server components by Sun Microsystems, Inc. of Palo Alto, Calif., is accessible by any Java/Jini-enabled client machine 4003 equipped with a Java/Jini-enabled (http) browser program known in the art. Any client machine 4003 can be RF linked to Internet infrastructure 4004, connected thereto by a POTs line, ISDN line, DSL line, T1 line or any other means available presently or in the future. Typically, computer system 900, RDBMS 4001, and Internet server 4002 are located in close physical proximity with the automated package identification and measuring system 1, 2000 and 3000, and if no in close physical proximity, then reasonably close thereto in comparison to the distance of a remote client machine 4003 used to remote control and manage the system when required by trained service technicians.

In this illustrative embodiment, the data element management computer subsystem 900 within the system 1, 2000 or 3000 is also realized using a SUN® workstation running the SOLARIS version of Unix and supporting Java and Jini server components by Sun Microsystems, Inc. Each node in the network, including subsystem 900, and Internet server 4002, has an assigned static IP address on the Internet, and is provided with its own Jini™ interface for the purpose of enabling customers and other authorized personnel to use a Jini/Java-enabled client machine 4001 located anywhere around the globe so as to: (1) remotely access (from Internet server 4002) information about any packages transported through the system, as well as diagnostics regarding the system; and (2) remotely control the various subcomponents of the system in order to reprogram its subsystems, perform service routines, performance checks and the like, as well as carry out other forms of maintenance required to keep the system running optimally, while minimizing down-time or disruption in system operations.

While the above-described system employs Jini/Java-enabled remote control technology, it is understood that other forms of remote control technology, known in the computing arts, can be used to implement the remote-controlled diagnostics, management and servicing method of the present invention.

Modifications of the Illustrative Embodiments

While the package conveyor subsystems employed in the illustrative embodiments have utilized belt or roller structure to transport package, it is understood that this subsystem can be realized in many ways, for example: using trains running on tracks passing through the laser i scanning tunnel; mobile transport units running through the scanning tunnel installed in a factory environment; robotically-controlled platforms or carriages supporting packages, parcels or other bar coded objects, moving through a laser scanning tunnel subsystem.

In the preferred embodiments of the present invention described above, holographic laser scanning subsystems have been used to generated robust 3-D omnidirectional scanning volumes employed in such systems. As such, the laser beam position tracking techniques disclosed herein have been applied to the holographic scanning disc used in such systems to produce facet and facet sector information generated and correlated with each and every line of scan data generated within each holographic scanning subsystem. It is understood, however, when using polygonal type scanning systems, the laser beam position tracking techniques taught herein can be directly applied to the rotating polygon, and in such cases, polygon mirror and mirror sector information would be automatically generated and correlated with each and every line of scan data generated within each polygonal-type laser scanning subsystem of the present invention.

While the various embodiments of the package identification and measuring system hereof have been described in connection with linear (1-D) and 2-D code symbol scanning applications, it should be clear, however, that the system and methods of the present invention are equally suited for scanning alphanumeric characters (e.g. textual information) in optical character recognition (OCR) applications, as well as scanning graphical images in graphical scanning arts. All that will be required is to provide image data storage buffers in each of the scanning units so that images of bar code symbols can be reconstructed during scanning operations, and then character recognition techniques, such as taught in U.S. Pat. No. 5,727,081 to Burges, et al, incorporated herein by reference.

Advantages and Other Features of the System of the Present Invention

Through proper programming, the automated package identification and measuring systems of the illustrative embodiments described hereinabove can read virtually any bar code symbology imaginable (e.g. Interleaved two of five, Code 128 and Code three of nine) and formats so as to sort and identify packages at various package rates required by USPS or other end-users. The systems of the illustrative embodiments can read the ZIP Code (six digits), Package Identification Code (PIC) (sixteen characters)[1] and Tray bar code (ten digits) symbols.

The tunnel scanning systems hereof can be configured so that all of the products passing through the "tunnel" shall be scanned and read for the valid USPS bar coded symbols regardless of the position of the bar code symbol on the surface of the product. This also includes the bottom surface of the product.

The tunnel scanning system hereof can be provided with additional equipment including, for example, tachometers, dimensioning units, support structures, special power units (if required), air compressors and any other support equipment required by an application at hand.

Preferably, the tunnel scanning systems of the illustrative embodiments are constructed using standard interfaces such that scanners, decoders, concentrator, etc. are interchangeable.

The tunnel scanning systems hereof can read bar coded symbols through the entire population of tray and tub label holders in use by the USPS, and other package or parcel carriers.

In addition, the tunnel scanning systems can read bar code symbols on the package products when the bar code symbol label is placed under diaphanous materials.

There will be more than one bar code symbol on many of the packages found in the tunnel system hereof. Some of these symbols will not be valid USPS symbols. If there are multiple symbols on a package, the scanner logic will automatically identify and process only the USPS valid symbols.

The tunnel scanning systems of the illustrative embodiments can process all types of products (e.g. trays and tubs having extremely large variance in surface types, colors, and plastics (e.g. Tyvek material, canvass, cardboard, polywrap, Styrofoam, rubber, dark packages).

Some of these product types include: softpack-pillows, bags; packages having non-flat bottoms, such as flats, trays, and tubs with and without bands; cartons; rugs; duffel bags (without strings or metal clips); tires; wooden containers; and sacks.

It is understood that the laser scanning systems, modules, engines and subsystems of the illustrative embodiments may be modified in a variety of ways which will become readily apparent to those skilled in the art, and having the benefit of the novel teachings disclosed herein. All such modifications and variations of the illustrative embodiments thereof shall be deemed to be within the scope and spirit of the present invention as defined by the claims to Invention appended hereto.

What is claimed is:

1. An automated object dimensioning system for measuring the dimensions of a scanned object transported along a conveyor belt structure, comprising:
    a system housing having a light transmission aperture, supportable above a conveyor belt structure;
    an optical bench, disposed within said system housing;
    a laser beam production module disposed within said system housing, for generating an amplitude modulated laser beam;
    a scanning mechanism, mounted on said optical bench, for projecting and said amplitude modulated laser beam through said light transmission aperture, and repeatedly scanning said amplitude modulated laser beam across the width of said conveyor belt structure;
    a light collecting mechanism, mounted within said system housing, for collecting laser light reflected off said scanned object and focusing said reflected laser light;
    a photodetector, mounted on said optical bench, for detecting said focused laser light and producing an electrical signal corresponding thereto;
    signal processing circuitry, disposed within said system housing, for processing said produced electrical signal and, during each scan of said amplitude modulated laser beam across said scanned object, generating a row of raw digital range data representative of the distance from said scanning element to sampled points along said scanned object, measured with respect to a polar-type coordinate system symbolically-embedded within said automatic object dimensioning system;
    a preprocessing data buffer, disposed within said system housing, for storing rows of raw range data produced by said signal processing circuitry; and
    a programmed digital image processor, disposed within said system housing, for receiving rows of raw range data from said preprocessing data buffer, and processing data, including raw range data buffered in said preprocessing data buffer,
    wherein said programmed digital image processor includes
        a first data processing stage for automatically processing said rows of raw range data in said preprocessing data buffer so as to produce a range data map representative of the space above said conveyor belt structure, and
        a second data processing stage for automatically tracing contours within said buffered range data map, said traced contours being represented by a first set of indices (m,n) indicative of objects being transported along said conveyor belt structure;
        a third data processing stage for automatically processing said first set of indices (m,n) associated with said traced contours so as to detect vertices associated with polygonal-shaped objects extracted from said range data map, said detected vertices being represented by a second set of indices (m,n) and indicative of polygonal-shaped objects corresponding to objects being transported along said conveyor belt structure;
        a fourth data processing stage for automatically processing said second set of indices (m,n) associated with said detected vertices so as to detect a set of candidate corner points associated with the corners of a particular object being transported along said conveyor belt structure, said candidate corner points being represented by a third set of indices (m,n) and indicative of the corners of a particular object being transported along said conveyor belt structure;
        a fifth data processing stage for automatically processing said third set of indices (m,n) associated with detected corner point candidates so as to reduce said set of candidate corner points down to a set of corner points most likely to correspond to the corner points of a regular-shaped polygonal object, said most likely set of candidate corner points being represented by a fourth set of indices (m,n) and indicative of the corners of a regular-shaped polygonal object which most likely corresponds to the particular object being transported along said conveyor belt structure;
        a sixth data processing stage for automatically processing said fourth set of indices (m,n) associated with the corner points of a regular-shaped polygonal object so as to compute dimension-related parameters of the object represented by said image contours traced within said buffered range data map.

2. The automated object dimensioning system of claim 1, wherein said sixth data processing stage further comprises:
    a first data processing substage for automatically processing said fourth set of indices (m,n) associated with the corner points of a regular-shaped polygonal object so as to compute the surface area of the object represented by said traced contours within said buffered range data map; and a second data processing substage for automatically processing said fourth set of indices (m,n) associated with the corner points of said regular-shaped polygonal object so as to compute the average height of the object represented by said traced contours in said buffered range data map, referenced relative to a global Cartesian-type coordinate reference system symbolically embedded within said system housing.

3. The automated object dimensioning system of claim 2, wherein said sixth data processing stage further comprises:

a third data processing substage for automatically processing said fourth set of indices (m,n) associated with the corner points of said regular-shaped polygonal object so as to compute the x, y, z coordinates corresponding to the corners of the object represented by said traced contours in said buffered range data map, referenced relative to said global Cartesian-type coordinate reference system.

4. The automated object dimensioning system of claim 1, wherein said first data processing stage employs window-type convolution kernals that smooth and edge-detect the raw range data and thus improve its quality for subsequent dimension data extraction operations.

5. The automated object dimensioning system of claim 1, wherein said first data processing stage includes means for subtracting detected background information (including noise) from the continuously updated range data map as to accommodate for changing background lighting conditions.

6. The automated object dimensioning system of claim 1, wherein said scanning mechanism comprises a polygonal-type laser scanning mechanism for scanning said amplitude modulated laser beam across the width of said conveyor belt structure.

7. The automated object dimensioning system of claim 1, wherein said scanning mechanism comprises a holographic-type laser scanning mechanism for scanning said amplitude modulated laser beam across the width of said conveyor belt structure.

8. The automated object dimensioning system of claim 1, wherein said photodetector comprises an avalanche-type photodetector mounted on said optical bench.

9. The automated object dimensioning system of claim 1, wherein said regular-shaped polygonal object is a package.

10. An automated method of measuring the dimensions of a scanned object transported along a conveyor belt structure, said method comprising the steps of:

(a) generating an amplitude modulated laser beam from a system housing of an automatic object dimensioning system disposed above said conveyor belt structure;

(b) automatically repeatedly scanning said amplitude modulated laser beam across the width of said conveyor belt structure;

(c) automatically collecting laser light reflected off said scanned object and focusing said reflected laser light;

(d) automatically detecting said focused laser light and producing an electrical signal corresponding thereto;

(e) automatically processing said produced electrical signal and, during each scan of said amplitude modulated laser beam across said scanned object, generating a row of raw digital range data representative of the distance from said scanning element to sampled points along said scanned object, measured with respect to a polar-type coordinate system symbolically-embedded within said automatic object dimensioning system;

(f) automatically providing a preprocessing data buffer for storing generated rows of raw range data;

(g) automatically receiving, in said preprocessing data buffer, rows of said raw range data, and processing data, including raw range data;

(h) automatically processing said rows of raw range data in said preprocessing data buffer so as to produce a range data map representative of the space above said conveyor belt structure, and (i) automatically tracing contours within said buffered range data map, said traced contours being represented by a first set of indices (m,n) indicative of objects being transported along said conveyor belt structure;

(j) automatically processing said first set of indices (m,n) associated with said traced contours so as to detect vertices associated with polygonal-shaped objects extracted from said range data map, said detected vertices being represented by a second set of indices (m,n) and indicative of polygonal-shaped objects corresponding to objects being transported along said conveyor belt structure;

(k) automatically processing said second set of indices (m,n) associated with said detected vertices so as to detect a set of candidate corner points associated with the corners of a particular object being transported along said conveyor belt structure, said candidate corner points being represented by a third set of indices (m,n) and indicative of the corners of a particular object being transported along said conveyor belt structure;

(l) automatically processing said third set of indices (m,n) associated with detected corner point candidates so as to reduce said set of candidate corner points down to a set of corner points most likely to correspond to the corner points of a regular-shaped polygonal object, said most likely set of candidate corner points being represented by a fourth set of indices (m,n) and indicative of the corners of a regular-shaped polygonal object which most likely corresponds to the particular object being transported along said conveyor belt structure; and (m) automatically processing said fourth set of indices (m,n) associated with the corner points of a regular-shaped polygonal object so as to compute dimension-related parameters of the object represented by said image contours traced within said buffered range data map.

11. The method of claim 10, wherein step (m) further comprises substeps (m)(1) automatically processing said fourth set of indices (m,n) associated with the corner points of a regular-shaped polygonal object so as to compute the surface area of the object represented by said traced contours within said buffered range data map; and (m)(2) automatically processing said fourth set of indices (m,n) associated with the corner points of said regular-shaped polygonal object so as to compute the average height of the object represented by said traced contours in said buffered range data map, referenced relative to a global Cartesian-type coordinate reference system symbolically embedded within said system housing.

12. The method of claim 10, which further comprises after step (l)

(m)(3) automatically processing said fourth set of indices (m,n) associated with the corner points of said regular-shaped polygonal object so as to compute the x, y, z coordinates corresponding to the corners of the object represented by said traced contours traced in said buffered range data map, referenced relative to said global Cartesian-type coordinate reference system.

13. The method of claim 10, wherein step (h) comprises employing window-type convolution kernals that smooth and edge-detect the raw range data and thus improve its quality for subsequent dimension data extraction operations.

14. The method of claim 10, wherein step (h) comprises subtracting detected background information (including noise) from the continuously updated range data map as to accommodate for changing background lighting conditions.

15. The method of claim 10, wherein step (h) comprises scanning said amplitude modulated laser beam across the width of said conveyor belt structure.

16. The method of claim 10, wherein step (b) comprises using a holographic-type laser scanning mechanism for scanning said amplitude modulated laser beam across the width of said conveyor belt structure.

17. The method of claim 10, wherein step (d) comprises using an avalanche-type photodetector.

* * * * *